(12) United States Patent
Cohen et al.

(10) Patent No.: US 10,254,499 B1
(45) Date of Patent: Apr. 9, 2019

(54) ADDITIVE MANUFACTURING OF ACTIVE DEVICES USING DIELECTRIC, CONDUCTIVE AND MAGNETIC MATERIALS

(71) Applicant: Southern Methodist University, Dallas, TX (US)

(72) Inventors: Adam Cohen, Dallas, TX (US); Paul Samuel Krueger, Plano, TX (US); Matt Saari, Dallas, TX (US); Edmond Richer, Richardson, TX (US); Bryan Cox, Marion, AR (US); Bin Xia, Dallas, TX (US); Collin Gabriel Clay, Houston, TX (US)

(73) Assignee: Southern Methodist University, Dallas, TX (US)

( * ) Notice: Subject to any disclaimer, the term of this patent is extended or adjusted under 35 U.S.C. 154(b) by 0 days.

(21) Appl. No.: 15/669,263

(22) Filed: Aug. 4, 2017

Related U.S. Application Data

(60) Provisional application No. 62/371,581, filed on Aug. 5, 2016.

(51) Int. Cl.

| | |
|---|---|
| *G02B 6/44* | (2006.01) |
| *H01R 4/02* | (2006.01) |
| *B33Y 30/00* | (2015.01) |
| *B29C 64/209* | (2017.01) |
| *B23K 1/005* | (2006.01) |
| *B29C 64/118* | (2017.01) |
| *B33Y 70/00* | (2015.01) |
| *B33Y 10/00* | (2015.01) |

(52) U.S. Cl.
CPC .......... *G02B 6/4463* (2013.01); *B23K 1/0056* (2013.01); *B29C 64/118* (2017.08); *B29C 64/209* (2017.08); *B33Y 10/00* (2014.12); *B33Y 30/00* (2014.12); *B33Y 70/00* (2014.12); *H01R 4/022* (2013.01); *H01R 4/024* (2013.01)

(58) Field of Classification Search
CPC ..... G02B 6/4463; B29C 64/118; B33Y 10/00; B33Y 30/00; B33Y 70/00
See application file for complete search history.

(56) References Cited

U.S. PATENT DOCUMENTS

| | | | | |
|---|---|---|---|---|
| 6,774,341 B2 * | 8/2004 | Ohta | ...................... | B23K 26/38 |
| | | | | 219/121.72 |
| 9,126,367 B1 * | 9/2015 | Mark | ....................... | B29C 70/20 |
| 2007/0137255 A1 * | 6/2007 | Miyake | .................. | G02B 6/381 |
| | | | | 65/393 |

FOREIGN PATENT DOCUMENTS

| | | | | |
|---|---|---|---|---|
| CN | 105043424 A | * | 11/2015 | ............. G01D 5/353 |

OTHER PUBLICATIONS

Ober et al. "*Active Mixing of complex Fluids at the Microscale*"; School of Engineering and Applied Science, Wyss Institute for Biologically Inspired Engineering, Harvard University, Cambridge, MA, Aug. 25, 2015; 6 pages.

* cited by examiner

*Primary Examiner* — Daniel Petkovsek

(74) *Attorney, Agent, or Firm* — Fish & Richardson P.C.

(57) ABSTRACT

The present disclosure relates to a process, system and apparatus for multi-material additive manufacturing process comprising: extruding an extrudable material through a nozzle capable of moving along one or more axis and concurrently extruding one or more filaments, wherein the filament is embedded in, on or about the extrudable material from the nozzle.

4 Claims, 235 Drawing Sheets

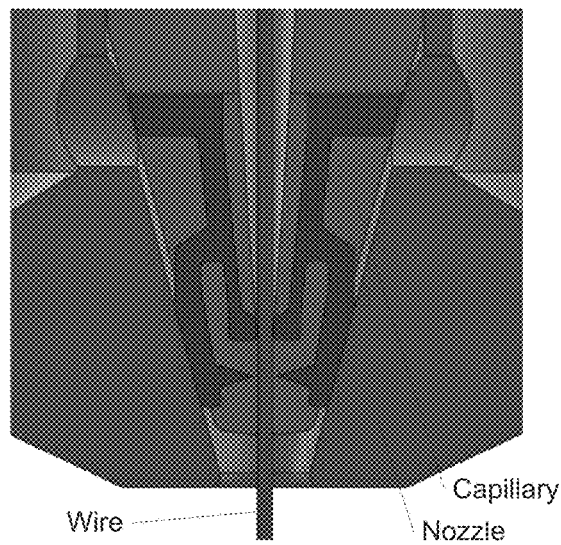
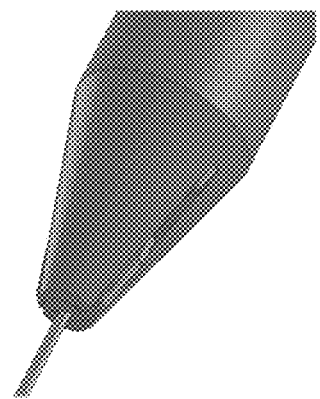
FIG. 4a
FIG. 4c
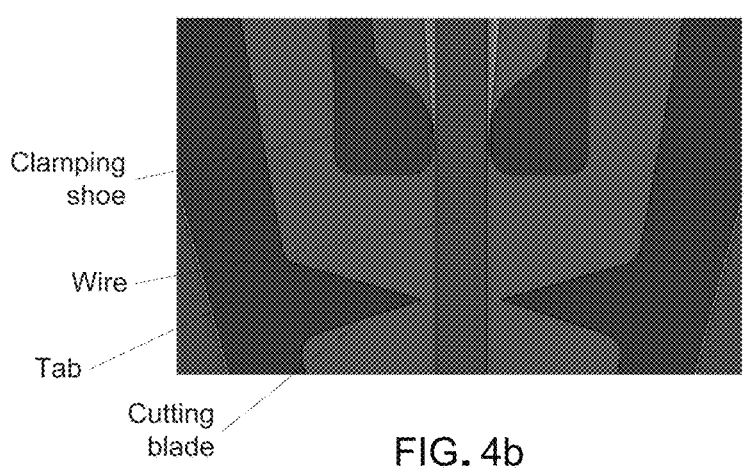
FIG. 4b

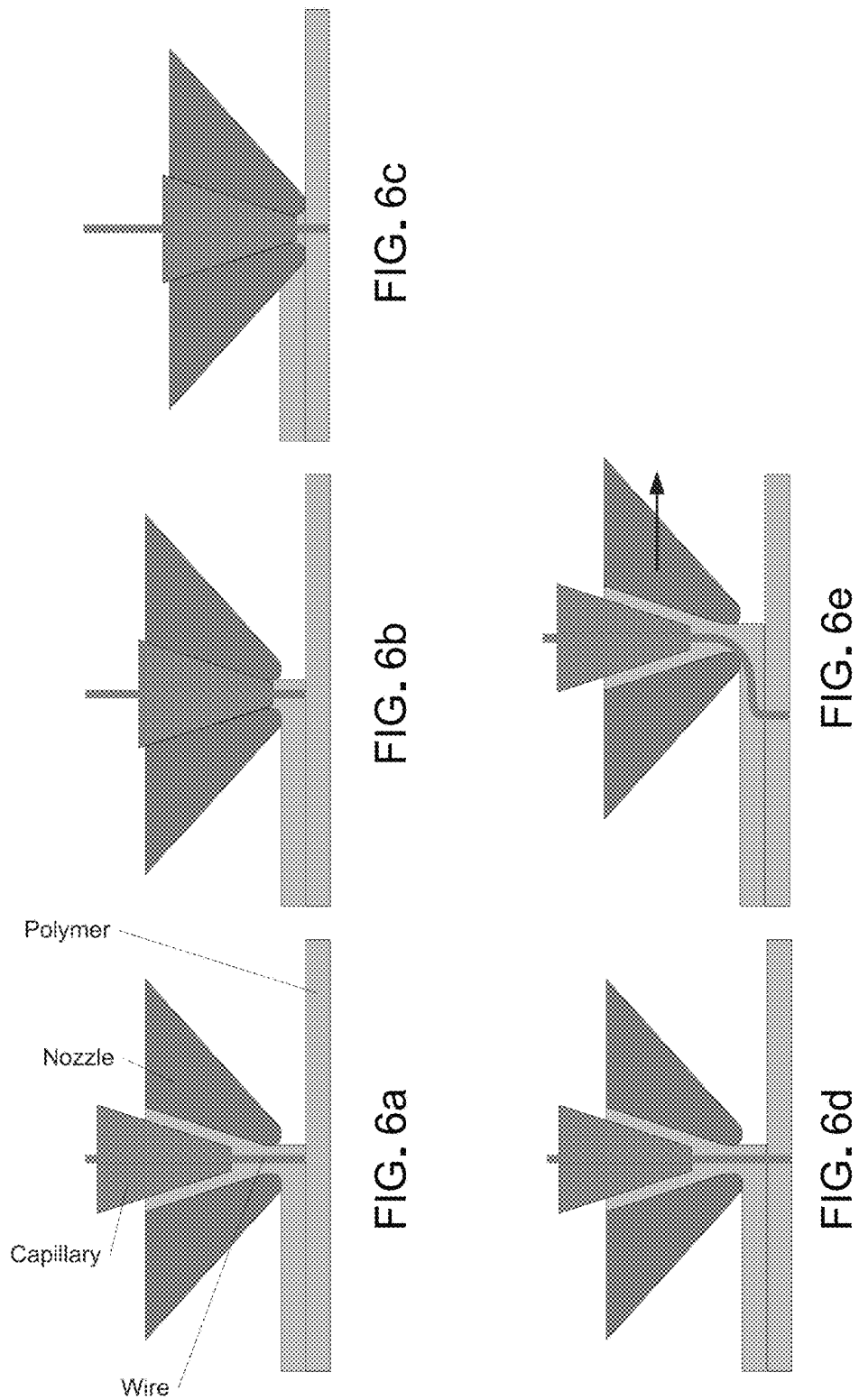

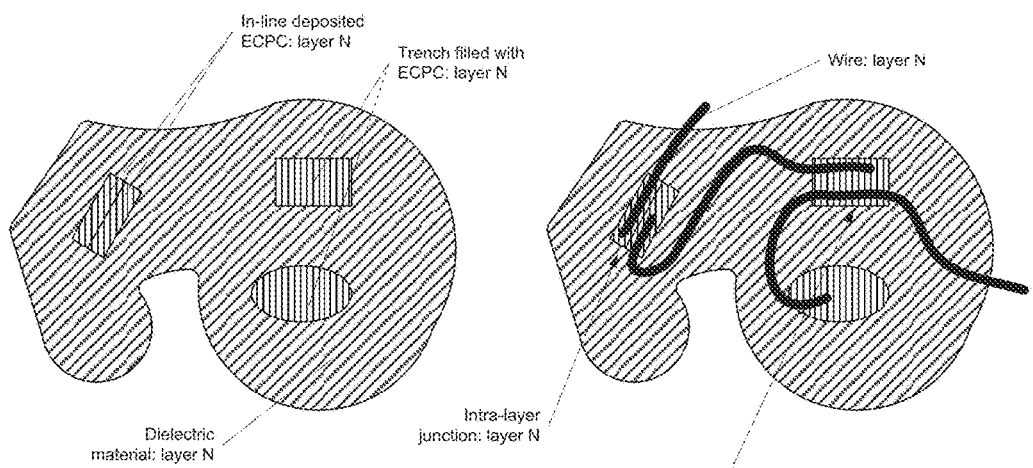
FIG. 13a
FIG. 13b
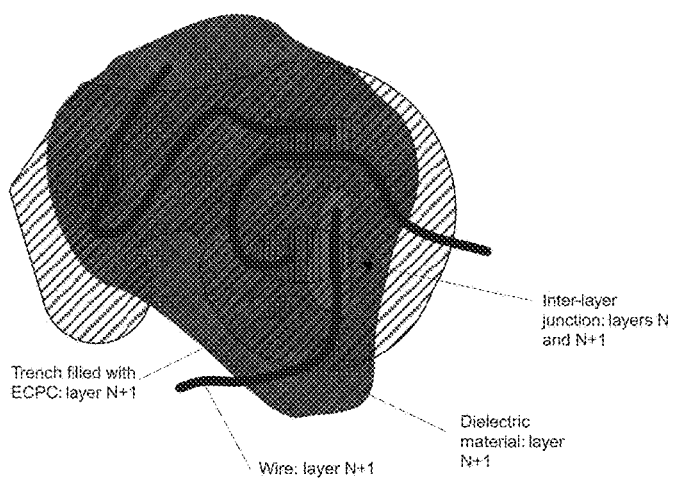
FIG. 13c

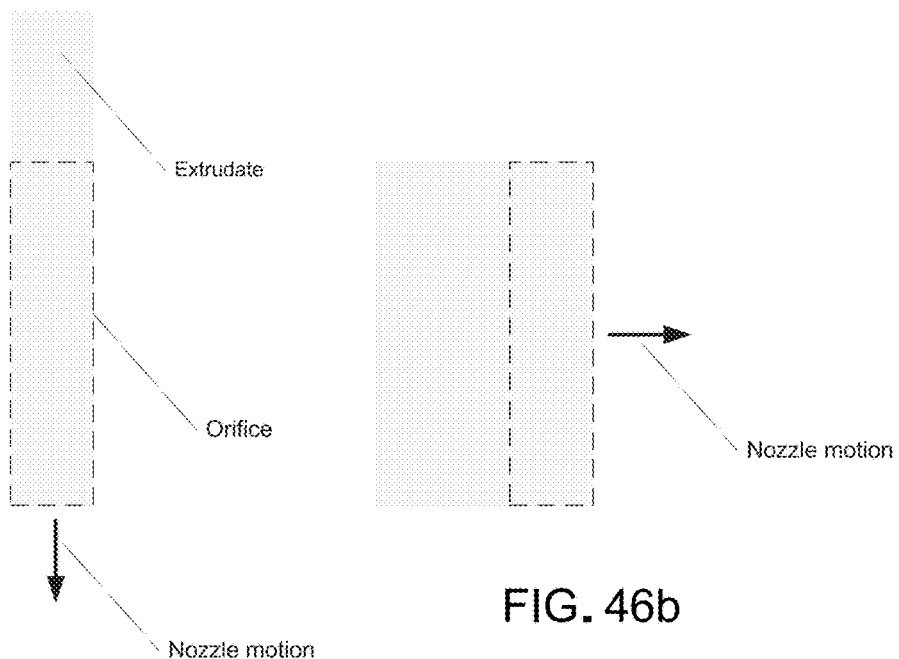
FIG. 46b
FIG. 46a
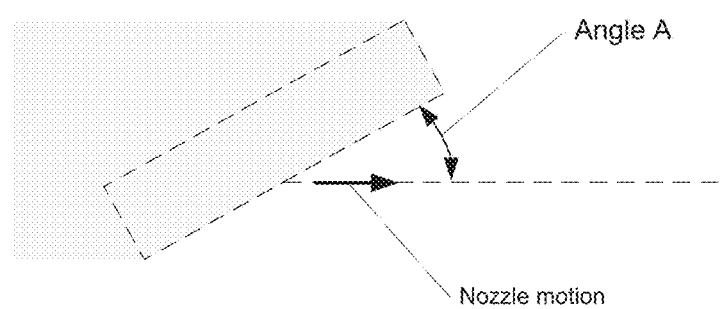
FIG. 46c

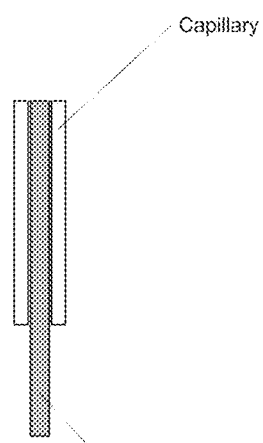
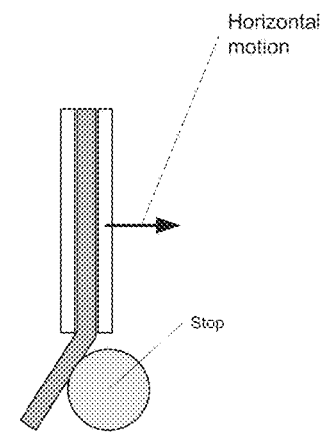
FIG. 53a
FIG. 53b
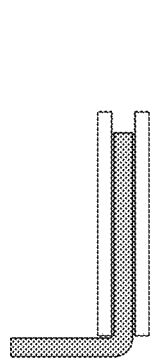
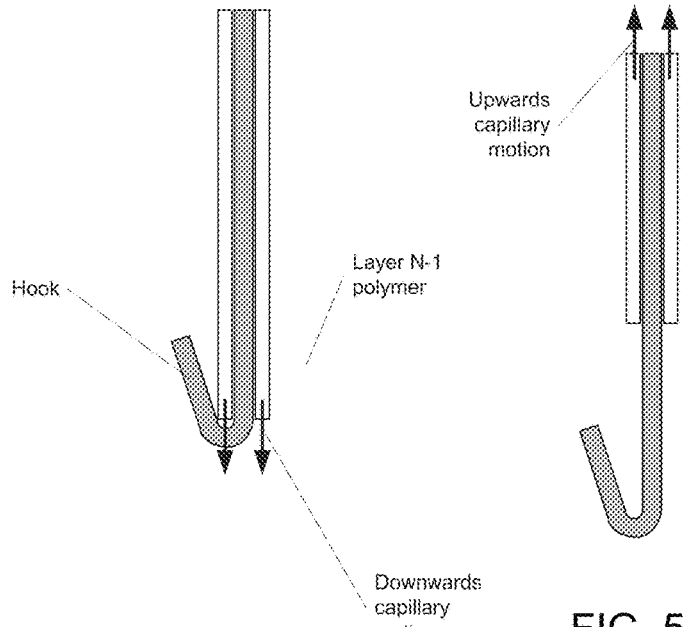
FIG. 53c
FIG. 53d
FIG. 53e

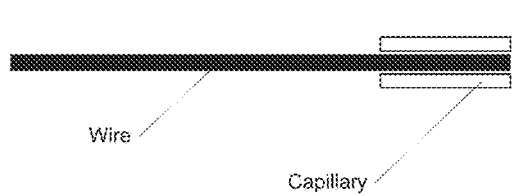
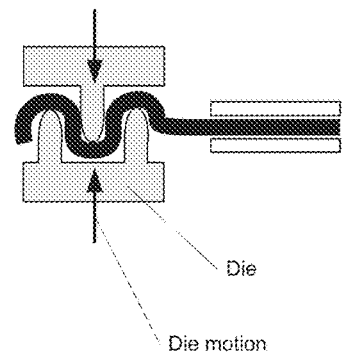
FIG. 54a          FIG. 54b
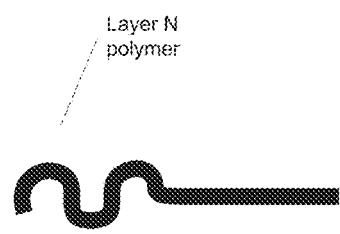
FIG. 54c          FIG. 54d

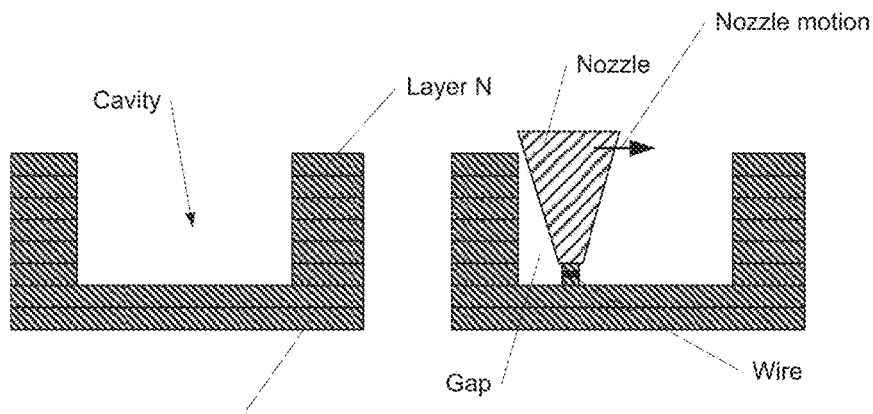
FIG. 63a
FIG. 63b
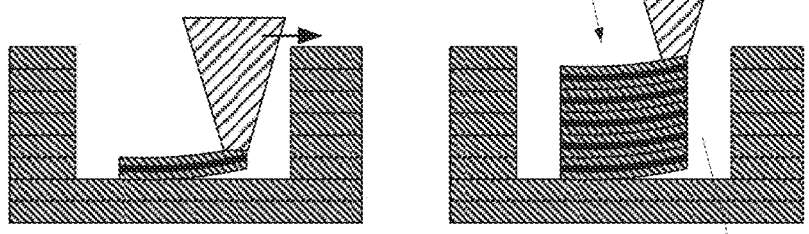
FIG. 63c
FIG. 63d
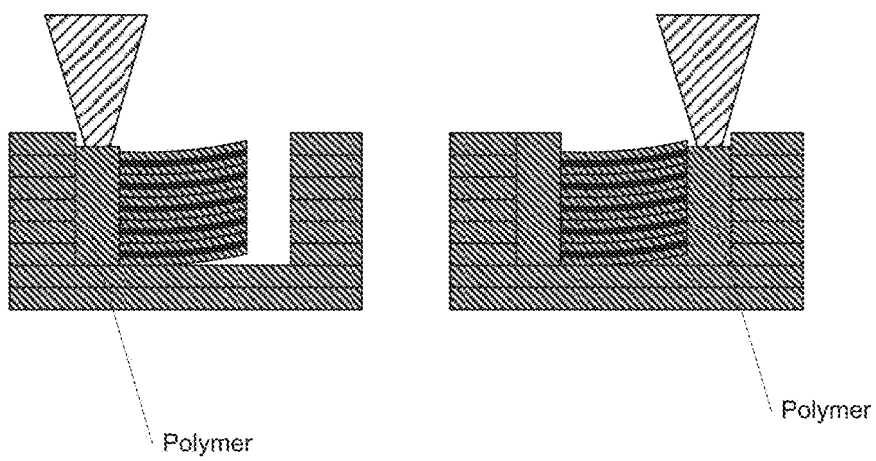
FIG. 63e
FIG. 63f

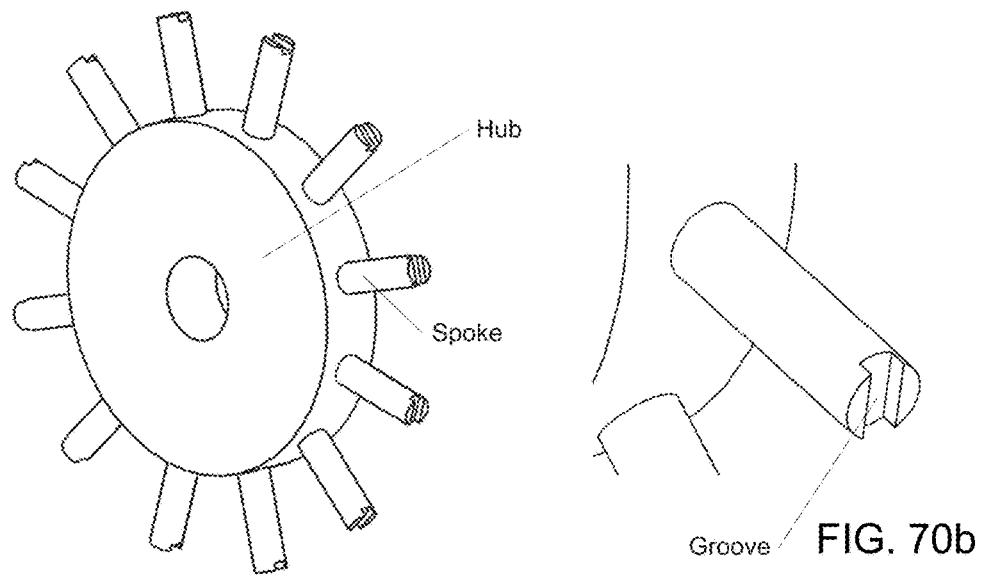
FIG. 70a
FIG. 70b
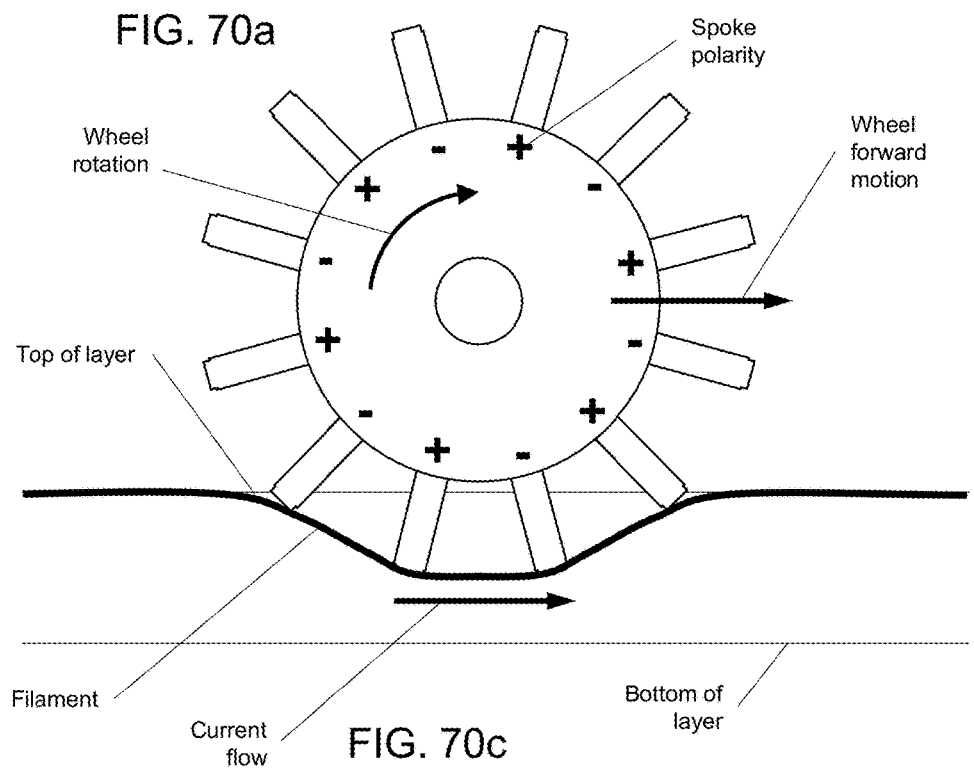
FIG. 70c

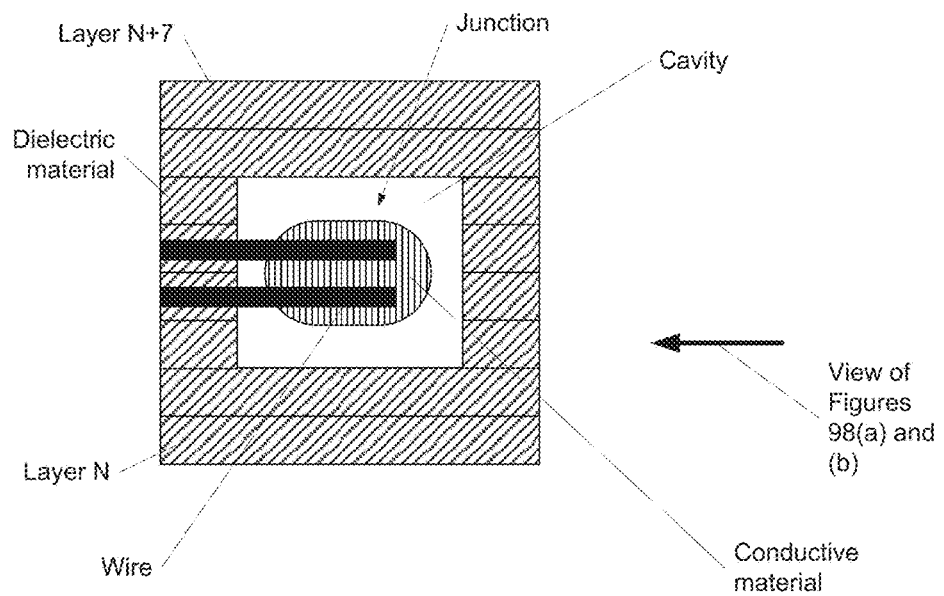
FIG. 98a
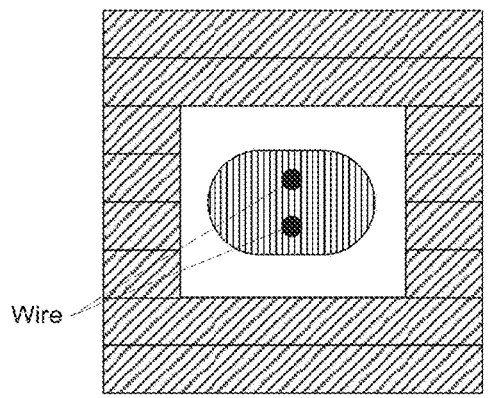 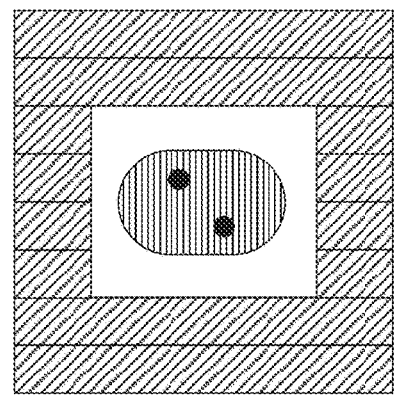
FIG. 98b  FIG. 98c

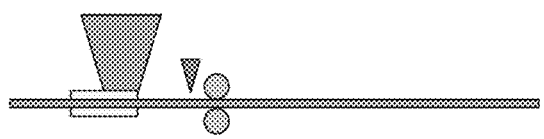
FIG. 105e"
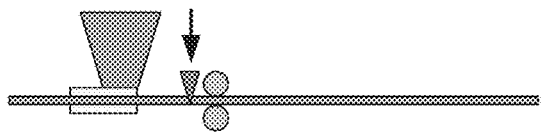
FIG. 105f"
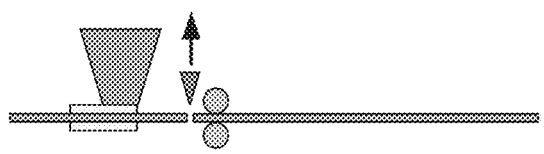
FIG. 105g"
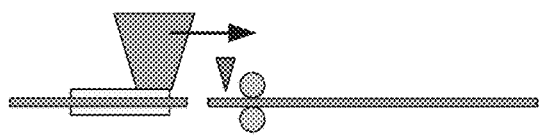
FIG. 105h"

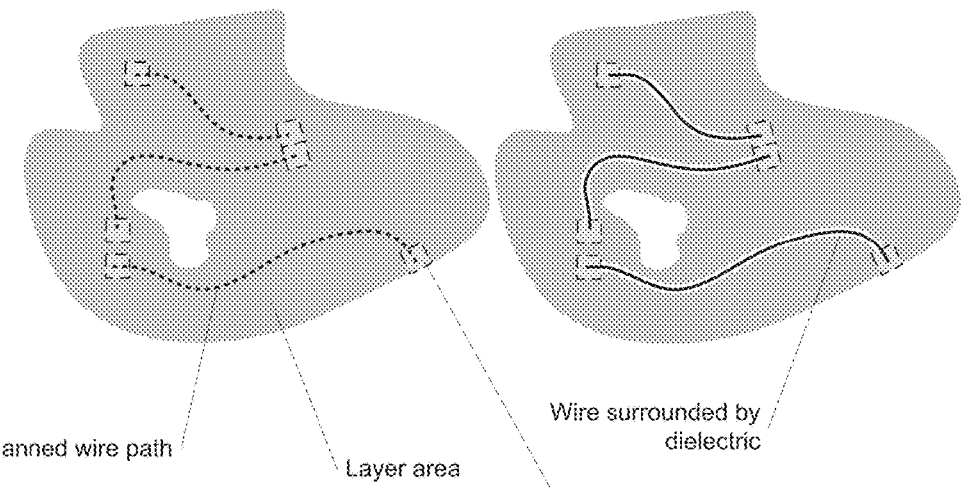
FIG. 108a — Planned wire path, Layer area
FIG. 108b — Wire surrounded by dielectric, Planned cavity for conductive material
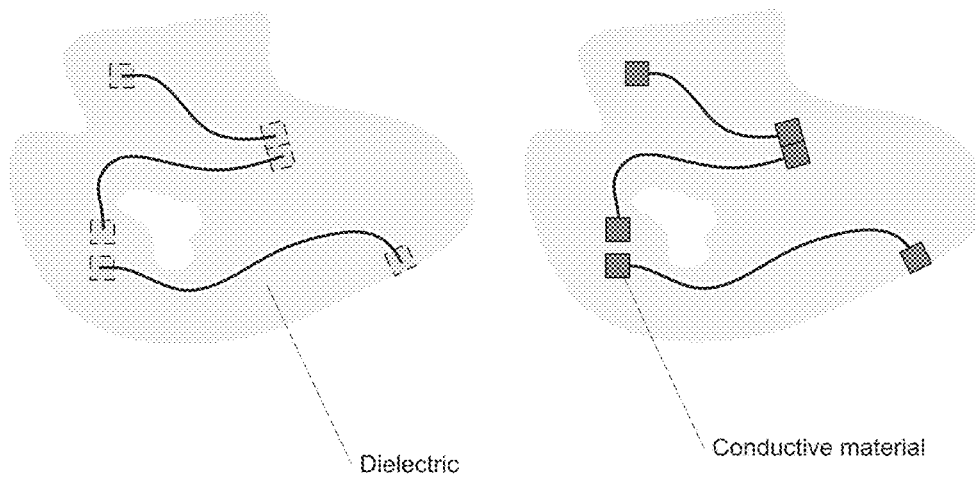
FIG. 108c — Dielectric
FIG. 108d — Conductive material

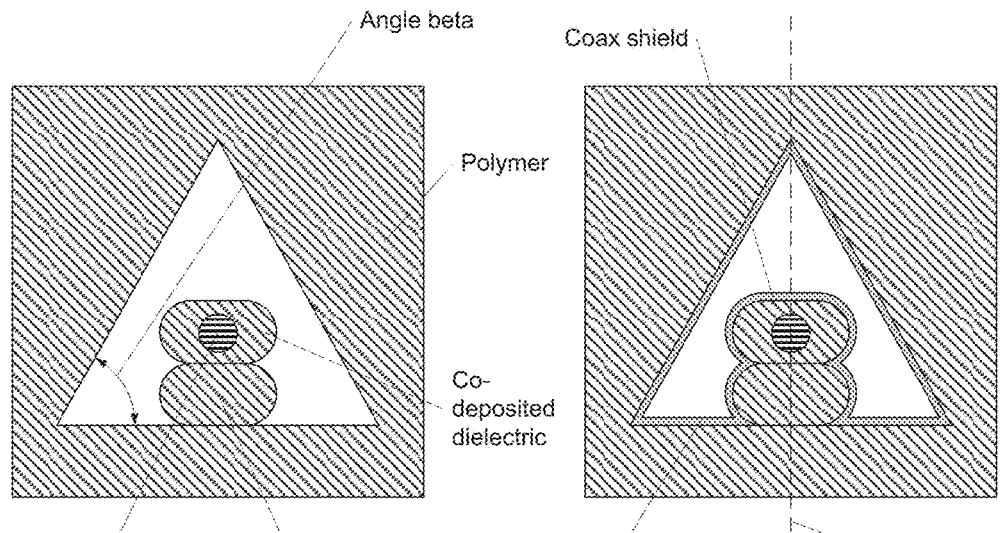
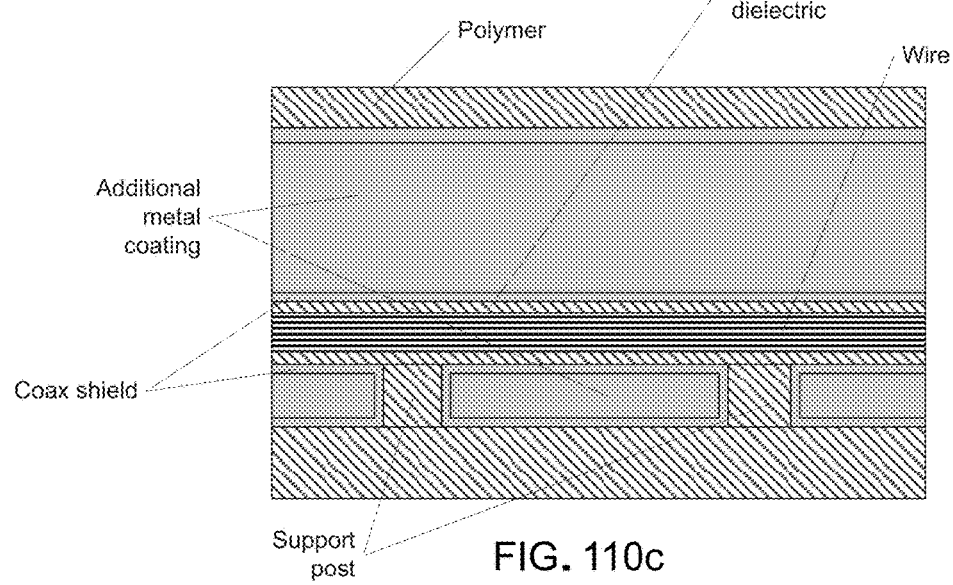
FIG. 110a  FIG. 110b  FIG. 110c

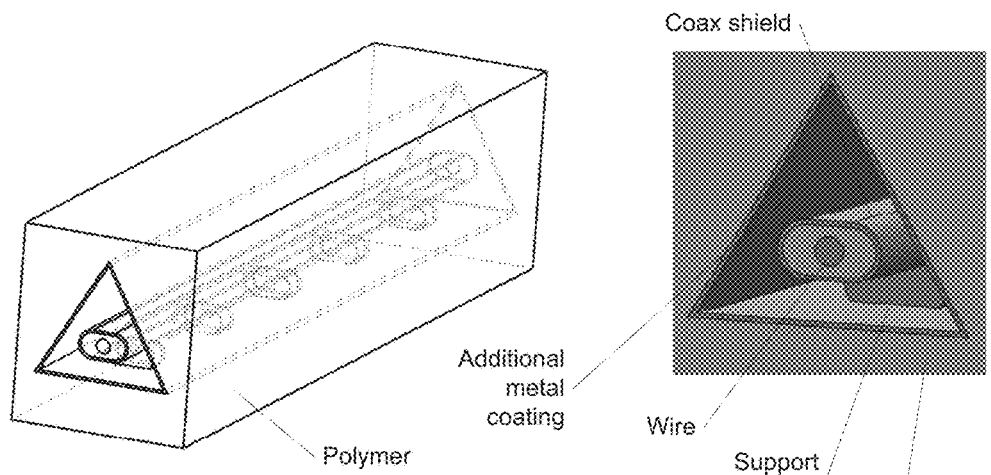
FIG. 110d
FIG. 110e
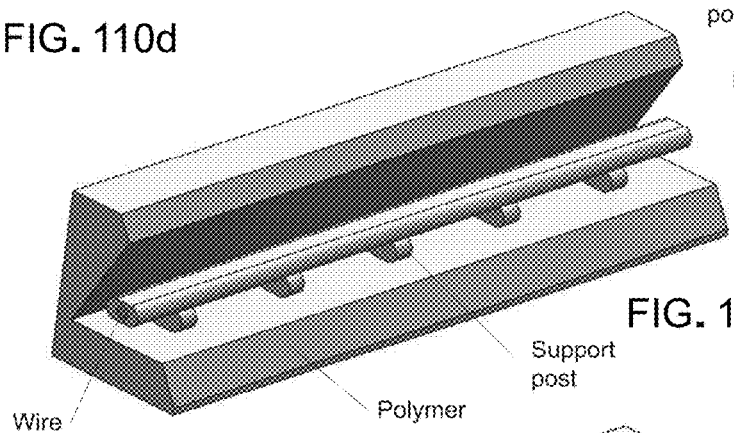
FIG. 110f
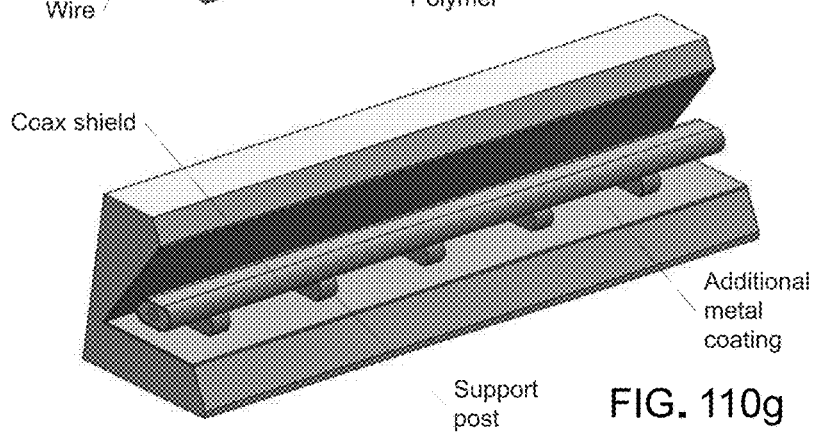
FIG. 110g

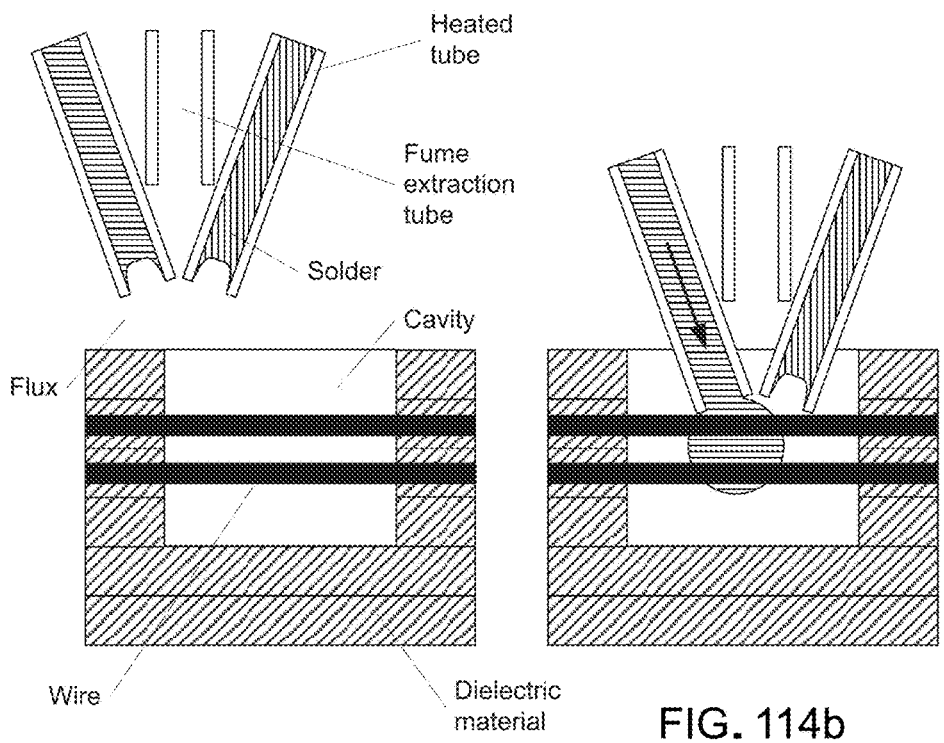
FIG. 114a
FIG. 114b
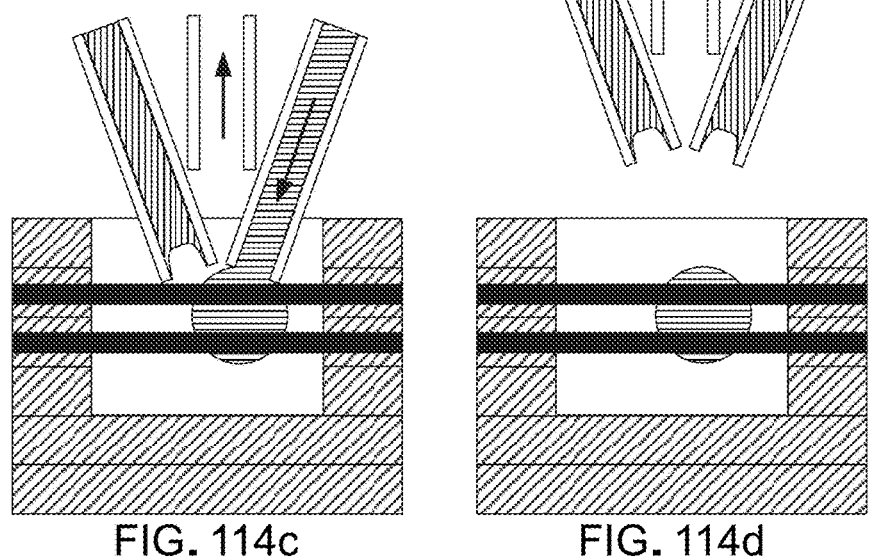
FIG. 114c
FIG. 114d

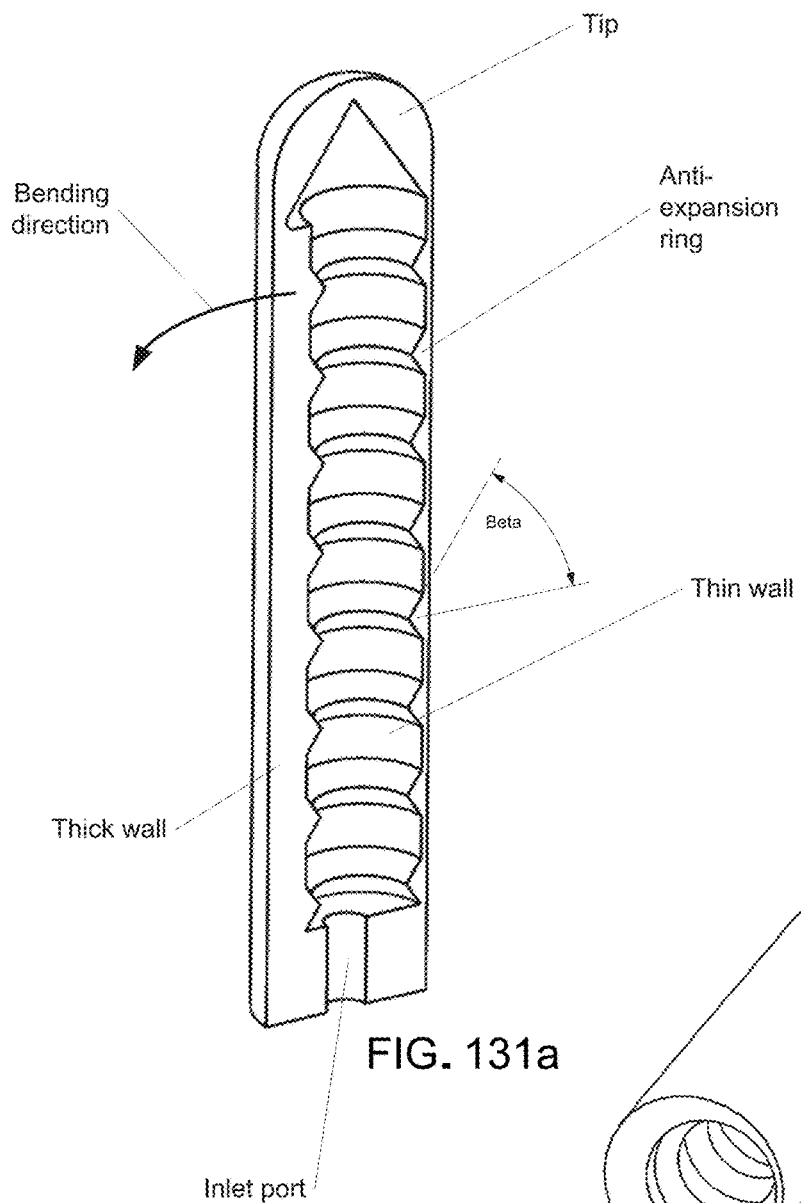
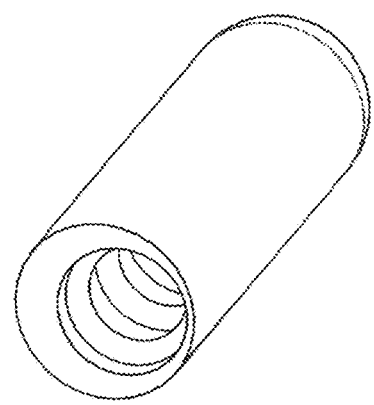
FIG. 131a
FIG. 131b

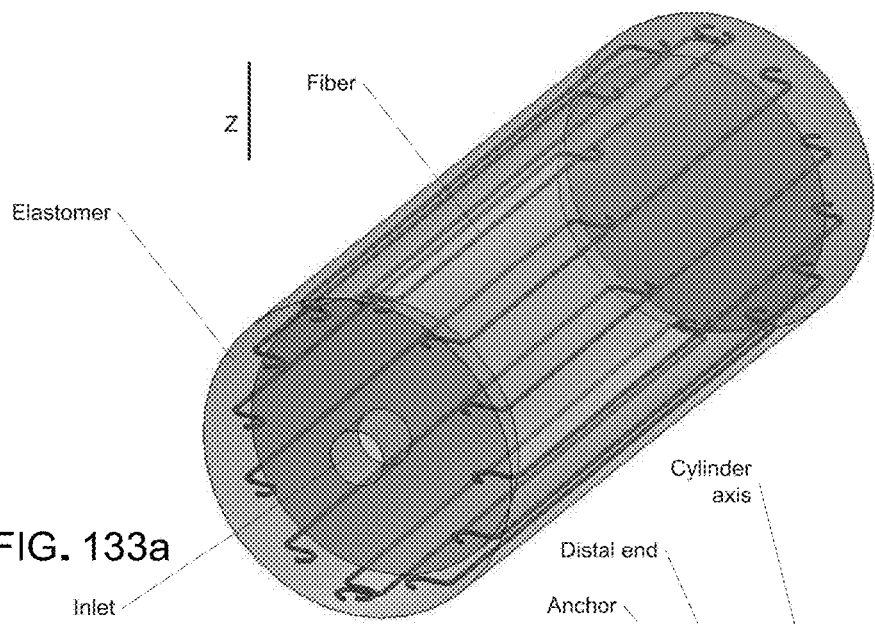
FIG. 133a
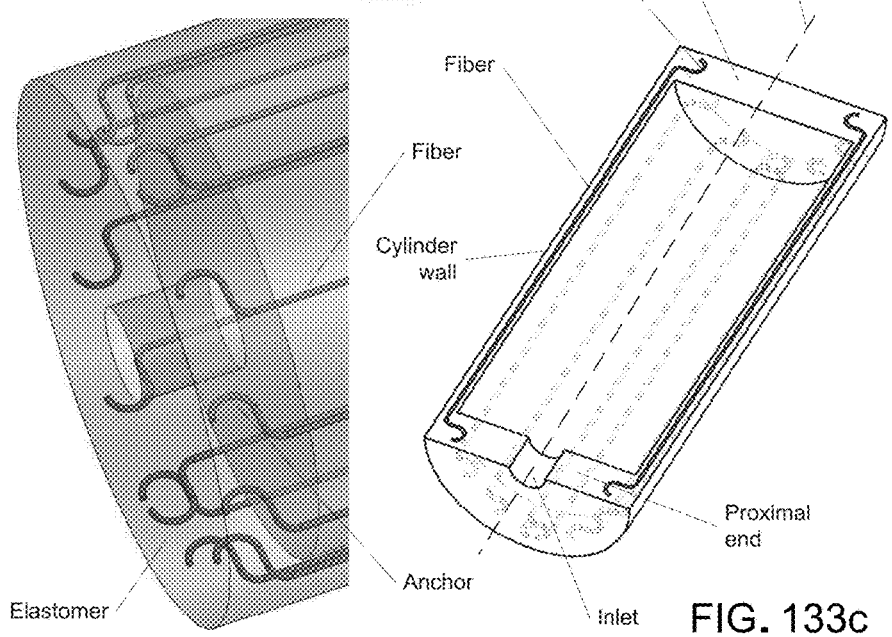
FIG. 133b
FIG. 133c

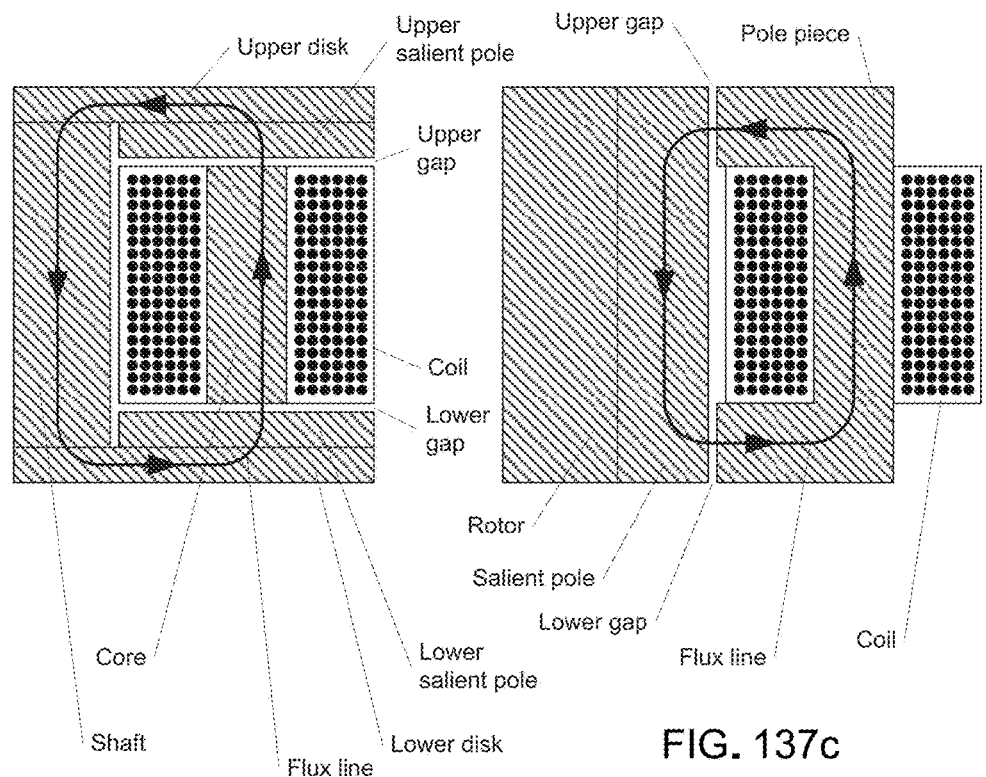
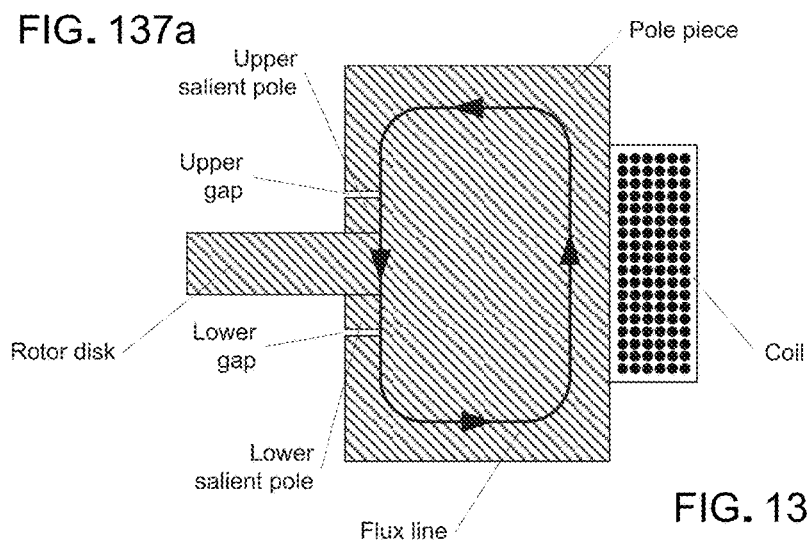
FIG. 137a
FIG. 137b
FIG. 137c

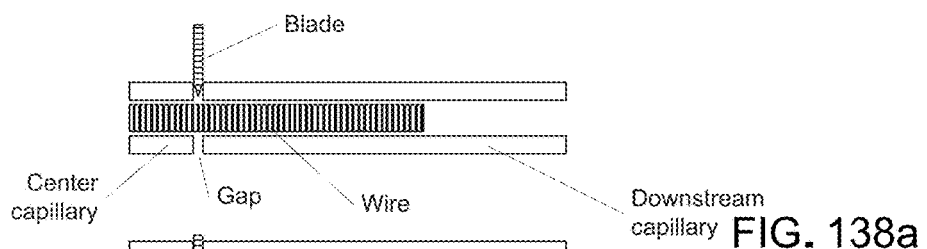
FIG. 138a
FIG. 138b
FIG. 138c
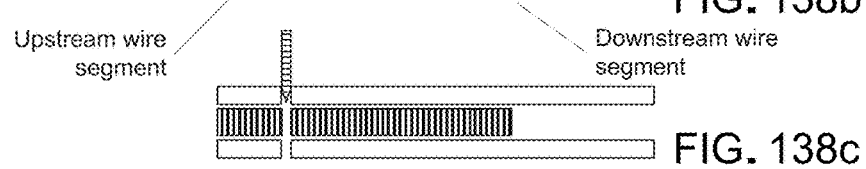
FIG. 138d
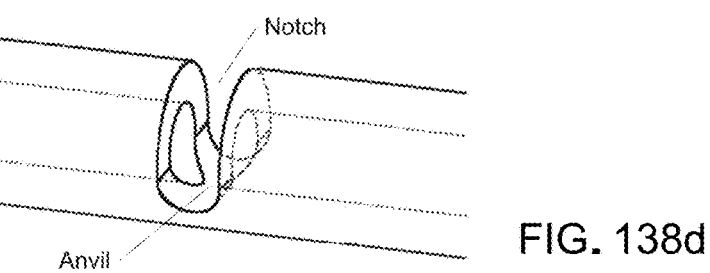
FIG. 138a'
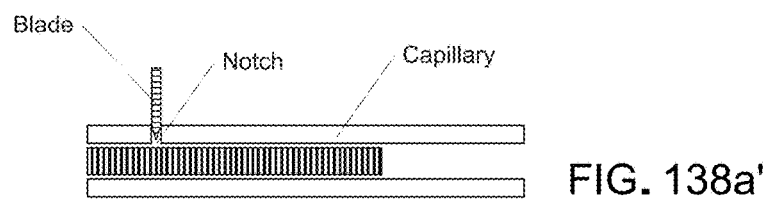
FIG. 138b'
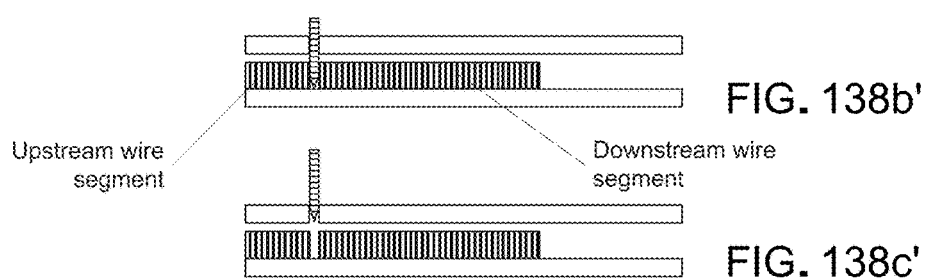
FIG. 138c'

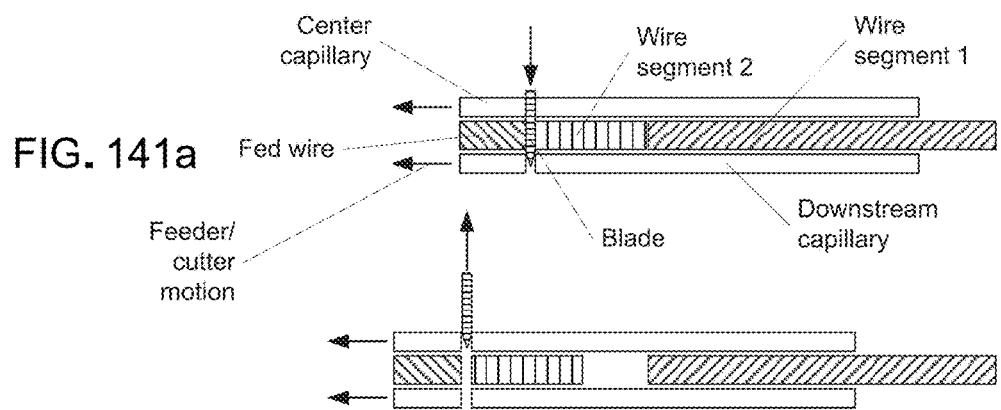
FIG. 141a
FIG. 141b
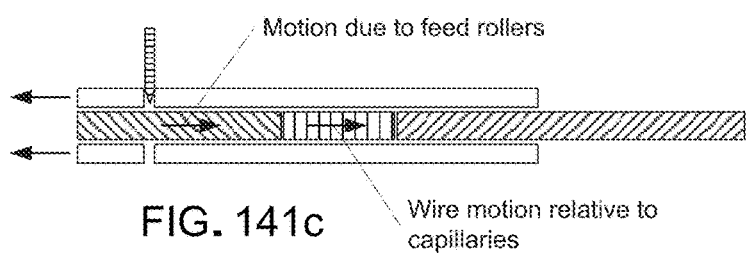
FIG. 141c
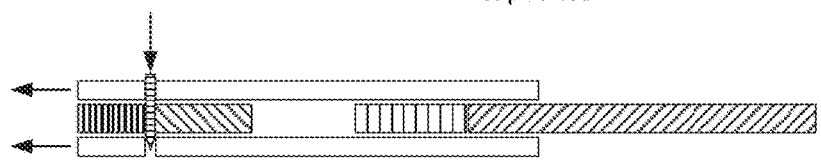
FIG. 141d
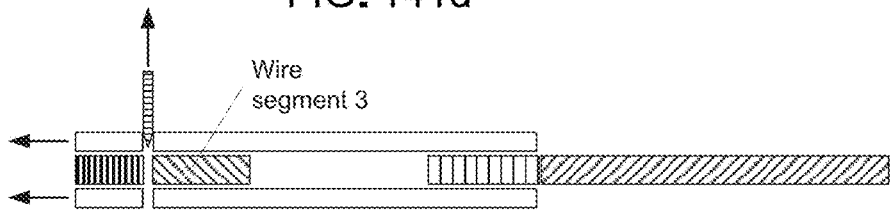
FIG. 141e
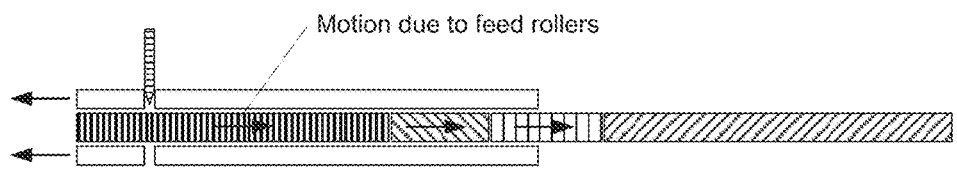
FIG. 141f

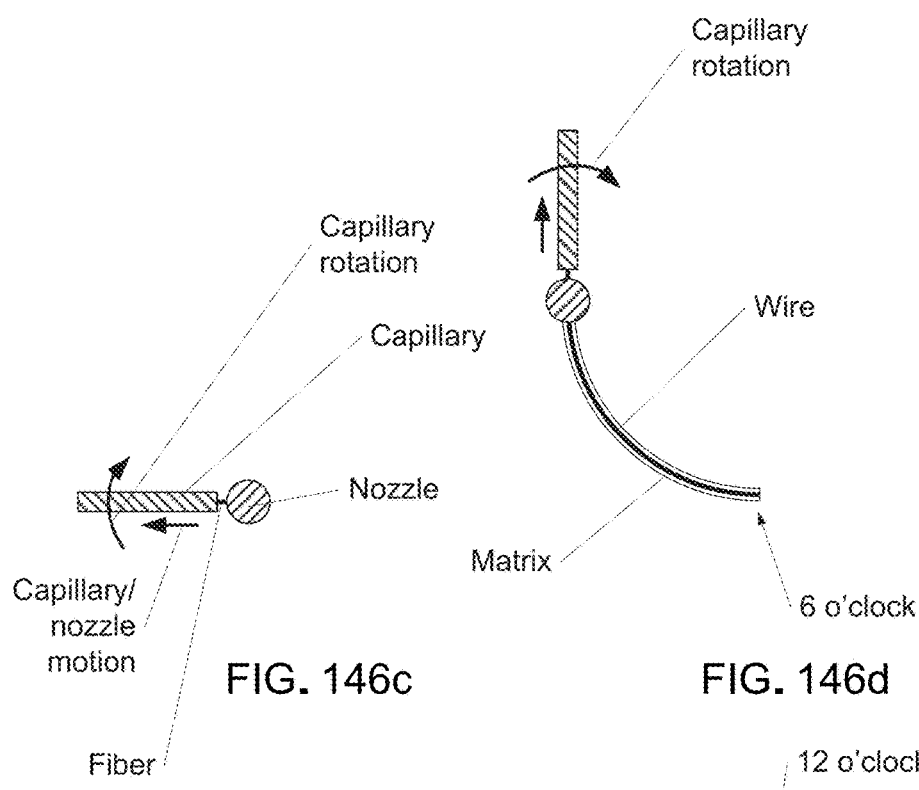
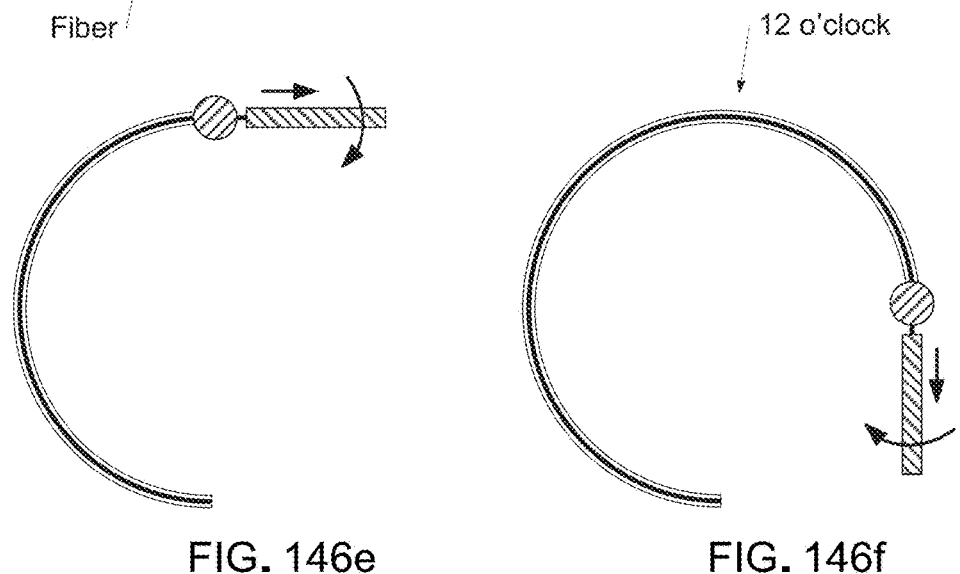
FIG. 146c FIG. 146d
FIG. 146e FIG. 146f

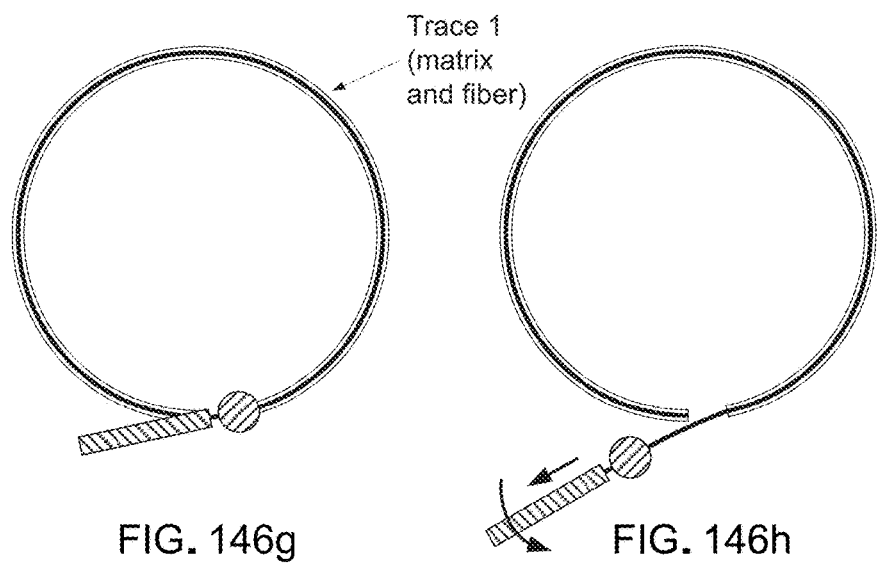
FIG. 146g
FIG. 146h
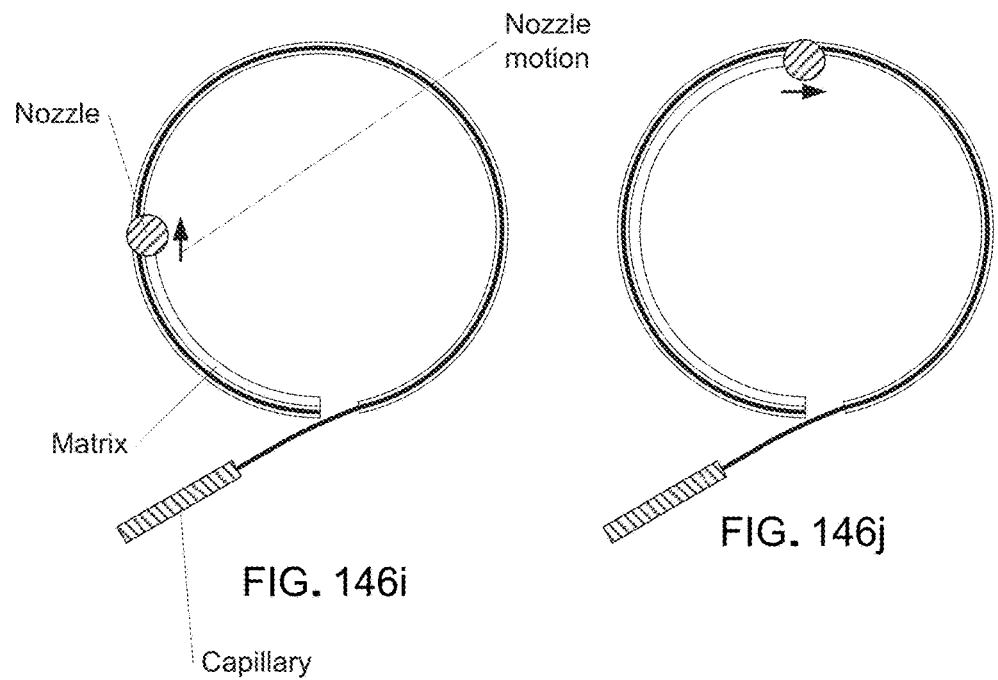
FIG. 146i
FIG. 146j

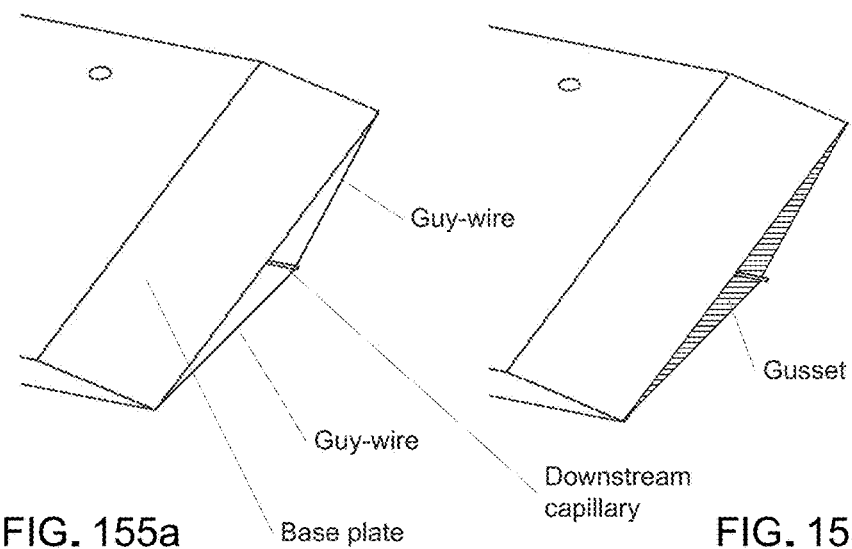
FIG. 155a
FIG. 155c
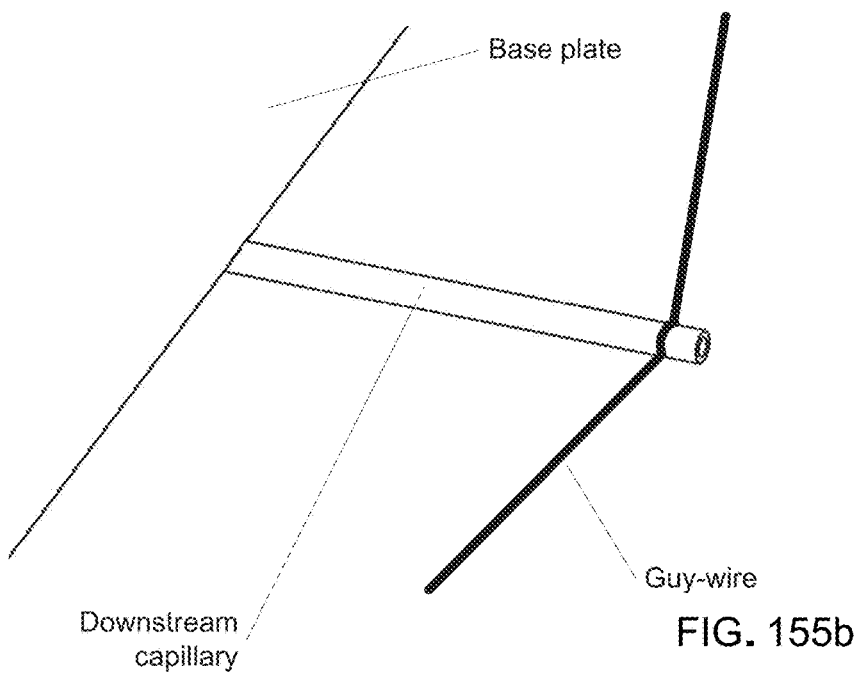
FIG. 155b

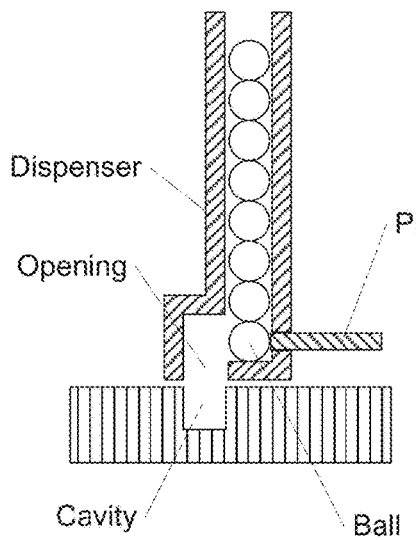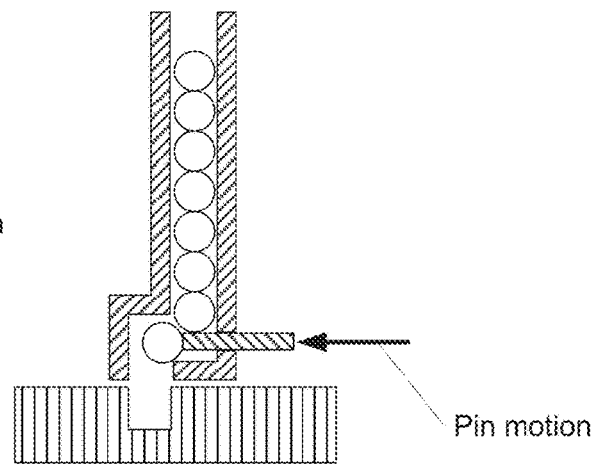
FIG. 157a  FIG. 157b
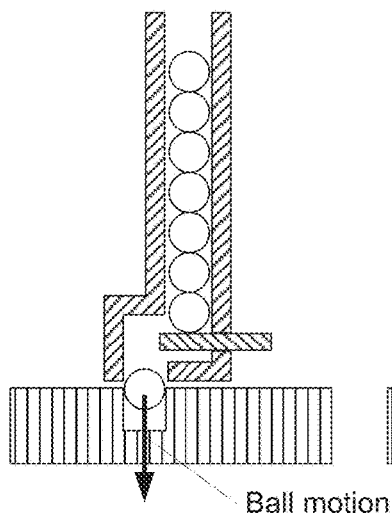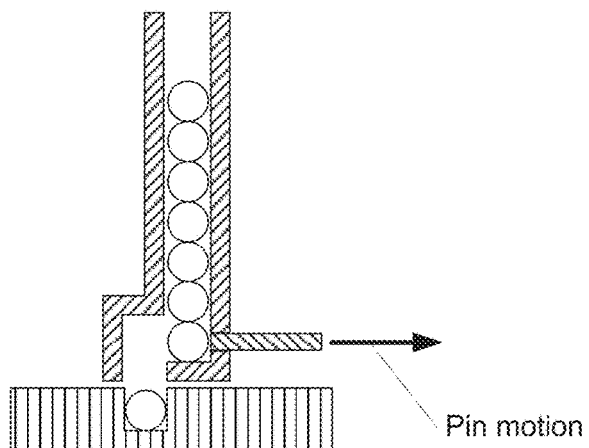
FIG. 157c  FIG. 157d

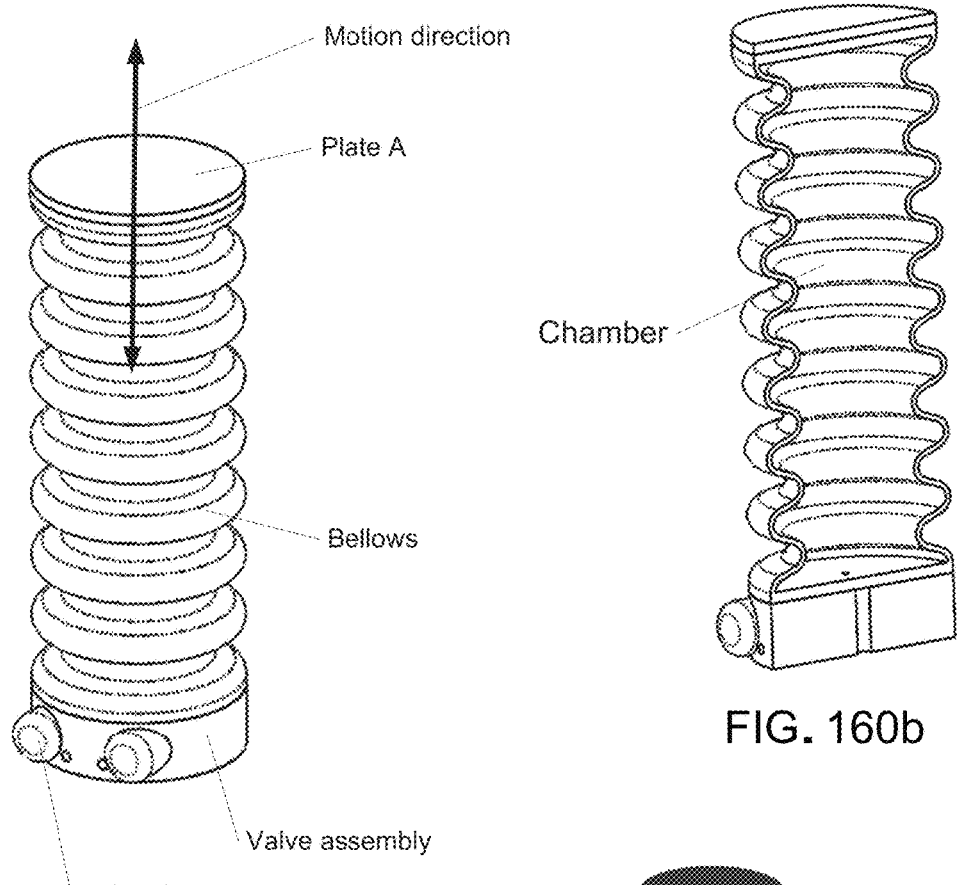
FIG. 160a
FIG. 160b
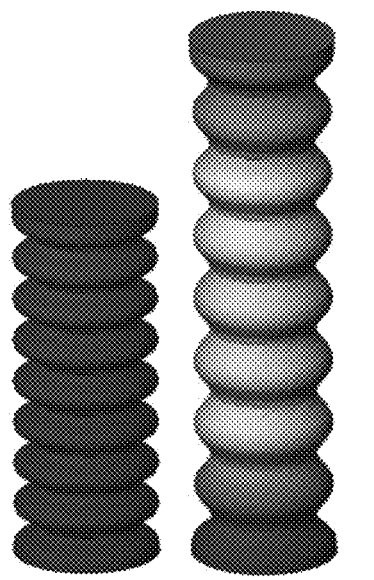
FIG. 160c

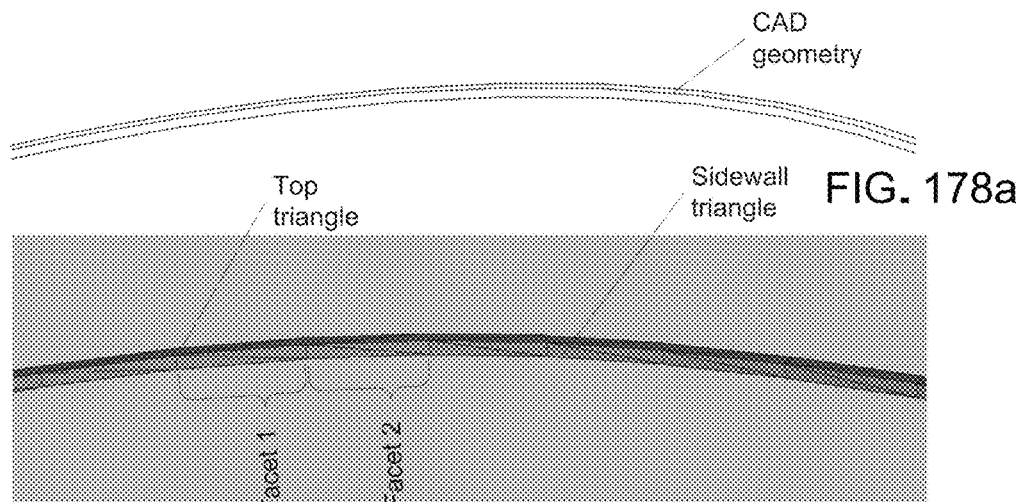
FIG. 178a
FIG. 178b
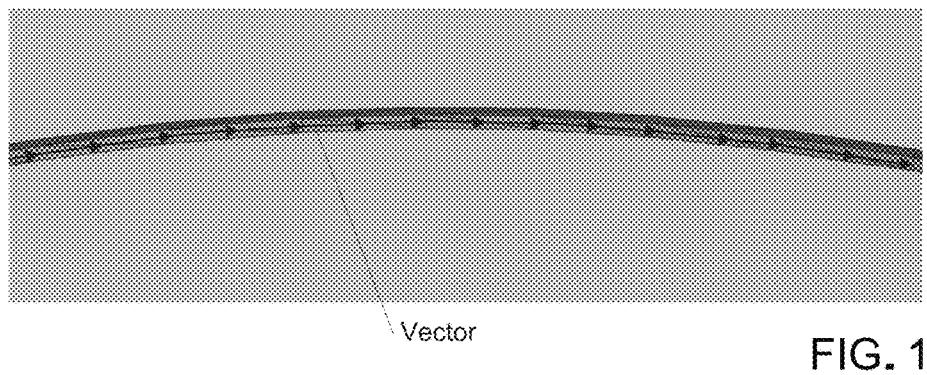
FIG. 178c
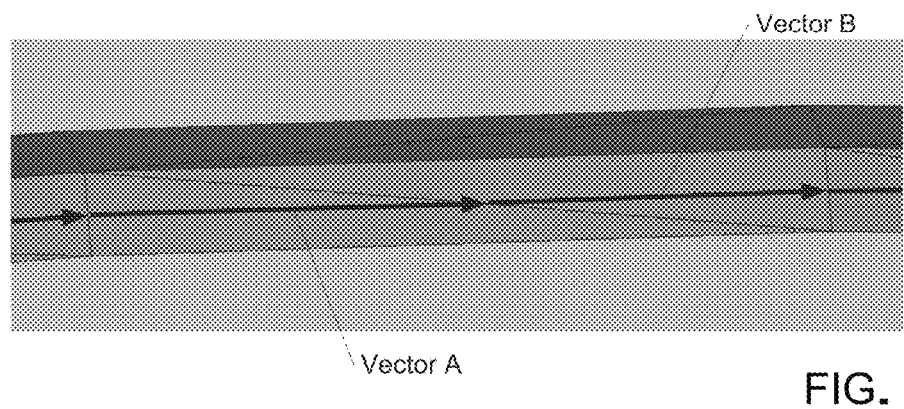
FIG. 178d

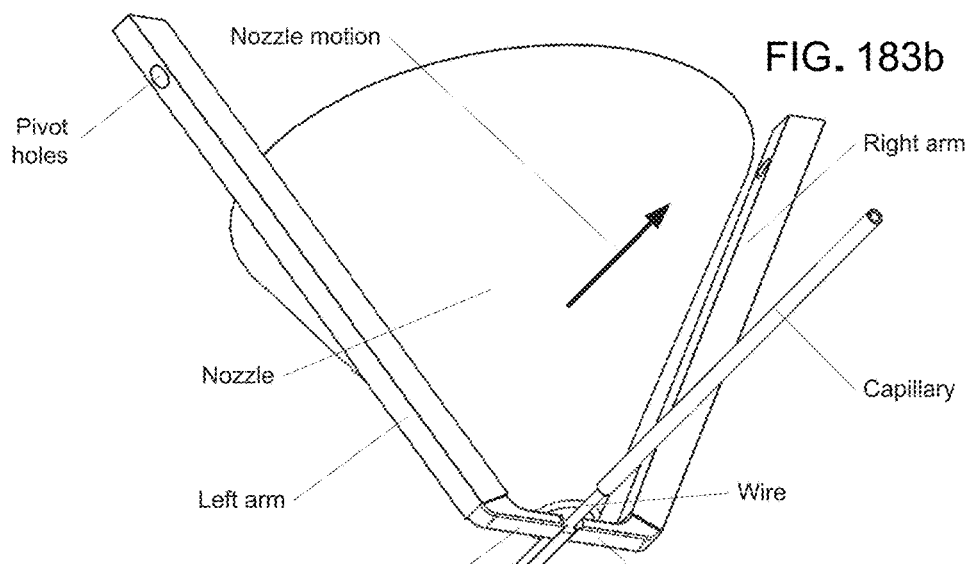
FIG. 183a
FIG. 183b
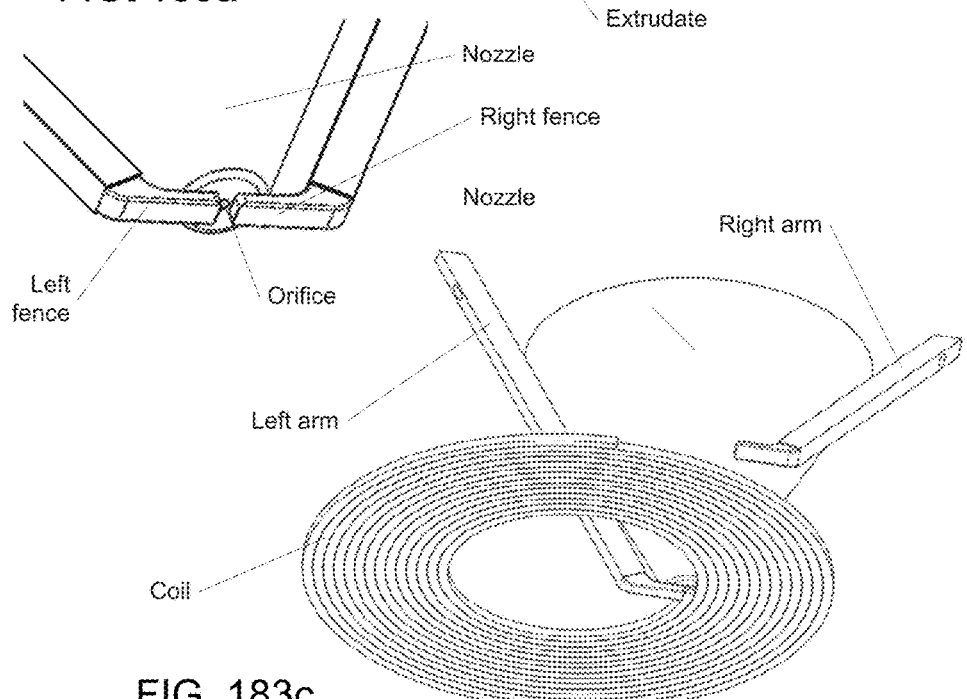
FIG. 183c

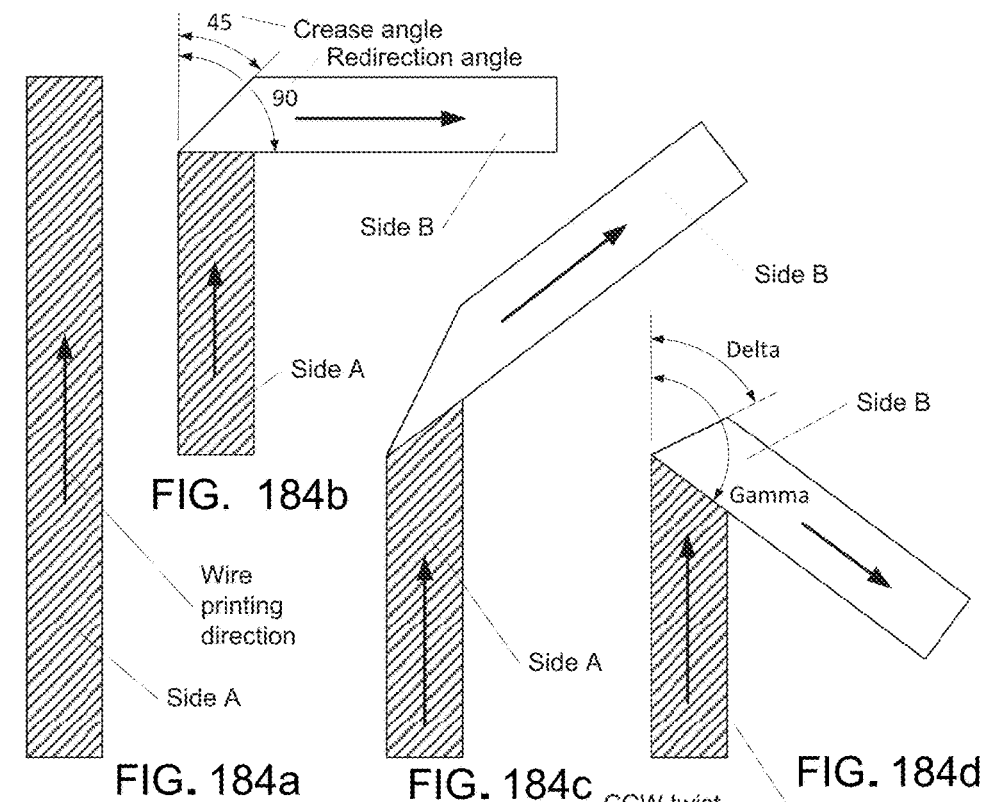
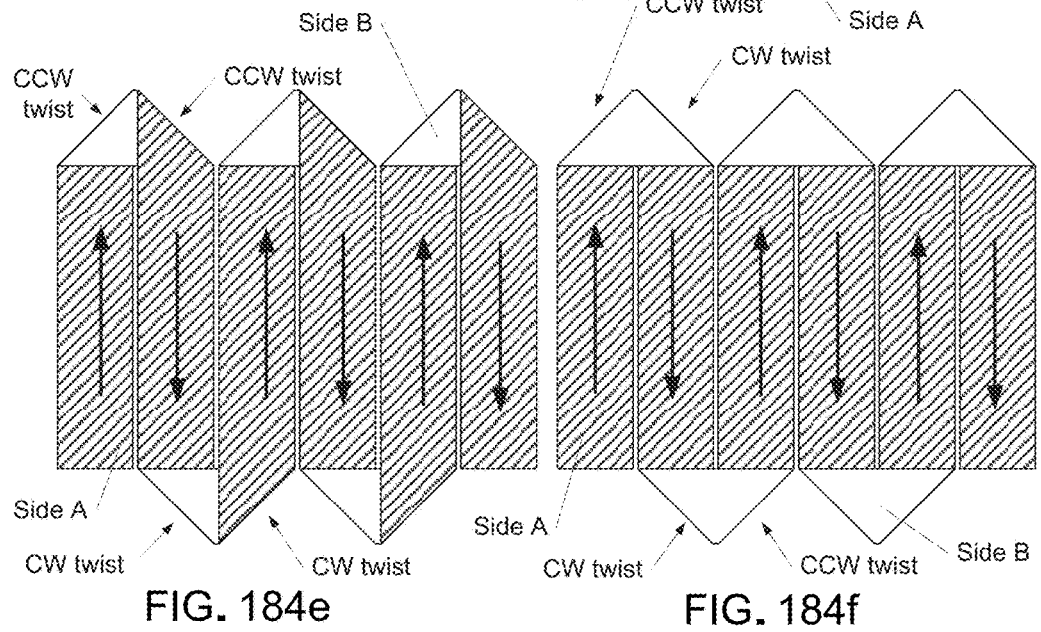

ADDITIVE MANUFACTURING OF ACTIVE DEVICES USING DIELECTRIC, CONDUCTIVE AND MAGNETIC MATERIALS

CROSS-REFERENCE TO RELATED APPLICATIONS

This application claims the benefit of priority of U.S. Application Ser. No. 62/371,581 (filed on Aug. 5, 2016), which is incorporated by reference herein in its entirety.

STATEMENT OF FEDERALLY FUNDED RESEARCH

This invention was made with govern support under NSF award #1317961: "NRI: Small: Additive Manufacturing of Soft Robot Components with Embedded Actuation and Sensing" awarded by National Science Foundation. The government has certain rights in the invention.

TECHNICAL FIELD

The present disclosure relates generally to the fields of additive manufacturing/3-D printing, robotics, electronic packaging, biomedical devices, and other fields.

BACKGROUND

Without limiting the scope of the disclosure, its background is described in connection with 3-D printing/additive manufacturing.

Multi-material and composite additive manufacturing (AM): Objet's (Rehovot, Israel, now merged with Stratasys) Polyjet™ technology can print structures from two dielectric photopolymers. Multi-material stereolithography using multiple vats of liquid (dielectric) photopolymer has been demonstrated [Wicker et al., 2009], and multi-material FDM has been explored [Espalin, 2012]. Ceramic and metal composites made with FDM have been described by several researchers [Kumar and Kruth, 2010; Vaidyanathan et al., 1999; Onagoruwa et al., 2001; McNulty et al., 1998; Agarwala et al., 1996] and FDM-produced injection molding dies using metallic composites were made [Masood and Song, 2004] and characterized for thermal conductivity [Nikzad et al., 2011].

Electromechanical structures by AM: FDM of ABS and low-melting point alloys such as Bi58Sn42 has been used to make simple multilayer structures having a dielectric structural component and an electrical conductor [Mireles et al., 2012]. However, this approach is limited by the relatively high electrical resistance of solders (Bi58Sn42 solder has ~22 times higher resistivity than annealed Cu); maintaining the integrity of solder melting at 138° C. while adjacent to polymer deposited at a higher temperature; the inability to use solder to make magnetic elements for electromagnetic actuators; mechanical weakness; brittleness common in Bi-based solders; significant electromigration risk; mutual adhesion of molten solder to polymer; and throughput (polymer and metal dispensed from separate nozzles). Others have demonstrated simple electromechanical/electronic devices fabricated by AM including relays, timing circuits using integrated circuits added manually, and flashlights [Periard et al., 2007; Malone and Lipson, 2007; Alonso et al., 2009; Malone and Lipson, 2008]. For example, a solenoid was fabricated using solder for coils, silicone for dielectric, and iron powder in grease for a core [Alonso et al., 2009]. While useful as a demonstration, the process was cumbersome and not fully-automated. Stratasys (Eden Prairie, Minn.) and Optomec (Albuquerque, N. Mex.) have demonstrated fabricating structures in rigid polymer using FDM and depositing traces of silver nanoparticle ink using aerosol jetting on the exterior surfaces of the structure [O'Reilly and Leal, 2010]. Trace resistivity can be as low as 1×10-5 ohm-cm, but part surface roughness, applicability to accessible surfaces only, and the need to sinter the ink remain challenges. Similar work has been done by researchers using stereolithography and micro-dispensing pumps [Lopes et al., 2012]. In both these efforts, traces are necessarily confined to external surfaces unless channels are manually filled by pumping [DeNava et al., 2008]; therefore the circuitry, like that produced by O'Reilly and Leal, is not truly 3-D and solenoid-type coils seem impossible. Moreover, these processes are not integrated or fully-automated. Others have postulated the use of curved layers to produce integrated electromechanical structures using FDM, insisting incorrectly that circuits cannot be produced using planar processes due to inter-layer connectivity issues [Diegel et al., 2011]. Curved layers introduce many difficulties and in any case do not truly obviate the need for a solution to interlayer connectivity.

More recently, Voxel8 Inc. (Somerville, Mass.) has developed a multi-material 3-D printer using FDM to deposit a thermoplastic polymer as dielectric and structural element, and an extrusion head to deposit between the layers of thermoplastic a rapidly-setting silver-based conductive ink to form interconnects. However, the Voxel8 process requires a separate step to deposit the conductor, and the ink is approximately 30 times higher in resistivity than metallic copper, has unknown maximum current density, and is extremely costly (indeed, over 1500 times as costly as copper wire for a "wire" of the same total resistance).

Wire embedding AM: While most prior efforts to integrate conductive and dielectric materials in AM assume that the conductive material cannot be a solid metal, a student project called "SpoolHead" investigated the use of FDM and metal wire to make 3-D circuits [Bayless et al., 2010], inspired by an adhesive-coated wire-based AM method [Lipsker, 2000]. Earlier work [e.g., Rabinovich, 1996] explored generating 3-D structures using laser welding of flat-sided wire. The SpoolHead project aimed to deposit thermoplastic using FDM, then interrupt the process and lay down wire while attempting to secure it to the polymer by remelting. Later, a process developed at the University of Texas at El Paso began to develop an approach [Aguilera et al., 2013] similar to SpoolHead, but in which wire is pushed just below the surface of a printed layer using either ultrasonic vibration or Joule heating to reflow the thermoplastic matrix material, allowing wire embedding. Junctions between wires or between wires and added components are created by laser welding. Due to the complex and costly equipment required and the relatively low processing speed, the process is not economical for producing most electromechanical or electronic devices, especially in significant volume. Moreover, the embedding process requires that the matrix be reflowable.

Elastomer AM: Additive manufacturing with elastomer materials is currently available. Polyjet can print with elastomeric photopolymer, and 3D Systems' (Rock Hill, S.C.) selective laser sintering process can work with powdered elastomer. Both techniques produce rather fragile parts, and neither is capable of selectively incorporating conductive materials. Elastomers have been cast and combined with other materials using a subtractive/additive process [Cutkosky and Kim, 2009]. Of most relevance, FDM of thermoplastic elastomers was demonstrated at Virginia Tech [Elkins et al., 1997] by changing the design of a standard FDM printhead to reduce the risk of filament buckling and to optimize filament feed rollers. Also, Stratasys commercialized for some time an elastomer FDM material branded as E20.

Molded Interconnect Device: Molded interconnect device (MID) is a device produced via injection molding of thermoplastic and having circuitry integrated into the device. The process is limited to locating circuit elements on the surface of the device; they cannot be located internally, so it would, for example, be impossible to produce a multi-layer, 3-D coil. Moreover, MID conductors tend to be thin and not capable of carrying higher currents.

SUMMARY

The present disclosure relates to a multi-material additive manufacturing process comprising: extruding an extrudable material through a nozzle capable of moving along one or more axis and concurrently dispensing one or more filaments, wherein the filament is encapsulated within or on an extrudate extruded from the nozzle. In one aspect, the filament is dispensed so as to become encapsulated nominally coaxial with the extrudable material. In another aspect, the filament is a metal, a semiconductor, a ceramic, a synthetic or natural thread, a conductor, a conductive polymer, a magnetic material, a conductive powder, a fiber, an optical fiber, a tube, a coaxial cable, or a conductive thermoplastic polymer. In another aspect, one or more filaments are wound into coils, formed into a block, formed into a cylinder or other shapes to form one or more actuators, sensors, thermal management structures (e.g., made using wire and/or a composite containing metal or boron nitride particles), switches, transformers, fuses, resistors, capacitors, supercapacitors, inductors, chokes, antennae (e.g., patch, fractal), batteries, external connecting pads, variable-resistance resistors, force sensors, pressure sensors, temperature sensors, cores and armatures for electromagnetic devices, capacitor plates, heat sinks, solenoids, heat conduction structures or power supplies. In another aspect, two or more filaments are formed into one or more mechatronic structures. In another aspect, the extrudable material is a thermoplastic material, a dielectric material, an elastomeric material, a thermoset material, a moisture-curing material, an air-hardening material, or a deformable material. In another aspect, the one or more filaments are connected electrically by a metal, a semiconductor, a ceramic, a conductor, a conductive polymer, a conductive powder, or a conductive thermoplastic polymer. In another aspect, the process further comprises the step of connecting one or more integrated circuits, actuators, sensors, thermal management structures, switches, transformers, fuses, resistors, capacitors, inductors, antennae, batteries, external connecting pads or power supplies to the one or more filaments. In another aspect, the one or more filaments are defined further as one or more sacrificial filaments that when removed create one or more open conduits or vias. In another aspect, wherein the one or more filaments are surrounded by a dielectric and the dielectric is removable by at least one method selected from laser processing, heating, mechanical stripping, or plasma etching. In another aspect, the one or more filaments are joined by welding, soldering, brazing, ultrasonic or thermosonic bonding, crimping, winding, pressure contact, or mutual entanglement. In another aspect, the process further comprises the step of segmenting (e.g., cutting or breaking) the one or more filaments upon deposition. In another aspect, the process further comprises a control system (e.g., a computer) that controls the steps of extruding the thermoplastic material and the one or more filaments.

Another embodiment of the present disclosure relates to a system for a multi-material additive manufacturing process comprising: a first nozzle for extruding an extrudable material through a nozzle capable of moving along one or more axis; and a filament, fiber, or wire dispenser that concurrently extrudes one or more filaments, wherein the filament is encapsulated within or on extrudate from the nozzle. In one aspect, the filament is extruded nominally coaxial with the thermoplastic material. In another aspect, the filament is a metal, a semiconductor, a ceramic, a conductor, a conductive polymer, a magnetic material, a conductive powder, a fiber, an optical fiber, a tube (e.g., through which fluid can flow, or shape memory wires may be routed), a coaxial cable, or a conductive thermoplastic polymer. In another aspect, the one or more filaments are wound into coils, formed into a block, formed into a cylinder or other shapes to form one or more actuators, sensors, thermal management structures, switches, transformers, fuses, resistors, capacitors, inductors, antennae, batteries, external connecting pads, variable-resistance resistors, force sensors, pressure sensors, temperature sensors, cores and armatures for electromagnetic devices, capacitor plates, heat sinks, solenoids, heat conduction structures or power supplies. In another aspect, the two or more filaments are formed into one or more mechatronic structures. In another aspect, the extrudable material is a thermoplastic material, a dielectric material, an elastomeric material, or a deformable material. In another aspect, the one or more filaments are connected electrically by a metal, a semiconductor, a ceramic, a conductor, a conductive polymer, a conductive powder, or a conductive thermoplastic polymer. In another aspect, one or more integrated circuits, actuators, sensors, thermal management structures, switches, transformers, fuses, resistors, capacitors, inductors, antennae, batteries, external connecting pads or power supplies, to the one or more filaments. In another aspect, the one or more filaments are defined further as one or more sacrificial filaments that when removed create one or more open conduits or vias. In another aspect, wherein the one or more filaments are surrounded by a dielectric and the dielectric is removable by at least one method selected from laser processing, heating, mechanical stripping, or plasma etching. In another aspect, the one or more filaments are joined by welding, soldering, brazing, ultrasonic or thermosonic bonding, crimping, winding, pressure contact, or mutual entanglement. In another aspect, the system further comprises a cutter capable of cutting the one or more filaments upon deposition. In another aspect, the system further comprises a computer that controls the steps of extruding the thermoplastic material and the one or more filaments.

Yet another embodiment of the disclosure relates to an apparatus for a multi-material additive manufacturing process comprising: a first nozzle for extruding a thermoplastic material through a nozzle capable of moving along one or more axis; and a filament dispenser that concurrently extrudes one or more filaments, wherein the filament is encapsulated within or on extrudate from the nozzle. In one aspect, the filament is extruded nominally coaxial with the thermoplastic material. In another aspect, the filament is a metal, a semiconductor, a ceramic, a conductor, a conductive polymer, a magnetic material, a conductive powder, a fiber, an optical fiber, a tube, a coaxial cable, or a conductive thermoplastic polymer. In another aspect, the one or more filaments are wound into coils, formed into a block, formed into a cylinder or other shapes to form one or more actuators, sensors, thermal management structures, switches, transformers, fuses, resistors, capacitors, inductors, antennae, batteries, external connecting pads, variable-resistance resistors, force sensors, pressure sensors, temperature sensors, cores and armatures for electromagnetic devices, capacitor plates, heat sinks, solenoids, heat conduction structures or power supplies. In another aspect, the two or more filaments are formed into one or more mechatronic structures. In another aspect, the extrudable material is a thermoplastic material, a dielectric material, an elastomeric material, or a deformable material. In another aspect, the one or more filaments are connected electrically by a metal, a semiconductor, a ceramic, a conductor, a conductive polymer, a conductive powder, or a conductive thermoplastic polymer. In another aspect, one or more integrated circuits, actuators, sensors, thermal management structures, switches, transformers, fuses, resistors, capacitors, inductors, antennae, batteries, external connecting pads or power supplies, to the one or more filaments. In another aspect, the one or more filaments are defined further as one or more sacrificial filaments that when removed create one or more open conduits or vias. In another aspect, wherein the one or more filaments are surrounded by a dielectric and the dielectric is removable by at least one method selected from laser processing, heating, mechanical stripping, or plasma etching. In another aspect, the one or more filaments are joined by welding, soldering, brazing, ultrasonic or thermosonic bonding, crimping, winding, pressure contact, or mutual entanglement. In another aspect, the apparatus further comprises a cutter capable of cutting the one or more filaments upon deposition. In another aspect, the apparatus further comprises a computer that controls the steps of extruding the thermoplastic material and the one or more filaments.

Thus, the Fiber Encapsulation Additive Manufacturing (hereinafter "FEAM", formerly known as 3-D Polymer+ Wire Printing, or "3dPWP")) process, system, and apparatus of the present disclosure provides a truly multi-material Additive Manufacturing (AM) process that can fabricate functional electromechanical devices using a polymer and a wire. More generally, the polymer may be another, non-polymeric material such as a ceramic, and the wire may be a fiber or filament of any composition, a tube, a solidifying liquid, or other element. The term "polymer" should be understood to include all materials extrudable from a nozzle and solidifiable by cooling, evaporation, thermal curing, UV curing, etc. The term "wire" should be understood to include wire (e.g., metal wire) and any fiber or filament such as carbon fiber, glass fiber, polymer fiber, small-diameter tubing, and all other materials and structures having a substantially filament or fiber-like shape. These materials can be monofilament or have multiple strands, sometimes impregnated and held together by a resin similar to prepreg used in composite manufacturing. FEAM greatly extends AM to enable automated fabrication of multi-material, multi-functional components and devices having embedded 3-D circuitry, actuators, sensors (e.g. accelerometers, strain gauges, tactile arrays, and touch screen overlays), thermal management structures (e.g., heat sinks, heat pipes, fluid channels, cooling fluid pumps), switches, transformers, fuses, resistors, capacitors, inductors, and antennae, among other elements.

The key aspect of the FEAM process is simultaneous co-deposition of a fiber and an extrudable material that surrounds and encapsulates the fiber. This aspect alone makes possible a variety of objects to be fabricated. However, important additional aspects of the FEAM process, which provide more capability, are the ability to stop and start the fiber (achieved for example using a feeder/cutter as described below), and the ability to join fibers together to form junctions which allow electric currents (or in some embodiments optical signals) to flow from one fiber to another, link fibers mechanically so that stresses can be coupled from one fiber to another, etc. The potential impact of FEAM is in providing a new means of monolithically producing fully-customized functional components and systems without the need for assembly, directly from digital data. In the semiconductor industry, monolithic fabrication has made possible the integrated circuit. At the macro scale—and incorporating mechanical, not just electrical elements—monolithic fabrication can also have a huge benefit, reducing cost while increasing reliability and quality, and enabling products impossible with traditional approaches.

The methods and apparatus of FEAM incorporate materials such as metal wire (e.g., nickel, copper, aluminum, silver, gold, superelastic nickel-titanium, and solder: either pure or plated with such metals as gold and silver for corrosion resistance and/or polymer compatibility) and conductive composites into a structure or device that is built up one layer at a time in an additive manufacturing process. More specifically, FEAM provides for simultaneous deposition of conductive and/or ferromagnetic wires together with polymer: either a pure polymer (e.g., an elastomer) or an electrically conductive polymer composite (ECPC) composed of polymer and conductive filler particles. The ability to controllably deposit these three materials (and in some cases, others) provides enormous flexibility in creating mechatronic structures with embedded electromagnetic elements.

The present disclosure provides a multi-material additive manufacturing process, system, and apparatus for fabricating 3-D structures, devices, components, systems, products, and assemblies comprising polymer and wire, and in some embodiment variations, also conductive polymer composite. Such fabricated objects, or articles, are generally active, in the sense of incorporating circuitry, actuators, and/or sensors, and can be used in robotics, defense systems, medical devices, consumer electronics, and many other fields.

The present disclosure provides a process, system, and apparatus for fabricating a 3-D structure, device, component, system, product, or assembly using a layer-by-layer, additive manufacturing process wherein an extrudate that forms at least a portion of a layer comprises a matrix (i.e., structural, build, or model) material and a wire, fiber, or fluid conduit (hereinafter "fiber") encapsulated at least in part within the matrix material. In some implementations, a major (i.e., longitudinal) axis of the fiber can be substantially parallel to that of the extrudate, while in others, the fiber can be in any orientation relative to the extrudate. For example, the fiber can be coiled or arranged differently within the extrudate.

The present disclosure provides a process, system, and apparatus for fabricating a 3-D structure, device, component, system, product, or assembly using a layer-by-layer, additive manufacturing process wherein an extrudate that forms at least a portion of a layer comprises a dielectric matrix material and an encapsulated metallic wire whose major axis is substantially parallel to that of the extrudate.

The present disclosure provides a process, system, and apparatus for fabricating a 3-D structure, device, component, system, product, or assembly using a layer-by-layer, additive manufacturing process wherein a matrix material and a fiber are co-deposited, resulting in a fiber encapsulated within a matrix.

The present disclosure provides a process, system, and apparatus for fabricating a 3-D structure, device, component, system, product, or assembly using a layer-by-layer, additive manufacturing process wherein a fiber encapsulated within a matrix and forming at least a portion of a layer is in some embodiment variations joined electrically, mechanically, or both to other fibers in the same or a different layer.

The present disclosure provides a process, system, and apparatus for fabricating a 3-D structure, device, component, system, product, or assembly using a layer-by-layer, additive manufacturing process wherein in some embodiment variations a metallic wire, encapsulated within a conductive matrix and forming at least a portion of a layer, is electrically connected to other metallic wires in the same or a different layer through the conductive matrix.

The present disclosure provides a process, system, and apparatus for fabricating a 3-D structure, device, component, system, product, or assembly using a layer-by-layer, additive manufacturing process wherein in some embodiment variations a metallic wire encapsulated within a conductive matrix and forming at least a portion of a layer is electrically connected to other metallic wires in the same or a different layer through the conductive matrix and the conductive matrix comprises a polymer and conductive particles.

The present disclosure provides a process, system, and apparatus for fabricating a 3-D structure, device, component, system, product, or assembly using a layer-by-layer, additive manufacturing process wherein in some embodiment variations a conductive matrix comprising a polymer includes conductive particles at a concentration above the percolation threshold such that some contamination by dielectric material will not significantly lower conductance, and wherein some contamination of dielectric material by conductive particles will not render the dielectric material conductive.

The present disclosure provides a process, system, and apparatus for fabricating a 3-D structure, device, component, system, product, or assembly using a layer-by-layer, additive manufacturing process wherein in some embodiment variations metallic wires are joined by welding, soldering, brazing, ultrasonic or thermosonic bonding, crimping, winding, pressure contact, or mutual entanglement.

The present disclosure provides a process, system, and apparatus for fabricating a 3-D structure, device, component, system, product, or assembly using a layer-by-layer, additive manufacturing process wherein in some embodiment variations a fiber surrounded by an initially fluid matrix material is co-deposited with the matrix material to form at least a portion of a layer and wherein the fiber is directed during deposition such that its major axis is substantially parallel to that of the extrudate by the time the matrix material has solidified.

The present disclosure provides a process, system, and apparatus for fabricating a 3-D structure, device, component, system, product, or assembly using a layer-by-layer, additive manufacturing process including an encapsulated filament wherein in some embodiment variations actuators, sensors, and/or wiring are monolithically fabricated.

The present disclosure provides a process, system, and apparatus for fabricating a 3-D structure, device, component, system, product, or assembly having such elements as embedded 3-D circuitry, actuators, sensors, thermal management structures, switches, transformers, fuses, resistors, capacitors, inductors, and antennae using a multi-material, multi-functional layer-by-layer, additive manufacturing process.

The present disclosure provides a process, system, and apparatus for fabricating a 3-D structure, device, component, system, product, or assembly using a layer-by-layer, additive manufacturing process wherein in some embodiment variations an encapsulated metallic wire is mechanically soft and in some embodiment variations annealed.

The present disclosure provides a process, system, and apparatus for fabricating a 3-D structure, device, component, system, product, or assembly using a layer-by-layer, additive manufacturing process wherein an encapsulated metallic wire is in some embodiment variations circular in cross section.

The present disclosure provides a process, system, and apparatus for fabricating a 3-D structure, device, component, system, product, or assembly using a layer-by-layer, additive manufacturing process wherein an encapsulated metallic wire is in some embodiment variations rectangular or square in cross section.

The present disclosure provides a process, system, and apparatus for fabricating a 3-D structure, device, component, system, product, or assembly using a layer-by-layer, additive manufacturing process wherein in some embodiment variations a matrix and a fiber are co-deposited along a curved path and a spool or other fiber storage means is rotated to counteract torsion resulting from such deposition.

The present disclosure provides a process, system, and apparatus for fabricating a 3-D structure, device, component, system, product, or assembly using a layer-by-layer, additive manufacturing process wherein in some embodiment variations a matrix and a fiber are co-deposited along a curved path and the direction of the deposition is alternated between clockwise and counterclockwise to counteract torsion resulting from such deposition.

The present disclosure provides a process, system, and apparatus for fabricating a 3-D structure, device, component, system, product, or assembly using a layer-by-layer, additive manufacturing process wherein in some embodiment variations a deposition head comprises at least one flow channel for matrix material and at least one capillary for filament dispensing.

The present disclosure provides a process, system, and apparatus for fabricating a 3-D structure, device, component, system, product, or assembly using a layer-by-layer, additive manufacturing process wherein in some embodiment variations a deposition head comprises at least one flow channel for dielectric material and at least one flow channel for conductive material.

The present disclosure provides a process, system, and apparatus for fabricating a 3-D structure, device, component, system, product, or assembly using a layer-by-layer, additive manufacturing process wherein in some embodiment variations a deposition head comprises a flow channel for fluid and a capillary with suitable geometry to substantially displace and purge fluid from the flow channel when maneuvered within the flow channel.

The present disclosure provides a process, system, and apparatus for fabricating a 3-D structure, device, component, system, product, or assembly using a layer-by-layer, additive manufacturing process wherein in some embodiment variations a deposition head comprises a clamp to securely hold filament and wherein the clamp is fixed to a capillary and actuated by translating the capillary.

The present disclosure provides a process, system, and apparatus for fabricating a 3-D structure, device, component, system, product, or assembly using a layer-by-layer, additive manufacturing process wherein in some embodiment variations a deposition head comprises a cutter to cut filament and wherein the cutter is fixed to a capillary and actuated by translating the capillary.

The present disclosure provides a process, system, and apparatus for fabricating a 3-D structure, device, component, system, product, or assembly using a layer-by-layer, additive manufacturing process wherein in some embodiment variations filament is dispensed or fed from a deposition head by vibration.

The present disclosure provides a process, system, and apparatus for fabricating a 3-D structure, device, component, system, product, or assembly using a layer-by-layer, additive manufacturing process wherein in some embodiment variations filament is dispensed or fed from a deposition head by anchoring the wire in substantially solidified matrix material and pulling it through the deposition head.

The present disclosure provides a process, system, and apparatus for fabricating a 3-D structure, device, component, system, product, or assembly using a layer-by-layer, additive manufacturing process wherein in some embodiment variations filament is dispensed or fed from a deposition head by two or more rollers which contact the filament and advance it through a capillary slightly larger in inside diameter than the filament outside diameter.

The present disclosure provides a process, system, and apparatus for fabricating a 3-D structure, device, component, system, product, or assembly using a layer-by-layer, additive manufacturing process wherein in some embodiment variations filament is cut or terminated by the sudden application of tension, twisting, or cyclic motion inducing mechanical fatigue.

The present disclosure provides a process, system, and apparatus for fabricating a 3-D structure, device, component, system, product, or assembly using a layer-by-layer, additive manufacturing process wherein in some embodiment variations filament passes through a capillary or other sheath and matrix material is removed from the region of the filament exiting the capillary to prevent the filament from being coated with matrix material.

The present disclosure provides a process, system, and apparatus for fabricating a 3-D structure, device, component, system, product, or assembly using a layer-by-layer, additive manufacturing process wherein in some embodiment variations matrix material coating a filament is removed by methods including laser processing, heating, mechanical stripping, and plasma etching.

The present disclosure provides a process, system, and apparatus for fabricating a 3-D structure, device, component, system, product, or assembly using a layer-by-layer, additive manufacturing process wherein in some embodiment variations filament position within the extrudate along the deposition (e.g., vertical) axis is controlled by adjusting capillary height and/or filament feed rate and in some embodiment variations filament position is controlled in a closed-loop fashion based on sensing the filament position within the extrudate.

It is the object of some aspects of the disclosure to provide a process, system, and apparatus for fabricating a 3-D structure, device, component, system, product, or assembly using a layer-by-layer, additive manufacturing process wherein in some embodiment variations filament position within curved extrudate in the layer plane (e.g., horizontal) is controlled by adjusting capillary rotation angle and/or printhead speed.

The present disclosure provides a process, system, and apparatus for fabricating a 3-D structure, device, component, system, product, or assembly using a layer-by-layer, additive manufacturing process wherein in some embodiment variations toolpaths for the deposition head are determined such that paths which include encapsulated filament are preferentially routed and those which do not include filament are routed at a lower priority.

The present disclosure provides a process, system, and apparatus for fabricating a 3-D structure, device, component, system, product, or assembly using a layer-by-layer, additive manufacturing process wherein separately-manufactured components are incorporated during fabrication process using pick-and-place or other means.

The present disclosure provides a process, system, and apparatus for fabricating a 3-D structure, device, component, system, product, or assembly using a layer-by-layer, additive manufacturing process wherein a removable and preferably soluble support material is provided and at least some of the support material is substantially encapsulated in matrix material to allow retention of at least some of the support material in the final structure, device, component, system, product, or assembly.

The present disclosure provides a process, system, and apparatus for fabricating a 3-D structure, device, component, system, product, or assembly using a layer-by-layer, additive manufacturing process wherein a conductive matrix comprising a polymer and conductive particles is used in the formation of integrated elements such as variable-resistance resistors, force sensors, pressure sensors, temperature sensors, cores and armatures for electromagnetic devices, capacitor plates, heat sinks, and other heat conduction structures.

The present disclosure provides a process, system, and apparatus for fabricating a 3-D structure, device, component, system, product, or assembly using a layer-by-layer, additive manufacturing process wherein the structure, device, component, system, product, or assembly comprises voids, which are fluid-filled and in some embodiment variations interconnected.

The present disclosure provides a process, system, and apparatus for fabricating a 3-D structure, device, component, system, product, or assembly using a layer-by-layer, additive manufacturing process wherein solenoid actuators are joined in series, in parallel, or in a combination of series and parallel.

The present disclosure provides a process, system, and apparatus for fabricating a coil from smaller coils arranged parallel to one another and electrically wired in parallel to one another.

Various embodiments of the disclosure will be apparent to those of skill in the art upon review of the teachings herein. The various embodiments of the disclosure, set forth explicitly herein or otherwise ascertained from the teachings herein, may address one or more of the above objects alone or in combination, or alternatively may address some other object ascertained from the teachings herein. It is not necessarily intended that all embodiments be addressed by any single aspect of the disclosure, even though that may be the case with regard to some aspects. Other aspects of the disclosure may involve combinations of the above noted aspects of the disclosure. These other aspects of the disclosure may provide various combinations of the aspects presented above as well as provide other configurations, structures, functional relationships, and processes that have not been specifically set forth herein.

A key application for the disclosure is in robotics, including soft (i.e., compliant) robots. Traditional robotic systems are comprised of substantially rigid elements with rotary joints and localized actuation. A new class of soft robotic systems is rapidly emerging, driven by a number of performance and application requirements. Due to their intrinsic compliance, soft robots can be more suitable than rigid ones to work safely and collaboratively with and in close proximity to people. Reliable grasping and manipulation of delicate, flexible, and irregular objects found often in the real world (e.g., tools, fruit on a tree) without damage has proven challenging to rigid robots; soft robots promise a more natural and potentially simpler solution to these problems. Unlike a rigid robot, a soft robot might be able to contort and contract itself to wriggle through narrow openings, as might be needed for search and rescue or soldier-assist. Moreover, soft robots can exploit biomimetic and previously-unavailable modes of locomotion, such as the peristaltic motion of a worm [Seok et al., in publication], enabling navigation through small passageways or irregular terrain. Soft robots can have increased robustness (e.g., to survive drops), lower mass, lower cost, and lower operational noise (e.g., stealthy). Lastly, soft robots can have deformable "skins", enabling broad-area tactile sensing or even very high resolution visual/tactile sensing (e.g., by incorporating fine particles into the skin surface as in the Gelsight™ material (Gelsight, Inc., Waltham, Mass.).

A key challenge of soft robots is being able to practically manufacture robot components having distributed actuation—soft robots intrinsically have a large number of degrees of freedom, and multiple actuators can be impractical, costly, and heavy to assemble and interconnect using discrete components—and/or broad-area touch sensing. Indeed, the 2009 Roadmap for U.S. Robotics calls for "embedded sensors and actuators in soft materials for robot limbs and bodies" in 10 years to address this challenge. The disclosure allows for automated, custom, rapid, low-cost fabrication without assembly of entire, functional robots and robot subsystems, including application-specific robots: the unprecedented capability to literally print robots. Ultimately, the embedding of integrated circuits (microcontrollers, memory, optoelectronics, RFID components, etc.) and MEMS (microelectromechanical) devices needed in robotic systems can provide even greater functionality.

The disclosure is also applicable to many other fields including highly dexterous, lifelike prosthetics; minimally-invasive surgical instruments; microfluidic devices with built-in pumps, heating elements (e.g., for PCR), mixers and filters (which may incorporate fibers (e.g., glass) as elements), fiber optic probes, and electrodes (e.g., for electrophoresis); bespoke wearable and stretchable electronics with integrated physiological sensors and communications; small UAVs with built-in radar (e.g., phased array radar) and shape-morphing wings, and concealments for surveillance, to name a few. Moreover, the disclosure relates to a revolutionary packaging approach that can liberate electronic products from the rigid, planar constraint of printed circuit boards and offer new, flexible, organic, customizable 3-D form factors in which product and circuit become one, and multiple levels of conventional packaging are eliminated, reducing size, weight, and cost while boosting reliability. In addition to wires providing electrical and magnetic properties, other fibrous elements such as fluidic channels and optical fibers can be incorporated into polymer structures fabricated according to the disclosure.

BRIEF DESCRIPTION OF THE DRAWINGS

For a more complete understanding of the features and advantages of the present disclosure, reference is now made to the detailed description of the disclosure along with the accompanying figures and in which:

FIG. 4(a) shows a cross-section of the lower portion of a FEAM printhead.

FIG. 4(b) shows a magnified cross section of the lower portion of a FEAM printhead.

FIG. 4(c) depicts an isometric view of FEAM printhead capillary, clamp/cutter, and square wire.

FIGS. 6(a), 6(b), 6(c), 6(d), and 6(e) depict cross-sectional views of a wire starting and anchoring process.

FIGS. 13(a), 13(b), and 13(c) show plan views of one or two layers of a structure which incorporates encapsulated wires and ECPC.

FIGS. 46(a), 46(b), and 46(c) are plan views illustrating a rectangular nozzle orifice.

FIGS. 53(a), 53(b), 53(c), 53(d), and 53(e) depict cross-sectional elevation views of an anchoring method.

FIGS. 54(a), 54(b), 54(c), and 54(d) depict cross-sectional elevation views of an anchoring method.

FIGS. 63(a), 63(b), 63(c), 63(d), 63(e), and 63(f) show cross-sectional elevation views of steps of an alternative approach for fabricating a continuous helical coil.

FIGS. 70(a), 70(b), and 70(c) depict a specialized pounce wheel arrangement for encapsulated filament.

FIGS. 98(a), 98(b), 98(c), 98(d), 98(e), 98(f), 99, 100, and 101 show a variety of junctions.

FIGS. 108(a), 108(b), 108(c), and 108(d) show a method for determining toolpaths for extruded material, wire, and conductive material.

FIGS. 109(a), 109(b), 109(c), 110(a), 110(b), 110(c), 110(d), 110(e), 110(f), 110(g), 111(a), 111(b), 111(c), 111(d), 112(a), 112(b), and 112(c) illustrate coaxial-type fabricated structures and methods of manufacture

FIGS. 114(a), 114(b), 114(c), and 114(d) depict a method of applying conductive material to form junctions.

FIGS. 126(a), 126(b), 126(c), 126(d), 126(e), 126(f), 126(g), 126(g'), 127(a), 127(b), 127(c), 127(d), 128(a), 128(b), and 128(c) show methods for integrating devices into fabricated objects.

FIGS. 129(a), 129(b), 130(a), 130(b), 131(a), 131(b), 132, 133(a), 133(b), and 133(c) show fluidic devices, some incorporating fibers.

FIGS. 136(a), 136(b), 136(c), 137(a), 137(b), and 137(c) depict electric motors.

FIGS. 138(a), 138(b), 138(c), 138(d), 138(a'), 138(b'), and 138(c') illustrate a wire cutting apparatus and method.

FIGS. 141(a), 141(b), 141(c), 141(d), 141(e), and 141(f) depict a sequence for cutting wire.

FIGS. 144(a), 144(b), 144(c), 144(d), 144(e), 144(f), and 144(g) depict a fiber feeder/cutter.

FIGS. 145(a), 145(b), 145(c), and 145(d) illustrate an extruder.

FIGS. 146(a), 146(b), 146(c), 146(d), 146(e), 146(f), 146(g), 146(h), 146(i), 146(j), 146(k), 146(l), 146(m), and 146(n) depict a coil having a thick wall and a method of fabrication.

FIGS. 147(a), 147(b), 147(c), 147(d), 148(a), 148(b), 148(c), 148(d), and 148(e) depict an apparatus for soldering.

Figure 149A:
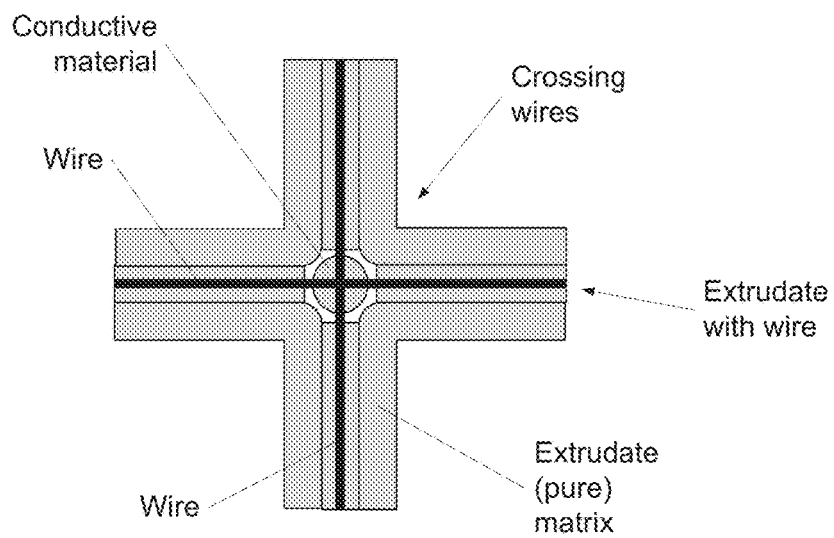
Figures 149B, 149C:
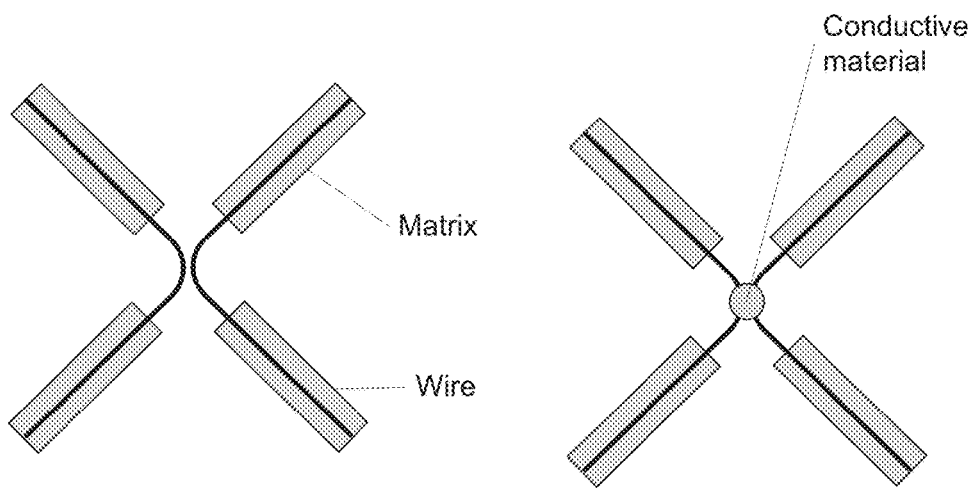

FIGS. 149(a), 149(b), and 149(c) show junctions between wires.

Figure 150:
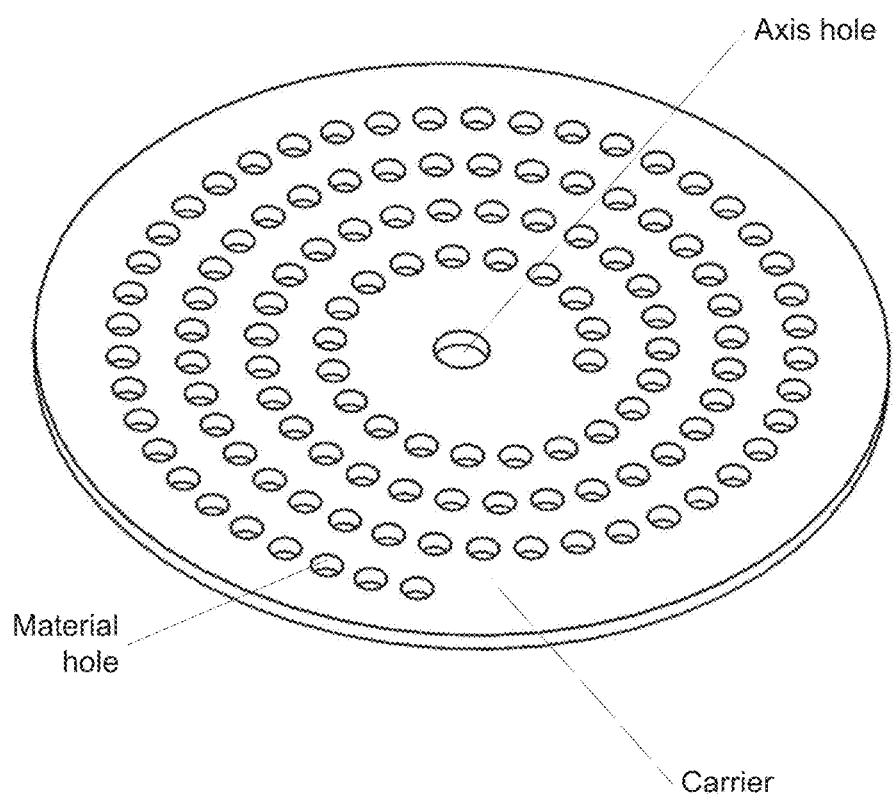

FIG. 150 depicts apparatus for storing and dispensing conductive material.

FIGS. 151(a), 151(b), 151(c), 152(a), 152(b), 152(c), 153(a), 153(b), 154(a) and 154(b) show a stretchable circuit element.

FIGS. 155(a), 155(b), and 155(c) depict approaches to stabilizing a capillary.

FIGS. 156(a), 156(b), 156(c), and 156(d) show an approach to filling a cavity with a material.

FIGS. 157(a), 157(b), 157(c), and 157(d) depict a method for dispensing objects into a structure.

Figures 158A, 158B:
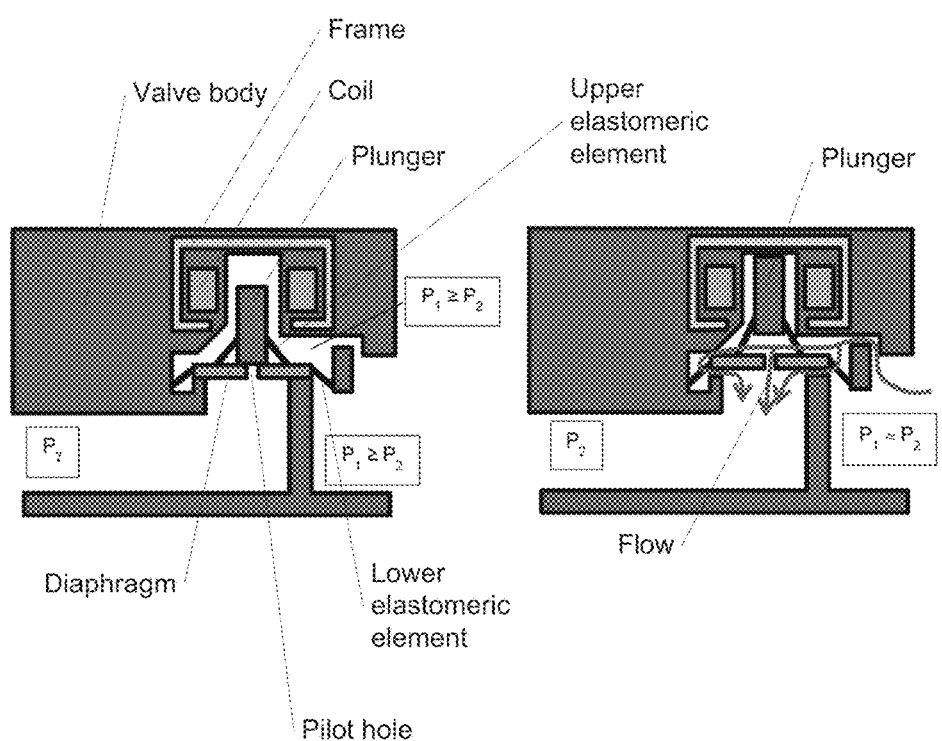

FIGS. 158(a) and 158(b) show a printable valve.

FIGS. 159(a), 159(b), 159(c), 160(a), 160(b), 160(c), 161(a), 161(b), 161(c), 161(d), 162(a), 162(b), 162(c), 163(a), 163(b), 164(a), 164(b), and 165 depict fluidic actuators.

Figure 166:
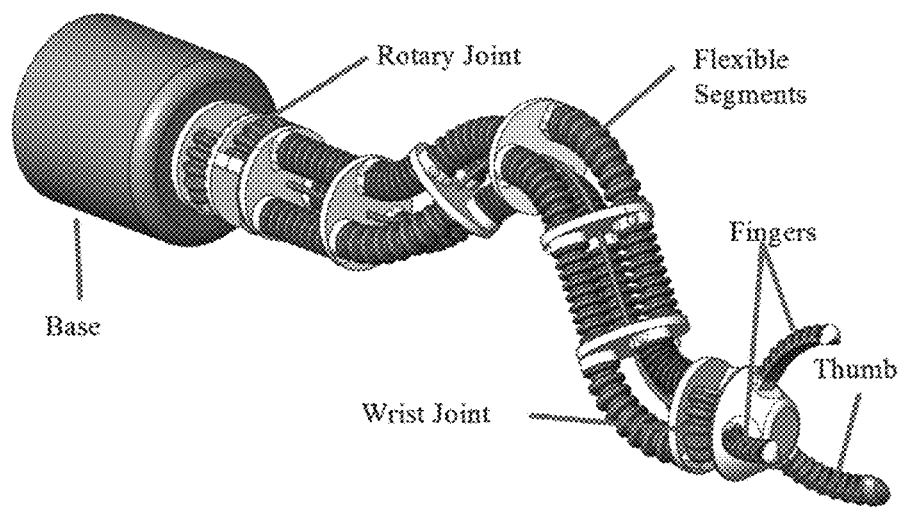

FIG. 166 shows an arm using fluidic actuators.

Figure 167:
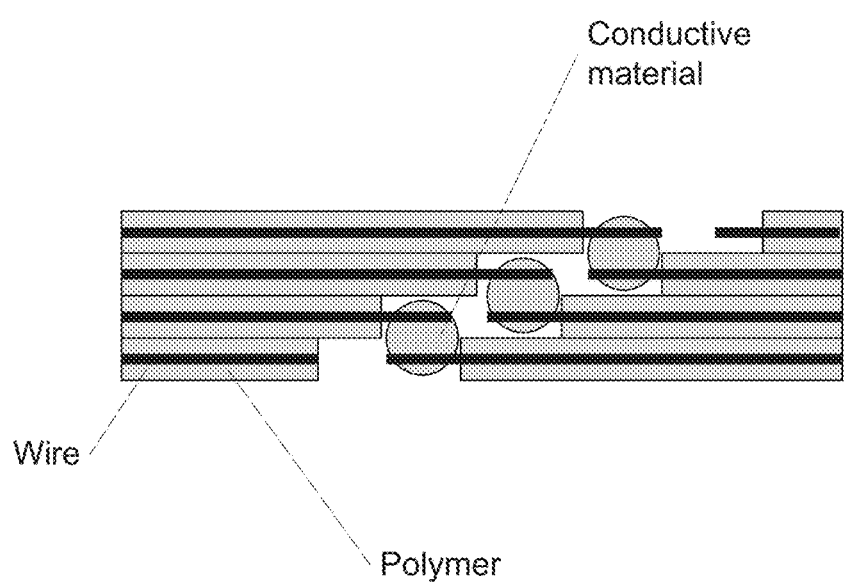

FIG. 167 depicts an approach to fabricating a coil.

FIGS. 168(a), 168(b), 168(c), 168(d) 168(e), 168(f), 168(g), 168(h), 168(i), and 168(j) show an apparatus for feeding and cutting wire.

FIGS. 169(a), 169(b), 169(c), 169(d), 169(e), and 169(f) depict an apparatus for feeding wire.

Figure 170A:
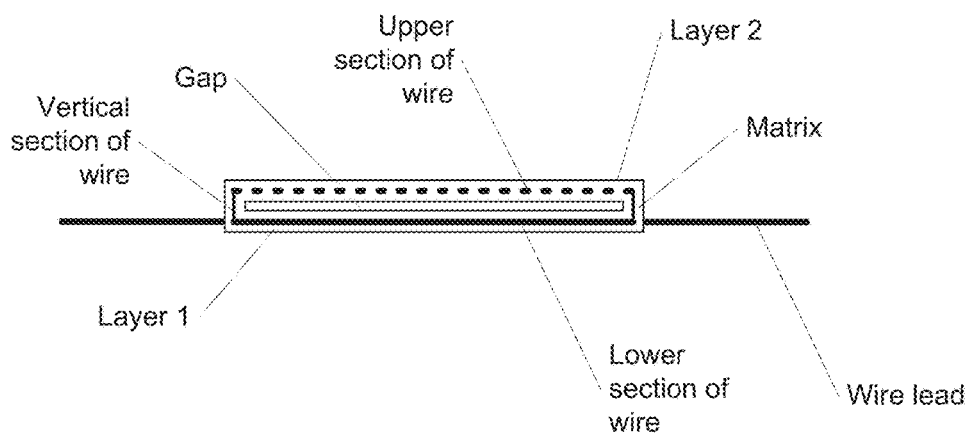
Figure 170B:
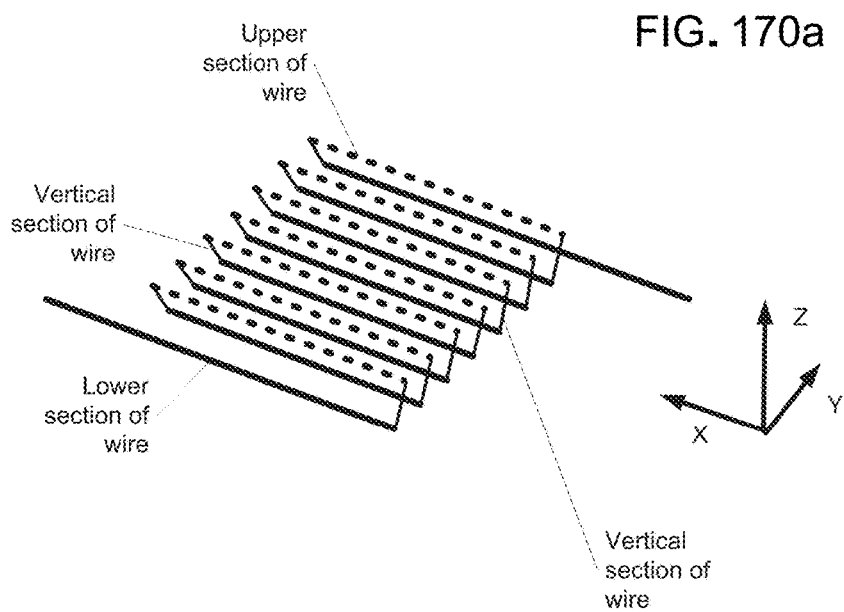
Figure 170C:
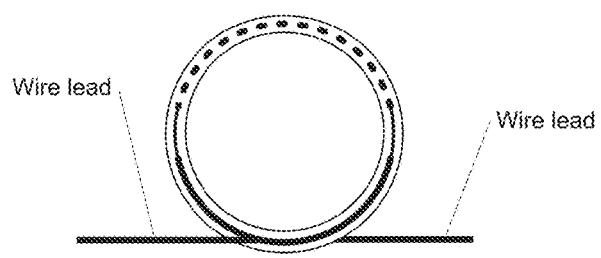
Figure 171A:
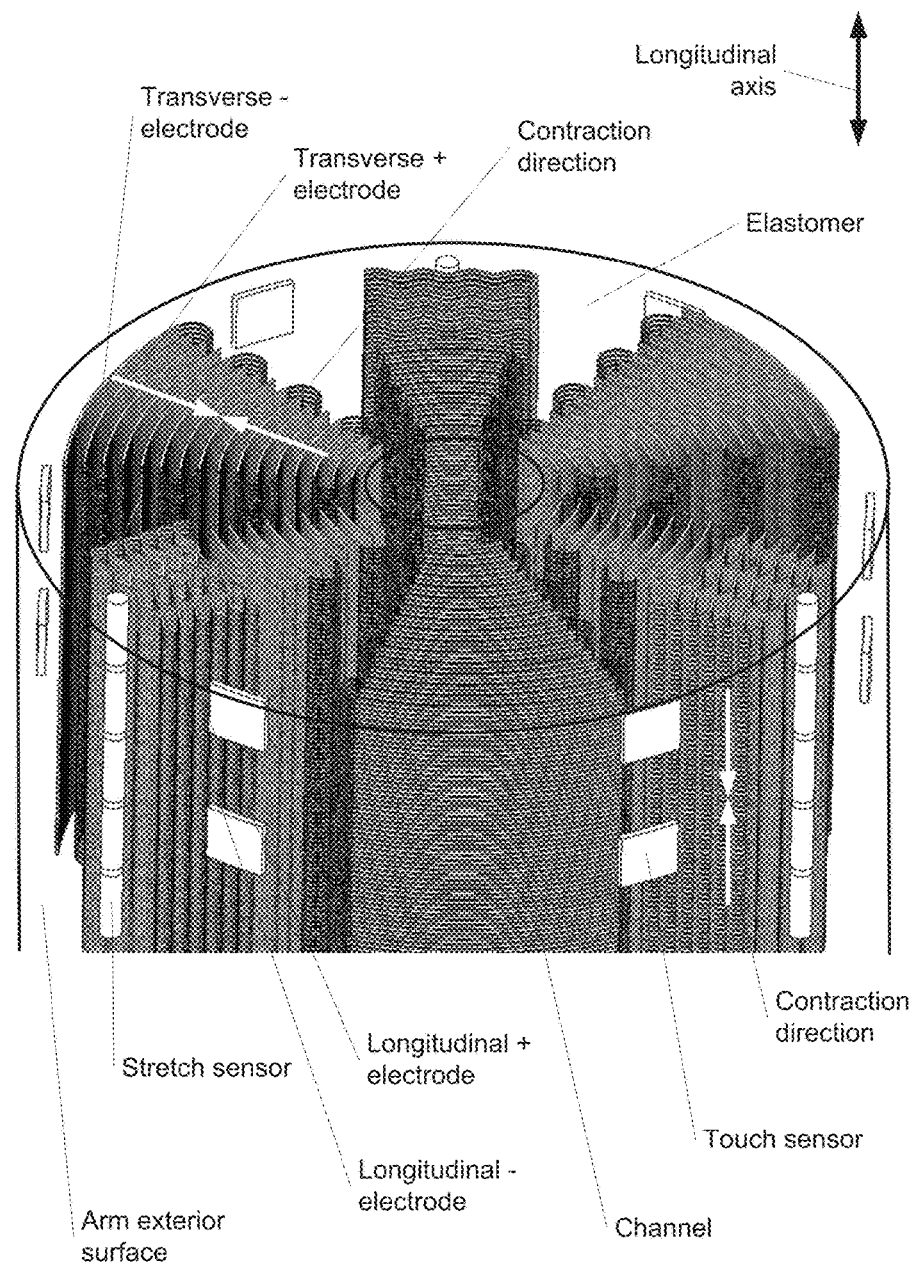
Figure 171B:
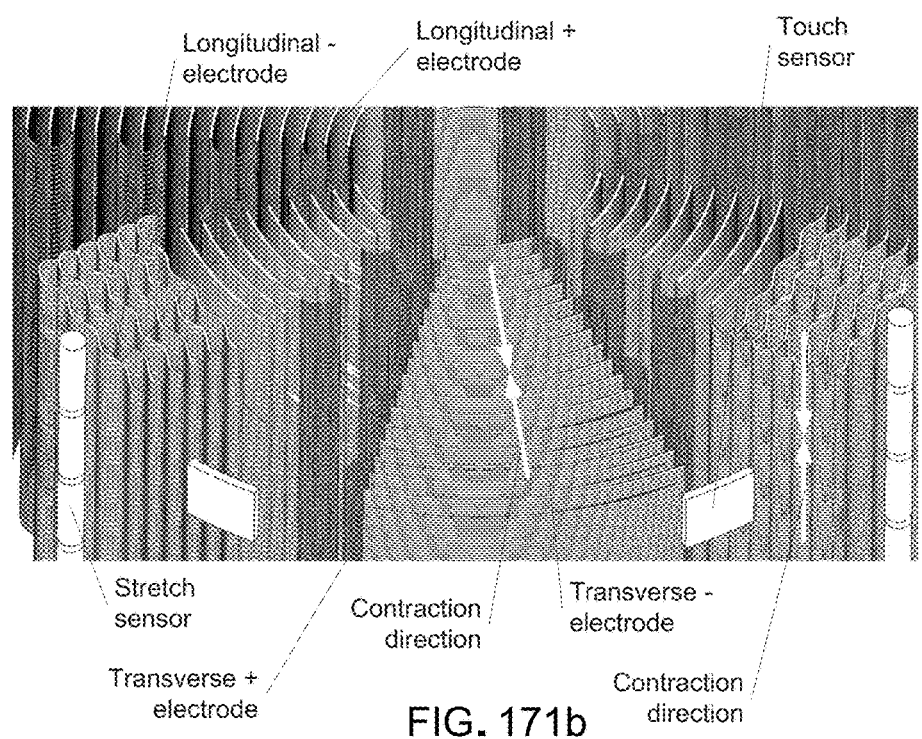
Figure 171C:
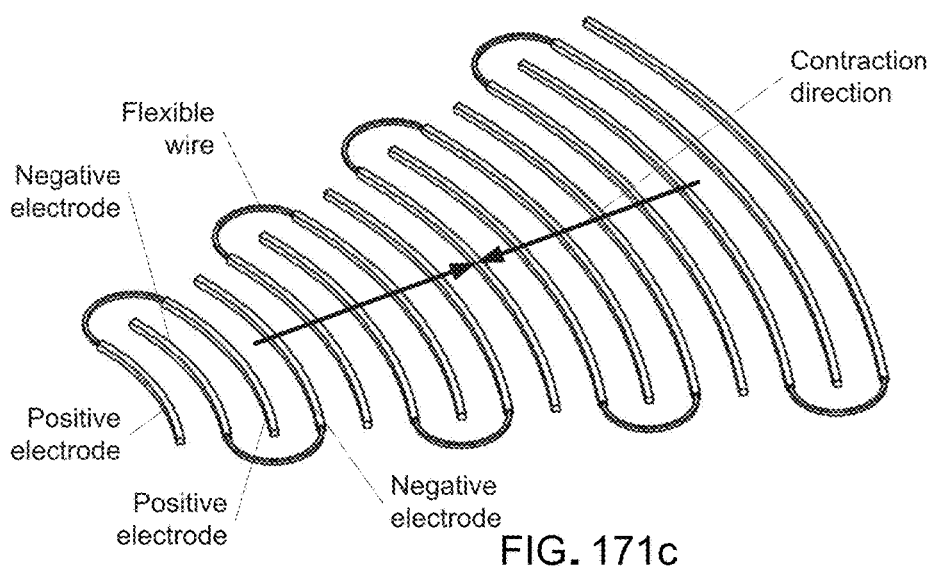
Figure 171D:
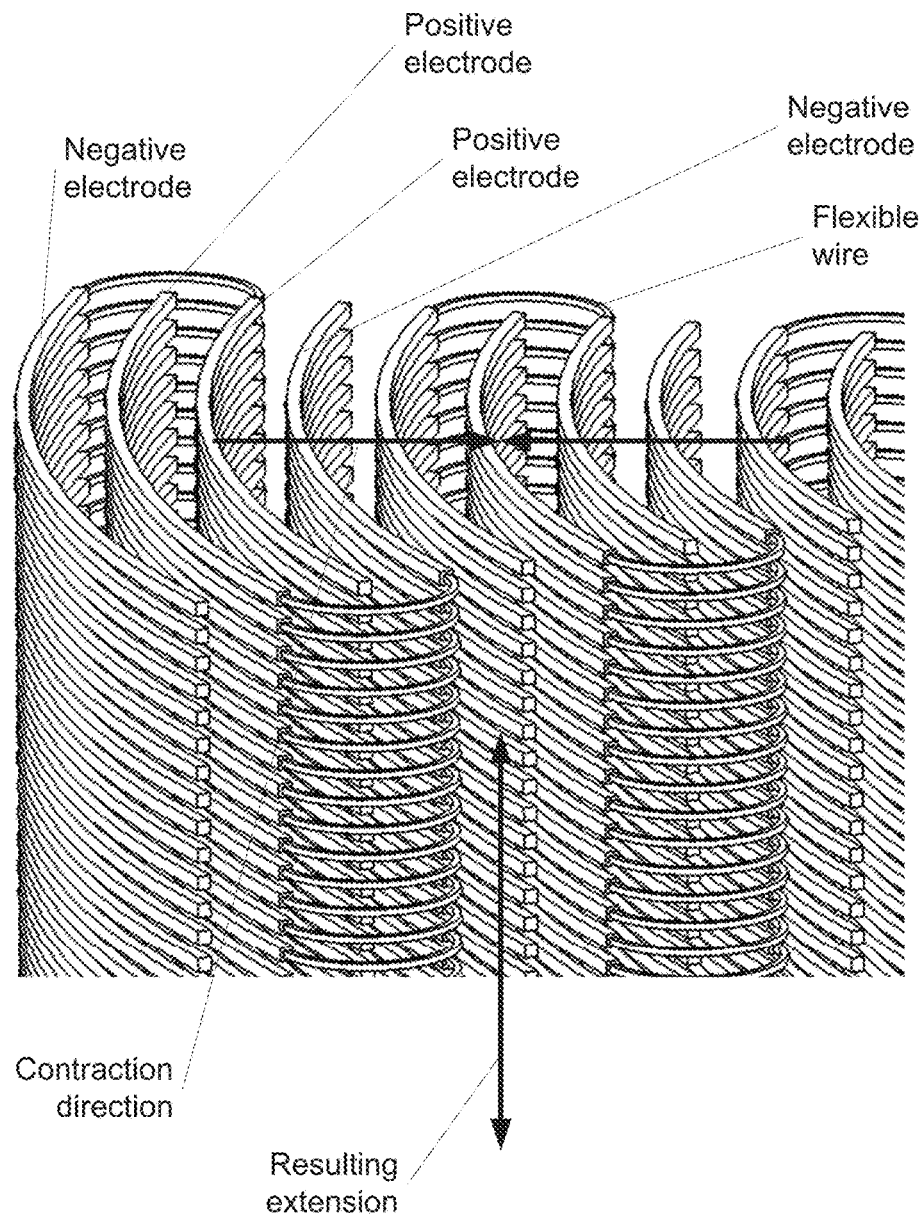
Figure 171E:
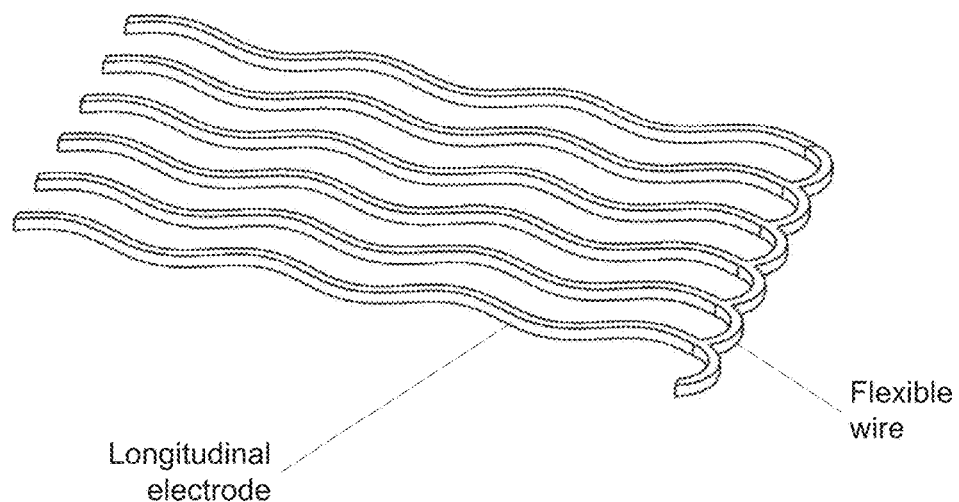
Figure 171F:
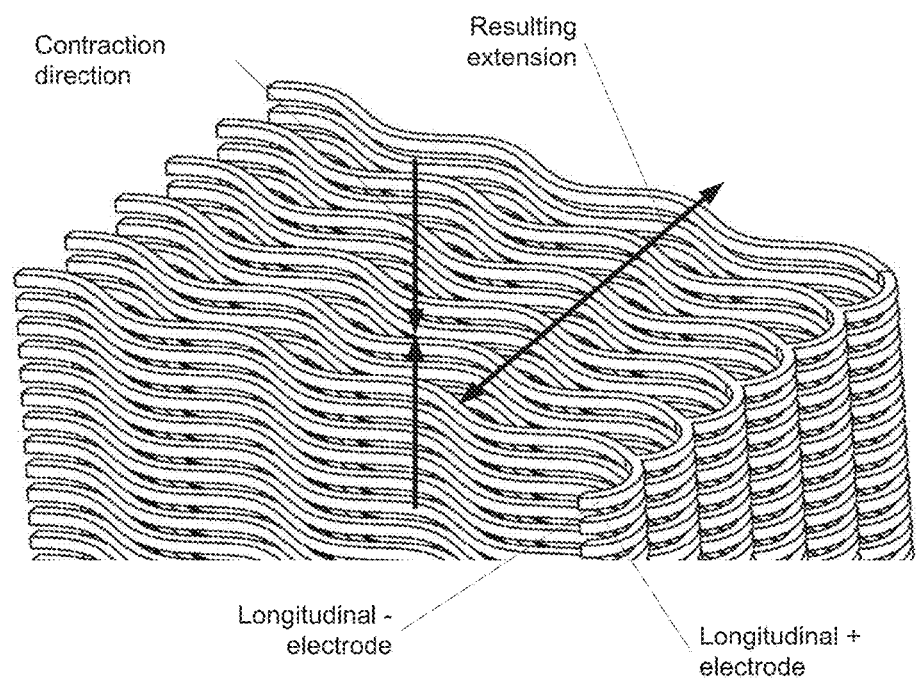
Figure 172A:
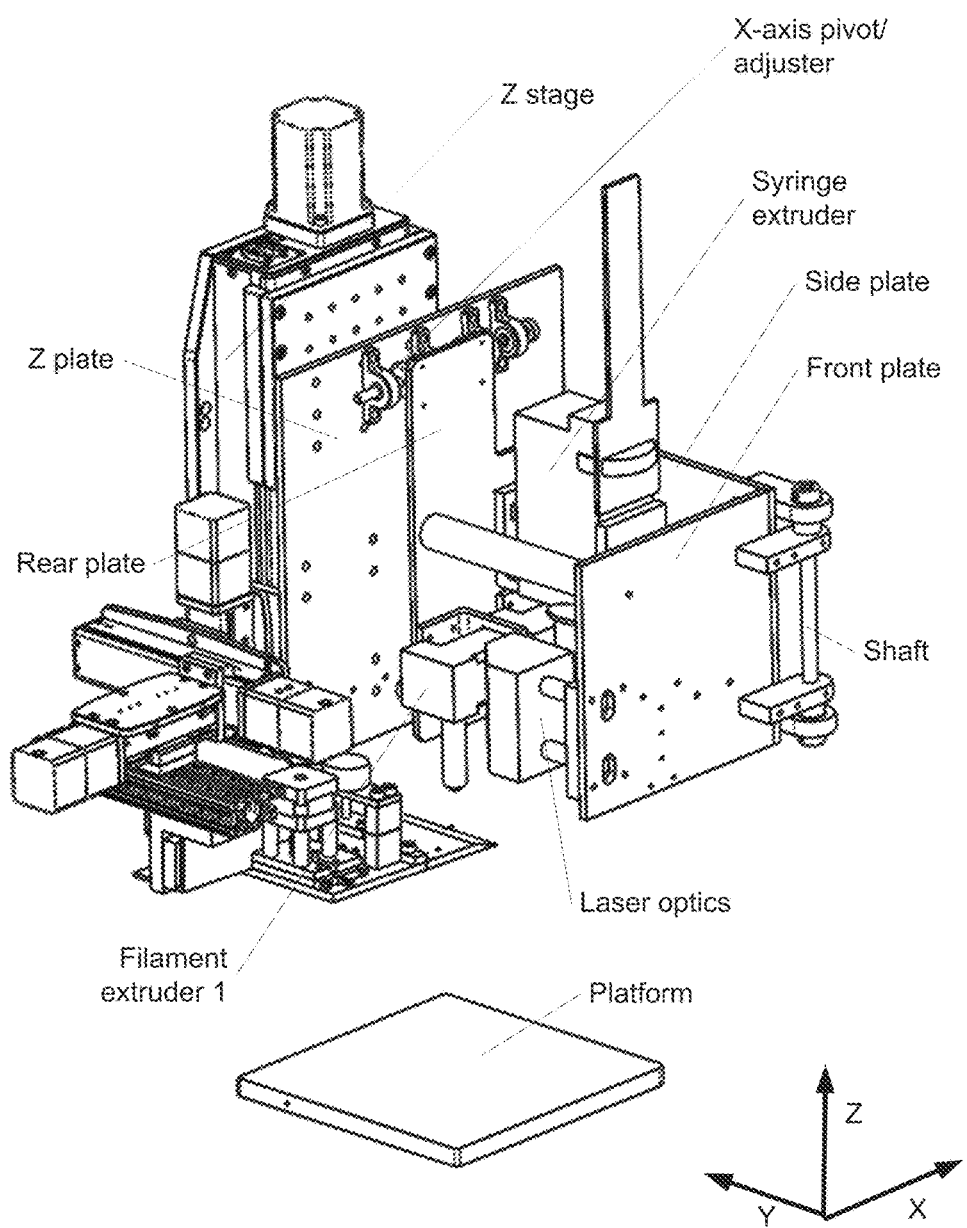
Figure 172B:
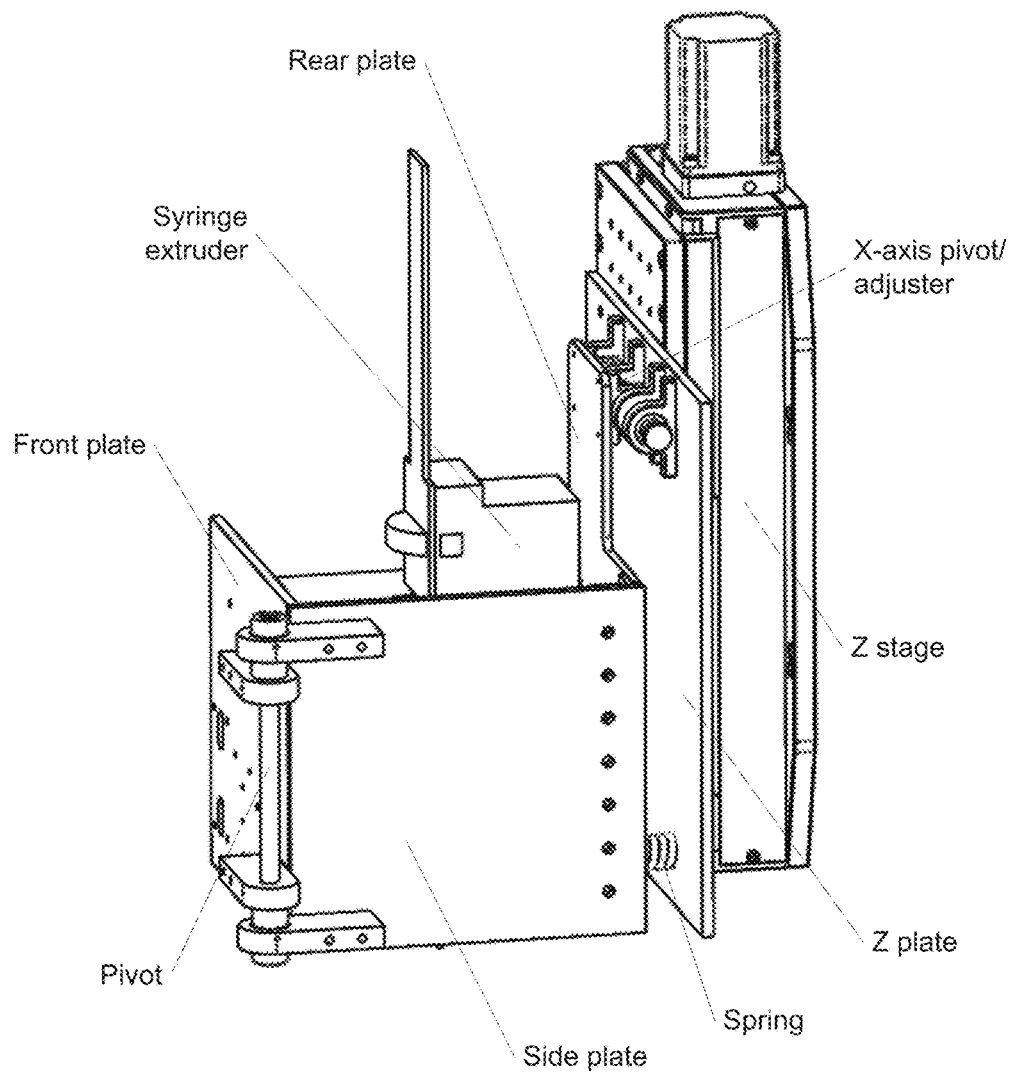
Figure 172C:
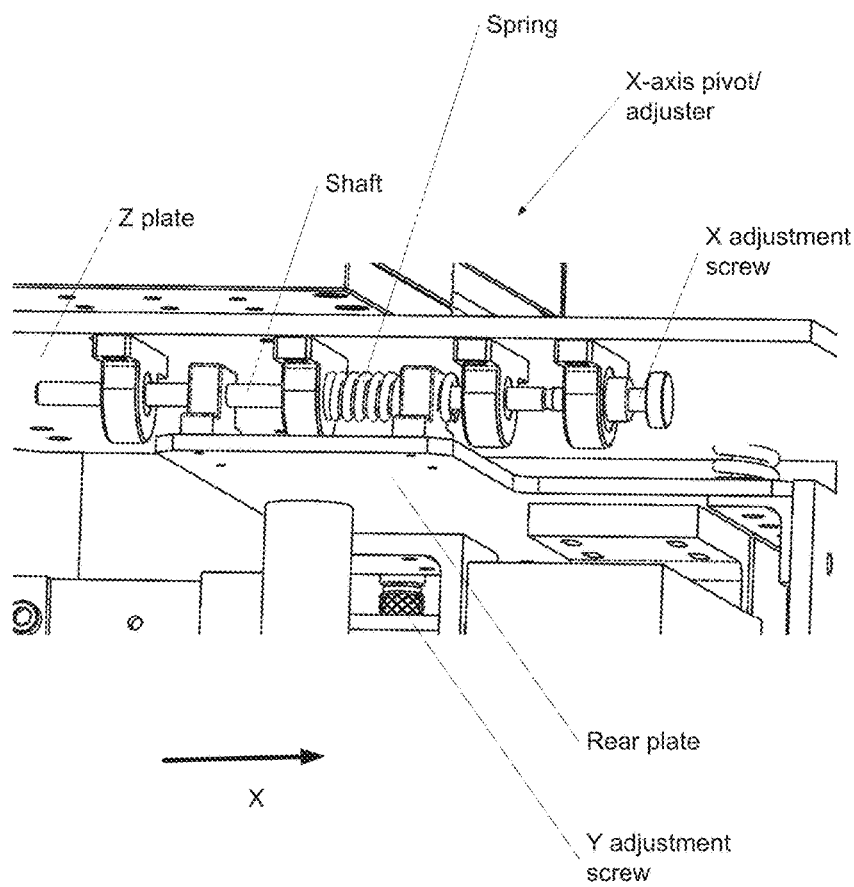
Figure 172D:
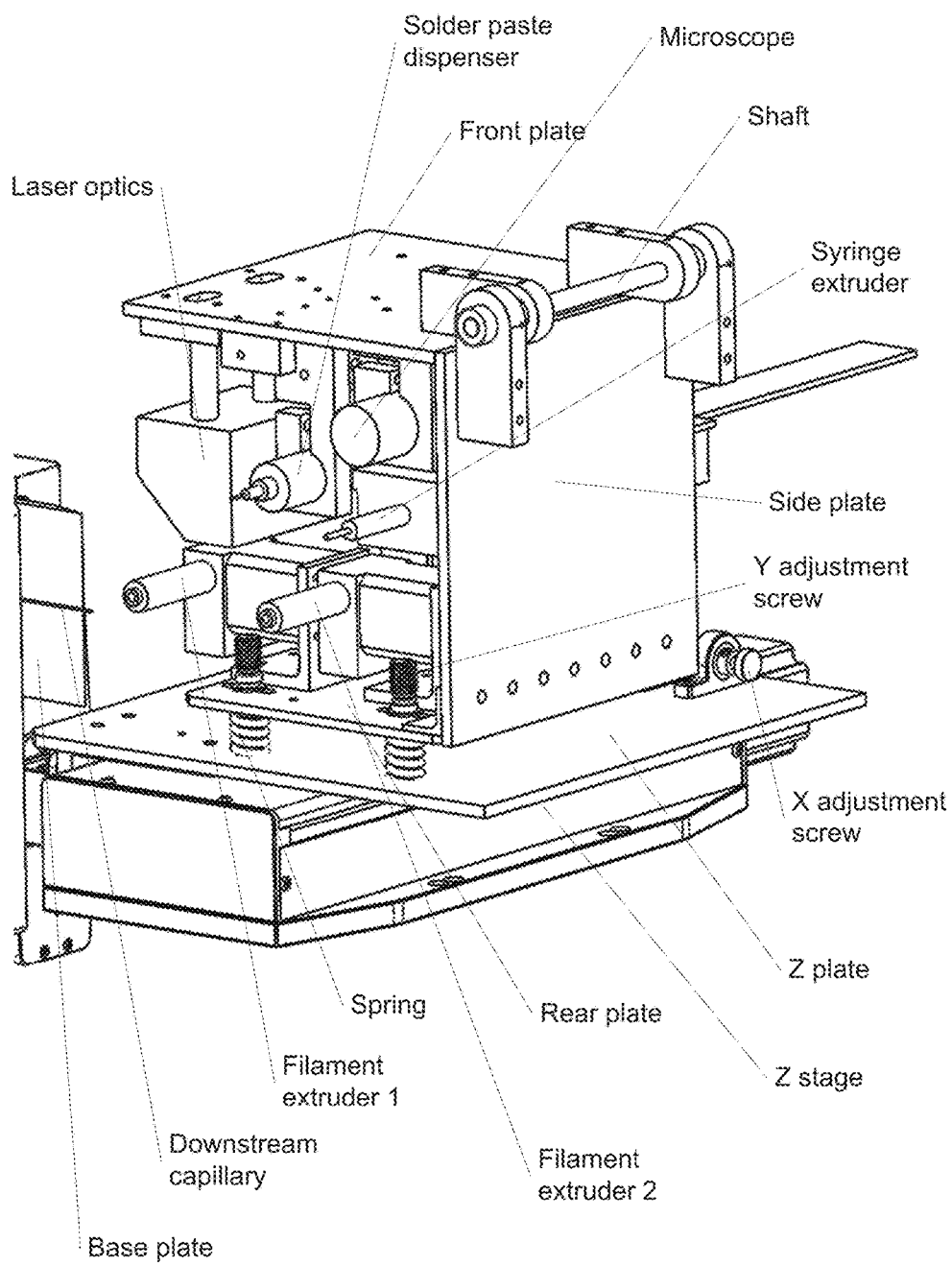
Figure 172E:
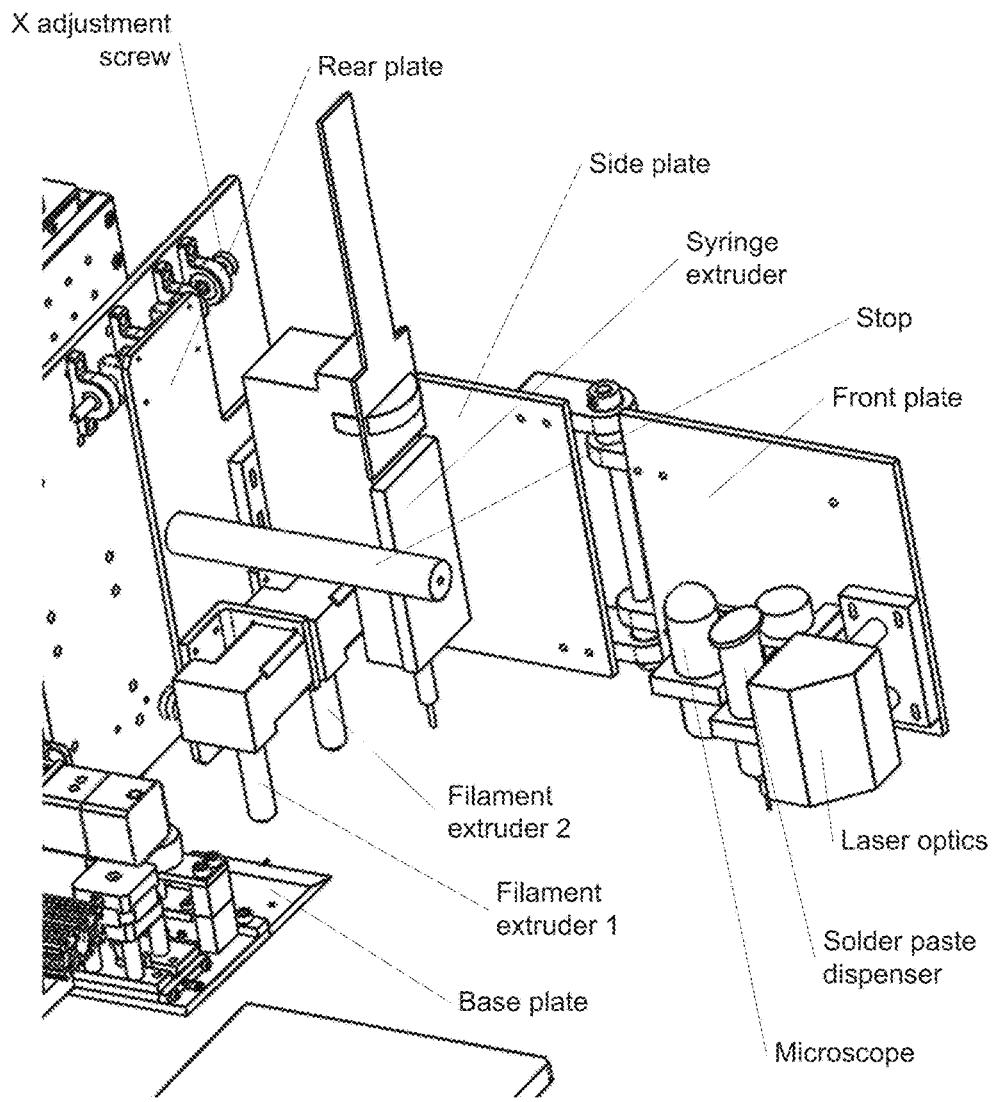

FIGS. 170(a), 170(b), and 170(c) show a method for making a coil.

FIGS. 171(a), 171(b), 171(c), 171(d), 171(e), and 171(f) depict a soft arm with embedded electrodes.

FIGS. 172(a), 172(b), 172(c), 172(d), and 172(e) show an apparatus for fabricating multi-material devices.

Figures 173A, 173B:
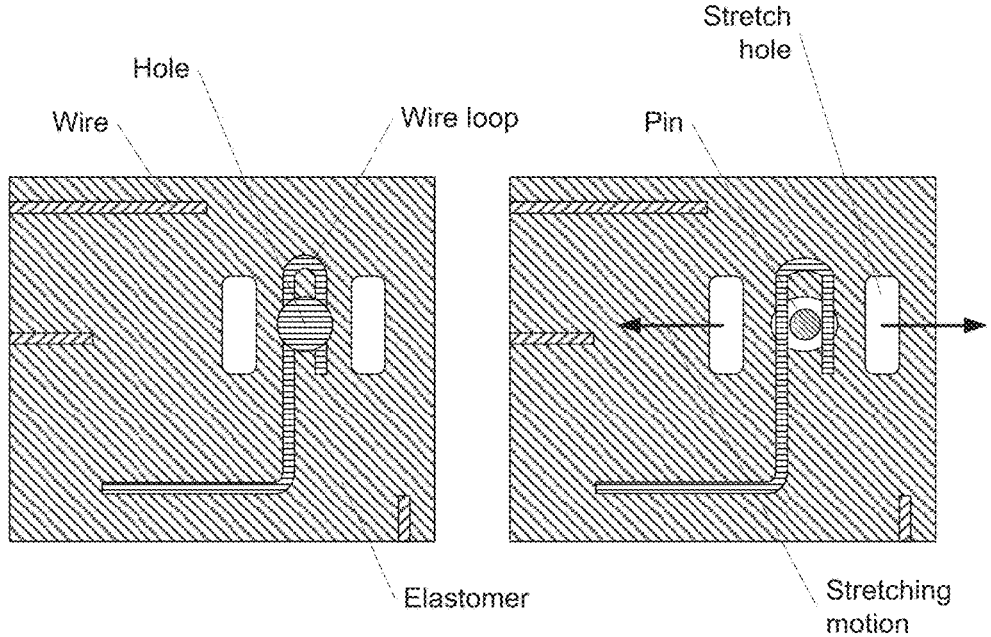
Figure 173C:
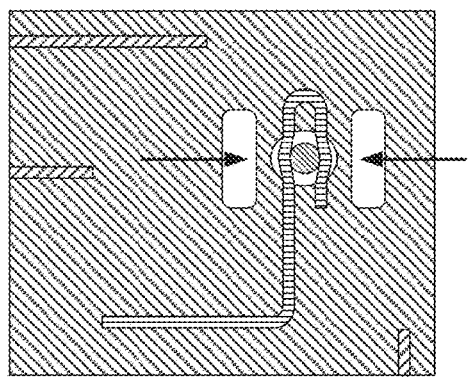

FIGS. 173(a), 173(b), and 173(c) show an approach to making electrical contact.

FIGS. 174(a), 174(b), 174(c), 174(d), 174(e), 174(f), 174(g), and 174(h) depict a soft robot.

FIGS. 175(a), 175(b), 175(c), 175(d), 175(e), and 175(f) show an apparatus for feeding wire.

Figures 176A, 176B, 176C:
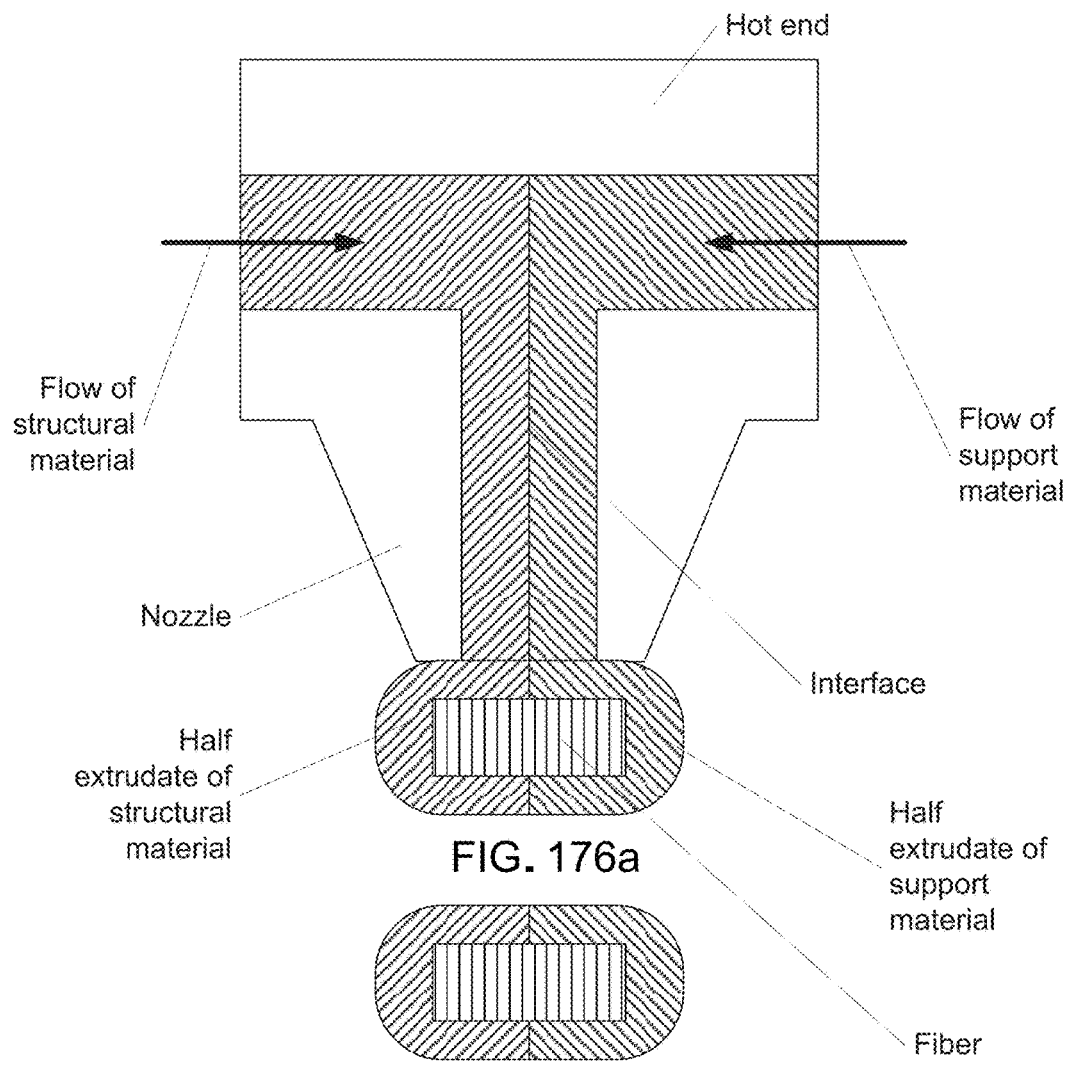

FIGS. 176(a), 176(b), and 176(c) depict a method for producing exposed wire.

Figure 177:
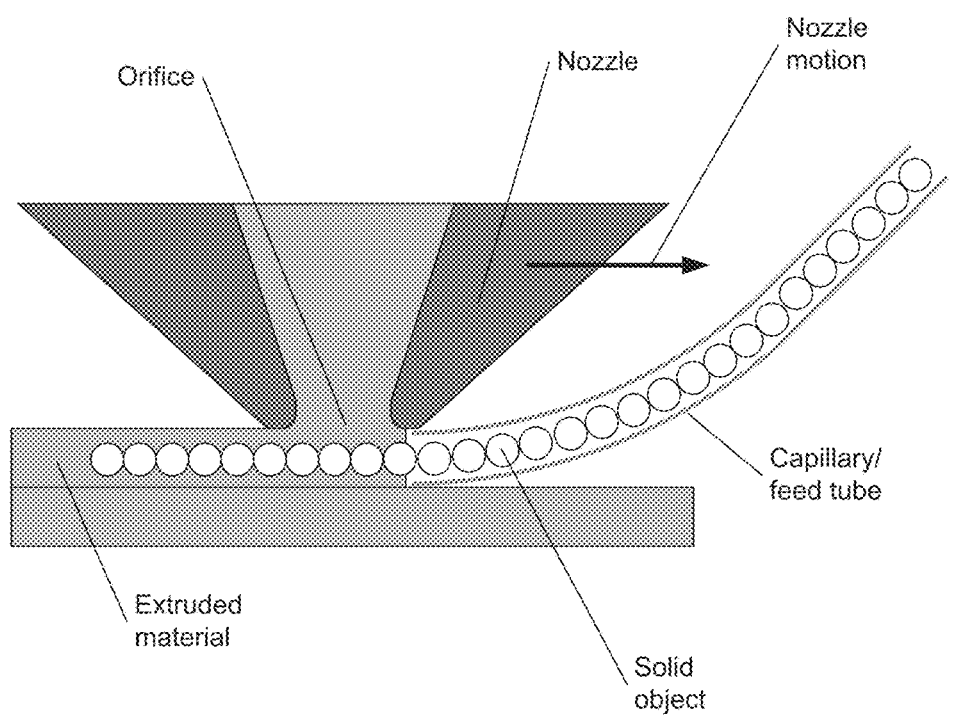

FIG. 177 shows a method for incorporating solid objects.

FIGS. 178(a), 178(b), 178(c), 178(d), and 178(e) depict a method for extracting toolpath data from a file.

FIGS. 179(a), 179(b), 179(c), and 179(d) show a wire segment feeder.

FIGS. 180(a), 180(b), 180(c), 180(d), 180(e), 180(f), 180(g), 181(a), 181(b), 181(c), 181(d), 181(e), 181(f), 181(g), and 181(h) show steps in the operation of a wire segment feeder.

FIGS. 182(a), 182(b), 182(c), 182(d), 182(e), 182(f), 182(g), 183(a), 183(b), and 183(c) depict approaches to increase metal content.

FIGS. 184(a), 184(b), 184(c), 184(d), 184(e), 184(f), 184(g), and 184(h) show approaches to incorporating flat wire.

FIGS. 185(a), 185(b), 185(c), 185(d), and 185(e) depict a rotary motor.

Figure 186A:
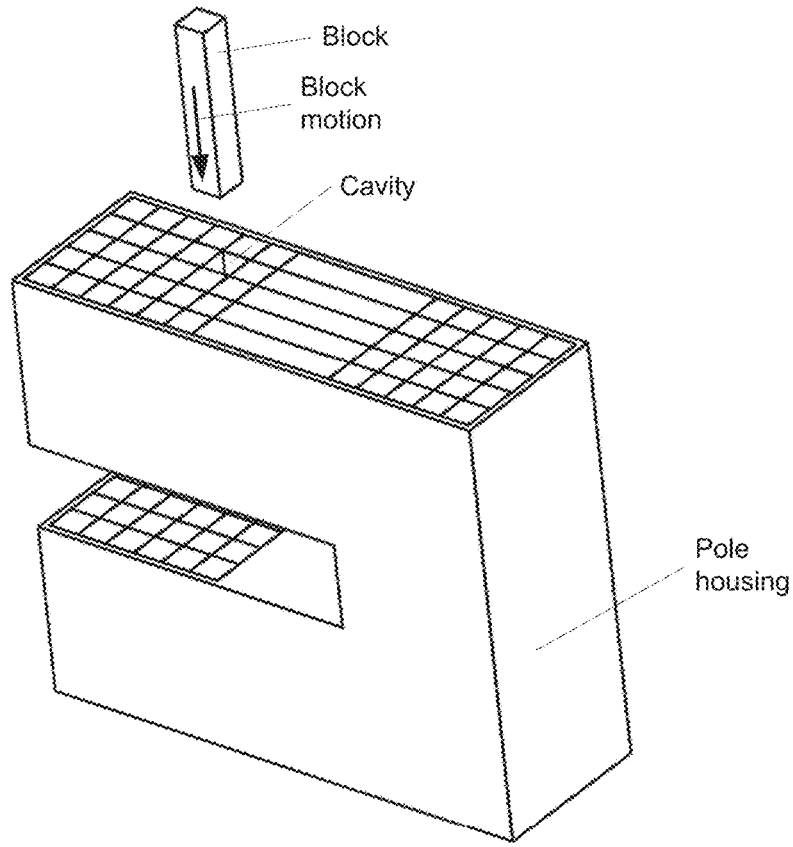
Figure 186B:
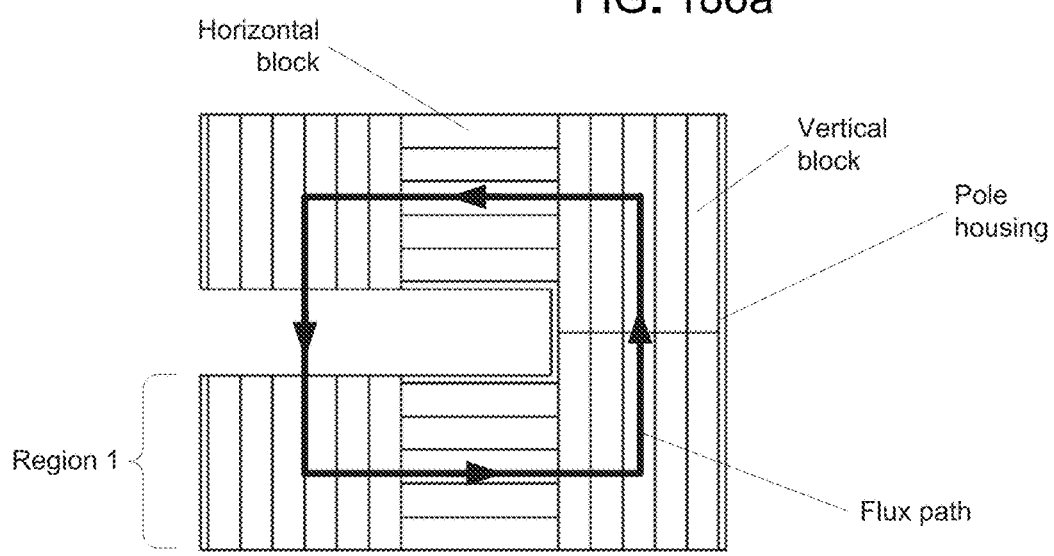

FIGS. 186(a) and 186(b) show an approach to fabricating a motor pole.

FIGS. 187(a), 187(b), 187(c), 187(d), 187(e), 187(f), 187(g), and 187(h) depict an apparatus for dispensing blocks.

Figure 188:
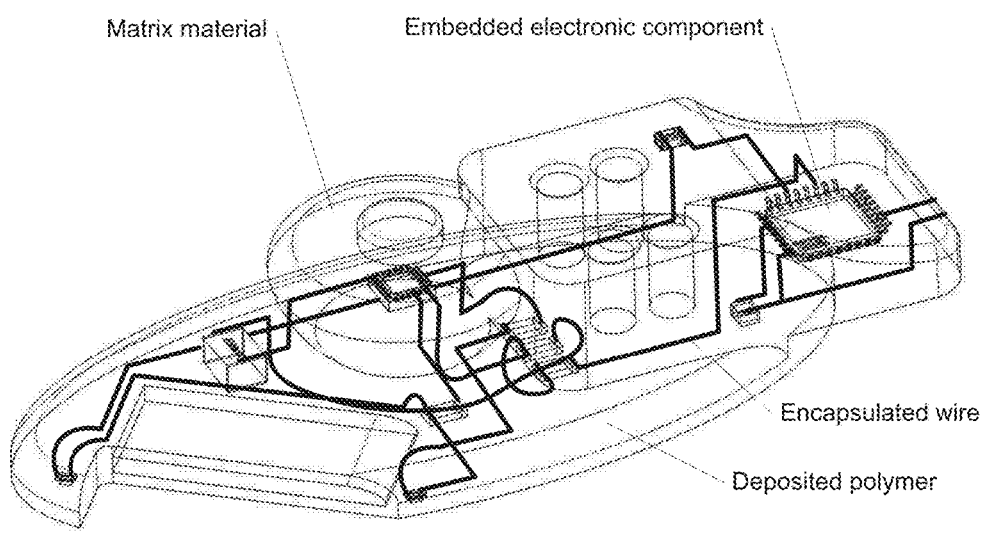

FIG. 188 shows a 3-D printed hybrid electronic module.

Figure 189A:
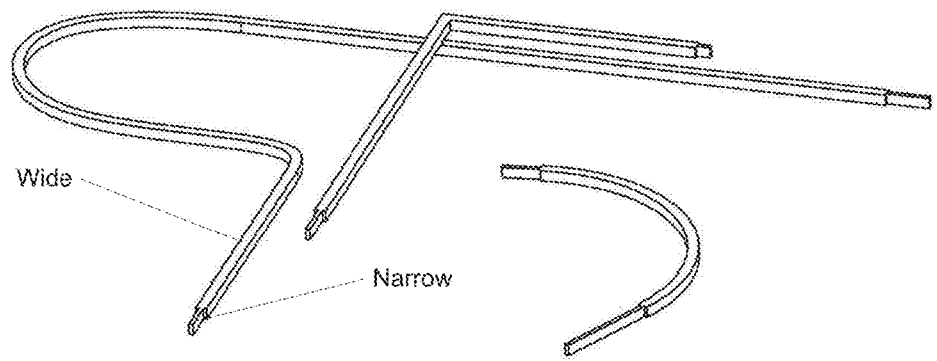
Figure 189B:
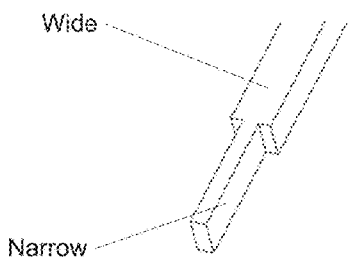
Figure 189C:
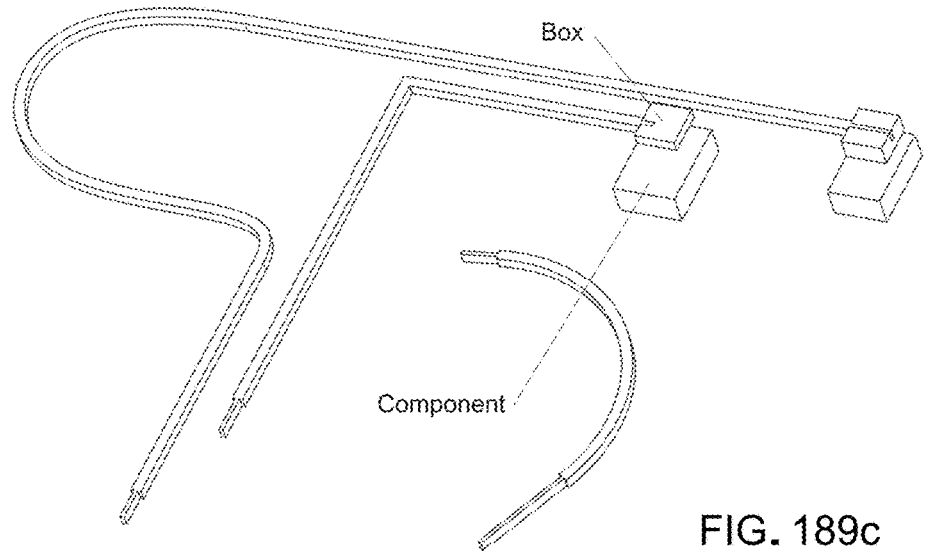

FIGS. 189(a), 189(b), and 189(c) depict an approach to designing electronic modules.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the disclosure and do not delimit the scope of the disclosure.

To facilitate the understanding of this disclosure, a number of terms are defined below. Terms defined herein have meanings as commonly understood by a person of ordinary skill in the areas relevant to the present disclosure. Terms such as "a", "an" and "the" are not intended to refer to only a singular entity, but include the general class of which a specific example may be used for illustration. The terminology herein is used to describe specific embodiments of the disclosure, but their usage does not delimit the disclosure, except as outlined in the claims.

AM (Additive Manufacturing, a.k.a., 3-D Printing) is a proven approach to rapid, layer-by-layer fabrication of complex 3-D parts with internal features, and mechanical devices with multiple moving parts requiring no assembly. The present disclosure is intended to achieve a "holy grail" of AM: namely, to provide a truly multi-material AM process that can fabricate functional electromechanical devices. The disclosure would greatly extend AM to enable automated fabrication of multi-material, multi-functional components and devices having embedded actuators, sensors, 3-D circuitry, and elements such as resistors, capacitors, inductors, and antennae.

The potential impact of the disclosure is in providing a new means of monolithically producing fully-customized functional components and systems without the need for assembly, directly from digital data. In the semiconductor industry, monolithic fabrication has made possible the integrated circuit. At the macro scale—and incorporating mechanical, not just electrical elements—monolithic fabrication can also have a huge benefit, reducing cost while increasing reliability and quality, and enabling products impossible with traditional approaches. The methods and apparatus of the disclosure incorporate materials such as metal wire and conductive composites into a polymer matrix as a structure or device is built up, one layer at a time. More specifically, it provides for simultaneous deposition of conductive and/or ferromagnetic wires together with polymer such as a pure polymer (e.g., an elastomer) or an electrically conductive polymer composite (ECPC) composed of polymer and conductive filler particles, or a magnetic polymer comprising ferromagnetic or permanently-magnetic particles in a polymer matrix. The ability to controllably deposit these multiple materials provides enormous flexibility in creating mechatronic structures with embedded electromagnetic elements.

Unlike the SpoolHead system described hereinabove, the FEAM technology of the present disclosure can achieve the same results as SpoolHead, but solves a number of fundamental problems including 1) difficulty of bonding wire securely to polymer (required for self-feeding of wire and making sharp turns), 2) low throughput/slow processing, and 3) lack of a viable solution to intra- or inter-layer interconnects. In addition, such systems would have trouble completely encapsulating wire and spacing wires closely without shorting, can only be used with thermoplastic materials, and may involve costly components such as ultrasonic transducers and power supplies. These limitations render SpoolHead and its derivatives impractical; FEAM is far more practical, versatile, and reliable.

Figure 1:
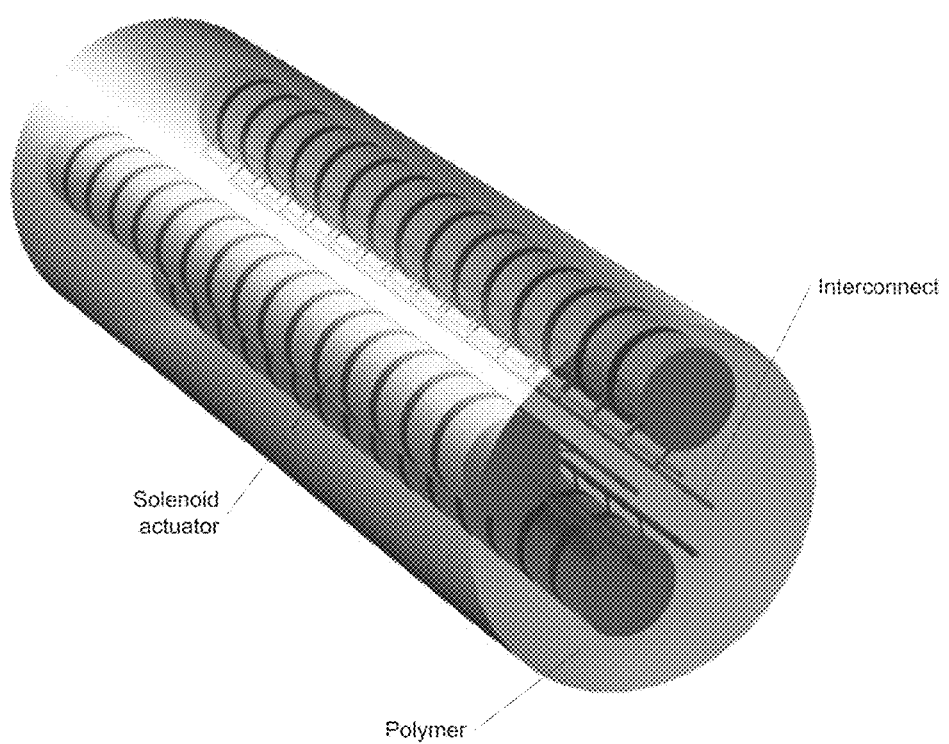
FIG. 1 is an isometric depiction of a robot limb with distributed, wired actuators and sensors, able to bend and change length.

To take full advantage of the flexibility offered by soft robots requires the integration of sensing and actuation elements and circuitry/electrical wiring directly into the robot structure (e.g., FIG. 1). Indeed, in the extreme case of a robotic limb without any rigid support (e.g., a tentacle), distributed actuation must be integrated into the element during fabrication (similar to the muscles in squid tentacles) for the device to function at all. To address these challenges, the disclosure provides a new multi-material Additive Manufacturing (AM, a.k.a 3-D printing) method for rapidly, economically, automatically, and flexibly manufacturing complex 3-D structures, devices, components, systems, products, and assemblies: to produce both prototypes and functional, usable devices. Among the systems that can be fabricated using FEAM are soft robot components with embedded, distributed actuation, sensing, and circuitry/interconnect (e.g., power and signal), produced without the need for assembly. FEAM generates active electromechanical structures, is driven directly by computer aided design (CAD) data, requires no tooling, and uses low-cost materials. FEAM enables complex geometries as well as distributed elements and material combinations and arrangements that in many cases are impossible to produce using the prior art. FEAM can print standalone mechatronic devices, robot parts, integrated subsystems, entire robots, packaging systems, and entire electronic devices.

FEAM fabricates components in layers by extruding dielectric and conductive polymer along with an embedded wire core. The ability to create heterogeneous structures using both dielectric and electromagnetic materials in an AM processes allows for monolithic fabrication of actuators and sensors embedded within the structure being fabricated. The result is a "smart", multifunctional, active material that can dynamically modulate its shape and sense its environment. With FEAM, actuators and sensors can be distributed throughout the volume of the fabricated device, located virtually anywhere and built in virtually any shape. Among its other benefits, distributed fabrication also enables localization of actuation, sensing, and processing (computation/control/memory). Thus, devices can be more modular and if provided with well-defined interfaces, component re-use using component libraries is more easily achieved. Thus a robot can be designed using a library of modules that provide the desired actuation and sensing, and processing capabilities, with all modules built together monolithically. AM (Additive Manufacturing, a.k.a., 3-D Printing) is a proven approach to rapid, layer-by-layer fabrication of complex 3-D parts with internal features, and mechanical devices with multiple moving parts requiring no assembly. Additive Manufacturing typically produces prototypes, production parts, and tooling directly from raw materials based on CAD models by depositing successive layers of material (e.g., polymer or metal) to build up a 3-D structure. Since there is full access to both internal and exterior regions as layers are formed, AM can make products otherwise impossible to manufacturable. AM can make parts in mere hours using a compact, self-contained machine. It usually requires no molds, patterns, or masks, produces little waste, often yields ready-to-use products, and allows an unlimited degree of customization at no additional cost. Nonetheless, AM has achieved only a fraction of its potential. In particular, current processes are unable to produce functional mechatronic devices since AM uses homogeneous materials, whereas mechatronic devices must contain elements that are dielectric, conductive, and often, magnetic.

FEAM is based on the Fused Deposition Modeling (FDM) process introduced by Stratasys (Eden Prairie, Minn.). In FDM, a thermoplastic polymer filament is fed by rollers into the heated liquefier tube of a printhead where it is melted and extruded from a nozzle. The head moves according to an X/Y toolpath under computer control, based on the calculated cross-section of the structure to be fabricated, laying down polymer extrudates that form the perimeter, top and bottom surfaces, and interior "fill" of a layer. FDM has several primary benefits: 1) fabrication using robust engineering polymers, 2) low cost, and 3) ability to produce multiple-component assemblies of moving parts.

FEAM greatly extends FDM, integrating the deposition of conductive wire (or other material in filament/elongated form, hereinafter "wire") into the process. In some embodiment variations, the wire is ferromagnetic, e.g., to allow for fabrication of elements of electromagnetic devices. In some embodiment variations, FEAM also integrates metal particle-filled polymer composite into the FDM process.

FEAM allows, for example, the fabrication of robot limbs with built-in, distributed actuators (electromagnetic, capacitive, etc.) and a full-surface tactile sensing "skin". Such a limb can support a multi-fingered hand—also built with FEAM—that manipulates objects; meanwhile, four such limbs can serve as robot legs. FEAM can produce worm- and snake-like robots that move like their biological cousins, swimming robots, shape-changing robots, and other novel configurations. Affordable, patient-unique disposable surgical and interventional robots with many degrees of freedom that allow access to deep brain tumors through a small incision are also enabled by FEAM.

FEAM enables robot components to be produced in hours. Custom, application-specific component designs in 3-D CAD are manufacturable without tooling, using an automated machine, and from low-cost materials.

Robots are typically assembled from discretely-manufactured and packaged components that require interconnection and are often costly and bulky. Therefore is it normally impractical to incorporate a large number of actuators and sensors. Monolithic fabrication of components and wiring using FEAM allows 10s-100s of actuators and sensors to be "built in" to robot body structures as they are made. Distributed actuation enables more degrees of freedom [Walker et al., 2005], increased dexterity, more complex motions (e.g., facial expressions for humanoids [Tadesse et al., 2011], new modes of locomotion, adaptive and shape-changing structures, dynamically-tunable stiffness, and redundancy. It allows large displacements and large forces to be generated from short-stroke and small actuators, respectively. Moreover, the ability to locate an actuator close to the point of action frees up "real estate" otherwise occupied by linkages, cables, etc. Nonetheless, embedded wires and other fibers (e.g., Kevlar, carbon) may be used as "tendons" enabling remote actuation (e.g., fingers of a robot or prosthetic hand may be operated by actuators located in the palm and connected to the fingers by such tendons. In some embodiments, the tendon itself is the actuator (e.g., if made from a shape memory alloy such as nickel-titanium). To allow free movement of tendons within a structure, they may be formed in channels free of matrix material, or be only surrounded by elastomers, or comprise fibers with non-stick coatings, or comprise fibers within tubes which are co-deposited using FEAM, etc.

In the case of a flexible matrix material surrounding them, tendons may adhere to the matrix material. However, when the matrix is more rigid, and even in some cases when it is not, it may be best for the tendon to slide within the matrix material (i.e., not be adhered to it). To achieve this, in some embodiments rather than encapsulating fiber alone, a tube containing a fiber (or into which a fiber can later be inserted) is encapsulated instead. In some embodiment variations, the fiber may be braided, which may facilitate pushing and twisting it in regions that are tortuous). In some embodiment variations, the tube has a low coefficient of friction at least on its inside (e.g., it may be made of PTFE). In other embodiments, a non-adhering fiber may be achieved by choosing a difficult-to-bond material for the fiber, or coating it with such a material (e.g., PTFE), or by exposing the fiber to a bonding inhibitor (e.g., a liquid or vapor) such as an oil just before encapsulating it in matrix material. In some embodiments, the adhesion of fiber to matrix material that may normally occur may be broken mechanically during the fabrication process or afterwards. For example, the fiber can be pulled manually or by an actuator after or during fabrication; if the tensile strength exceeds the adhesion strength, the fiber will be broken free and be able to slide within the matrix thereafter. The wire may also be fed more slowly than the X/Y stage tangential speed, thus applying tension to the wire. Mechanical disruption of adhesion can be achieved during wire laying in FEAM by printing in short steps as follows: Matrix and fiber can be printed one short segment at a time, with the fiber pulled periodically (e.g., by stopping the feeder/cutter feed rollers and advancing the X/Y stages) to break it free of the matrix.

With regard to sensing, the ability to build a component with sensors distributed throughout (e.g., near the surface for tactile sensing) promises to imbue robots with high spatial resolution capabilities that begin to emulate living organisms. FEAM also enables complex 3-D wiring networks and dense connectors with dozens of I/O so that distributed elements can be connected and interfaced to controllers, power, etc.

With FEAM, actuators, sensors, and wiring—as well as any discrete devices incorporated while building—can be encapsulated by polymer at virtually no additional cost in material or processing time. As such they will be unable to delaminate and will be protected from hazards such as mechanical forces that can cause distortion or fracture, moisture (e.g., humidity, rain, sweat), dust, electromagnetic interference (built-in shields and Faraday cages can be provided), and corrosive fluids. Because the conductive material is normally surrounded by polymer on all sides, adhesion between the conductive material and the polymer is less of an issue than with surface metallizations, which can peel away. Moreover, unlike attempts to metalize the surface of AM parts through a separate operation, the topography of the solidified polymer surface is irrelevant, and no smoothing/bonding layer is required to allow metallization.

Thus, the present inventors have developed a novel FEAM that for the first time enables the additive manufacturing of multi-material, active structures and devices such as robots, which comprise 3-D electrical circuits, actuators, sensors, and other components. A key challenge in integrating distributed actuators and sensors throughout a robot body or component—as well as for other active devices—is providing electrically conductive pathways through a dielectric material. Common methods of achieving conductivity such as low-temperature solders and conductive inks (e.g., containing silver, copper, gold, platinum, nickel, etc.) have issues with high-temperature curing operations, adhesion with the polymer, throughput, limited geometries, and sophisticated equipment required to implement. In lieu of these approaches—and far more compatible with AM processes—is FEAM's use of conductive composites and fibrous conductors (i.e., wires).

Epoxy and silicone conductive adhesives are widely available, and thermoplastic conductive adhesives for flip chip applications are in use [Gilleo, 2000]. By adding conductive particles at sufficient concentration to thermoplastic it is possible to produce an electrically conductive polymer composite (ECPC). At low concentrations, the additive doesn't change the electrical properties of the polymer matrix significantly because the particles are dispersed and non-contacting. As the concentration increases, a sharp increase in conductivity is eventually achieved at the "percolation threshold", when enough particulate material is incorporated that conductive junctions are formed between neighboring particles/particulate agglomerates and conductive pathways are formed throughout the composite matrix [Aneli et al., 2012; Huang, 2002]. Further increases in the concentration of particulate above the threshold will increase bulk conductivity, but at a much lower rate.

Conductive particles useful in FEAM include those comprised of nickel, silver, gold, carbon, and copper. Such particles can have multiple forms, e.g., solid metal, metal-coated polymer, metal-coated ceramic, and metal-coated glass. Particles may be micro-scale (e.g., average sizes in the range of 5-50 µm) or nano-scale (e.g., average sizes <1 µm). As an example, small conductive nickel and silver-coated nickel particles are available from Novamet Specialty Products Corporation (Wyckoff, N.J.), and silver-coated nickel, iron, and hollow glass microspheres are available from Potters Industries LLC (Malvern, Pa.).

If the polymer is an elastomer (e.g., for a soft robot), then addition of particulate to the matrix generally would make the material stiffer and more brittle as particulate concentration is increased. Moreover, the conductivity of ECPC is far lower than that of the pure additive material (typically by a factor of 103-108) due mostly to lowered conductive area and inter-particle electrical resistance [Ruschau et al., 1992]. Even some of the highest-conductivity ECPC adhesives (e.g. SEC1244 (Resinlab, Germantown, Wis.): resistivity ~$6\times10^{-4}$ ohm-cm) are over 200 times less conductive than annealed Cu. Hence, use of ECPC for creating long conductive pathways would introduce excessive electrical losses and associated heating, as well as potentially degrading the mechanical properties of the elastic structure. Moreover, long pathways of ECPC may be subject to strain-induced conductivity changes or de-percolation, especially when supported by a soft elastomer matrix, whereas localized regions of ECPC (in junctions) can be more easily decoupled from stress that may induce excessive strain and reduce performance. Instead, FEAM uses metallic wires embedded (e.g., coaxially) within the polymer (creating a "coaxial composite") for the majority of the conductive pathways, limiting, in some embodiment variations, the use of ECPCs to creating electrical junctions/joints, which are relatively small. In some embodiments, the process may involve junctions that are do not provide electrical functionality (e.g., if the fiber is not conductive) but provide other functionality such as mechanically coupling stress from one fiber to another, providing an optical junction between optical fibers, etc.

To form 3-D structures from a plurality of polymer extrudates with metal wire embedded substantially coaxially in selected regions, and (in some embodiment variations) to use ECPC to form electrical junctions, FEAM leverages several key technologies: 1) FDM using thermoplastic polymers or other solidifiable materials such as thermoset polymers; 2) in some embodiments, ECPCs; and 3) in some embodiments, crosshead extrusion for wire coating. In the case of FEAM fabricating soft structures, thermoplastic or thermoset elastomers are used as the solidifiable material.

In addition to the advantages mentioned above, FDM has the ability to use a range of thermoplastic materials, uses a vector deposition approach (vs. raster) that is intrinsically more compatible with incorporation of wire, and can include voids in structures, which can be used to adjust elastic modulus and other properties. However, compared with FDM, FEAM requires apparatus with a novel printhead, novel process, novel control software, and novel material supply.

Crosshead extrusion is the standard process for insulated wire production. Molten polymer from an extruder enters a side port while wire is fed perpendicularly through the head: the polymer envelopes the wire exiting from the lumen of a capillary. Polymer and wire then pass through a die that establishes the outside diameter of the coated wire, and the polymer jacket is allowed to solidify [Drobny, 2011].

While ECPCs are at present a poor choice for general wiring due to the long conductive pathways often required, in some embodiment variations they are highly advantageous for creating electrical junctions. To produce 3-D devices and provide power and signal paths to embedded components, electrical junctions are in general needed both between wires within the same layer (intra-layer) and between wires in adjacent or separated layers (inter-layer). A number of methods are available to create such junctions. In some embodiment variations, wires may be brought closely together and soldered or brazed. In other embodiment variations, wires may be pressed together and ultrasonically or thermosonically bonded. In yet other embodiment variations, wires may be welded (e.g., by laser welding or resistive welding). In yet other embodiment variations, wire may be simply mechanically placed into contact with other wire, crimp other wire, or be wound around or entangled with other wire, to form a junction that remains robustly conductive and tolerant to deformation due to the wires being "potted" in and thus captured by surrounding polymer. Or, a "free air ball" (FAB) may be formed on the wire, e.g., using a variant of "electronic flame-off", a spark technique used in semiconductor ball bonders [Harman 1997], such that the FAB occupies the full width and/or height of the extrudate; this could make contact with a FAB in an adjacent extrudate, forming a junction.

Because it doesn't require contact or bonding pressure between wires or accurate alignment of wires, readily accommodates different sizes and cross-sectional shapes of wire, can produce multiple-layer/multiple-wire connections (by spanning the entire extrudate width and/or height), doesn't require perfectly-clean wires, and can create junctions at any location along a wire (not merely at the ends), the use of ECPC to form junctions is in some embodiment variations particularly preferred. Moreover, ECPCs allow external components such as packaged ICs to be connected by pushing their leads through the ECPC (if the ECPC is soft enough, or the leads are heated), and enable magnetic cores and armatures (e.g., made from nickel wire such as Ni 200, Ni 201, or Ni 205) and/or nickel powder-filled ECPC, or pure ECPC) and capacitor plates. Other elements which could be made using FEAM with the aid of deposited ECPC include variable-resistance resistors, force and pressure sensors, temperature sensors, heat sinks, heat pipes, and heat conduction structures. Junctions can be formed by embedding wires in a conductive matrix of deposited ECPC that establishes conductive pathways between them. While the resistivity of ECPCs is much higher than that of wire, the distance between wires in the junction is very short, so excellent junction resistance can in principal be obtained (e.g., ~0.1 ohm for a 1 mm-long junction with wires separated by 250 µm). Effective use of ECPC in FEAM requires judicious selection of particulate material, concentrations, and composite preparation. Percolation and conductivity in ECPCs has been studied extensively for different polymers and additives, with a focus on carbon black because of cost and the lack of an insulating oxide layer [Huang, 2002]. A number of factors can affect the percolation threshold in both hard polymers and elastomers, including the relative affinity of the particulate and polymer, shape and size of the particulate additive, and preparation of the composite material [Huang, 2002; Ruschau and Newnham, 1992; Kalyon et al., 2002; Bayer et al., 1988; Ezquerra et al., 1988]. Regarding composite preparation, degree of mixing and forming method (extrusion vs. compression molding) can have an important effect on percolation and conductive properties. A certain level of mixing is required to distribute the conductive filler throughout the matrix, but over-mixing can increase the minimum concentration of conductive additive required for percolation because the additive agglomerates are broken down and the particulates become spaced too far apart to form conductive chains without increasing concentration [Kalyon et al., 2002]. Mixing, e.g., using a single screw extruder, in some cases may be enhanced by using polymer that is more finely divided (e.g., cryogenically-ground powder or granules) than standard pellets. If the composites are injection molded, shear can redistribute the particles and break down agglomerates, affecting the conductive properties across high shear regions [Bayer et al., 1988; Ezquerra et al., 1988].

While general observations about electrical properties and basic mechanical properties (e.g., increased stiffness with higher solids loading) of ECPCs hold true for both hard polymers and elastomeric composites, composites based on elastomers present additional considerations. Even with the effect of particulate on mechanical properties, strains of several hundred percent are still achievable with typical conductive elastomeric composites, and filler content may have very little effect on elongation limit [Sau et al., 1997; Flandin et al., 2001]. With such large strains possible, however, the structure of the conductive chains in the composite can change during loading, causing changes in the electrical conductivity during strain, or even irreversible "de-percolation" if the strain becomes too large [Flandin et al., 2001; Li and Shimizu, 2009]. In some embodiment variations, junctions may be "shielded" from excessive loads that would compromise electrical behavior through proper design, incorporation of strong and rigid materials that handle the stress, decoupling of stress as in FIGS. 79(a), 79(b), etc. In some embodiment variations, the effect of strain on electrical conductivity may be mitigated by providing higher filler loading that improves electrical properties but may compromise mechanical properties, especially of elastomers. In any case, ECPC mechanical properties often will not dramatically influence overall structure behavior since ECPC is localized at junctions. ECPC regions can also be specially designed and formulated to serve as sensitive sensors for displacement, force, and pressure.

It may be advantageous in some embodiments to blend polymers with more than one conductive additive to create ECPCs with desirable mechanical properties and robust electrical properties. The different conductive additives may differ substantially in size and/or shape. For example, conductive spherical particles with diameters of a few microns or smaller may be used together with larger (greater than 10 micron diameter) conductive spherical particles, or fibrous conducting particles (with large aspect ratio) may be used together with spherical particles greater than 10 µm in diameter. Utilizing smaller particles, and/or particles with large aspect ratio, provides geometric variability that can help fill the gaps between larger spherical particles, achieving conductive chains within the material at lower overall concentrations, and maintaining conductivity during larger strains [Kyrylyuk et al., 2011].

The polymer used to formulate ECPC may be the same polymer as that used to fabricate the object in general, or it may be a different polymer that is compatible (e.g., there is mutual adhesion and cross-contamination is not problematic). The conductive particulate additive may be a number of materials (e.g., silver, silver-coated glass spheres (hollow or solid), carbon black, nickel, silver-coated nickel) and range in size from nanoscale (sub 1 µm) to several microns or tens of microns. If a magnetic material such as nickel is used, the ECPC can be used to create structures such as cores/armatures for electromagnetic actuators and transformers. An example of an elastomer that may be used with FEAM is Chronoprene (AdvanSource Biomaterials, Wilmington, Mass.), which is available in a range of hardness, is highly elastic, has high abrasion resistance and durability, and is biocompatible (e.g. used in balloon catheters), making it suitable for medical devices. A variety of other elastomers may be suitable, however, including Versaflex™ (PolyOne Corporation (Avon Lake, Ohio), Kraton™ (Kraton Performance Polymers Inc., Houston, Tex.), Alcryn® (Advanced Polymer Alloys, Wilmington, Del.), Dryflex T (ELASTO, Sweden) and many others. In addition, air-curing or moisture-curing materials can be used, as well as thermoset materials such as silicone (PDMS), e.g., with thermal or UV curing. Thermoset materials are not subject to distortion or melting at higher temperatures, and may therefore be more stable in situations requiring high currents through wiring (e.g., for some shape memory actuators and electromagnet coils). Moreover, some thermosets, such as silicone, have well-established biocompatibility. For example, to make a flexible implantable lead for neuromodulation, pacemakers, or implantable cardioverter defibrillators using FEAM, silicone such as a liquid silicone rubber (LSR) formulation may be combined with Pt—Ir wire which is exposed in selected areas to form electrode surfaces. Use of thermosets may also enable in-situ heat treatment of wire (e.g., to anneal it or set its shape, if capable of shape memory), and can facilitate the use of heating wires or heated fluid channels to generate bubbles in fluids (e.g., to alter stiffness or eject droplets as in some inkjet printheads), activate shape memory polymer materials incorporated into the device, induce melting (e.g., of a low melting point polymer or other phase-change material (e.g., wax) that is melted to reduce stiffness), etc. Also, self-healing structures may be produced by incorporating conductive wires or other elements which heat material that is cracked or otherwise damaged and cause it to reflow, repairing the damage.

Thermoplastic elastomers are well-suited as structural polymers for building soft robot components and bodies, as well as other structures and devices, although soft robots can be produced using more rigid materials if the geometry is appropriate, by using thin, flexible regions of material (e.g., a robot with a large number of polypropylene living hinges). Due to their compliance, elastomers can be more robust under impact and when subject to stress caused by differential thermal expansion between metal wire and polymer. Elastomers are soft enough to facilitate wire anchoring with minimal heating as will be described hereinafter, and also allow electrical components to be integrated into a device by pushing leads into regions of elastomer-based ECPC. Moreover, like all thermoplastics, they are recyclable. In the cases or locations where elastomers are too flexible or weak, strength and stiffness can be increased by incorporating reinforcing filaments/wires (e.g., Kevlar®, carbon fiber, glass) in the polymer matrix, or by integrating a strong and/or rigid material into the process. In some embodiment variations, a relatively strong, stiff, and preferably soluble support material—which may be similar in composition to materials commonly used for soluble supports in FDM (e.g., Lombardi et al. 2002; Priedeman, Jr. et al. 2004; Stratasys E20 Elastomer Support (a thermoplastic copolyester))—deposited along with the matrix material to provide support of the object during fabrication, may also be deposited and completely or substantially surrounded by matrix material (e.g., elastomer) such that it cannot be fully dissolved during the cleaning process used to remove support material that is exposed. Such encapsulated support material can thereby strengthen and stiffen the structural material, especially if it's an elastomer. Conversely, air or liquid-filled voids of various sizes and shapes can be introduced to reduce stiffness. If voids are interconnected through narrow air or liquid passages, then void volume and passage area can be specified so as to control the damping behavior of the structure as it flexes. In some embodiment variations, integrated filaments and relatively rigid material can be used to form structures that prevent excessive movement (e.g., bending, radial expansion, over-inflation) or to control the direction of movement, much like ligaments in animal bodies. For example, a well-attached filament initially having a serpentine shape will limit movement when placed in tension once it has become straight.

Figure 2:
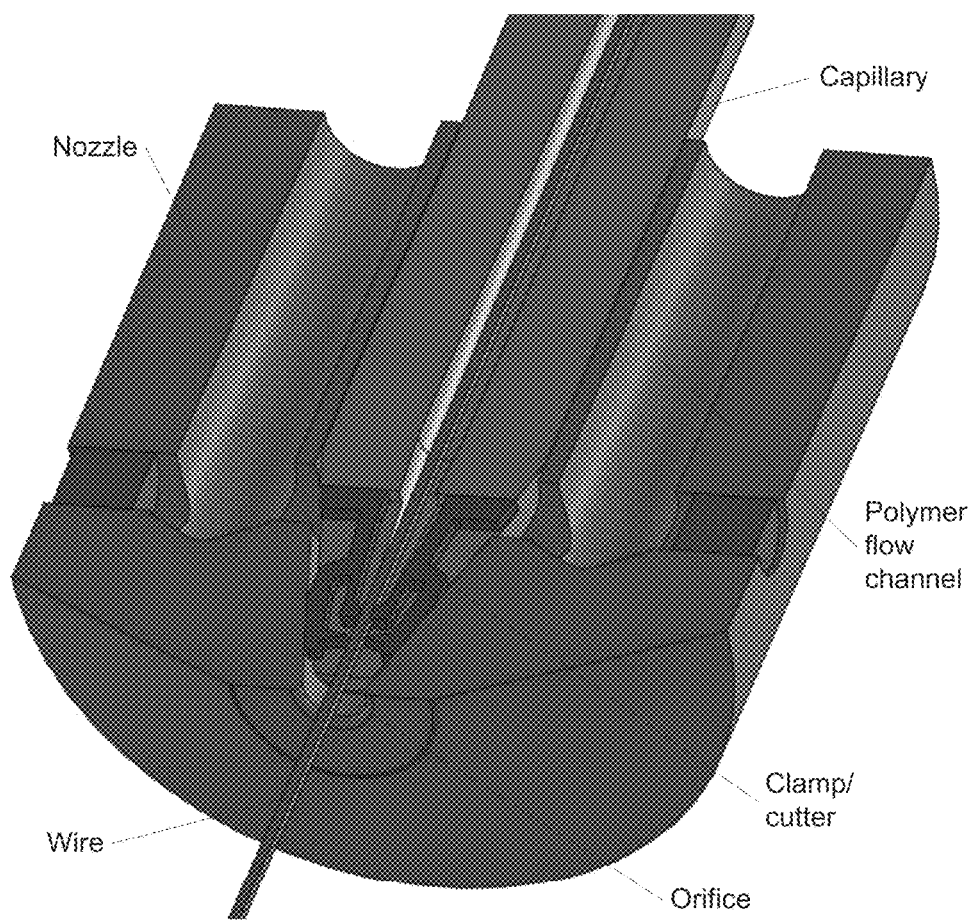
FIG. 2 is an isometric cross-section view of a FEAM printhead.

A FEAM printhead can include additional functionality compared to a standard FDM printhead, for example, the ability to: 1) cut wire; 2) in some embodiment variations, clamp wire; 3) switch between polymer and polymer with wire; 4) in some embodiment variations, switch from polymer with wire to bare wire; and 5) in some embodiment variations switch between extrusion of pure polymer and polymer-based ECPC. In some embodiment variations, ECPC is deposited by a separate printhead or separate nozzle, which may have different characteristics (e.g., a larger orifice diameter), especially if the ECPC is not based on the (pure polymer) matrix material or is less compatible with it. In some embodiment variations, ECPC is delivered coaxially with pure polymer. As shown in FIG. 2, a printhead capable of all of the above comprises an extrusion nozzle with two polymer flow channels and an orifice for extrusion; a slotted capillary having a lumen through which wire is fed; and within the capillary slot, a pair of clamps/cutters. The capillary can be, for example, a ceramic capillary similar to those used for wire bonding in the semiconductor industry, a steel hypodermic-type tube, a polyimide tube, or other material that can tolerate the elevated temperature of the polymer. Not shown for simplicity are elements such as heated liquefiers located upstream of the flow channels, an optional nozzle heater (the nozzle may be heated by the same heater as the liquifiers), and in some embodiment variations, two pairs of conductive feed rollers that advance the wire while heating it resistively and regulating wire tension. In some embodiment variations a key aspect of the printhead is the capillary through which the wire is fed. In some embodiment variations the capillary translates and in some embodiment variations the capillary also rotates about its long axis. The capillary may provide multiple functions: 1) clamping and cutting wire; 2) adjusting the position of wire within the extrudate in the plane formed by the orifice axis and the extrudate (e.g., a vertical plane); 3) purging the printhead when switching between elastomer and ECPC; 4) increasing control over the wire during winding operations (e.g., for solenoid cores); and 5) reducing polymer coating thickness (e.g., when producing coils). In some embodiments, these functions are divided among various components.

In standard coated wire extrusion, the wire is kept centered with respect to the extrusion die orifice by a capillary until the insulating polymer jacket solidifies, ensuring reasonable concentricity of wire and jacket. In FEAM, the capillary is typically vertical and the "jacketed wire" (i.e., polymer extrudate with wire core) is deposited parallel to the plane of the layers (see FIGS. 5($a$), 5($b$), 5($c$), and 5($d$)): typically horizontal. While molten polymer can easily negotiate this large (e.g., 90°) bend, the wire must be also be reoriented and bent. In some embodiment variations, the wire is gradually bent (to avoid kinks) and guided so as to be reasonably coaxial/concentric in the extrudate (excessive non-concentricity can lead to shorting between adjacent wires and other problems). In some embodiment variations, soft (e.g., annealed) wire is selected to facilitate bending in the vertical and horizontal planes. Concentricity is influenced by such parameters as wire stiffness, printhead speed, and viscosity and solidification rate of the molten polymer. For a given position of the printhead orifice above the building substrate/previous layer, the vertical concentricity of the wire is controlled, in some embodiment variations, by adjusting the internal capillary height, wire feed rate, and/or other parameters. However, accurate vertical (or horizontal/in-layer) centering of the wire within the extrudate is not required in some embodiments for the process to be useful. In some embodiment variations, this adjustment is dynamic, based on factors (e.g., printhead speed, extrudate geometry, deposition speed) which may change during the fabrication process, and in some embodiment variations closed-loop control of capillary height, capillary horizontal position or angle, or wire feed rate may be employed in which the vertical and horizontal position of the wire within the extrudate (unless the extrudate is no larger horizontally than the wire itself) is sensed using capacitive, optical, ultrasonic, electromagnetic, thermal, or other means.

Concentricity of the wire within the extrudate in the horizontal (i.e., layer) plane is influenced by such parameters as wire stiffness, printhead speed, viscosity and solidification rate of the molten polymer, polymer strength, capillary rotational angle, and the radius of curvature of the extrudate in the horizontal plane. In some embodiment variations, capillary rotational angle (e.g., in the case of non-circular wire) is adjusted to control horizontal concentricity. In some embodiment variations, this adjustment is dynamic and in some embodiment variations closed-loop control of horizontal concentricity may be employed in which the horizontal position of the wire within the extrudate is sensed. In some embodiment variations printhead speed is reduced when depositing extrudate along small-radius toolpaths, to allow more time for the extrudate to solidify and capture the wire.

Figure 3:
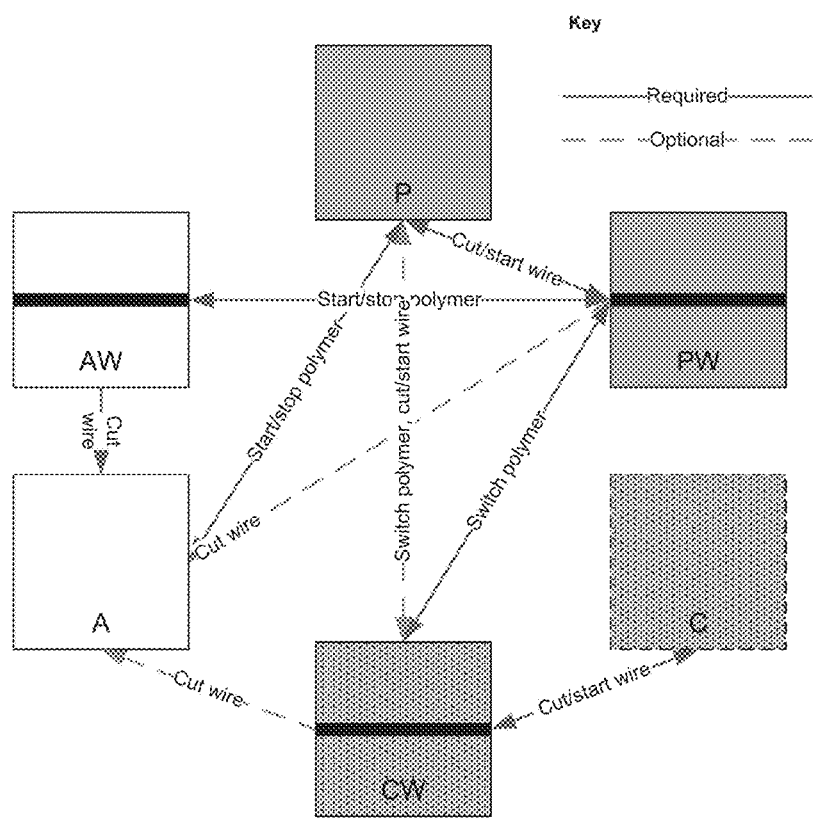
FIG. 3 is a diagram showing transitions between voxel types.

In FEAM, any given volume element (voxel) within the XYZ extents of the fabricated object can in principle contain one of at least three "homogeneous" materials (not including support material): structural polymer, ECPC, and air, as well as combinations of these materials with wire: polymer+wire (e.g., for encapsulated wiring), ECPC+wire (e.g., for conductive junctions), and air+wire (e.g., for actuator armatures, electrodes, etc.). Controlling which of these six or more types is deposited in each voxel—and transitioning cleanly among them—requires in some embodiments a reliable means of starting/anchoring wire, cutting wire, depositing "bare" wire with minimal polymer coating, switching between polymer and ECPC, etc. FIG. 3 depicts the six voxel types and the required transitions, as well as some optional transitions (not required for functionality, but which allow for greater design freedom). Some transitions may be impractical and possibly disallowed, such as A-AW (air to air+wire): in some embodiment variations, wire cannot be pulled from the capillary if not anchored in polymer as will be described hereinafter. The inverse transition AW-A is however, practical and allowable (e.g., by cutting the wire); all such constraints are accommodated in the software that generates toolpaths.

The functions needed to create the required transitions are 1) cutting wire, 2) starting wire, 3) producing bare wire, and 4) switching polymer type.

Figure 5A:
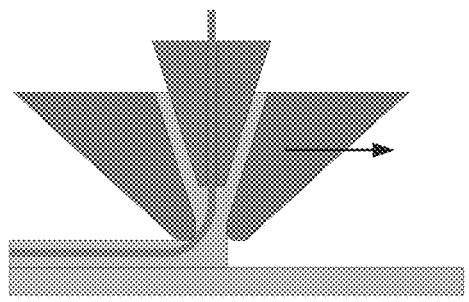
FIGS. 5(a), 5(b), 5(c), and 5(d) depict cross-sectional views of a wire cutting process.
Figure 5B:
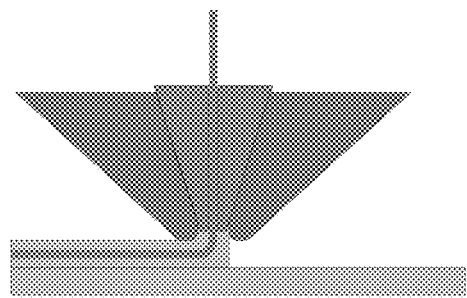
Figure 5C:
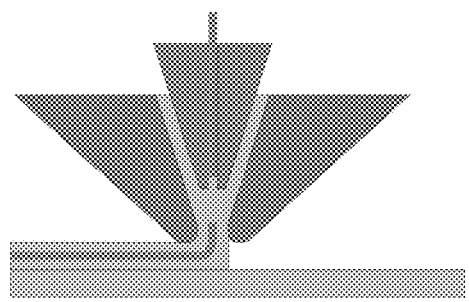
Figure 5D:
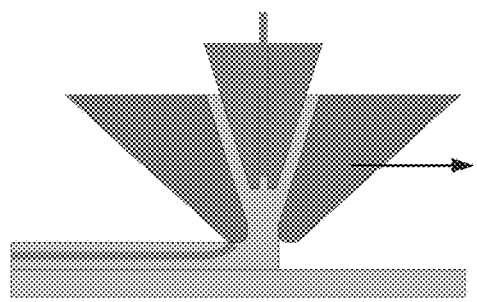

In some embodiment variations, a mechanical cutter near the tip of the capillary may be used for cutting wire, as is needed, for example, in the PW-P transition. FIGS. 4(a), 4(b), and 4(c) depict the lower portion of a printhead suitable for wire cutting in some embodiment variations. In FIG. 4(a) a cross-section of the lower portion of the printhead is shown; in FIG. 4(b) a closeup cross-section of the lower portion is shown; and in FIG. 4(c) an isometric view of the printhead capillary, clamp/cutter, and wire is shown. Within a slot in the capillary preferably perpendicular to the local axis of the deposited extrudate are mounted two small clamps/cutters, e.g., micromachined from hard steel using a process such as Laser MicroJet® cutting (Synova, Fremont, Calif.), which offers offering 5 µm accuracy and a 25 µm kerf. Each clamp/cutter includes tabs for contact with the inner taper of the printhead nozzle, wire clamping shoes through which the wire passes, cutting blades (which in some embodiment variations are staggered to provide a scissors-like shearing action), flexures, and a mounting surface. The clamps/cutters may be attached to the capillary by laser welding using an alignment fixture, crimping, an adhesive, or other means. When the capillary is translated axially and forced against the inner taper of the nozzle, the tabs are pushed inwards, bending the flexures and causing the shoes to clamp the wire. If the translation force is increased, the cutting blades are directly pushed into the wire, cutting it. FIGS. 5(a), 5(b), 5(c), and 5(d) show the PW-P transition; the AW-A transition is similar. In FIG. 5(a), polymer is extruded and wire is fed out; in FIG. 5(b) the printhead is stopped and the capillary is lowered, compressing the clamp/cutter to cut the wire. In FIG. 5(c), the capillary is raised, and in FIG. 5(d), the printhead is moving forward again while extruding polymer. The small length of wire that may protrude above the layer in FIG. 5(c) is bent into and captured by the molten polymer as the nozzle passes over it.

In other embodiment variations, other methods are used to cut, break, or otherwise terminate the wire. For example, wire may be suddenly tensioned to break it, if well anchored in solidified extrudate. Or, wire may be broken through work hardening and fatigue by being twisted either in one direction (clockwise or counterclockwise), or twisted alternating between clockwise and counterclockwise rotation. To accomplish this with non-circular wire passing through a non-circular capillary hole, the capillary need only be rotated; with circular wire, the capillary may additionally clamp the wire before rotation. Also, wire may be broken through work hardening and fatigue by motions of the entire printhead, not just by capillary rotation. For example, the printhead may be made to oscillate in the layer plane back and forth several times. Wire may be cut using a laser, electron beam, flame, or electrical discharge, or by rapid stretching or bending, scoring/nicking/partial cutting and stretching (e.g., using counter-rotating feed rollers on either side of the scored region), vaporization through resistive heating, or by other mechanical cutting devices such as rotating wheels, miniature milling cutters, or blades. It may be preferable to use a method that minimally alters the wire shape (e.g., creating burrs or wider regions) so that it can pass through the capillary, if the cutting is upstream of the capillary, and so it is not distorted or stressed in its final state, embedded within the polymer. However, burrs and distortions can also be corrected by further processing of the wire after cutting, such as pulling the wire through an orifice in hard material or passing it between two grooved rollers. Mechanical cutting using a very sharp blade (e.g., steel, diamond, glass, silicon, obsidian, sapphire, cubic boron nitride, or silicon carbide) may be advantageous, as may be a blade which is rotating or vibrating, as in vibratory microtomes. Wire that is cut by a blade may be cut from one side (e.g., against a flat surface/anvil), or from two or more sides. Multiple cutting blades, if used, may be aligned or may be offset, the latter causing a shearing effect on the wire.

When a transition such as P-PW is required, a means of starting wire (actively feeding wire when the free end is not already captive inside polymer) may be used. In some embodiment variations, wire may be transported through the capillary by simply feeding it into the capillary (e.g., using rollers located between capillary and wire supply) in a manner that avoids buckling. Preferably the capillary inside diameter is just slightly greater than the wire outside diameter, and the entrance to the capillary is near the rollers. To facilitate loading of the wire into the capillary, the capillary may be flared at one or two ends, be made from or lined with a low-friction material, vibrated during insertion, or lubricated. Suction may also be used to help load the wire.

In other embodiment variations, wire may be fed using a mechanism located between capillary and nozzle tip or within the capillary itself. For example, wire may be feed by vibrating the capillary or separate structures) in contact with it at sonic or ultrasonic frequencies. If the wire surface is suitably textured (e.g., with a saw tooth-like pattern), or if the wire is contacted by a suitably-textured surface (e.g., having a saw tooth-like shape, or having angled bristles), it may be made to advance in one direction through the nozzle. As an example, a suitable vibratory feeder may consist of two small brushes with angled bristles between which the wire is pressed. The motion imparted to the wire can be more complex than simple vibration (e.g., elliptical) such that each cycle the wire is grabbed, advanced slightly, and released to propel the wire: an inchworm-type of motion. The motion of piezoelectric actuators such as the NEXLINE®/NEXACT® Piezo Linear Motors of Physik Instrumente (Karlsruhe/Palmbach, Germany) may be applicable. Other methods of feeding wire (and polymer or composite filament) include miniaturized rolling ring drives (Joachim Uhing GmbH & Co. Flintbek, Germany).

Active feeding, especially in the case of vertical capillaries (i.e., those parallel to the nozzle axis) may also be used to reduce friction between capillary and wire when the anchored wire is pulled, control wire height (vertical position) within the extrudate, and reduce the likelihood that wire will contact the nozzle, which may cause the molten polymer extrudate to split into two or more streams.

In some embodiment variations, the wire can be entrained by the flow of the polymer and move along with it (possibly at a lower speed) when the wire is made free to move.

In other embodiment variations, the wire is primarily pulled, not pushed, out of the capillary. Pulling the wire requires that it be initially dispensed a small amount from the capillary and then well-anchored in the polymer. Also, the tension in the wire is preferably well-controlled (e.g., by a slip clutch on the wire spool, or passing it through rollers equipped with a slip clutch or motor drive). For initial dispensing feed rollers can be used; these may also be used to assist with wire feeding, thus reduce the strain on the anchored wire and minimizing the risk of wire detachment or polymer tearing. FIGS. 6(a), 6(b), 6(c), 6(d), and 6(e) show an approach to wire starting. In FIG. 6(a), the printhead is stopped (or equivalently, the build platform is stopped) and a short length of wire is fed into molten polymer. In FIG. 6(b), the capillary is lowered, clamping the wire, and in FIG. 6(c), the printhead is moved relative to layer N (the layer being formed), impaling layer N−1 with the wire to help anchor it. If the material of layer N−1 is relatively soft, impaling it may be relatively easy; however, in some embodiment variations the wire is heated or ultrasonically vibrated to melt the polymer for purposes of anchoring.

In FIG. 6(d), the capillary is raised, unclamping the wire, and in FIG. 6(e), the printhead is moved forward, bending the wire, while polymer is extruded and solidifies around the wire, helping to anchor it. In some embodiment variations, to minimize the risk of pulling out the wire after impaling the polymer, the capillary is raised a significant amount before the printhead is moved so that the wire can more easily bend and won't be pulled too much horizontally when the printhead moves. Wire feed distance, impale depth, capillary height, and delay before moving (e.g., waiting until the polymer is fully solidified) may be important parameters to control the anchoring process. In addition, by anchoring wire in ECPC vs. pure polymer, the higher hardness of the composite due to the filler can assist with anchoring. In some embodiment variations, a suitably textured wire as described above can be employed to improve anchoring within the polymer and minimize the risk of pull-out. In some embodiment variations, the wire may be stranded or porous to encourage polymer infiltration and improved anchoring. In some embodiment variations, the wire surface may incorporate barbs (similar to the Quill™ suture of Angiotech (Vancouver, BC)) or other features which make inadvertently pulling the wire through the polymer more difficult. In some embodiment variations, the wire can be looped where needed (e.g., at regular intervals) so as to better anchor it within the polymer. In some embodiment variations, the wire in the vicinity of the free end may be modified to improve anchoring. For example, the process that is used to cut the wire may also impart a texture on the wire end near the cut. Or the wire may be bent near its tip (e.g., an "L", "J", or serpentine, circular, or helical shape) to improve anchoring. In some embodiment variations, a FAB may be formed at the wire end and the FAB embedded inside molten polymer that is allowed to solidify. In some embodiment variations, the printhead may deposit the extrudate/embedded wire in a sharply curved (e.g., a "U") shape after starting the wire, such that the curve helps to anchor the wire. In some embodiments, wire will be started within ECPC vs. within unfilled matrix as the higher viscosity of ECPC can also help anchor the wire end.

Many of the structures created with FEAM will be created by extruding wire and polymer together. However, there are situations where bare wire is needed, including creating solenoid cores and capacitor plates containing the maximum possible volume fraction of metal. Bare wire regions with no residual polymer coating may also be desirable for creating terminals to connect to separately-fabricated components such as batteries. In some embodiment variations, polymer coating the wire (including coatings for wires that are pre-coated with insulation, such as magnet wire) can be removed by laser processing (e.g., $CO_2$, excimer, femtosecond), heating using a heated blade or other device (and optionally, wicking away melted polymer), burning, creating a FAB (the formation of which will damage the polymer coating), mechanical stripping (e.g., cutting and pulling, wire brush, abrasive), plasma etching, wiping the wire (while the polymer is still molten), etc. To the extent that the wire is heated or textured to increase adhesion of the polymer to it, this can be eliminated in areas that are intended to be bare.

In some embodiment variations, simply continuing to feed wire while stopping the feeding of polymer into the printhead liquefier can arrest polymer flow and yield bare wire, since the wire is surrounded by the capillary—serving as a sheath—until shortly before it exits the nozzle. In some embodiment variations, to minimize any residual coating on the wire the polymer flow is reversed so as to draw molten material away from the capillary tip. Retracting the polymer filament is commonly done in FDM to minimize the formation of thin strings or to minimize nozzle oozing. Retraction with a suitable velocity profile should extract most of the polymer from the volume between capillary and nozzle in which polymer coating of the wire normally occurs. In some embodiment variations, the surfaces within the volume to which polymer might adhere may be coated with a low surface energy material such as PTFE or AMC148-18 (Advanced Materials Components Express, State College, Pa.). Since retraction is not instantaneous, the need for bare wire is preferably anticipated by the FEAM apparatus control software: the printhead can be stopped or slowed, or retraction initiated before reaching the bare wire region.

Figure 7A:
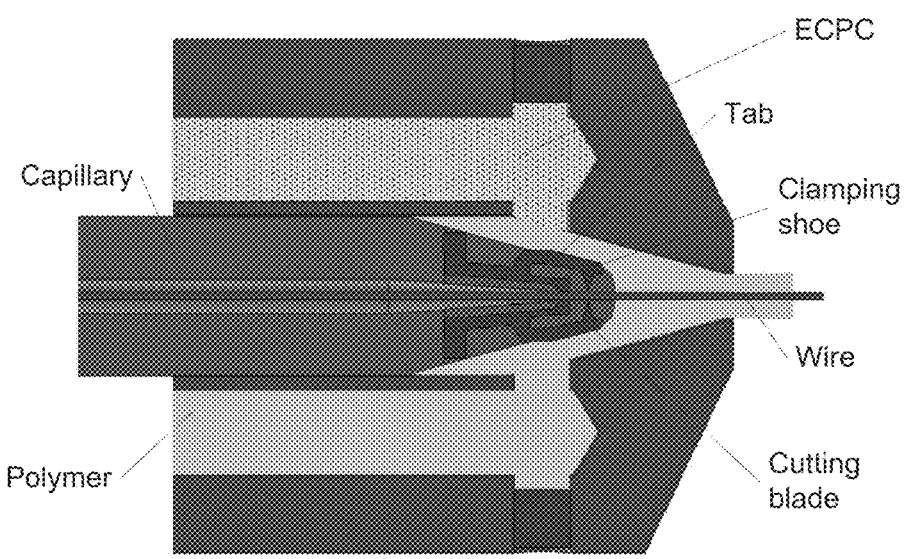
FIGS. 7(a) and 7(b) show cross-sectional views of a FEAM printhead dispensing polymer (7(a)) and with the printhead purged (7(b)).
Figure 7B:
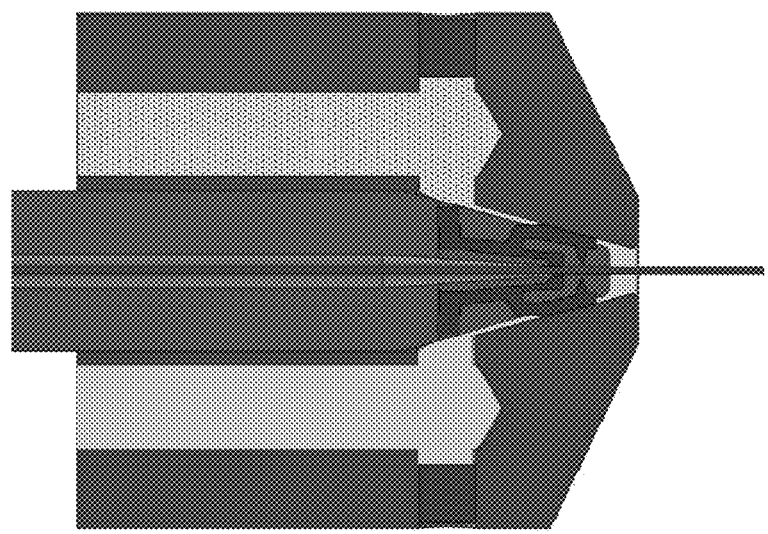
Figure 8A:
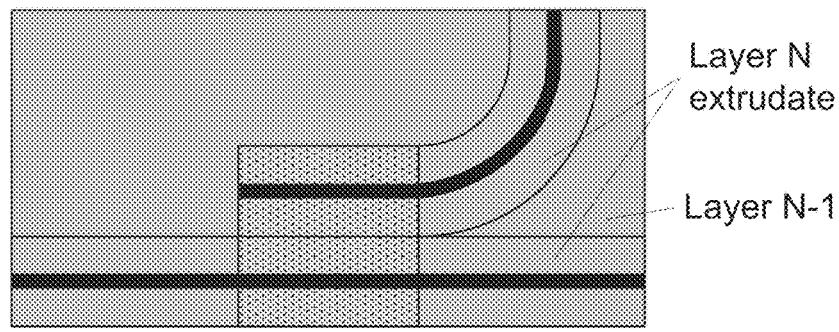
FIGS. 8(a) and 8(b) show plan views (i.e., looking down onto the X/Y plane parallel to the layers) of intra-layer junctions (8(a)) and a cross-sectional elevation view of inter-layer junctions (8(b)).

A major advantage of using ECPC is that localized delivery of the composite material can be directly integrated into the manufacturing process. In some embodiment variations, this can be done by designing the print head nozzle with two flow channels: one for delivering polymer, and one for delivering ECPC, as shown in FIGS. 7(a) and 7(b), while in other embodiment variations, this can be done using separate printheads and/or nozzles. This allows formation of conductive regions (ECPC surrounding wire, or "CW") "on the fly" as material is deposited. However, in some embodiments, ECPC or other conductive materials may be deposited through a separate operation, before or after dielectric matrix material and wire are deposited (in the former case, the wire becomes embedded into already-deposited conductive material). Any two CW regions adjacent in the same layer and at least partially overlapping can form an intra-layer junction (FIG. 8(a)). Separate volumes of conductive material may in some embodiments be deposited on each wire, while in other embodiments a junction between two or more wires may be produced by depositing a single volume of conductive material the encompasses the wires. In some embodiments, wires may overlap (e.g., cross) within the same layer, and may therefore spontaneously form a junction, but even in such embodiments, the resistance and reliability of the junction may in some embodiment variations be improved by encapsulating the wires in conductive material.

Figure 8B:
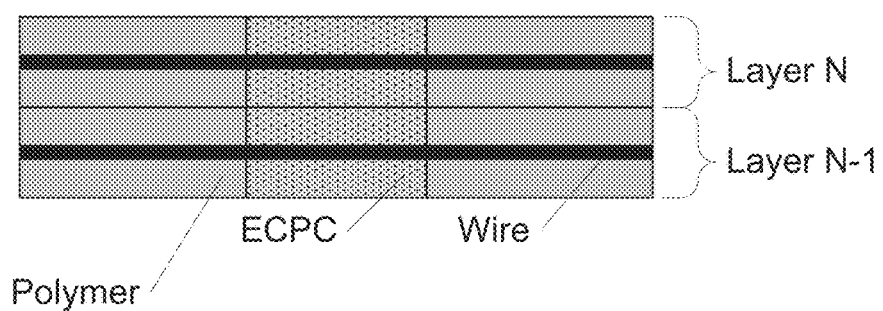

Any two vertically adjacent, at least partially-overlapping regions of conductive material can form an inter-layer junction (FIG. 8(b)), whether there is wire on the two adjacent layers or not (e.g., ECPC "vias" may span multiple layers to connect wires separated by multiple layers). Direct contact of the wires in these junctions is not required. Junctions can incorporate more than two wires as shown, and in the case of inter-layer junctions, can span more than two adjacent layers, forming vertically-conductive vias.

Preferably the conductivity of the ECPC is relatively isotropic and homogeneous throughout the CW region, such that there is a continuous path of relatively low resistance from wire to wire; for adjacent junction voxels, this requires low resistance from the location within the junction in contact with the wire, to the surface of the ECPC voxel in contact with the other ECPC voxel. In some embodiment variations, a magnetic field can be used to modify ECPC conductivity in favorable ways if the metal filler is magnetic (e.g., Ni). Polymer and ECPC material are in some embodiment variations delivered to the printhead as filaments, while in other embodiment variations, they may be delivered in other forms, such as pellets or powders. Since relatively little ECPC material is needed when ECPC is confined to junctions, and ECPC filament due to its high filler content may be challenging to wind on a spool, relatively straight (i.e., large radius of curvature) and in some embodiment variations, larger diameter (e.g., 3 mm) replaceable lengths of ECPC filament may be used to supply the printhead.

Each of the dispensing channels shown in FIGS. 7(a) and 7(b) is downstream of a liquefier (not shown) into which filaments are fed by rollers. In FIG. 7(a), the printhead is operating normally, extruding polymer. In FIG. 7(b), the capillary has been lowered as much as possible (without causing the wire to be nicked/cut by the cutting blade) in preparation for extruding ECPC (the PW-CW transition). Since both liquefiers are "plugged" upstream by solid filament acting as a piston (as in conventional FDM), lowering the capillary purges most of the polymer from the nozzle. In some embodiment variations, the capillary may be designed with a channel that opens up to either the pure polymer or ECPC channel, such that it serves as a rotary valve: rotating the capillary allows either one material or the other to flow through the nozzle. The capillary is then raised and the ECPC filament advanced to extrude material. The CW-PW transition follows a similar sequence. In some embodiment variations in with ECPC has limited thermal stability, elements of the printhead (e.g., the liquefier) associated with melting ECPC and keeping it at deposition temperature are cooled when no ECPC is needed soon, to prolong ECPC lifetime.

There may be some uncontrolled mixing of polymer with ECPC and vice-versa in the proposed configuration. In some embodiment variations, by exploiting the "quantized" nature of percolation in ECPCs, reasonably abrupt differences in conductivity between adjacent regions of an extrudate ("voxels") that are intended to be dielectric, and those meant to be conductive, are obtained. In some embodiment variations, the particulate filler concentration is set higher than the percolation threshold so that minor dilution by unfilled polymer doesn't lower concentration below the threshold; yet the concentration is set low enough that material in dielectric voxels contaminated with low concentrations of particulate is not rendered conductive. In some embodiment variations, long (e.g., 1-2 mm or greater) junctions are provided, such that all "conductive" voxels within a junction need not be fully conductive to yield a low junction resistance overall. In some embodiment variations, the conductivity of the ECPC is monitored in-situ to ensure that a good junction can be formed. This can be performed by incorporating electrodes into the printhead (e.g., within the nozzle) to measure the conductivity before extruding ECPC, or can be performed on the extruded material. Conductivity measurements can be used to optimize filament and machine parameters, and junctions with inadequate conductivity can be made longer/larger, or additional junctions provided, to compensate.

In some embodiment variations, all or much of the length of a wire may be embedded in ECPC, which can further reduce electrical resistance, provide for a large number of junctions, etc. In some embodiment variations, design rules used in the layout of a printed structure can avoid locating CW-PW transitions in regions of tightly-spaced conductors (e.g., a coil) to allow for minor conductivity in PW voxels due to inter-contamination of ECPC and polymer.

In some embodiments, ECPC need not be delivered "in-line" along with the dielectric material such that the printhead must switch between the two materials and the composition of the extrudate changes dynamically. Rather, the dielectric material and ECPC can be applied through separate operations. For example, dielectric material may be applied first, leaving a trench one or more layers deep within which at least one bare wire is exposed; this is then filled in by deposited ECPC. Such trenches can be filled by methods differing from FDM extrusion, and may involve means for removing excess material such as wiping with a doctor blade/squeegee. Alternatively, for a given layer, wire/ECPC regions may be formed first and dielectric regions formed afterwards. The trench approach allows multiple wires on the same layer or different layers (if the trench spans multiple layers) to share the same region of ECPC, which can reduce resistance. In some embodiment variations, trenches may be formed by placing objects with suitable shape (e.g., a disk or rectangle large enough to form a junction) and depositing material around them, then removing the object.

In some embodiment variations square wire (e.g., Fort Wayne Metals, Fort Wayne, Ind.) is used in FEAM for building "solid" metal volumes. In such embodiments, the capillary tip has a square orifice (e.g., produced by wire EDM, or by machining the tip in separate halves) and the capillary rotates during extrusion such that two opposing sides of the wire remain tangential to the platform velocity, forcing the wire to bend in the correct plane and preventing wire bulging and/or layer delamination. In some embodiment variations, the capillary tip is located far enough from the nozzle orifice that any twisting in the wire which occurs is distributed over a significant length. To minimize buildup of torsion in the wire when following curved paths, in some embodiment variations the wire spool is rotated in the same direction as the capillary (e.g., synchronously). In some embodiment variations, the buildup of torsion in the wire is minimized by alternating the deposition direction of extrudates comprising a layer between a clockwise and counterclockwise direction. This may be calculated and incorporated into the toolpath planning, or the torsion sensed and the deposition direction reversed when needed. In some embodiment variations, torsion buildup is minimized by cutting the wire more frequently than otherwise needed, and re-starting it; the wires connect through ECPC junctions as usual. In the extreme, cut pieces of wire can be used in FEAM, so that wire is not provided on a spool but in relatively short pieces. In some embodiment variations, torsion buildup can be counteracted by intentionally twisting the wire (e.g., by spinning the capillary) enough to create plastic deformation (e.g., periodic twisted regions along the wire).

Figure 9:
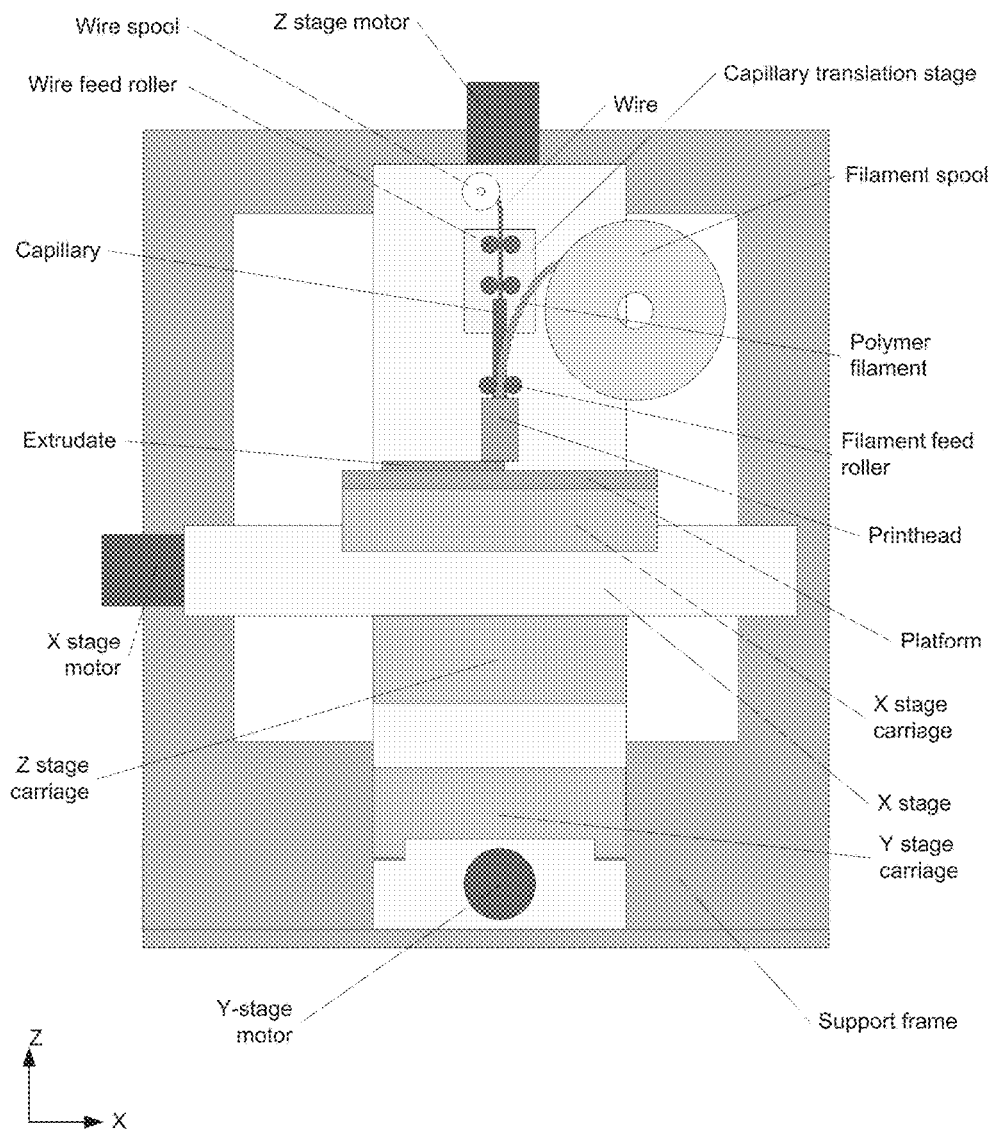
FIG. 9 shows a front elevation view of apparatus for FEAM.

An apparatus for FEAM may be configured in some embodiment variations as in FIG. 9. The printhead capillary in some embodiments may be arranged to pass through a hollow rotation motor. A build platform is provided with three axes of motion using stages and motor (in other embodiment variations, the printhead may instead be provided with one or more of these axes). A spool provides polymer filament to a printhead, advancing it, for example, using feed rollers. In some embodiments, the filament is cooled to prevent softening before reaching the printhead liquifier. Cooling can be provided by blowing continuous or pulsed gas onto the filament, by using cooled feed rollers, etc. ECPC filament is also fed into the printhead, e.g., using feed rollers (not shown), as is wire, which may be fed using two pairs of rollers, such that the wire is heated resistively (to enhance wire coating by the polymer) by passing current from one pair to the other. To improve traction and electrical contact, the wire may be wrapped at least once around one roller of each pair. Inductive or other means of heating the wire may also be used, as can heating the rollers, heating the capillary (e.g., if external to the nozzle) by contact with a heating element (e.g., wrapping it with insulated nickel-chromium wire), infrared heating, flame heating, inductive heating, and laser heating, for example. The entire apparatus is preferably enclosed within a temperature controlled environment; alternatively or in addition, the build platform/substrate may be heated. Fabrication parameters (e.g., nozzle/platform gap, toolpath curvature, and platform speed) may be varied to optimize extrudate width, height, uniformity, surface quality, defects, and residual stress due to shrinkage.

In FDM, the printhead typically moves in X/Y and the part moves in Z. It may be desirable to use the standard FDM approach also for FEAM, since moving the part or device quickly in X/Y can cause movement and vibration of the previously-deposited material, especially if it is elastomeric, leading to misalignment of layers. Certainly, use of rigid support material (temporary or encapsulated) can mitigate this. However, there can be benefits to keeping the printhead fixed in X/Y and moving the part, since the printhead and its feedstock are different and more complex. To compensate for potential misalignment due to rapid part movement, to facilitate the use of printheads which are relatively massive and difficult to accelerate, etc., the printhead (or just the nozzle) can be moved by small distances at relatively high speed only so as to "track" the undesired movement of the previously-deposited layer, much as a CD (compact disc) or DVD read head is servoed to track the position of the disc data track as the disc spins. Computer vision can be used to identify fiducial marks on previous layers (e.g., internal to the final object surfaces, or in support material), or the edges of previous layers, to provide the requirement positioning data. For this purpose a camera can be incorporated into the printhead just ahead of the nozzle. Alternatively, a very lightweight motion stage can be used to rapidly position a lightweight extruder or nozzle, or the tip of a heated, flexible tube (e.g., double walled vacuum tubing such as Insulon (Concept Group, West Berlin, N.J.), according to part geometry (e.g., driven by G-code data), while the additional, heavier hardware required for extrusion is kept nearby, moved by its own motion stage so as to maintain a not-to-exceed distance from the lightweight stage. The motion of the "heavy" stage does not need to be exact, so long as the maximum distance between stages is not exceeded; thus, the heavy stage can avoid the need for high accelerations of which it may not be capable, or which it may not be able to perform accurately.

FEAM generally requires software to generate suitable toolpaths for the printhead and to control the apparatus during fabrication. Such toolpaths may be generated by processing one or more files defining the geometry and the functionality of the object to be fabricated. In some embodiments, multiple files may be processed, for example, three .STL files (commonly used in additive manufacturing), each defining the location of one material (matrix material, filament, conductive matrix material/ECPC). Software generating toolpaths (e.g., after the design process, or during it) may in some embodiments preferentially (e.g., as a first step) route extrudates which include embedded filament along user-designated or automatically distance-optimized paths on a layer, or along paths which meet other requirements of the process (such as providing for intra- and inter-layer junctions or avoiding sharp bends in the wire). Extrudates needed to form the layer which do not include filament are also routed, but at a lower priority (e.g., as a later step) and in some embodiments, in a secondary process. In some embodiments, toolpaths can be generated such that the number of transitions between one voxel type and another are minimized, especially those transitions which take some time or have the potential to introduce defects. In some embodiments, the spacing between extrudates containing wire and/or ECPC may be arranged so that such extrudates are placed adjacent to one another (on the same or different layers) as little as possible, to reduce the risk of shorts.

FEAM can be used to make and integrate into co-fabricated devices—either singly or in a distributed fashion—a wide variety of electromagnetic and electrostatic actuators and sensors. Electromagnetic actuators that can be fabricated include solenoids (linear and rotary), voice coils, motors (e.g., axial and transverse flux motors in which the axes of coils and rotation are parallel and thus easier to fabricate), and novel configurations (e.g., using the attractive or repulsive force between adjacent current-carrying wires). Electrostatic actuators include "comb drive" and parallel-plate electrostatic actuators. Electromagnetic sensors that can be produced include linear variable differential transformers (LVDTs), variable-reluctance sensors, and fluxgate sensors. Electrostatic sensors that can be made include capacitive sensors such as those using surface or projected capacitance.

Figure 10:
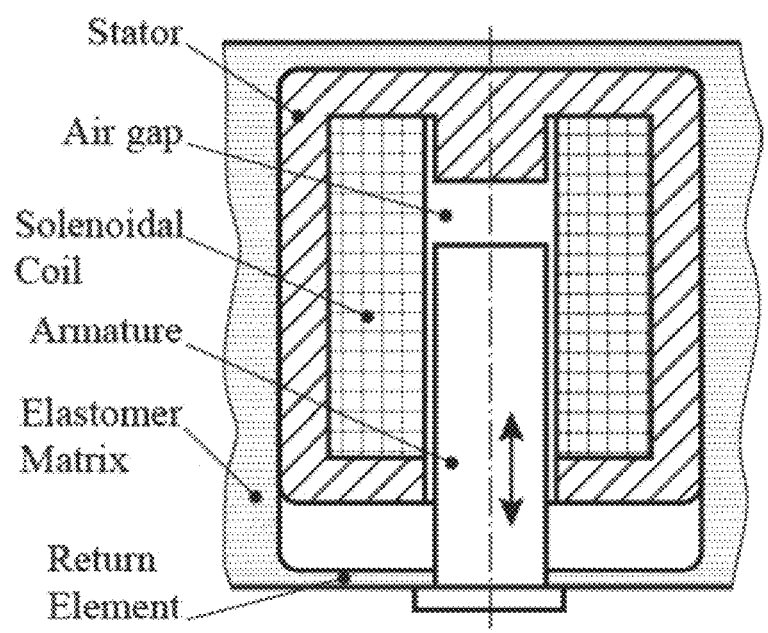
FIG. 10 Shows a cross-sectional schematic of a plunger type solenoid actuator (PRIOR ART).

Among the devices that can be made using FEAM are DC plunger-type solenoid actuators. Such actuators are in some embodiment variations readily distributed through a robot limb or body and connected by wiring. A typical plunger solenoid actuator (FIG. 10) has a coil wrapped around a solid or laminated ferromagnetic armature (plunger). When current flows in the coil, the magnetic field produced in the core attracts the plunger with a force roughly proportional to the square of the coil current [Brauer, 2006]. As the plunger moves inward, an element such as a spring is deformed; when current stops this returns the plunger to its original position. A ferromagnetic stator surrounding the coil strengthens the flux and improves performance. In some embodiment variations, solenoids may be cascaded in series end-to-end (i.e., the plunger of solenoid N connected to the body of solenoid N+1, etc.) to increase displacement, or arranged in parallel to increase force, or in a combination of series and parallel arrangements.

Figure 11A:
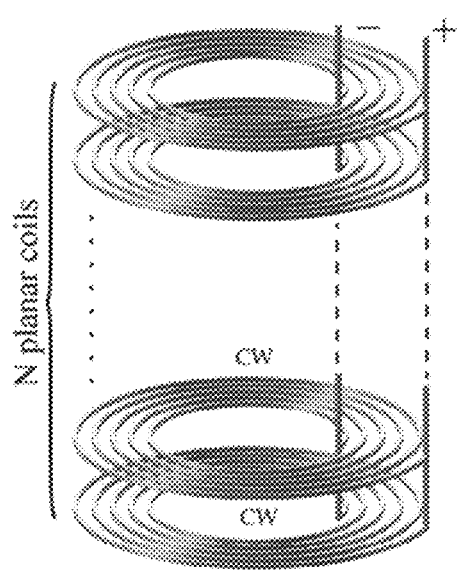
FIGS. 11(a) and 11(b) depict two coil architectures in isometric views: stacked planar spiral coils connected in parallel (11(a)) and stacked pairs of spiral coils connected in series (11(b)).
Figure 11B:
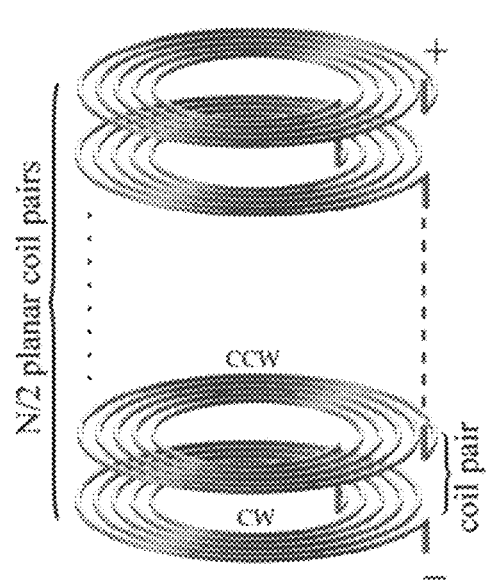

Solenoid actuators may be made using FEAM in several ways. In some embodiment variations, a trench is provided that spans multiple layers, and a coil is continuously wound within the trench using PW voxels, much like a standard coil. In other embodiment variations, as shown in FIG. 11(a), the coil is made from stacked spiral planar coils: coils are wound clockwise (as shown, or counterclockwise) and joined vertically both at the inside and the outside of the coil stack, such that all are electrically connected in parallel. Such an arrangement reduces overall coil resistance. In still other embodiment variations, as shown in FIG. 11(b), the coil is made from stacked pairs of spiral planar coils: one coil of each pair is wound clockwise from outside to inside, while the other is wound counterclockwise from outside to inside. The inside ends of both of these are then wired in series, such that current flows clockwise (or counterclockwise) through both of the coils in the pair. Such an arrangement also reduces overall coil resistance, and such paired coils may be continuously wound (i.e., both coils wound without interrupting the wire) or wound separately and joined; if the former, then in some embodiment variations each coil of the pair may be only half the typical layer thickness, with the pair as thick as the typical layer. In this configuration both connections are on the outside of the coil stack. In some embodiment variations, the pattern shown in FIG. 11(b) is extended beyond just one pair of coils using continuous wire, to a large number of coils made using continuous wire, in which on alternating layers, spirals are formed either from the outside to the inside, or from the inside to the outside. In some embodiment variations, such as to allow closer spacing of coil turns and increase the number of turns in the coil, the capillary is lowered partially to reduce the thickness of the polymer coating the wire. The gauge of the wire used for the coil can be selected based on considerations of current handling requirements, weight (since metal is far denser than polymer), and suitability for the FEAM process.

In some embodiment variations to improve the force/current characteristic of the actuator the plunger and stator have a large relative magnetic permeability, and may be made from stacked, spirally-wound bare wire such as nickel (Ni $\mu_r$=110-600) or Ni-based ECPC.

Figure 12:
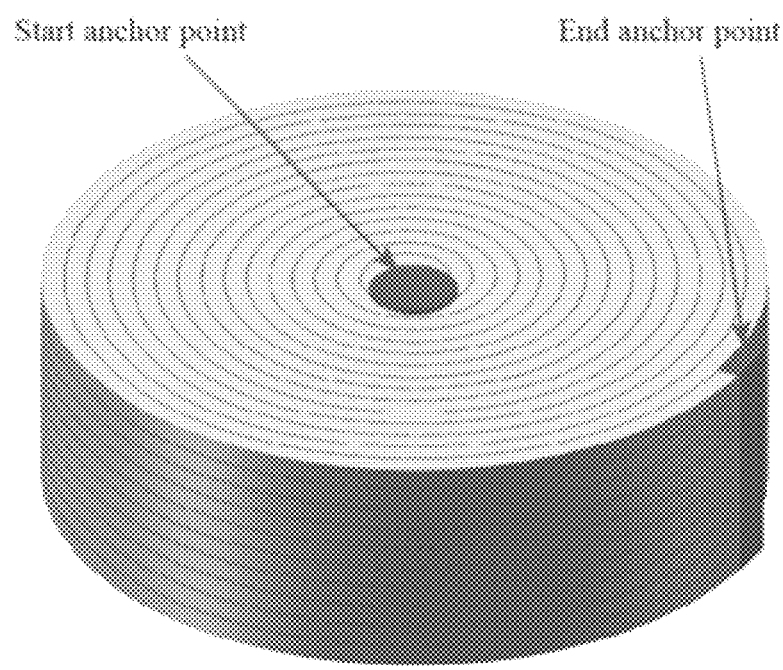
FIG. 12 shows an isometric view of a solenoid plunger formed by stacking tight spirals of bare square ferromagnetic (e.g., nickel) wire.

In some embodiments, to improve the force/current characteristics of the actuator, e.g., the plunger and stator, materials are chosen having a large relative magnetic permeability. For example, cores, armatures, plungers, and the like may be made from nickel (nickel μr=110-600) wire, or nickel-, iron-, or Permalloy-based ECPC or other filled polymer (not necessarily electrically conductive), e.g., deposited into a cavity. FIG. 12 depicts a stacked, spirally-wound bare nickel wire plunger, in which wire is wound in a spiral path on each "layer" (not necessarily the same thickness of the device layers). In some embodiment variations, the two ends of the wire on each layer can be anchored in polymer. In some embodiments, elements such as plungers may be wound in a more conventional 3-D fashion, using a helical trajectory of the capillary to wind wire around a central "spool" of polymer, filled polymer, inserted object, etc., in a single "layer" of wire, or in multiple "layers", with each layer increasing the element diameter. To facilitate winding elements made from bare wire and in some cases, small radii such as these, the capillary may be lowered within the printhead (or lowered outside the printhead, if the capillary is external) to better control the wire position. Square or rectangular wire vs. round wire is used in some embodiment variations as it can be wrapped to form dense solenoid cores, stators, and capacitor plates; it's also easier to clamp and have its position sensed within the extrudate (e.g., capacitively, ultrasonically, magnetically, or optically) so that it can be adjusted statically or dynamically (e.g., by moving the capillary). In some embodiment variations, the plunger is supported by a flexible (e.g., elastomer) diaphragm or bellows, allowing axial motion and optionally, providing a return force.

Permanent magnets and permanent magnetic materials may be incorporated into devices and structures produced using FEAM. For example, the layer-by-layer building process may be interrupted so that a void or trench in deposited material can be filled with a mixture of binder (e.g., epoxy) and NdFeB particles and the FEAM process then continued. After solidification (e.g., room temperature or oven curing, solidification from a molten state, UV curing) and magnetization, the material forms a permanent magnet: solidification can be achieved before proceeding with the FEAM process, or after the entire device is built. Alternatively, a composite of polymer and a magnetic powder can be formed, analogous to ECPC, and then deposited directly through a suitable nozzle (e.g., the FEAM printhead could deposit pure polymer, ECPC, and magnetic polymer). Alternatively, pre-formed magnets can be incorporated into a device made by FEAM by interrupting the process and inserting the magnet into a suitable trench or opening, then continuing the process.

Capacitance-based actuators may be made using FEAM. For example, dielectric elastomer actuators (DEAs)—a subgroup of electroactive polymers (EAPs)—change their shape when subjected to an electric field, and typically comprise a layer of elastomer sandwiched between two compliant electrodes. Due to the small displacements normally produced, these may be stacked to create dielectric elastomer stack actuators (DESA). Compliant electrodes may be in the form of wire (e.g., serpentine or coiled, preferably without polymer coating), ECPC, or both. A filled may be incorporated into the elastomer to increase its relative permittivity, thus increasing the force per unit area of the actuator (i.e., the Maxwell stress). FEAM enables DEAs and DESAs with complex, non-planar shapes not achievable with conventional methods of fabrication. DEAs and DESAs may be further co-fabricated with other elements to create valves, pumps, and other useful devices; however, such devices can also be actuated by FEAM-fabricated electromagnetic, shape memory, piezoelectric, thermal, or other types of actuators.

In other embodiments, FEAM may be applied to making structures from materials other than polymers. For example, FDM has been used to fabricate "green" ceramic parts (made from ceramic particles and a polymer binder), which are fired at high temperature after fabrication to form a ceramic of the desired properties. Some clays, ceramics, and ceramic-like materials do not require high-temperature firing (e.g., Rescor™ castable ceramics of Cotronics (Brooklyn, N.Y.)), while others may. Using wire (e.g., tungsten, platinum) that is sufficiently refractory given the processing temperature of the ceramic, FEAM can be used to make ceramic products with embedded wiring such as custom heaters of complex shape, sensors for high-temperature environments, chemical processing devices, medical implants with built-in strain gauges and other elements, passive components (e.g., capacitors, inductors, and antennas), etc. In some embodiments, concrete, plaster of Paris, and similar materials may be used in a FEAM process (possibly with viscosity modifiers to prevent slumping of the extruded material). The resulting parts are similar in some respects to low-temperature or high-temperature co-fired (LTCC or HTCC) ceramic parts, but offer far more complex 3-D geometry and easier, more automated fabrication. In such a case, ECPC may be replaced by a conductive material of the kind normally used for LTCC/HTCC metallization, such as a conductive paste containing Ag or Cu, and the wires used for interconnections can be of a refractory material such as tungsten. The ceramic can be a green ceramic-polymer composite which ultimately is fired to create the final object. FEAM may be used with molten glass in lieu of molten filament, or glass frit mixed with a binder, to make glass structures with embedding filaments such as conductive wires.

In other variations, bare die or packaged ICs (e.g., microprocessors, signal processors), optoelectronic components (e.g., camera chips, LEDs), MEMS sensors, magnets, piezoelectric crystals, and hardware components such as bearings can be integrated into FEAM-produced components, for example, by using integrated pick-and-place assembly hardware to position parts into a structure while it's being fabricated. Connections to pads on semiconductor die can be made by wire bonding between pad and FEAM wiring using standard wire bonding techniques (e.g., using the capillary as a wire bonding tool). Or, if the pad pitch matches the minimum FEAM line width, by direct connection of pad to wire using conductive polymer (e.g., ECPC), much like flip chip assembly performed with conductive adhesives. Solder, especially if low temperature, may also be used.

Other variations can include multiple wires co-deposited simultaneously within a single extrudate. FEAM can also be expanded to include composites with magnetic filler materials (e.g., NdFeB powder), forming a "permanent magnet polymer composite" (PMPC). "Active" wire materials (such as shape memory alloy wire or contractile nanotube yarn [Lima et al., 2012]) may be substituted for ordinary wire in the printhead, offering more actuator options.

The basic approach of FEAM can be broadly expanded to address a wide variety of technical needs. For example, instead of or in addition to embedding conductive wires, in some embodiment variations fluid conduits (tubes), reinforcing filaments, filaments which produce a change in visual appearance, or optical fibers could be embedded. Likewise, relatively hard materials such as ABS may be used in lieu of, or in combination with, elastomeric materials, and fillers (which may or may not also provide desirable electrical, magnetic, or optical properties) may be incorporated to modify mechanical properties of the polymer. In some embodiments, incorporation of relatively low-melting point materials (e.g., polylactic acid, low-melting point metal alloys) can be used to alter mechanical properties such as stiffness or elastic modulus dynamically, based on controlled solidification or melting of the material. Moreover, r polymers with tailored optical properties may be used, facilitating direct fabrication of microfluidic devices with integrated optical components for optical sample analysis. Shape memory polymers—which change shape or mechanical properties, and if pre-loaded can generate motion when heated—may be incorporated, with heating provided in some cases via Joule heating of embedded wires. Soft gels, including those which are bio-derived or biocompatible such as hydrogels, may also be used for FEAM, either in lieu or polymers or in combination with them.

Advanced electromagnetic actuators such as voice coils and rotary motors and electromagnetic sensors suck as magnetic pickups requiring permanent magnets and coils can be fabricated through the integration of a permanent magnetic material and in some cases, suitable bearings. Permanent magnetic material may be deposited (e.g., ferrite, alnico, or NdFeB powder such as fine MQFP powders (Magnequench, Science Park II, Singapore) in a polymer matrix) by modifying the FEAM printhead to accept a third material, or incorporating an additional printhead. A polymer composites containing such material may be termed a "permanent magnet polymer composite" (hereinafter "PMPC"). Bearings can be produced by wrapping wire to form circular shafts and sleeves. Alternatively, prefabricated magnets and bearings can simply be inserted into suitable cavities or be secured by material deposited around them. These and other inserts (e.g., balls, integrated circuits) may be provided with flanges, tapers, bevels, undercuts, pores, textures, holes, or other means of improving anchoring in the surrounding material.

FEAM-produced components can incorporate pneumatic or hydraulic actuators, as well as channels, reservoirs, and even pumps. Such actuators need a source of pressurized fluid, offer a large range of motion and high power, and can be made MRI-compatible for medical devices such as surgical/interventional instruments. For example, a catheter for treating atrial fibrillation could unfold and navigate inside the heart using built-in actuators, deploying an electrode array for mapping and ablating tissue. Better and more natural-appearing prosthetics, such as a FEAM-fabricated human hand, custom-made for an amputee, should become possible. While actuators embedded in such a hand may be far weaker than human forearm muscles, dexterity and touch sensitivity could be enormously improved over current devices. Using materials such as Pt—Ir wire and long-term implantable polymers (e.g., Bionate® thermoplastic polycarbonate polyurethane (DSM Biomedical, Berkeley, Calif.)), implants such as drug-delivery pumps and neurostimulation devices could be made, complete with coils for transcutaneous inductive charging and communication. Orthotics for tremor control using magnetorheological dampers could also benefit from custom, low-profile, built-in flexible coils: magnetorheological fluids can be used to provide variable damping by varying viscosity as a function of applied current.

By surrounding at least one wire with others that surround it (e.g., oriented substantially parallel to it) to form a shield, low-loss coaxial-type micro/millimeter-wave transmission lines and passives also become possible, allowing for example, a phased-array radar system to be built into the wing of a small unmanned air vehicle. Such a wing could furthermore alter its shape using buried actuators to optimize performance, or even flap like a bird or insect wing.

By incorporating suitable wires or other filament in a fabricated structure, either as long or short pieces, embedded tags which encode data (e.g., a UPC product code) can be produced, and such tags would be highly resistant to tampering, counterfeiting, and (if the surrounding material is opaque) detection. For example, radiopaque material so embedded in the form of numbers or bar codes would allow identification of a device using X-rays, while conductive material might be detected and a code extracted using magnetic fields or radio waves. Since such tags can easily be non-planar, their "signature" could vary substantially with orientation of the sensing radiation; while this might require alignment when sensing, it also permits more data to be stored and allows verification to be performed, further complicating attempts at counterfeiting the product in which the tag is embedded. Even randomly placed filaments can be incorporated, as they provide a unique 3-D "fingerprint" which can manifest itself differently according to observation angle.

Devices made using FEAM can include sound transduction devices (e.g., headphones, earbuds, microphones, and sonar transducers), active vibration damping devices, and a variety of sensors. For example, in addition to touch-sensitive robot "skins", transparent touch screens using crossed arrays of fine wires to detect touch when wires contact one another, are stretched (altering resistance as in a strain gauge), or change their relative spacing (altering capacitance), or crossed arrays of ECPC extrudates which change resistivity when pressure or bending force is applied, can be readily made, as can pressure-sensing pads (e.g., for breast cancer detection, fitting of insoles). Temperature sensors can be fabricated using ECPC sensing volumes (e.g., carbon black-filled), thermocouples and thermoelectric devices based on forming a junction between two wires of dissimilar composition, etc. Hot wire anemometers having wires that are resistively—(i.e., Joule) heated and exposed to a fluid stream while measuring the wire resistance can be incorporated into devices, as can accelerometers using capacitive, variable reluctance, or other sensing modalities. Even gyros based on measuring the Coriolis force acting on a vibrating element (e.g., vibrated electromagnetically) can be monolithically incorporated.

Soft devices with embedded actuators include those that can be used to apply localized vacuum or mechanical stimulation to promote tissue healing, those incorporated into large pads that avoid pressures which can cause bedsores, and those which adapt to the stump of an amputee to provide a comfortable, snug socket that minimizes tissue damage and relative motion.

FEAM can be used to create metamaterials incorporating dielectric and conductive elements and metamaterials-based devices such as lenses that focus electromagnetic radiation. If the dielectric element is an elastomer, these can be deformed mechanically to tune their operating wavelengths, change focal length, etc. Ordinary refractive or diffractive optics which are tunable and adjustable in focal length, aberration correction, etc. and based on deformation or movement of a lens or mirror are also possible, such as low-cost adaptive optical mirrors used to enhance laser propagation through the atmosphere or better view astronomical objects.

FEAM can be used to create primary or secondary batteries that are built into a fabricated structure. For example, wires made from two different materials (e.g., copper and aluminum, zinc and manganese, lithium cobalt oxide and carbon, $Li_4Ti_5O_{12}$ and $LiFePO_4$) can be embedded in the structure such that at least some portions of the wires are exposed within a cavity as electrodes; the cavity can be filled—either during fabrication or afterwards—with a suitable electrolyte (e.g., liquid, solid, gel or paste). If the electrodes are embedded in an arrangement that prevents them from contacting one another, no separator may be needed. In some embodiments, wires made from two different materials may be simultaneously encapsulated in the same extrudate; the latter may be in the form of a solid or gel electrolyte, or is porous to allow infiltration with liquid electrolyte.

FEAM's feature size is comparable to that used in microfluidic devices, which perform analysis or synthesis quickly using small amounts of material. A shortcoming with such devices is the need for pumps; using FEAM solenoid-actuated peristaltic pumps could be integrated into a disposable device, as well as channels, reservoirs, active and passive valves, heaters, electrodes, and optical fiber probes. One application of microfluidics is in the integration of chromatophores similar to those used by the cuttlefish and zebrafish into a robot that needs camouflage or a device that simply needs a variable coloring or opacity. Chromatophores can be widely distributed at a robot surface and function via pumping—or changing the shape or orientation of—a solid or a volume of colored and/or opaque liquid [Rossiter et al. 2012]. Optical fibers can be used in imaging devices among other applications, and can be scanned in a spiral or raster scan by built-in actuators.

Surgical planning and training phantoms or models can be produced using FEAM. Such devices can include distributed sensors to measure contact pressures and warn the surgeon of excessive or inadvertent contact with delicate structures. Phantoms can also include actuators so as to modify their shape to match patient-specific or dynamic variations in anatomical structure (e.g., as measured using a CT or MRI scan), thus ensuring a more accurate representation.

Complex, bespoke wearable electronics including clothing and helmets that incorporate non-invasive physiological and biological sensing (e.g., a blood pressure cuff integrated with a shirt, ECG), inertial sensors, cellular and wireless communications, GPS, displays, fluidic temperature regulation, etc., are enabled by FEAM. For example, stretchable devices can be printed with FEAM similar to those produced by lithographic methods [Kim et al., 2011]—though possibly with larger features—by incorporating wires which are laid in serpentine, helical, or other patterns, which allow deformation under load. Stretchable regions can comprise polymer, ECPC, wire, or combinations thereof. For example, a stretchable region may include serpentine elements of polymer containing substantially coaxial (and thus serpentine) wire.

Orthotic and augmentation devices may be produced using FEAM such as exoskeletons that increase natural human load handling, sense joint kinetics and kinematics, stabilize joints, provide better joint form, and train the wearer in desired motions or poses. The Nike+ FuelBand, a smart elastomer wristband that tracks activities like running using embedded accelerometers, is a first step toward what is possible. Virtual reality and motion capture input devices such as finger position-sensing gloves and garments, as well as haptic displays for force and touch (e.g., vibration-based texture displays, braille displays) are also achievable using FEAM. Energy harvesting can be performed using devices made using FEAM, including garments and shoes that harvest the energy of the wearer. Electromagnetic, piezoelectric, or other generators can be integrated into the structure of the device through monolithic fabrication.

As shown in FIGS. 13(a), 13(b), and 13(c), in some embodiments, wire is not deposited along with dielectric or conductive (ECPC) material as described above. Rather, a layer comprising dielectric material and ECPC is formed and wire is embedded into the layer through a separate operation. Alternatively, in some embodiment variations, two or more wires may be joined to form horizontal (in-layer) or vertical (between-layer) interconnections/junctions by welding, soldering, brazing, ultrasonic or thermosonic bonding, crimping, winding, pressure contact, or mutual entanglement, among other methods. In some embodiment variations, both dielectric and ECPC are deposited before embedding the wire, while in other embodiment variations, one material is deposited first, followed by wire. This is then followed by depositing the other material. In some embodiment variations, wire is delivered first, and held in position (e.g., by slightly melting the previous layer, adhesive) and then both materials are deposited over and around the wire. FIG. 13(a) shows a plan view of a layer in which both dielectric and ECPC have already been deposited to form layer N; some ECPC has been deposited in-line, and some has been deposited by filling a trench. In FIG. 13(b), wire has been added to layer N through an embedding process (e.g., heating such as Joule heating or through use of ultrasonic energy) to form intra-layer junctions and the first part of an inter-layer junction. To facilitate penetration of the wire deeply into the material, the heated or ultrasonically-vibrated tool may be furnished with thin protrusions such that the wire is pushed below the upper surface of the material, which then closes around the protrusions as it they are withdrawn. For example, a rotating wheel with teeth, similar to a pounce wheel, may be used. The path of the wire need not coincide with the path of extruded material previously deposited on the layer, but may follow an arbitrary pattern. In the figure, some sections of the wire are exposed (forming AW voxels), possibly to interconnect the structure with external power, etc. In FIG. 13(c), dielectric and ECPC have been deposited on layer N+1, along with wire; at this point, the inter-layer junction between layers N and N+1 is completed.

In some embodiment variations, rather than embedding wire by dispensing it in a particular pattern, conductive regions may be formed by laying a sheet of conductive material (e.g., solid foil or mesh) over the layer and selectively embedding regions of the material, e.g., using heat. Non-embedded regions can then be removed or made non-conductive such as by brushing, planarizing, or exposing to suitable chemicals.

Figure 14:
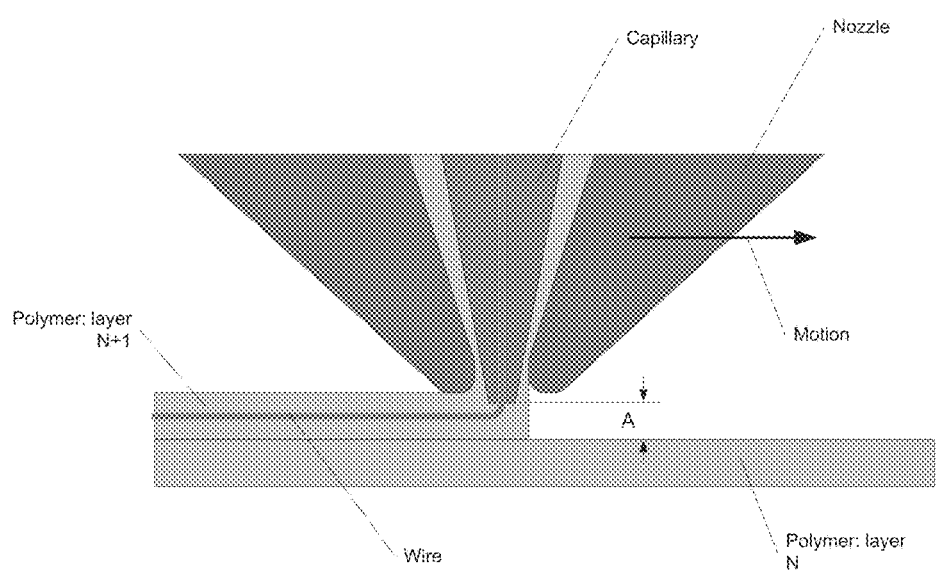
FIG. 14 depicts a cross-sectional view of a printhead wherein the capillary tip is below the nozzle.

FIG. 14 depicts a printhead designed such that the capillary can descend considerably further than shown in previous figures while feeding out wire. For example, if such a printhead is used with wire that's very flexible (e.g., annealed thin copper or gold), the wire can bend in a small radius as it exits the capillary and the height of the capillary tip inside the extrudate can directly regulate the vertical position of the wire inside the extrudate. In some embodiments, however, wire may be of a height comparable to the layer thickness and thus no regulation would be needed. For example, in the figure, the capillary is set to be a distance A above the bottom of layer N+1, where A is less than the thickness of layer N+1. In such a situation where the capillary tip is beyond/below the tip of the nozzle even a small amount and in the extrudate, the polymer at the capillary tip is no longer under pressure, and thus there is no tendency for polymer to try to rise up through the capillary. This allows the hole in the capillary to be larger. With capillaries whose tips are position higher, within the higher pressure volume within the nozzle, positive gas pressure can be applied to the capillary, or an elastomer or ferrofluid seal may be used to mitigate movement of polymer up the capillary.

Figure 15:
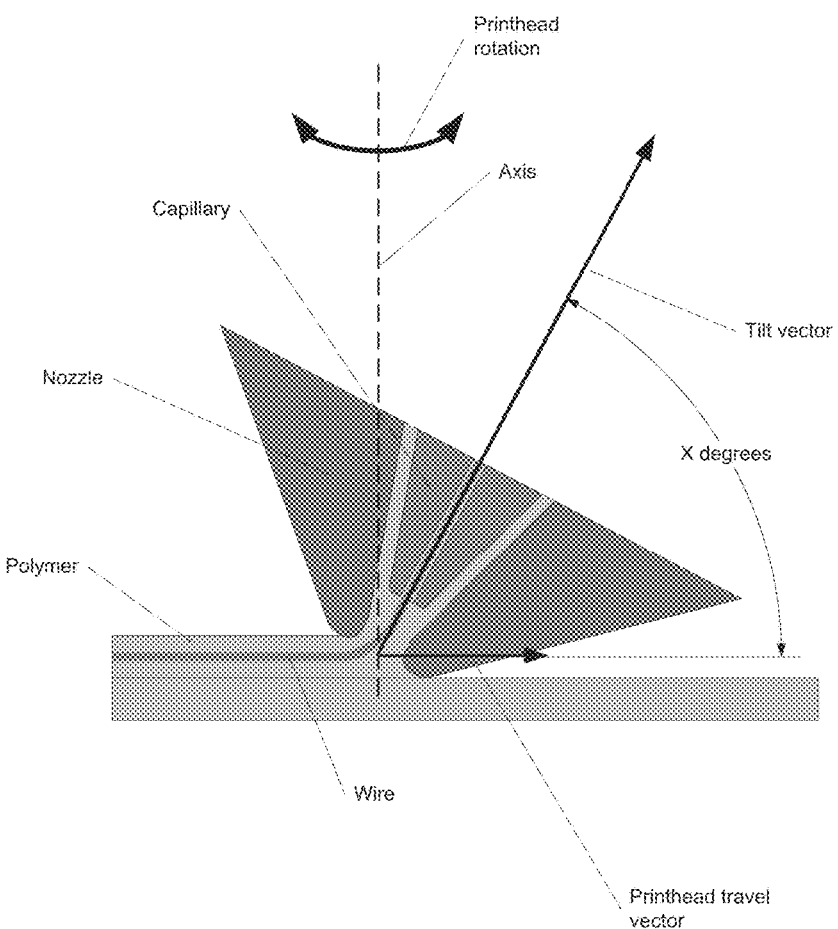
FIG. 15 depicts a cross-sectional view of a printhead wherein the nozzle axis is tilted away from perpendicular to the extrudate.

In some embodiments, the printhead (or at least its nozzle) is angled as shown in FIG. 15 such that the angle X between the wire and the substrate (or previous layer) in the direction of printhead travel is less than 90°, unlike in standard FDM and the previous figures. At such a reduced angle, the wire or other filament must bend through less than 90°, which may be advantageous since the wire may remain within its elastic range (e.g., if metal) or not fracture if made of a brittle material such as ceramic, may be easier to keep coaxial with the extrudate in the vertical plane, etc. To allow for this, the printhead (or at least the nozzle) must be dynamically rotated or tilted as the printhead (or the device) moves such that the tilt vector and the printhead travel (i.e., velocity) vector, both shown in FIG. 15, are both substantially within a vertical plane (i.e., the printhead always tilts in a direction tangent to its travel), or the fabricated object must rotate. The axis shown in the figure may be used as the axis of rotation if the printhead is rotated; however, other axes may also be used. If the capillary and/or wire spool is rotated as described above, printhead rotation may be incorporated into the same mechanism that rotates the capillary and/or spool (e.g., so all rotate together). In some embodiment variations, adjustment of the angle X may be used in lieu of, or in addition to, adjustment of the capillary tip height, to control the vertical concentricity of the wire within the extrudate. To avoid collisions between the nozzle and previously-deposited material as will be discussed below, the nozzle can retract vertically, rotate, or tilt to a more standard angle (e.g., X=90°).

Figure 16:
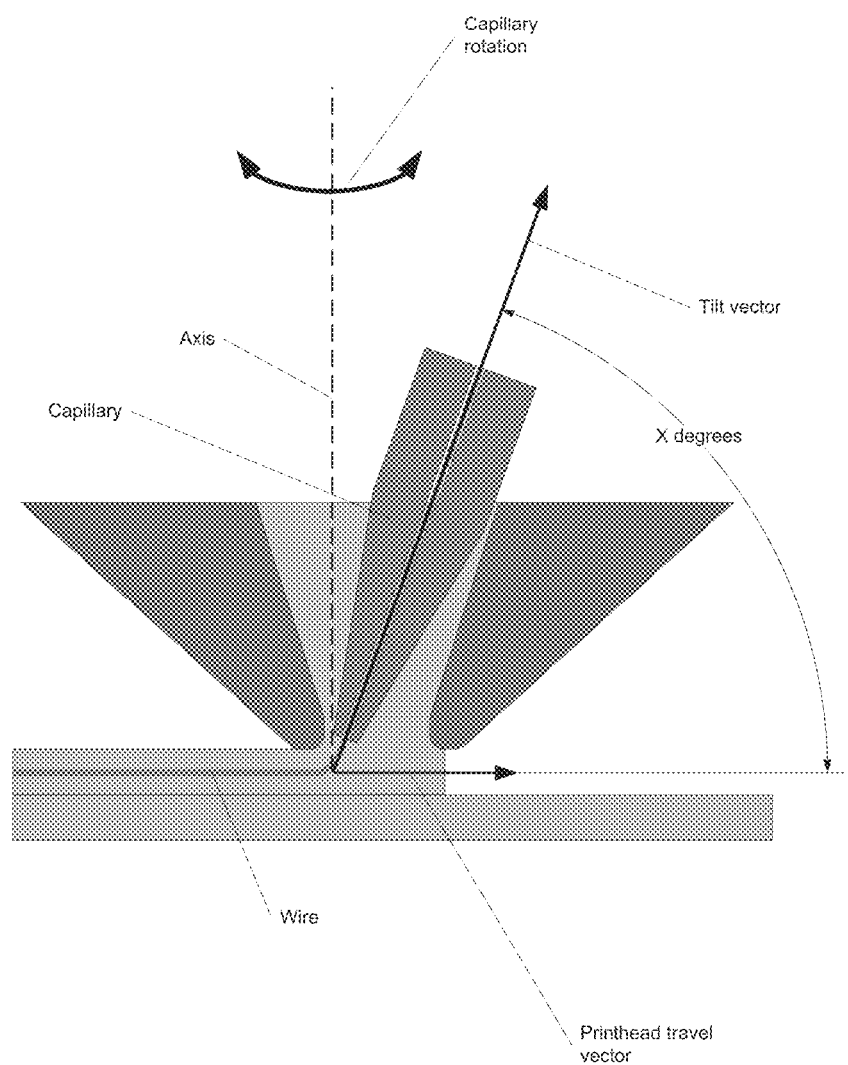
FIG. 16 provides a cross-sectional view of a printhead wherein the capillary is tilted away from perpendicular to the extrudate.

In some embodiment variations, the printhead or nozzle may be angled at 90° as usual as in FIG. 16, but the capillary is set at an angle less than 90°, such that again the wire does not have to bend through a 90° angle. In this case, the capillary (and optionally, the nozzle and the entire printhead) must rotate so that the tilt vector and travel vector substantially share a vertical plane. The axis shown in the figure may be used as the axis of rotation if the printhead is rotated; however, other axes may also be used. Again, in some embodiment variations, adjustment of the angle X may be used in lieu of, or in addition to, adjustment of the capillary tip height, to control the vertical concentricity of the wire within the extrudate. In some embodiments, multiple capillaries may be included within a single nozzle, for example, to deliver multiple strands of wire, or multiple types of wire or other filament. Multiple strands of wire are useful for increased current handling without significantly degrading flexibility. Conventionally-made multi-strand wire has the strands twisted together, which facilitates manufacturing. In FEAM, the strands can remain separate—either one strand per extrudate in a set of parallel extrudates, or several per extrudate (e.g., side by side in extrudates whose width is greater than their height—making possible even greater flexibility. Multiple strands can be delivered by multiple capillaries within a single nozzle, multiple external capillaries, or multi-lumen capillaries.

To allow room for multiple capillaries, they can be oriented at an angle less than 90° as shown in FIG. 16, and oriented around the rotation axis. As a particular capillary is used, the group of capillaries (or entire nozzle or printhead) is rotated such that the tilt vector of the capillary in use and the printhead travel vector are substantially in a vertical plane. In some embodiment variations, the capillary, nozzle, or printhead angle is variable. For example, when not depositing wire or other filament, it is at 90° with respect to the plane of the substrate or previous layer, but the angle is decreased when wire is to be deposited. In some embodiment variations, multiple nozzles or printheads can be used at multiple angles, depending on whether wire is or is not deposited.

In some embodiments, wire deposited in solid form is allowed to soften or become molten when the fabricated device is in use. For example, a low melting point metal (e.g., solder-like material) incorporated into a thermoset elastomer like silicone, or a thermoplastic elastomer with a relatively operating temperature (as limited by the glass transition temperature or melting point) can be heated (e.g., Joule heating due to current passing through the metal) until it has melted. Such melting can be desirable in its own right to reduce mechanical stiffness of the device, or may be a byproduct of using high currents to produce large forces, etc. In some embodiments, channels may be provided (e.g., by embedding tubes or leaving unfilled volumes) into which liquid metal is introduced (e.g., metals that are liquids at room temperature) to serve as conductors; such metal may be used in liquid or solid form. In some embodiments, conductors may be deposited onto a dielectric layer in non-solid form using such methods as aerosol jetting or inkjet printing, with additional layers formed over the deposited conductor. In some embodiment variations, conductive regions such as those incorporating ECPC may be used to form junctions between deposited conductors on multiple layers.

Figure 17:
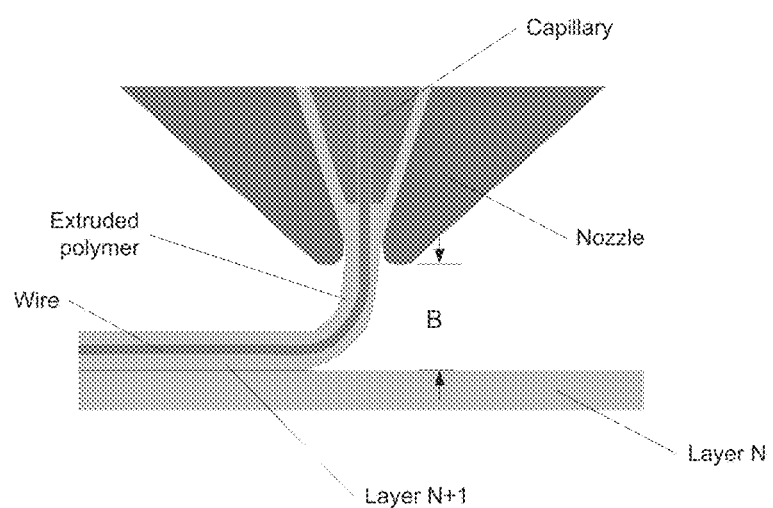
FIG. 17 shows a cross-sectional view of a printhead wherein polymer and wire descend a distance below the nozzle before contacting the previous layer.

In some embodiments, the nozzle is not in direct contact with the top of the layer being fabricated, as shown in FIG. 17. Rather, polymer and wire are delivered from the nozzle a distance B above the previous layer N, where B is greater than the desired thickness of layer N+1. By providing the extra distance, the wire may be curved and re-oriented horizontally more gradually than when B is equal to the thickness of layer N+1. This may be of particular value when using large gauge wire able to handle hire currents, or when delivering filament-like materials which are too stiff to bend sharply, or may break, kink (e.g., tubing), or otherwise be compromised if bent with too small a radius. The result is similar to conventional crosshead wire coating, but with the insulated wire redirected after extrusion.

Figure 18:
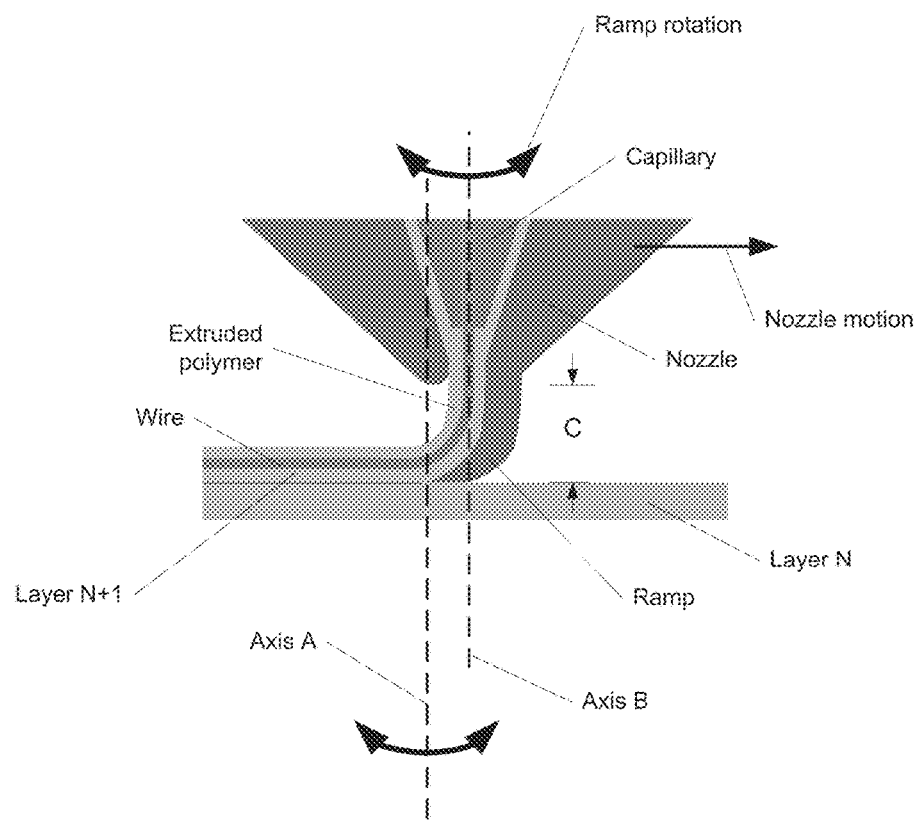
FIG. 18 depicts a cross-sectional view of a printhead wherein a ramp is provided to direct extruded polymer and wire.

As shown in FIG. 18, in some embodiments a curved (or angled, or polygonal) ramp that is thin at its trailing edge may be provided to guide the polymer and wire onto the previous layer, again allowing the wire to curve gradually. In some embodiment variations, the ramp is coated with or made from a non-stick material such as PTFE. In such a configuration, the ramp may be attached to the nozzle and rotated (e.g., using the same actuator used to rotate the wire and wire spool to prevent torsional wind-up) such that the ramp curvature is maintained within the plane of the nozzle motion (i.e., tangent to the local curvature of the extrudate in the X/Y (layer) plane). Rotation may be about axis A, axis B (coincident with the nozzle centerline), or another axis. In some embodiment variations, viscous drag on the ramp alone may orient it in the desired direction if the ramp is free to turn on a low-friction bearing, etc. If rotation occurs about the nozzle centerline, the nozzle can be made square in profile, vs. round; this allows the extrudate to have flatter sides, which can improve surface finish on the printed device.

Figure 19:
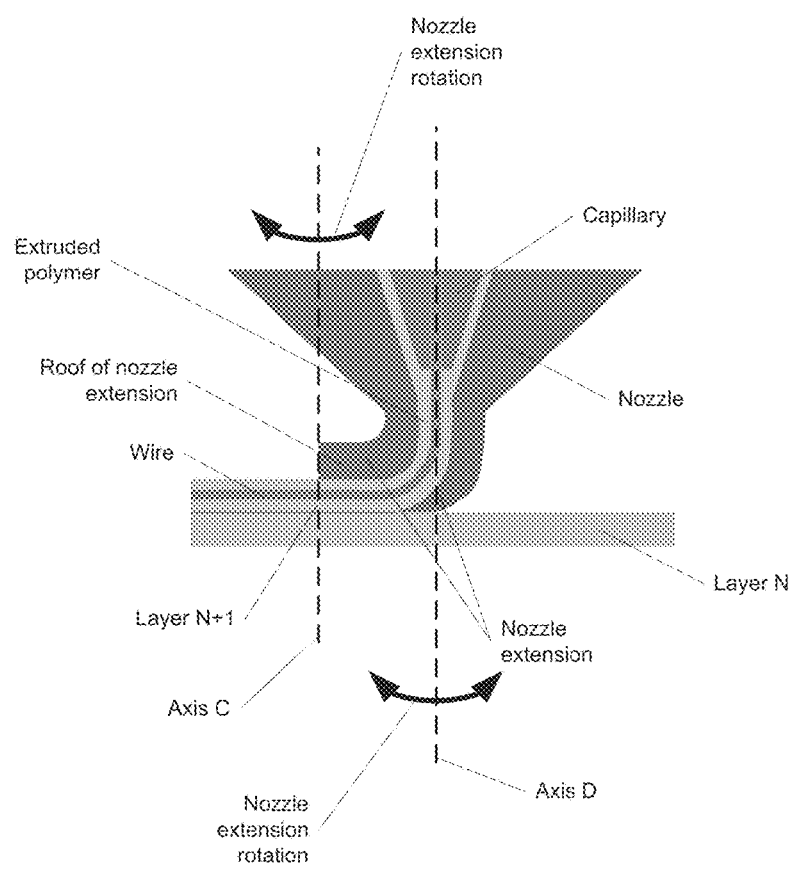
FIG. 19 is a cross-sectional view of a printhead wherein a curve tube is provided to direct extruded polymer and wire.

In some embodiments such as that of FIG. 19, the nozzle extension has ramp-like qualities similar to the ramp of FIG. 18, but further surrounds the extrudate: enclosing it both on the top and on the sides, and providing a "roof" which acts similar to the nozzle tip in standard FDM, establishing the top surface of the extrudate and helping to press it against the previous layer to provide good interlayer adhesion (this effect can be achieved with the configuration of FIG. 18 using a roof-like plate or ring, not shown). In effect, the nozzle terminates in a tube that is curved horizontally and is preferably, though not necessarily, truncated at the bottom such that the extrudate and wire can be deposited onto the previous layer smoothly and without needing to descend over a step. As with the embodiment of FIG. 18, the nozzle extension, and conveniently, the entire nozzle (and possibly more of the printhead) rotates around axis C, axis D, or another axis so as to maintain the extension curvature in the plane of the nozzle motion. In embodiments such as those in FIGS. 18-19, the ramp or tube may occupy enough space that the extrudate cannot be placed easily in close proximity to extrudate already deposited on a particular layer. In such cases, two nozzles may be used in some embodiment variations, with path planning that first deposits polymer with wire using ramped or extended nozzles, and then deposits polymer without wire using more typical nozzles.

Figure 20:
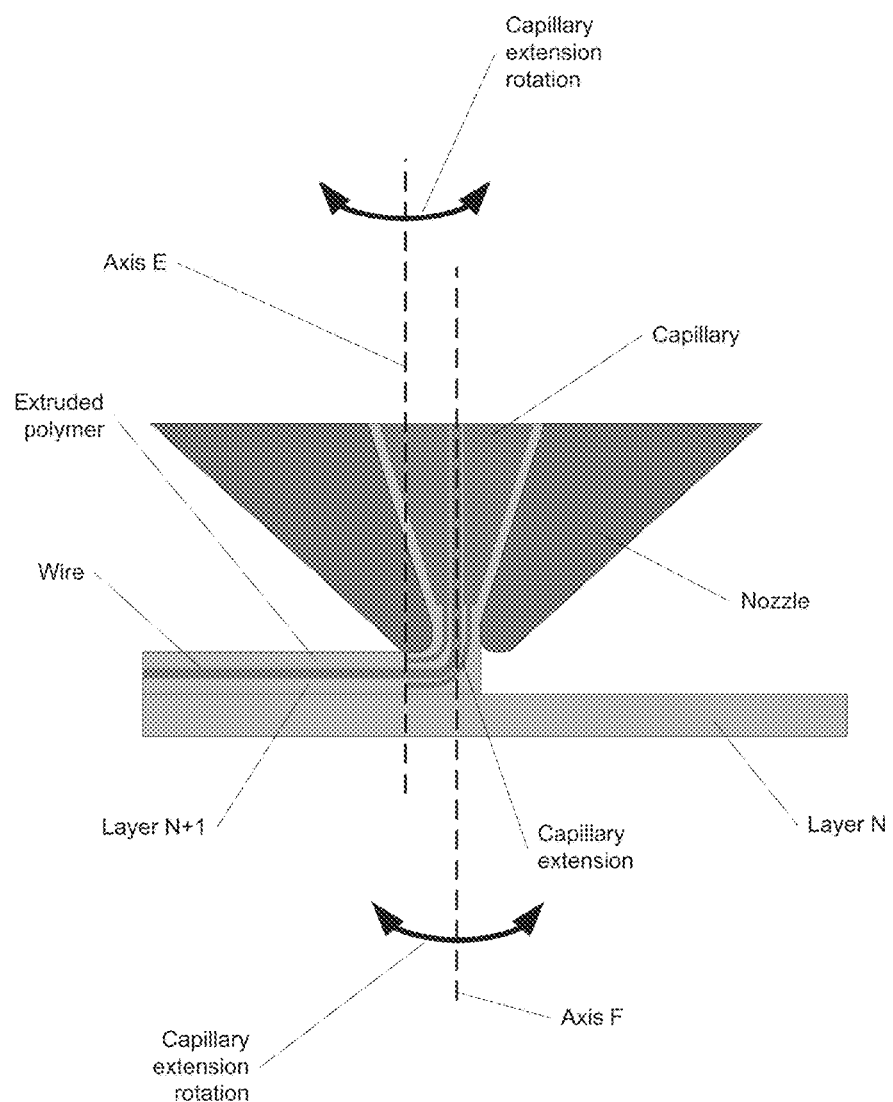
FIG. 20 depicts a cross-sectional view of a printhead wherein a curved capillary extension extends below the nozzle.

In some embodiments such as that of FIG. 20, the capillary itself comprises an extension which is curved so as to gently guide the wire into a horizontal orientation, i.e., bend or redirect the wire, and preferably allow it to exit concentric with the extrudate. As with the embodiments of FIGS. 18-19, the capillary extension rotates around axis E, axis F, or another axis so as to maintain the extension curvature in the plane of the nozzle motion. If rigid, the capillary extension can be a bent tube (e.g., stainless steel), a microfabricated component (e.g., made using MICA Freeform (Microfabrica, Van Nuys, Calif.), etc. In some embodiment variations, the extension is a flexible tube (or the capillary itself is flexible at the tip or everywhere) such as polyimide (Microlumen, Tampa, Fla.) or laser-machined nickel-titanium such that it bends on its own (e.g., to a maximum curvature) when surrounded by fluid due to viscous drag. When the printhead is not moving, the tip may then resume a straight configuration which facilitates wire anchoring by impaling as previously described. In some embodiment variations, the capillary extension is retractable (e.g., for protection against damage); in some embodiment variations it may be a pre-curved nickel-titanium tube that curves when it is pushed beyond a more rigid tube (or the nozzle), and then is forced to be straight when retracted, in the way of certain steerable needles developed for medical procedures [Sears and Dupont, 2006].

Figure 21:
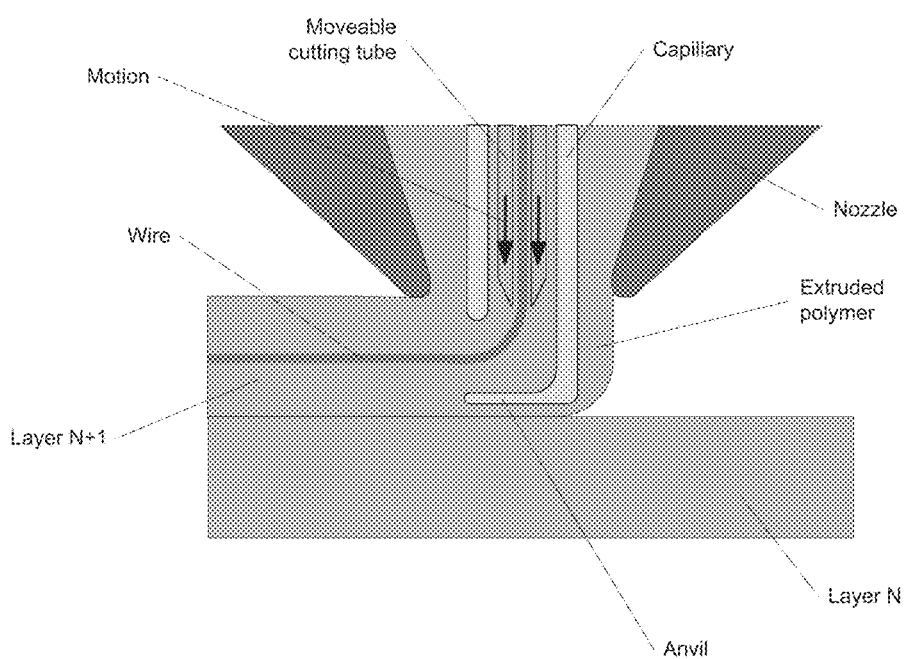
FIG. 21 depicts a cross-sectional view of a printhead comprising a moveable cutting tube and anvil.

In FIGS. 17, 18, 19, and 20 the wire may be cut outside the nozzle rather than within it as discussed above, e.g., using two blades which converge horizontally and shear the wire. Once cut, the wire remaining in the nozzle can be retracted back through the extrudate if desired, or left to extend beyond the nozzle, with the extrudate deposited around it. FIG. 21 depicts a wire cutting apparatus different than that of FIGS. 4(*a*), 4(*b*), 4(*c*), 7(*a*), and 7(*b*) that may be used in some embodiments, in which a sharpened cutting tube capable of vertical motion and located either inside (as shown) or outside the capillary is provided to cut the wire. As shown in the figure, the capillary may be provided with an anvil such that by lowering the tube, the wire is pinched between the sharp tube edge and the anvil and is thus cut. In some embodiment variations, the anvil may be eliminated, especially when using harder polymers. In some embodiment variations, the cutting tube is rotated to enhance its action. In some embodiment variations, the cutting tube, rather than cutting per se, includes notches which engage the wire and then break it when the cutting tube is rotated, either in one direction or in an oscillatory manner. In some embodiment variations, the wire (or other fiber) is not cut, but scored or notched, weakening it in one region; such weakening may be also achieved by resistive heating of the wire (e.g., in a region between two rollers/roller pairs), optionally followed by rapid quenching, or by work hardening. Bending or tensile stress applied to the wire then breaks it in the weakened region. In some embodiments (e.g., FIG. 16) in which the capillary axis is less than 90° from the horizontal, cutting the wire using a vertically-translating blade can be facilitated.

Figure 22:
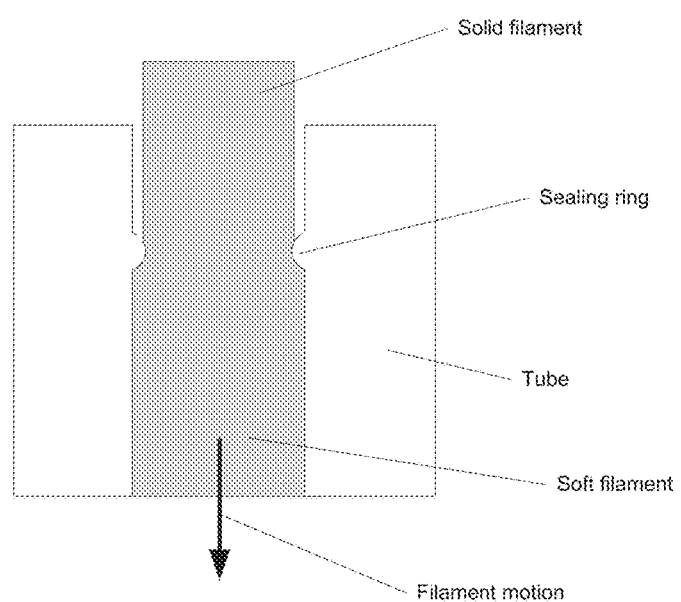
FIG. 22 depicts a cross-sectional view of a polymer filament passing through a tube that provides sealing.

Prior efforts [Elkins, 1997; Stratasys' E20] efforts to use elastomer in FDM were limited to fairly high durometer elastomers in the range of 70-80 Shore A. To accommodate softer elastomers (e.g., 5-60 Shore A), other approaches may be used. Assuming that elastomer is provided to the printhead in filament form, it need be noted that soft elastomers are difficult to extrude with good dimensional control. A filament varying in diameter, for example, may not always form a good "piston" seal within the liquefier tube, even though when axially compressed they will expand within the liquefier according to their Poisson's ratio. While a good seal may be achieved, the increased friction may make pushing the filament through the tube difficult. FIG. 22 depicts a liquefier tube with a protruding internal sealing ring, preferably of rounded profile, which can indent the soft filament and facilitate sealing, without substantially increasing friction. In some embodiments, variables in filament diameter may cause variations in the flow rate of polymer through the nozzle, which may manifest themselves as variations in the width of the extrudate, leading to inaccuracy. To remediate this, the flow rate may be measured and the feed speed adjusted using a real time feedback loop.

Figure 23:
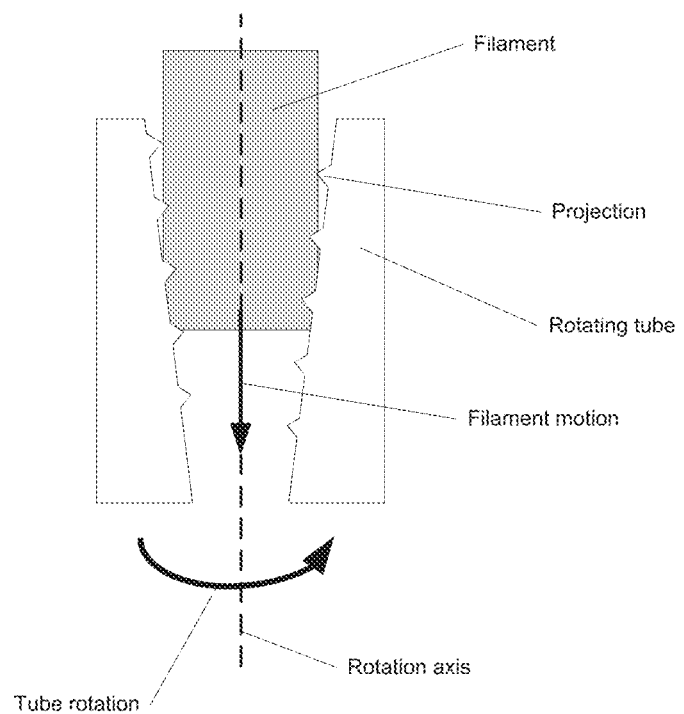
FIG. 23 shows a cross-sectional view of a rotating tube that draws filament into it.

A second issue with soft filaments is that they can buckle when pushed. Therefore in some embodiments, rather than push the soft filament into the liquefier using rollers or other methods, the filament is pulled into the liquefier. FIG. 23 depicts a rotating tube which may be located at the entrance to the liquefier, or in some embodiment variations, be a part of the liquefier tube (thermally isolated adequately so that polymer engaging the projections remains substantially solid). The axis shown in the figure may be used as the axis of rotation if the printhead is rotated; however, other axes may also be used. Again, in some embodiment variations, adjustment of the angle X may be used in lieu of, or in addition to, adjustment of the capillary tip height, to control the vertical concentricity of the wire within the extrudate. In some embodiments, elastomeric filament is pushed into a liquifier (e.g., by rollers), and the elastomer is cooled to prevent premature softening using gas (e.g., air) jets, refrigerated gas streams, passage through a tube through which cool air circulated, liquid (e.g., water) cooling, volatile liquid mist or spray, synthetic jet, contact with cooled rollers, etc.

In some embodiments, rather than providing pure or filled elastomer to the nozzle in the form of a filament, it may be provided in the form of powder, granules, or pellets. For example, material in such a form may descend from a suitable hopper through a flexible tube that allows the printhead to move, or may be stored in the printhead itself. In such embodiments, the material may be pressurized, liquefied, and extruded through the nozzle using a miniaturized screw similar to that found on a larger scale in single screw extruders. In some embodiment variations, the screw delivers material into a small chamber whose volume is controlled by a sliding piston (FIG. 23); the piston can slide to adjust flow rate precisely, and can retract to cause polymer retraction from the nozzle. In some embodiments, a small gear pump may be used in lieu of, or in addition to, a rotating screw.

In some embodiments, filament is provided in the form of a ribbon and fed into a miniature version of a drum extruder [Rauwendaal, 2001]. Such an extruder can pull filament into it, avoiding buckling, and with a tapered feed region, can also accommodate thickness variation in the ribbon.

In some embodiments, unanchored wire can be pulled instead of pushed through the capillary. For example, wire can be embossed with teeth or grooves as part of its manufacturing process, or this can be done en route to, or inside, the nozzle. Such teeth or grooves can be engaged by a small rotating gear or a reciprocating/vibrating toothed element to pull the wire, or such a gear or element can directly push plain wire, especially if soft enough to indent or emboss it slightly. In some embodiment variations, wire can be provided with threads so it can be pulled by rotating a nut. Or, wire can be threaded within the printhead if soft; rotating thread-cutting teeth inside the printhead can pull the wire forward much like filament is pulled in FIG. 23. To prevent torsional wind-up, square wire can be used and passed through a square hole before threading. The thread need only be at the wire edges; the wire doesn't have to be threaded so deeply that it ends up substantially circular).

Since electrical conductivity along the layer stacking/vertical/Z axis normally provided by ECPCs, the conductivity can be significantly lower than in the X/Y plane, where wire provides the primary electrical path. In general, devices might most favorably be oriented for fabrication, and interconnects designed, so as to minimize the use of ECPCs and maximize the use of wire. In addition, there are several options to mitigate the anisotropy in conductivity. For example, ECPCs made using elastomer normally increase in conductivity when compressed, which can be useful in pressure or force sensors, for example. Thus, if completed device (e.g., after removal of any support material) is compressed entirely or in selected region along the Z axis, the conductivity along that axis will be improved. Another method is to provide lower conductivity vias along Z. After fabrication, wire can be threaded (e.g., using a needle if not sufficiently stiff) through ECPC regions; the wire can be heated to facilitate penetration through thermoplastic. In some embodiment variations, a channel can be provided to accommodate the wire, facilitating insertion. In lieu of wire, channels through vertically-stacked ECPC regions can be provided that can be filled with liquid metal that solidifies (e.g., a solder or other low melting point alloy) or remains liquid.

Figures 24A, 24B:
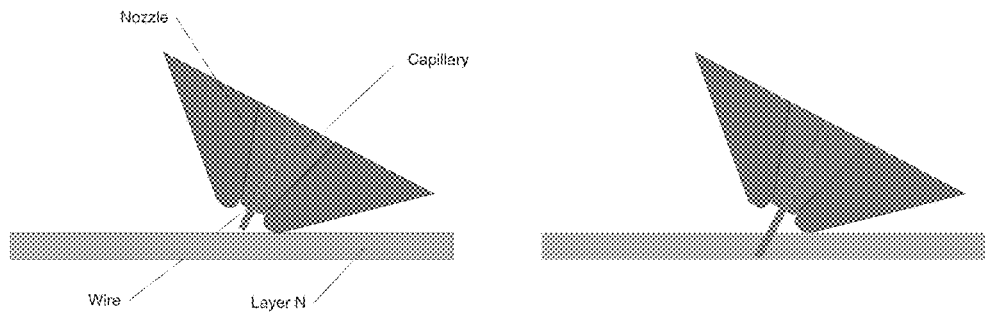
FIGS. 24(a), 24(b), 24(c), and 24(d) show in cross-sectional views a series of steps in anchoring a wire by altering the tilting axis of a printhead.
Figures 24C, 24D:
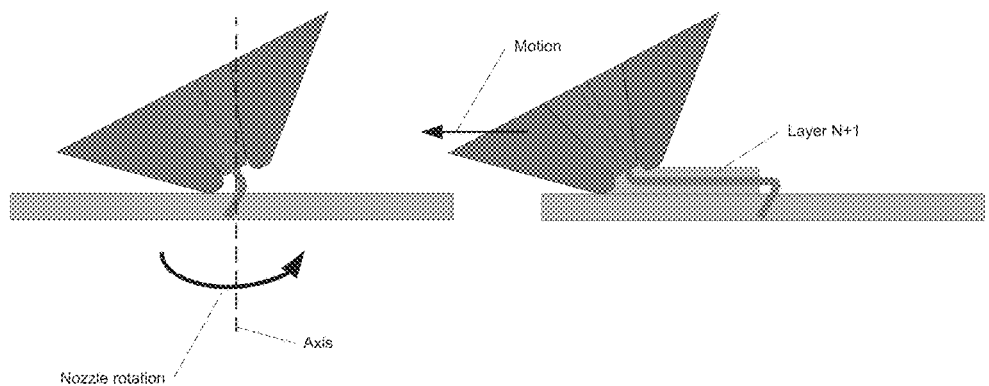

FIGS. 24(*a*), 24(*b*), 24(*c*), and 24(*d*) show a method of enhancing anchoring that may be used in some embodiments. In FIG. 24(*a*), the printhead (or the nozzle and capillary) is tilted toward the left. The axis shown in the figure may be used as the axis of rotation if the printhead is rotated; however, other axes may also be used. Again, in some embodiment variations, adjustment of the angle X may be used in lieu of, or in addition to, adjustment of the capillary tip height, to control the vertical concentricity of the wire within the extrudate.

Figure 25A:
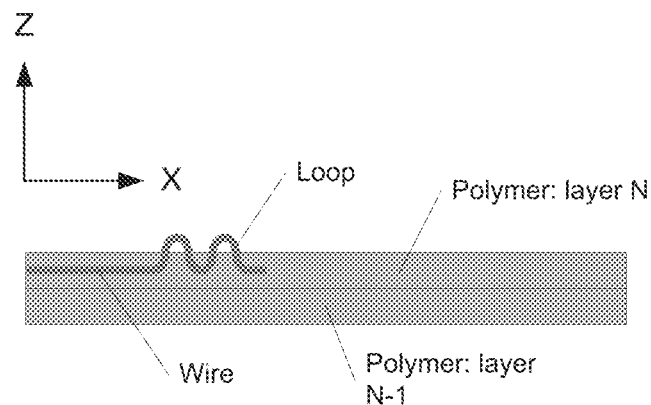
FIGS. 25(a) and 25(b) depict cross-sectional (25(a)) and plan (25(b)) views of wire loops which extend beyond the boundaries of the extrudate.

FIG. 25(*a*) depicts an approach to enhancing interlayer adhesion and reducing the resistance of junctions along the Z axis by creating loops of wire which protrude upwards from the layer in which they are formed (e.g., layer N as shown) into the space that will be occupied by layer N+1. Such loops can be formed, for example, by movement of the capillary and/or nozzle, synchronized with forward (X/Y plane) movement of the printhead. Polymer flowing around the loops when creating layer N+1 mechanically interlocks the layer to the loops, just as the loops are well mechanically interlocked to layer N. Moreover, wire in layer N+1 can be in contact or near-contact with the loops, minimizing junction resistance. In some embodiment variations, the capillary can plunge from layer N down into layer N−1 (not shown) so as to embed wire (especially if heated ultrasonically or thermally) in the previous layer. Wire is thus delivered in part to layer N−1 while the polymer in that layer re-solidifies in the wake of the capillary.

Figure 25B:
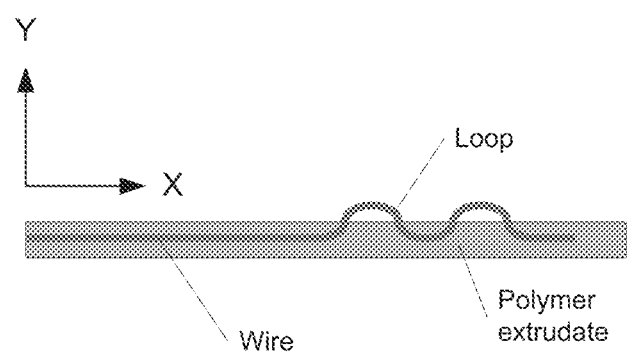

In FIG. 25(b), the loops are created in the X/Y plane (e.g., by rapid lateral movements of the printhead or just the capillary, causing the wire (with a thin coating of polymer) to deform in the plane), and extend laterally beyond the boundaries of the extrudate. Such loops can assist with increasing mechanical properties within the X/Y plane. In some embodiment variations, the capillary can be vibrated (e.g., perpendicular to the local printhead velocity) with a small amplitude when required, so that the embedded wire is forced into a serpentine and becomes better anchored (and the overall structure reinforced), at the cost of increasing wire length, and thus resistance.

If relative rigid support material is used, its selective removal after the device has completed building may be enhanced by methods such bending, squeezing, or twisting the device, which can fracture the support with minimal damage to the more flexible elastomer structure. In some embodiment variations, actuation of embedded actuators (e.g., flexing wires) can create motions that help to break up and dislodge the support material. Moreover, chemical dissolution of the support material in long, narrow channels or through small holes can be enhanced by fluid pumping motions induced by actuators embedded in the device.

In some embodiments, ECPC is not provided only for junctions, but rather, wire is always delivered to the device surrounded by a matrix, or jacket, of ECPC. This avoids the need to switch between ECPC and pure polymer as often. Moreover, if two nozzles are used—one for pure polymer and one for ECPC and wire—the latter can be specialized and optimized (e.g., rotating, including ramps for gradually curving the wire) for wire and ECPC delivery. A disadvantage of ECPC jacketed wire is that isolation of two wires requires an air gap or a region of pure, dielectric polymer to be created between the wires, thus increasing the wire pitch considerably. Another concern is the increased stiffness of ECPC vs. pure polymer with ECPCs made using high loadings of powder; this can be mitigated somewhat using nanotube fillers and other particulates which achieve percolation at lower volume percent.

In some alternative embodiments, rather than create a polymer-wire composite upon exit from the printhead as described above, pre-exiting jacketed wire of the desired outside diameter can be laid down by a deposition head moving in X/Y. If the jacket is a thermoplastic, then it may be slightly melted (e.g., by IR or nozzle contact) so that it adheres to jacketed wire on the previous and same layer. If not (e.g., if the jacket is silicone), and adhesive can be applied just prior to deposition, or a heat- or UV-activated adhesive may be incorporated into the jacket or applied to it.

Figure 26A:
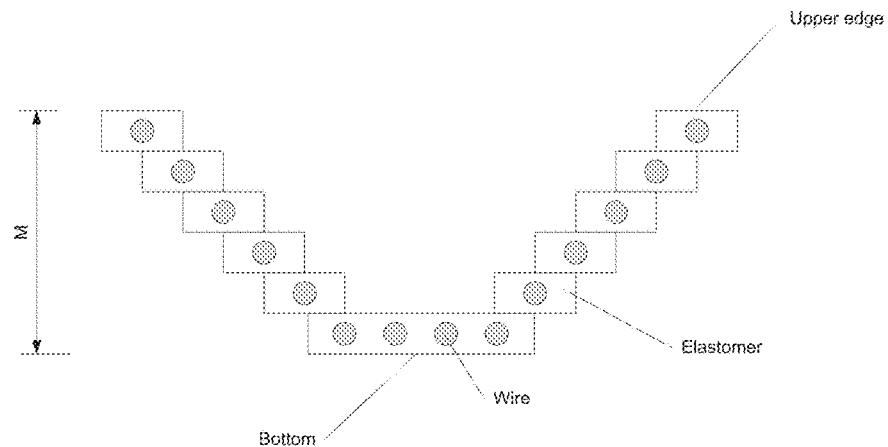
FIGS. 26(a) and 26(b) show cross-sectional views of dome-like actuators.
Figure 26B:
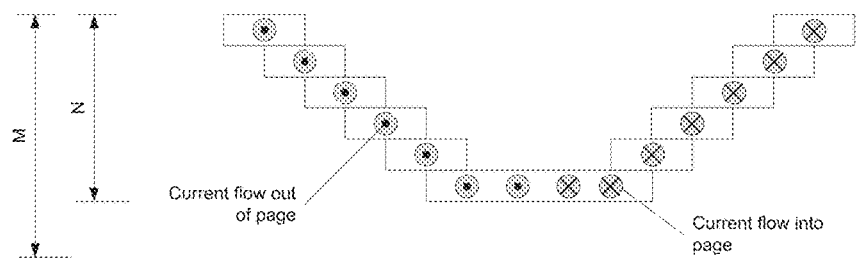

FIG. 26(a) depicts a novel electromagnetic actuator in the form of a dome-like structure supported at its upper edge and comprising multi-layer, spirally-wound insulated elastomer wire, produced via FEAM. Preferably, to eliminate ECPC junctions, this structure is fabricated as a continuous tapered helix in 3-D, rather than one layer at a time. Indeed, FEAM may be used to form planar or non-planar layers of material with continuous embedded filament, such as a carbon fiber-reinforced polymer structure comprising multiple layers, with the direction of the filaments varying among the layers (e.g., alternating 90° on even and odd layers) to increase strength. In such uses, ECPC may be omitted since the goal is to produce improved mechanical properties by incorporating of filaments. To create such non-planar layers the printhead normally translates relative to the structure being fabricated in three axes simultaneously, not just two as when forming planar structures. The actual cross-sections of the insulated wire may be narrower or different than those shown in the figure. As shown in FIG. 26(a), the bottom of the device is normally at a distance M below the upper edge. However, as shown in FIG. 26(b), when current is passed through the wire as indicated by the current direction symbols, neighboring wires attract one another, causing the dome to flatten out such that the distance between the bottom and the upper edge is now N, where N<M. This displacement can be used to accomplish a desired actuation. In some embodiments, the dielectric material of the actuator may be filled with a magnetically soft powdered material such as ferrite, nickel, or iron (coated if needed) to improve performance. In some embodiments, to increase flexibility, the dome structure may be corrugated somewhat like a bellows, e.g., such that in a cross-sectional view such as FIGS. 26(a) and 26(b), the walls meander (e.g., sinusoidally). Capacitance-based actuators based on this design may also be created, as can SMA-based actuators relying on contraction of a long wire. In one application, structures such as those in FIGS. 26(a) and 26(b) can be placed against a reasonably smooth surface in the powered-on configuration of FIG. 26(b) and then be transformed to the powered-off configuration of FIG. 26(a), creating a partial vacuum, and thus serve as controllable suction cups, as is useful in pick and place systems, climbing robots, and robotic tentacles, etc. In another application, rapid transitioning between the configurations of FIGS. 26(a) and 26(b) while immersed in a liquid can be used in a jellyfish-like manner to propel a robot, for example, to which the structures are attached.

In general, elastomeric actuators and sensors with embedded wire can be built so that at least a portion of the elastomeric structure contains a magnetically soft powdered material through which the magnetic flux can more easily flow. Since powder-filled elastomer may be stiffer than pure elastomer, depending on such parameters as powder volume fraction, particle size, and particle shape, the structure may be designed to be mechanically less stiff in regions comprising stiffer material, to mitigate excessive stiffness. In some embodiments, the structure may be designed so as to follow the natural lines of force.

Figure 27A:
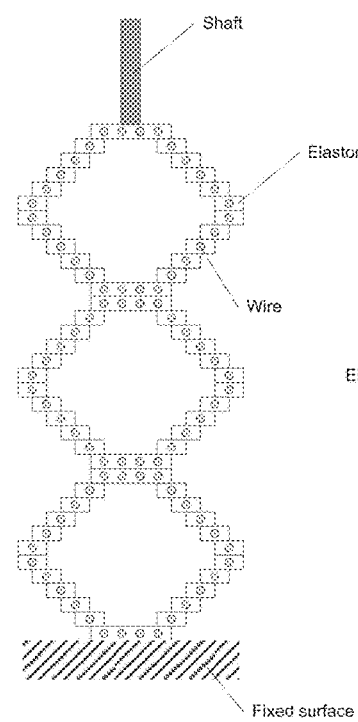
FIGS. 27(a) and 27(b) show cross-sectional views of dome-like actuators arranged in series and in parallel.
Figure 27B:
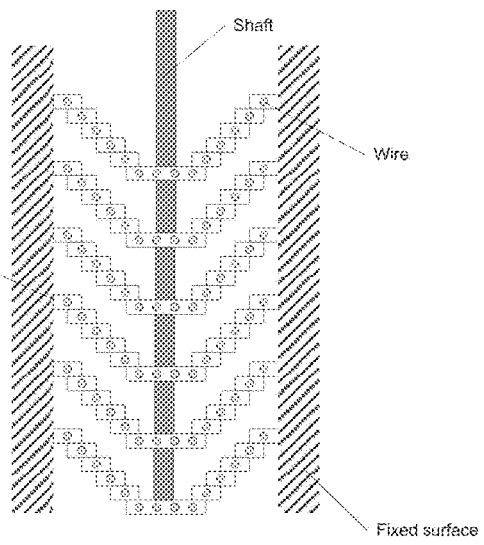

In FIG. 27(a), multiple dome-like actuators have been arranged (preferably co-fabricated) in series such that the displacements of each add; thus the motion of a shaft relative to a fixed surface to which the bottommost dome is attached can be considerable. In FIG. 27(b), the actuators have been arranged in parallel, such that the force on the shaft is the sum of the individual actuator forces. Combinations of parallel and serial arrangements may also be used. Filling gaps with compressible or compliant magnetic material may improve performance.

Figure 28:
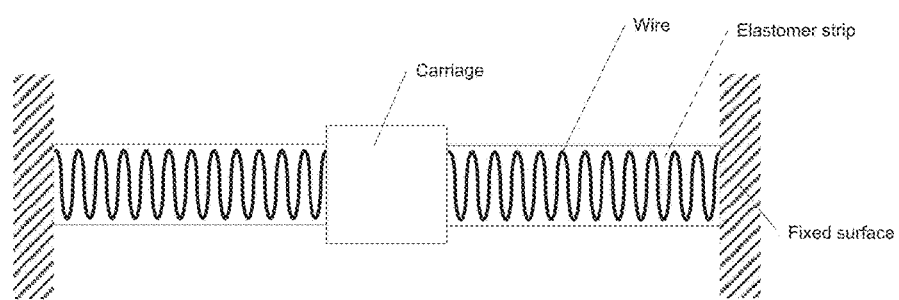
FIG. 28 shows a plan view of an actuator comprising tensioned elastomer strips.

FIG. 28 shows a balanced tension type of actuator. In the figure, a carriage is held between two tensioned elastomer strips, each of which has a serpentine wire embedded within. When current is passed through one of these strips, mutual repulsion of the wires (since the current in any neighboring pair passes in opposite directions) reduces the tension, causing the carriage to move toward the opposite strip due to the tension in it. In general, by incorporating wire that is not straight (e.g., a serpentine) into an elastomer as in FIG. 28, a stretchable structure results in which the wire becomes at least somewhat straighter when the elastomer is stretched, yet electrical performance is preserved. The wire in such a structure in some embodiments is printed while it is encapsulated by elastomer, and the additional elastomer required for a given layer is subsequently printed in the regions not occupied by wire.

Since ECPC can be visible in regions in which it is incorporated, it may be desirable to locate junctions away from the visible surfaces of devices, so as to not mar their appearance.

Fluid passages may be built in place for various purposes. For example, if located in close proximity to wires used in electromagnetic and shape memory alloy (SMA) actuators, such passages may be used to convey a cooling fluid (e.g., allowing higher power to be supplied to a solenoid, or faster response of an SMA actuator), or a heating fluid to increase the efficiency of an SMA actuator. In some embodiments, hollow wires may be employed, through which cooling fluid may travel. Pumping of liquids may be as a result of one or more localized pumps, or distributed pumping may be employed. For example, wires in close proximity will exhibit mutual attraction or repulsion when supplied with current. These forces can be used to slightly deform the geometry of nearby fluid channels (e.g., located between two wires) so as to achieve a pumping effect (e.g., peristaltic pumping). It may be advantageous for such devices to use pulsed DC or alternating current in lieu of unidirectional DC current, to achieve a pumping effect.

In some embodiments, shape control of a device or structure made using FEAM may be provided, for example, to compensate for creep, inelastic distortion due to excessive strain, and other sources of distortion. Displacement or force control of actuators used for shape control (or in general) can be implemented by incorporating displacement/position sensors such as electrostatic or electromagnetic sensors (e.g., LVDTs or variable reluctance sensors), strain gauges, etc.

FIG. 29 is a cross-sectional elevation view depicting two capillaries that are external to the nozzle in some embodiments, and which deliver or lay wire into the molten extrudate as the nozzle (or fabricated object) moves. External capillaries offer a number of advantages over those within the nozzle, for which the angle of the axis with respect to the nozzle axis is more constrained. For example, by allowing the wire to pass through the lumen of the capillary and enter the extrudate with little bending, less residual stress is imparted to the wire, which for most wires (e.g., other than superelastic nickel-titanium) may cause it to curl the deposited layer, and thicker and/or more brittle wire and filament can be accommodated. Moreover, there is less friction between the wire and capillary, facilitating the use of wire feeding and cutting mechanisms such as FIGS. 32(a), 32(b), 33(a), 33(b), 33(c), 33(d), and 33(e), as an alternative to anchoring wire as a means of dispensing it. Since the capillary is not within the nozzle, there is no pressurized polymer around it, so no risk of polymer entering the capillary, and no blockage of flow through the nozzle (especially useful for ECPC). The vertical position of the wire within the extrudate can be easier to control, since a vertical displacement of the capillary translates more directly into a vertical displacement of the wire. Also, the horizontal position of the wire can be controlled more easily using an appropriate translation system, without the space constraints of being internal to the nozzle. Bare wire (e.g., for winding cores or making external interconnects is easier to deliver with an external capillary, as it is possible to avoid any contact between molten polymer and wire (in some embodiments, the polymer flow may be retracted/sucked back into the nozzle, and/or the nozzle may be briefly separated vertically or horizontally from the capillary to avoid contamination of the wire). It is easier to implement multiple capillaries with multiple filaments as in FIGS. 45(a) and 45(b), or multiple filaments per capillary (e.g., to incorporate multiple filaments in the extrudate). Finally, rapid movements of the capillary (e.g., to create shapes such as that of FIG. 72) are more easily produced without having to move the capillary inside a viscous polymer. To realize these benefits, however, may require the incorporation of several approaches, as described below.

Figure 29A:
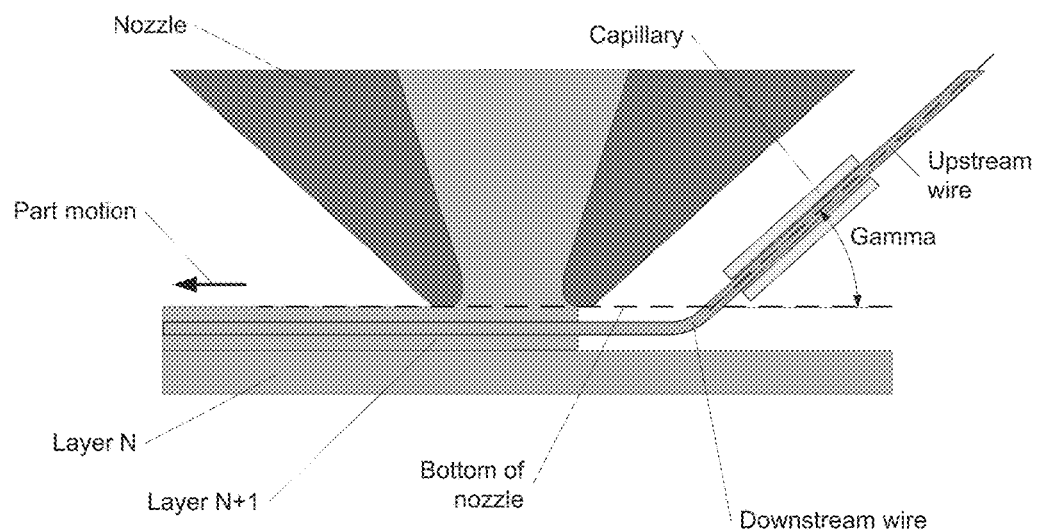
FIGS. 29(a) and 29(b) are cross-sectional elevation views depicting two capillaries that are external to the nozzle in some embodiments.
Figure 42:
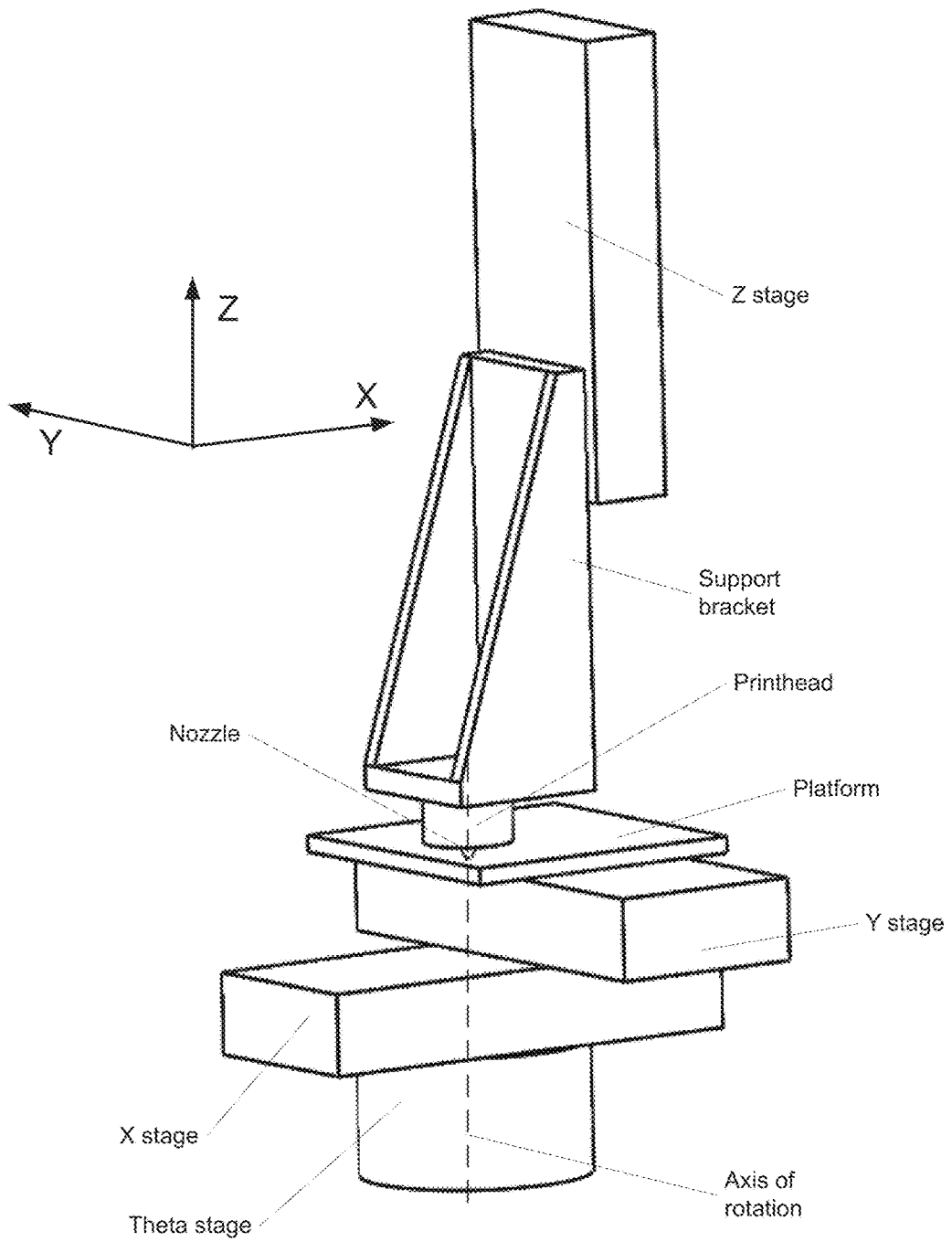
FIG. 42 is an isometric schematic view of apparatus used in some embodiments wherein the printhead moves in the Z direction.

If the capillary feeds wire asymmetrically from one side of the nozzle, in some embodiments the capillary rotates around the nozzle as it moves around curves in the layer (X/Y) plane, while in other embodiments the fabricated object rotates with respect to the capillary (e.g., around the nozzle axis, as in FIG. 42). With such capillaries, the wire may be anchored within the object and pulled through the capillaries, or the wire may be fed by advancing it through the capillary, as will be discussed. In FIG. 29(a), the capillary is straight and the wire bends in the vertical plane after exiting from the capillary (the bend radius may be larger than shown). The vertical position of the capillary, or its angle gamma to the horizontal, may be adjusted to control the vertical position of the wire inside the extrudate for layer N+1. Moreover, the horizontal Y (perpendicular to the figure plane) position of the wire may be controlled by translating the capillary along the Y axis or rotating it about the axis of its upper, straight portion.

If the lower edge of the capillary is below the plane defined by the bottom of the nozzle, the capillary can collide with previously-deposited material. Thus, the vertical position of the capillary may be set to be above this plane, as shown, or may be dynamically variable, such that the capillary lifts out of the way temporarily when a collision might otherwise occur. If wire is cut upstream of the capillary, it may still be pushed through the capillary; however, short cut wire segments would be unsupported between the capillary and extrudate and cannot be accommodated.

Figure 29B:
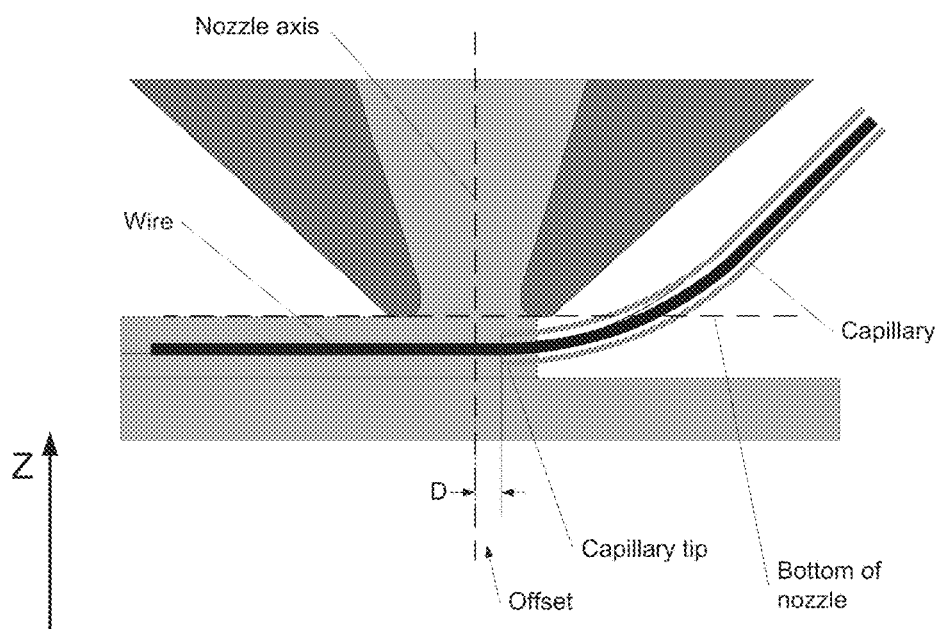

FIG. 29(b) illustrates a cross-sectional elevation view of an external capillary comprising a curved tube, the tip of which can be at the correct position (in Z and Y) and angle to deliver the wire into the center of the extrudate, or to another desired position. Wire is dispensed through the lumen of the capillary which is located and oriented such that the longitudinal axis of the tip (having its lumen nearest the nozzle) is at a small angle to the plane of the previous layer and build substrate. The internal cross-sectional shape of the capillary can be circular (for round, hexagonal, or octagonal wire, or for square or rectangular wire in which the twist orientation is not controlled), square (for square wire with controlled twist), rectangular (for rectangular wire with controlled twist), etc. The tip can also more closely approach the extrudate and even enter it as shown, offset from the nozzle centerline by a distance D. X can be zero or a small number, such that the capillary tip is immersed in extrudate; though coated with extruded polymer, the tip can be unclogged by wire entering it, and the capillary can be heated to melt polymer at the tip and/or heat the wire. However, in some embodiment variations, D is a larger distance such that the tip does not touch the polymer. To avoid collisions with previously-deposited extrudate, the wire can be retracted or translated and the capillary translated in X (as needed) and Z, or rotated (e.g., around the X axis) to move it above the bottom of the nozzle. Thus, for example, when extruding polymer into a closed, circular, single-layer extrudate starting at 0°, as the nozzle approaches 0° again, the wire (if extended) is retracted, and the capillary is moved above the bottom of the nozzle. While this means that wire cannot be deposited everywhere in a closed loop, this is rarely a concern (for situations where it may be, such as producing conductive loops in metamaterials, ECPC can be used to bridge the gap). For example, when building a layered, vertical axis coil, wire might be deposited within 300-350° of arc for each turn, before terminating in an ECPC vertical junction and continuing on the next layer. In the case of a continuous coil as in FIG. 61, no retraction is required. In some embodiment variations, the entire capillary need not be positioned or angled, but just the most downstream part of the capillary, if the capillary is at least in part flexible. In some embodiment variations, collisions can be tolerated if the capillary is relatively thin and heated so it can penetrate previously-deposited material.

Suitable materials for capillaries and portions of capillaries include stainless steel hypodermic tubing, ceramic tubes, glass micropipettes, and polymer (e.g., polyimide, PTFE) tubes. The upstream end of the capillary may be flared to facilitate insertion of the filament. The downstream tip of capillaries may be radiused (e.g., by micro abrasive blasting or electrochemical polishing) to minimize friction and potential damage to the wire. Capillaries may be made from multiple pieces that are bonded or fastened together. Capillaries may be coated or lined with PTFE (e.g., Thermech Engineering, Anaheim, Calif.), or coated with AMC148-18, etc.

In some embodiments, wire may not initially be co-deposited with polymer. Rather, a heated capillary such as that of FIGS. 29(a) and 29(b) is immersed through the polymer and moved in X/Y, delivering filament as it moves.

Figure 30A:
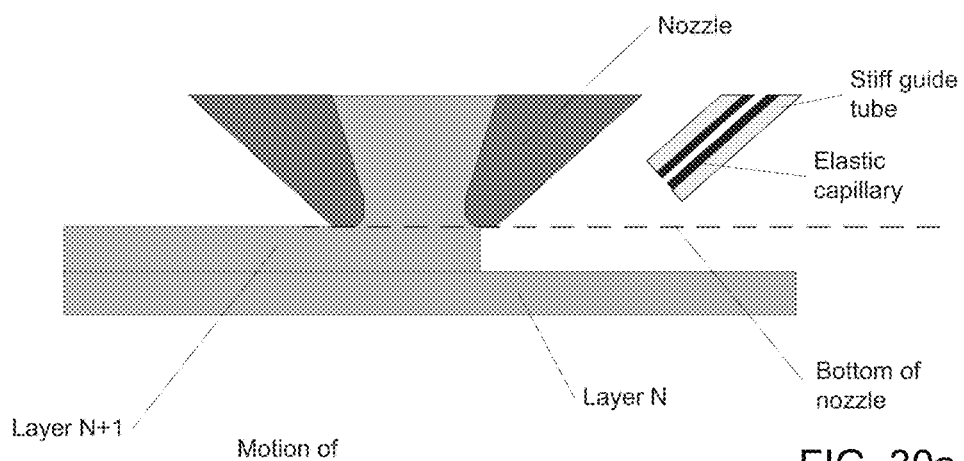
FIGS. 30(a), 30(b), and 30(c) depict cross-sectional elevation views of an external capillary used in some embodiments and similar to that of FIGS. 29(a) and 29(b).
Figure 30B:
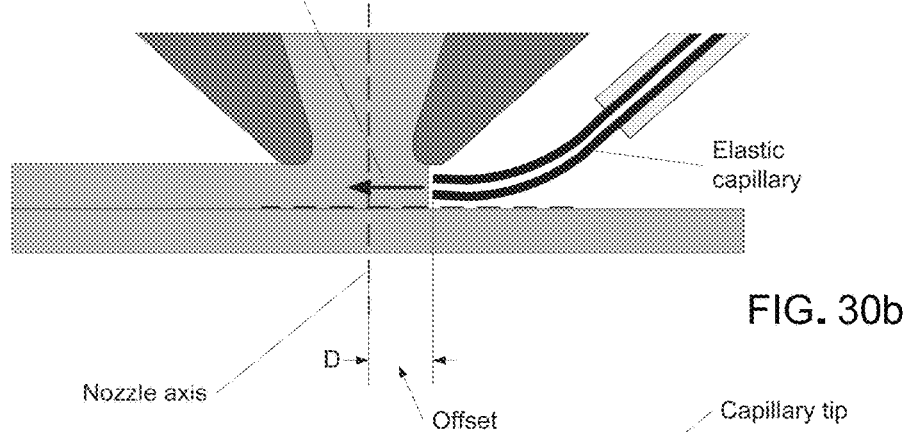
Figure 30C:
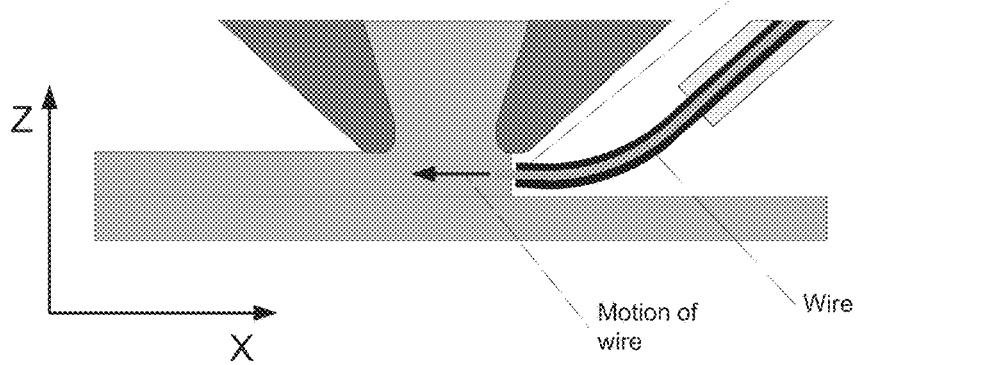

FIGS. 30(a), 30(b), and 30(c) depict a cross-sectional elevation view of an external capillary used in some embodiments and similar to that of FIG. 29(b), the tip of which can be at the correct position and angle to deliver the wire into the center of the extrudate. Again, due to the asymmetry, rotation of the capillary or fabricated object is needed. In this case the capillary comprises a thin walled, curved, elastic tube that is surrounded partially by a stiff guide tube. The elastic tube may be made from superelastic nickel-titanium, stainless steel, or a polymer, for example. If the tube is curved in the X/Y plane to naturally have a shape such as that shown in FIG. 30(c), when withdrawn into the guide tube it is forced to straighten out. While the arrangement of FIG. 29(b) may require two axes of motion to bring the capillary above the bottom of the nozzle, a single-axis retraction of the capillary into the guide tube in FIGS. 30(a), 30(b), and 30(c) accomplishes this. The guide tube can be translated and/or rotated, and the capillary can be extended or retracted by various amounts, to adjust the position and orientation of the tip of the capillary. For example, the distance D between the nozzle axis and the tip of the capillary can be adjusted (e.g., to minimize potential contamination of the capillary downstream end/tip, or wire that is intended to be "bare". If distance D is small and the tip is in contact with molten polymer, the capillary can be heated to prevent or eliminate clogging by polymer; such heating can also pre-heat the wire, which can improve coating with polymer and adhesion. In some embodiments, distance D is adjusted dynamically. To avoid collisions with previously-deposited extrudate, the wire and capillary can both be retracted to move them above the bottom of the nozzle. In some embodiments, the entire downstream/distal end of the capillary is not retracted; rather, the tip is simply deflected upwards so that it no longer protrudes below the bottom of the nozzle. Also, the outside dimensions of the portion of the capillary below the nozzle should be smaller than the extrudate width horizontally, so that wire delivery/polymer extrusion can occur immediately to the side of already-deposited extrudate. It should also be smaller than the layer thickness vertically, so that the wire can be centered vertically if needed with respect to the layer thickness. In some cases the capillary may need to be placed lower than the center of the layer thickness, e.g., to compensate for hydroplaning of the wire on the molten fluid, or higher than the center, e.g., to compensate for depression of the wire due to impingement of the polymer flow. To deliver bare wire (e.g., for winding a capacitor plate or electromagnetic actuator core), wire can be retracted (if needed) into the capillary and polymer retracted from the nozzle (e.g., by reversing the feed rollers). Once the region underneath the nozzle is free from polymer, the wire can be re-extended.

In some embodiments, the wire height (for square wire) or diameter may be substantially equal to the layer thickness, such that the nozzle virtually rides on the wire surface, the wire is flush with the bottom of the layer, and polymer is on either side of the wire, but not elsewhere. In such a case, the capillary tip may be at a larger X value than in FIGS. 30 (a), 30(b), and 30(c) so that it doesn't interfere with the nozzle.

Figure 31:
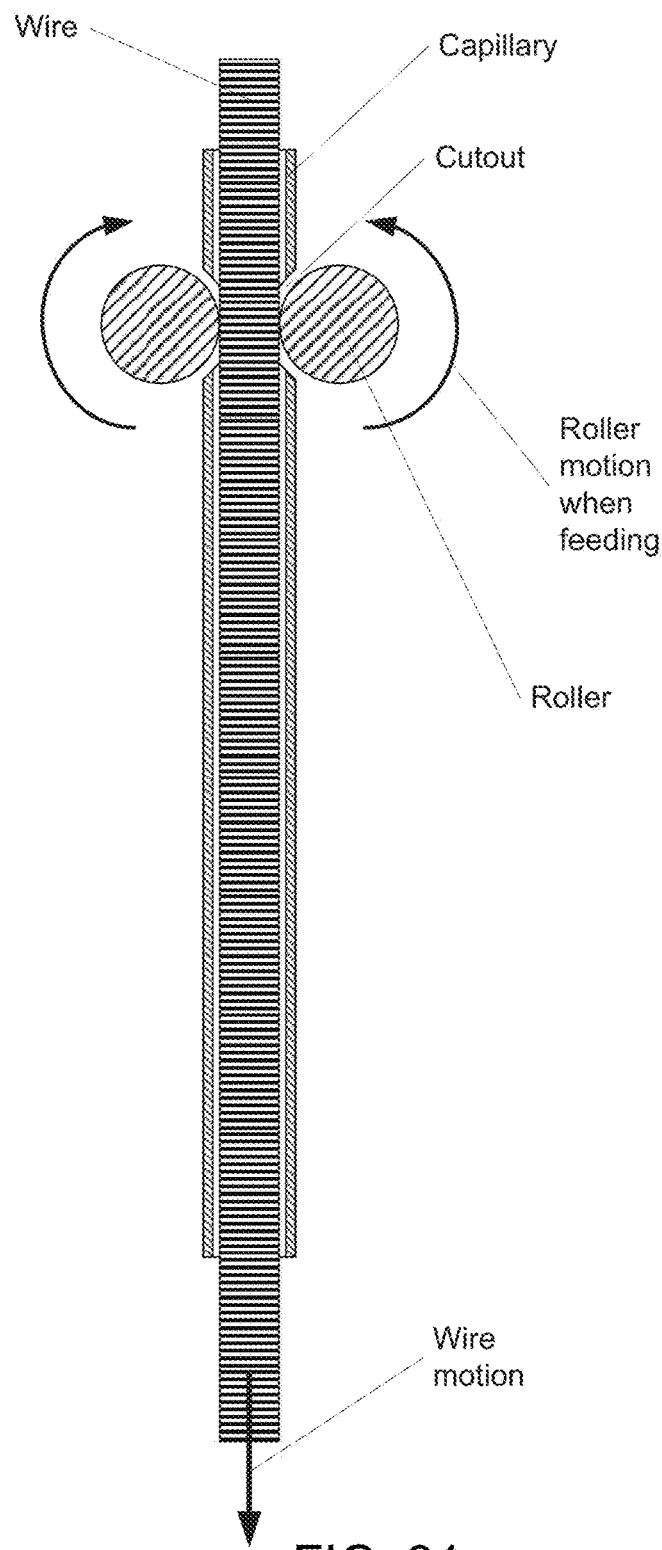
FIG. 31 is a cross sectional view of feeding of filaments.

In some embodiment variations, the capillaries of FIGS. 29(a), 29(b), 30 (a), 30(b), and 30(c) need not guide the wire very far toward the point of entry of the wire into the extrudate, but rather, may "aim" the wire at the desired entry point, such that the wire spans the gap between capillary tip and extrudate without further support. The capillary aim will depend on whether the wire issues from the capillary in a straight or curved form once its internal stress In some embodiments, feeding of filaments may be performed using apparatus similar to that shown in the cross sectional view of FIG. 31. To minimize the possibility that wire (especially if its stiffness or yield strength is low) will buckle, the wire is surrounded as much as possible by the capillary, especially downstream (in the direction of motion) of the rollers. A single capillary with cutouts similar to those shown allows contact between the counter-rotating rollers and the wire. The rollers can be metal, polymer (e.g., elastomer), ceramic, or other material. In some embodiment variations, both of the rollers are driven by a motor, while in other embodiment variations, one roller is driven and one rotates passively. Motion of the rollers in the direction shown displaces the wire in the downstream direction shown, i.e., extends it from the capillary, typically at the same tangential speed as the printhead nozzle moves (though this may vary if the intent is to preload the wire in tension, create more complex wire shapes as in FIG. 72, etc.). Reversing the roller direction reverses the wire direction, i.e., retracts the wire. At least one of the rollers may also serve as one electrode, along with at least one (driven or passive) upstream roller (or brush, etc.) to provide Joule heating of the wire by the passage of current from the roller to the upstream roller.

Figure 32A:
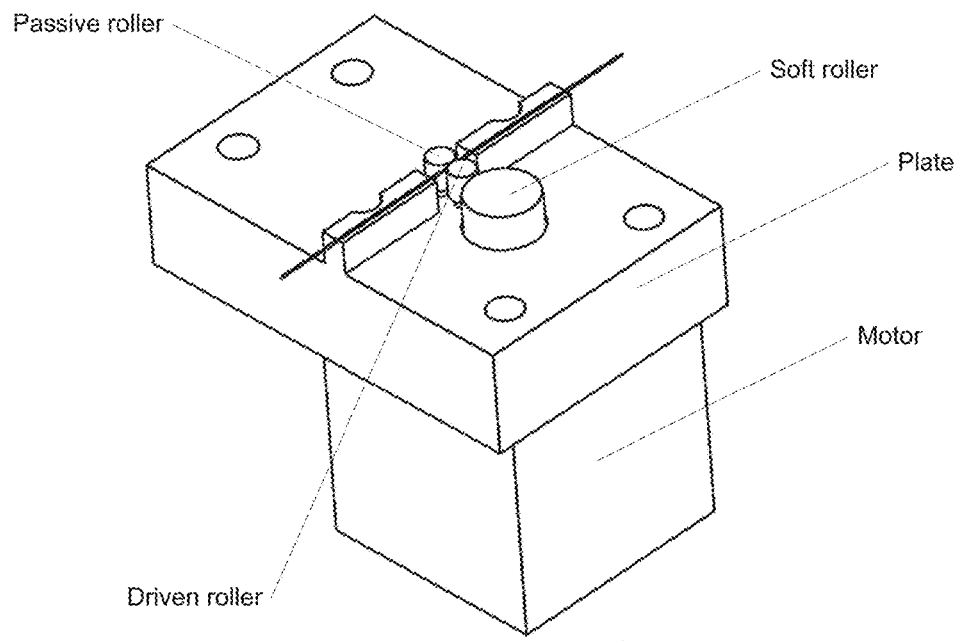
FIGS. 32(a) and 32(b) illustrate a wire feeding mechanism.
Figure 32B:
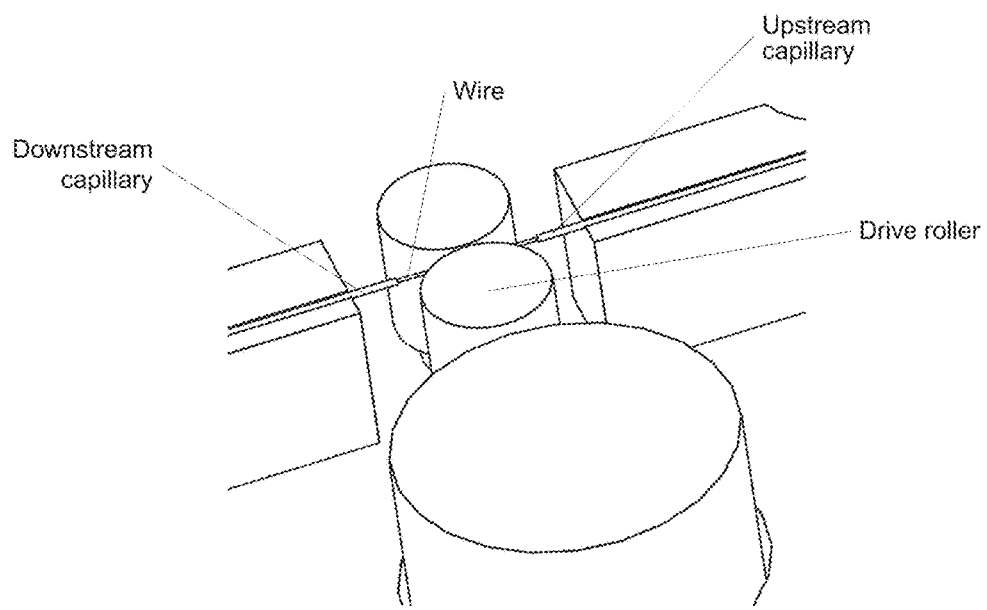
Figure 33A:
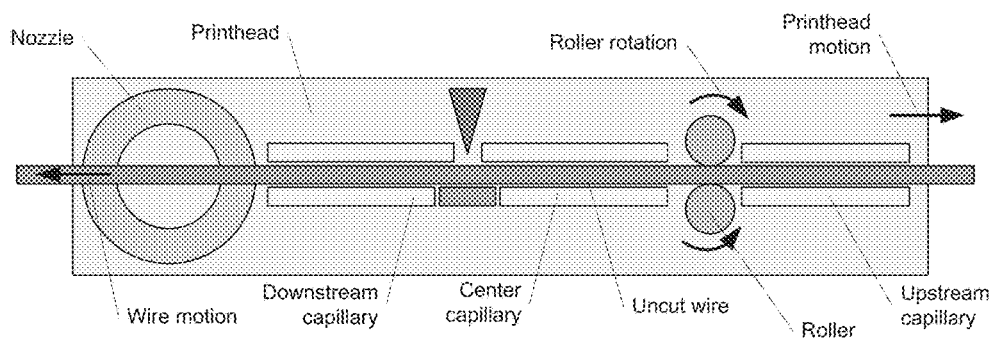
FIGS. 33(a), 33(b), 33(c), 33(d), and 33(e) illustrate a wire feeding and cutting mechanism.
Figure 33B:
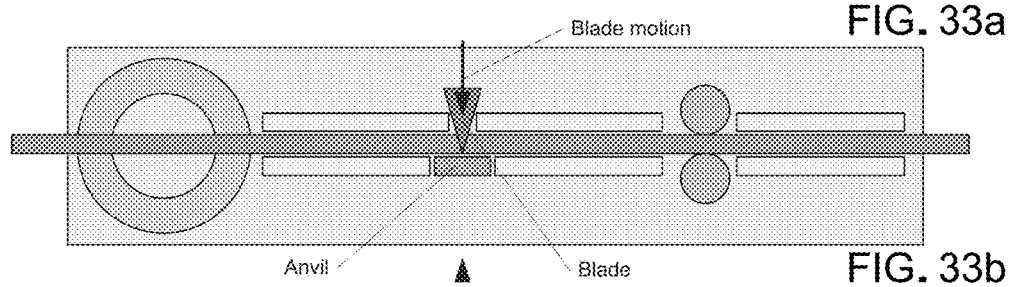
Figure 33C:
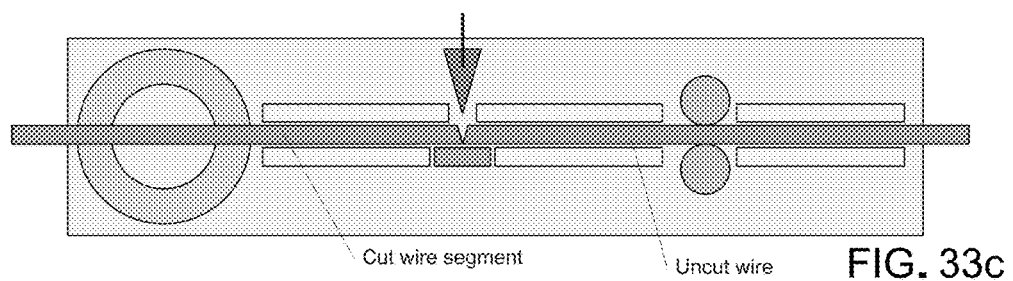
Figure 33D:
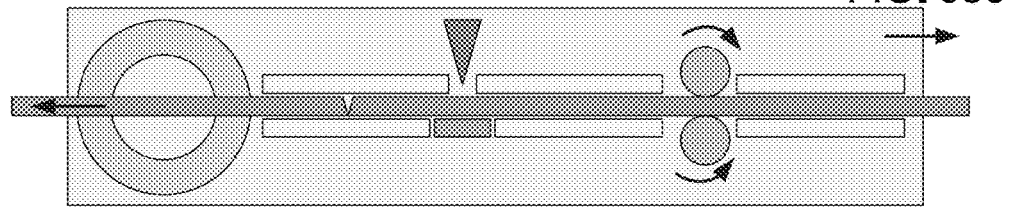
Figure 33E:
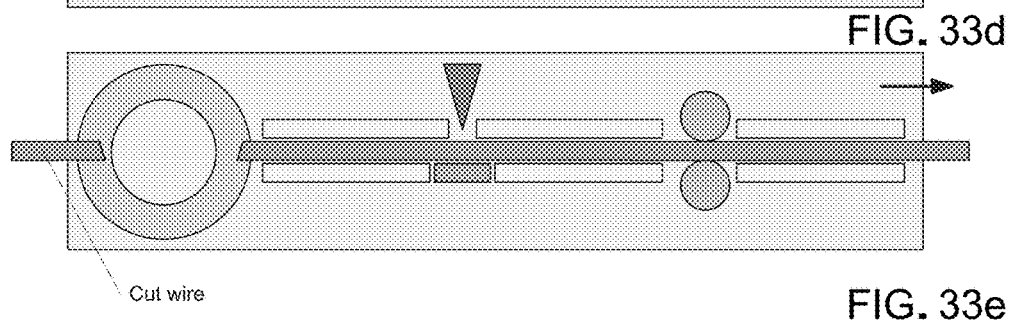

In FIGS. 32(a) and 32(b), apparatus applicable in some embodiments (e.g., those using an external capillary) for feeding filament is shown in isometric view. As shown in the closeup view of FIG. 32(b), a closeup view of FIG. 32(a), two rollers are provided, as well as two capillaries: one upstream (to guide the filament) and one downstream (i.e., toward the nozzle) of the rollers, separated by a small distance (particularly small between the downstream capillary and rollers) to allow access of the rollers to the filament. A single capillary shaped like that of FIGS. 32(a) and 32(b) which allows roller contact with the filament can also be used. In FIGS. 32(a) and 32(b), one roller is driven by contact with an elastomeric friction roller turned by a motor, while the other turns passively. The speed of the motor is preferably very well controlled and adjustable with high resolution, so as to achieve the desired wire feed rate. For example, the wire may be fed at precisely the same speed that the nozzle traverses the previous layer or build platform; however, other speeds may also be used. The gap between the rollers can be pre-set to firmly grip the filament, or at least one roller can be spring-loaded. Especially if Joule heating is not used, at least one of the rollers may be made from or covered with elastomeric material. In some embodiments, two rollers are driven at different speeds to induce residual stress in the wire and pre-curve it, e.g., so that it can more easily follow the curved trajectory of the printhead, or conversely, counteract residual stress already in the wire (e.g., resulting from it being spooled, not straight). In some embodiments, two other rollers or deflectors are provided downstream of the two rollers, which can translate perpendicular to the wire feed direction, and induce or counteract residual stress in the wire if needed.

In some embodiments, the filament may be fed by a single roller pressing against a filament resting on a flat surface, or in a curved, rectangular, or V-shaped groove. Preferably the material the filament contacts is a material like PTFE or AMC148-18 with a low coefficient of friction.

In some embodiments, the rollers feeding the filament also provide additional functions, such as embossing the filament with a texture that increases bonding to, and anchoring of, the filament to the polymer (chemical or plasma etching of the wire, or adding a conductive primer to the wire and/or polymer, can also assist with bonding and anchoring). The rollers may also provide a residual stress to the filament that is desirable in the printed object, or at least partially mitigate a residual stress that would otherwise remain in the printed object. For example, when wire is dispensed from a vertical capillary, it may be bent through approximately 90°, resulting in a residual stress that tends to curl an extrudate containing the wire upwards. Or, when wire is dispensed from a substantially vertical capillary, it may be bent in the horizontal (layer) plane to conform to the shape of a curved extrudate, again resulting in residual stress. In some embodiments, desirable residual stress may be imparted to the filament, or counteracted if already present (e.g., due to spooling) by feeding the filament between a relatively large, soft roller and a relatively small, hard roller, the former tending to plastically deform the wire around the latter.

FIG. 33 shows a view (e.g., a bottom view) of a printhead applicable in some embodiments, comprising filament feeding apparatus and means of cutting wire. The printhead includes a nozzle for polymer delivery, three capillaries (upstream, center, and downstream), feed rollers, and a cutting blade and anvil located between the center and downstream capillaries. In some embodiment variations, the downstream and center capillaries are combined into a single capillary (e.g., ceramic, such as made by Morgan Advanced Materials, Fairfield, N.J.) having a slot through which the blade can access the wire, cutting it against the inside wall of the capillary; no anvil is then required. To the right of the printhead is a supply of wire (e.g., on a spool). In FIG. 33(a), while the printhead moves to the right (or, the fabricated object moves to the left); wire is fed to the left by rotation of the rollers, embedding into the polymer. At this time the blade is retracted. In FIG. 33(b), the printhead has paused momentarily (if required) and the rollers have briefly stopped turning (if required). The blade is quickly advanced to cut the wire against the anvil, and in FIG. 33(c), the blade is quickly retracted, leaving a cut wire segment within the downstream capillary. In practice, the blade motion can be so rapid that neither the printhead nor the wire need stop moving. Since the wire is cut upstream of the nozzle, the machine control software must "look ahead" of the current nozzle position to determine the length of wire needed, thus compensating for the distance between the nozzle and the blade. In FIG. 33(d), the wire is again fed by the rollers while the printhead moves. The cut wire segment is pushed to the left by the motion of the uncut wire, eventually completely exiting the downstream capillary. In some cases multiple short pieces of wire may be within the downstream capillary. In FIG. 33(e), the printhead has advanced further to the right, and the cut wire segment has remained behind, with the uncut wire ready to be fed into another region of the object. In some embodiments, wire is tensioned before cutting and in some embodiment variations, the wire is necked down in a region before cutting it in the region, so that the incidence of burrs that protrude beyond the wire diameter is minimized. Tensioning can be achieve using an additional set of rollers or a wire brake downstream of the cutting blade, or by pulling on wire that is well-anchored in the fabricated object using the rollers shown. In some embodiment variations, wire is not only cut, but the end of the upstream portion also deformed so as to better anchor in the polymer; the downstream capillary can be designed to accommodate the deformed wire. In some embodiment variations, the capillaries comprise grooves in a block against which a block of hard material (e.g., ceramic) is fixed; the resulting channel then serves to guide the wire, with the hard block providing an anvil. The wire cutting approach of FIGS. 33(a), 33(b), 33(c), 33(d), and 33(e) may also be used for wire that is fed substantially parallel to the nozzle axis.

Figures 34A, 34B:
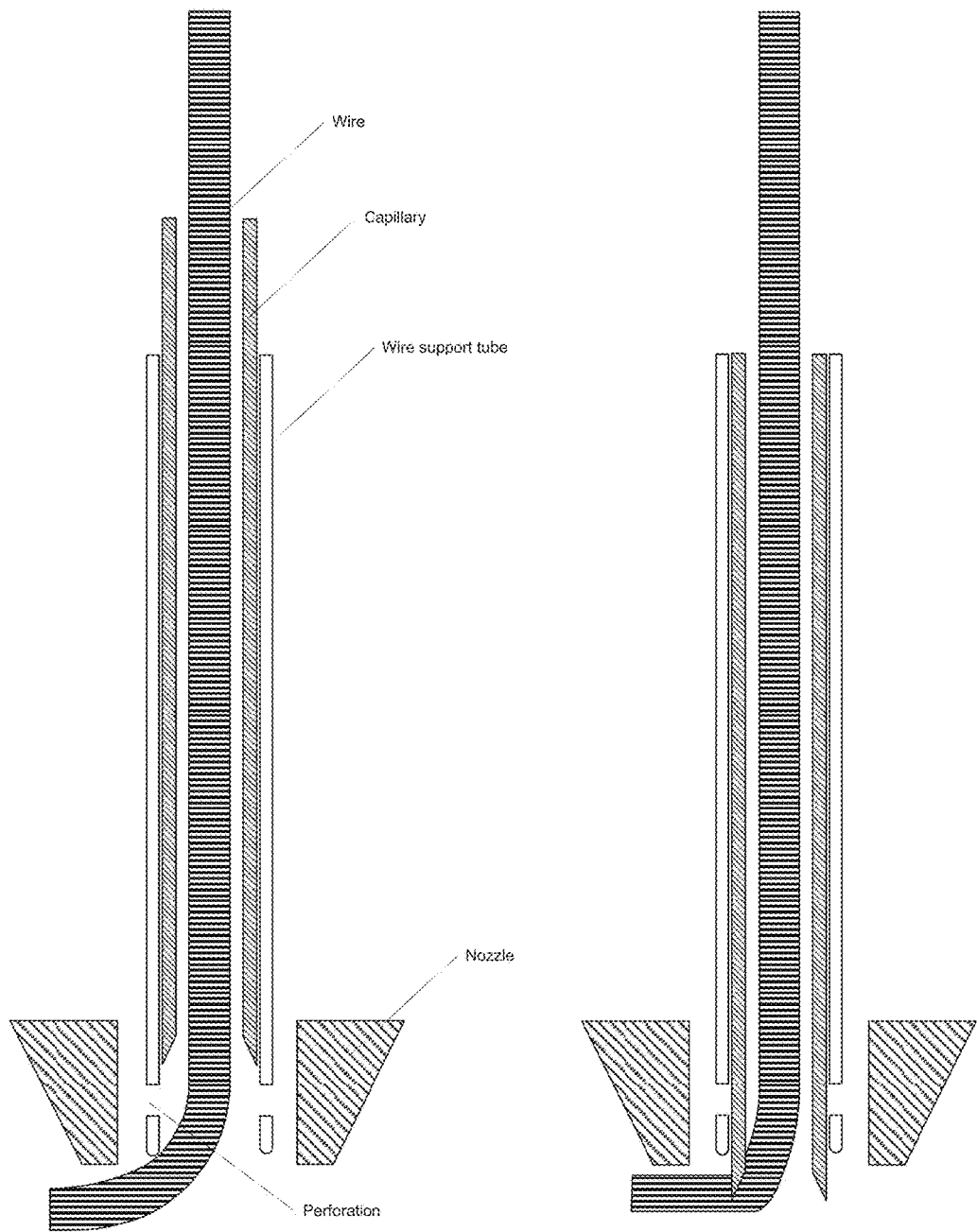
FIGS. 34(a) and 34(b) depict an apparatus for cutting wire.

FIGS. 34(a) and 34(b) depict apparatus for cutting wire used in some embodiments and having some similarity to that shown in FIG. 21. The capillary through which the wire is fed is surrounded by a perforated support tube, and the lower edge of the capillary is sharpened (e.g., electrochemically). The perforations in the tube allow molten polymer to reach the wire and minimize the flow restriction in the nozzle. When the capillary is positioned high relative to the support tube (FIG. 34(a)), the latter serves to prevent contact between the wire and the edge of the nozzle (which can cause the extruded polymer to split into two streams). The edge of the support tube also affects the vertical position of the wire inside the extrudate; thus adjusting its vertical position can adjust this position. In the configuration shown in FIG. 34(a), the wire cannot easily come into contact with the sharp edge of the capillary. When the capillary is positioned low relative to the tube, the wire can come into contact with the sharp edge, and be cut (FIG. 34(b)). Thus by altering the relative positions of tube and capillary, wire can be cut when needed. In FIGS. 34(a) and 34(b), the tube has remained fixed and the capillary has moved; however, in some embodiment variations, this is inverted, or both the capillary and tube move. In some embodiment variations, the entire lower edge of the support tube is not sharpened; the wire contacts the unsharpened region in normal operation, but the tube is rotated to bring the sharp region into contact with the wire, allowing it (or causing/enhancing it, as a result of the rotation) to be cut. In some embodiment variations, the tube is rotated sufficiently rapidly, cutting through the wire much like a hole saw; its edge may comprise teeth, diamond particles, etc.

Figure 35:
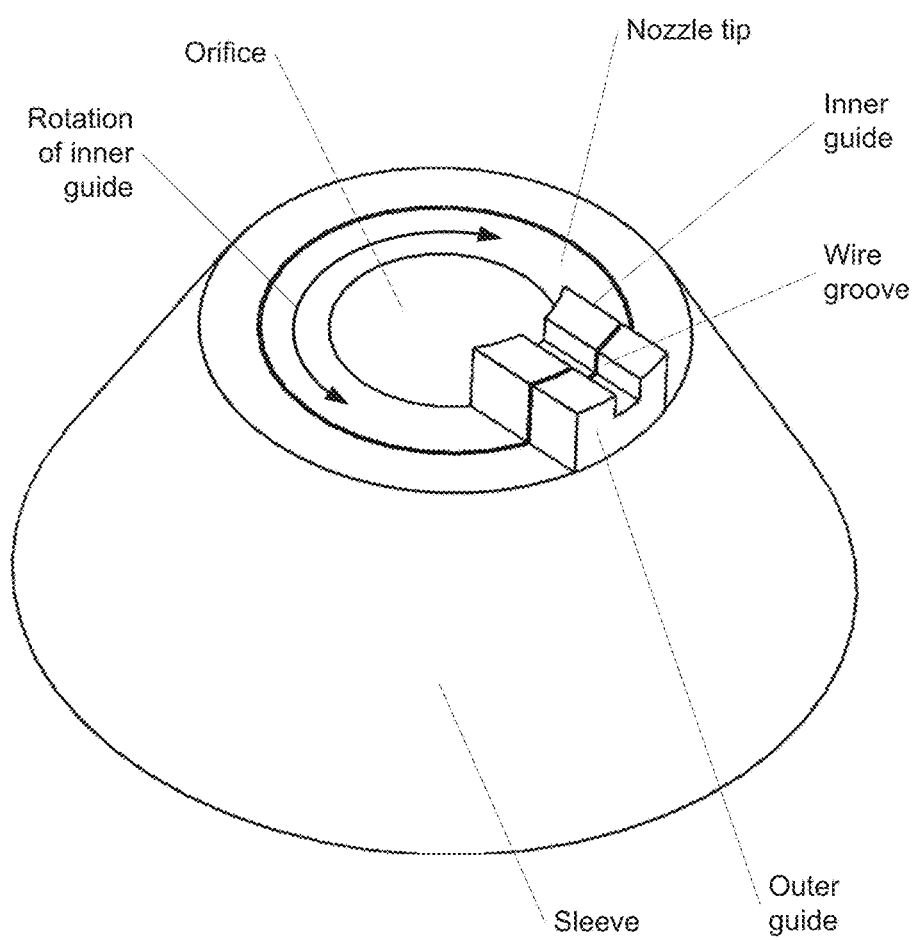
FIG. 35 depicts an approach used in some embodiments for cutting wire issuing from an external capillary.

FIG. 35 depicts an approach used in some embodiments for cutting wire issuing from an external capillary such as that in FIG. 29(a), 29(b), 30(a), 30(b), or 30(c), in which the nozzle tip itself provides the required cutting action. The nozzle is capable of rotating through a small angle, and surrounding the nozzle tip is a fixed sleeve, which may be tapered in shape. In some embodiment variations, the sleeve rotates and the nozzle tip is fixed, or both rotate. The lower surface of the tip is furnished with an inner guide, comprising a groove for the wire (in practice the inner guide may be at located at a larger radius than shown). The lower surface of the sleeve is provided with an outer guide, also comprising a wire groove. The bottom of each groove may be set to a height that controls the vertical position of the wire within the extrudate, or may be set to not interfere with the wire position as set by an external capillary. The wire may be retained in the guides magnetically, in some embodiment variations.

The inner edge of the outer guide is in close proximity to the outer edge of the inner guide. At a particular orientation of the tip, the two grooves can be substantially aligned. If a wire is placed in the groove and the tip rotated, the wire can be cut by the shearing action of the two guides moving relatively. In some embodiment variations, only a single guide may be used, simply to guide the wire into the polymer at the desired position. In some embodiment variations, a single outer guide is provided, which may be capable of both rotation and axial translation, thus controlling the position of the wire within the extrudate. By cutting the wire after it has passed through the capillary, burrs and distortions introduced by cutting may be easily accommodated. In some embodiment variations, the inner guide is rotated through a smaller angle and/or the space between inner and outer guides is larger, and or radiused edges are used (e.g., cylindrical pins), so as to clamp or deform but not cut the wire. This can in some embodiments allow intentionally deforming the end of the wire to enhance anchoring in the polymer, for example. Such an arrangement also allows forming the wire into a serpentine shape, bending the wire with tight radii to obtain sharp turns, etc. In some embodiment variations, the guides both (simultaneously or sequentially) cut the wire and shape the end of the wire upstream of the cut, deforming it plastically so it will be more securely anchored in the solidified polymer.

When depositing extrudate into a closed loop, the guides shown, protruding below the nozzle tip, may contact already-deposited and solidified polymer just as the loop is closed. This may not an issue, in that the inner guide is heated and the outer guide may be heated. Thus, the guides may re-melt the polymer (e.g., if the nozzle motion is slowed toward the origin of the loop), avoiding a collision, though possibly leaving a small defect. In some embodiment variations, the guides may be recessed further into the nozzle and sleeve, or be retractable. In some embodiment variations, the outer guide may also be rotatable. Then, the inner and outer guides may be rotated away from the origin of the loop to avoid contact.

Figure 36:
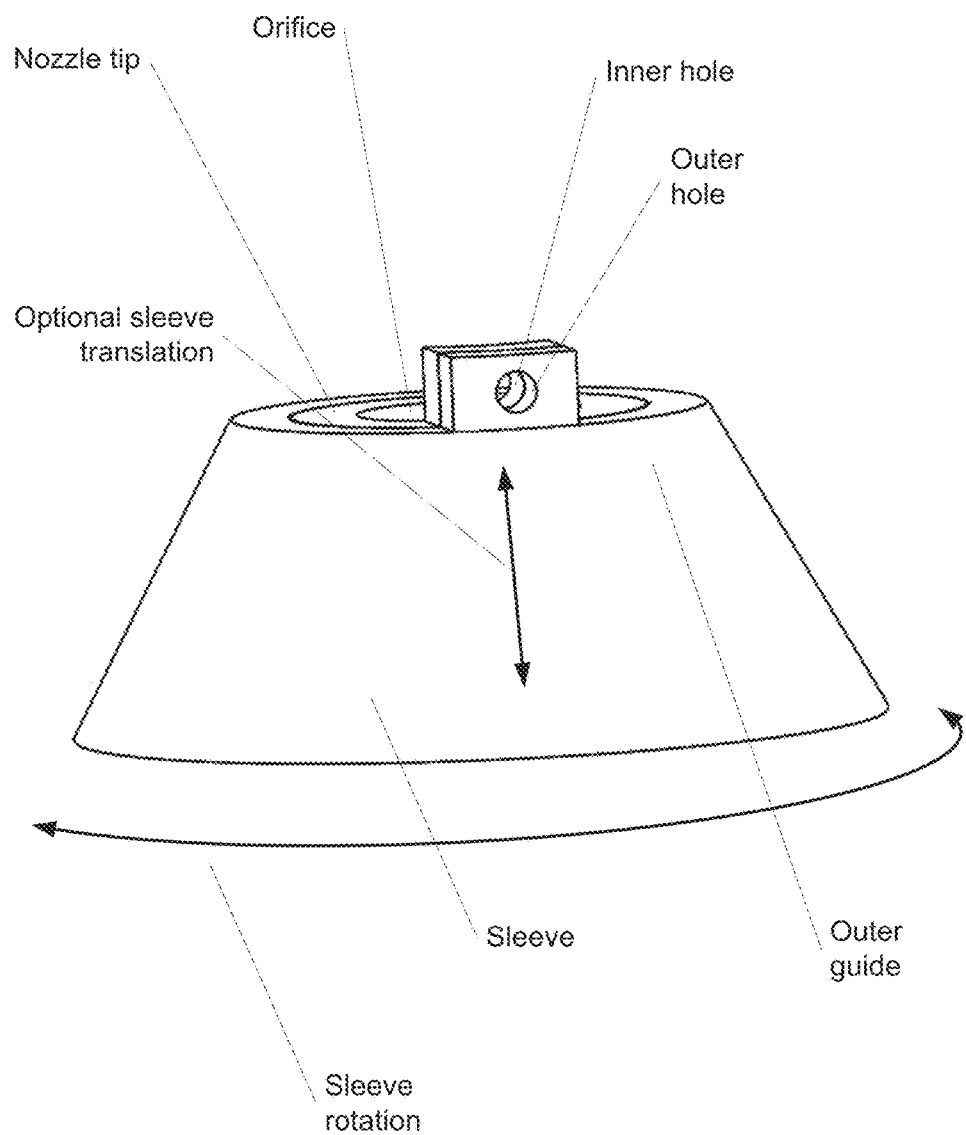
FIG. 36 depicts a nozzle.

In FIG. 36, a nozzle used in some embodiments and similar to that of FIG. 35 is shown. Here, the wire guides are provided with holes in lieu of grooves, through which the wire is fed. In practice, the edges of the grooves may be radiused to minimize damage to the wire. In some embodiment variations, one hole and one groove is provided. As before, the wire can be cut or clamped by this arrangement. In addition, by allowing the sleeve (and/or tip) to translate axially, the wire can be bent in complex 3-D shapes. For example, the wire may be bent so that it can better follow the curve of the extrudate, especially if the wire is not particularly soft, or is of a larger cross section and thus, stiffer. Or, the wire may be given an intentional residual stress in some direction so that it can preload a portion of the fabricated object. Or, if the wire has developed a curvature in the process of dispensing from the capillary that would cause residual stress in the fabricated object, it can be bent so as to straighten it out again. The nozzle of FIG. 36 may also be used for many of these purposes. Bending by the nozzle may best be achieved by rapid, intermittent motion of the sleeve and/or nozzle, moving in a reciprocating fashion in translation and/or rotation. In this way, a closely-spaced series of micro-bends are produced in the wire, but when the holes are aligned in between such bends, the wire is still able to be fed through the holes with minimal friction. In some embodiment variations, additional wire guides may be provided, such as guides located diagonally opposite those shown in FIGS. 35-36. In the case of multiple guides, some may be designed for cutting wire (e.g., with sharper edges, or with the inner and outer guides in closer proximity when aligned, to provide shearing), while others may be designed for bending wire (e.g., with rounder edges, or with the inner and outer guides further from one another). Guides may be shaped so as to minimally disturb the molten polymer through which they pass.

Figure 37:
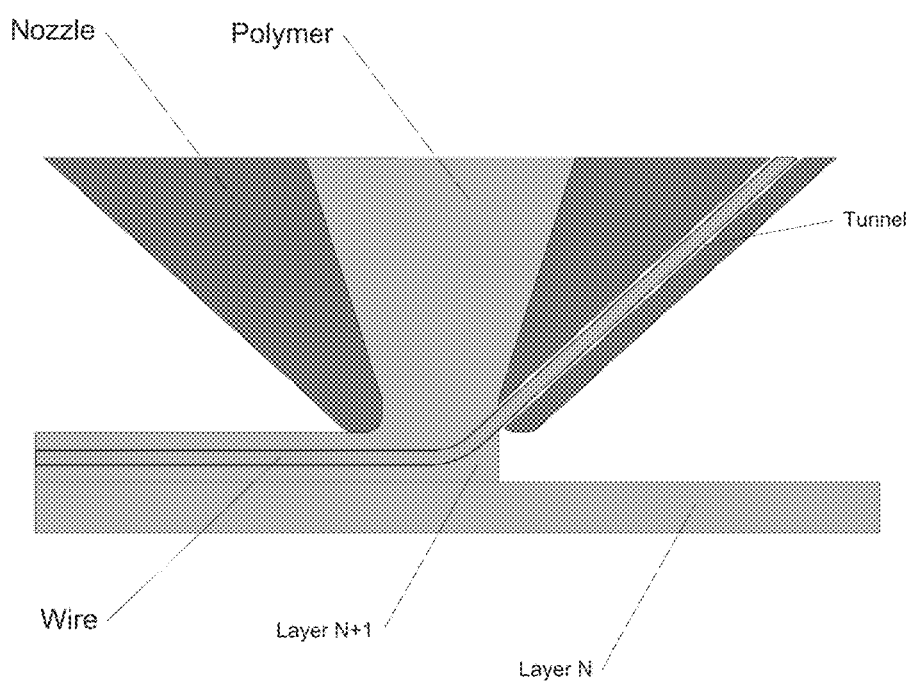
FIG. 37 depicts a cross sectional elevation view of an embodiment wherein an angled tunnel is provided in the nozzle to serve as a capillary to deliver the filament.

FIG. 37 depicts a cross sectional elevation view of an embodiment wherein an angled tunnel is provided in the nozzle to serve as a capillary to deliver the filament. As with the external capillaries of FIGS. 29(a), 29(b), 30(a), 30(b), and 30(c), in this configuration the filament need not be redirected through as large an angle as with a capillary that is parallel to the nozzle axis.

Figure 38A:
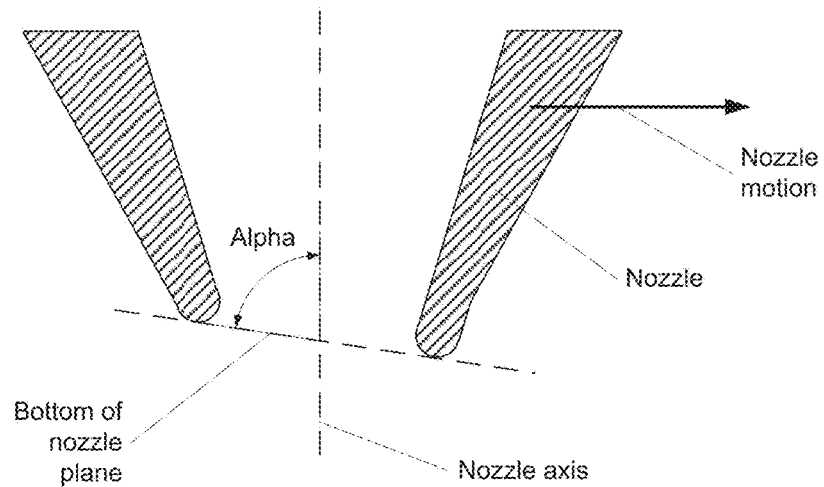
FIGS. 38(a), 38(b), 38(c), and 38(d) depict aspects of printheads used in some embodiments wherein the axes of the capillary and nozzle are substantially parallel.
Figure 38B:
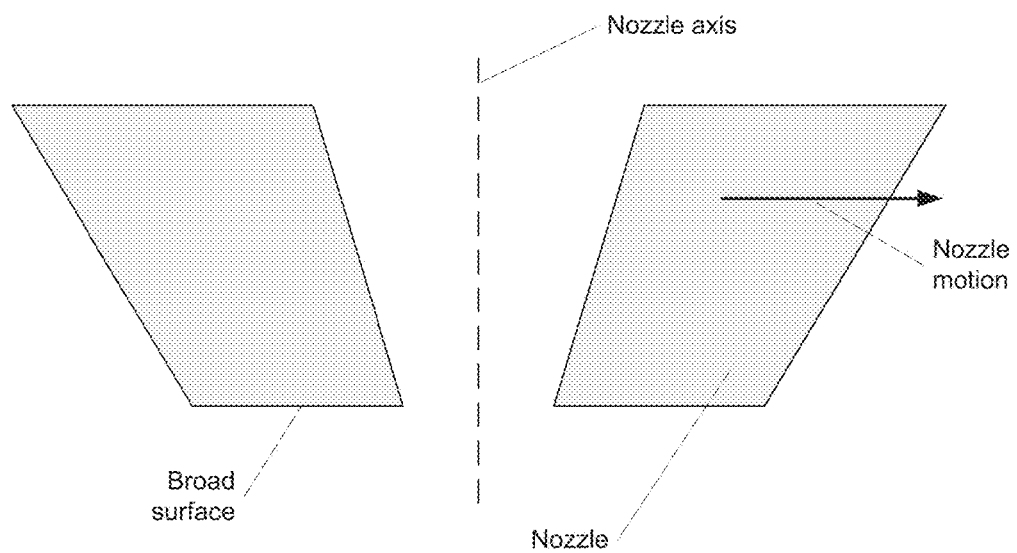

FIGS. 38(a), 38(b), 38(c), and 38(d) depict aspects of printheads used in some embodiments wherein the axes of the capillary and nozzle are substantially parallel as, for example, in FIGS. 5(a), 5(b), 5(c), and 5(d), and which promote the production of extrudates with embedded filament wherein the extrudates fully enclose the filament. FIG. 38(a) is an elevation cross sectional view of a nozzle wherein the bottom of the nozzle is oriented at an angle alpha <90° from the nozzle axis, tilted in the direction of printhead motion. Such a nozzle can provide more flow of polymer to the upper region of the extrudate, helping to close any trench or smooth any seam that may be produced by the wire entering the extrudate, especially if the wire touches or approaches the inside of the nozzle. FIG. 38(b) is an elevation cross-sectional view of a nozzle in which the bottom surface is unusually broad, either omnidirectionally as shown, or in the trailing direction (opposite nozzle motion). The prolonged time of contact between extrudate and nozzle surface can help keep the extrudate flowable for a longer time, facilitating closing or trenches and smoothing of seams.

Figure 38C:
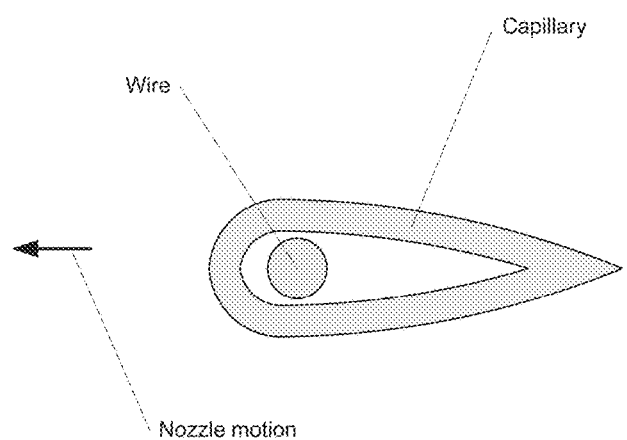
Figure 38D:
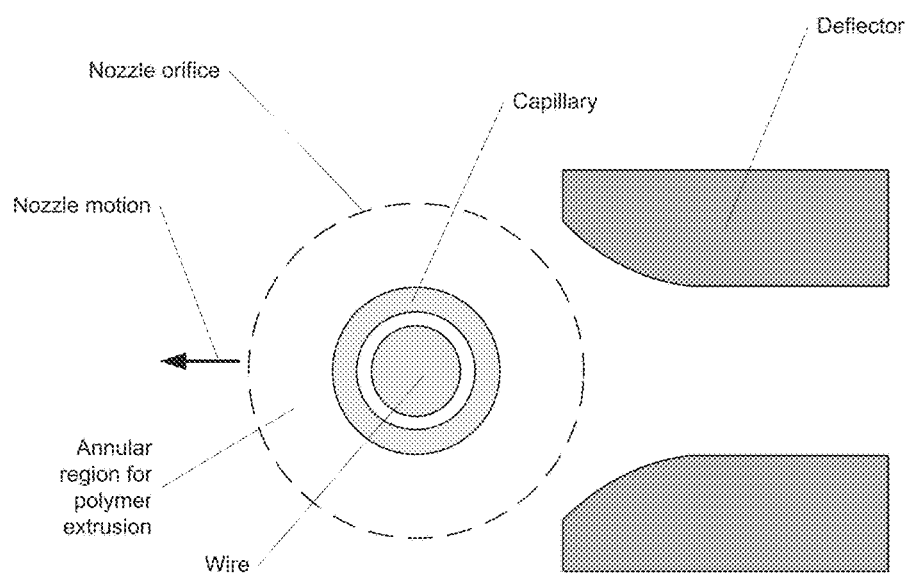

FIG. 38(c) is a plan view of a capillary substantially parallel in axis to the nozzle axis (not shown). Wire is fed through the capillary axially. The capillary has a streamlined shape which can minimize disruption of the extrudate through which it passes as the nozzle moves, and help prevent any "splitting" of the molten polymer stream by the capillary. FIG. 38(d) is a plan view of a capillary substantially parallel in axis to the nozzle axis (not shown). Wire is fed through the capillary axially. As the nozzle moves in the direction shown, polymer is extruded from the annular region between capillary and nozzle orifice. To the extent that the flow of polymer is "split" by the capillary, also provided are two deflectors at least a portion of which extends below the nozzle, and which force the twin extrudate streams together and to merge. In some embodiment variations, grooves or projections in the bottom of the nozzle can also provide this function. In some embodiments, polymer flow around the wire (e.g., for larger size wires) may be improved by vibrating the wire (e.g., by vibrating the capillary), by heating the wire, by heating the polymer above the normal extrusion temperature, or by rapidly twisting and untwisting over a limited angular range (e.g., square filament twisted using a capillary with a square lumen rotated about its longitudinal axis), for example.

Figure 39:
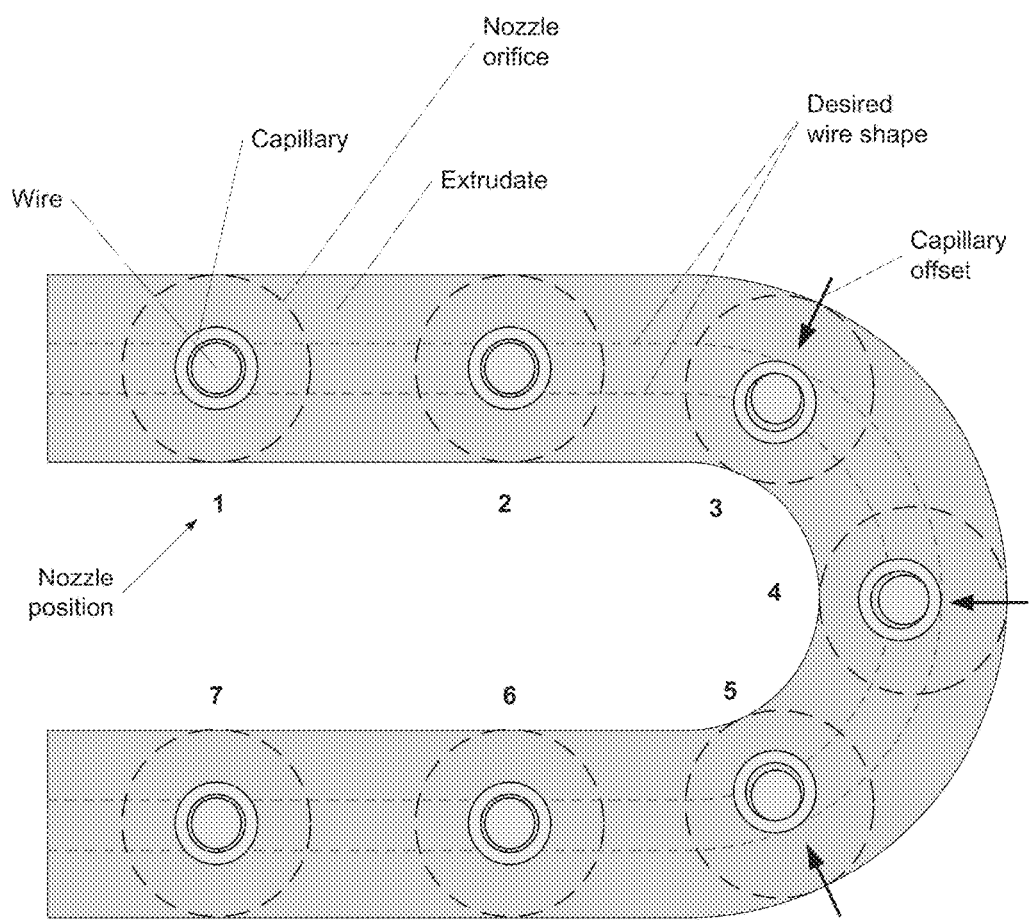
FIG. 39 depicts a plan view sequential schematic illustrating the deposition of an extrudate along a curved, U-shaped path.
Figure 40A:
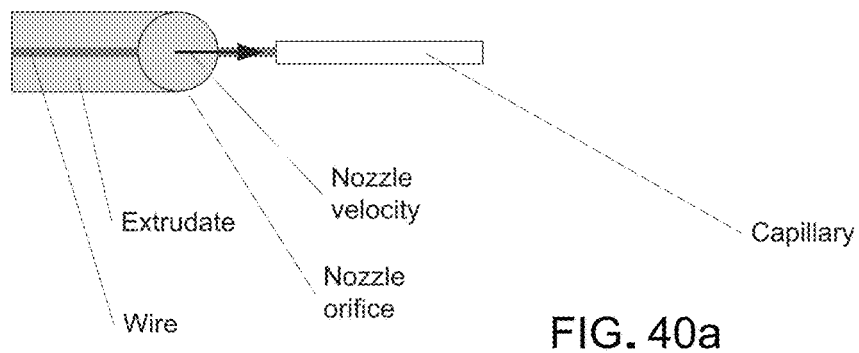
FIGS. 40(a), 40(b), 40(c), and 40(d) depict in plan view the behavior of an external capillary.
Figure 40B:
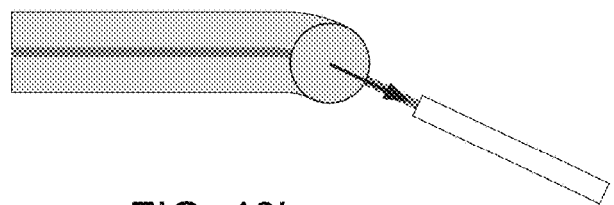
Figure 40C:
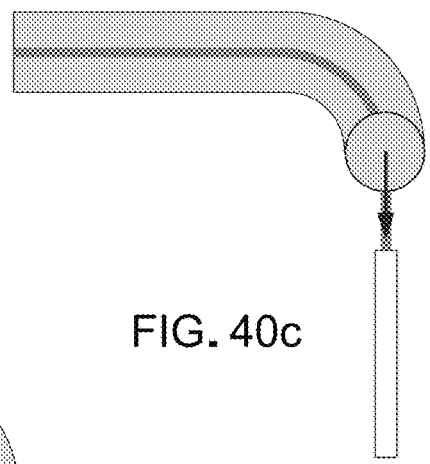
Figure 40D:
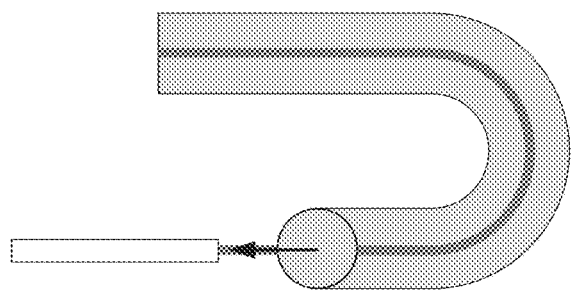

FIG. 39 depicts a plan view sequential schematic illustrating the deposition of an extrudate along a curved, U-shaped path in some embodiments, using a nozzle equipped with a capillary whose axis is substantially parallel to the nozzle axis. The capillary can be translated perpendicular to the direction in which the nozzle is moving. When the nozzle is at nozzle position 1, the path is straight and the capillary is centered within the nozzle so as to center the wire within the extrudate. At position 2, the path remains straight, with the capillary centered. However, at positions 3-5, the path has become curved with a particular radius. The desired wire shape, along the centerline of the extrudate, is shown in finely-dashed lines in the figure. If the capillary remains centered in the nozzle as at positions 1 and 2, the wire—once extended from the capillary—may have a high enough yield strength that bending it leaves it with a residual stress. This stress thus causes the wire to spring back to a larger radius, which can cause it to depart from the desired shape (e.g., not remain substantially centered in the extrudate), and may also distort the shape of the surrounding polymer, or damage the polymer (e.g., tearing through it). To mitigate this, the capillary may be offset from the nozzle center toward the center of curvature of the path, as shown by the arrows at positions 3-5, over-bending the wire so as to compensate for the springback effect. The amount of offset may vary with the radius of curvature of the path (e.g., more offset for a smaller radius). Once the nozzle has reached position 6, and again at position 7, the capillary can again be located at the center of the nozzle.

In an alternative situation, certain wires and other filaments (e.g., optical fibers) beneficial to incorporate into the extruded polymer have a minimum bend radius. If the bend radius of such a fiber, when lying along the centerline, would be too small, the capillary may be offset away from the center of curvature so that the bend radius for the fiber is larger. Although the fiber would no longer be centered in the extrudate, this may be acceptable.

FIGS. 40(a), 40(b), 40(c), and 40(d) depict in plan view the behavior of an external capillary used in some embodiments. As shown, as the nozzle moves through a U-shaped path in FIGS. 40(a), 40(b), 40(c), and 40(d), the capillary axis is reoriented to remain substantially parallel to the nozzle velocity vector (or if the printed object is moving, then substantially parallel to the object movement). More precisely, the longitudinal axis of the capillary lumen nearest the nozzle is maintained in a plane that is perpendicular to the substrate, substantially coincident with the nozzle axis, and substantially parallel to the component (in the plane parallel to the substrate) of the instantaneous velocity of the nozzle relative to the substrate.

Figure 41A:
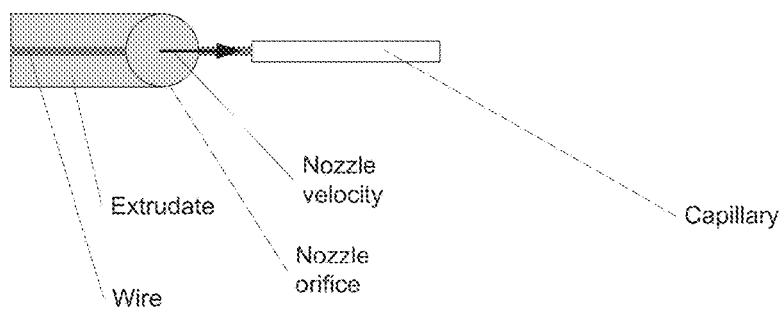
FIGS. 41(a), 41(b), 41(c), and 41(d) illustrate a nozzle moving along a straight line and curved lines.
Figure 41B:
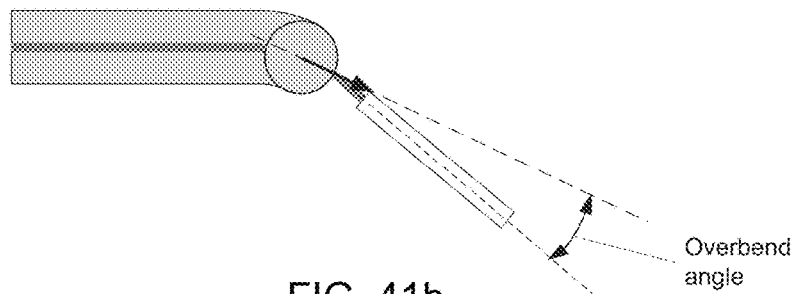
Figure 41C:
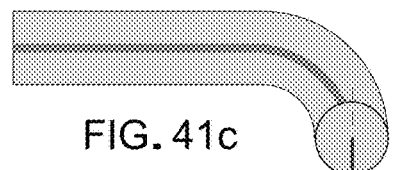
Figure 41D:
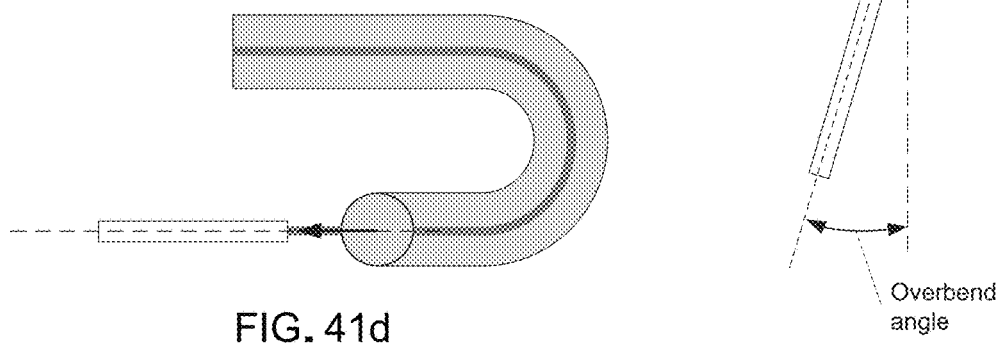

As already described with respect to FIG. 39, in which an internal capillary is offset to compensate for wire springback, an external capillary such as that shown in FIGS. 40(a), 40(b), 40(c), and 40(d) may in some embodiments use the approach to reducing spring-back shown in FIGS. 41(a), 41(b), 41(c), and 41(d). In FIG. 41(a), the nozzle is travelling along a straight line and the capillary is parallel to the nozzle velocity vector. However, in FIG. 41(b), the nozzle is travelling in a curved path. While the wire may be soft and ductile (e.g., annealed nickel, copper, gold, aluminum, silver), spring-back may still be an issue. To over-bend the wire and reduce spring-back, in some embodiments, the capillary may be over-rotated through an "overbend angle" relative to the velocity vector, and/or in some embodiments, the capillary may be translated in such a way as to over-bend the wire. If in lieu of the nozzle moving in the X/Y plane, the nozzle is stationary and the fabricated object is translating and rotating, then the object would normally be rotated as it translates in X and Y. Without overbend compensation, the rotation angle may be that which makes the X/Y velocity vector parallel to the capillary. With overbend compensation, the angle would be larger by the overbend angle, providing additional rotation toward the center of the curved path. Thus if the path is S-shaped, the rotation might be first more clockwise than needed to make the capillary parallel to the velocity vector, and later, more counterclockwise. The overbend angle may vary with the radius of the curve (e.g., increase with decreasing radius, to provide additional overbending). In some embodiment variations, the capillary is translated laterally as well as, or in lieu of, over-rotating. Approximate translation along the Y axis can be achieved, for example, with the capillary of FIGS. 29(b), 30(a), 30(b), and 30(c), by twisting the capillary about an axis parallel to its straight section. In some embodiments, overbending or pre-stressing of the wire may be achieved by rotating (continuously or intermittently) either the inner guide or hole, outer guide or hole, or both, using a nozzle similar to that shown in FIGS. 35-36. In some embodiments, adjusting nozzle speed when forming extrudates of different radii can help to ensure the wire remains in the desired position and with the desired (e.g., zero) residual stress. Other methods of correcting for wire position within the extrudate include changing the wire feed rate as a function of extrudate radius.

FIG. 42 is an isometric schematic view of apparatus used in some embodiments wherein the printhead moves in the Z direction and the platform on which the object is built rotates and translates in X and Y. The apparatus comprises linear X-axis and Y-axis stages stacked in an X/Y configuration and capped by a build platform. These are rotated by a theta/rotary stage, with wiring to the X/Y stages provided through slip rings in some embodiments. Also provided, and mounted on the same frame (not shown) as the theta stage, is a linear Z-axis stage to which a printhead with nozzle is mounted through a support bracket. In some embodiment variations, two Z-axis stages may be provided, with the printhead mounted on a member raised and lowered by both stages. In some embodiment variations, the axis of rotation of the theta stage is set to correspond to the axis of the nozzle (or more precisely, the theta rotation axis is made coaxial with the axis of the (typically cylindrical) nozzle orifice). If so, then rotation of the fabricated object is equivalent to a rotation of the printhead about its axis, in terms of relative motion. Thus, for example, an asymmetric nozzle such as in FIG. 35 or 38(a), or an external capillary as in FIGS. 30(a), 30(b), and 30(c) is provided, then rotation of the theta stage may be used to achieve the desired relationship between the nozzle orientation or capillary axis to the instantaneous velocity of the fabricated object, as determined by the motion of the X/Y stages. However, in some embodiment variations, the axis of the theta stage is offset from the nozzle axis. When depositing portions of the object having no embedded filament (e.g., polymer alone) using an asymmetric printhead (e.g., having at least one external capillary, or having a capillary parallel but not collinear with the nozzle axis), no rotation may be necessary, and the X/Y stages provide the primary motion when forming a layer.

Figure 43:
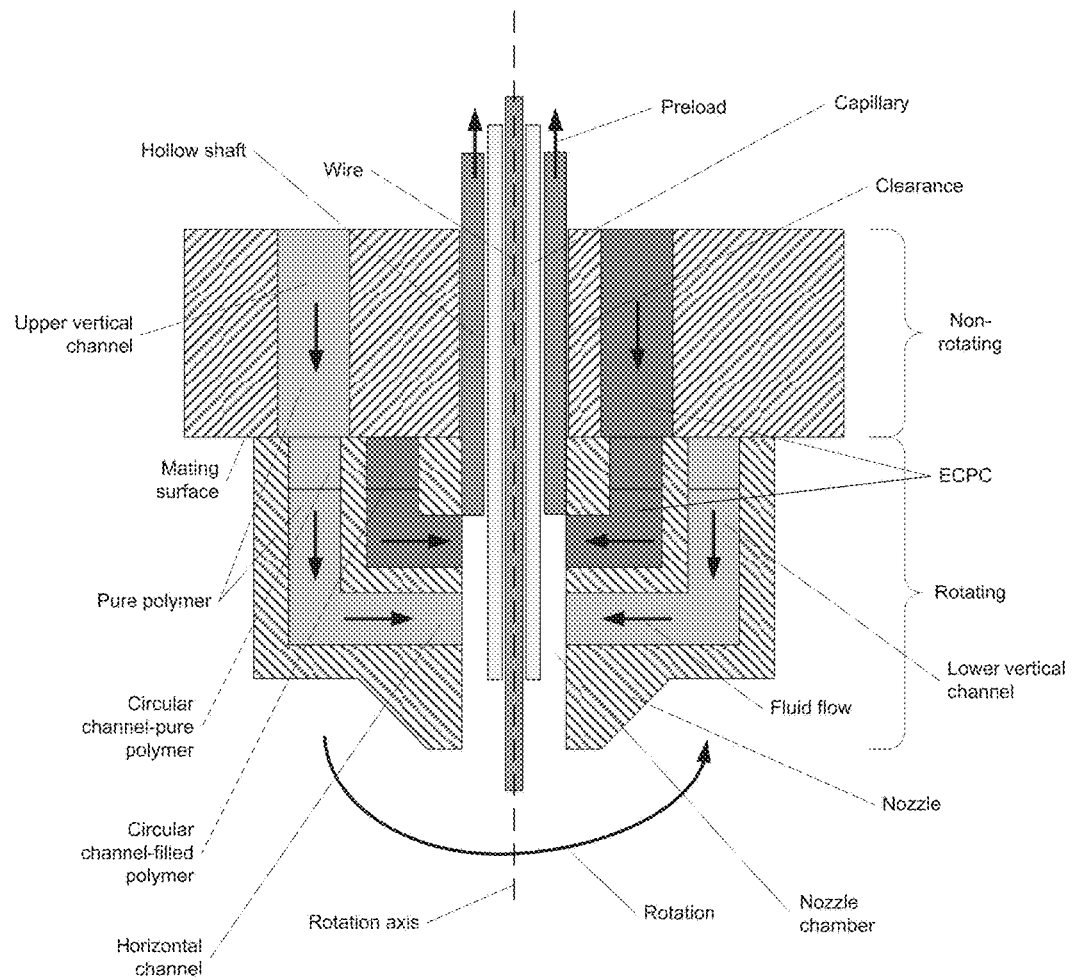
FIG. 43 depicts a cross-sectional elevation view of a printhead.

In some embodiments wherein the nozzle or an associated component of the printhead must rotate to remain at the same orientation to the extrudate path as it follows a curve (e.g., when the nozzle is asymmetric as in the embodiment shown in FIG. 35 and the fabricated object is not rotated as with the embodiment of FIG. 42), a printhead having a spinning nozzle may be used. FIG. 43 depicts a cross-sectional elevation view of such a printhead, in this example one configured to deliver two materials-pure polymer and ECPC; the printhead also incorporate a capillary coaxial with the nozzle to deliver wire. The upper, non-rotating portion of the printhead comprises two vertical channels and/or liquifiers through which the two materials can each flow downwards toward the interface between the upper and lower portion of the printhead. The lower portion has two concentric, circular channels on its upper, mating surface—one for the pure polymer and one for ECPC. This surface, along with the lower mating surface of the upper portion may be machined (e.g., ground or lapped) to be very flat and smooth, minimizing leakage between upper and lower portions. Or in some embodiment variations, O-rings or other seals may be used. To keep the two portions in intimate contact and guide the rotation of the lower portion, in some embodiment variations a hollow shaft fit into the lower portion passes through a bore in the upper portion (which may be lined with a suitable bushing material), where it can be preloaded upwards (e.g., using a spring), pulling the lower and upper portions together. Though the hollow shaft the capillary and wire can pass en route to the nozzle chamber. Fluid entering the circular channels normally fills the entire annular space of the channels. Each circular channel communicates with at least one lower vertical channel which itself communicates with a horizontal channel (the horizontal channel can be drilled from the outside and partially plugged, or the lower portion may be fabricated using additive manufacturing). Fluid exiting the horizontal channels enters the nozzle chamber, from which it is extruded. The lower portion is free to rotate as needed, driven, for example, by a belt or drive gear (neither shown).

Figure 44:
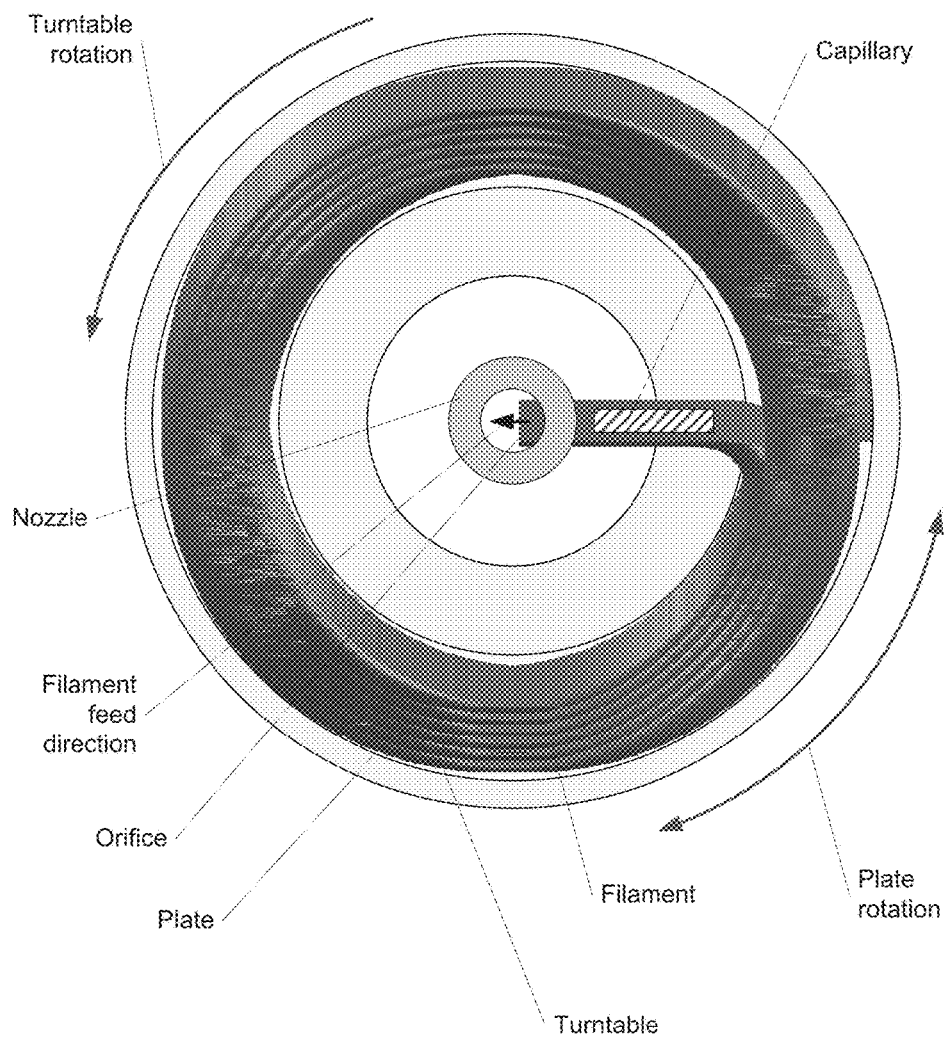
FIG. 44 depicts a plan view of a printhead.

In some embodiments wherein at least one external capillary is used (e.g., when the fabricated object is not rotated as with the embodiment of FIG. 42) the capillary and supply (e.g., spool) of filament may be rotated around the nozzle (by a suitable actuator) as is needed to orient the capillary (e.g., FIGS. 40(a), 40(b), 40(c), 40(d), 41 (a), 41(b), 41(c), and 41(d)). FIG. 44 depicts a plan view of a printhead (many components of which are omitted for clarity) wherein the filament supply is in the form of a coil surrounding the nozzle. A benefit of this configuration vs. using a spool of material to one side of the nozzle is the relatively well-balanced rotating element and the relatively large bending radius of the filament that is practical, facilitating use of filaments which cannot tolerate or become distorted by bending with a small radius, such as optical fibers. Moreover, such an arrangement avoids excessive plastic deformation (and residual stress) of soft filaments (e.g., annealed Ni wire) by maximizing the wire coil diameter. In some embodiment variations, a plate supports the coil, and the capillary is fixed to the plate. To re-orient the capillary, the plate is rotated. As filament is pulled through the capillary (if anchored) and/or fed (e.g., by a mechanism similar to that of FIGS. 32(a) and 32(b)) toward the nozzle and cut to length (e.g., by a mechanism similar to that of FIGS. 33(a), 33(b), 33(c), 33(d), and 33(e)), it is drawn from the coil into the capillary. In some embodiment variations, as shown in the figure, the coil of filament is supported by a turntable which rotates independently of the plate (e.g., on a bearing) as filament is fed, minimizing frictional drag between coil and plate.

Figure 45A:
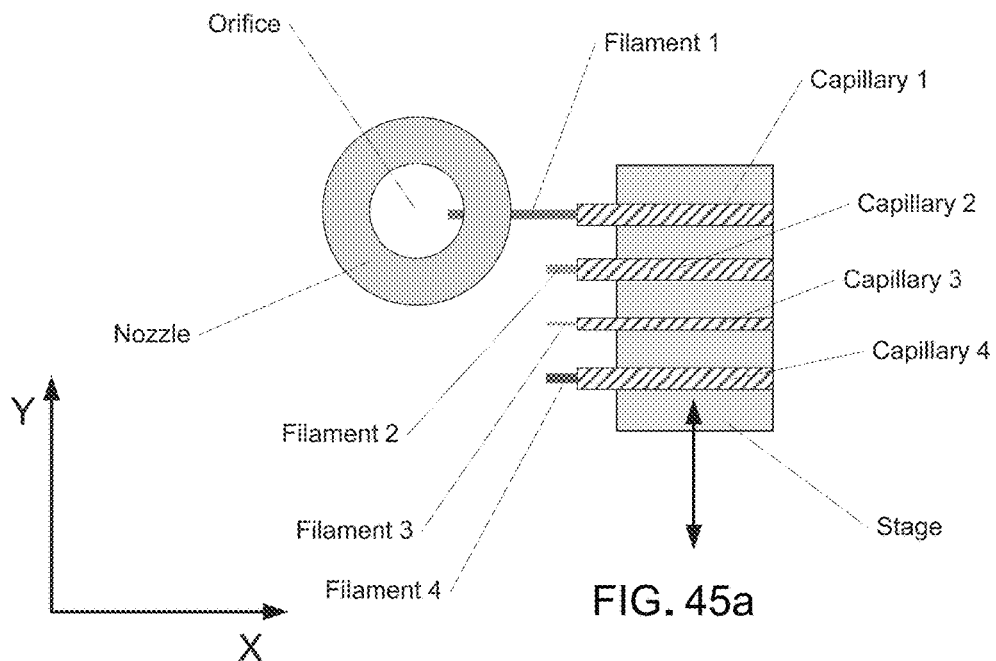
FIGS. 45(a) and 45(b) depict plan views of printheads having multiple external capillaries delivering multiple filaments.
Figure 45B:
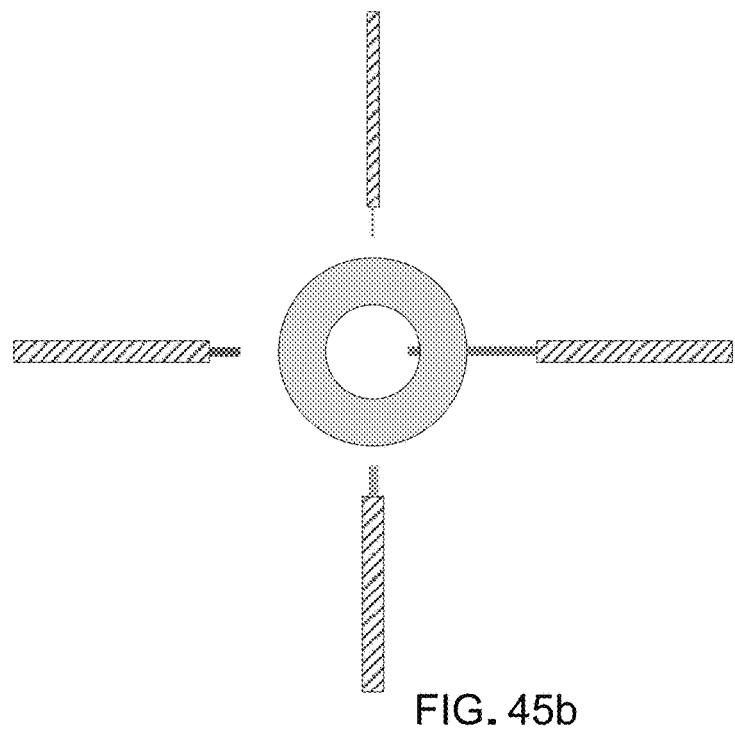

FIG. 45 are plan views of printheads (of which many components, such as filament supply spools, are omitted for clarity) having multiple external capillaries delivering multiple filaments to allow fabrication in some embodiments using multiple filaments (e.g., multiple filaments incorporated into a single fabricated object). While multiple capillaries can be incorporated within the nozzle in some embodiments, there is generally more space available for this when the capillaries are external. In the figure, four capillaries are provided, each with a different filament; in practice, fewer or more capillaries can be used. A wide variety of such filaments, both metal and nonmetal, can be used such as copper wire for coils, nickel wire for magnetic cores and armatures, optical fiber for lighting and communication, glass or carbon fiber (individual fibers or tow) for mechanical properties enhancement, coaxial cable for high-frequency or noise-sensitive signal transmission, and resistance wire such as nickel-chromium or carbon fiber for heating or to form resistors needed in circuits and devices. In some embodiments objects may be affixed to wire (in some cases shaped like beads which surround the wire) and become embedded/encapsulated along with them. Different sizes and shapes (e.g., rectangular, square, circular, elliptical) may also be used. In FIG. 45(a), a linear stage that can move along the Y axis allows the capillaries to be brought into alignment with the nozzle, one at a time. In some embodiment variations, a rotary stage can be used instead, with the capillaries arranged at different orientations, pointing outwards (e.g., in a turret configuration). In FIG. 45(b), the multiple capillaries are arranged at different orientations surrounding the nozzle. In some embodiment variations (e.g., those in which the fabricated object does not rotate), the capillaries may be rotated relative to the nozzle both to a) select the capillary required at a given time, and b) to orient the capillary relative to the nozzle velocity vector. For example, parallel to it as in FIGS. 40(a), 40(b), 40(c), and 40(d), or at the overbend angle as in FIGS. 41(a), 41(b), 41(c), and 41(d). In some embodiment variations (e.g., with the configuration of FIG. 42), the capillaries of FIG. 45(b) do not rotate relative to the nozzle; rather, the fabricated object rotates relative to the capillaries, both to a) select the capillary required at a given time, and b) to orient the capillary relative to the nozzle velocity vector. In the configuration of FIG. 45(b), in some embodiment variations, multiple filaments can be coiled to surround the nozzle as with FIG. 44. In some embodiments, cores and other elements such as in FIG. 12 may be wound using wire from capillaries that are not aligned with the nozzle, such as Capillary 4 in FIGS. 45(a) and 45(b).

FIGS. 46(a), 46(b), and 46(c) are plan views illustrating a rectangular nozzle orifice used in some embodiments. While round orifices are typically used in FDM since they produce similar extrudate widths regardless of the direction of nozzle (or fabricated object) motion, with the ability to rotate the nozzle (e.g. as in FIG. 43) or the fabricated object (e.g., as in FIG. 42), the use of nozzles that are not rotationally symmetric becomes feasible and useful in some embodiments. For example, a rectangular nozzle can be used to produce an extrudate with sidewalls that are flatter than are produced by a circular nozzle, which tends to produce curved sidewalls. A vertical wall comprising multiple layers of extrudate normally exhibits a roughness associated with the curved sidewalls. Such a wall, when built from extrudates with flatter sidewalls, can be significantly smoother. Another benefit of flat sidewalls is improved visualization of filament embedded within the extrudate, with less refractive distortion. Thus, measurement in real time of filament vertical position within the extrudate by imaging the filament with a video microscope through the sidewall may be accomplished more easily, facilitating dynamic, closed-loop adjustment of the position. In FIGS. 46(a), 46(b), and 46(c), a nozzle with a rectangular orifice having different width and height is shown, illustrating another feature of rotationally asymmetric nozzles: the ability to vary extrudate width. FIG. 46(a) shows a rectangular orifice which is oriented so its narrower dimension is perpendicular to nozzle motion, while FIG. 46(b) shows the same orifice oriented so its wider dimension is perpendicular to nozzle motion. As can be seen, the width of the extrudate can be varied widely. It can be useful, for example, to deposit a narrow extrudate to better define small features, while depositing a wide extrudate when only larger features are needed, or to rapidly fill in broad regions (e.g., the internal volume of the fabricated object, or an up- or down-facing horizontal surface, or to adjust the amount of polymer "insulation" on the wire (e.g., reducing the insulation thickness to allow thinner layers or for coils, allowing for more turns). FIG. 46(c) shows the orifice oriented relative at an angle between the angles of FIGS. 46(a) and 46(b), such that the extrudate width is intermediate in width and a function of the angle A. in some embodiment variations, rather than a rectangular orifice, other shapes may be used, such as ellipses.

Figure 47A:
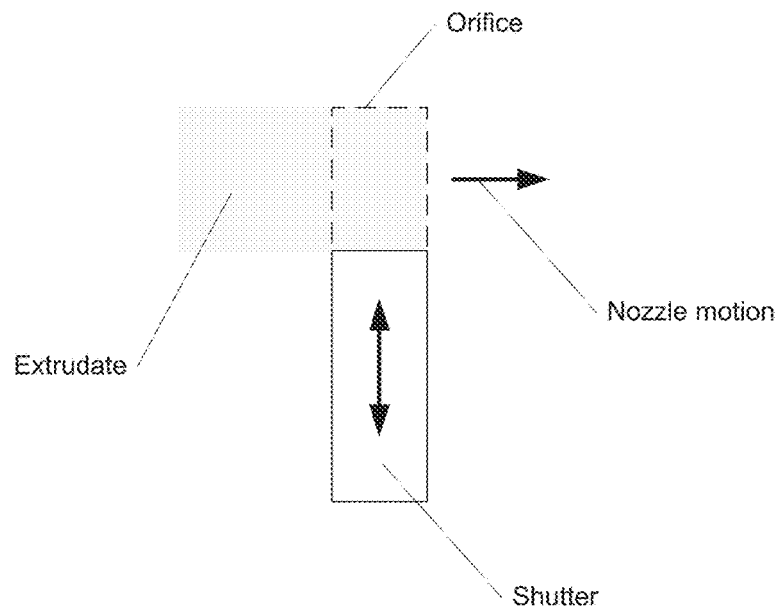
FIGS. 47(a) and 47(b) are plan views depicting another orifice used in some embodiments that is not rotationally symmetric.
Figure 47B:
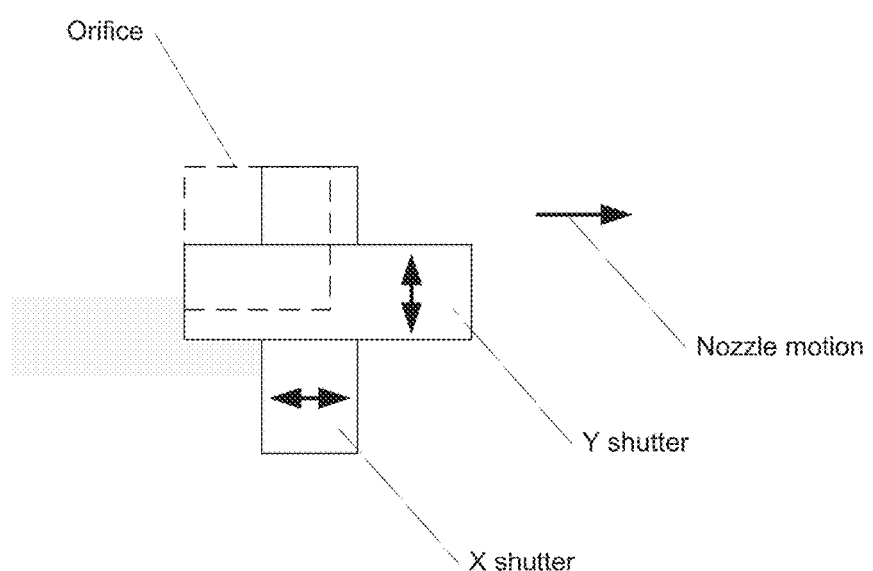

FIGS. 47(a) and 47(b) are plan views depicting another orifice used in some embodiments that is not rotationally symmetric, in this case rectangular and equipped with at least one sliding shutter. While multi-leaf camera lens-like diaphragms are difficult to implement due to the small size required, as well as freedom from leakage and mechanical reliability, if the orifice is asymmetric, a single sliding shutter as in FIG. 47(a) can be used to regulate extrudate width. If desired, a second shutter may be incorporated as in FIG. 47(b).

Figure 48:
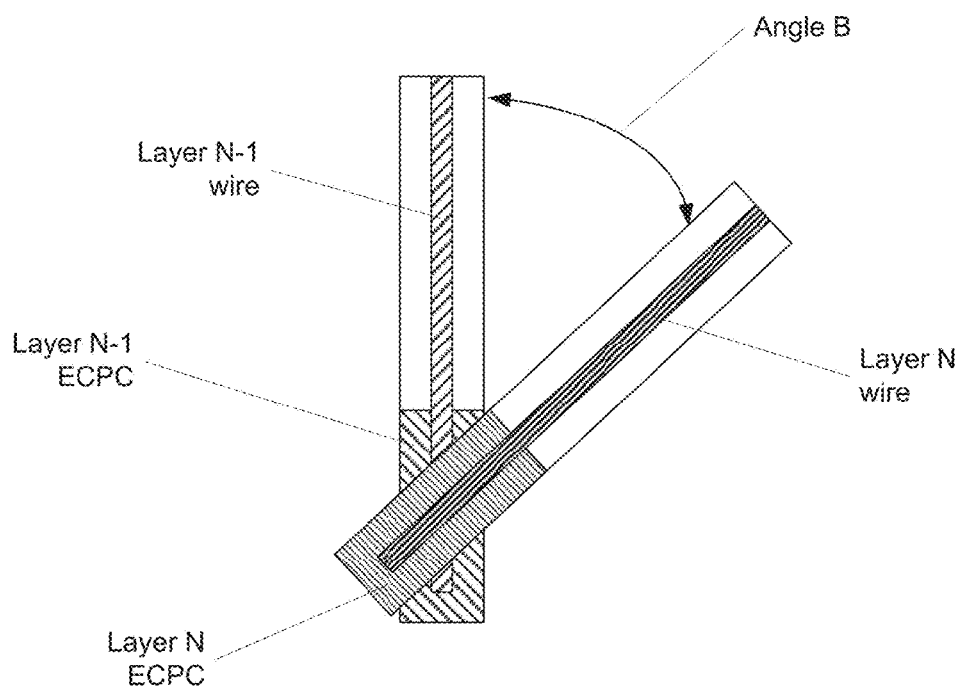
FIG. 48 illustrates in plan view a junction used in some embodiments in which the wires are parallel.

As already described, vertical, Z-axis junctions between wires may be produced by overlapping regions of ECPC on adjacent layers. FIG. 48 illustrates in plan view a junction used in some embodiments in which the wires are parallel, but are separated by an angle B, which can range from 0 to 360°. The ECPC regions associated with these wires are themselves not parallel, yet overlap sufficiently to provide adequate conductivity. ECPC regions may be rectangular as shown, or may have alternative shapes, e.g., circular.

Figure 49:
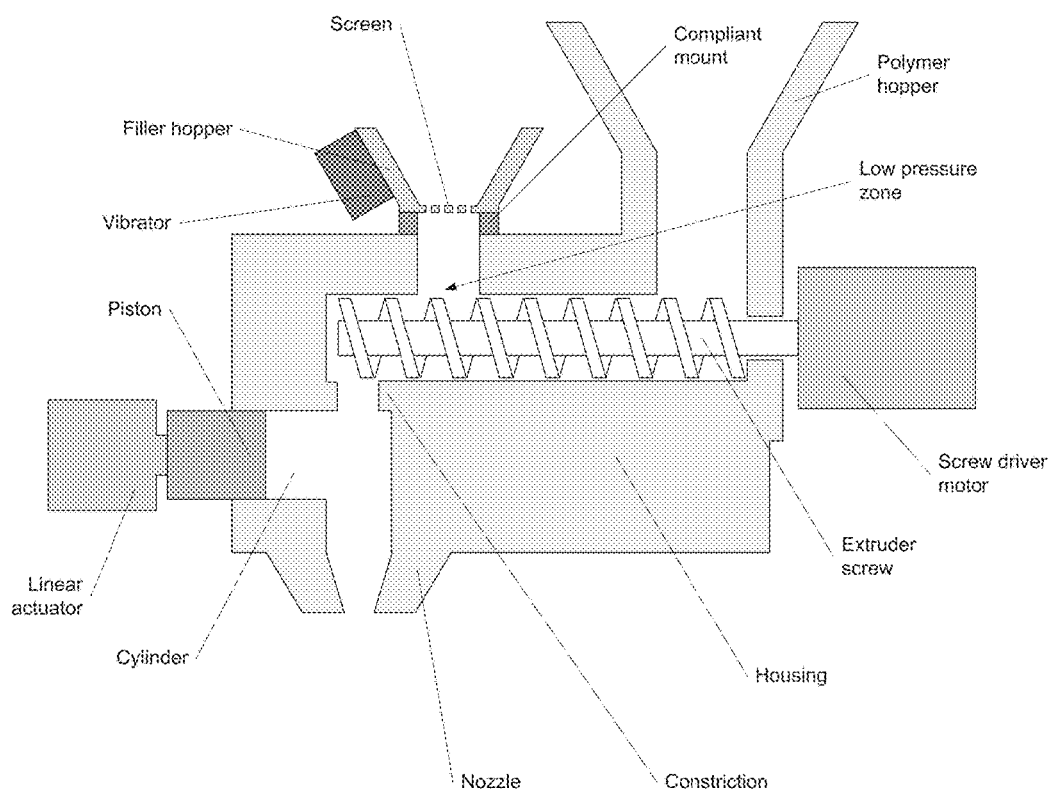
FIG. 49 depicts a cross-sectional elevation view of a printhead.

FDM using very soft elastomers (e.g., 5-60 Shore A durometer) can be challenging if the material is provided in conventional filament form, fed into a liquifier by rollers as is conventionally the case. As has been described in [Elkins 1997], soft filaments may buckle when pushed by the rollers, a problem exacerbated if there is any softening of the material prior to entering the liquifier. A requirement for extruders is FDM is the ability to precisely control feed rate, as well as the ability to retract (i.e., suck back) the extrudate, as may be done before making jumps from one X/Y location on the layer to another. In some embodiments, alternative extruders for FDM printheads which are able to extrude very soft thermoplastic elastomers may be used. FIG. 49 depicts a cross-sectional elevation view of a printhead used in some embodiments based on a screw extruder that comprises a hopper for polymer (e.g., in pellet, powder, or granule form), a screw turned within a barrel by a motor, and a nozzle (e.g., below the screw). In some embodiment variations an actuated piston is provided within a cylinder between the screw and nozzle orifice. Retraction of the piston creates suction that retracts molten material within the nozzle, providing retraction. In some embodiments, in lieu of a piston and cylinder, a diaphragm, bellows, screw, or other means of rapidly creating a volumetric change or suction may be used. In some embodiment variations, a constriction is provided between the screw and piston such that retraction of the piston preferentially causes inward movement of material in the nozzle, and less so movement of material surrounding the screw. In some embodiment variations (e.g., to extrude ECPC, the barrel is vented in a region after the polymer has substantially melted, in a lower pressure region of the screw. In this region, a hopper containing powder above a screen is provided; a vibrator may be attached to the hopper, along with a compliant mount (e.g., a bellows, or the hopper itself may be compliant) such that when the vibrator is actuated, powder steadily flows through the screen, but not otherwise. Powder thus is mixed with polymer by the screw prior to extrusion. Using such apparatus, powder may be incorporated into polymer only where ECPC is needed, otherwise extruding pure polymer. Powder can be introduced by the control system "looking ahead" in the data file that controls the fabrication process to determine where ECPC is needed, since there is a delay from the moment powder is introduced until ECPC is extruded. Polymer composites with variable concentrations of powder may also be delivered in some embodiment variations; e.g., using variable amounts of conductive powder to fabricate resistors with different resistivities, sensitive strain gauges (e.g., for robot joint position feedback) whose concentration of powder is in the steep region of the conductivity vs. concentration curve, or using variable amounts of another powder to locally change the strength or elastic modulus of the polymer.

Figure 50:
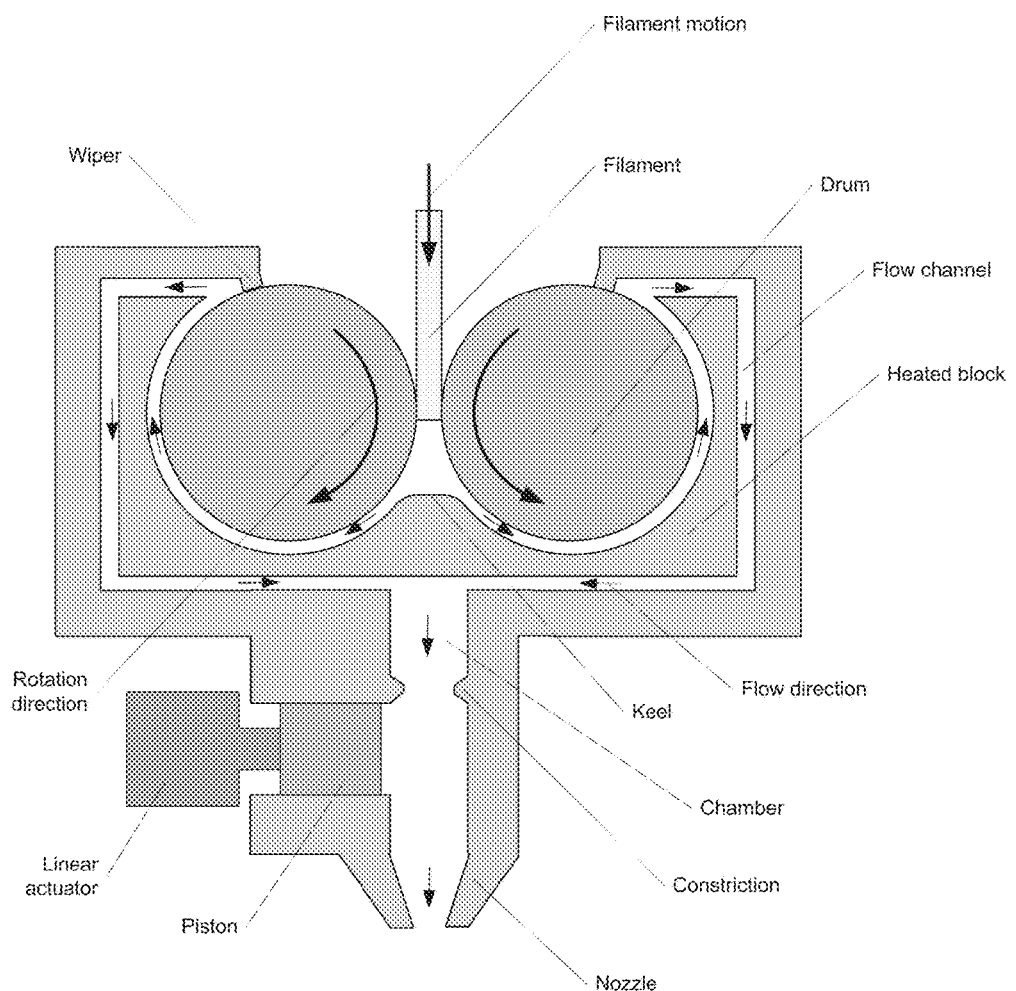
FIG. 50 depicts a cross-sectional elevation view of a printhead comprising a double-drum extruder intended for use in FDM of soft elastomers.

FIG. 50 depicts a cross-sectional elevation view of a printhead used in some embodiments comprising a double-drum extruder intended for use in FDM of soft elastomers. Filament is preferably provided in flat, substantially rectangular ribbon form, though filament with circular or other cross-sectional shapes can also be used. The filament is drawn into the heated block of the extruder by the motion of two counter-rotating drums. These may in some embodiment variations be cooled so as to avoid prematurely softening the filament by contact with the drums, potentially reducing traction on the filament. Filament brought into contact with the heated block, e.g., at a keel, is melted and transported by viscous drag around one drum or the other until it reaches a wiper. Molten polymer then continues to flow through flow channels until it reaches a common chamber on its way to the nozzle. In some embodiment variations, an actuated piston and cylinder are provided between chamber and orifice as in FIG. 49 for polymer retraction, while in some embodiments drum rotation is reversed. In some embodiment variations a constriction is also provided to allow the piston to preferentially retract polymer in the nozzle.

In some embodiments, especially those using very soft materials such as Chronoprene with a durometer of 5 Shore A, polymer filament with a cross-sectional area comparable to that of extrudate and having a pre-embedded wire of small diameter is provided, such that by pulling on the wire, the filament can be fed into the printhead. In regions of the part in which no wire is desired, the wire can be spooled up or ejected. In some embodiments, materials are pulled into the liquifier by pressurizing the material supply and/or at least partially evacuating the build chamber.

Figure 51A:
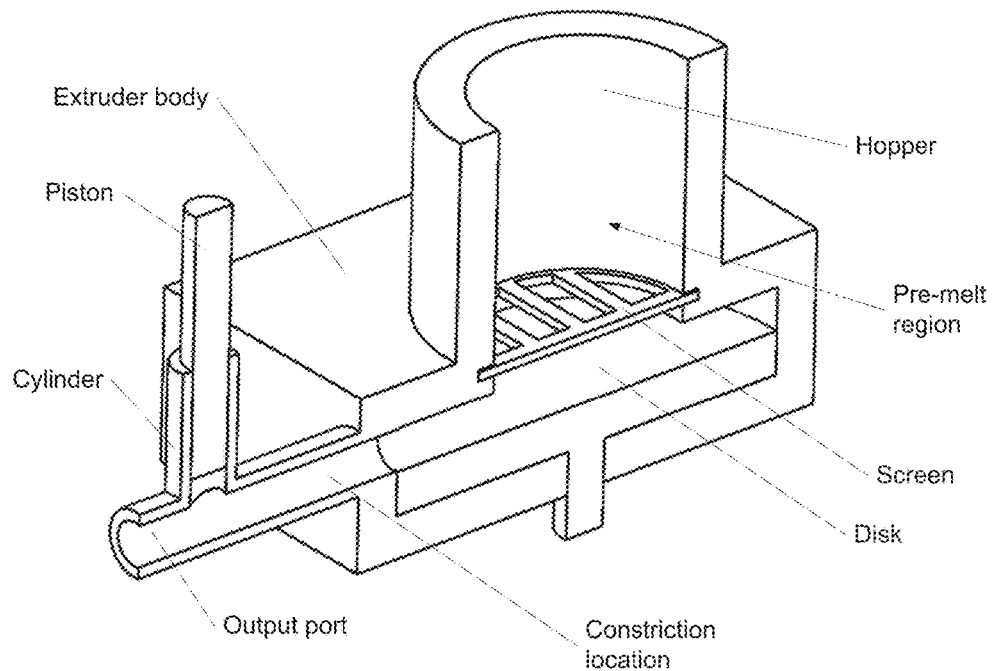
FIGS. 51(a) and 51(b) depict cross-sectional isometric views of a centrifugal extruder.
Figure 51B:
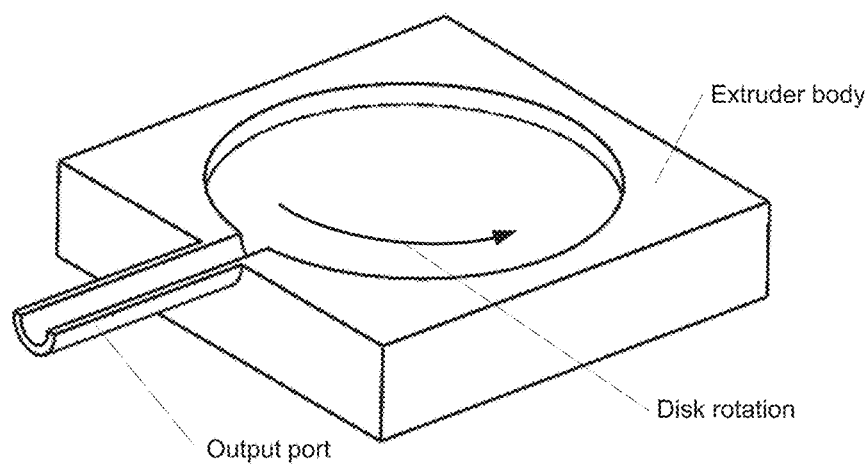

FIG. 51 depicts cross-sectional isometric views of a centrifugal extruder used in some embodiments, either as a part of a printhead, or for the creation of filament. FIG. 51(a) is a cross-sectional isometric with a vertical cross-section plane, while in FIG. 51(b) the plane is horizontal. The centrifugal extruder comprises an extruder body, a hopper for pellets or other polymer feedstock, a rapidly-spinning disk, and an output port. In some embodiment variations, the lower part of the hopper comprises a pre-melt region with heating, and a porous screen, such that feedstock is prevented from reaching the disk until it is at least partially melted and passes through the screen. In some embodiment variations the disk, extruder body, and/or output port are heated. Material reaching the surface of the disk is propelled to the edges of the disk by centrifugal force, where it may be further melted by contact with the extruder body walls. Melted material is also propelled out of the output port. In some embodiment variations, powder additives (e.g., metal powder) may be added (e.g., sprinkled onto) the molten material as it forms a relatively thin layer on the rotating disk, assisting with mixing. In some embodiment variations, the surface of the disk in contact with the polymer is provided with features (e.g., vanes, pins) that slow the motion of the polymer toward the disk edge, promoting mixing and/or melting. In some embodiment variations in which the centrifugal extruder is used in an FDM printhead, an actuated piston and cylinder are provided between disk and output port (leading to a nozzle) for polymer retraction, and in some embodiment variations a constriction is also provided between disk and piston to allow the piston to preferentially retract polymer in the nozzle.

Figure 52:
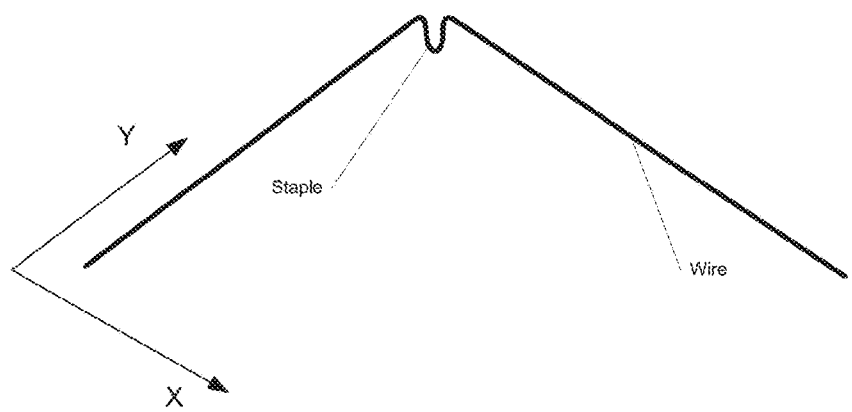
FIG. 52 depicts an isometric view of a wire that is "stapled".

FIG. 52 depicts an isometric view of a wire that is "stapled" according to some embodiments. The "staple" comprises a bent region of the wire that causes it to descend into at least one previous layer (not shown) and then return, thus anchoring it well. In some embodiment variations, staples are used to better anchor wire when the extrudate (not shown) must turn a sharp corner or in general, conform to a smaller radius. The staple may be more gradual than that shown in the figure. Wire may be formed into staples by the vertical motion of a capillary through which it passes. Stapling is used in some embodiment variations to provide an electrical connection between wire in the current layer and that in another layer, e.g., by locating the staple in ECPC in the previous layer(s). In some embodiment variations, staples are used to better constrain wire that is stressed, forcing it into the desired shape, and distributing the stress over multiple layers.

FIGS. 53(a), 53(b), 53(c), 53(d), and 53(e) depict cross-sectional elevation views of an anchoring method used in some embodiments to anchor the end of wire within a previously-formed layer (layer N−1) (e.g., in a region filled with ECPC). In FIG. 53(a), a wire is provided within a capillary; the capillary may be oriented vertically as shown, or non-perpendicular to the layer. In FIG. 53(b), the wire has been bent at least slightly by contact with a fixed stop (e.g., by moving the printhead horizontally). In FIG. 53(c), the wire has been further bent by lowering the capillary and wire so as to press the latter against the previous layer (or by further action of the stop). In FIG. 53(d), the capillary has been lowered into the previous layer, forcing the wire to bend into a hook/barb/"J" shape. In general, the penetration of wire into polymer may be enhanced by heating the wire (e.g., by heating the capillary) enough to allow for cooling of the wire before penetration, vibrating it, and/or twisting it (e.g., by twisting the capillary or printhead). Penetration of the capillary into the polymer, as a means of delivering the wire for anchoring, may be enhanced by heating the capillary, twisting it, vibrating it, and provided a sharp and/or toothed penetrating tip. Finally, in FIG. 53(e), the capillary has been withdrawn over the wire, leaving the wire securely anchored in the previous layer by virtue of the shape of the end of the wire resisting extraction.

In some embodiments using an external capillary, the wire emerging from the capillary may be forced into the previous layer by a needle (e.g., with a groove/bifurcated tip to accept the wire) which penetrates into the previous layer. The needle may be heated, vibrated using ultrasonic energy. It may be located between the capillary and the nozzle centerline.

FIGS. 54(a), 54(b), 54(c), and 54(d) depict cross-sectional elevation views of an anchoring method used in some embodiments to help anchor the end of wire within the current layer, which may be useful, especially with an external capillary. In FIG. 54(a), a wire extends from a capillary. The wire may be horizontal as shown (e.g., passing through an external capillary), or oriented at another angle. In FIG. 54(b), the wire has been squeezed between two parts of a die, which may include internal features that can plastically deform the wire. In some embodiment variations, the die is attached to the machine, e.g., off to the side of the build area, such that the printhead can move to reach it. In other embodiment variations, the die may be fastened to the printhead (e.g., it may be positioned above the bottom of the nozzle as in FIGS. 30(a), 30(b), and 30(c) such that when the capillary is retracted the wire can be extended into the die and the die closed. In FIG. 54(c), the wire has been removed from the die, and is now deformed into a non-straight shape. In FIG. 54(d), the wire end is embedded in polymer which has been deposited around it; the shape of its end anchors the wire, resisting pull-out. Moreover, the deformed shape of the wire can increase contact area with the ECPC.

Figure 55A:
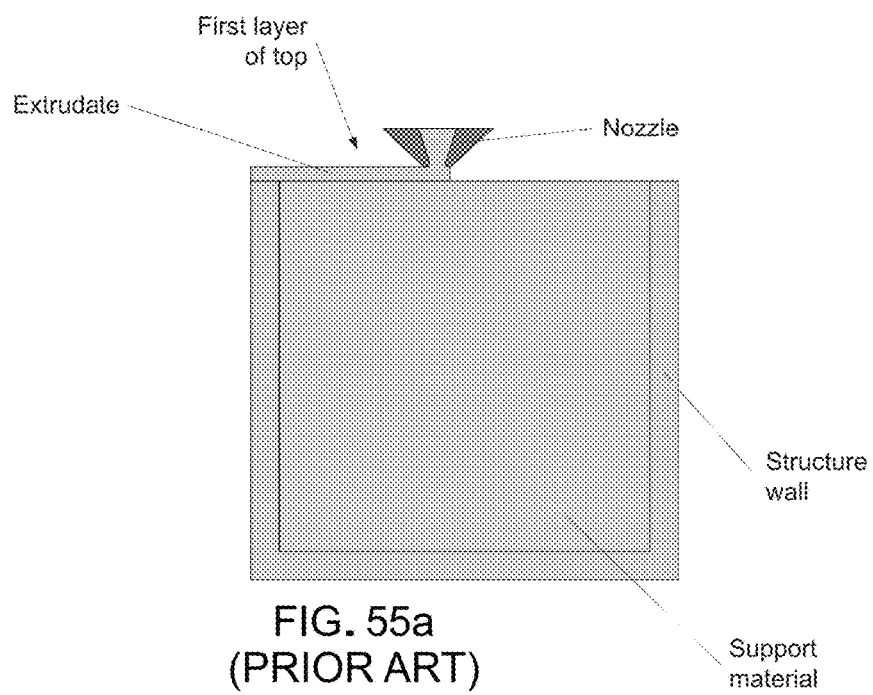
FIGS. 55(a) and 55(b) depict two cross-sectional elevation views of a fabricated object.
Figure 55B:
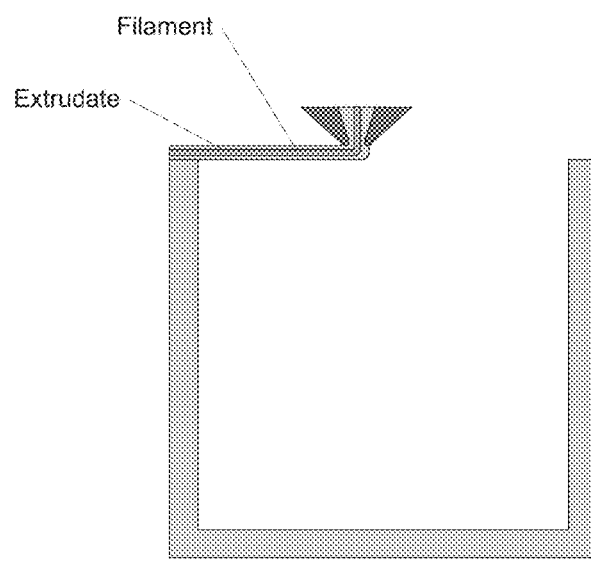

FIGS. 55(a) and 55(b) depict two cross-sectional elevation views of a fabricated object such as a cube in the process of being fabricated. In the prior-art FDM process shown in FIG. 55(a), extruding structural material to form the top of the cube requires that either structural material (later removed) or support material (e.g., soluble) be provided within the cube so as to provide a substrate onto which the extrudate can be deposited. In contrast to this, FIG. 55(b) depicts fabricating the top of the cube using a bridging method according to some embodiments, wherein a filament is simultaneously embedded and incorporated into the extrudate as material issues from the nozzle. The filament is typically under a slight tension, and by virtue of its mechanical strength, and the tendency of the molten material to cling to it due to surface tension and viscosity effects, the molten material can solidify around the filament without sagging or simply falling into the open space below. Indeed, materials with viscosities that are typically too low to extrude well such as waxes and molten metals may be co-extruded with a filament to which they cling and which controls their shape and position. In some embodiment variations, this effect is exacerbated by using a filament of high thermal conductivity, or which is cooled prior to delivery, or which is in the form of a tube that is actively cooled by circulating fluid. The filament may have useful properties other than supporting the extrudate; it may also provide electrical circuitry, for example. This unique capability of FEAM to bridge open spaces without the need for structural support enables layered fabrication with fewer or no supports, speeding up both the fabrication and support removal processes, reducing material usage and waste, and reducing cost. It can also enable new geometries, e.g., structures with shapes for which support removal is difficult or impossible. For example, fluidic chambers, channels, and manifolds may be easier to build this way. Reduced need for supports also helps to enable high volume production of objects, since support removal otherwise can be time-consuming and costly.

Figure 56A:
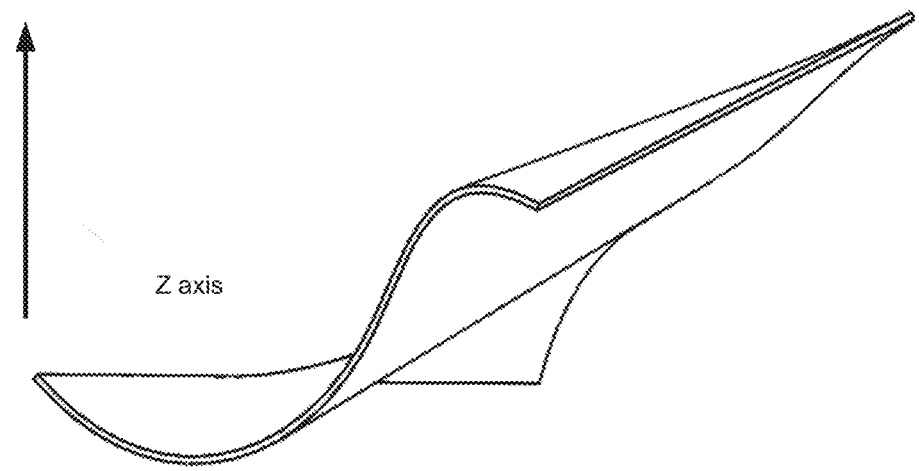
FIGS. 56(a) and 56(b) depict an isometric view of a curved 3-D structure.
Figure 56B:
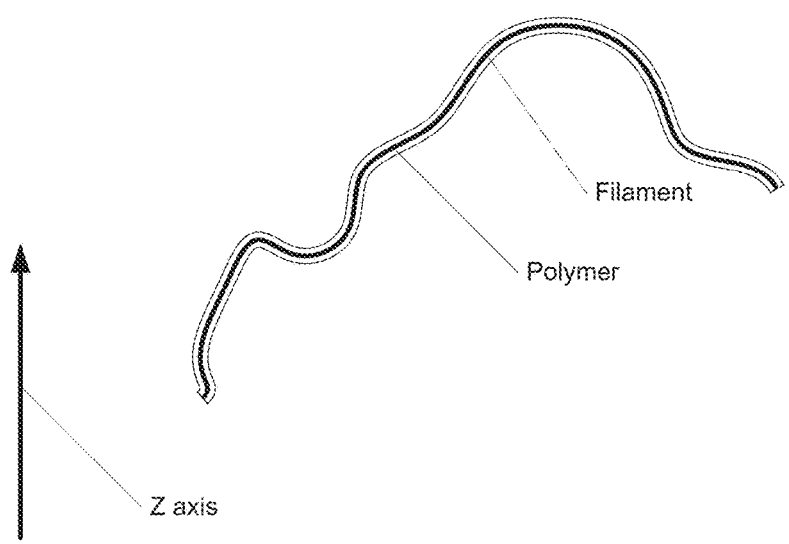

FIG. 56(*a*) depicts an isometric view of a curved 3-D structure that can be fabricated in some embodiments by moving the nozzle simultaneously in the X, Y, and Z axes. For example, the top of the shape in FIGS. 55(*a*) and 55(*b*) may, instead of being planar, be a curved structure such as this. To aid in the production of such shapes without supporting structures or support material, and/or to reinforce the extruded material, filament may be delivered where needed into the molten material as it is extruded, as in FIG. 55(*b*), resulting in a filament/polymer composite as in FIG. 56(*b*). The direction of the filament may be varied throughout the structure. In some embodiment variations, the wire may be bent in three dimensions (e.g., by a nozzle such as that of FIG. 36) to conform to the desired 3-D path. 3-D structures produced by this approach may comprise single layers, or comprise multiple layers, each having a similar shape, or a different shape (e.g., creating voids between layers). In some cases, non-planar structures can be stronger or stiffer than planar structures, require less support material, and be faster to fabricate. If they include conductive wire, they can also provide the required electrical paths with a minimal number of junctions, reducing overall resistance of the path. With the ability to create a composite such as that in FIG. 56(*b*) from wire and elastomer, comes the ability to create stretchable electronic circuits in which the wire and elastomer can undulate (e.g., in a serpentine manner) in the vertical plane and in complex 3-D configurations, not merely in one plane.

Figures 57A, 57B:
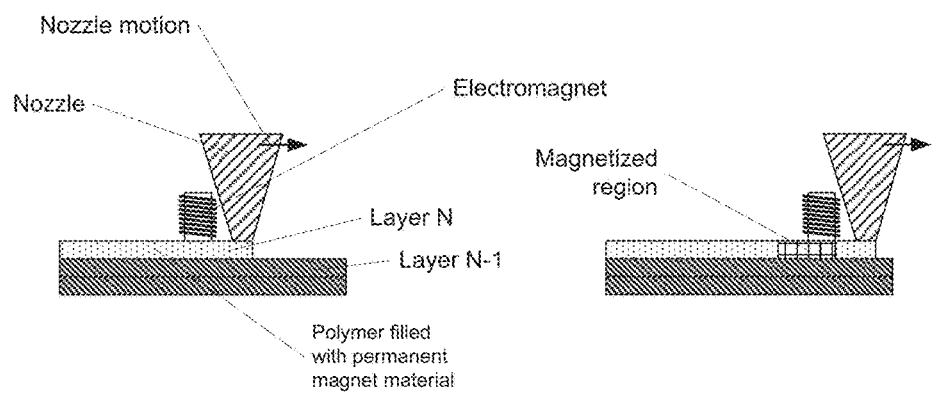
FIGS. 57(a), 57(b), 57(c), 57(d), and 57(e) depict elevation views of a method and apparatus used in some embodiments of magnetizing PMPCs.
Figures 57C, 57D, 57E:
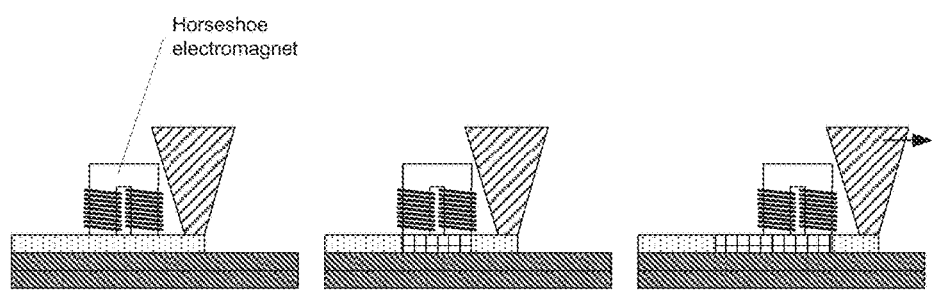

In some embodiments, PMPCs incorporated into an object may be magnetized after the object is fabricated, e.g., by placing at least part of the object in a strong magnetic field. FIGS. 57(*a*), 57(*b*), 57(*c*), 57(*d*), and 57(*e*) depict elevation views of a method and apparatus used in some embodiments of magnetizing PMPCs as they are deposited, either one or several layers at a time. This enables the creation of complex, additively-manufactured magnets, such as permanent magnets or electromagnetics with unusual pole configurations which can create complex magnetic fields (e.g., Halbach arrays) for actuators and sensors, or encode data (e.g., for remote identification such as RFID, or authentication/anti-counterfeiting). In FIG. 57(*a*) a nozzle is depositing a PMPC for layer N onto layer N−1. Located in the path of the nozzle is a cylindrical electromagnet; the location of this can be changed dynamically so as the nozzle executes a motion along a curve, the magnet is always over the already-deposited material. When current is passed through the electromagnet coil as in FIG. 57(*b*), a magnetized region of the PMPC, spanning one or more layers as desired, is produced in the vicinity of the electromagnet pole, with a desired north/south polarity. Thus, the object being fabricated can include volumes which are not magnetized, as well as those magnetized with either the North Pole pointing upwards or downwards. FIGS. 57(*c*), 57(*d*), and 57(*e*) show an alternative electromagnet in the shape of a horseshoe also producing magnetized regions. In this configuration, the magnetic flux passes out through one pole, through the PMPC, and back into the other pole. In some embodiment variations, to provide a return path for flux the layer underneath can contain a reasonably high concentration of soft magnetic material (but not necessarily be conductive) such as Fe or Ni particles. In some embodiments, two electromagnets are located on either side of the nozzle to magnetize the extrudate with a horizontal magnetization axis. In some embodiments, in lieu of a localized electromagnet, PMPC in one or more a layer may be magnetized after the layer is deposited, either heterogeneously or homogenously, by using a sliding or rolling "write" head, or a large magnetizer which simultaneously magnetizes PMPC on the entire layer.

Figure 58A:
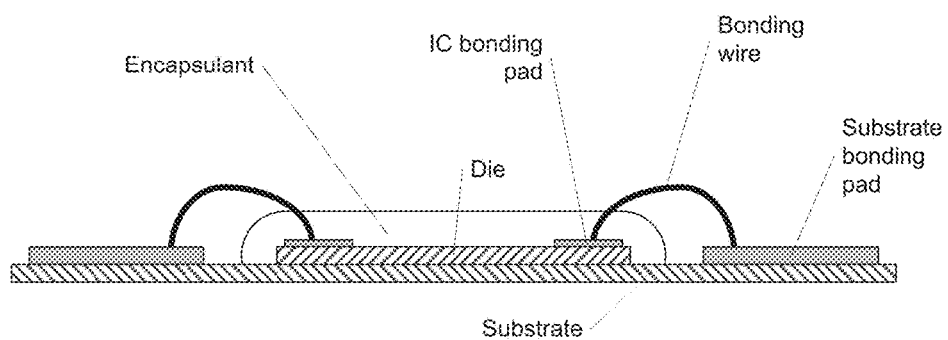
FIGS. 58(a), 58(b), and 58(c) depict cross-sectional elevation views of a method for embedding an integrated circuit.
Figure 58B:
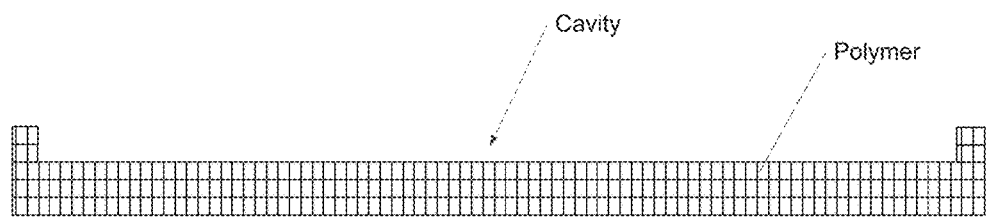
Figure 58C:
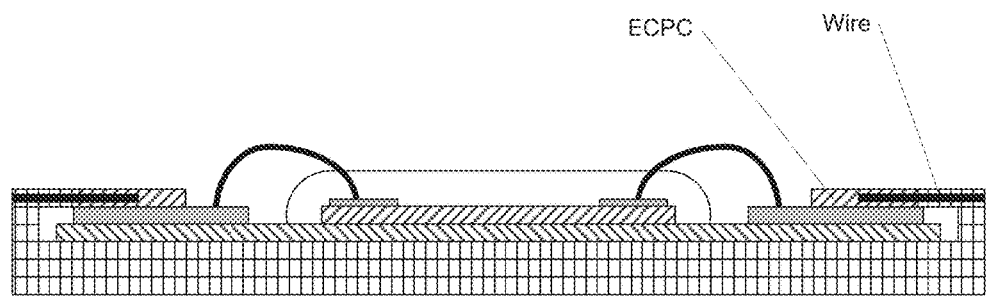

FIGS. 58(*a*), 58(*b*), and 58(*c*) depict cross-sectional elevation views of a method for embedding an integrated circuit such as a microprocessor or analog device (or a MEMS device or other component or subassembly) within a structure produced using FEAM. In particular, since the deposition temperature of thermoplastics may exceed the maximum temperature of some devices, it can be important to avoid directly depositing molten polymer on top of a device, especially if unpackaged (i.e., bare). In FIG. 58(*a*), the bare IC die has been mounted to a substrate that is preferably thin, and has been wire bonded (e.g., using thermosonic methods known to the art)—with wire running between IC and substrate bonding pads—to the substrate. An encapsulant, preferably with a low coefficient of thermal conductivity, may be applied to the die to protect it and insulate it from molten polymer that in some embodiment variations will be applied over the die. In FIG. 58(*b*), a cavity in the object to receive the substrate has been prepared and in FIG. 58(*c*), the substrate has been placed (e.g., by automated pick-and-place equipment) into the cavity and ECPC has been deposited onto the substrate bonding pads to form a junction. The ECPC communicates with wire in most cases, electrically connecting the IC to the object being fabricated (e.g., a robot). Next, more layers may be deposited, either directly over the encapsulant, or leaving a cavity over the encapsulant to provide thermal insulation. At least a portion of the subsequent layers may serve to retain the substrate in the cavity, e.g., at its edges, while in some embodiment variations, an adhesive (e.g. melted polymer) may be deposited into the cavity or onto the bottom of the substrate before it is placed. In some embodiment variations, the top of the cavity can have sloping walls (e.g., at a 45° angle) so that no support material is required, while in other embodiment variations, the cavity can be closed by a bridge-type cap supported by filament as in FIGS. 55(*a*) and 55(*b*). In the latter case, encapsulant may be superfluous. In some embodiment variations, the die is directly inserted into the cavity without a substrate. In some embodiment variations in which less or no encapsulant is used, ECPC is directly deposited onto the IC bonding pads. In some embodiment variations, rather than being inserted into a cavity, the substrate or die is placed on top of the last layer and structure is built around it. In some embodiment variations, the chip is inserted into a cavity that is deep but narrow, such that the plane of the chip is vertical (orthogonal to the layer plane) or at another angle. In some embodiment variations, the die may be provided with bumps (e.g., solder) or studs (e.g., gold) through which a connection is made.

In some embodiments, the substrate or die is placed inverted compared with FIGS. 58(*a*), 58(*b*), and 58(*c*) as is shown in the cross-sectional elevation views of FIGS. 59(*a*), 59(*b*), and 59(*c*), in which no substrate is used. In such embodiments, the bonding pads on the IC (or substrate) make contact with wire, solder, or ECPC (as shown) on a previous layer. In this orientation, the substrate, if used—especially if made from low thermal conductivity material—can help insulate the die from the molten polymer. In FIG. 59(*a*), at least several layers have been fabricated, forming a cavity and comprising wire in electrical contact with ECPC pads. As shown in FIG. 59(*b*), the die is inverted and positioned so its bonding pads (or conductive structures attached to its bonding pads, such as bumps or studs, not shown) are in mechanical and electrical contact with the ECPC (or wire).

In some embodiment variations, the ECPC is reflowed (e.g., by localized heating with a hot air jet or laser) to bond the ECPC to the die. In some embodiments, the ECPC is composed of a lower melting point material than the surrounding insulating polymer, such that once the object is fabricated, the ECPC pads can be softened by heating the entire object in an oven to a temperature sufficient to reflow the ECPC but not deform or damage the fabricated object. In some embodiment variations, a conductive adhesive is used to bond the IC bonding pads to the ECPC (or directly to exposed wires). In some embodiment variations, the IC bonding pads have affixed to them a protruding conductor (e.g., a short piece of bond wire) that can penetrate into the ECPC when the die is pressed against the ECPC pads, thus securing the die mechanically to the ECPC pads and making a good electrical connection. In some embodiment variations, a thermoset or air-drying conductive adhesive is used to connect the IC bonding pads with the ECPC. In some embodiment variations, pressure is used to press the IC bonding pads against the ECPC. In some embodiment variations, the melting points of the "primary" ECPC (i.e., that used throughout the object for electrical junctions) and the (insulating) polymer are similar (e.g., the primary ECPC is a filled version of the insulating polymer), but the IC bonding pads are coated with an second, "secondary" ECPC having a lower melting point than those and which can bond to the primary ECPC. The secondary ECPC can be reflowed just before the die is inserted (e.g., by exposing it to a source of infrared energy) and can then solidly in contact with, and bond to, the primary ECPC. Or, the fabricated object can be baked in an oven at a temperature high enough to reflow the secondary ECPC and bond it to the primary ECPC, without reflowing the primary ECPC or the polymer.

Figure 59A:
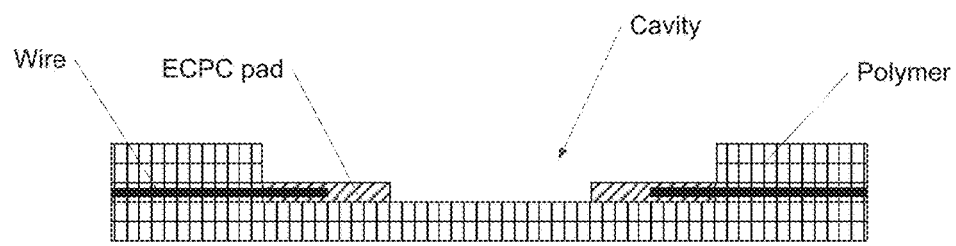
FIGS. 59(a), 59(b), and 59(c) are cross-sectional elevation views of FIGS. 58(a), 58(b), and 58(c).
Figure 59B:
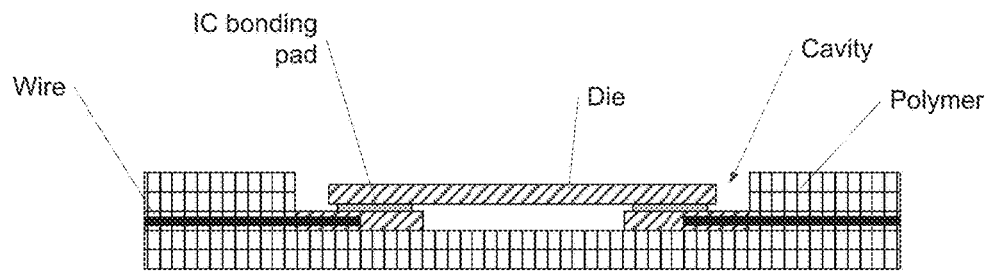
Figure 59C:
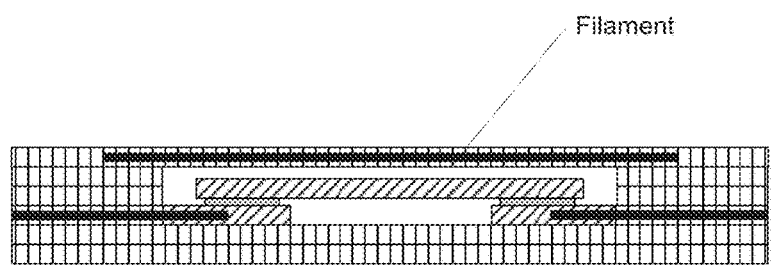

In FIG. 59(c), the cavity is capped by depositing a layer of polymer with a core of filament over it in a "bridge" configuration (as in FIG. 55(b)), such that the polymer does not come into contact with the die. In some embodiment variations, the cavity is capped by building a hollow region (e.g., pyramidal) from polymer with walls at a steep enough angle (e.g., 45°) that no support material is needed. In some embodiment variations, a thin layer of thermally insulating material is applied to polymer is applied to the rear of the die, and polymer is deposited directly onto it. In some embodiment variations, polymer is directly applied to the rear of the die but in a relatively thin "partial layer" (i.e., one thinner than a standard layer), so as not to overly heat it. This is then followed by other partial layers, or a layer of normal thickness, with at least one partial layer acting as insulation.

In some embodiments, thermal damage to sensitive components may be mitigated by other means. For example, limiting exposure time to the molten polymer by gradually deposit polymer over the component, and returning to it multiple times while building up other areas of the object is one option. Providing a metal heat sink made from wire can be helpful. Using components that already have a thermally-protective package is an option, though requires more room for the component. Depositing polymer onto the component which incorporates gas bubbles is a possibility, thus reducing thermal mass and lowering thermal conductivity. Lastly, cooling the polymer using air or liquid jets immediately after deposition to solidify it can avoid the component having enough time to heat to a temperature at which it will be damaged.

In some embodiments, devices such as integrated circuits may have conductive leads pre-attached to them, and then be embedded into fabricated objects, such that junctions can be made between wires within the object and these leads, rather than between wires and device bonding pads. In some embodiments, small devices such as semiconductor devices may be connected to conductive leads and be directly embedded into the extrudate, in much the same way that plain filament is embedded. For example, a series of light emitting diode (LED) bare die, wired in series, consists of alternating regions of wire and die; this may be delivered into the molten extrudate (e.g., by a suitable capillary) and the two wire ends connected to a power source. If the LEDs are wired in parallel, then two wires, with LED die spanning them like rungs on a ladder, may similarly be embedded into an extrudate.

Figure 60:
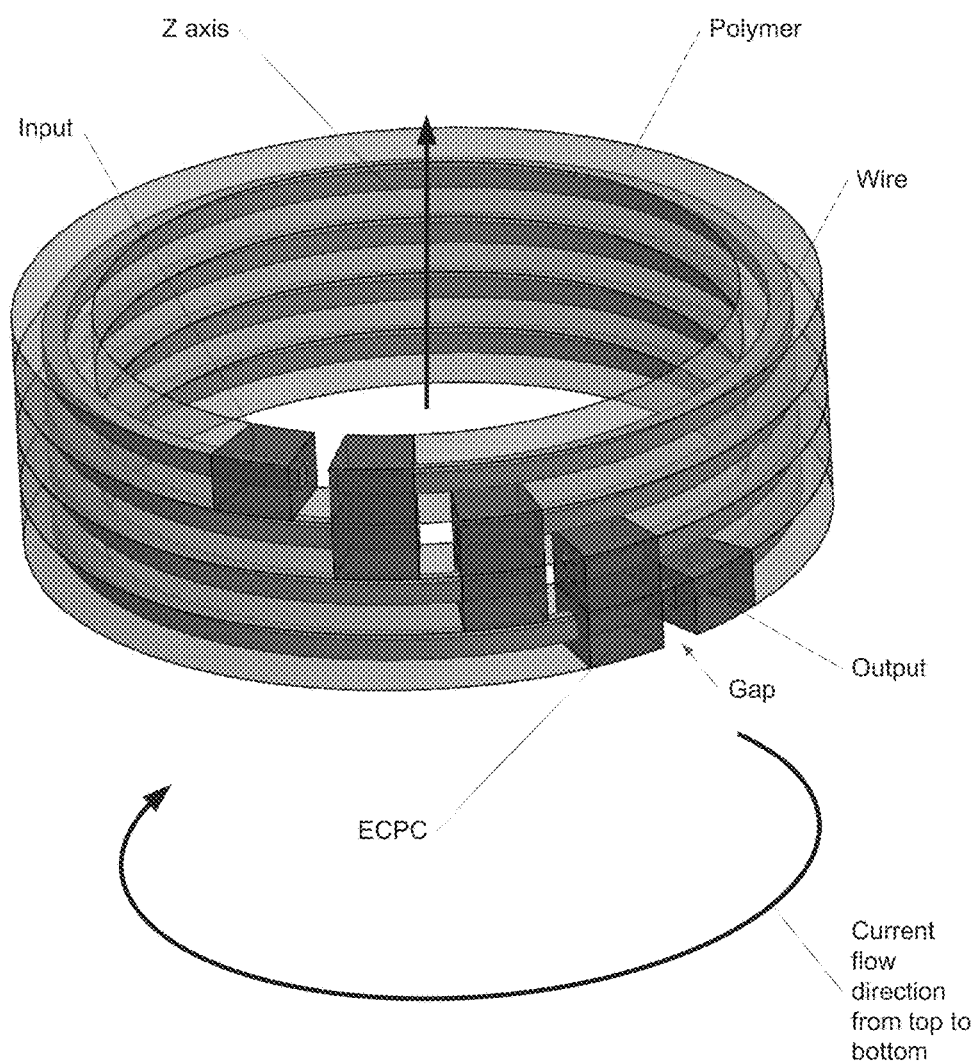
FIG. 60 depicts an isometric view of a discontinuous Z-axis coil.

FIG. 60 depicts an isometric view of a discontinuous Z-axis coil fabricated according to some embodiments. Polymer with embedded wire is deposited to form an open loop on each layer. Typically, the free ends of each loop terminate in a volume of ECPC, and the ECPC volumes on adjacent layers overlap to form junctions which allow current to flow from layer to layer. In the figure, current enters at the junction on the topmost layer, and circulates in a clockwise direction on its way to the output junction on the bottommost layer. Input and output are chosen somewhat arbitrary for clarity since coils are not polarized. Not shown are the wires connecting to these junctions; the input wire can be located above or to the side of the input junction, while the output wire can be located below or to the side of the output junction. Alternatively, the input and/or output wire can be continuous with the top or bottom coil wire, respectively, eliminating the need for ECPC junctions in those regions.

Figure 61:
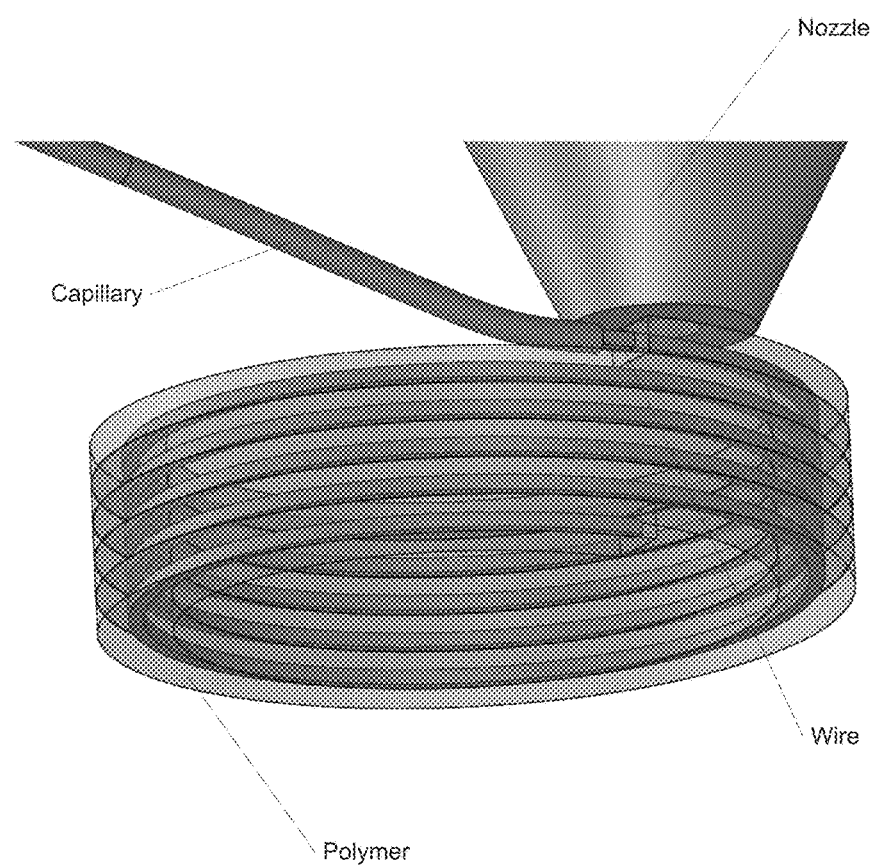
FIG. 61 depicts an isometric view of a continuous helical coil.

By comparison with FIG. 60, FIG. 61 depicts an isometric view of a continuous helical coil fabricated according to some embodiments. With the printhead nozzle moving relative to the fabricated object in a coordinated X, Y, and Z motion, and an external capillary (and possible guide tube, not shown) rotating as well, polymer and wire (here, shown to be square) are deposited to form helical turns of the coil, and no ECPC is needed within the coil. As shown, the coil has all turns at a constant radius. However, in some embodiment variations, having reached the last turn at the top of the coil, a downward-growing coil may be formed at a larger radius, outside (or inside) the turns already made, to provide additional windings (e.g., for larger inductance). This process may be continued for multiple radii. Moreover, the coil may be tapered or otherwise made to vary in radius along its axis, and coils may have concave shapes as well as convex shapes typical of conventionally-wound coils. In some embodiments, coils made discontinuously as in FIG. 60 or continuously as in FIG. 61 may have non-circular and non-cylindrical shapes, e.g., coils square in plan view, or conically tapered in elevation view. In some embodiments, rather than move continuously in a helical fashion as in FIG. 61, the printhead makes an almost-complete circle in one layer (retracting the capillary if needed to avoid a collision with the beginning of the circle), then jumps up to the next layer, without cutting and restarting the wire.

Figure 62A:
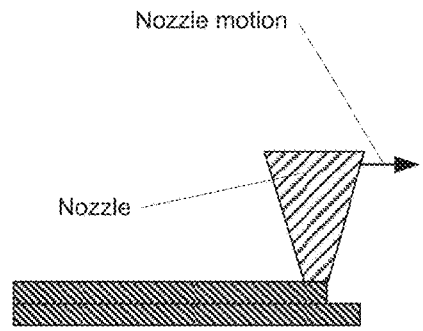
FIGS. 62(a), 62(b), 62(c), 62(d), and 62(e) show cross-sectional elevation views of steps for fabricating a continuous helical coil.
Figure 62B:
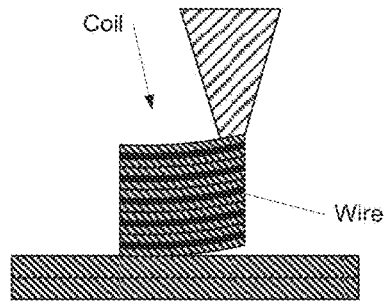
Figure 62C:
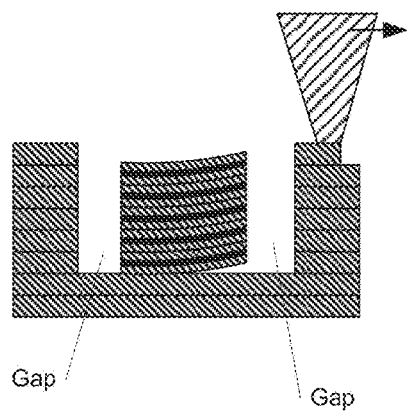
Figure 62D:
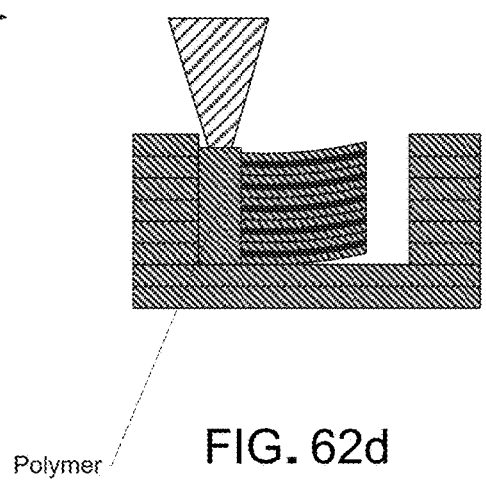
Figure 62E:
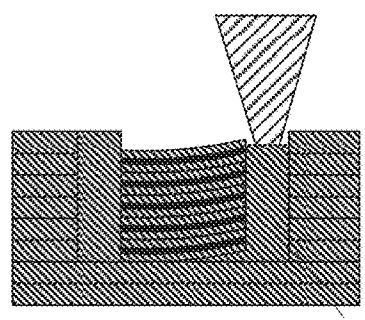

FIGS. 62(a), 62(b), 62(c), 62(d), and 62(e) show cross-sectional elevation views of steps according to some embodiments for fabricating a continuous helical coil such as that of FIG. 61 that is embedded within a fabricated object. In FIG. 62(a), the last layer before fabricating the coil is being formed. In FIG. 62(b), the coil has been formed continuously, as in FIG. 61, e.g., using an external capillary to guide the wire. In FIG. 62(c), the remaining portions of the layers surrounding the coil are being formed; the cumulative thickness of these layers may be slightly more than the height of the coil. As will be seen in FIG. 62(c), due to the finite width of the nozzle (which nonetheless may be made narrower and/or more cylindrical than shown), polymer for the remaining portions cannot be deposited immediately adjacent to the coil, and an annular gap remains surrounding the coil. In FIGS. 62(d) and 62(e) this gap has in some embodiment variations been filled in with additional polymer that spans multiple layers. The approach of building a structure continuously across multiple layers—or embedding an object that spans multiple layers—and then building up around it, can be applied to making solenoid cores that are wound from wire, inserted bearings, etc.

FIGS. 63(a), 63(b), 63(c), 63(d), 63(e), and 63(f) show cross-sectional elevation views of steps of an alternative approach according to some embodiments for fabricating a continuous helical coil that is embedded within a fabricated object. In this case, a cavity (e.g., cylindrical) is created within the object, and the coil is fabricated within it. In FIG. 63(a), the cavity has been created. In FIG. 63(b), the nozzle and capillary (e.g., internal capillary with axis parallel to that of the nozzle) has begun to deposit the first turn of the coil (both polymer and wire), and in FIG. 63(c), more of the turn is completed. In FIG. 63(d), the entire coil has been completed. Again, due to the finite width of the nozzle, the coil cannot be deposited immediately adjacent to the walls of the cavity, and an annular gap remains surrounding the coil. In FIGS. 63(e) and 63(f) the gap is filled in with additional polymer.

The approach of FIGS. 63(a), 63(b), 63(c), 63(d), 63(e), and 63(f) may not be suitable for use using an external capillary of the kind shown in FIGS. 30(a), 30(b), and 30(c), due to interference between the capillary and the wall of the cavity, so a capillary (e.g., internal) whose axis is parallel to that of the nozzle may be more appropriate. However, as shown in the plan view of FIG. 64, an external capillary and nozzle of suitable design can be used to create a continuous coil directly adjacent to the wall of the cavity. The nozzle is elbow-shaped, so as to re-direct the flow of molten polymer to one side, and rotates and (if not centered on the cavity as shown) translates, to follow the inner wall as it deposits polymer extrudate. Meanwhile, a capillary that may be curved at least in part in the horizontal (layer) plane is provided to distribute wire. The capillary rotates/translates along with the nozzle, and may be fixed to it. In the figure, the first partial turn of the coil has been formed at the bottom of the cavity (on top of layer M) while the nozzle and capillary rotate counterclockwise. With each successive turn, the nozzle/capillary is raised. Once the full height is reached (e.g., flush with, or below layer N), the nozzle/capillary may be moved to a small radius and the process continued as they move downwards toward layer M again. This may be continued further for smaller radii. A similar nozzle, e.g., without the capillary, could be used in the case of FIGS. 62(a), 62(b), 62(c), 62(d), and 62(e) to deposit material more closely around the coil.

Figure 64:
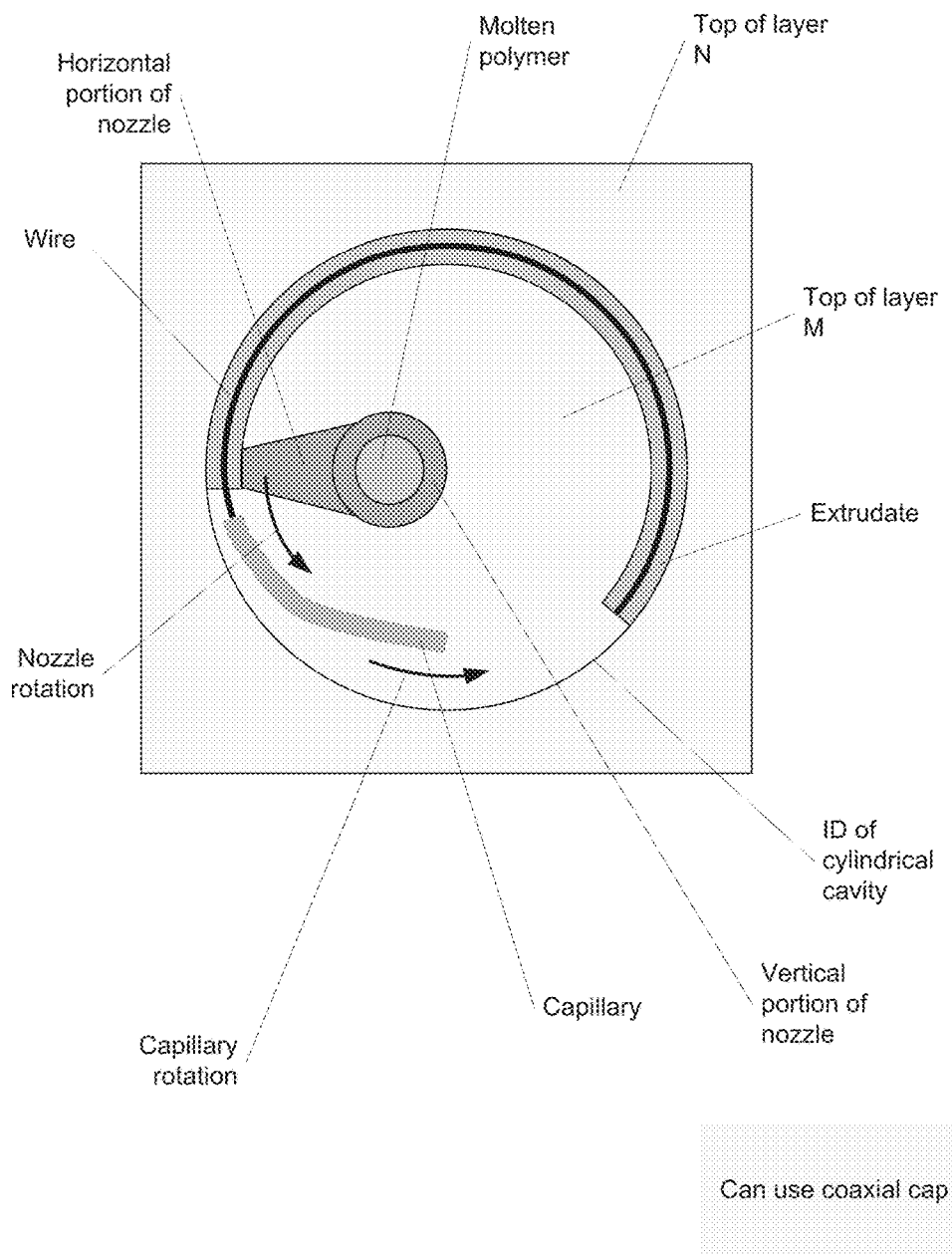
FIG. 64 is a plain view of an external capillary and nozzle.
Figure 65:
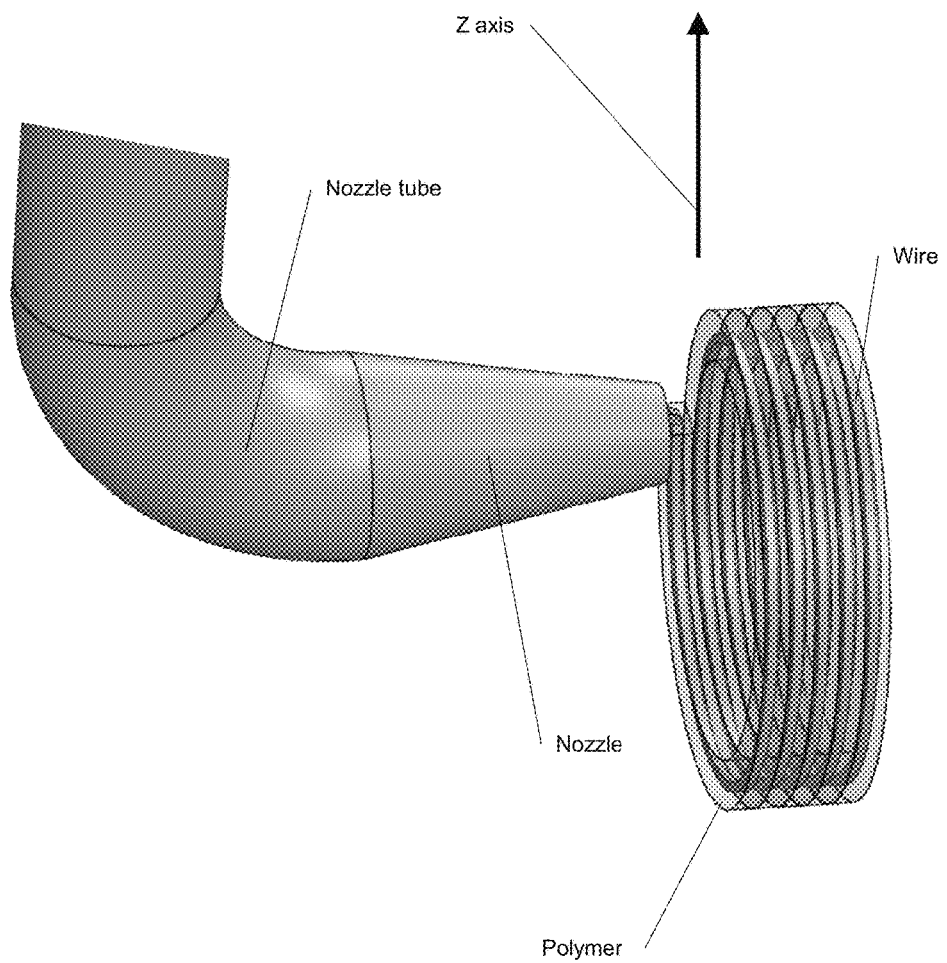
FIG. 65 is an isometric view of capillary whose axis is substantially parallel to the nozzle axis.

A bent (not necessarily 90°) nozzle similar to that of FIG. 64 but with a capillary whose axis is substantially parallel to the nozzle axis (e.g., internal) can also be used in some embodiments—as in the isometric view of FIG. 65—to form a continuous coil having an axis that is horizontal (i.e., at 90° to the Z, or layer-stacking axis), or at other angles. Coils whose axes are not vertical may be generally useful for electromagnetic actuators and sensors.

Figure 66A:
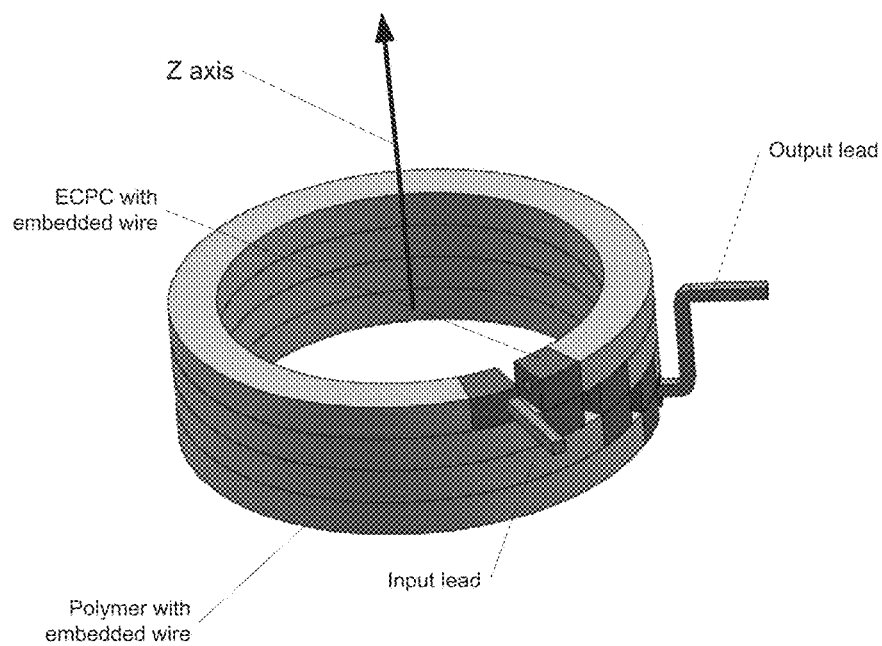
FIGS. 66(a), 66(b), 66(c), and 66(d) depict a coil which has been fabricated discontinuously.
Figure 66B:
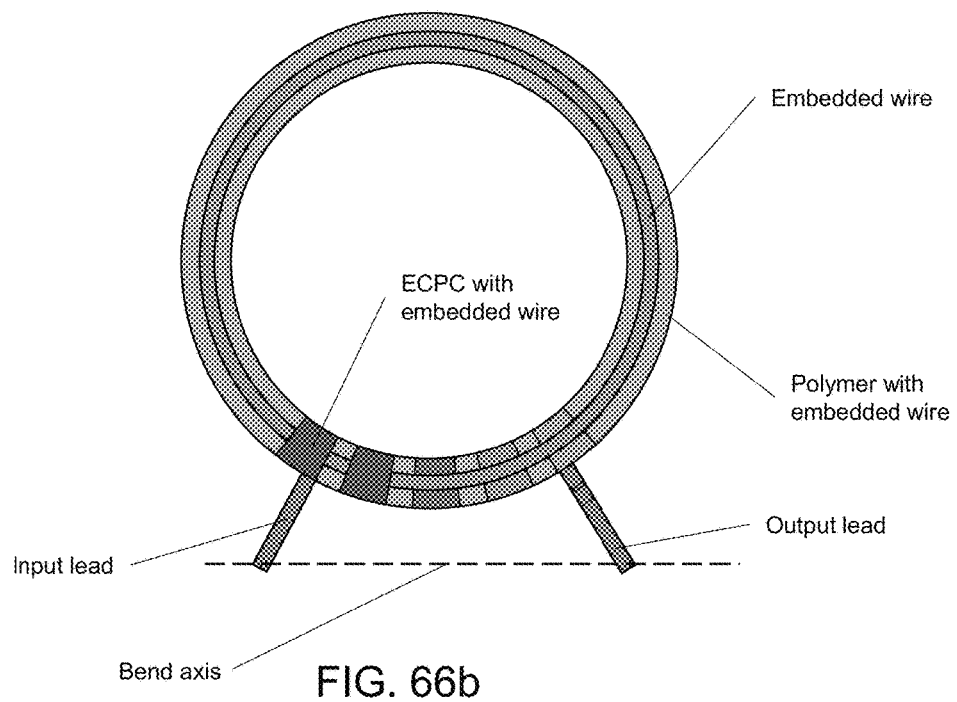
Figure 66C:
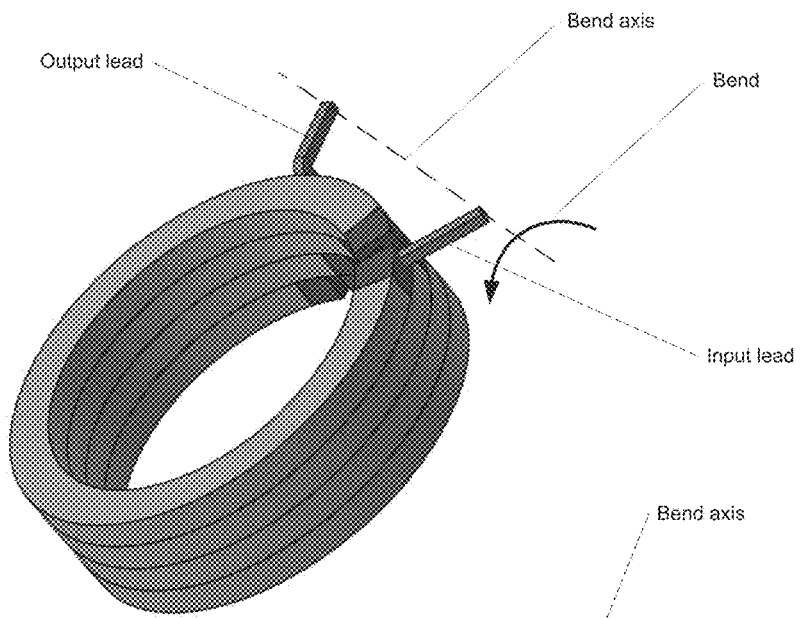
Figure 66D:
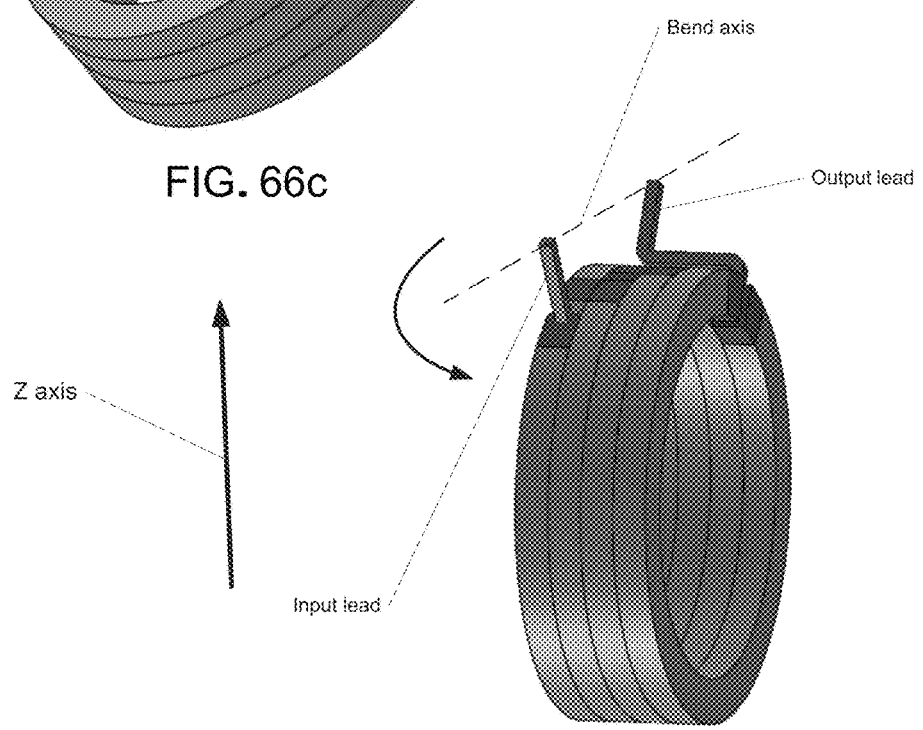

FIGS. 66(a), 66(b), 66(c), and 66(d) depict a coil which has been fabricated discontinuously in some embodiments as in FIG. 60 (however, a continuously-fabricated coil such as that of FIG. 61 could also be used) with its axis vertical, and which is then rotated until its axis lies at another angle (in this case, horizontal). The rotation can be stopped at a particular angle (e.g., by fabricating a suitable mechanical stop. The printhead or a specialized instrument on the FEAM machine can affect the rotation during the build process, or the process can be interrupted if needed (and the rotation performed manually in some embodiments), and polymer can be deposited after rotation to retain the coil in its new position. FIG. 66(a) is an isometric view of the coil, showing portions of the input and output leads which are in the same horizontal plane. In the plan view of FIG. 66(b), a bend axis is shown around which the leads can be bent. In FIG. 66(c), the coil has been partly rotated by bending the leads around the bend axis, and in FIG. 66(d) the bending (assuming a 90° bend is desired) has been completed. In some embodiments, the bend axis is elsewhere, and the leads may not be bent, though they may be twisted. Other structures than coils may be similarly rotated, for example, armatures/plungers used in conjunction with coils to form solenoid-type actuators.

Figure 67A:
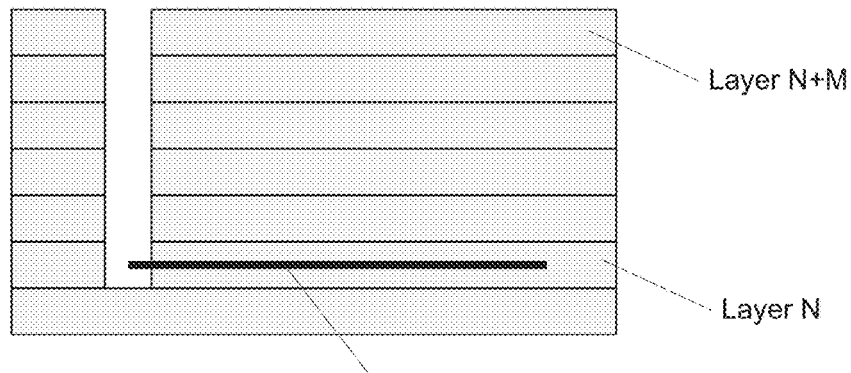
FIGS. 67(a), 67(b), and 67(c) depict in cross-sectional elevation views two approaches to electrically connect wires from one layer to another.
Figure 67B:
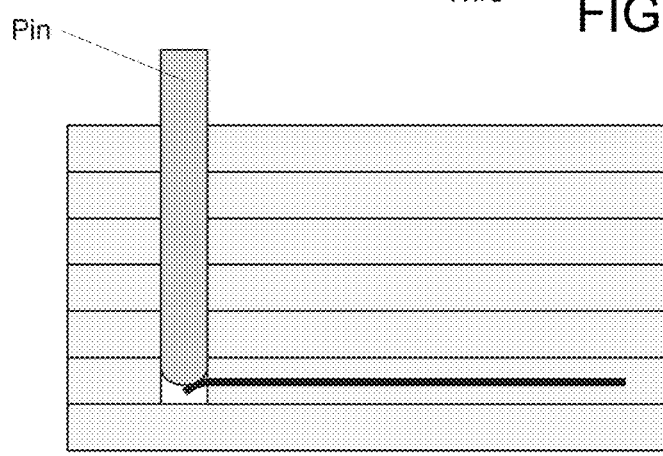
Figure 67C:
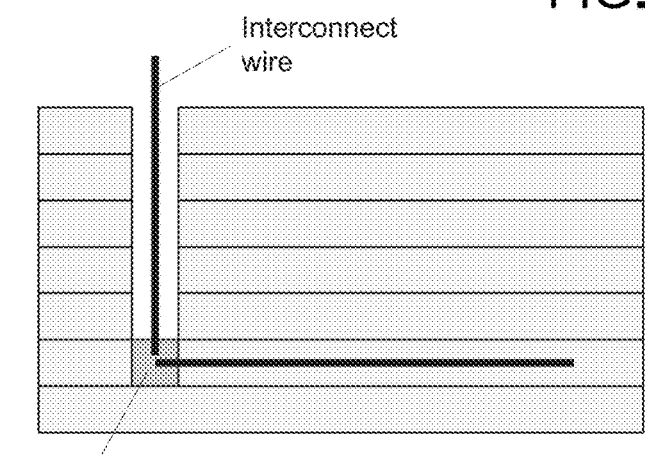

FIGS. 67(a), 67(b), and 67(c) depict in cross-sectional elevation views two approaches used in some embodiments to electrically connect wires from one layer to another other than by using overlapping regions of ECPC or by using a joining method (e.g., thermosonic or laser bonding) to connect the wires. In FIG. 67(a), a wire is shown on layer N that extends at its tip or anywhere along its length into a hole formed so as to span multiple layers from layer N to layer N+M. In FIG. 67(b), a conductive pin has been inserted into the hole, making contact with the wire on layer N and thus interconnecting layer N to the top of the layer stack. The pin preferably slightly deforms the wire to make good contact. If wires are provided on other layers (e.g., layer N+2) that extend into the hole, they too can be contacted by the pin and be electrically connected as well. The pin may be retained in the hole by pressure, adhesive, or other means, such as being sized to be a press fit, or being heated so as to slightly melt and deform the surrounding polymer. In FIG. 67(c), the wire in layer N extends into ECPC and an interconnect wire delivered through a hole running from layer N+1 to layer N+M enters the ECPC, thus connecting the two wires together with a low resistance.

Figure 68A:
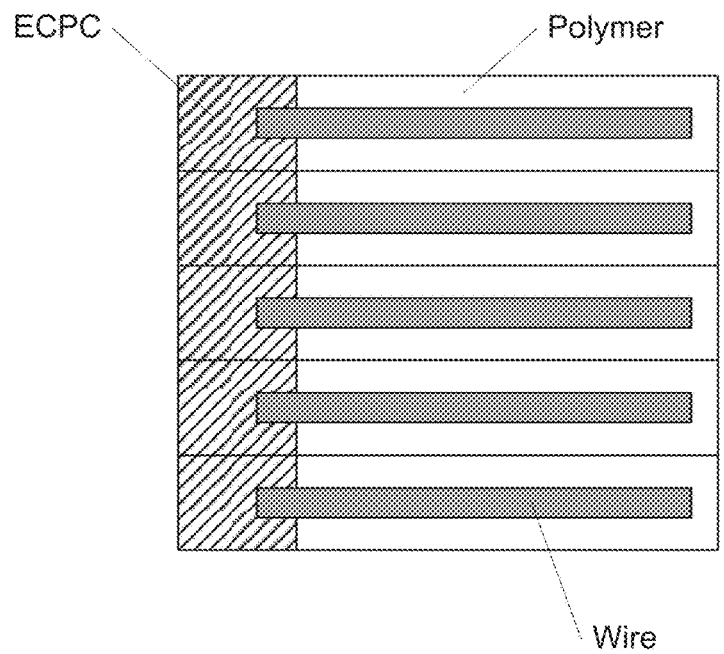
FIGS. 68(a) and 68(b) are cross-sectional elevation views of a group of layers comprising wires which are at least partly surrounded by ECPC.
Figure 68B:
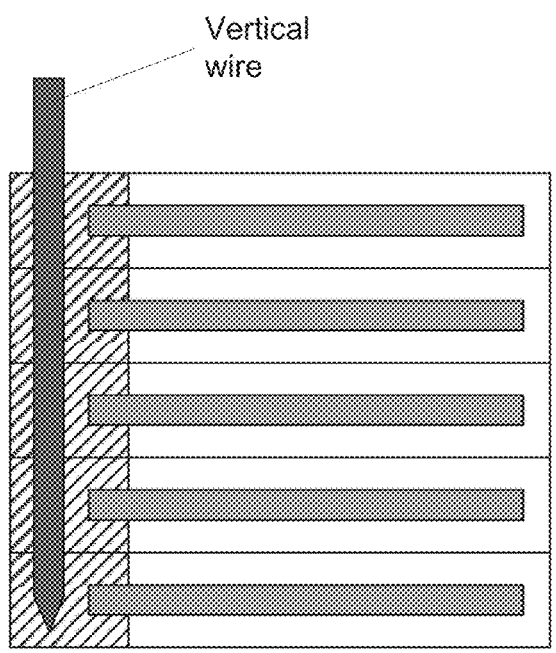

FIGS. 68(a) and 68(b) are cross-sectional elevation views of a group of layers comprising wires which are at least partly surrounded by ECPC. The ECPC regions are shown to overlap; thus electrical contact is established between the layers. In some embodiments, to further decrease the resistance in this vertical interconnect, a wire or pin is inserted through the ECPC regions. In such a case, the ECPC is used to bridge the short distance between wire and vertical wire, and the overall resistance can be reduced. The wire may be heated to aid insertion, twisted, etc. In some embodiment variations, the wire may be in the form of a small drill bit which drills through the ECPC volumes. In some embodiment variations, the wire is inserted (e.g., at an angle) through ECPC volumes which do not otherwise overlap.

Figures 69A, 69B:
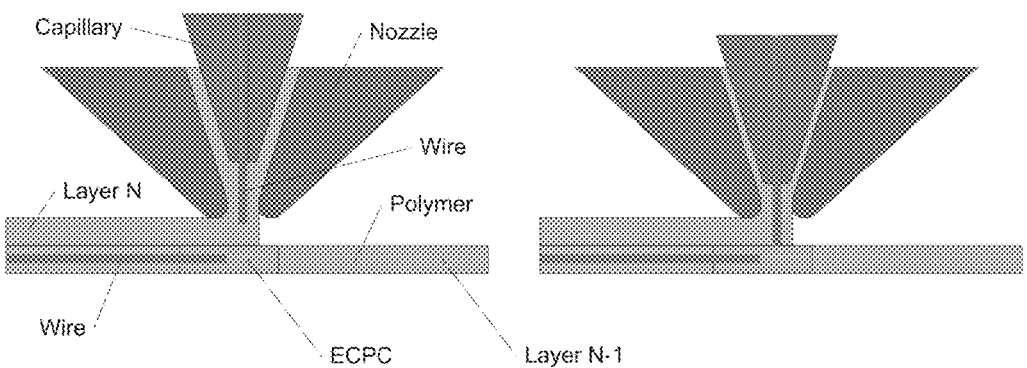
FIGS. 69(a), 69(b), 69(c), 69(d), and 69(e) depict in cross-sectional elevation views an approach to creating junctions between two layers in which ECPC.
Figures 69C, 69D:
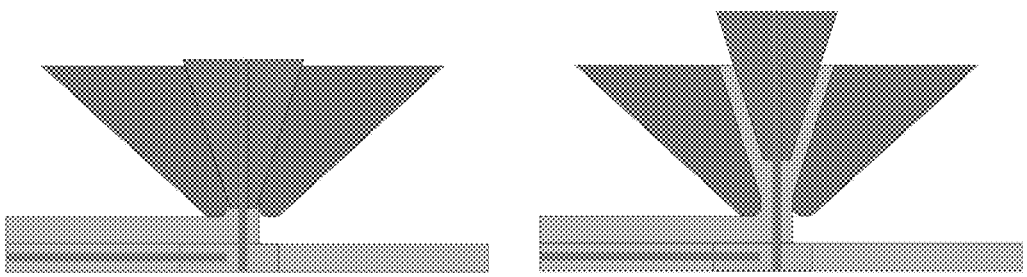
Figure 69E:
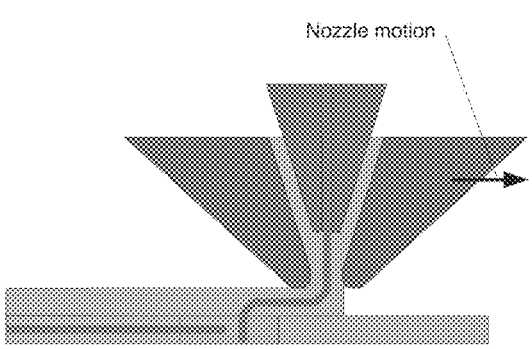

FIGS. 69(a), 69(b), 69(c), 69(d), and 69(e) depict in cross-sectional elevation views an approach to creating junctions between two layers in which ECPC is required only on the lower of the two layers. In FIG. 69(a), layer N−1 comprises a first wire, a portion of which is within a volume of ECPC. A capillary is provided through which a second wire is fed. The nozzle, having already deposited polymer for a portion of layer N, has come to a stop or possibly slowed down. In FIG. 69(b), the capillary and second wire have been lowered; the second wire is immobile within the capillary (e.g., clamped by the capillary) and about to penetrate the ECPC. In FIG. 69(c), the second wire has impaled the ECPC, forming a junction with the first wire. In FIG. 69(d) the capillary, now free to move without moving the second wire, has been raised (if needed to allow the nozzle to deposit polymer). In FIG. 69(e), the nozzle is moving, bending the second wire, which remains anchored in the ECPC.

FIGS. 70(a), 70(b), and 70(c) depict a specialized pounce wheel arrangement for embedding filament, along the lines of that already described in conjunction with FIGS. 13(a), 13(b), and 13(c). As shown in the isometric view of FIG. 70(a), the wheel may comprise a hub and multiple spokes. FIG. 70(b) depicts a single spoke in closeup view, showing a groove in some embodiment variations to accommodate the filament. In the elevation view of FIG. 70(c), filament is pushed below the surface of a layer (e.g., of thermoplastic material) by the spokes of the wheel as the wheel rotates and moves. The wheel spoke length and position may be optimized to push the filament approximately halfway into the layer. In some embodiment variations as shown, current is passed from one spoke to another adjacent spoke through the (conductive) filament; the spokes can alternate between two terminals, labeled positive and negative (though the polarity is not relevant), of a power supply. By virtue of Joule heating, the filament is heated and more easily penetrates the layer. As shown in the figure, the filament may be in contact with more than two spokes at a time, such that all portions of the wire that must penetrate the surface are heated. In the case of layers of non-thermoplastic material, the wheel may simply serve to force the filament below the surface, with no Joule heating provided. In some embodiment variations, the spokes may be tapered so as to better penetrate the polymer. In some embodiment variations, the pounce wheel is ultrasonically vibrated to better embed the filament. The path along which the wheel rolls may not be straight, so that wire to be embedded along curved paths; as such, the wheel may rotate relative to the fabricated object around an axis perpendicular to the layer (i.e., vertical) or parallel to the local surface normal, or vice-versa (the object may rotate).

Figure 71:
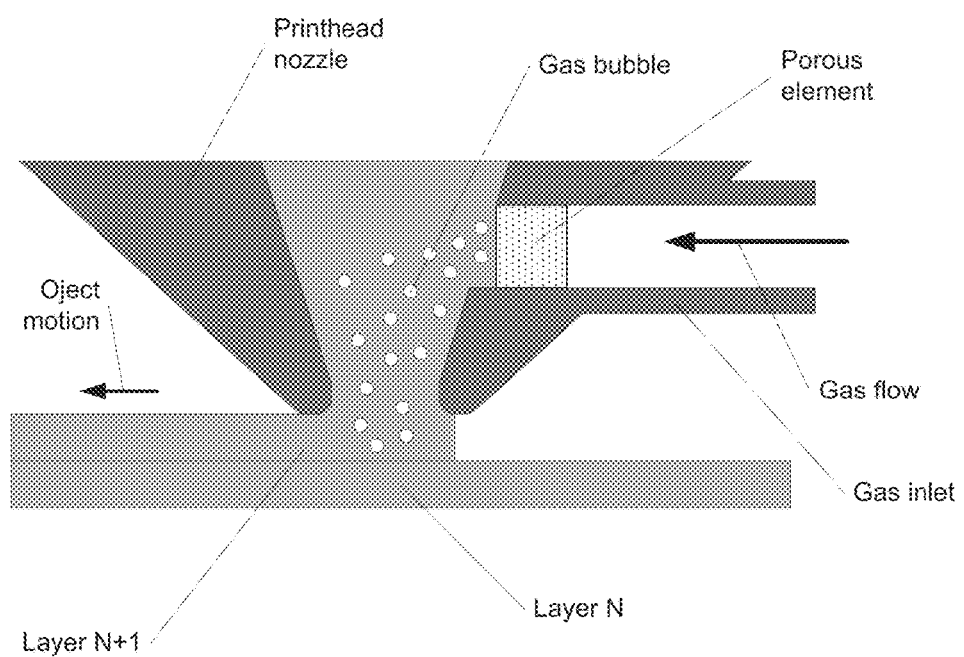
FIG. 71 is a cross-sectional elevation view depicting a printhead furnished with a gas inlet.

FIG. 71 is a cross-sectional elevation view depicting a printhead furnished with a gas inlet and in some embodiment variations, a porous element, for the purpose of depositing an extrudate containing gas bubbles. The porous element (e.g., a sintered metal filter such as those made by Mott Corporation, Farmington, Conn., with a suitable, preferably small pore size) can help produce a large number of bubbles with the desired size distribution. The gas may be injected into the printhead higher up within its heated portion, not necessarily within the nozzle as shown. The process may be similar to that used in microcellular injection molding, known to the art. Bubbles may be of air or of a gas such as nitrogen. Injected bubbles may be used to alter the mechanical properties (e.g., elastic modulus, tensile strength) of the extruded material, on a smaller size scale than might be achieved by toolpaths which leave voids in the fabricated structure. For example, a relatively high-durometer elastomer may be given an effective hardness that is significantly lower if it solidifies with internal voids such as would be produced by entrapped gas (e.g., air) bubbles. Gas bubbles may also be used to modulate the appearance of the solidified extrudate. For example, a clear polymer may be made to look translucent or even opaque white, due to light scattering by the bubbles, if sufficiently small. By varying the bubble concentration and/or size distribution, the amount of scattering may be controlled. For example, a black polymer such as ABS or a black elastomer may be made to look light gray or even white by virtue of entrapped gas bubbles. Other colors of material than black can also be used. By controlling the inclusion of such bubbles at a suitable frequency as the object moves in the direction shown (or the printhead moves in the opposite direction), an extrudate displaying a variable gray level, preferably ranging from white through black, may be formed using only black material. An object fabricated with such a capability can thus display gray levels and data on its surfaces, which is useful, for example, in making prototypes of new products. Similarly, an object having variable mechanical properties that are locally specified can be produced. Since foamed extrudates contain less material and are lighter, and have more surface area, extrudates solidify faster and are less likely to sag. Thus, forming a bridging element such as the roof of the cube in FIGS. 55(a) and 55(b) can be achieved even without the use of filament to reinforce the extrudate.

Figure 72:
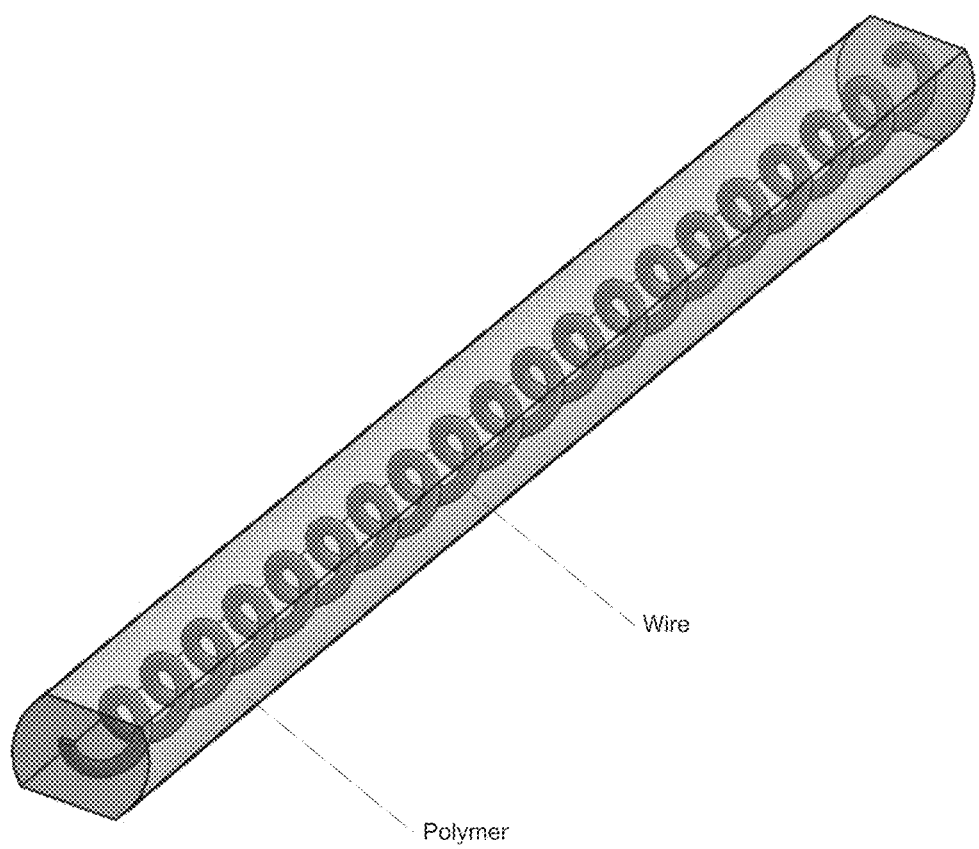
FIG. 72 depicts an isometric view of an extrudate in which is encapsulated a wire that has a helical form.

FIG. 72 depicts an isometric view of an extrudate in which is embedded a wire that has a 3-D helical form. In some embodiment variations, the wire has a 2-D planar serpentine form (with the shape of the wire analogous to various waveforms such as sine, triangle, square, and sawtooth waves), or a 3-D, piecewise planar serpentine form (with the plane varying from region to region along the length). While in some embodiments it is desirable to use wire or other filament to provide electrical conductivity, reinforce polymer, and so forth, incorporating wire in a form that allows it to stretch may be useful in other embodiments to minimize the impact on the mechanical properties, such as elongation, of the surrounding polymer, especially if an elastomer. Thus, stretchable, highly-deformable circuits can be made by placing wire having a non-straight shape within an elastomeric material such as TPE; the material may be shaped to follow the wire shape, or may be differently shaped, such as the shape shown in FIG. 72. In some embodiments, a mismatch in coefficient of thermal expansion between wire and polymer can be accommodated by shaping it so it isn't straight. In some embodiments, it is desirable to incorporate a longer length of wire to increase resistance or inductance; depositing the wire in a non-linear form helps with this. In some embodiments, modifying the wire shape as in FIGS. 54(a), 54(b), 54(c), and 54(d) can assist with anchoring the wire within the polymer. In some embodiments, helical or planar serpentine shapes can help decouple stress from sensitive elements such as ECPC junctions, sensors whose readings should be free of parasitic influences, brittle integrated circuits and other components that tolerate little bending, etc. In some embodiments, small spring-like elements produced as in FIG. 72 are themselves valuable as mechanical elements as springs, flexures, hinges, etc., whether comprising bare fiber or fiber encapsulated in a matrix; these may be made in other shapes such as torsional springs, leaf springs, etc. In some embodiments, wire springs may be produced encapsulated in a sacrificial material that aids in forming them; this may later be removed. Due to the high hardness and springback of typical wire used for springs, a nozzle such as that of FIGS. 35-36 may be useful in helping to bend the wire in some embodiments.

In some embodiment variations, wire may be formed as shown in the figure by moving the capillary tip in a circle perpendicular to the extrusion direction during the extrusion process, or in the case of planar waveforms, vibrating it from side to side appropriately. Adjusting the amplitude and frequency of vibration according to the nozzle velocity, polymer solidification rate and viscosity is generally required; for example, attempting to vibrate with too large an amplitude or too small a spatial frequency may not work unless nozzle speed is reduced, since the wire may simply wiggle within the molten polymer. In some embodiment variations, merely feeding the wire faster than the polymer may cause it to buckle to form a reasonably-regular serpentine or helical shape. To promote and control this, vibration with a small amplitude may be imparted to the wire; along with the increased feed rate this can initiate a controlled bending of the wire into the desired shape, and with a larger amplitude than the vibration itself.

In some embodiment variations, wire may be pre-formed into such a shape and incorporated into the extrudate; for example, wire having a helical shape can be delivered by a capillary that is similarly shaped, by rotating the wire. 2-D and 3-D patterns may be imposed on the wire in some embodiments by embossing the wire in its manufacturing process, or doing so as it is being dispensed and fed into the fabricated object.

Figure 73:
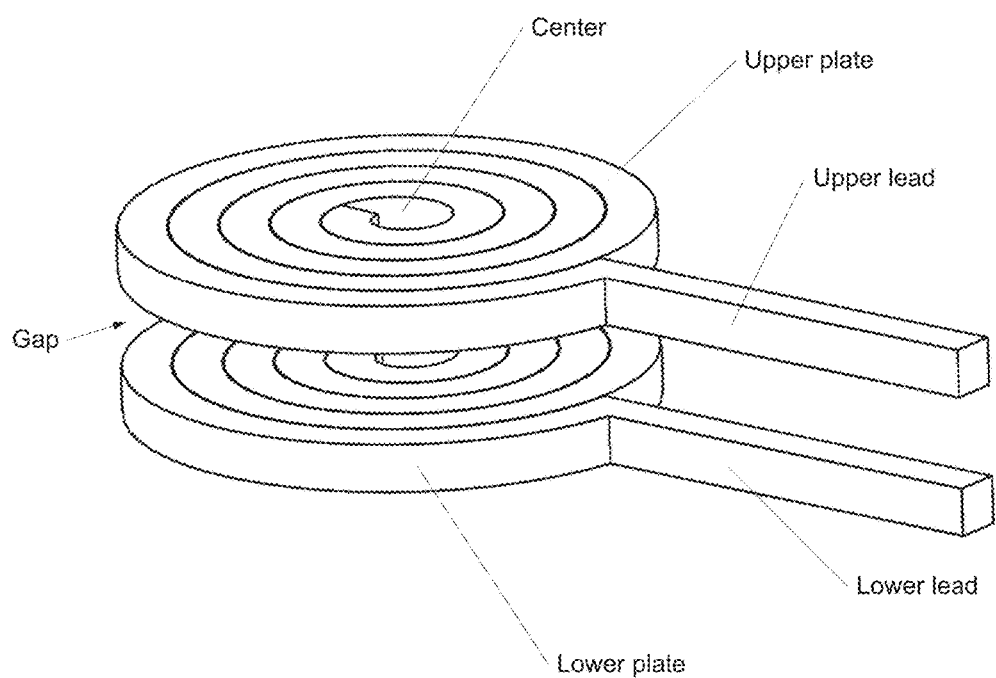
FIG. 73 is an isometric view of a capacitor produced using wire encapsulated at least partially in a dielectric.

FIG. 73 is an isometric view of a capacitor (which may be used as a pressure, force, or displacement sensor) produced in some embodiments using wire embedded at least partially in a dielectric (not shown) such as a thermoplastic. The upper and lower plates of the capacitor, as well as the leads, are produced by wire (e.g., having a square cross section as shown) which is wound to form the plates. The wire may be substantially bare, or may be coated with polymer. For example, if the wire is delivered by an external capillary such as that of FIGS. 30(a), 30(b), and 30(c) and the fabricated object is attached to a build platform that is rotated as in FIG. 42, then winding may be accomplished by anchoring the wire end at the center of the plate (e.g., with a small volume of polymer) and rotating/translating the stages appropriately. The space between the plates may be left substantially empty; however, filling it with polymer to increase dielectric constant—and in some embodiment variations, a polymer with an enhanced dielectric constant (e.g., containing particulate)—may be desirable. In other embodiment variations, capacitor plates are produced using ECPC within which wire is embedded (e.g., toward one edge, across a diameter, or in a loose spiral).

Figure 74:
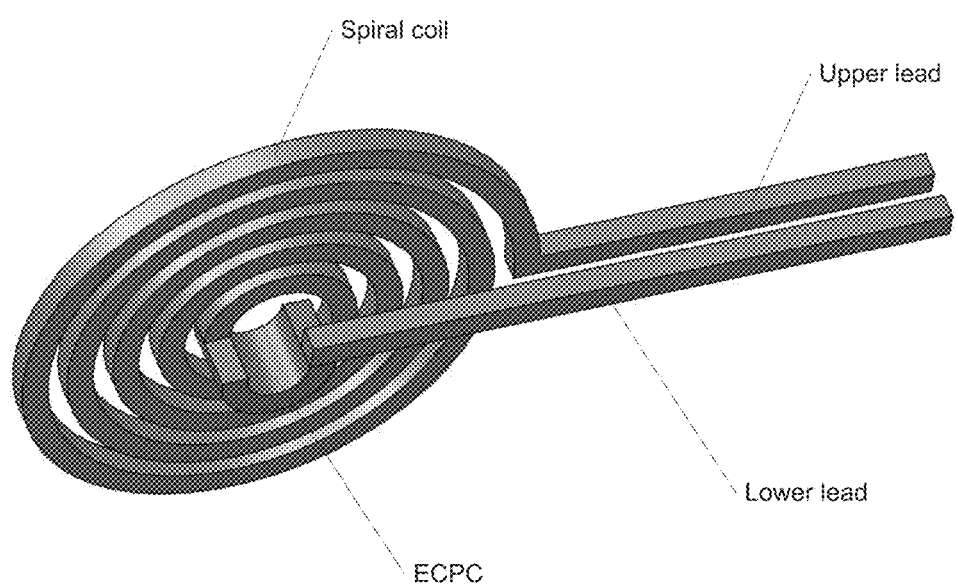
FIG. 74 depicts an isometric view of a spiral inductor.

FIG. 74 depicts an isometric view of a spiral inductor produced in some embodiments using wire embedded at least partially in a dielectric. The wire may be bare and may be square in cross section, and may be deposited in a loose spiral on top of polymer, to which it can anchor (e.g., the wire may be pre-heated), or the wire may be deposited along with polymer, forming an insulating coating. Leading into the coil on the top layer is the upper lead. Above or below the inductor a region of ECPC is provided, connecting the inner end of the coil to the lower lead, which may be at least two layers below the upper lead.

Figure 75:
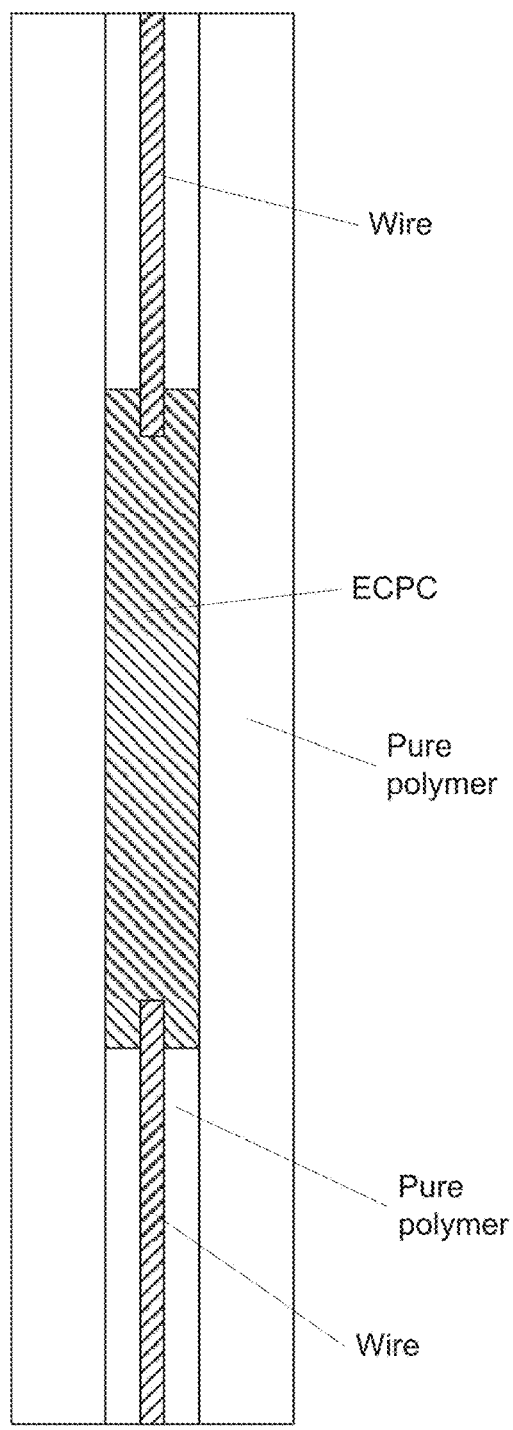
FIG. 75 is a plan view (or an elevation view) showing a resistor.

FIG. 75 is a plan view (or an elevation view) showing a resistor produced in some embodiments. Three adjacent extrudates are shown. The center extrudate comprises pure polymer and ECPC, while the outer extrudates are pure, insulating polymer. Wires leading into and out of the ECPC region are also provided. The value of the resistor may be controlled by any or all of various parameters such as the cross-sectional area of the ECPC, the length of the ECPC, the distance between the ends of wires in the ECPC, and the ECPC conductivity, which may be varied for example by varying the conductive filler concentration. In some embodiments, resistors with non-linear shapes may be produced, such as serpentine and helical resistors.

Figure 76A:
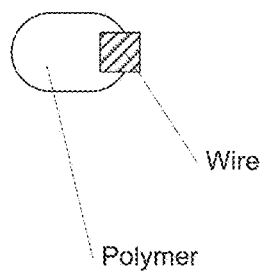
FIGS. 76(a), 76(b), 76(c), and 76(d) depict cross-sectional elevation views of extrudates.
Figure 76C:
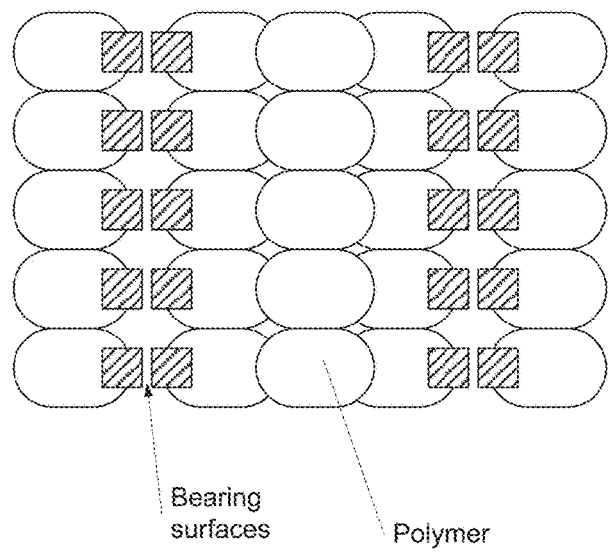
Figure 76B:
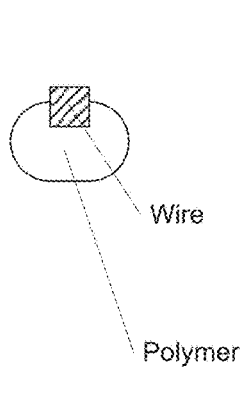
Figure 76D:
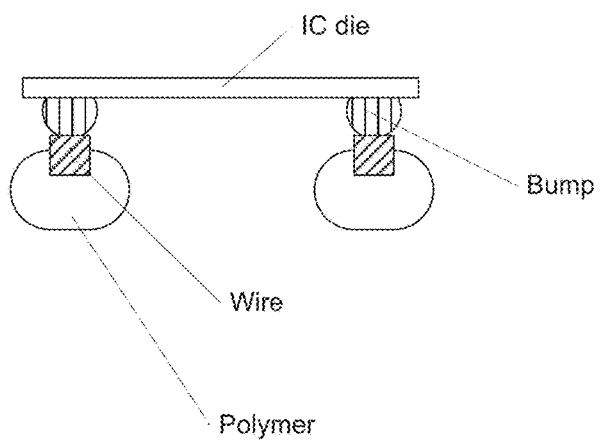

FIGS. 76(a), 76(b), 76(c), and 76(d) depict cross-sectional elevation views of extrudates according to some embodiments, in which the embedded wire or other filament is intentionally not coaxial with the polymer; i.e., the wire is offset to the side as in FIG. 76(a) or top as in FIG. 76(b), for example. In FIG. 76(c), extrudates with wires offset to the sides are shown forming a shaft and plain bearing. The wires that are part of the extrudates on the surface of the shaft are offset toward the outside diameter of the shaft. Meanwhile, the wires that are part of the extrudates on the inside of the hole in which the shaft turns are offset toward the inner diameter of the hole. Together, these offset wires form bearing surfaces. In some embodiments, these bearing surfaces may be machined using a subtractive operation such as drilling (for the plain bearing) or turning, in order to achieve more exact tolerances and/or better surface finishes. In some embodiment variations, the wires used for the shaft and plain bearing are hard materials and/or materials containing particles of PTFE, bronze, etc. to provide lubricity and wear resistance. To maximum contact area, wire with a rectangular cross section can be used. In FIG. 76(d), by contrast, the wires are offset to the bottom of the extrudate, for example, so as to provide pads onto which an integrated circuit die can be bonded, e.g., using solder bumps or a conductive adhesive. Other reasons for locating filament off-center include reducing or increasing spacing to change capacitance or allow higher voltages without arcing, and allowing direct contact between wires in bare regions (e.g., for a pressure-actuated switch).

Figure 77A:
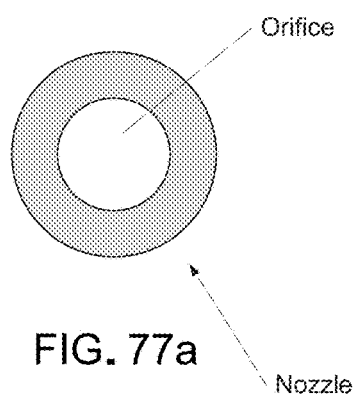
FIGS. 77(a), 77(b), 77(c), and 77(d) depict nozzles used in magnetic extrusion and extrudates produced.
Figure 77B:
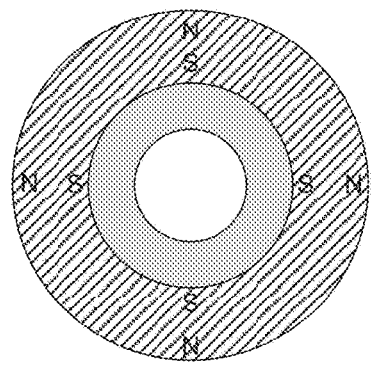
Figure 77C:
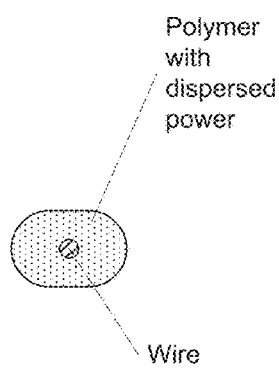
Figure 77D:
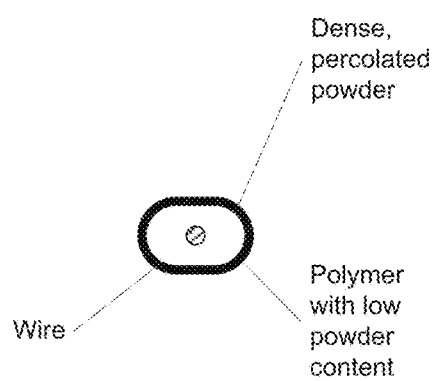

FIGS. 77(a), 77(b), 77(c), and 77(d) depict nozzles used in magnetic extrusion and extrudates produced, according to some embodiments. FIG. 77(a) depicts a nozzle in plan view composed of ferromagnetic material such as nickel or steel. In FIG. 77(b), the nozzle is surrounded by a radially polarized, ring-shaped permanent magnet (e.g., as provided by Magma Magnetic Technologies of Israel) or electromagnet, or a ring of individual permanent magnets or electromagnets aligned so that all their South (or North) poles are pointed inwards, a ring-shaped ferromagnetic material interfaced to a magnet pole; a rapidly-spinning magnet or magnets, etc. In any of these cases, the intent is to create a radial magnetic field whose flux passes through the nozzle, and which can cause magnetic particles within the orifice to be drawn outwards, toward the inner diameter of the nozzle (i.e., orifice edges). Polymer in which a ferromagnetic powder such as silver-coated nickel or iron is dispersed can be extruded through a nozzle such as that of FIG. 77(b) and a wire embedded it. If the magnetic field is turned off (e.g., by pulling the permanent magnets out of contact with the nozzle, or turning off the electromagnet(s), and if a wire is provided, the nozzle can deposit a extrudate similar to that shown in the cross-sectional view of FIG. 77(c), in which the powder particles are substantially dispersed uniformly. If the particle concentration is below the percolation threshold, then the extrudate is not conductive, other than through the wire, though in some embodiment variations, the extrudate may be conductive. However, if the field is turned on, particles may be drawn to the inner diameter of the nozzle and remain near the surface of the extrudate. The resulting increased concentration at the surface can cause percolation, making the extrudate conductive at its surface and remaining dielectric in its interior. In this case, in conjunction with the wire, the extrudate forms a coaxial conductor that may be suitable for high-frequency signal propagation, or can serve as a multi-directional pressure, force, or touch sensor. In some embodiment variations, no wire is provided, but the extrudate may be made locally either conductive or insulating, depending on whether a magnetic field is applied to the nozzle at the moment of extrusion. Though the conductivity thus obtained is low compared with extrudates which include wires, the ability to switch on and off conductivity in a single material can be useful and is relatively simple. In some embodiment variations, a radial magnetic field may be used to modify the percolation behavior of an extrudate containing ferromagnetic particles. For example, if the extrudate is more conductive axially than radially, then the field may be used to help redistribute and/or chain the particles to obtain a more isotropic conductivity. In lieu of using ferromagnetic particles and a magnetic field, similar behavior can be obtained using dielectric particles and an electric field, causing particles to migrate by electrophoresis.

In some embodiments, it is desirable to move the particles in order to alter material properties or create a visual effect. For example, an extrudate composed of white polymer mixed with dark ferromagnetic particles may appear white or light gray normally, but can be made to appear dark on its surface by applying a magnetic field to attract the particles to the surface while the polymer is molten. When the polymer solidifies, the particles are locked into their new positions. In this way, gray-scale surface coloration can be obtained in a fabricated object. Preferably the entire perimeter of the extrudate is colored, since any portion of the surface may be exposed to the outside of the fabricated object, depending on whether the extrudate is forming part of a vertical surface, an top/up-facing surface, a bottom/down-facing surface, etc.

In some embodiments, high speed rotation of the nozzle may be used to cause particles dispersed in the polymer, especially if considerably denser than the polymer, to be brought near the surface of the extrudate by centrifugal force, where they may percolate to form conductive paths, modify material properties, or cause coloration differences and visual effects.

Figure 78A:
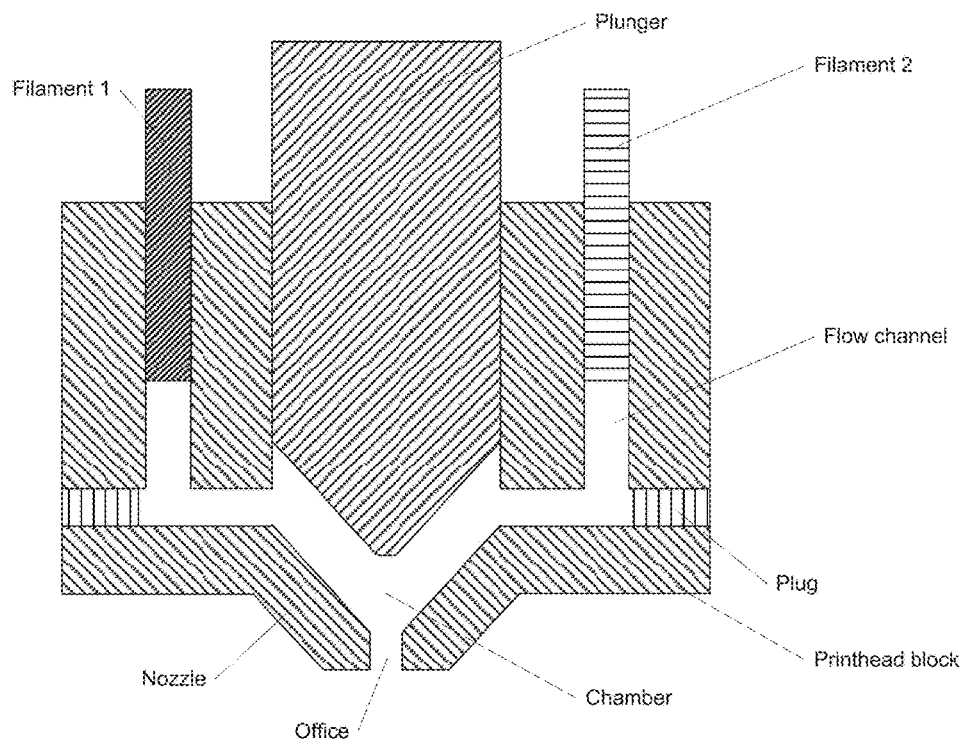
FIGS. 78(a) and 78(b) depict cross-sectional elevation views of a printhead "hot end".
Figure 78B:
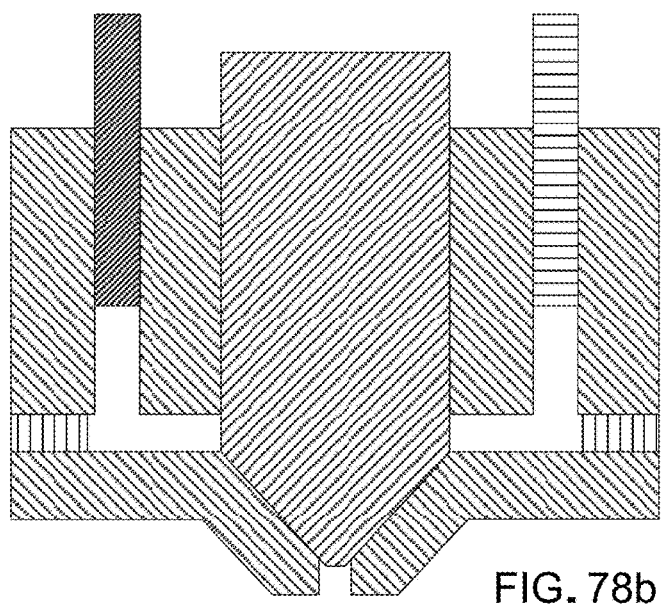

FIGS. 78(a) and 78(b) depict cross-sectional elevation views of a printhead "hot end" similar to that of FIGS. 2, 7(a), and 7(b), and which may be used in some embodiments with an external capillary such as that of FIGS. 30(a), 30(b), and 30(c). As is the case with many figures in this application, the figure is not to scale; in particular, the diameter of the filaments is normally larger than that of the orifice. In FIG. 78(a), the hot end is shown with two filaments (e.g., pure elastomer and elastomer-based ECPC), each entering a flow channel. It is assumed that the entire hot end shown is heated to liquefy the filaments. Both flow channels lead to a central chamber which communicates with the orifice of a nozzle. To more easily manufacture the flow channels, holes may be drilled from the outside for their horizontal runs; these are then plugged. The roof of the chamber is a tightly-fitting plunger, shown raised in FIG. 78(a), and lowered in FIG. 78(b). As the lower region of the chamber is tapered (e.g., conical), which is desirable in some embodiment variations, the lower portion of the plunger is shaped to conform to the chamber shape such that by lowering the plunger the volume of material in the chamber can be completely exhausted through the nozzle, purging the chamber. In use, filament 1 may be fed (e.g., by rollers) into its flow channel, with molten material 1 filling the channel and chamber while the plunger is raised (FIG. 78(a)) and extruding from the nozzle. In preparation for switching to the material 2, the plunger is lowered as in FIG. 78(b), purging the remaining material 1. During the purge, filament 1 is no longer advanced into the hot end, and the plunger motion may be adjusted to produce the same flow rate that previously was obtained by advancing filament 1. The plunger is then raised again and filament 2 fed into the hot end, filling the chamber with material 2 and extruding it from the nozzle. In preparation for changing back to material 1, the plunger is lowered again at a controlled rate until material 2 is purged, and so forth.

Figure 79A:
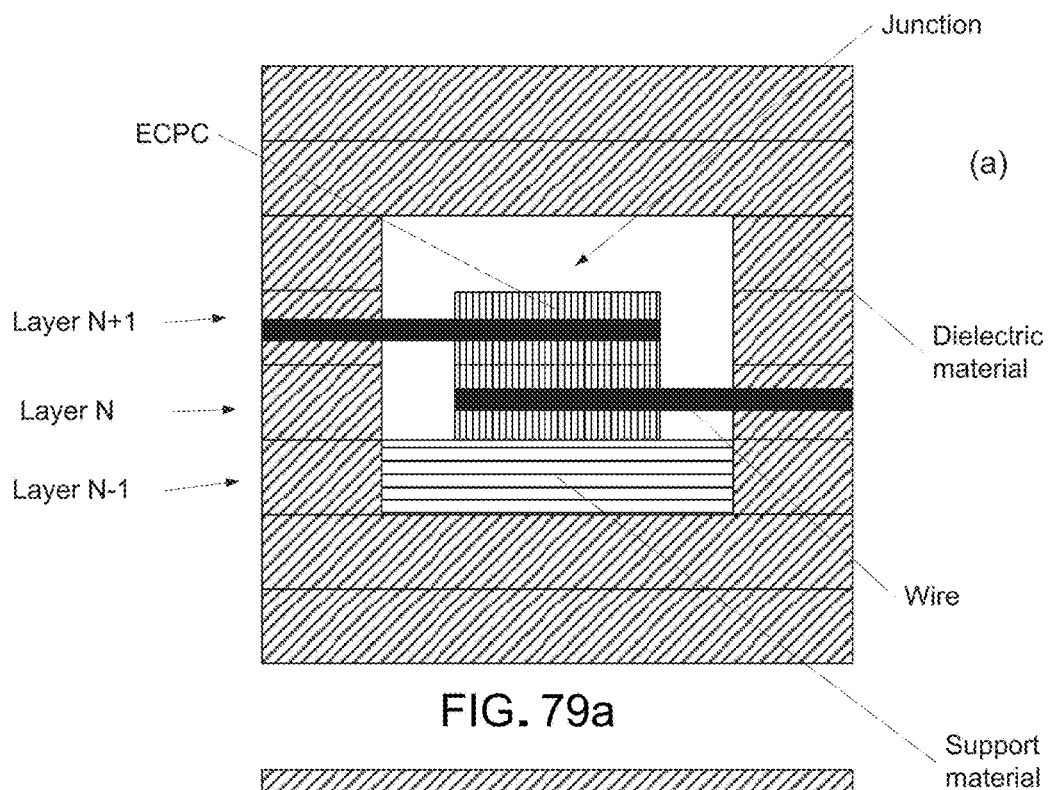
FIGS. 79(a) and 79(b) depict a method of stress-decoupling a junction.
Figure 79B:
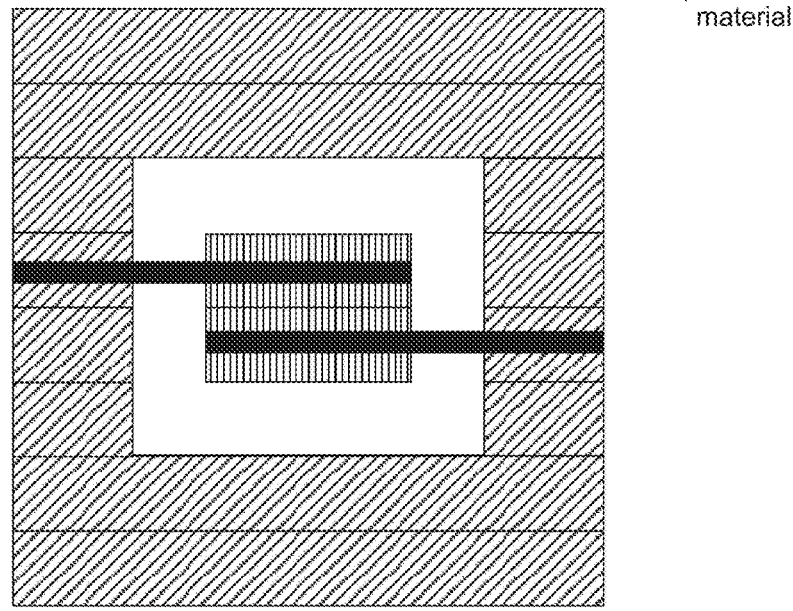

FIGS. 79(a) and 79(b) depict in cross-sectional elevation views a method used in some embodiments for decoupling stress from ECPC-based junctions between wires, which may be useful, for example, when using ECPC having a conductivity that is particularly sensitive to strain. The junction shown is between two wires on two adjacent layers: layers N and N+1. Each wire exits dielectric material surrounding the junction region, passes through air (or sacrificial support material), and enters a region of ECPC. In the figure, the wires both terminate within such regions, though that is not necessarily the case. In the figure, the wires enter their ECPC regions from opposite sides, though that is not necessarily the case. In the geometry shown, the ECPC for layer N is deposited onto a removable (e.g., soluble) support material on layer N−1 as shown in FIG. 79(a). After removal of the support material as in FIG. 79(b), the ECPC junction is suspended within a cavity in the surrounding material by only the wires. In this way, stress applied to the surrounding material is largely decoupled from the ECPC, resulting in a more consistent and reliable junction. In some embodiment variations, the geometry is modified such that no temporary support material is required to achieve useful isolation. In some embodiments, the junction is protected by use of stiffer material in its vicinity, for example, fully-encapsulated stiff support material, or deposited dielectric polymer with a high elastic modulus. Since abrupt transitions in elastic modulus between ECPC and surrounding material may in some cases exacerbate stresses in ECPC, graded, transition materials may be used.

In some embodiments, electrical robustness of the fabricated object can be improved by providing redundancy in electrical junctions between wires, such that stresses which may compromise the performance of one or more junctions may still leave other junctions fully functional. Redundant junctions, as they are electrically in parallel, can provide reduced overall resistance even in situations where junction performance under stress is not an issue.

Figure 80A:
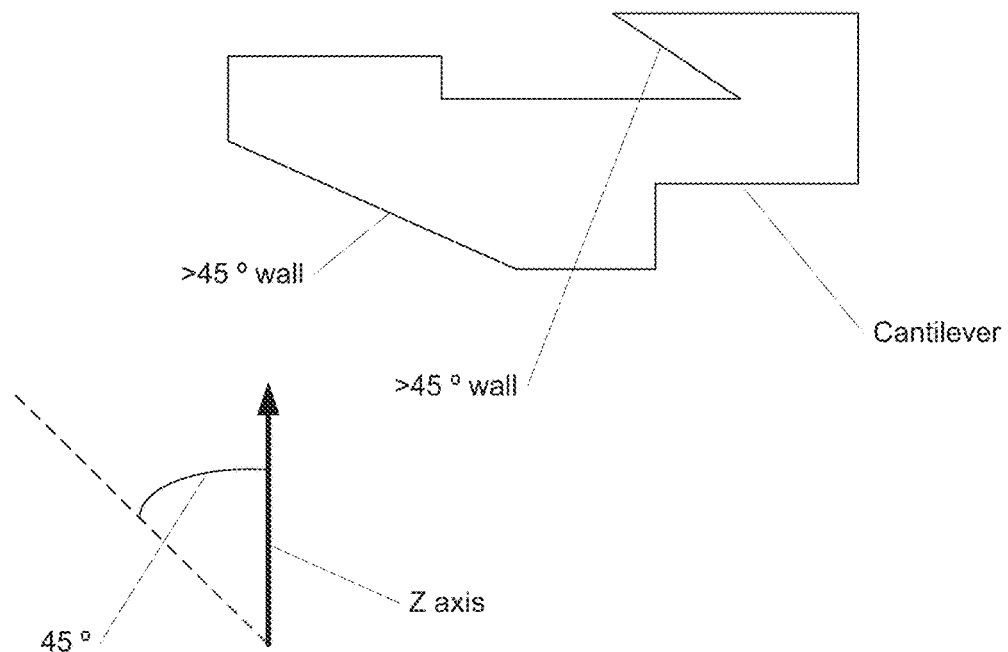
FIGS. 80(a) and 80(b) depict structures that are poorly supported but which may be built using cooling.
Figure 80B:
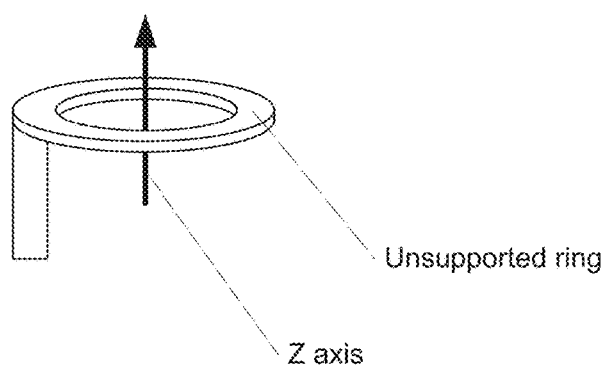

In some embodiments, the extrudate may be rapidly solidified (or significantly increased in viscosity due to a drop in temperature, hereinafter "solidified") upon exiting the nozzle, for example, through the application of a flowing cooling gas to the extrudate. Such "rapid solidification" can serve several purposes. One is to "lock" the wire in place, anchoring it so it can be pulled out of the capillary for feeding, and immobilizing it so as to minimize any tendency for it to come out of the extrudate, for example, when the nozzle follows a toolpath with turns of small radius and/or when the nozzle is moving rapidly along the toolpath. Another purpose—even when no embedded wire or other filament or fiber is involved—is to reduce and sometimes eliminate the need for supports in the fabricated object, by giving the extrudate enough mechanical strength to not sag or collapse of its own weight when poorly supported, or not supported, by the structure below. For example, in FIG. 55(b), rapid solidification can be used to help form the top of the cube, even if no wire is provided. Similarly, rapid solidification can enable geometries such as walls at large (e.g., >45°) angles to the vertical and cantilevers such as those shown in the plan view of FIG. 80(a), unsupported rings such as that shown in the 3-D view of FIG. 80(b), etc. Indeed, while it is sometimes possible to extrude material rapidly to form a straight, unsupported span due to cohesive forces in the material providing a tensile stress in the extrudate, it is not normally possible to create a structure such as that of FIG. 80(b) without supports unless rapid solidification is used. In the case of materials such as metals which form grains upon solidification from a molten state, rapid solidification can be used to produce a finer grain structure than would normally be achieved. In the case of metals and other materials (e.g., waxes) having low viscosities and/or high surface tensions which one wishes to extrude in an AM process, rapid solidification can quickly mechanically stabilize and harden the molten material, making controlled, precise deposition possible.

Figure 81A:
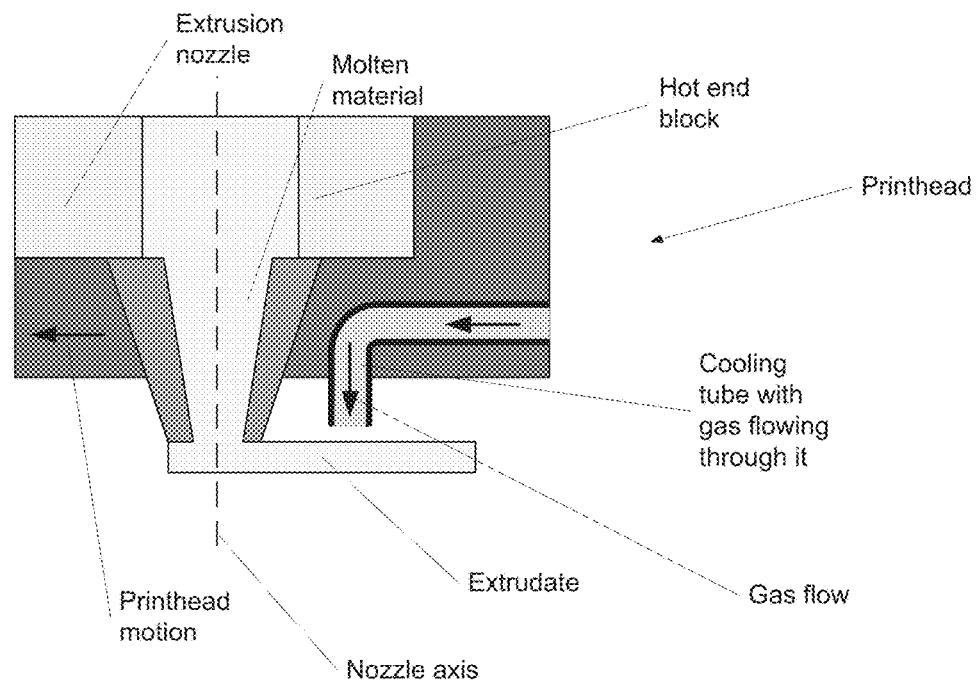
FIGS. 81(a), 81(b), and 81(c) depict a cooling apparatus.
Figure 81B:
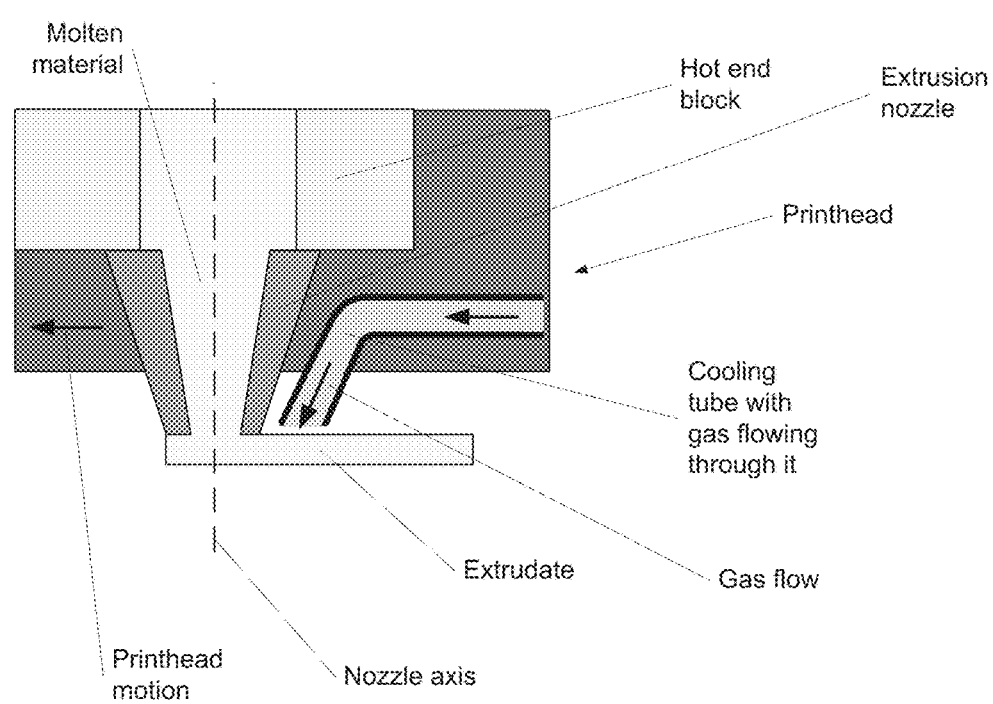
Figure 81C:
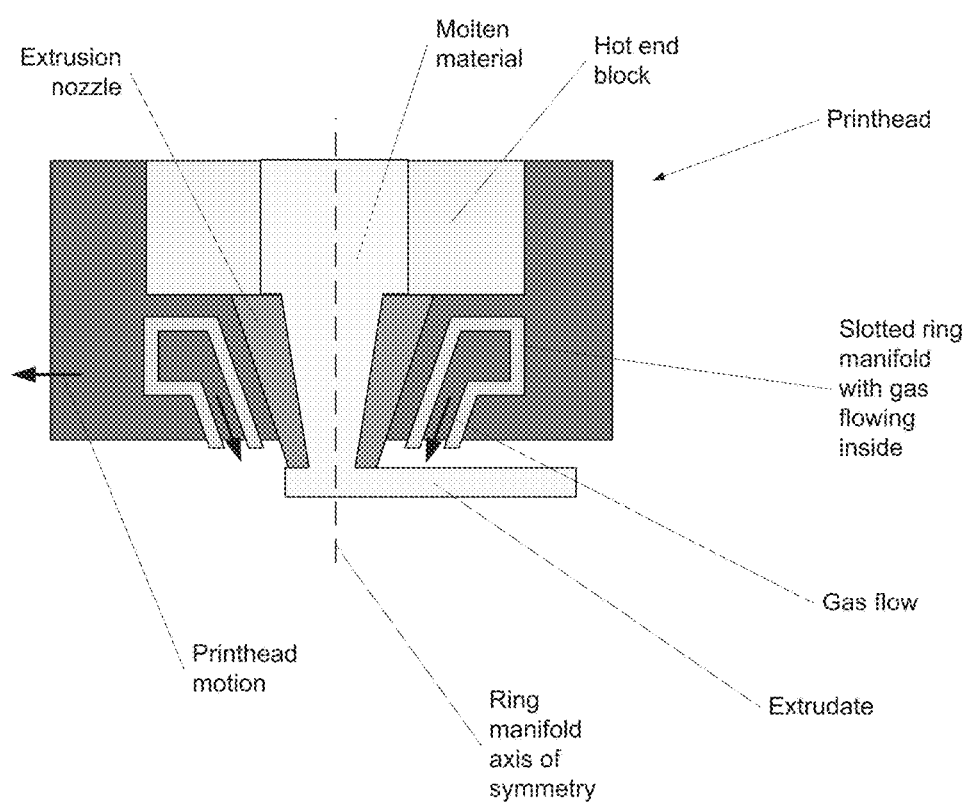

Rapid solidification of extruded material can be accomplished by a significant flow of a cooling fluid, such as air, whether at ambient temperature or cooler than ambient. Other gases, as well as liquids may be used in some embodiments, as can liquids (e.g., delivered as a fine mist) which preferably evaporate, also cooling the extrudate by removing the heat of vaporization. Small fans mounted to the printhead which can provide airflow to the printed layer are sometimes used in FDM systems. Diffuse, non-localized cooling such as by a fan may help in rapid solidification if the flow rates are high. In some embodiments, localized, focused cooling of the extrudate using a fluid at ambient temperature or below ambient temperature can be used instead, typically to far greater effect. FIGS. 81(a), 81(b), and 81(c) depict cross-sectional elevation views of apparatus for rapid solidification as used in some embodiments. In FIG. 81(a), a downward-pointing cooling tube, or conduit, (or more generally, a tube pointing toward the extrudate, which is typically below the nozzle), is provided as part of the printhead, adjacent to and "downstream" of the nozzle (i.e., in the nozzle's "wake"), such that material extruded by the nozzle arrives beneath the tube when the nozzle is moved in the direction shown (or equivalently, when the fabricated object/build platform is moved below the nozzle). Though not shown in FIGS. 81(a), 81(b), and 81(c), if a capillary is provided to deliver fiber for encapsulation (as in FIG. 29(a), 29(b), or 140), the capillary typically is located diametrically opposite the tube on the other side of the nozzle (i.e., on the left side in the figure), such that as the nozzle moves along the toolpath, the capillary leads the nozzle, and the cooling tube follows it, with both rotating as necessary relative to the fabricated object, to follow the path.

Through the cooling tube passes gas (e.g., air) which in some embodiment variations is at the same temperature as the room or chamber in which the object is fabricated, while in other embodiment variations may be chilled (e.g., by a thermoelectric cooler, or passing a hose conducting the gas through an acetone and dry ice bath, or using a compressed air cooler such as the CHILLYBITS™ cold air blaster from Abanaki Corporation (Chagrin Falls, Ohio). Chilling the gas can maximize the rate of solidification while minimizing the velocity and flow rate of the gas, since excessive gas kinetic energy may tend to deflect the extrudate away from the tube. The gas emerging from the tip of the tube impinges on the extrudate, rapidly solidifying it. In FIG. 81(b), a similar tube is provided, but at an angle that permits the gas to impinge upon the extrudate even sooner after the latter has been extruded, thus cooling and solidifying it even faster. The shape of the tube or the tip through which gas exits may be circular, elliptical, rectangular, square, slot-shaped, or have another geometry which optimizes cooling and directs the flow as desired. Since hot air surrounding the extrusion nozzle may be entrained by the gas issuing from the cooling tube, warming it, in some embodiments the nozzle and/or the tube is insulated. Methods of insulation include coating the nozzle exterior (e.g., on the side nearest the tube) and/or tube with an insulating paint such as that made by Hy-Tech (Melbourne, Fla.), covering it (e.g., with a cap) with a thermally-stable, low thermal conductivity material (e.g., a cap) such as ceramic, fiberglass, glass, silicone, PEEK, or aerogel. In some embodiments, the nozzle may be insulated by these methods merely to better maintain the correct temperature.

In some embodiments a shield may be used between the nozzle and cooling tube to prevent inter-mixing of the cooling air and air heated by the nozzle; in some embodiment variations the shield may surround the nozzle, while in other embodiment variations it may be located primarily in the region between the nozzle and cooling tube. In some embodiments, a thermoelectric device may be used adjacent to the nozzle to avoid overheating the air near the cooling tube. In some embodiments, the Reynolds number of the flow from the cooling tube is adjusted so as to minimize mixing with and entraining hot air adjacent to the nozzle.

In the case of the apparatus of FIGS. 81(a) and 81(b), the tube may in some embodiments rotate around the nozzle axis such that the tube remains substantially downstream of the nozzle regardless of the toolpath along which the nozzle moves (e.g., the line between nozzle axis and tube tip remaining tangent to the toolpath). The object may rotate about an axis substantially coincident with the nozzle (e.g., using apparatus as in FIG. 42) to achieve a similar effect. Alternatively, the printhead shown in the cross-sectional elevation of FIG. 81(c) comprises a ring-shaped manifold which surrounds the nozzle, provided with a slot at or near its bottom through which gas may impinge on the extrudate no matter what the orientation of the extrudate in order to rapidly solidify it. In other words, the manifold of FIG. 81(c) acts as an omnidirectional cooling manifold; one that requires no mechanical rotation of a cooling tube or the fabricated object, and is thus easily adapted for use in standard FDM-type machines to provide, for example, the ability to fabricate parts using far fewer—or in some cases no—supports.

In some embodiments, gas flow rate, gas temperature or type, and/or cooling tube position may be adjusted during the fabrication process according to varying needs, e.g., based on the geometry of the fabricated object. For example, while extrudates comprising the first layer of a cantilever such as that of FIG. 80(a) might require significant acceleration of solidification to allow accurate fabrication, extrudates comprising subsequent layers of the cantilever may require less or no acceleration. Moreover, excessive cooling of an extrudate intended to fuse with or adhere to material on the layer below it, or material adjacent to it on the current layer, may be impaired by improper or excessive cooling and solidification. Thus, for example, while the gas stream may be adjusted (e.g., by a flow controller, proportional valve, or pressure regulator controlled by the control system) to provide significant flow when printing the first layer of the cantilever in FIG. 80(a), the flow may be much reduced for subsequent layers.

Figure 82A:
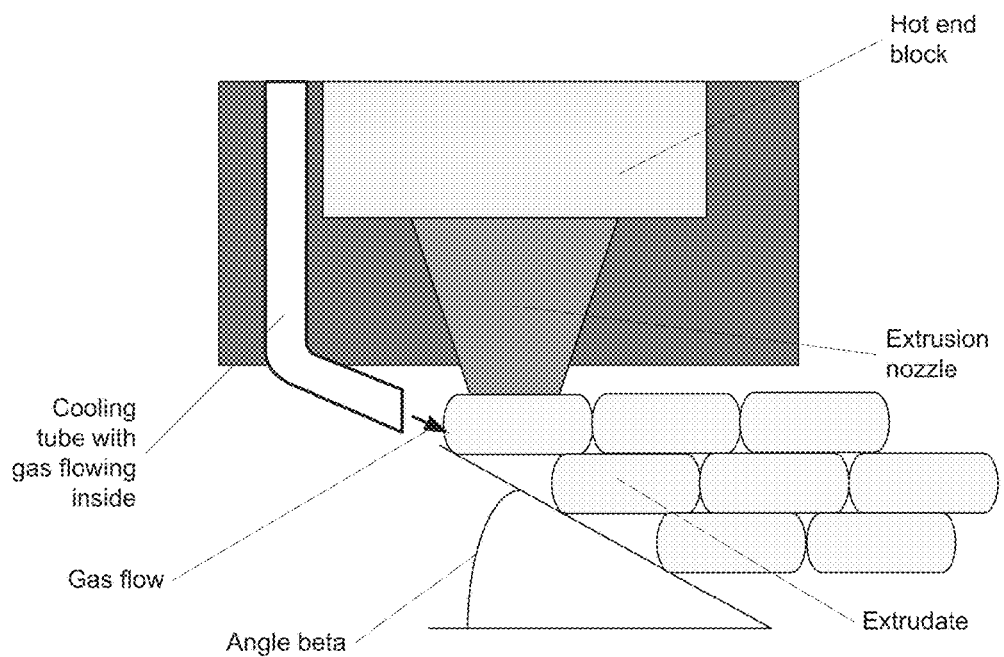
FIGS. 82(a) and 82(b) depict structures being fabricated using cooling.
Figure 82B:
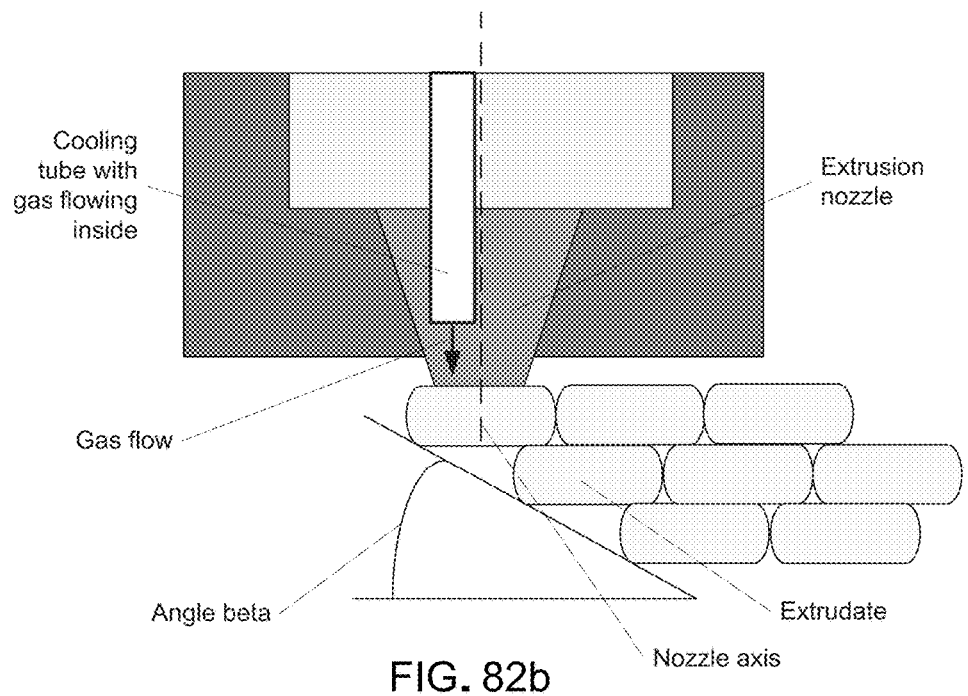

FIGS. 82(a) and 82(b) depict elevation views of a printhead from an angle parallel to the long axis of several extrudates (i.e., the printhead or printed object move normal to the plane of the figure). In both figures, a wall comprised of extrudates such as those shown has been fabricated, at an angle beta to the layer plane. As shown, theta might be ordinarily too small to be practical without the need for supports, or it may be an angle that is practical for extrudate by itself, but not for a composite extrudate that includes wire. While benefiting from rapid solidification, the extrudates nonetheless need to fuse with the extrudates beneath them and to their sides.

In FIG. 82(a), a cooling tube is provided which blows in a directed fashion on the extrudates so as to preferentially rapidly solidify the portion of the extrudates that is not overlapping or adjacent to other material, thus providing the benefits of rapid solidification without significantly compromising adhesion of the extrudates to other material. In some embodiments the tube may be entirely above the lower extremity of the extrusion nozzle, while in other embodiments it may be below as shown. When below, it may be retractable, or it may be re-positionable so as not to collide with previously-deposited material (e.g., it may rotate about the nozzle axis). FIG. 82(b) depicts a similar arrangement but one in which a tube producing a narrow stream or jet of gas is positioned downstream of the nozzle but offset to one side of the nozzle axis so as to preferentially rapidly solidify material not adjacent to previously-deposited material. The offset may be adjustable (e.g., using a positioning actuator) depending on geometry; for example, when depositing extrudates comprising a wall leaning to the right (vs. to the left, as shown), the cooling tube may be offset to the right of the nozzle axis, (vs. to the left as shown).

In some embodiments the cooling tube may be designed to produce a narrow stream or jet of gas that impinges on the center of the extrudate, such that part of the extrudate is rapidly solidified, but part remains molten long enough to fuse with underlying material and with material on at least one side of the extrudate on the same layer. If the latter is not a requirement, alternatively the gas may impinge on both sides but not the center of the extrudate to achieve good adhesion with the underlying layer.

Figure 83:
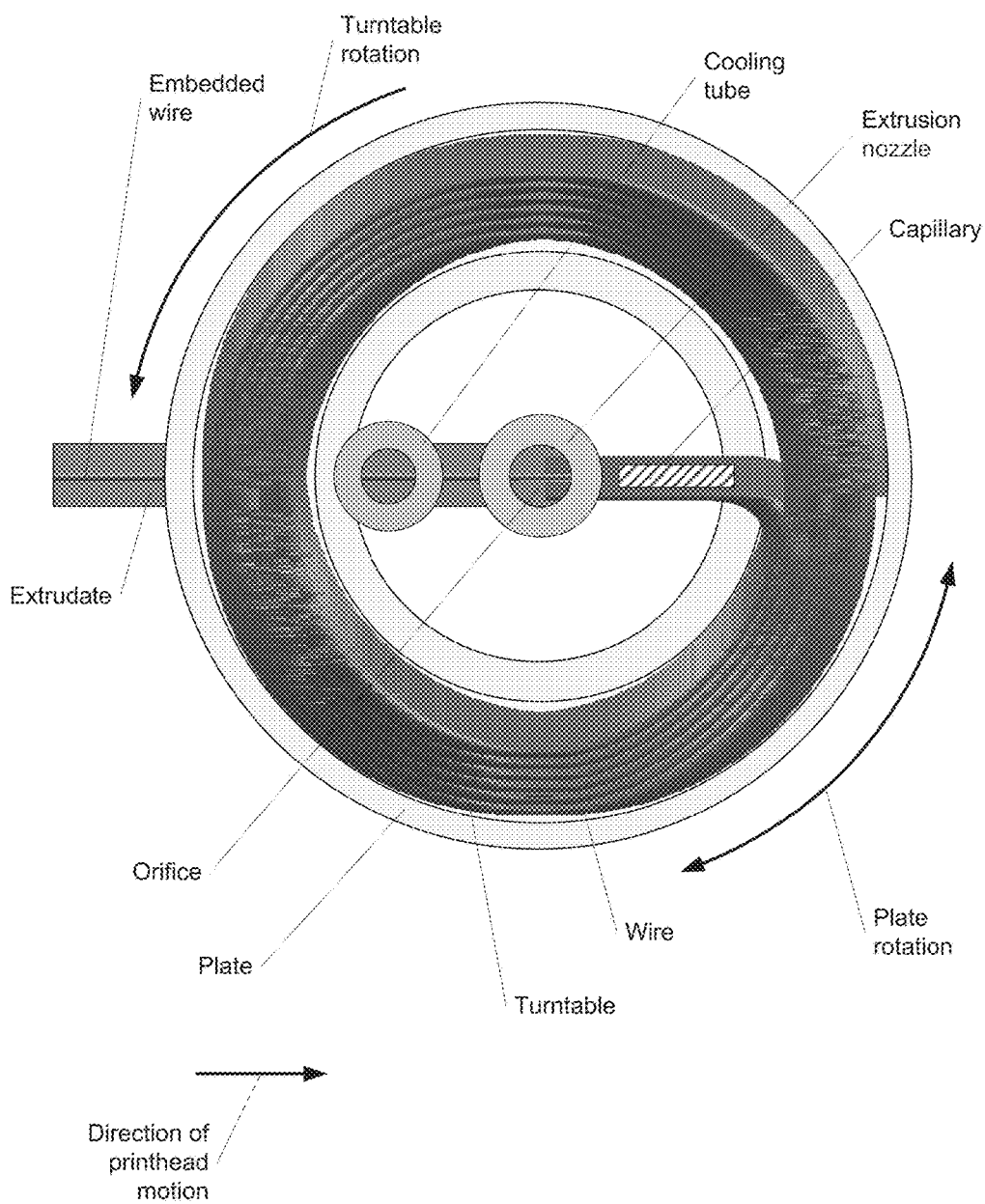
FIG. 83 depicts a printhead incorporating a rotating cooling tube.

FIG. 83 depicts an arrangement similar to that of FIG. 44, to which has been added a cooling tube downstream of the nozzle. The tube may be fixed to the plate such that, along with the capillary, it rotates with the plate according to the local direction of printhead motion along the toolpath. Cooling tubes and manifolds such as those shown in FIGS. 81(a), 81(b), 81(c), 82(a), 82(b), and 83 are preferably designed so that the flow of gas minimally impinges on the nozzle, which risks excessively cooling the nozzle and slowing or preventing extrusion. In some embodiments, the nozzle can be shielded and/or at least partially made from a material which has low thermal conductivity to mitigate this. Also, in some embodiments, the tube or manifold is designed (and possibly shielded) to minimize entrainment of warm air surrounding the nozzle by the flowing gas, which can increase the gas temperature.

In some embodiments, however, cooling of the nozzle may be used intentionally as a means of modulating flow from the nozzle. For example, when the printhead makes a discontinuous jump between locations on a layer, if the flow is not stopped or even reversed as is the practice typically with FDM, an undesirable "stringer" of extruded material will typically result. Cooling of the nozzle using an impinging gas stream, a flow of liquid onto or through channels in the nozzle, etc. can be useful to abruptly stop the flow of material and avoid stringers (conversely, intermittent or periodic heating of the nozzle using an impinging stream of heated gas can temporarily increase flow, providing a rapid modulation of the extrudate width which be used to advantage to create surface textures, etc.)

In some embodiments, rather than, or in combination with, blowing gas onto the extrudate to rapidly solidify it, air may be made to impinge onto the extrudate by drawing it into a tube in proximity to the extrudate; this upwards-directed airflow can also help to offset the force of gravity acting on the extrudate to make it sag and/or the force of a gas jet impinging on the extrudate from above. In some embodiments, a vacuum nozzle designed to reduce air pressure above the extrudate but not draw in any partially-molten material may be located downstream of the nozzle to support the extrudate as it hardens.

In some embodiments, the extrudate may be cooled to promote rapid solidification by using a liquid that impinges on the extrudate, such as a fine mist of water or alcohol that quickly evaporates. In some embodiments, the extrudate may be cooled by direct contact with an element (e.g., a plate, a ring surrounding the nozzle allowing omnidirectional nozzle motion) which has high thermal conductivity (e.g., made from aluminum) and/or high heat capacity, and which in some embodiment variations may be actively cooled. The element may be made from or coated with a material such as PTFE to minimize adhesion of the extrudate.

In some embodiments, more than a single cooling tube or manifold may be used. For example, two tubes may be used with different locations and/or angles such that the flow impinging on the extrudate is more balanced and the net force on the extrudate reduced, than would be the case with a single tube that is asymmetric. The tube shown in FIG. 82(a) on the left of the nozzle may be replicated symmetrically on the right and both tubes may be higher so as not to be below the nozzle tip and interfere with the previously-deposited material.

In some embodiments, fillers may be added to the extruded material to increase thermal conductivity and/or reduce the volume fraction of molten material, thus promoting rapid solidification. For example, fine boron nitride powder may be used to increase thermal conductivity of some polymers, while hollow glass microspheres or particles of a thermoset polymer may be used to reduce the molten polymer volume fraction. In some embodiments, thermally-conductive polymers such as CoolPoly® D8102, made by Celanese (Irving, Tex.) may be used.

In some embodiments in which the extrudate is deposited onto underlying material, it may be cooled from its top surface so as to solidify material at or near that surface before the remainder of the extrudate volume. When the remaining of the volume solidifies and shrinks, shrinkage-related stresses associated with contact with the underlying, already-shrunk material, can thus be more balanced than is normal in FDM, reducing the tendency to curl the layer.

Figure 84:
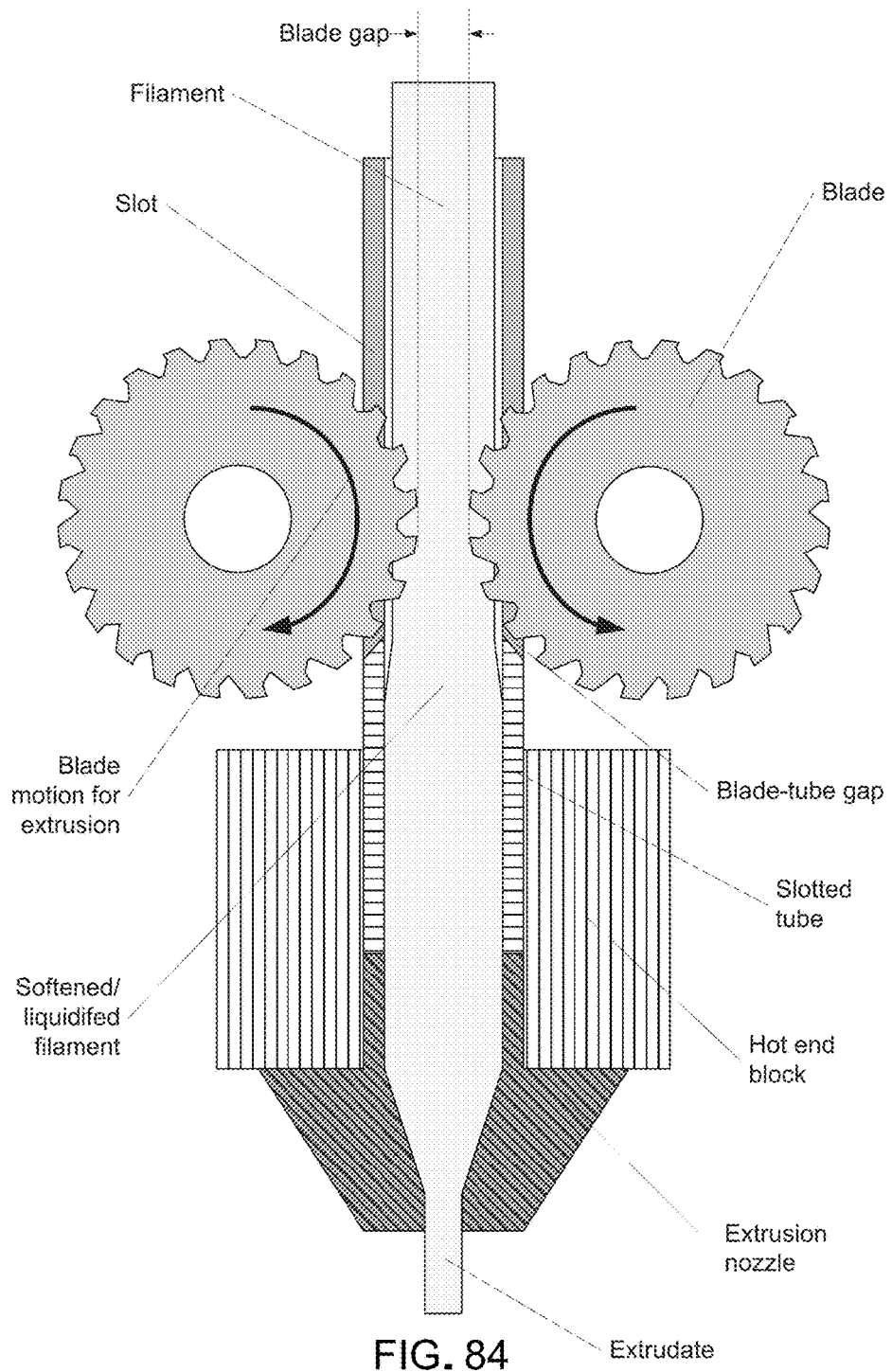
FIGS. 84, 85, 86, 87, 88, 89, 90, 91, 92, 93 depict an extrusion-based printhead able to extrude soft filaments.
Figure 85:
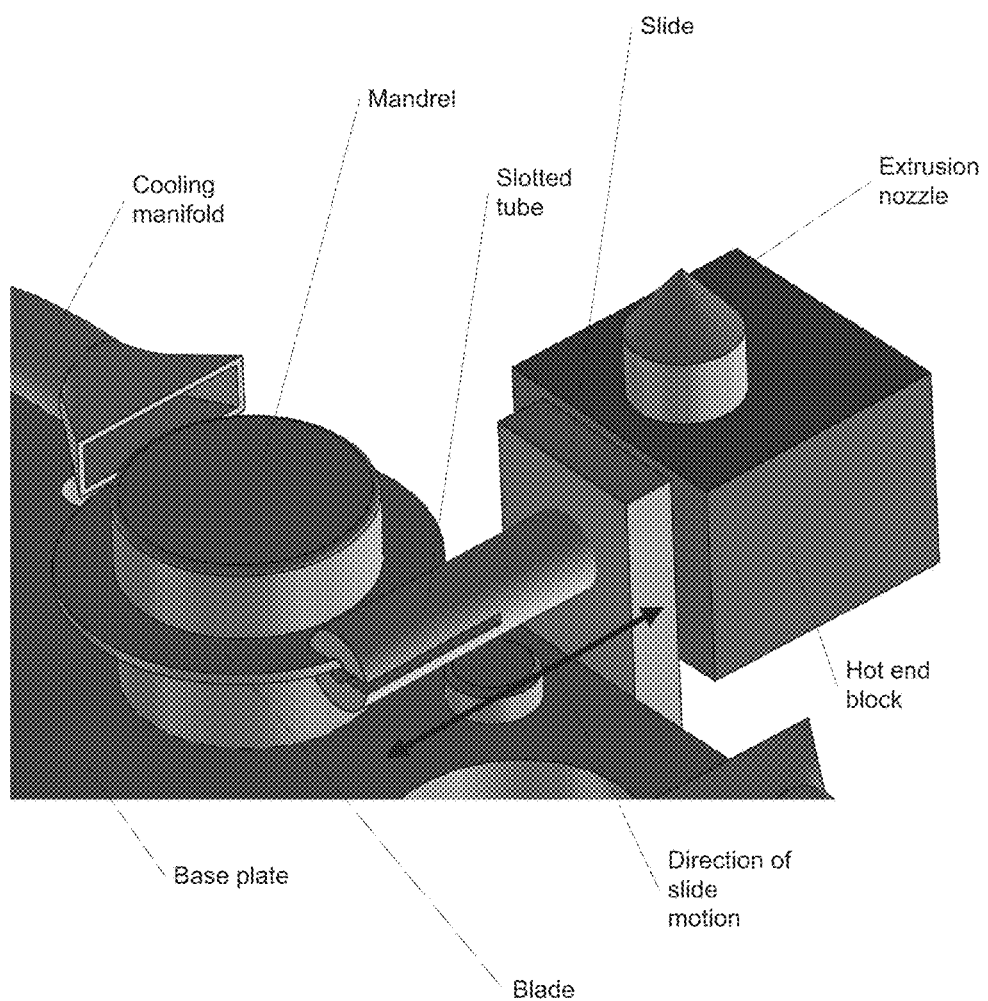

Commercially available FDM filaments typically do not have durometers below 70 or 75 Shore A, comparable to those pursued in the past [Elkins, 1997; Stratasys' E20]. The extrusion of softer (lower durometer and/or lower modulus of elasticity) materials such as Chronoprene with a durometer of 5 Shore A or even Kraton D1162P (with a durometer of 53 Shore A) using a conventional FDM-type printhead is currently not possible due to buckling of the filament en route to the hot end/liquifier when fed by rollers or gears, and/or poor traction on the filament by the rollers or gears, allowing slippage. Therefore, in some embodiments, a printhead/extruder of a design similar to that shown in the cross-sectional view of FIG. 84 may be used. The printhead comprises two relatively thin (i.e., in the direction perpendicular to the drawing sheet) rotating elements, which may have the form of blades as shown (e.g., slitting cutters/saws), but which in some embodiments have the form of thin gears, thin rollers (e.g., with hard or elastomeric surfaces), spiked wheels such as the pounce wheel-like structure of FIGS. 70(a), 70(b), and 70(c), etc. (hereinafter "blades"). The blades are spaced so that the gap (the "blade gap") between their outside diameters is smaller than the diameter of the filament to be fed. The blades are driven to counter-rotate as shown, such that the blade rotation forces the filament toward the heated "hot end" of the printhead, including the extrusion nozzle (i.e., "downstream"). Surrounding and guiding the filament is a tube similar to the liquifier tube or barrel screw of conventional FDM printheads, but with a key difference: the tube is slotted as shown in FIG. 85, such that blades can engage the filament much further downstream than the gears or rollers of a conventional FDM printhead, located upstream of the liquifier tube/barrel screw, can engage the filament. Use of a slotted tube and thin blades enables the location at which force is applied to the filament to be much further downstream, with the critical result that the filament is pulled through the tube for at least a significant part of its travel, rather than being pushed through as in the prior art. Pulling avoids buckling of filaments that are soft and/or low modulus, allowing them to be efficiently driven into the hot end, where they can be fully liquified and extruded. Meanwhile, the blade gap can be set to be small enough that the blades penetrate the filament enough to grip it securely, without slippage. In some embodiments the extrusion axis of the nozzle is parallel to the filament and filament feed direction, as in FIG. 84. In other embodiments, the extrusion axis is at another angle to the filament/feed direction, such as 90 degrees as in FIG. 85. The design of the hot end block is of course somewhat different for these two embodiments.

Figure 86:
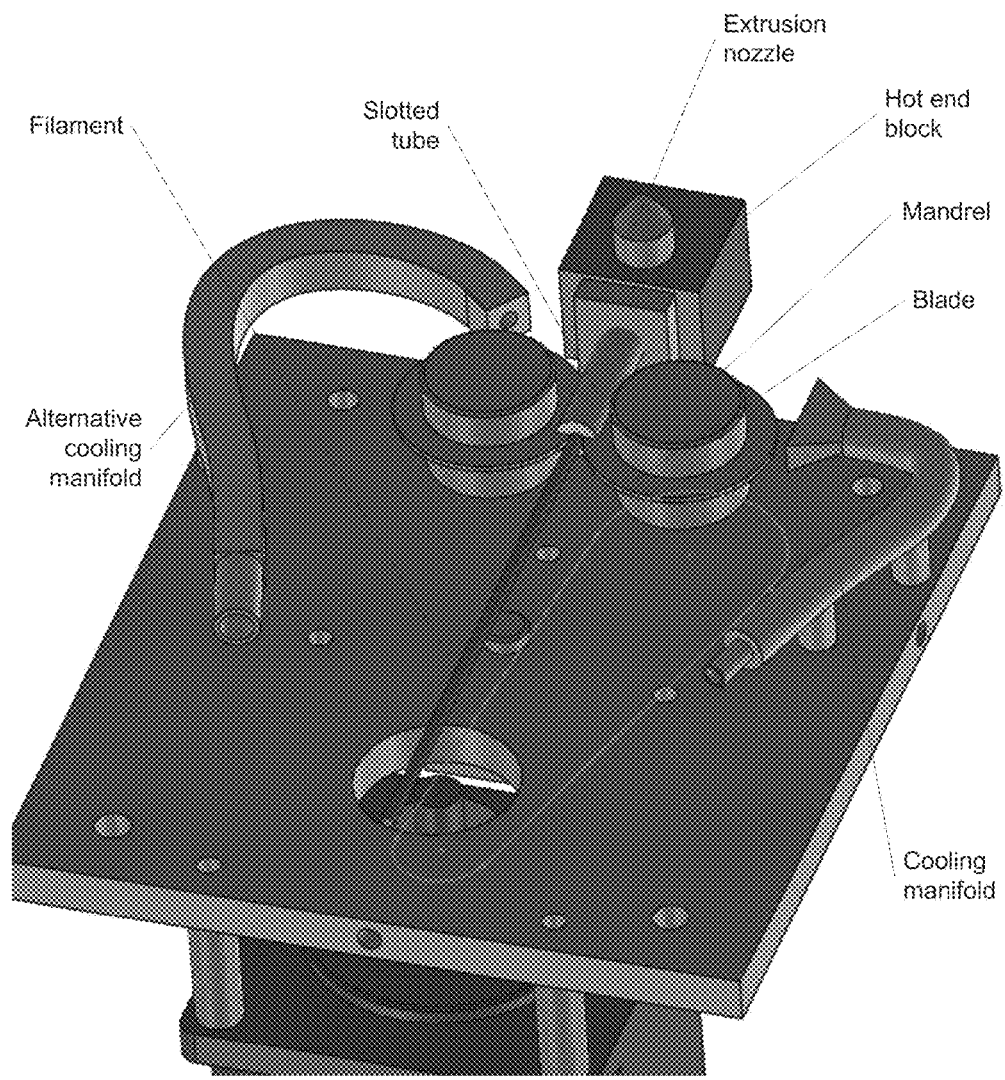
Figure 87:
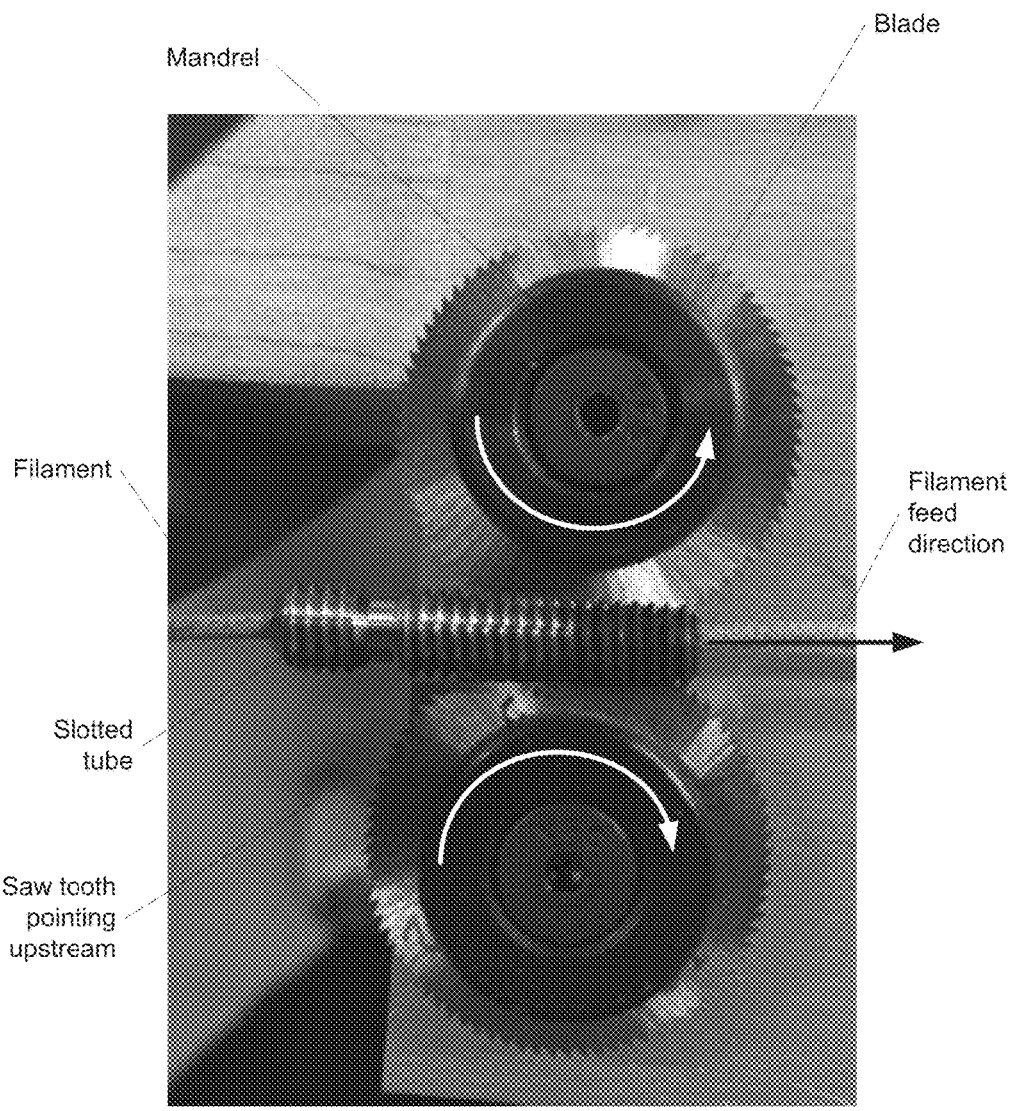

The inside diameter of the tube may be somewhat smaller than the outside diameter of the filament, as shown, or the two dimensions may be close to one another. In some embodiments, filament with non-circular cross-section may be used (e.g., to increase the contact area with the blades or other driving elements. For example, filament may have a square cross section. Softening of the filament may begin in the tube (e.g., in the downstream portion of the tube as shown), or may not occur significantly until further downstream, e.g., where the tube is embedded in the hot end (however in some embodiments the tube and hot end form a single piece). In some embodiments the upstream portion of the tube and/or the filament is cooled by a manifold (as shown in the 3-D views of FIGS. 85-86) through which cooling gas such as compressed air is passed, so as to avoid premature softening of the filament. Soft tubing may be connected to the upstream end of each manifold. The flow from the manifolds should preferably not impinge on the hot end, which may reduce its temperature. In FIG. 86, an alternative design of the manifold is shown on the left, in which the flow is directed more upstream and away from the hot end than in the right-hand design. FIG. 87 is a photograph depicting a slotted tube (which may be externally threaded in some embodiments), two rotating blades mounted to mandrels, and a filament being fed by the blades rotating as shown through the tube in the direction shown.

The blades are preferably located as far downstream as possible, but not so far as to engage the filament in a region where it has begun to soften significantly. In some embodiments, the blades are smaller than shown so that they may be located further downstream. In FIG. 84 it will be noted that the downstream end of the slot may be cut at an angle (e.g., using a slitting saw) so that the tube conforms better to the blade and any solid or semi-solid material that may be separated from the filament by the blades cannot readily escape the tube in the small gap (the "blade-tube gap") between it and the blades, and is instead driven into the hot end. FIG. 85 depicts the hot end block and slotted tube mounted to a slide used in some embodiments which can move in the directions shown to adjust the blade-tube gap. The thickness of the blades is preferably close to that of the tube slot, to minimize escape of material between the blades and the tube. In some embodiments, means of collecting and/or recirculating material that does escape from the tube are provided. In some embodiments, the blade-tube gap is mostly closed by means of a flexure (e.g., steel) or other compliant element on each side of the tube, adjacent to the blade. In some embodiment variations, to accommodate a flexure and allow for reverse operation to retract the filament, the blade teeth may be more symmetric (e.g., triangular) than shown in FIG. 87, or smaller, or blunt/rounded, or no teeth may be used at all (e.g., the "blades" may rely on friction alone), the latter allowing the blade-tube gap to be made extremely small.

As will be noted in FIGS. 84 and 87, if the blades include saw-like teeth, then in some embodiments they may be reversed in orientation when compared with the orientation used for normal sawing/slitting operations: i.e., the sharp tip of each tooth may point upstream rather than downstream. As shown in FIG. 85, the blades are supported on mandrels which allow them to rotate freely. The mandrels may be supported by bearings (not shown) within the base plate which supports much of the assembly. Not shown in FIG. 88 and other figures are a heater (e.g., a cartridge heater) and temperature sensor (e.g., a thermistor or thermocouple) for the hot end block. The slide is preferably made of material of low thermal conductivity (e.g., ceramic, steel) so that the hot end block can be heated efficiently; in some embodiments the block may be mounted to the slide using only the tube and possibly one or more spacer, the intent being to reduce contact surface area and thus heat transfer.

Figure 88:
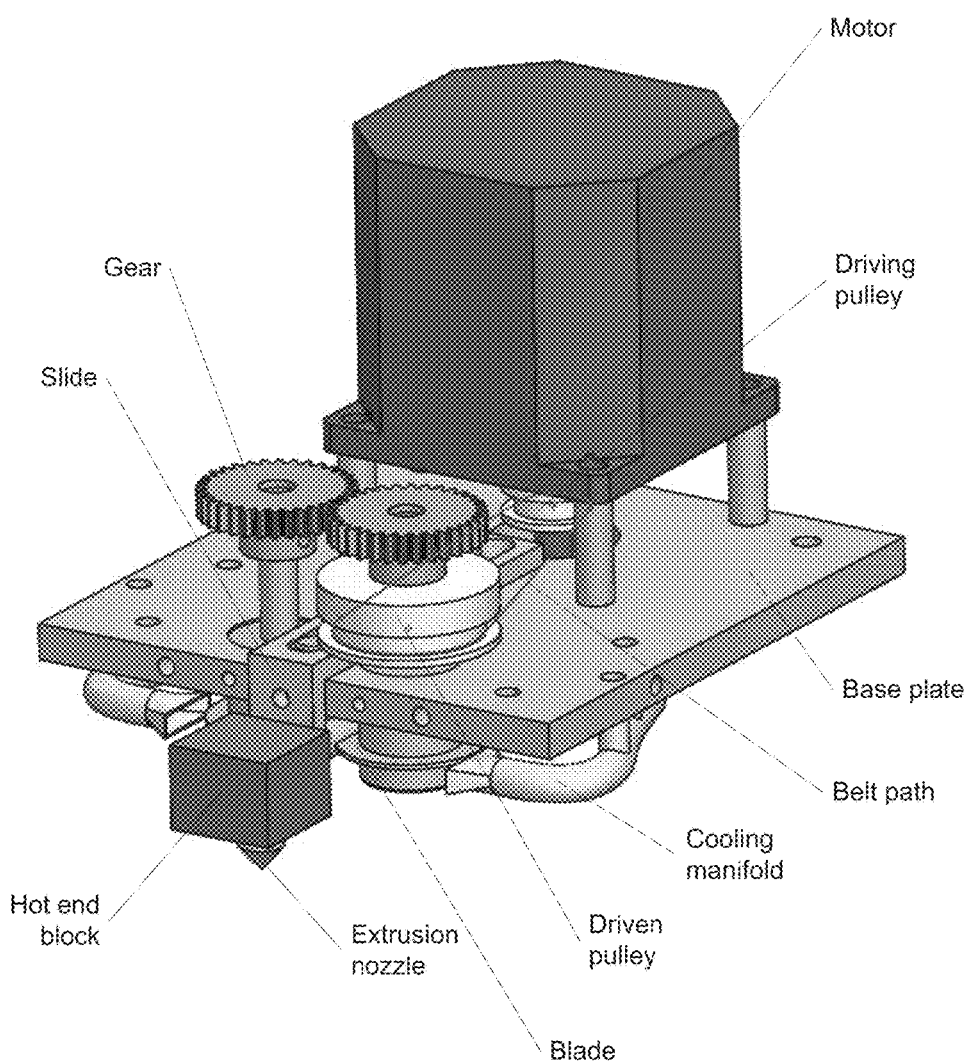

As illustrated in the 3-D view of FIG. 88, the mandrels are driven by gears which are meshed so as to counter-rotate when one mandrel is turned by means of a driven pulley. The driven pulley is turned by a belt (the path of which is shown in outline in this and other figures) connected to a driving pulley turned by a motor. To feed material, the blades are rotated in the direction shown in FIG. 87. As with a standard FDM printhead, reversing the blade rotation can be used to withdraw the filament and to retract the extrudate or prevent seepage of molten material from the nozzle, e.g., to avoid stringers.

In some embodiments, the blade gap may be adjusted (e.g., by incorporating a compliant element in the base plate holding the mandrels) to accommodate different mechanical properties (e.g., hardness) and/or cross-sectional dimensions of filament, and in some embodiments the blades may be spring-loaded against the filament, e.g., with an adjustable force. In cases where the blade gap may be varied, both blades may be driven by belts instead of by gears, to avoid sub-optimal gear tooth engagement. In some embodiments the tube is made from a low-friction material such as PTFE, or is lined with such a material (e.g., coated with PTFE or AMC148-18).

Figure 89:
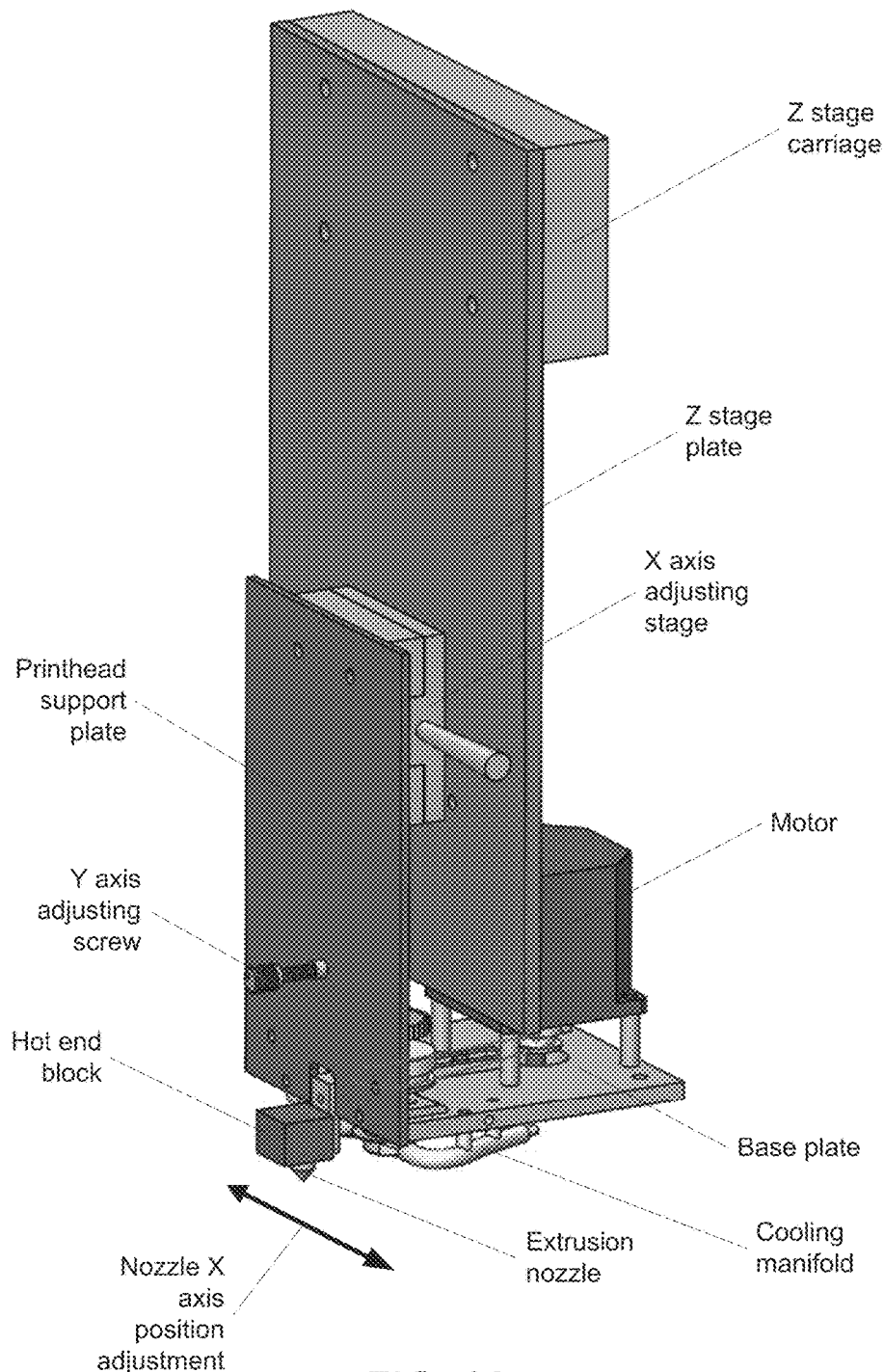
Figure 90:
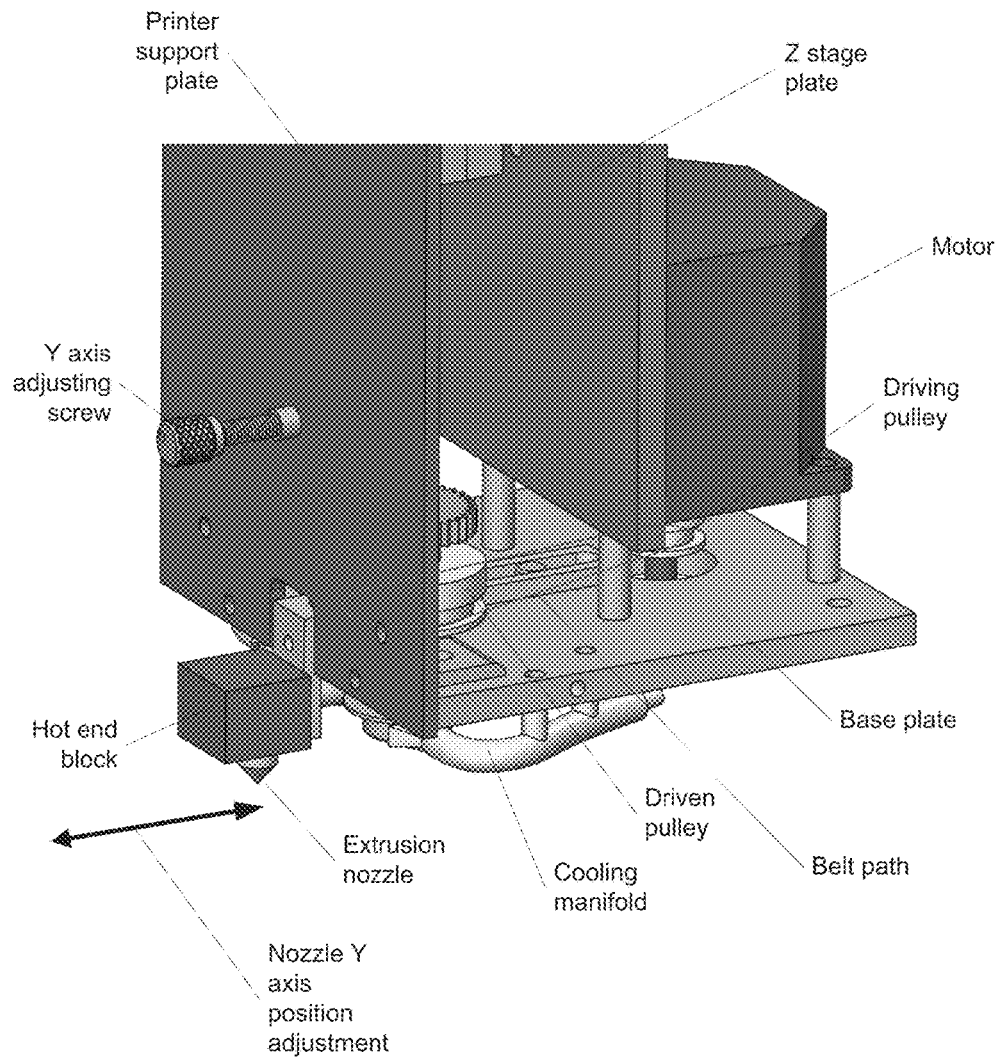
Figure 91:
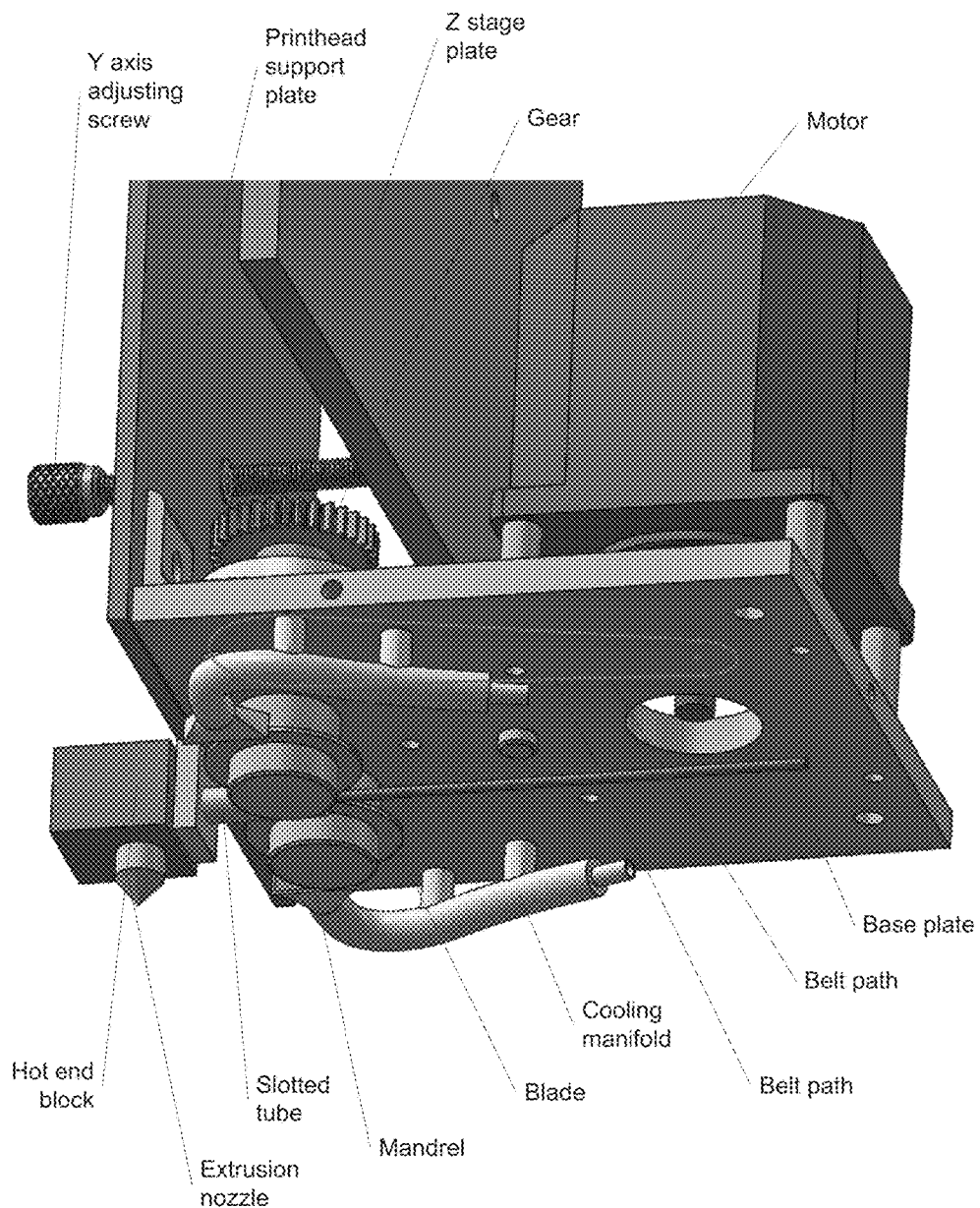
Figure 92:
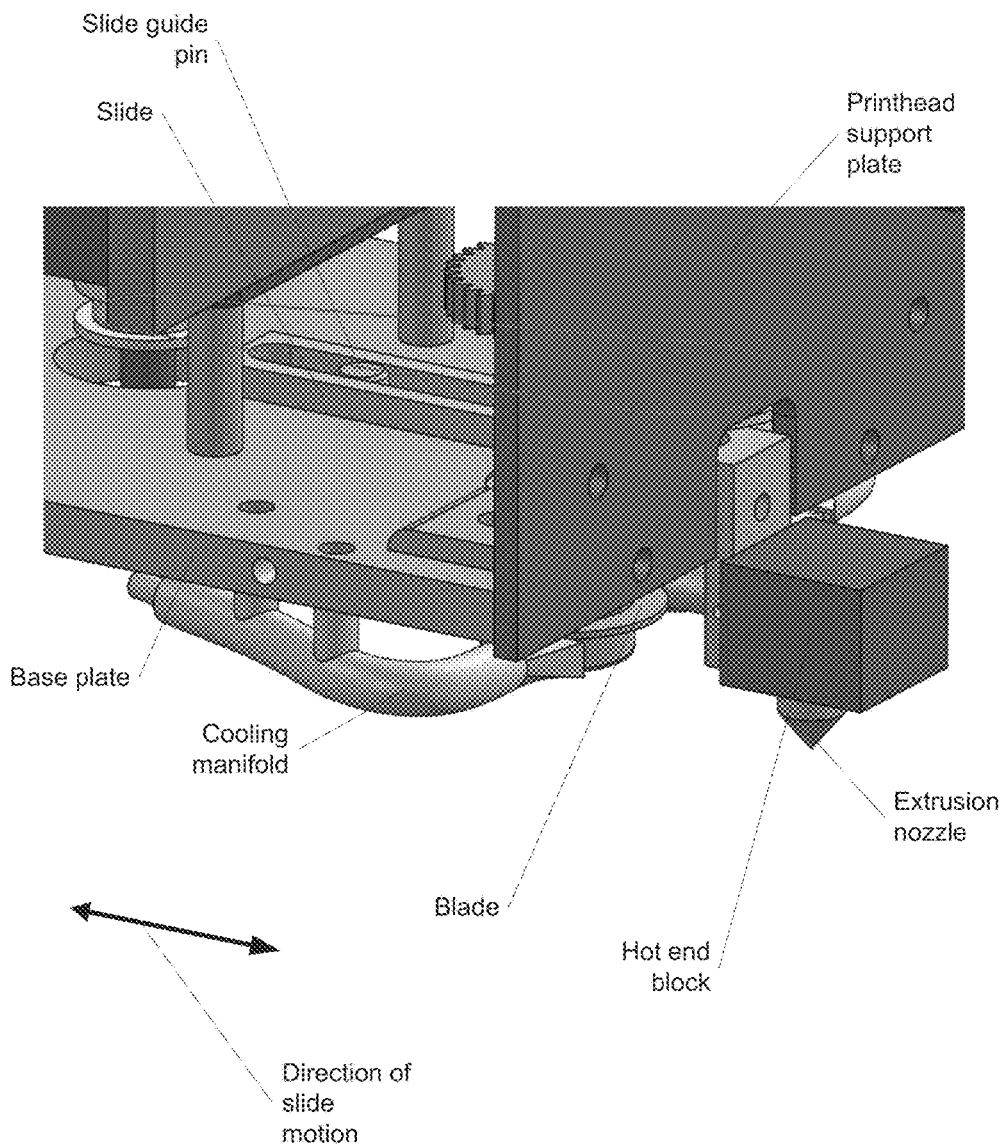

FIGS. 89-92 depict 3-D views the assembly of FIG. 88 in which the base plate is mounted to a flexible printhead support plate used in some embodiments. In some embodiments the support plate is shown mounted to a Z stage plate, which is mounted to the Z stage carriage. Between the Z stage plate and support plate in some embodiments is a stage which allows adjustment of the nozzle position along the X axis as shown in FIG. 89. Meanwhile, as shown in FIG. 90, the support plate can be flexed slightly by tightening or loosening the Y axis adjusting screw to move the nozzle along the Y axis. Such adjustments are useful when aligning the nozzle orifice to be coaxial with the axis of the theta stage of FIG. 42. FIG. 92 provides a useful closeup of the slide, which can move in the direction shown by sliding along guide pins within a slot in the slide.

Figure 93:
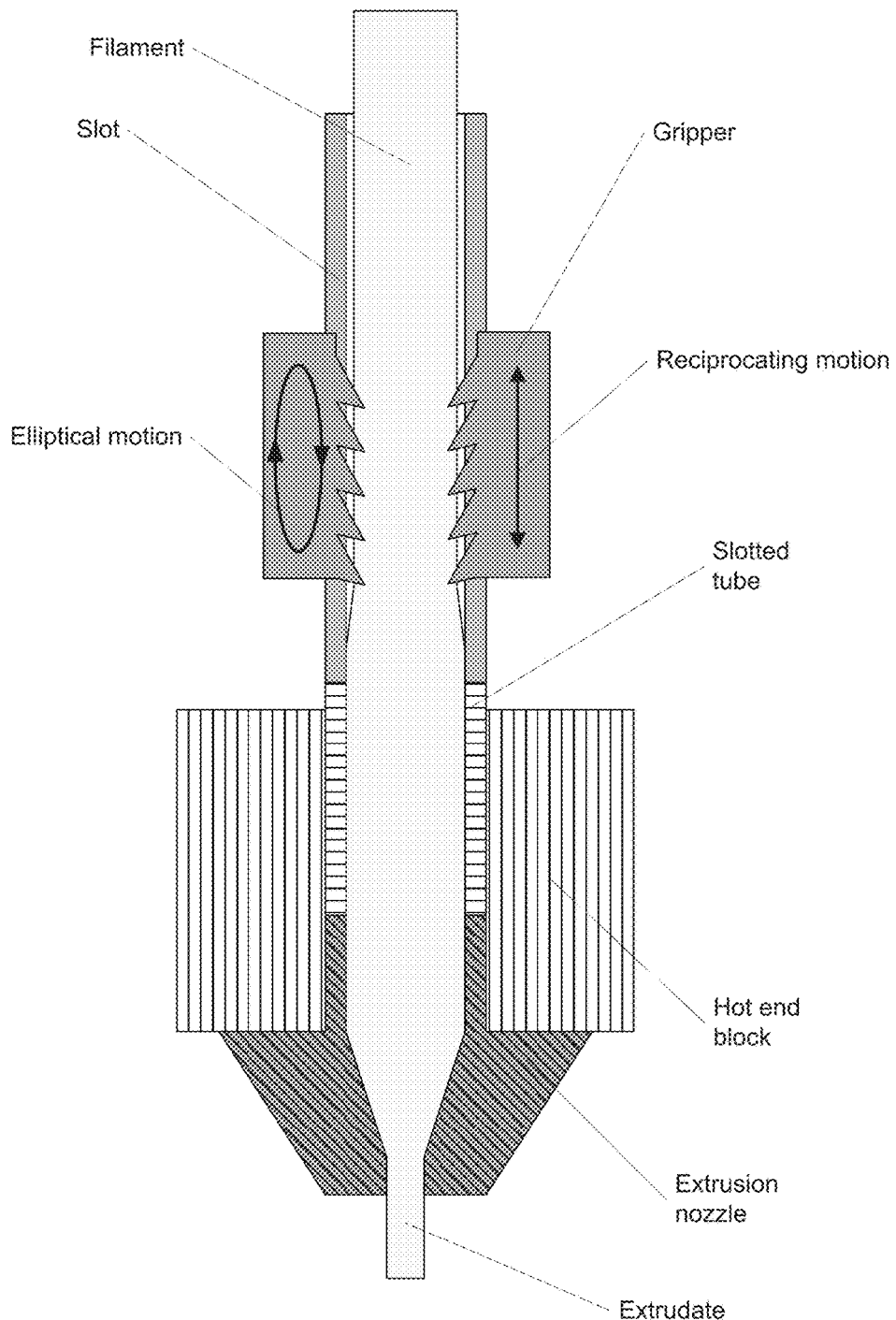

FIG. 93 depicts a cross-sectional view of an extruder similar in some respects to that shown in FIG. 84. However, in lieu of rotating blades two grippers are provided to feed the filament. The grippers can in some embodiment variations be provided with teeth such as the downstream-pointing saw-like teeth shown. In such embodiments the grippers may move in a linear reciprocating motion as shown on the right-hand gripper, pushing filament downstream with each downstream stroke, and with the return (i.e., upstream) stroke slipping on the filament due to the asymmetrical shape of the teeth. In other embodiment variations, the grippers are not provided with teeth, or may be provided with more symmetric teeth, and the gripper motion may be more elliptical or racetrack-shaped: with the gripper closer to the filament during the downstream portion of the stroke, and then further from the filament (so as to not grip it) during the upstream portion of the stroke.

Figure 94:
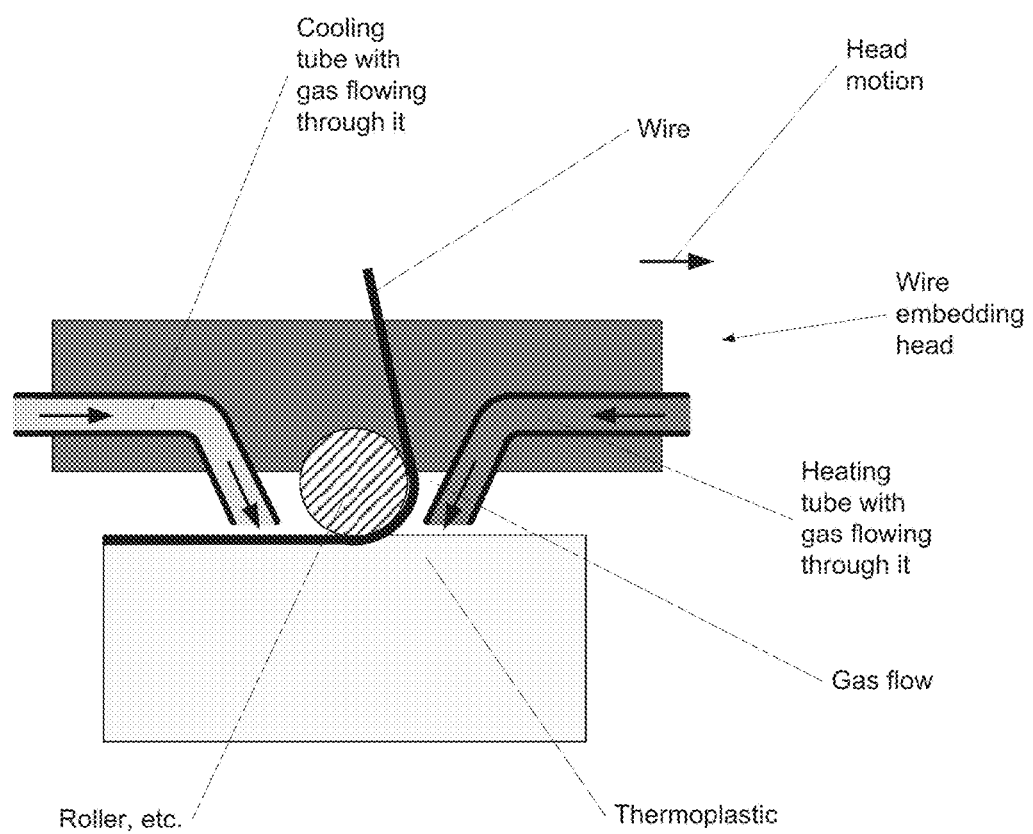
FIG. 94 shows a wire embedding head incorporating cooling and/or heating.

In some embodiments in which wire is embedded into a reflowable/meltable material (e.g., a thermoplastic), as already described for example in connection with FIGS. 13(*a*), 13(*b*), and 13(*c*), the material may be melted or softened prior to embedding the wire through the application of heat or ultrasonic energy. For example, a heat source that precedes an embedding device that embeds the wire (such as a roller) can be used. The heat source may be a laser, an infrared source, a stream or jet of heated gas (e.g., air), etc. FIG. 94 depicts in a cross-sectional elevation view a wire embedding head in which an embedding device (e.g., a roller) presses wire into the surface of a thermoplastic object (e.g., one of more layers fabricated using FDM, selective laser sintering, or an injection-molded part). Ahead of the roller, heating a region of the polymer, is positioned a tube through which heated air is passed such that the air impinges on the polymer and softens or melts it, allowing the roller to press the wire into the surface. In some embodiments, the heated air itself does not sufficiently heat the polymer, but rather, it pre-heats it and the wire is separately heated (e.g., Joule heated, using electrical contacts on the roller, brushes rubbing against the wire at different locations, etc.) by the additional amount required for embedding, or the wire is ultrasonically vibrated (e.g., by the roller serving as a sonotrode). The roller may rotate relative to the fabricated object around an axis perpendicular to the layer (i.e., vertical) or parallel to the local surface normal, or vice-versa.

In some embodiments as shown in FIG. 94, a tube through which gas (in some embodiment variations, chilled gas) is delivered is provided in the wake of the wire embedding device (e.g., a rotating or non-rotating roller) to rapidly solidify the thermoplastic after the wire has been embedded. Such rapid solidification can allow for smaller radius turns/bends of the wire, for example, and reduce the risk of the wire migrating or being pulled out of its intended position (e.g., by tension on the wire). It can also be useful for quickly anchoring the end of the wire, e.g., to allow it to be pulled into the embedding device under controlled tension as the wire embedding head advances.

Figure 95A:
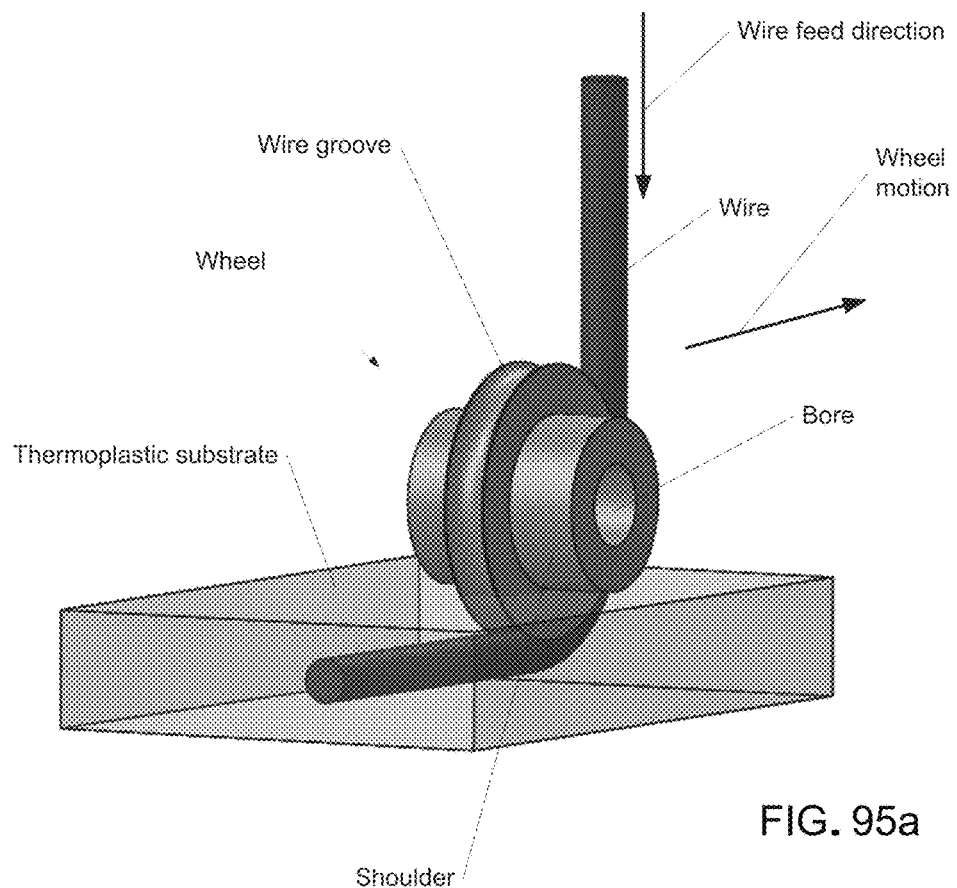
FIGS. 95(a) and 95(b) show wheels used for wire embedding.
Figure 95B:
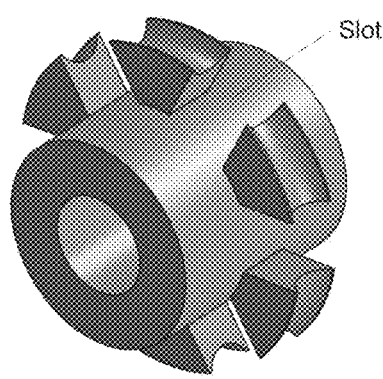
Figure 96A:
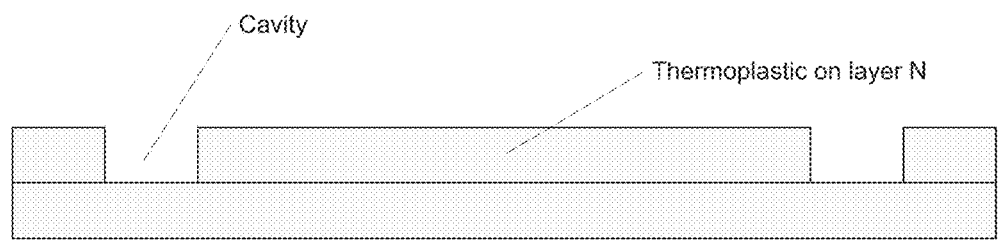
FIGS. 96(a), 96(b), 96(c), 96(d), 96(e), and 96(f) show an approach to wire embedding.
Figure 96B:
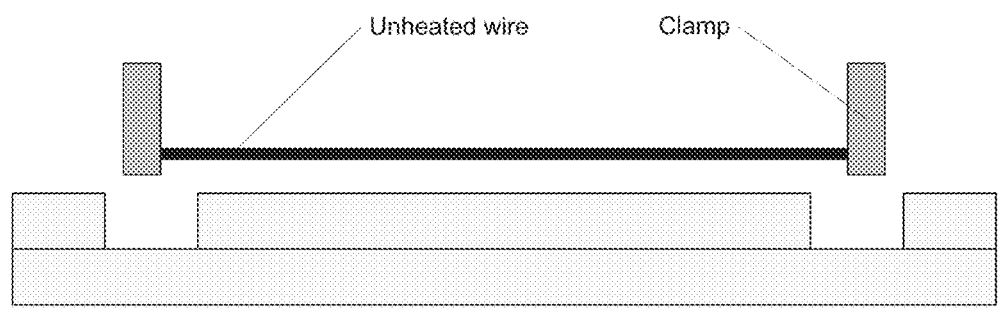
Figure 96C:
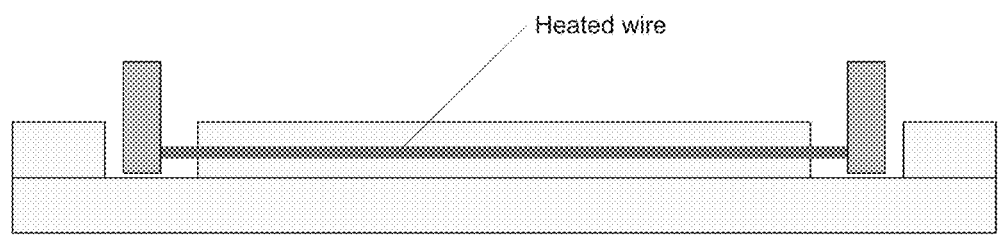
Figure 96D:
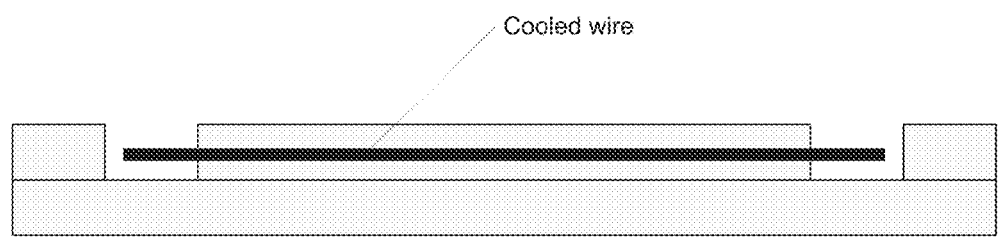
Figure 96E:
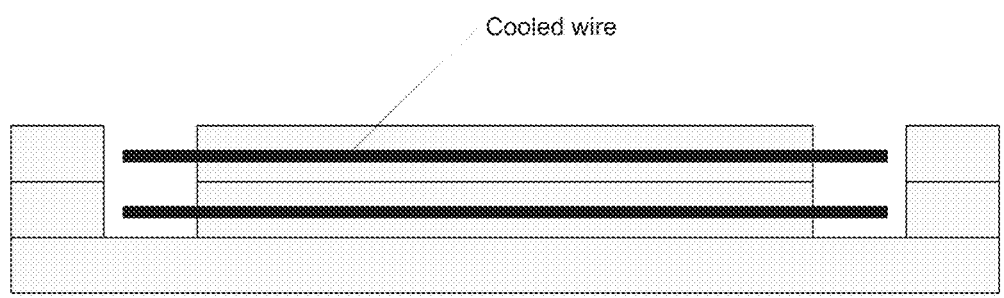
Figure 96F:
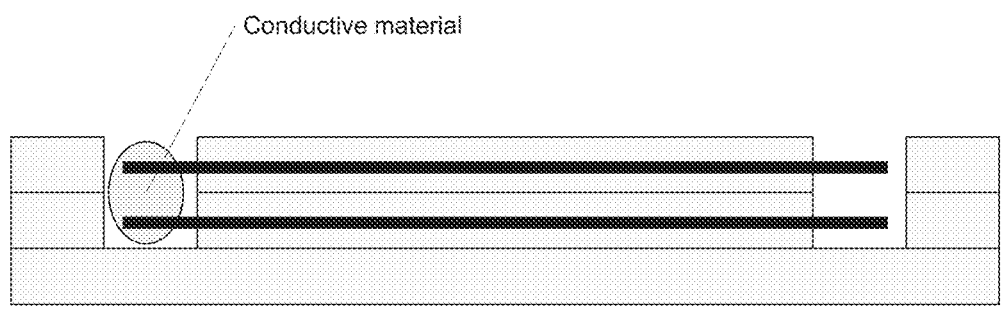

In some embodiments, both a means of heating the polymer ahead of the embedding device and a means of cooling the polymer in the wake of the embedding device is provided, as in FIG. 94, where two tubes are provided. Since the direction of the wire may vary considerably as a toolpath for embedding is followed during the embedding process, the tubes and embedding device may be arranged to rotate (around an axis perpendicular to the object surface, or if the surface is not a planar layer, then parallel to the local surface normal) relative to the thermoplastic object, or vice-versa. In some embodiments, an embedding device other than a roller may be used, such as a plate (e.g., a plate or "ski" having a rounded leading edge). In some embodiments, the roller may be of the form of the wheel shown in the 3-D view of FIG. 95(*a*), or the wheel shown in FIGS. 70(*a*), 70(*b*), and 70(*c*), a variant of which is shown in the 3-D view of FIG. 95(*b*). In FIG. 95(*a*) the wheel is provided with a bore in some embodiments to allow rotation around a shaft (not shown) and in some embodiments with a groove in its central portion to accept wire and keep it centered and in a controlled position on the wheel. The central portion of the wheel is preferably as narrow as possible, to not interfere with embedding wire well below the surface of the thermoplastic substrate, either in the topmost layer or in a layer below the topmost layer. The wheel may rotate in some embodiment variations, or simply slide, serving as a guide. In some embodiment variations, the wheel may be provided with at least one shoulder which can slide or roll upon the surface, controlling the depth of the wire (acting as a stop) and in some embodiment variations facilitating or causing rotation of the wheel as it moves, through contact with the substrate. In some embodiments the depth of embedding is determined not by contact between the shoulder and the substrate surface, but by adjusting the height of the wheel (e.g., by raising and lowering a shaft on which the wheel turns), thus allowing the wire to be embedded at a desired, programmed depth.

As the wheel moves forward, wire is fed toward the substrate. The wire is not necessarily perpendicular to the substrate as it feeds into the wheel as shown in FIGS. 95(*a*) and 95(*b*), and may be introduced at a much smaller angle to the substrate surface (e.g., to minimize residual stress and/or fracture or other damage to the wire). In some embodiments rotation of the wheel may be measured and used to feed the wire at the correct speed. FIG. 95(*b*) depicts a 3-D view of a wheel similar to that of FIG. 95(*a*), but with slots around its periphery. Such slots can be useful to allow polymer to better envelope and capture the wire during the embedding process. Wheels as well as other shapes of embedding device, designed with specific groove shape, groove depth, number of grooves (e.g., a wheel with multiple grooves to accommodate multiple wires), slot size and shape, etc. may be used in various embodiments. Wires that are rectangular or square can be accommodated by suitably-designed grooves. For example, wires that are rectangular can be embedded with the wider dimension perpendicular or parallel to the substrate surface. In some embodiments, the wheel may be designed as a cam (e.g., a spiral cam) and the groove radius may vary with rotation angle. Such a wheel, rotating as needed to select a different radius, but not rolling, can serve as a variable-depth wire embedding device.

FIGS. 96(*a*), 96(*b*), 96(*c*), 96(*d*), 96(*e*), and 96(*f*) depict in a cross-sectional elevation view an alternative approach to embedding wire through the use of wire heating and/or vibration. In FIG. 96(*a*), a layered object fabricated from (dielectric) thermoplastic using AM such as FDM is shown; however, the method may be used for monolithic object such as those which are molded. Cavities (e.g., cylindrical) are provided on either side of a region in which it is desired to embed wire, these can also serve to hold a conductive material used to form a junction, for example. In FIG. 96(*b*), wire held taut between two clamps is introduced above the topmost layer. The wire is then heated (e.g., by passing an electric current through the wire with the two clamps serving as electrodes) and in FIG. 96(*c*) has been plunged into the thermoplastic material on the topmost layer; in some embodiments the cavities may be deeper and the wire plunged further into the object, e.g., several layers below the topmost layer. In some embodiments, the wire may be thicker than a single layer thickness, and may therefore span more than one layer. The wire is then allowed to cool and the clamps are released and withdrawn, as in FIG. 96(d). In FIG. 96(e), the process has been repeated on another layer, and in FIG. 96(f), a conductive material (e.g., solder, solder paste, solder with particulate filler (e.g., metal or metal-coated particles), ECPC, conductive epoxy, conductive ink) has been added to one end of two adjacent wires to form a junction, if required. The material may fill the cavity or as shown, only contact the wires and in some cases be supported by them, without contact with the walls of the cavity.

In some embodiments, the conductive material may be deposited in the cavity prior to introduction of the wire; in such cases the heated wire can not only melt the dielectric material, but also melt and/or reflow the conductive material in the junction, if desired. In some embodiments, using embedding approaches such as those of FIGS. 94, 95(a), and 95(b) which heat the wire or vibrate it ultrasonically, the wire may similarly be embedded into conductive materials already present in the substrate, as well as and in some embodiment variations in the same operation as embedding it into dielectric materials.

In some embodiments, rather than heating the wire to allow it to penetrate, or as an adjunct to heating it, the wire may be vibrated (e.g. at ultrasonic frequencies) using the clamps, for example along its long axis or transverse to that axis. In some embodiments, no cavities are provided initially, but the clamps are able to penetrate the material of their own accord (e.g., they may be heated). Or, the geometry may be such that the clamps extend past the edges of the material to be embedded with wire, and so no cavities are required. In some embodiments, multiple wires may be held by a single or multiple pairs of clamps, and embedded simultaneously (e.g., to different depths).

In some embodiments, the wire is not held by clamps at its two ends as shown, but may be held at other positions. For example, a long piece of wire may be clamped at two locations near its center, and then the segment approximately between the clamps embedded. Other segments of the wire can then be embedded at other angles (i.e., not collinear with the first embedded region), remain un-embedded to connect to other devices or other wires, etc.

Since the wire is under tension, it must normally be straight between the clamps; however, in some embodiments one or more structures intermediate between the clamps (e.g., pins) may be provided so that the wire may follow a more complex path. In the case of straight wires, for example, toolpaths can be automatically calculated that allow for the required circuit or mechanical structure to be produced using straight segments of wire, and cavities (if required) automatically generated to allow for clamps.

While the method of FIGS. 96(a), 96(b), 96(c), 96(d), 96(e), and 96(f) typically involves clamps that hold the wire, the methods of FIGS. 70(a), 70(b), 70(c), 94, 95(a), and 95(b) may benefit from having one end or segment of the wire anchored in the thermoplastic while embedding more of the wire. However, the end or segment, or a section nearby, may need to connect to another wire or element through a junction. In some embodiments, the end or segment may be anchored in dielectric material, but a cavity is provided adjacent to the end or segment that will later be filled with conductive material. In other embodiments, conductive material is provided before the wire is embedded, such that the wire end or segment can be anchored in the conductive material, as well as form an electrical junction.

Figure 97A:
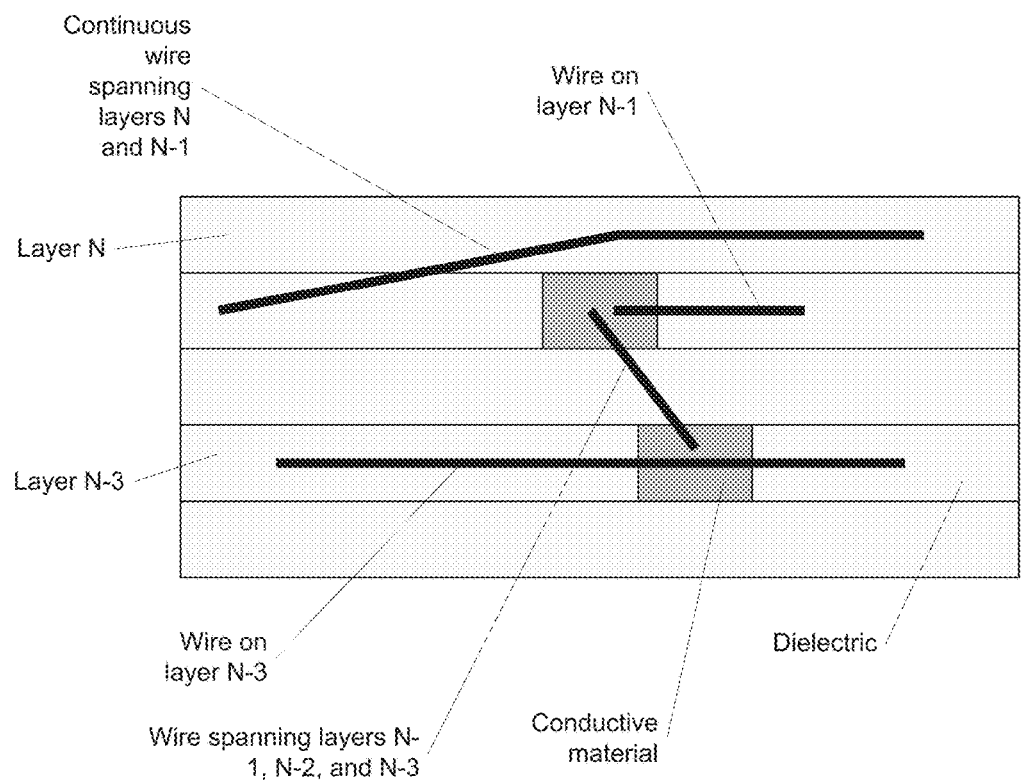
FIGS. 97(a) and 97(b) show wire embedded at variable depths.
Figure 97B:
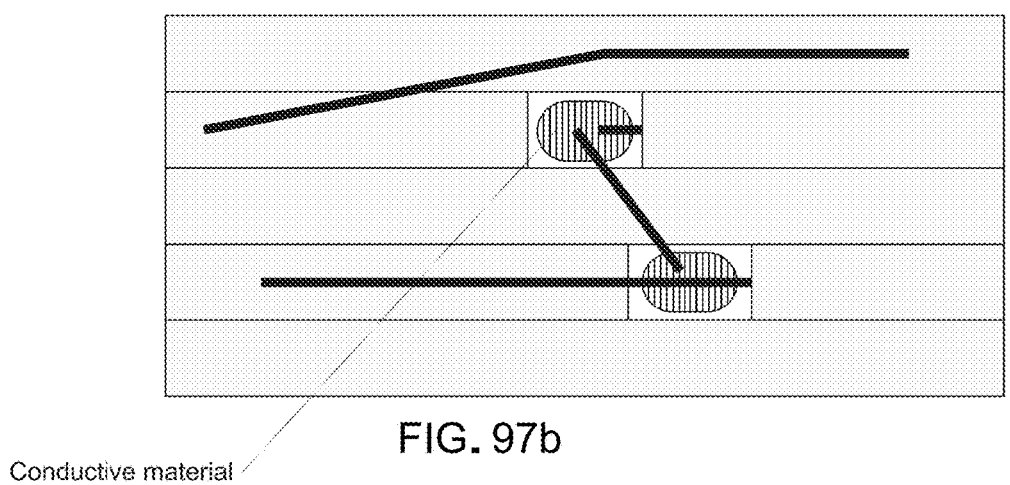

Using embedding methods such as those shown in FIGS. 70(a), 70(b), 70(c), 94, 95(a), 95(b), 96(a), 96(b), 96(c), 96(d), 96(e), and 96(f), the wire depth can be constant for a given wire (being in some cases embedded to a depth greater than the thickness of the last-fabricated layer), or may change along the length of the wire. In some embodiments, the wire may span multiple layers (e.g., within a dielectric, multi-layer object) and form a type of vertical interconnect, as shown in FIGS. 97(a) and 97(b). In FIGS. 97(a) and 97(b), the wire on layer N−3 remains in that layer, as does one wire on layer N−1. However, a wire is depicted starting on layer N−1 and rising at an angle such that it ends up entirely within layer N, bending to become parallel to it. Similarly, another wire is shown ascending at an angle from layer N−3 (where is close to another wire) and terminating in layer N−1, where its end is close to a wire already there. While smooth transitions from layer to layer are shown, in which the wire gradually changes depth, more abrupt transitions are also possible, as are curves in a vertical plane (wires may have a variety of shapes in the horizontal plane). In both figures, the fabricated object includes volumes penetrated by wires in which there is no dielectric, but rather, a conductive material, allowing junctions to be formed. In FIG. 97(a), junctions are formed between wires using a conductive material (e.g., ECPC, conductive epoxy, solder, reflowed solder paste) that fills the volume, contacting the dielectric. In FIG. 97(b), junctions are formed by a conductive material that does not necessarily fill the volume, but which adheres to the wires and may be supported by them. In some embodiments, junctions between wires (or between wires and other structures such as inserted component pads and leads) may be formed by laser welding, ultrasonic or thermosonic wire bonding, conductive powder filling the volume, metals like eutectic gallium-indium alloy which remain liquid at normal temperatures, small "fuzz buttons", wire mutual entanglement, wire wrapping (wrapping one wire around another), etc. For example, a cavity may be formed within which are wires to be joined together. If the cavity is provided with a small aperture (e.g., on its top surface), then wire (e.g., of a smaller gauge than the wires being joined) can be inserted into the cavity so as to make contact, typically in multiple locations, with the wires to be joined, forming a junction. Other materials, including conductive materials at least initially in liquid form, can also be introduced through such apertures to contact the wires within the cavities.

In some embodiments, wires can be embedded one above the other, either aligned or staggered, in an embedding operation that takes place between the formation of two adjacent layers (if an AM process), rather than embedding one wire in a particular X/Y location after each layer is formed. The lowest wire can be embedded first, followed by the next-highest, etc., until all wires are embedded. Some wires may be embedded at a variable depth, as already described. Some embedding devices may provide for embedding multiple wires to multiple depths in a single operation.

In general, wires embedded as described in FIGS. 70(a), 70(b), 70(c), 94, 95(a), 95(b), 96(a), 96(b), 96(c), 96(d), 96(e), 96(f), 97(a), and 97(b) can be of the same or mixed diameters, lengths, materials (including electrically non-conductive fibers such as optical or carbon fibers used for reinforcement or to make resistors), cross-sectional shapes, etc. If wires are embedded close to the surface of the object, as shown in FIG. 94, where a simple cylinder may be used to press the wire into the surface, such that the cylinder cannot penetrate further into the surface, in some embodiments, the wire may be capped by an additional layer of dielectric material above it so that it is not exposed. In general, wires not completely surrounded by dielectric (e.g., embedded too deeply or not deeply enough, or laid along with the extrudate too close to the surface using methods such those shown in FIGS. 29(*a*), 29(*b*), 30(*a*), 30(*b*), and 30(*c*)) can be nonetheless insulated as desired by making provision in the design and/or the "slicing" process that generates the layer cross sections for a capping layer above and/or below the wire.

Methods of embedding wire into already-deposited thermoplastic and methods of simultaneously laying wire and depositing material such as those shown in FIGS. 29(*a*), 29(*b*), 30(*a*), 30(*b*), and 30(*c*) may be combined in the production of a single fabricated object. For example, the latter method may be used to form a layer in which the wire is fairly deeply buried (e.g., at the bottom of the layer), and after the layer is formed, the former method may be used to embed one or more wires above the previously-laid wire. The latter method in general allows wire to be combined with non-thermoplastic materials (e.g., thermosets), can be faster, since wire and dielectric are deposited simultaneously, allows wire to help support poorly-supported structures, allows continuous structures like helical coils to be made, facilitates or enables the formation of large regions of tightly-spaced wires, and enables embedding of especially delicate filaments (e.g., braided wire used in coaxial cable shielding, optical fibers). The former method in general allows wires to be placed along paths that do not necessarily coincide with the path of dielectric extrudates, and may facilitate use of wires that are taller than a single layer or wider than a single extrudate. Nonetheless, the latter method also may be used to embed such taller or thicker wires, for example, by heating the wire and/or the surrounding material using Joule/resistive heating, a localized hot air jet, laser, etc., such that as the wire is laid/co-deposited with the polymer, it also can penetrate into material on the previous layer and/or to its side on the same layer.

In some situations, after either or both methods are used, the surface of the layer may be rougher and/or less planar then desired, or of the incorrect thickness, as a result of laying or embedding wire. Therefore in some embodiments the layer may be smoothed and/or planarized once the wire is in place, before continuing to build the subsequent layer (if any) using a mechanism that softens and reflows the layer surface. In some embodiments, the mechanism can be a heated roller which traverses the layer surface or portion thereof. In other embodiments the mechanism can be a heated plate which contacts the layer. With roller, plate, or other mechanism, the fabricated object may rise using the Z stage to contact the mechanism, while the printhead is moved off to the side. It may be desirable to have the mechanism made from or coated with a non-stick material such as PTFE, and in some embodiments the mechanism may comprise a thin sheet of material that is peeled off of the layer after smoothing or planarizing.

In some embodiments, the pressure exerted on the object associated with embedding wires such as in FIGS. 70(*a*), 70(*b*), 70(*c*), 94, 95(*a*), 95(*b*), 96(*a*), 96(*b*), 96(*c*), 96(*d*), 96(*e*), 96(*f*), 97(*a*), and 97(*b*), due to the wire entering the softened material, may distort or damage the object and/or cause the wire to end up at the incorrect depth. An example of a geometry that may be difficult to embed with wire is a cantilever. This problem may be mitigated in various embodiments through the use of proper supports, through the use of a vacuum system that pulls the structure to be embedded upwards during the embedding process, through the use of a temporary adhesive applied to the embedding device or a nearby device, through the use of a magnet (if the material into which the wire is embedded, or nearby material, is magnetic), etc.

The methods depicted in FIGS. 70(*a*), 70(*b*), 70(*c*), 94, 95(*a*), 95(*b*), 96(*a*), 96(*b*), 96(*c*), 96(*d*), 96(*e*), 96(*f*), 97(*a*), and 97(*b*) may in some embodiments be used in fabricating structures in which wire is embedded after a dielectric thermoplastic material is deposited, but not in regions that are intended to form junctions or cavities to receive components. After embedding wire, junctions may be formed between wires and between wire and other elements (such as pads on bare or packaged integrated circuits) using deposited conductive material such as solder, solder paste, ECPC, or "fuzz buttons", or by using bonding methods such as laser welding, ultrasonic or thermosonic bonding, resistance welding (e.g., squeezing two wires together with electrode "tweezers", such as those made by Assembly Technologies International of Clawson, Mich.), resistance soldering, micro tungsten insert gas (TIG) welding (e.g., using the PUK 5 welder of Lampert, Werneck, Germany), pulse arc welding (e.g., using the welders of Sunstone Engineering, Payson, Utah), etc. These methods may also be used in which the order of events is modified: for example, in which the conductive material is deposited after the dielectric material (or vice versa) and then the wire is embedded.

In some embodiments, a junction, or a portion of a junction, may be fabricated by first fabricating a cavity in dielectric matrix material, through which at least one wire passes, with at some region of the wire(s) unencapsulated in matrix material (i.e., bare). The ECPC regions shown in FIGS. 8(*a*) and 8(*b*) are examples of portions of a junction; such portions when adjacent are electrically shorted, forming a junction. ECPC, solder, or other conductive material is then deposited into the cavity, in some embodiment variations filling it at least in part. In other embodiment variations the deposited conductive material is deposited so as to contact the wire(s), but not necessarily (and in some embodiment variations, intentionally) not contacting the cavity walls. ECPC, for example, may be deposited into the cavity by dispensing it from the nozzle of a filament extruder, a screw extruder (e.g., the extruder shown in FIGS. 145(*a*), 145(*b*), 145(*c*), and 145(*d*)), or a heated tube equipped with a pressure source such as a piston. In some embodiments, the bottom surface of the nozzle is approximately even with the top surface of the cavity, while in other embodiments, the bottom surface is below the top surface, while in still other embodiments, the bottom surface is above the top surface. Having the bottom surface below the top surface of the cavity can help avoid ECPC (or other conductive material) from protruding above the top surface of the cavity. In some embodiments, the cavity, or a portion thereof (e.g., the upper surface) is rectangular (e.g., square) in plan view, while in other embodiments it is shaped otherwise. For example, if the top surface of the cavity has a reasonably accurate circular shape and/or is compliant, a conical nozzle can fit into it and seal against the upper edge while injecting ECPC, minimizing spreading beyond desired volume.

The nozzle can in some embodiment variations be oscillated (e.g., vertically) to push/pack ECPC in a flowable state into the cavity, helping to increase contact between the wire(s) and ECPC, as well as consolidating the ECPC to cause conductive particles to move closer together and form better conductive percolation networks, thereby reducing ECPC resistivity. This can be particularly useful in higher-aspect cavities (e.g., multi-layer cavities for inter-layer junctions, in which ECPC is deposited only after the upper portion of the cavity is formed, rather than on all the layers of the cavity). In some embodiments, a small protruding or extendible element such as a cylinder or pin can be used to pack ECPC into the cavity and/or smooth its top surface (e.g., if heated). In some embodiments, junctions are "capped" by depositing at least one additional layer over the cavity to increase the robustness of the junction and/or wire(s) being joined. In some embodiments, the top layer of the cavity has an aperture smaller than the layer beneath it, such that the ECPC cannot easily leave the cavity, if not sufficiently adherent to the cavity walls or wire(s), but the junction is nonetheless exposed (e.g., to allow an electronic component to be inserted, for example, in making an electronic package, as described below).

In some embodiments, rather than a small cavity which can be filled with ECPC through a nozzle not moving in the X/Y (layer) plane, a larger cavity (e.g., a trench) may be used, such that ECPC is deposited as an elongated extrudate within the cavity. The cavity may be wider at one or both ends than the extrudate, to accommodate excess material that might otherwise protrude above the top of the cavity.

FIGS. 98(a-c) depict in cross-sectional elevation view a junction between wires in two adjacent layers (however, wires in the same layer may also be so joined) made within a cavity in the fabricated object, and used in some embodiments. As shown the junction is at the ends of two wires; however, it may be made along the length of one or both wires in some cases. In FIG. 98(a), the wires are seen from the side, while FIGS. 98(b) and 98(c) depict the junctions as seen in the direction of the arrow shown in FIG. 98(a). The conductive material forming the junction may be deposited onto the wires after both wires are laid or embedded, by applying it to the wires and having it cling and bond to them. For example, a drop of molten solder may be applied to the wires, such as using a nozzle dispenser, or a small amount of solder paste may be applied and then reflowed (e.g., using a localized hot air stream delivered by a unit such as the ZT-2-MIL Hot AirPencil made by Zephyrtronics (Pomona, Calif.), or ECPC may be applied. In some embodiment variations, solder or solder paste can be applied to each wire (each on a different layer) separately, and then, if the solder or paste is in contact or near-contact, the two volumes of solder or paste can be reflowed together to make a junction.

Figure 98D:
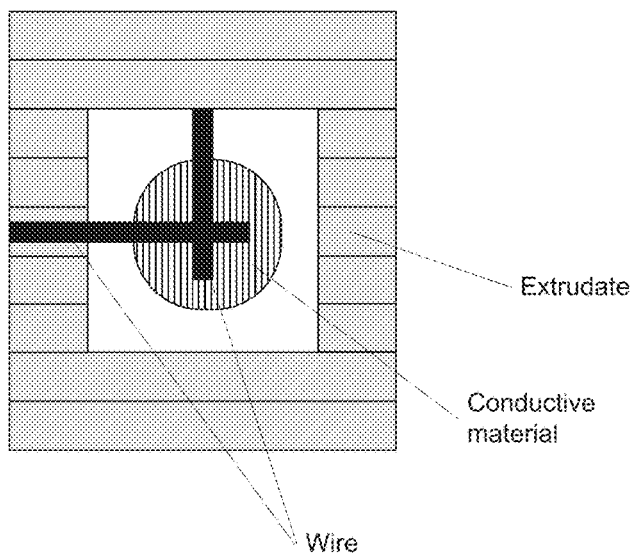

In some embodiments, the conductive material does not contact or at least, not adhere to, the walls of the cavity as shown. Thus, the junction is suspended by the compliant wires and largely isolated from deformations of the cavity wall which might otherwise strain it. Such strain may cause cracking, detachment of the material from the wires, depercolation (in the case of ECPC), etc. While the wires may be aligned vertically as shown in FIG. 98(b), particularly in the case of using higher-viscosity conductive materials such as solder paste, it may be advantageous in some embodiments for the wires to be staggered as in FIG. 98(c), such that the upper wire does not interfere with access of the material to the lower wire. In some embodiments, rather than being substantially parallel as shown in FIGS. 98(a), 98(b), 98(c), 98(d), 98(e), and 98(f), the wires may be at an angle (e.g., 45°, 90°, 180° (anti-parallel)) to one another. It should be noted that if a solder joint (or an ECPC joint) such as those used in some embodiments of FIGS. 98(a), 98(b), 98(c), 98(d), 98(e), and 98(f) were to become hot (due to increases in the fabricated object's environment, Joule heating of the wire, etc.) and melt, the electrical functionality of the junction may be preserved, especially in junctions in which care has been taken to isolate the joined wires from excessive strain, as described.

Figure 98E:
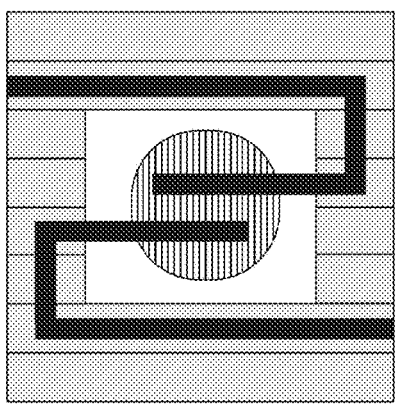
Figure 98F:
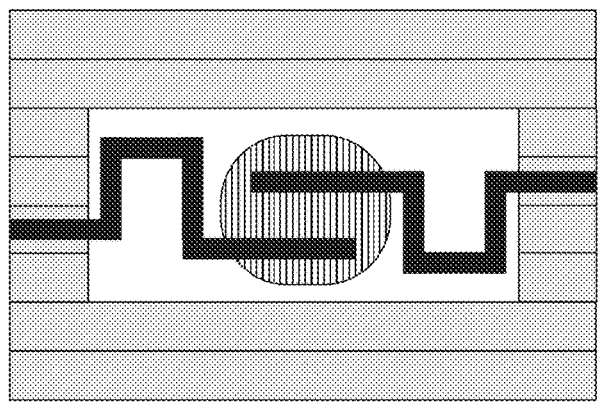

FIGS. 98(d), 98(e) and 98(f) depict junctions in cross-sectional plan view. FIG. 98(d) depicts a junction used in some embodiments similar to that of FIG. 98(a), but in which the wires enter the junction from different angles (e.g., at 90° apart as shown). In this arrangement, wires on the same layer can also be joined. Such an arrangement can be helpful in isolating the junction from stress and strain, and also facilitates (as with the arrangement of FIG. 98(c) the conductive material reaching the lower wire. FIG. 98(e) depicts a junction in which the wires leading to the junction undergo one or more bends en route to the junction (in practice the bends may be more rounded than shown). This helps the wires be more solidly anchored within the surrounding dielectric, distributes any stress applied to the wires, and further isolates the junction from stress and strain. In FIG. 98(f), one or more wires entering the cavity are allowed to bend into a serpentine, spiral, or other pattern which adds length to at least one wire and provides more compliance, further isolating the junction from stress and strain. The approaches of FIGS. 98(e) and 98(f) may of course be combined in some embodiments for a combined advantage.

Figure 99:
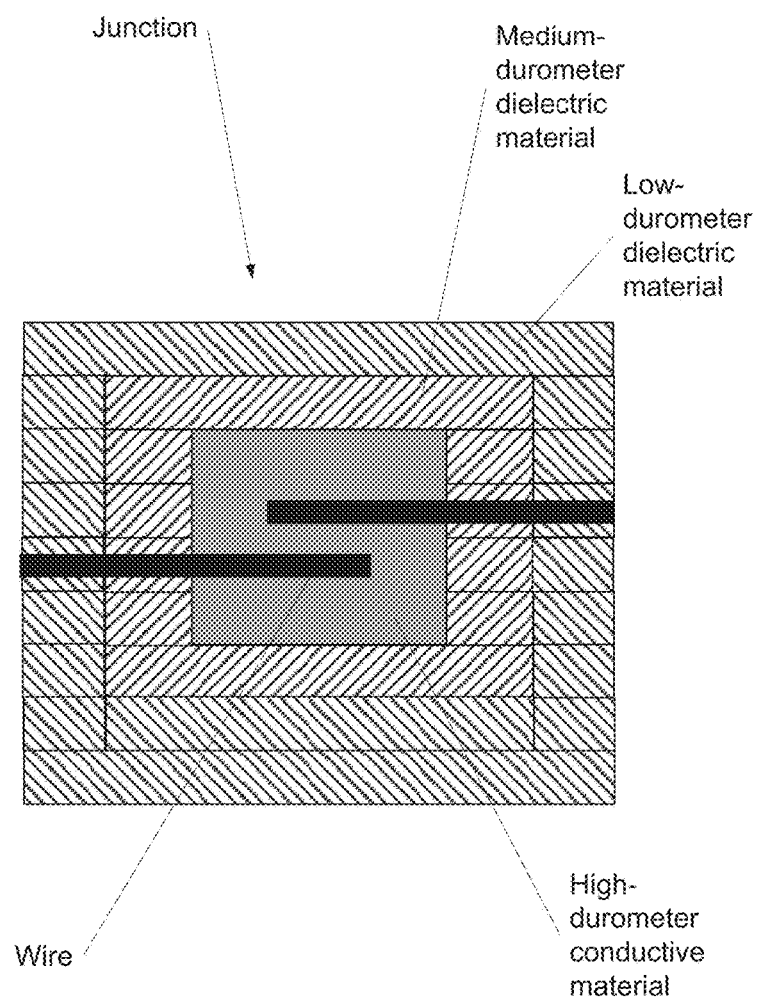

FIG. 99 depicts a cross-sectional view of a stress and strain-isolating junction used in some embodiments. The figure can represent either an elevation view or a plan view. Wires enter a volume of high-durometer/high-modulus of elasticity conductive material such as an ECPC. This is surrounded by a medium-durometer/medium-modulus dielectric material, and the latter is further surrounded by a low-durometer/low-modulus dielectric material (of which much of the object may be composed). Due to the gradient in hardness/modulus, the stresses and strains of the junction are mitigated. In some embodiment variations, the materials are mutually adherent, while in other embodiment variation they are not. In some embodiment variations, more gradations in hardness/modulus may be used, and in some embodiment variations, the gradient may be continuous, with material properties gradually varied in the vicinity of the junction. In some embodiments, the medium-durometer material shown in the figure may be eliminated, with the junction simply comprising a hard conductive material encapsulating portions of at least two wires, the hard material embedded within relatively soft material comprising the fabricated object.

Figure 100:
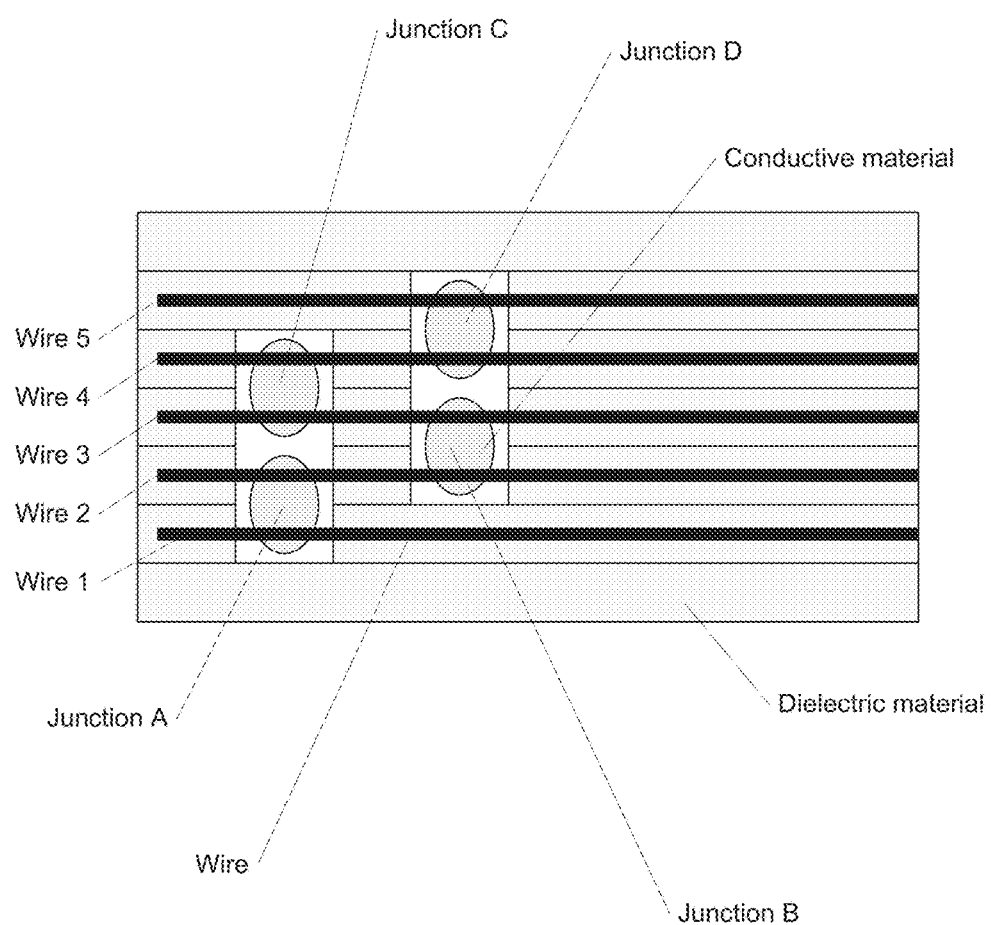

FIG. 100 depicts a cross-sectional elevation view of several layers of dielectric material with internal wires and with junctions between certain wires. In the current situation, it is desirable to connect together all the wires at their ends with a vertical "via" or equivalent. If a method (e.g., solder or solder paste) of forming the junctions is used that can only span a limited number of wires (e.g., two as shown) is used, then a satisfactory equivalent via may be achieved using a staggering approach. Such an approach may be required when there is a risk of reflowing a solder joint while attempting to create another one involving one of the same wires directly above it, for example. As shown in the figure, wires 1 and 2 can be connected at Junction A; wires 2 and 3 at Junction B, which is not aligned vertically with junction 1; wires 3 and 4 at Junction C, which is not aligned vertically with Junction B but may be aligned as shown with Junction A; and wires 4 and 5 at Junction D, which is not aligned with Junction C but may be aligned with Junction B.

Figure 101:
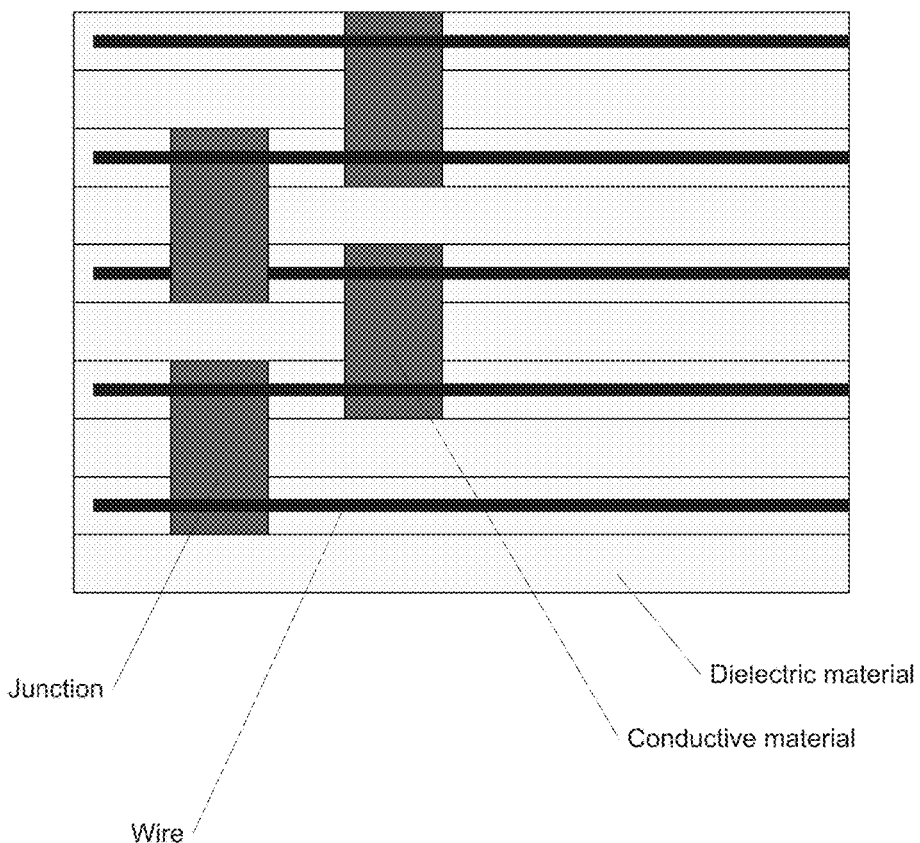
Figure 102A:
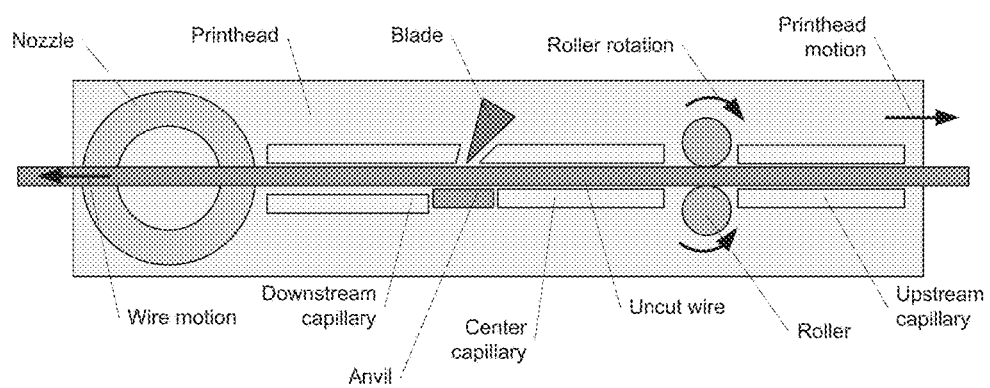
FIGS. 102(a), 102(b), 102(c), and 102(d) show a wire cutting and feeding apparatus.
Figure 102B:
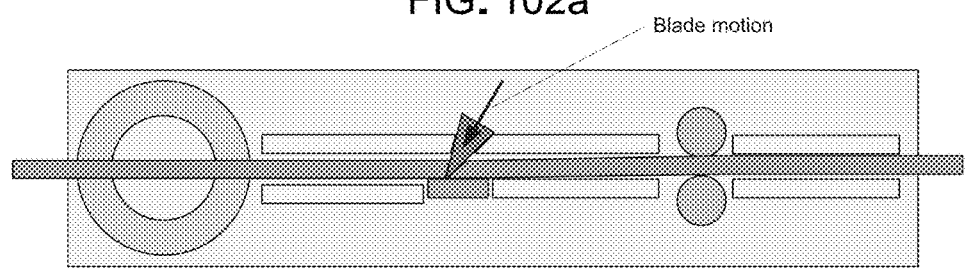
Figure 102C:
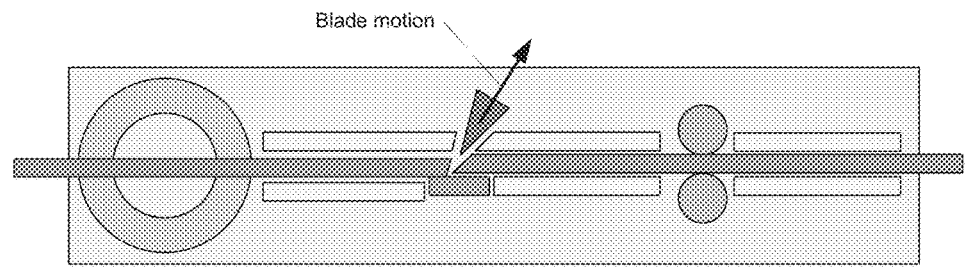
Figure 102D:
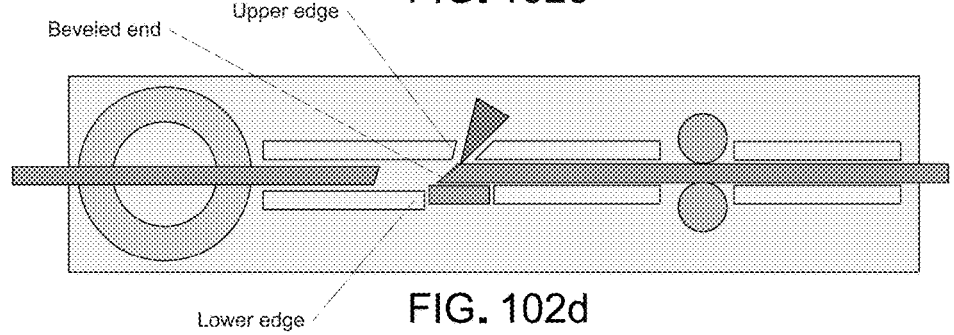
Figure 103A:
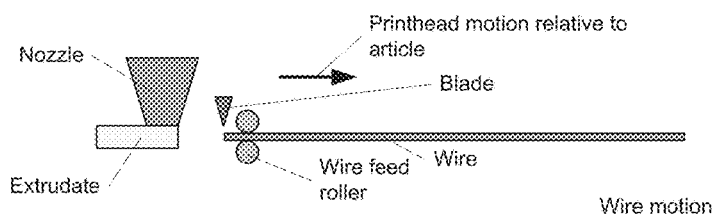
FIGS. 103(a), 103(b), 103(c), 103(d), 103(e), 103(f), 103(g), 103(h), 104(a), 104(b), 104(c), 104(d), 104(e), 104(f), 104(g), 104(h), 105(a), 105(b), 105(c), 105(d), 105(e), 105(f), 105(g), 105(h), 105(e'), 105(f'), 105(g'), 105(h'), 105(i'), 105(e"), 105(f"), 105(g"), and 105(h") depict methods for printing with wire and extruded material.
Figure 103B:
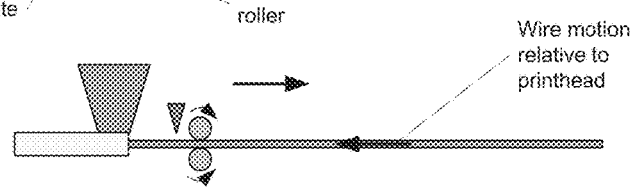
Figure 103C:
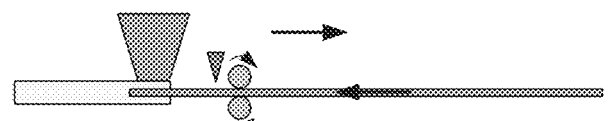
Figure 103D:
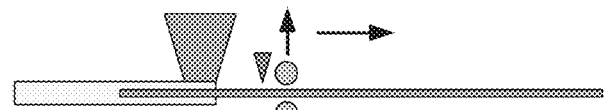
Figure 103E:
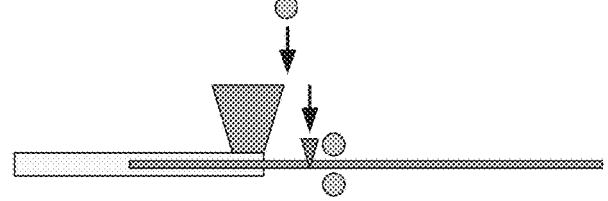
Figure 103F:
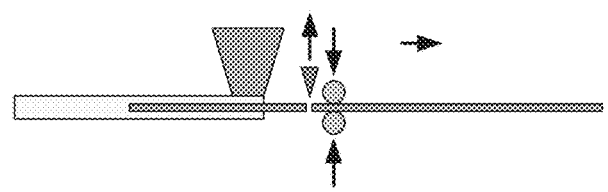
Figure 103G:
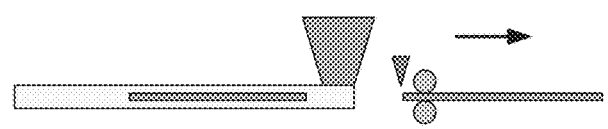
Figure 103H:
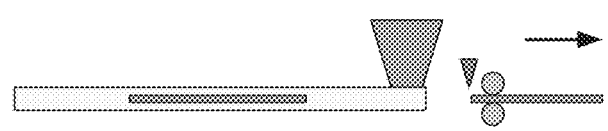
Figure 104A:
Figure 104B:
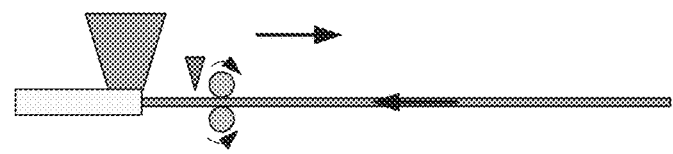
Figure 104C:
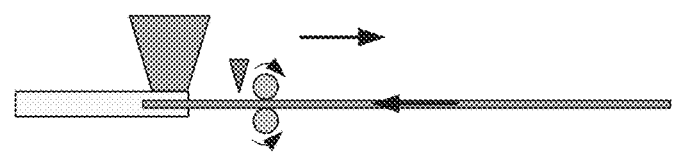
Figure 104D:
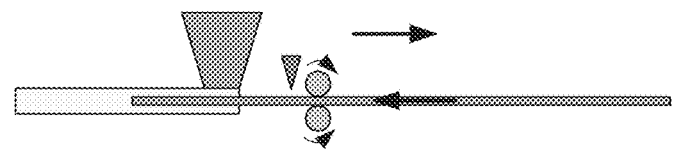
Figure 104E:
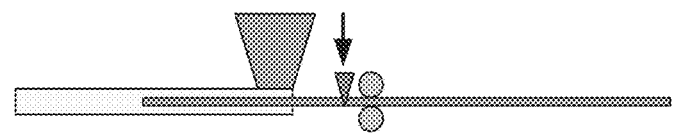
Figure 104F:
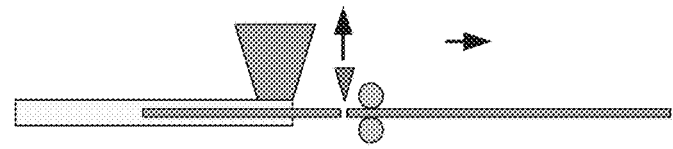
Figure 104G:
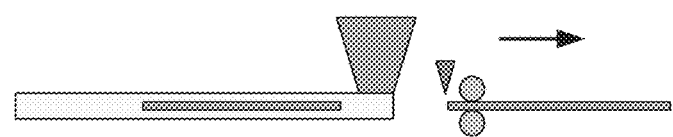
Figure 104H:
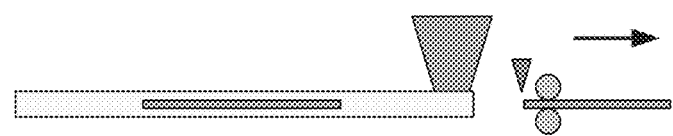

As shown in the cross-sectional elevation view of FIG. 101, in some cases, the junctions may be made using a conductive material (e.g., a hard ECPC) that is relatively high in modulus compared with the dielectric material, which may be a soft elastomer. Created a vertical via of such material would potentially stiffen the fabricated object in undesirable ways. In lieu of a strictly vertical via, therefore, in some embodiments a staggered vertical via may be employed. In FIG. 101, it may be observed that conductive material is used only in localized regions that are discontinuous both along the layer stacking (i.e., vertical) axis and along other axes, thus avoiding a stiffening effect while still allowing, all wires to be connected together as intended.

FIGS. 102(*a*), 102(*b*), 102(*c*), and 102(*d*) depict a wire cutting and feeding apparatus used in some embodiments that is similar to that of FIGS. 33(*a*), 33(*b*), 33(*c*), 33(*d*), and 33(*e*). In the current apparatus, however, as shown in the figures, the blade is not perpendicular to the wire axis, and moves along a path that is also not perpendicular to it, thus cutting the wire to create a beveled end. Moreover, the downstream capillary is enlarged in inside diameter. In FIG. 102(*a*), the wire is being fed normally by the rollers. In FIG. 102(*b*), the wire has stopped being fed, and the blade has advanced to cut the wire against the anvil. In some embodiments, the wire can be cut by diamond blades, or by extremely sharp and thin steel blades such as the "Feather" blades made by the Feather Safety Razor Co., Ltd. of Japan. It is highly desirable to not leave burrs on the wire that interfere with entering or passing through the capillary. To maintain blades in a sharpened state, blades can be replaced as needed, and blades that have long cutting surfaces such as Feather blades can be indexed parallel to the cutting edge so that worn regions can be replaced with sharp ones. In FIG. 102(*c*), the blade has been withdrawn and in FIG. 102(*d*), the downstream segment of wire has been retracted away from the blade (e.g., by advancing the wire feeder/cutter and printhead without feeding more wire). The next time wire is fed, it will be able to enter the downstream capillary without difficulty for several reasons: 1) the lower edge of the downstream capillary is lower than the anvil, such that the lower edge of the wire will not catch on the edge; 2) the beveled surface of the wire tends to push the wire downwards and away from the upper edge of the downstream capillary as the wire advances, avoiding getting caught; and 3) the edge of the retracted blade in some embodiments helps keep the wire down and away from the upper edge. The downstream capillary, which in some embodiments is the last conduit for the wire on its way to the nozzle, may be provided with frictional means (not shown) such that wire inside of it cannot fall out of its own accord, but remains inside until pushed or pulled. Suitable frictional means include a spring such as a flexure contacting the wire through a cutout in the capillary, an internal obstruction such as a crimped region, etc.

FIGS. 103(*a*), 103(*b*), 103(*c*), 103(*d*), 103(*e*), 103(*f*), 103(*g*), and 103(*h*) provide simplified schematic views of an apparatus such as that of FIGS. 33(*a*), 33(*b*), 33(*c*), 33(*d*), and 33(*e*), or 102(*a*), 102(*b*), 102(*c*), and 102(*d*), and a first method for feeding, cutting, and laying wire used in some embodiments to create an extrudate which contains wire in some regions and no wire in others. In FIG. 103(*a*), the printhead (including the extrusion nozzle and the wire feeder/cutter) is moving to the right while the nozzle extrudes material (or equivalently, the object being fabricated is moving to the left). In FIG. 103(*b*), as the printhead continues to move, the rollers advance the wire until it contacts the molten extrudate. In some embodiments wire is preferably not advanced to this position until it is ready to be laid/encapsulated within the extrudate since the extrudate might (especially if cooling means are provided) inadvertently capture it. This is especially true of short pieces of wire which may be inside the downstream capillary and which are too short to be reach the roller, which might otherwise retain them (though risking distortion or damage to the object). However, the wire may be advanced to a position closer to the extrudate than that shown in the figure.

In FIG. 103(*c*), as the printhead continues to move, the rollers continue to advance the wire into the extrudate until it is positively captured/anchored. Then, as in FIG. 103(*d*), in some embodiments the rollers disengage from the wire, separating as shown, or in other embodiments simply stop being driven and become free to rotate without resistance. As the printhead continues to more to the right, the wire remains in place with respect to the fabricated object, entering the extrudate that is being deposited around it. While this occurs, wire is dispensed from a supply spool or similar as needed. In FIG. 103(*e*), the printhead has in some embodiments stopped as shown (in other embodiments if the cutting is rapid enough, or if stretching of the wire is desirable before cutting, the printhead may continue to move, perhaps more slowly) so as not to apply tension to the wire and risk pulling it out of the extrudate, damaging or distorting the part, etc. Also, the blade has moved into the wire (e.g., rapidly) to cut it. In FIG. 103(*f*), the blade has retracted, the rollers have re-engaged the wire (or no longer rotate freely), and (in some situations, as shown) the printhead has begun again to move and extrude, now that the wire is cut. In FIG. 103(*g*), the printhead is moving to the write, forming extrudate without wire as shown. FIG. 103(*h*) is essentially equivalent to FIG. 103(*a*); the printhead may continue to form pure extrudate, or as in FIG. 103(*b*), preparation for delivering wire may occur next.

FIGS. 104(*a*), 104(*b*), 104(*c*), 104(*d*), 104(*e*), 104(*f*), 104(*g*), and 104(*h*) provide simplified schematic views of an apparatus such as that of FIGS. 33(*a*), 33(*b*), 33(*c*), 33(*d*), and 33(*e*), or 102(*a*), 102(*b*), 102(*c*), and 102(*d*), and a second method for feeding, cutting, and laying wire used in some embodiments which creates an extrudate which contains wire in some regions and no wire in others. FIGS. 104(*a*), 104(*b*), and 104(*c*) are identical to FIGS. 103(*a*), 103(*b*), and 103(*c*), with the same events occurring. However, this second method varies beginning with FIG. 104(*d*), in that the rollers continue to feed wire. As the printhead continues to more to the right, the wire remains in place with respect to the fabricated object, entering the extrudate that is being deposited around it. While this occurs, wire is dispensed as needed. In FIG. 104(*e*), the printhead has in some embodiments stopped as in FIG. 103(*e*) and the blade has cut the wire. In FIG. 103(*f*), the blade has retracted and the printhead has (in some situations, as shown) begun again to move and extrude. FIGS. 104(*g*) and 104(*h*) are identical to FIGS. 103(*g*) and 103(*h*), with the same events occurring.

FIGS. 105(*a*), 105(*b*), 105(*c*), 105(*d*), 105(*e*), 105(*f*), 105(*g*), 105(*h*), 105(*e'*), 105(*f'*), 105(*g'*), 105(*h'*), 105(*i'*), 105(*e"*), 105(*f"*), 105(*g"*), and 105(*h"*) depict simplified schematic views of an apparatus such as that of FIGS. 33(*a*), 33(*b*), 33(*c*), 33(*d*), and 33(*e*), or 102(*a*), 102(*b*), 102(*c*), and 102(*d*), and a method for feeding, cutting, and laying wire used in some embodiments in which extrudate having bare wire at each end may be produced. In FIGS. 105(*a*), 105(*b*), 105(*c*), 105(*d*), 105(*e*), 105(*f*), 105(*g*), and 105(*h*), bare wire of a medium length results at the right end of the extrudate, while in FIGS. 105(*e'*), 105(*f'*), 105(*g'*), 105(*h'*), and 105(*i'*), which replace and supplement FIGS. 105(*e-h*), bare wire of a long length results. In FIGS. 105(*e"-h"*), which replaces FIGS. 105(*e*), 105(*f*), 105(*g*), 105(*h*), bare wire of a short length results.

Figure 105A:
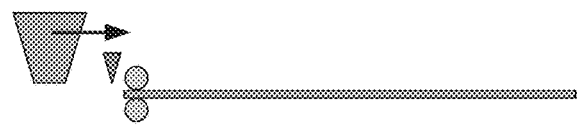
Figure 105B:
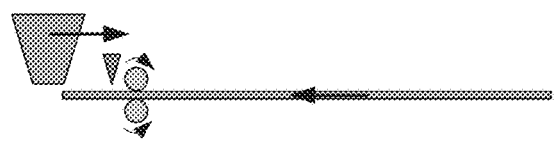
Figure 105C:
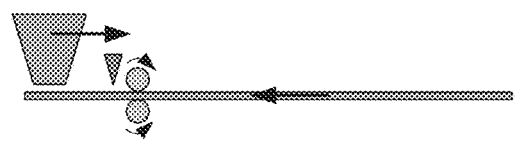
Figure 105D:
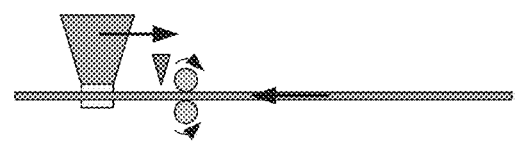
Figure 105E:
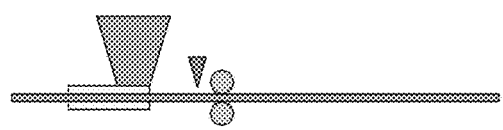
Figure 105F:
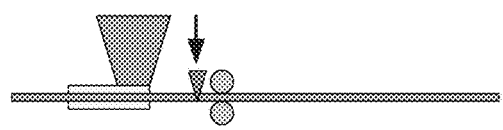
Figure 105G:
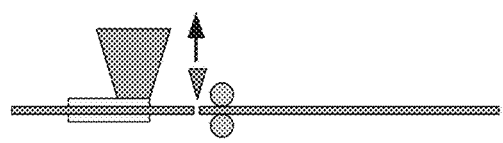
Figure 105H:
Figure 105E:
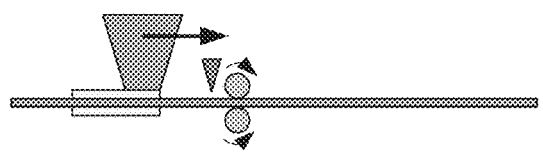
Figure 105F:
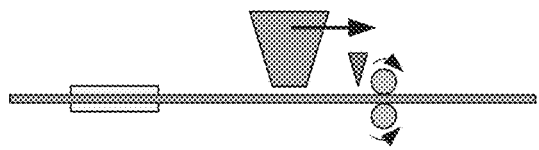
Figure 105G:
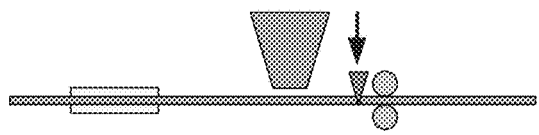
Figure 105H:
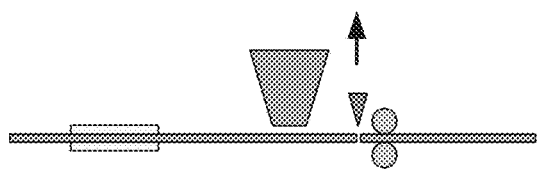
Figure 105I:
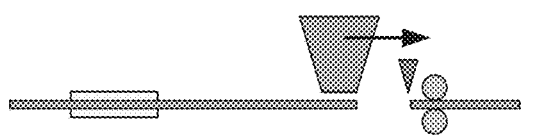

In FIG. 105(a), the printhead (including wire feeder and wire) is advancing to the right (or equivalently, the fabricated object moves to the left). In FIG. 105(b), the rollers are activated, feeding wire toward the nozzle as the nozzle continues to move to the right. In FIG. 105(c), the nozzle continues to move and the wire continues to move relative to the nozzle, until in FIG. 105(d), the wire has moved past the nozzle sufficiently to provide the desired length of bare wire at the left end of the wire. At this point, extrusion begins as the nozzle continues to move to the right. In FIG. 105(e), the printhead has stopped at a position which provides the desired medium length of bare wire extending from the extruded material. Next, in FIG. 105(f), the blade cuts the wire (in some embodiments this may be done while the printhead is moving, e.g., if moving slowly) and in FIG. 105(g), the blade retracts. The printhead then continues to move in FIG. 105(h), leaving behind the desired extrudate and wire composite.

In FIG. 105(e') (replacing FIG. 105(e)), extrusion has been stopped while the printhead continues to move to the right and wire is fed. In FIG. 105(f'), the nozzle has moved to a position suitable for cutting the wire so that a long length of wire will extend from the right end of the extrudate. In FIG. 105(g'), the wire is cut, during which time printhead motion relative the fabricated object may be paused, and in FIG. 105(h') the blade is retracted. The printhead then continues to move in FIG. 105(i'), leaving behind the desired extrudate and wire composite. In FIG. 105(e") (replacing FIG. 105(e)), extrusion is stopped and printhead motion is stopped (in some embodiments the printhead may continue to move, e.g., slowly). In FIG. 105(f") the wire is cut and in FIG. 105(g") the blade is retracted. In FIG. 105(h"), the printhead continues to move forward while extruding, leaving behind only a short length of bare wire extending from the right end of the extrudate.

Feeding and cutting methods similar to that in FIGS. 103(a), 103(b), 103(c), 103(d), 103(e), 103(f), 103(g), 103(h), 104(a), 104(b), 104(c), 104(d), 104(e), 104(f), 104(g), 104(h), 105(a), 105(b), 105(c), 105(d), 105(e), 105(f), 105(g), 105(h), 105(e'), 105(f'), 105(g'), 105(h'), 105(i'), 105(e"), 105(f"), 105(g"), and 105(h") can be used in some embodiments in embedding approaches such as those of FIGS. 70(a), 70(b), 70(c), 94, 96(a), 96(b), 96(c), 96(d), 96(e), 96(f), 97(a), and 97(b) as well as in simultaneous extruding and wire laying approaches such as those shown in FIGS. 29(a), 29(b), 30(a), 30(b), and 30(c).

In some embodiments, it is desirable to introduce multiple wires into a single extrudate at a time. For example, the current-carrying capability of a coil may be increased by using thicker wire, but such wire may be difficult to incorporate due to its stiffness, or in the case of a compliant structure, the stiffness may be undesirable. Thus, laying multiple strands of thinner wire through a single or multiple capillaries is a desirable alternative. Since it is common for an extrudate to be wider than it is tall, these multiple strands in some embodiments can be positioned side to side, and can of course be in electrical contact with one another. Multiple wires may also allow for more redundant contacts with ECPC, allowing alternative percolating pathways to be used; this can be particularly useful if there is a risk that some pathways are disrupted, e.g., by overly stressing and straining the ECPC. Moreover, multiple wires are likely to be radially more distributed through an ECPC junction than a single solid wire, thus reducing the average distance of wire in one junction to that of wire in an adjacent junction.

In some embodiments, multiple wires may be embedded in a single extrudate for the purpose of increasing circuit density, e.g., to match the density of pads on an integrated circuit (bare die or packaged), to increase current-carrying capacity (e.g., filling more of the volume of the extrudate, especially laterally, with metal, without using a stiff wire or one which is difficult to deform laterally along a curved toolpath), mechanical strength or stiffness, etc. The wires may differ in size, shape, composition, etc. The relative location of the wires in the extrudate may vary (e.g., side-to-side, one above the other, etc.). In cases which require the wires to be electrically isolated, this can be achieved by using insulated wires (e.g., lacquer insulation as with magnet wire) or by incorporating dielectric fibers between the metal wires as spacers, or by passing currents through the wires as they are deposited so as to cause them to repel so that the dielectric polymer can separate them, etc. In some embodiments a "rake" may be provided on or near the nozzle which has tines which keep multiple wires apart until they are embedded in solidified matrix material. In some embodiments, multiple wires may be used to create more complex wire cross-sectional shapes, such as shields which surround a central conductor to form a coaxial cable. When more than a single wire is incorporated into a single extrudate, each wire can be fed passively or actively (e.g., using a feeder/cutter such as that in FIGS. 139(a), 139(b), 139(c), 139(d), 139(e), 139(f), 139(g), and 139(h)). If fed actively, wires in some embodiments may be fed at different speeds. For example, in producing a coil in which two wires are located side-by-side in the same extrudate so as to increase current-carrying capacity of the winding, the wire on the outside of the turn needs to be somewhat longer, and thus, should be fed at a faster rate. In the case of multiple wires in a single extrudate which should not touch (e.g., for a battery application), by feeding the wire on the outside of a turn significantly faster than the wire on the inside, separation between the wires can be maintained with little if any need for a spacer.

In some embodiments, by adjusting the relative feed rates of two or more fibers encapsulated within the same extrudate, the matrix material, by clinging to the fibers, can be "steered" to follow a particular path by the relative feed rates of the wires (i.e., straight if the rates are the same, curved if they are different).

In some embodiments stranded wire may be used in lieu of solid wire. Stranded wire is typically more flexible, and can have more surface area, thus providing less contact resistance with ECPC. Stranded wire provides redundancy, in that the breakage of a single strand does not interrupt the circuit.

Figure 106A:
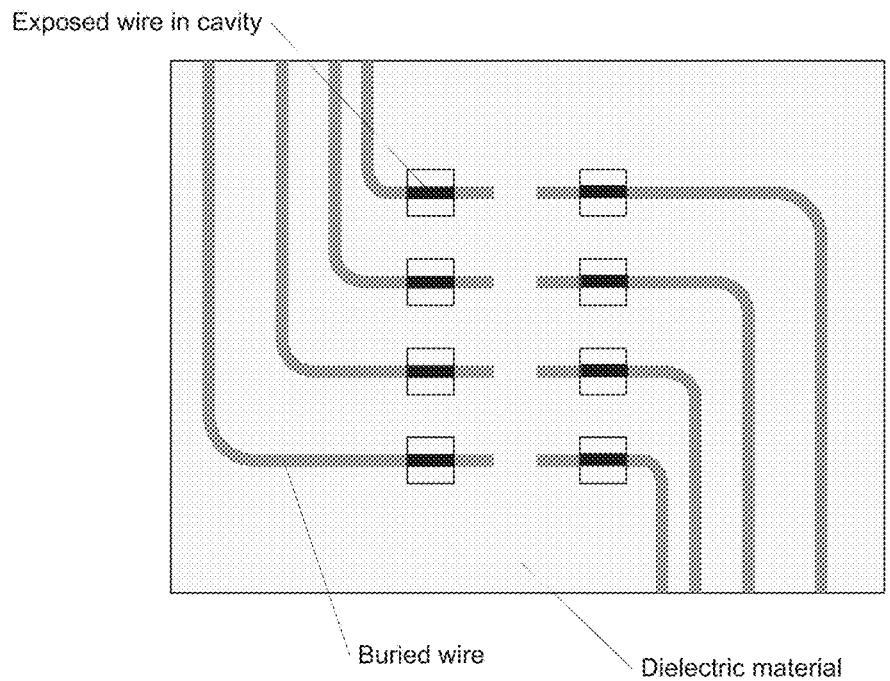
FIGS. 106(a) and 106(b) show an approach to integrating an electronic device with a fabricated structure.
Figure 106B:
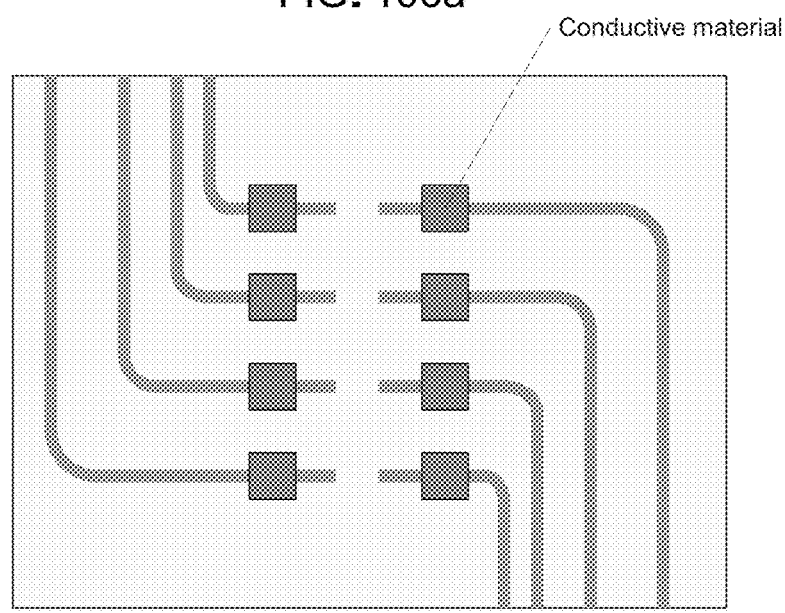

FIGS. 106(a) and 106(b) depict in plan views a structure having some similarities to the structure of FIGS. 59(a), 59(b), and 59(c) for integrating a device such as an integrated circuit (e.g., a bare die, surface mount package, or through-hole package) or other electronic or electrical device with a fabricated object. In one application, the structure may take the form of a 3-D printed circuit board (PCB), and in other applications, it may be a part of a larger system. Indeed, as an aside, FEAM may be used to construct PCBs, whether conventionally planar or 3-D, using for example copper wire as the interconnect, a (preferably) high temperature thermoplastic (e.g., nylon or PEEK, the latter available in filament form from INDMATEC GmbH (Karlsruhe, Germany)) or thermoset material such as polyimide or epoxy, or (for a flexible circuit) silicone elastomer as the dielectric. Solder joints may be made between inserted or surfaced mount components and wires, e.g., with low-temperature solders.

In FIG. 106(a), wires are shown buried within dielectric, with cavities through which the wire passes (in some embodiments the wires may terminate inside the cavities, while in other embodiments the wires extend past the cavities so they can be better anchored in the dielectric). The cavities are laid out to match pads, pins, or other terminals on the device. In FIG. 106(b), the cavities are filled (e.g., using a nozzle or pneumatic dispensing system) with a material suitable for making electrical contact to the device. In some embodiments, the material may protrude beyond the dielectric surface, and in some embodiments, the material may be elastomeric. For example, the material may be ECPC, solder paste, conductive epoxy (e.g., E3082 from Epoxy Technology, Inc. of Billerica, Mass.), or other materials. In the case of ECPC, the ECPC may be pre-heated (e.g., by localized hot air flow) to soften the TPE and make it tacky, and the device picked up and positioned (e.g., by a vertically-translating vacuum pickup mounted to the stage holding the printhead) and pressed onto the ECPC pads so that its terminals make contact. In some embodiments structures which allow self-assembly (e.g., fluidic self-assembly or vibrational self-assembly) may be fabricated, such as specially-shaped cavities and ramped structures, allowing devices to be positioned more efficiently, especially large numbers of devices. In the case of solder paste, the device may be similarly placed on the paste regions, and a localized heating system such as the ZT-2-MIL used to reflow the solder, preferably after pre-heating the paste to activate the flux. In some embodiments, the paste may be pre-heated as it is dispensed (e.g., using an inline heater); in some embodiments the object may be built inside a chamber at a temperature that activates the flux, and in some embodiments the layer or portions therefore may be exposed to a heat source such as an infrared light. In the case of conductive epoxy, the device may be similarly placed on the regions of epoxy, and a similar localized heating system used to rapidly cure the epoxy (unless a UV-curable epoxy is used, in which case a UV LED or other source can be used).

After the device is attached to the conductive material, the device may be father secured by dispensing an underfill known to the art in the electronics industry, by dispensing dielectric polymer (thermoplastic or thermoset, including UV-curable) onto at least part of it, etc. In the case of a through-hole package, the pins of the device may be inserted into a soft conductive material such as partially melted hard ECPC or unmelted soft ECPC. With elastomeric ECPC, the device may simply be pressed so that its terminals contact the ECPC, and kept compressed by suitable underfill or capping material (including additional deposited layers), etc. Structures similar to that of FIGS. 106(a) and 106(b) may be created on other planes (e.g., vertical, parallel to the Z axis) of a fabricated object, or on curved surfaces to integrate ICs and other devices at other angles.

Formation of metal volumes that are much larger than individual wires (continuous sheets, or nearly-continuous regions such as sheets separated by thin dielectric volumes that serve the purpose of laminations to reduce eddy currents) is an important capability. Such a capability allows for 3-D printing objects comprising soft magnetic armatures and cores needed for solenoids and for magnetic circuits in general, capacitor plates, ground planes that are mostly continuous (vs. made from closely-spaced wire, another option), patch antennas, thermal management structures (which can also be made from wire, ECPC, etc.), RF shields, mechanical structures including reinforcing elements, etc. Several approaches to this may be used, in various embodiments.

One approach is the layer-by-layer spiral winding approach shown in FIG. 12. A second approach is to deposit a metal powder either by itself or as a composite material. ECPC is one such composite, intended for electrical conductivity, and an analogous composite that provides magnetic permeability comparable to solid ferromagnetic material such as iron can also be produced and deposited. SMPC's ("soft magnetic polymer composites", a.k.a. "soft magnetic composites", or SMC's) may consist of small particles of a magnetically soft metal such as iron (e.g. Atomet 1001HP from Rio Tinto Metal Powders, Sorel-Tracy, Quebec, Canada) mixed with a suitable binder (which might not always be a polymer). In some embodiments the powder may be coated with a binder (e.g., a thermoplastic) such that, once formed into the desired shape (e.g., by being delivered into a cavity), the binder can holder the particles together (e.g., by heating the powder and allowing it to cool). A commercially available SMPC with a relatively low concentration of ferromagnetic material is the magnetic iron filament (iron particles mixed with PLA) made by Proto-Plant (Vancouver, Wash. Other finely-divided metals may be used, such as nickel, steel, and cobalt. One example is silver-coated nickel particles such as Potters SN08P40, which can also serve as ECPC. The binder may be in some embodiments a thermoplastic polymer such as Nylon-6, Nylon-12, ABS, polylactic acid, or a thermoplastic elastomer; a soft wax such as paraffin or a hard wax such as Crystalbond (Aremco Products Inc., Valley Cottage, N.Y.), a thermosetting or UV-curable adhesive such as epoxy, a non-thermosetting adhesive such as cyanoacrylate, a non-hardening material such as grease, a liquid such as oil, water, or alcohol, or other material. ECPCs and SMPCs may be extruded from a nozzle on a layer-by-layer basis to form the shape desired. Alternatively, they may be extruded or otherwise deposited into cavities formed in another material such as the primary structural material used to build the object; such cavities may be multiple layers in depth.

With regard to SMPCs, it is important that the volume fraction of soft ferromagnetic material be high in order to obtain the best properties, and suitable mixing approaches can be used to achieve this. In some embodiments, a magnetic field can be applied to compact (and align) the powder particles within the binder, improving final properties. In some embodiments, however, it is desirable to eliminate the binder entirely. For example, a cavity may be filled with pure iron powder which is preferably compacted by pressure (not to exceed that tolerated by the object) and/or vibration. In some embodiments, powder can be mixed with a vehicle such as a solvent or water whose surface tension pulls the particles together into a compact mass and evaporates.

A third approach to creating dense soft magnetic elements, which is compatible with low-temperature materials, is cold spray or related technologies such as capillary cold spray and plasma spray. With such methods, iron or other suitable materials can be deposited to form structures with low porosity, such as filling a cavity with a capillary cold spray system that directs material into the cavity.

A fourth approach is the laying or embedding of wires side-by-side with little or no gap between them. In some embodiment variations, the side-by-side wires are straight and the desired shape is approximated by cut wires forming a typical "rasterized" representation of the shape. In other embodiment variations, the side-by-side wires are curved in a useful direction but the ensemble of wires nonetheless forms the desired shape. Wires may lie parallel to the layer plane or at angles to the plane, such as in FIGS. 97(a) and 97(*b*). In some embodiments, coils produced adjacent to rasterized patterns of magnetic wire (e.g., forming a solenoid coil) are preferably made square or rectangular vs. circular, so they can be located more closely to the magnetic wire, for maximum efficiency.

FIGS. 107(*a*), 107(*b*), 107(*c*), 107(*d*), and 107(*e*) are cross-sectional elevation views of an asymmetric printhead nozzle designed to lay wire (in this case, square or rectangular wire) side-by-side, whether straight or curved (straight will be assumed in the following description), retained by the material extruded from the nozzle, which in general should be flowable and adhere to the wire and itself, and which may be dielectric, conductive, and/or magnetically permeable. In some embodiments, the material is solidifiable, obtaining its maximum adhesion strength once fully solidified. In FIG. 107(*a*), the nozzle is shown positioned above a build substrate/platform (or the previous layer of the fabricated device). The gap between the flat surface near the bottom of the nozzle may be set to be approximately equal to the height of the wire to be laid (however, if wire that is not square or rectangular wire is used, the surface may be shaped to match the wire). Thus in some embodiments the wire height and the layer thickness are equal. In some embodiments, the bottom of the nozzle serves as a doctor blade to ensure that little if any material (especially if dielectric) remains on top of the wire (in some embodiment variations a spring-loaded blade may be used to help keep the top of the wire relatively free of material), while in other embodiments a larger gap may be used, for example, to allow material to flow underneath the wire to anchor it and/or isolate it from wire or other structures underneath. The nozzle comprises a guide which in some embodiments is not centered on the nozzle orifice and which in some embodiments extends below the flat surface; the guide may have a height such that it does not touch the substrate. The guide serves to precisely position the wire in the layer (X/Y) plane so that it conforms to the toolpath followed by the guide (in some embodiments this is useful even when laying wires more widely separated), to precisely control the gap between adjacent wires and prevent this from increasing due to fluid between adjacent wires, and as a stop to prevent material from coating the left side of the wire. In some embodiments, the guide is not an integral part of the nozzle but is a separate piece, and in some embodiment variations, the guide may be moved separately from the nozzle according to a distinct toolpath/trajectory. In some embodiments, more than one guide may be provided, or a guide with multiple guiding features may be used. In some embodiments, the guide has the form of a groove or female feature instead of a projection or male feature. In FIG. 107(*b*), wire has been placed below the nozzle (e.g., extended from a suitable capillary, such as a square capillary that prevents wire rotation) such that the wire is held downwards against the substrate by the flat surface on the bottom, or by the flow of material (e.g., thermoplastic, though other materials may be used) issuing from the nozzle. Meanwhile, since the wire is offset from the axis of the nozzle orifice, the flow tends to push the wire up against the inner wall of the guide, which serves to stop and accurately position the wire along the X axis. In some embodiments, the wire, if ferromagnetic (e.g., nickel) may also be attracted to the guide if the latter is ferromagnetic and connected to a permanent magnet or electromagnet, or if a magnet such as a permanent magnet (preferably thermally isolated from the nozzle) is located to the left of the guide (not shown). In this configuration, the printhead then moves out of the plane of the drawing, extruding material at a suitable flow rate to secure the wire in place by anchoring it to the substrate.

In FIG. 107(*c*), the printhead has moved to the left in some embodiments by a distance in excess of the wire width plus any desired gap between wires (this is non-zero if the goal is to produce a laminated structure in which adjacent wires are separated in the X/Y plane by a thin film of dielectric, for example), while in other embodiments it moves only by a distance equal to the wire width plus any desired gap between wires. In the former case, the additional space between the guide and wire can facilitate entry of the dielectric material into the gap between the wires, which might otherwise be high aspect-ratio. In this case, the nozzle moves to the right before or during the wire laying process as shown in FIG. 107(*d*). Also in FIG. 107(*c*), another wire is introduced beneath the nozzle between the already-laid wire and the guide. In FIG. 107(*d*), the printhead has moved again out of the plane of the drawing, laying the second wire and also depositing material between the two wires that separates them and anchors the second wire (the wire can also be anchored by some material flowing underneath, and by material at its two ends), as may be seen better in FIG. 107(*e*). Since the molten material is in contact with both wires simultaneously, they are bonded together properly. The material, delivered at an appropriate flow rate, may not completely fill the gap between the two wires, depending on the gap aspect ratio and operating conditions, and in some embodiments this is acceptable if not desirable. In some embodiments, the guide may be angled or curved in a plane parallel to the substrate so that the separation between the wire being laid and the previously-laid wire is initially greater, allowing material to flow more easily into the gap between them. In FIG. 107(*e*), the printhead has moved to a position at which it can accommodate a third wire and the gap between it and the second wire. The process continues until all wires are laid. In some embodiments, wires are laid bidirectionally, with a new wire added each time the nozzle moves either into or out of the plane of the drawing. The process can continue on another layer, laying wires on top of wires. When the goal is to produce a laminated structure similar to that found in conventionally-fabricated electromagnetic devices, the wires on successive layers may be aligned along the X axis, such that dielectric material-filled gaps also align, and form isolating, vertical planes. Otherwise, the wires may be staggered (e.g., like bricks) on successive layers, shorting the wires together. The nozzle of FIGS. 107(*a*), 107(*b*), 107(*c*), 107(*d*), and 107(*e*) allows wires to be laid from right to left; if another direction of laying wire is required, the nozzle can be rotated about the orifice axis, or another version (e.g., a mirror image) can be used.

In some embodiments wires are laid with a larger gap, and the printhead returns to push the wire to the final, desired gap using the guide, while the material is still able to flow. In some embodiments, the material is dielectric (e.g., to form laminations to minimize eddy currents), while in other embodiments it is conductive (e.g., ECPC) to electrically bridge the gap between the wires. The material may also be magnetic (e.g., SMPC) to magnetically bridge the gap. In some embodiments, a different style of nozzle than that shown in FIGS. 107(*a*), 107(*b*), 107(*c*), 107(*d*), and 107(*e*) is used. In such embodiments, the orifice is offset to the left relative to the wire, instead of to the right as in FIG. 107(*b*), and material is deposited between the wire and the guide, which now has the function of a trowel or similar former of soft material. The guide can be shaped (as seen from above, perpendicular to the layer plane) to incorporate a relief area that allows extruded material to enter the space between the guide and the wire in the direction of the travel; the portion of the guide in direct contact with the wire still serves as a doctor blade to remove excess material from the side of the wire if desired. Since material may remain on the left side of the wire after the wire is placed, the position of the nozzle along the X axis should be carefully set so that the thickness of this material is accommodated.

Figure 107A:
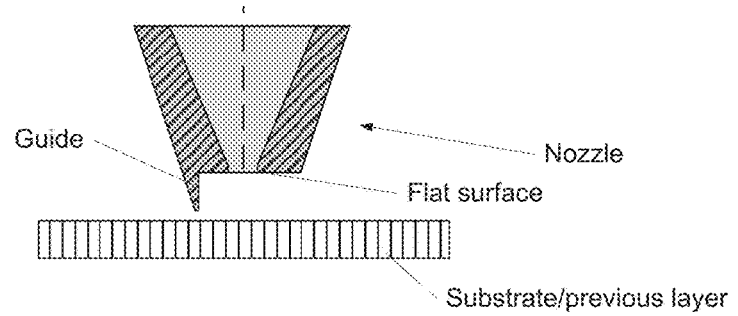
FIGS. 107(a), 107(b), 107(c), 107(d), and 107(e) show an approach to incorporating closely-spaced wires.
Figure 107B:
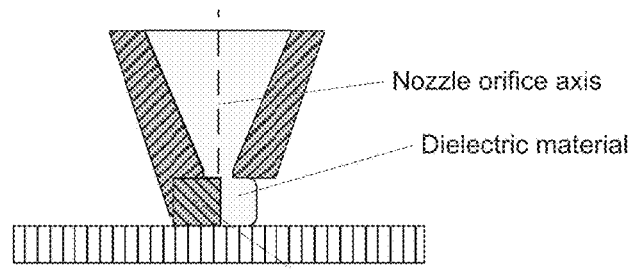
Figure 107C:
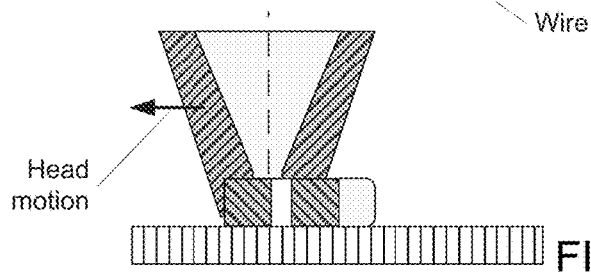
Figure 107D:
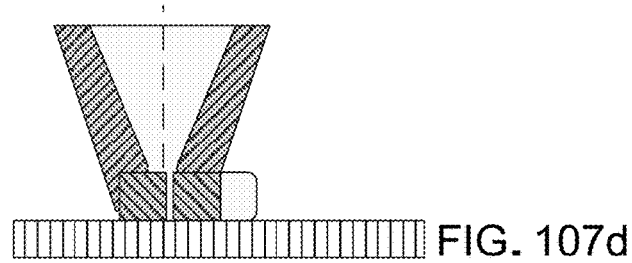
Figure 107E:
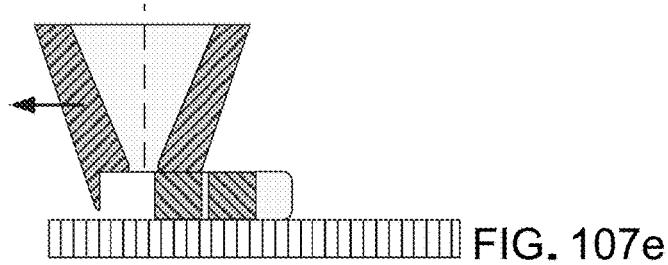

In some embodiments, the wire is heated to facilitate penetration of the extruded material, e.g., into a high aspect ratio gap such as that shown between the two wires in FIG. 107(d), minimizing freezing of the material entering the gap. In some embodiments, in which the gap is particularly small or intended to be non-existent, the left and/or right sides of the wire may be textured, scalloped, or otherwise shaped to be non-planar (e.g., by running the wire through an embossing roller, and possibly two additional flattening rollers on the top and bottom to flatten out any burrs caused by embossing). As a result of the non-flat sides, material can still be injected between the wires to help bond them together and bond them to the substrate or previous layer. A fourth approach to forming large metal areas and volumes in a manner compatible with additive manufacturing is the use of cold spray and/or plasma spray techniques known to the art (e.g., for coatings). These methods may be used to deposit magnetically-soft materials as well as electrically-conductive materials, achieving high volume fraction of metal/low porosity.

A fifth approach to forming large metal areas and volumes is co-depositing foils with extruded material, in lieu of wire, or embedding foils into previously-deposited material. In such an approach, the foil may be continuous or may be perforated to allow material such as molten polymer to penetrate it and encapsulate it. In the extreme, the foil may be in the form of a mesh.

The printhead in FIGS. 78(a) and 78(b) may be used to deposit dielectric polymer and ECPC, for example, switching 'on the fly' between these two materials. Thus a junction such as those shown in FIGS. 8(a) and 8(b) can be generated, by transitioning from one material to another while laying wire. In some embodiments, however, it is desirable to deposit each material from its own nozzle, for example, switching between the two nozzles using a slide or turret. Moreover, in some embodiments it is desirable to deposit ECPC in another direction than parallel to the wires. For example, ECPC may be anisotropic in its conductivity (e.g., more conductive parallel to the long axis of the extrudate than across it/radially). Such an ECPC may preferentially be deposited in a cavity or trench formed in the dielectric material, such that the cavity includes two or more wires on the same layer as in FIG. 8(a), with the nozzle moving perpendicular to the wires as the ECPC is extruded into the cavity. Similarly, wires on separate layers such as in FIG. 8(b) would preferably be joined by ECPC that is extruded vertically to fill a cavity common to the wires.

In some embodiments, regions of a layer that would normally be poorly adhered or fused to material underlying or adjacent on the same layer may be subjected to localized heating to "tack weld" them. An example of the use of such an approach is an extrudate or group of extrudates that overlap extrudates on the layer below very little (e.g., the extrudates are right angles to one another). Localized heating may be performed using a system such as the ZT-2-MIL, an infrared laser, a spot infrared source, etc.

Some materials, both pure and composite (e.g., ECPCs, PMPCs, and SMPCs) may degrade if they remain heated in a printhead for an extended period, with altered properties or extrusion performance being the result. In some embodiments filaments of such materials may be extracted from the printhead (e.g., by reversing the rollers or blades) when the control system determines they will not be used for some time, during which time they are likely to degrade. Or, if delivered by a separate nozzle and extruder, the temperature of the nozzle and extruder can simply be reduced temporarily, and increased again before the material needs to be dispensed, again by "looking ahead" in the data controlling the fabrication process to determine when the material will be needed.

Laying encapsulated wire with very small radii using approaches such as that of FIGS. 5(a), 5(b), 5(c), 5(d), 29(a), 29(b), 30(a), 30(b), and 30(c) can be facilitated in some embodiments using the "stapling" approach of FIG. 52, or by bending the wire around a form such as small diameter pin. For example, such a pin may be attached to the nozzle and may be retractable, or may remain extended, dragging through molten material with little resistance, and if small enough in diameter, leaving the polymer minimally disturbed.

As already described, toolpaths may in some embodiments be calculated and then implemented to generate extrudates with encapsulated wire as the highest priority, and extrudates without wire as a lower priority. FIGS. 108 (a), 108(b), 108(c), and 108(d) depict an approach to this in which wire and polymer are deposited, followed by pure dielectric polymer, followed by ECPC or other conductive material. In FIG. 108(a), the wire paths and cavities for the ECPC are calculated first, and will be implemented as shown in FIG. 108(b). Then, in FIG. 108(c), toolpaths for depositing extrudates encompassing the remaining dielectric polymer needed on the layer are determined. Finally, toolpaths to deposit the ECPC are determined.

Materials

In addition to SMPCs, it can be advantageous to incorporate permanent magnetic materials into a fabricated object, allowing such devices as voice coil actuators, permanent magnet motors, and many others to be fabricated. While it is certainly possible to pause the fabrication process as is known in the art, and then insert magnets (not to mention other items such as bearings, balls, semiconductor devices, etc.), it may be preferable to fabricate magnets in-situ as part of an automated process. PMPCs ("permanent magnet polymer composites") may be formulated from magnetic powders such as strontium ferrite, samarium-cobalt, and neodymium-iron-boron, mixed with a suitable binder such as the binders described above in the context of SMPCs. As with SMPCs, it is important that the volume fraction of ferromagnetic material be high in order to obtain the best properties, and suitable mixing approaches can be used to achieve this. Or, pure permanent magnetic powders can be formed into compact masses using techniques described above for soft magnetic materials. In some embodiments, a magnetic field can be applied to compact (and align) the powder particles within the binder, improving final properties, as is sometimes done with in the mold when making injection molded magnets.

3-D printed permanent magnets need to be magnetized. This can be done by placing the object containing the magnet(s) in a magnetic field after fabrication. It can also be done in some embodiments by magnetizing the magnets before the object is completely fabricated, i.e., during or after the permanent magnet material is deposited. In some embodiments, the deposited magnetic material may be placed in contact with or near a permanent magnet or electromagnet, and in some embodiments the magnetization is performed gradually and repeatedly, as more and more layers are added to the fabricated magnet. In the case of a fabricated magnet which needs to be magnetized in an orientation which is not easily accessible to a magnet used to magnetize it, or which is too deep inside the structure to be reached with that magnet, soft magnetic structures built into the object can be used to deliver the magnetizing flux to the magnet. These structures may be permanent in some embodiments, forming part of the magnetic circuit of a functional magnetic device. In other embodiments, the structures may be temporary, and be removed after the object is fabricated. For example, an SMPC comprising a low melting temperature (e.g., a wax) binder, or a soluble binder (e.g., polyvinyl alcohol or PVA) may be removed easily: one the binder is melted or dissolved, the particles simply fall away.

In some embodiments, custom-sized and shaped magnets may be fabricated within a machine in a separate operation, such that they can be optimally magnetized, then simply inserted into the build.

An example of a thermoplastic polymer that may be used with FEAM is Kraton G1643M, a low-durometer (52 Shore A) elastomer. Such a polymer may also be mixed with conductive particles to form a compatible ECPC. For example, silver-coated hollow glass microspheres such as Potters SH400S20 (13 µm average diameter) may be mixed with D1161; the low density of the hollow microspheres facilitates mixing by reducing sedimentation, and is cost-effective on a volumetric basis. Polymer or ceramic particles coated with conductive material such as silver are also suitable, as are solid metal particles (e.g., silver, nickel, copper), carbon particles, and nano-particles (e.g., carbon nanotubes). Smaller particles (e.g., 10-50 µm) are preferred, in part for their lower likelihood to bridge and clog the printhead nozzle. Silver-coated nickel particles such as Potters SN08P40 and SH400S20, or silver-coated iron particles such as Potters SI03P40 are useful not only for their electrical properties, but for incorporating ferromagnetic elements such as solenoid cores, plungers, and armatures with good properties; such materials can be deposited into appropriately-shaped cavities/trenches formed within the fabricated object. In some embodiments, adhesion promoters may be mixed into the polymer to promote adhesion to the particulate material, which can make the ECPC more robust against damage due to large strains.

An example of a procedure using simple equipment that may be used to produce ECPC filament with 35% by volume of powder uses about 12 grams of G1643Mpellets, as follows:

Vacuum dry G1643M pellets for about 10 hours.

Measure out 11.6 grams of G1643M TPE and 66.0 grams of SN08P40 conductive filler into separate containers.

Heat the G1643M pellets in a melting pot to ~200° C.

Add SN08P40 carefully to the melting pot, minimizing powder clinging to sides of the pot.

Gently stir and press the powder into the TPE, so that the powder contacts the softening TPE.

Cover the pot and heat to approximately 200-220° C.

Continue to mix the powder in by hand until a uniform color darker is reached.

As the powder becomes more absorbed into the TPE, stir more vigorously.

Mix using an electric mixer on a low speed setting for at least 60 seconds. If temperature of the mixture has dropped, cover and reheat to 200-220° C.

Repeat the above process 2-4 times until the contents of the pot starts to appear slightly wet and possibly beginning to clump, as opposed to appearing dusty.

Reheat again at 220-230° C.

By hand, stir the mixture in a large circular motion. The contents of the pot should suddenly clump together quite easily and form a single, large "dough-ball".

Immediately transfer the dough-ball to an injection molder which should already be pre-heated to ~146° C.

Use the injection molder to extrude the material through a die (e.g., 1.75 mm diameter) at a constant speed.

In addition to blending powder with polymer in liquid form, ECPC can be made by dry-blending polymer (e.g., powdered (perhaps cryogenically ground)) and powder, by coating polymer with powder using a ball or vibratory mill, etc.

Particulates which may, in some embodiments, be used to advantage in FEAM include:

Ceramic powder or other additives that alter dielectric constant (e.g., lowering it for high frequency applications using hollow microspheres), thermal conductivity, coefficient of thermal expansion, and other parameters. For example, incorporation of ceramics such as boron nitride, aluminum nitride, beryllium oxide, and silicon carbide can increase thermal conductivity without rendering the polymer matrix electrically conductive. This can enable better heat dissipation from wires, allowing higher currents to be used (e.g., for higher-force actuators).

Conductive particles such as nickel and iron can be incorporated at concentrations below the percolation threshold to nonetheless improve magnetic properties of the resulting composite due to their high permeability, improving the performance of electromagnetic devices (e.g., the actuators of FIGS. 26(a) and 26(b)). Coated (e.g., heavily oxidized or encapsulated) conductive particles can also be used, as can ferrites, which be used in FEAM-fabricated transformers, coils, and the like.

Pigments may be added to polymers and other materials to color them, and small particles, whether pigmented or not, may be added to make otherwise-transparent materials translucent or opaque by means of scattering. For example, a region of a fabricated object able to diffuse light from an embedded LED or optical fiber might be produced using such particles.

Electroactive polymers such as those made by Novasentis (Burlingame, Calif.) may be incorporated into objects fabricated using FEAM. Powdered lead zirconate titanate (PZT) may be added to polymers used in FEAM to create piezoelectric actuators and sensors, as in PiezoPaint™ (Meggitt Sensing Systems, Dorset, U.K.), and wire and ribbons of piezoelectric material may also be used. In some embodiments, piezoelectric elements may be fabricating from materials such as polyvinylidene fluoride or polyvinylidene difluoride (PVDF) which are poled during the fabrication process and which use encapsulated wires as electrodes. Piezoelectric devices may be used as actuators or as generators of electricity, depending on the application.

The incorporation of iron or other materials in finely-divided form into an elastomer matrix gives rise to a magnetorheological elastomer, which can be based on thermoplastic elastomers [Bose and Roder, 2009]. Uses of such materials in FEAM include stiffness modulation and haptic feedback devices, including those in which the magnetic field is generated by current flowing in conductors embedded within the structure. Electrorheological elastomers are also possible.

Mechanical properties may be changed dynamically on a local basis by incorporating materials which undergo a phase change (e.g., wax) when heated or cooled, and heating or cooling elements may be incorporated into a FEAM structure (e.g., resistive wires).

Bioresorbable polymers such as polylactic acid, polylactide-co-glycolide, or combinations thereof, can be used in FEAM to make structures and scaffolds incorporating filaments such as wires as well as other components (e.g., integrated circuits) in specific geometric, mechanical, optical, and/or electrical configurations. When the polymer is resorbed, the configurations remain in place, and may become integrated into and/or infiltrated with living tissue to serve, for example, as active implants or bionic devices.

Electroluminescent materials may be incorporated into FEAM-produced structures to provide light, for example, creating glowing elastomeric structures similar to those produced with Elastolite (Oryon Technologies, Addison, Tex.), but with more complex and 3-D shapes. For example, phosphors are available in small (e.g., 5 µm) particle sizes from companies such as PhosphorTech (Kennesaw, Ga.); these can be incorporated into polymer and if stimulated using appropriate electrodes (e.g., suitably-shaped wire) at suitable frequency, emit light. Polymer light-emitting electrochemical cells [Lian and Pei, 2014] can be produced with FEAM. Using electroluminescent materials, organic light emitting diodes, etc., and materials which can change their opacity such as liquid crystals, then displays can be produced with additive manufacturing, including volumetric 3-D displays in which the 3-D interconnects to pixels, groups of pixels, or driver and multiplexing ICs are built-in.

Haptic and certain kinds of 3-D displays may be produced with FEAM, for example, a surface with an array of electromagnetic actuators that deforms itself dynamically to form a moving, bas-relief 3-D human face for more realistic teleconferencing, a configurable, dynamic topographical map, a braille display, etc. In some embodiments, touch sensors may be embedded within the display surface so that it can respond (e.g. by changing its shape) to touch and manipulation. A device can be created comprising a "blob" made from an elastomeric or plastically-deformable material, laden with sensors that can measure local deformation. Manipulating and deforming this "electronic clay" would be useful as a 3-D input device for creating or modifying CAD models, for measuring strength and range of motion for rehabilitation/physical therapy, etc.

Heating elements and devices incorporating buried, integrated heaters made from resistive wire may be made with FEAM. The generated heat can be used to modify liquid surface tension to move/deform liquids (e.g., for lab-on-a-chip devices and variable-focus lenses); process materials (e.g., perform the polymerase chain reaction); serve as electron sources; modify mechanical or other physical properties such as stiffness, such as in a structure containing a shape memory alloy, a shape memory polymer, a meltable metal or polymer such as wax, etc.; melt solder, etc. to make electrical connections (such localized melting is especially useful if one can't heat the entire device); enhance interlayer and/or inter-extrudate adhesion; smooth surfaces of fabricated objects using surface tension (e.g., for optical elements, and transparent regions of parts); de-icing (e.g., of UAV wings) and defogging (e.g., of optical surfaces); sensors (e.g., for gas, or hot wire anemometers); and to enable displays such as those incorporating thermochromic materials.

Touch-sensitive surfaces (e.g., for displays) comprising (e.g.,) crossed sets of small-diameter wires may be made using FEAM. One example is projected capacitance touch-screens and sensors. If the surface must be transparent, the polymer can be reflowed in some embodiments by heating it after extrudates are deposited such that surface tension smoothes the surfaces; alternatively, the surface may be placed in contact with a smooth, heated non-stick surface.

Small volumes of ECPC (especially if elastomeric) may be used along with wire to form a switch, by making temporary contact with at least two wires and shorting them together when the ECPC, mounted to a compliant structure, is pressed, slid, pulled, etc.

Devices with built-in sensors, antennas, and integrated circuits providing processing and memory, as well as batteries or energy-harvesting devices (e.g., electromagnetic, thermoelectric, capacitive, piezoelectric), may be made with FEAM. Such devices may be able to report on their usage history and structural integrity, for example, providing notification of the need for service and other structural health monitoring data. Devices that can participate in the "internet of things" (TOT) are possible.

Oxygen masks or masks for continuous positive airway pressure (CPAP) may be produced using FEAM from suitable elastomers, and may incorporate sensors such as strain gauges which measure breathing rate and inhalation/exhalation force, or microphones to detect snoring or pick up voice communications and commands.

Energy-harvesting devices, or products incorporating such devices, may be made using FEAM. For example, an elastomeric shoe sole made with FEAM may incorporate electromagnetic or piezoelectric elements to generate electricity as the wearer takes steps.

Non-resorbable medical implants may be produced using FEAM from suitable materials which incorporate sensors and interconnects that measure stress, strain, pH, and other useful parameters.

The ability to create structures from dielectric materials, including rigid dielectrics such as ceramic or glass, or even (e.g., high temperature, low-porosity) polymers, along with encapsulated/embedded wire enables the fabrication and integration into structures of monolithically-fabricated vacuum electronic devices such as diodes and triodes, as well as travelling-wave tubes and other devices useful for computation, signal generation, illumination (e.g., incandescent bulbs), etc. In some embodiments, all vacuum devices can be connected to one or more common manifolds such that they can be evacuated of air after fabrication and then sealed (at one or multiple points) to make them functional. Electrons in vacuum electronic devices can be generated by thermionic emission, by field emission (e.g., from the free ends of small and/or sharpened wires, which may be sharpened electrochemically in-situ), etc. All the elements in a conventional vacuum tube, including grids, filaments, plates, can be formed using wires that are anchored in the surrounding tube envelope (which may have a wide variety of shapes, some quite different from a standard vacuum tube) and which form complex shapes within the empty space of the tube.

Figure 109A:
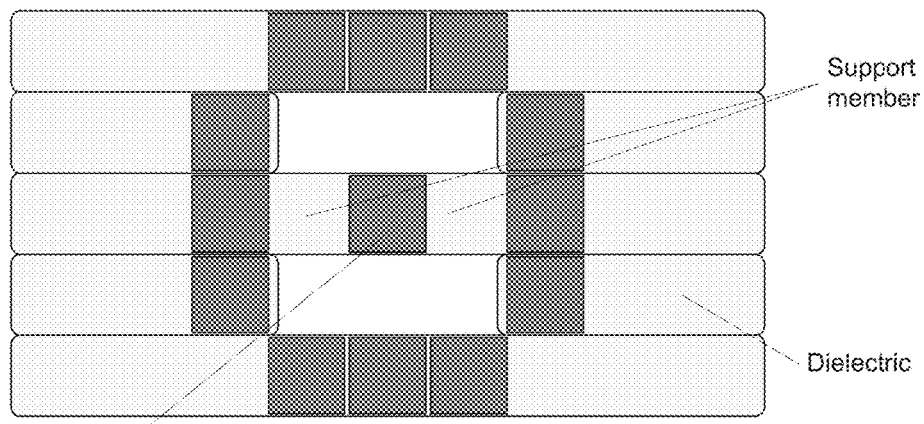
Figure 109B:
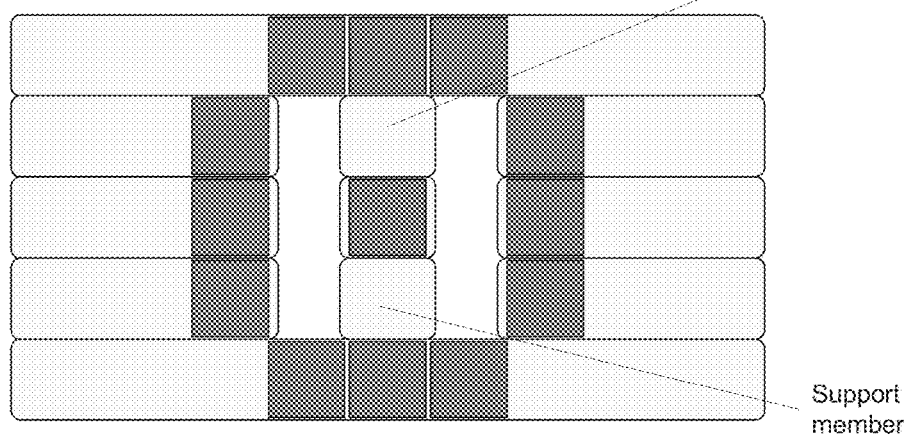
Figure 109C:
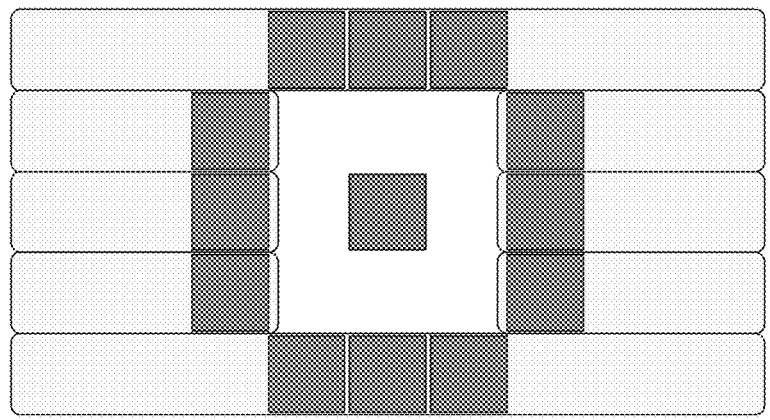
Figure 111A:
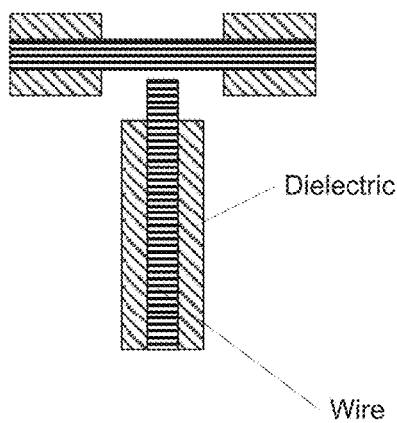
Figure 111B:
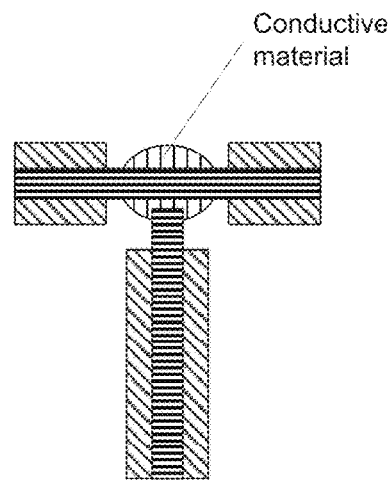
Figure 111C:
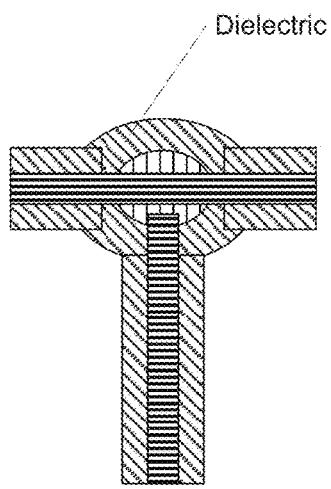
Figure 111D:
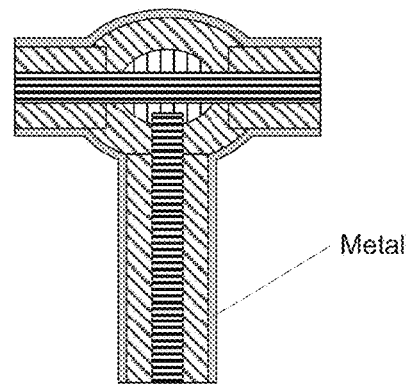

FIG. 109 depicts a coaxial cable made according to some embodiments and serving as a built-in, high frequency capable and/or noise-insensitive signal line in a fabricated object. For example, a microwave or millimeter wave system such as a phased array radar may benefit from shielded, coaxial signal transmission lines (though coplanar waveguide and other approaches are also achievable in the disclosed process), and specialized coax-based structures may serve as filters, hybrid couplers, and other microwave/millimeter wave components. In some embodiments, braided shields may be co-deposited with polymer or embedded, but in some embodiments, coaxial structures similar to those shown in FIGS. 109(a), 109(b), and 109(c)

may be fabricated in-situ. The methods shown in FIGS. 107(a), 107(b), 107(c), 107(d), and 107(e) for laying wire side-by-side can be applied to making the top and bottom sections of the coax outer conductor/shield (although this can also be made from a single piece of wide, ribbon-like wire), whereas the center conductor and side sections involve more widely-spaced wires. In FIG. 109(a), one possible cross section of a coaxial transmission line is shown, in which the center conductor is supported by polymer members on either side. The polymer is preferably low loss (e.g., tangent loss), such as ZEONEX RS420 made by Zeon Corporation (Chiyoda-ku, Toyko, Japan), polystyrene, liquid crystal polymer, polyethylene, and polycarbonate, which can be solid, foamed, filled with hollow particles (such as hollow glass spheres from Potters Industries) or particles with good dielectric properties. Similarly, the cross section shown in FIG. 109(b) uses members above and below the center conductor (in some embodiments, one of these members in either version may be eliminated. By contrast, the cross section shown in FIG. 109(c) has no supports; this is intended to represent a cross section intermediate between cross sections such as those shown in FIG. 109(a) or 109(b). In other words, to reduce losses, it is best for the space between the center conductor and shield to contain as little dielectric as possible. Preferably most of the length of the coaxial line has a cross section similar to that of FIG. 109(c), but as needed, the other cross sections would be provided to give support to the central conductor. In some embodiments, the small gaps between wires shown may be larger or smaller than shown, depending on electromagnetic and process requirements. In some embodiments, wires would also be provided in the four corners of the cross-section shown in FIGS. 109(a), 109(b), and 109(c). In some embodiments, wires with other cross-sectional shapes such as flat (rectangular), hexagonal, or even oval or circular, may be used in lieu of the square wire shown, and the overall cross-sectional shape of the coaxial structure may be of a different shape than square as shown. For example, using flat wire, the top and bottom of the shield can be made with fewer pieces of wire if the shield is square, or a low-profile shield can be produced with rectangular overall cross-section. In some embodiments, structures such as those in FIGS. 109(a), 109(b), and 109(c), but without the center conductor, can serve as waveguides for high-frequency signals.

Coaxial cables and other structures such as these can serve as transmission lines but also as passive devices including band pass filters and hybrid couplers. They can be built straight, curved, and in serpentine or spiral configurations, for example, leading to compact high-frequency systems embedded within structural elements (e.g., the wings or fuselage of an unmanned air vehicle).

Coaxial structures may be incorporated into fabricated objects in some embodiments by a number of methods other than that described in FIGS. 109(a), 109(b), and 109(c). For example, the insulation of wire that is flexible and small diameter (e.g., the 2420/42 ultra-flexible microminiature lead wire of Daburn Electronics & Cable (Dover, N.J.) can be metallized, providing a coaxial structure that can then be printed as with normal FEAM printing of plain or insulated wire.

FIGS. 110(a), 110(b), 110(c), 110(d), 110(e), 110(f), and 110(g) depict a method used in some embodiments for fabricating coaxial structures wherein the center conductor may be a bare wire (e.g., copper, gold), the dielectric material is co-deposited as the wire is laid, encapsulating it, and the shield is applied using a secondary process (after at least a portion of the object has been fabricated). In the axial cross-sectional view of FIG. 110(a), a channel has been fabricated through the fabricated object. As shown, the channel has a triangular cross-section wherein two walls are at an angle beta (e.g., greater than 45°) sufficient to avoid the need for support material during fabrication; however, in some embodiment variations, other shapes such as circular and rectangular may be used, as well as support material (e.g., removable). On the floor of the channel support posts (e.g., dielectric) have been deposited at intervals as is clear from the radial cross-sectional view of FIG. 110(c). These posts are preferably narrow in the wire axial direction. Above the posts is deposited an elongated wire encapsulated within co-deposited dielectric, such as a polymer with desirable high-frequency characteristics (e.g., low tangent loss). Among the polymers which may be suitable are thermoplastics such as polystyrene, liquid crystal polymer, polyethylene, and polycarbonate, and ABS, all of which also can be electroplated and/or electrolessly-plated. Similar to FIGS. 55(a) and 55(b), the dielectric can bridge from one post to the other, by virtue of the wire inside. Bridging may be enhanced in some embodiment variations by keeping the wire under slight tension (e.g., feeding it at a linear speed slightly slower than the nozzle speed) and/or by rapid cooling of the dielectric upon extrusion. If the center conductor in the structure of FIGS. 110(a), 110(b), 110(c), 110(d), 110(e), 110(f), and 110(g) is not encapsulated while being co-deposited with the dielectric, but instead is embedded (e.g., ultrasonically), support material can be deposited under the bridge to support it during the embedding process, and then removed before metallization.

In some embodiment variations, the wire and dielectric may not be in a channel as shown (e.g., the wire and dielectric may be on the surface of an object); however, a channel will be assumed in this description. After fabrication of the structure shown in FIG. 110(a), the outside surface of the dielectric can be metallized. In some embodiment variations this may be accomplished by a vacuum metallization process such as sputtering or evaporation, or a gas phase process, while in other embodiment variations as will now be described, this can be accomplished by electroless plating. The channel may have apertures (not shown) at particular locations along its length to allow fluids to enter and exit the channel. In some embodiment variations, an electroless plating bath may be introduced along with other chemicals, as known to the art of electroless plating, such as cleaners, activators, conditioners, sensitizers, acids, catalysts (e.g., palladium), etchants, and rinses. The plating bath and associated chemicals may deposit a variety of metals, such as copper, nickel, gold, and tin (e.g., for solderability), various alloys, or a combination of several metal films, one on top of another. For high frequency applications, for example, a gold film having a thickness comparable to the skin depth can be beneficial. The plating bath and associated chemicals (collectively, "liquids") can be introduced into the channel in some embodiment variations by immersing the fabricated object, in which case liquids may enter the channel through apertures and/or the ends of the channel. In some embodiment variations liquids may be made to flow through the channels, e.g., driven by a pump. Channels may be interconnected and/or connected to a manifold which may be built into the object, thus allowing liquids to be introduced into channels and emptied from them in succession. Once introduced, liquids may reside inside the channels for a certain amount of time, or may be recirculated, as required by the metallization process.

Whatever the particulars of the process, after metallization, the structure appears as in the axial cross-sectional view of FIG. 110(b), and as in FIG. 110(c). Metal has formed an additional coating on the inner walls of the channel and around the support posts, but more significantly, has coated the dielectric surrounding the wire center conductor. The result is a coaxial structure whose shield is continuous except in a few locations in which it interrupted by the support posts. The additional coating of the channel walls can serve to further shield the wire serving as coax center conductor. In some embodiment variations, the dielectric surrounding the wire may not be easily platable (e.g., polyethylene, PVC, PTFE), but the dielectric comprising the walls of the channel is platable. In such as case, the dielectric surrounding the wire may be made very thin and the walls of the channel form the coax shield, with air as the primary (very low-loss) dielectric. In some embodiment variations, the wire is uncoated by dielectric, and supported at its ends and/or by regularly-spaced supports, and metallization of the interior of the channel (e.g., by electroless plating) generates a shield. Then, the wire, the channel walls, and whatever fills the channel (e.g., air) together comprise the coaxial structure. If the wire itself becomes metallized in the process, that is usually acceptable. In some embodiment variations, the dielectric surrounding the wire may be platable but the walls of the channel are not platable, thus no additional metal coating is generated.

FIG. 110(d) is a 3-D transparent sectional view of the channel before metallization, and FIG. 110(e) is a close up 3-D sectional view of the channel after metallization. FIGS. 110(f) and 110(g) are 3-D sectional views similar to FIG. 110(d), but with the side of the channel removed for clarity. In FIG. 110(f), the structure is shown as-fabricated, while in FIG. 110(g), the structure is shown after metallization, such as by copper or gold electroless plating. In some embodiment variations, multiple coaxial structures may be incorporated into a single channel and metallized simultaneously. In some embodiments, no center conductor is provided, and the dielectric shown surrounding the wire in FIGS. 110(a), 110(b), 110(c), 110(d), 110(e), 110(f), and 110(g) is pure dielectric, which when metallized by a secondary process, yields a waveguide. Alternatively, the channel itself, once its interior surface is metallized, can form a waveguide.

In some embodiments, the dielectric, which provided a surface upon which metal was deposited, remains in place. However, in other embodiments, the dielectric is removed at least in part. The dielectric, for example, can be a soluble material such as polyvinyl alcohol, polylactic acid, etc.), and dissolution can take place through the ends of the coaxial cable or waveguide, and can be facilitated by incorporating etch holes along the length of the structure.

In some embodiments, electrolytic plating of coax shields and other structures (such as junctions between wires) can be implemented, for example, by incorporating wires into the fabricated object which are, for the most part, exposed (e.g., supported at intervals by stopping and starting the flow of polymer while printing). Such wires can serve as anodes for electrolytic plating, and a suitable plating bath can be introduced (e.g., within a channel) between the anodes and a structure to be plated, serving as a cathode. For example, one or more anodes can be incorporated into the channels of FIGS. 110(a), 110(b), 110(c), 110(d), 110(e), 110(f), and 110(g) so as to electroplate the coax shield, in some cases, to thicken it after electroless plating. In some embodiments, wires incorporated into objects may serve as electrodes which allow, with a suitable bath chemistry, electrochemical machining, polishing, deburring, sharpening, and other processes of metallic structures such as other wires in the object.

Coaxial structures made according to the processes of FIGS. 110(a), 110(b), 110(c), 110(d), 110(e), 110(f), and 110(g), may in general need to be interfaced to connectors, devices (e.g., high-frequency integrated circuits), etc. Thus a region of the center conductor, e.g., at the end of the structure, must be exposed (i.e., not covered by dielectric or by a metallic shield). A method used in some embodiments to achieve a bare center conductor involves 1) encapsulating the region to be bare in a removable (e.g., soluble) and preferably unplatable support material in lieu of normal dielectric material; 2) metallizing (e.g., using electroless plating as described above), which if the support material is not plated, will leave it exposed; and 3) removing the support material. An alternative method used in some embodiments is to leave regions of the center conductor uncoated/unencapsulated in dielectric. During the region uncoated in dielectric and proceed with the metallization process. The exposed center conductor may become itself metallized, which can increase its thickness, though usually by a negligible amount. The side of the dielectric, however, will likely become metallized, potentially forming a short between the shield and center conductor. However, the thin coating of metal on this wall can be removed (e.g., by abrasive blasting).

FIG. 111 is a cross-sectional plan view of a process in some embodiments for forming a shielded junction in the form of the letter "T"; however, junctions with other geometries such as that of the letter "L" or "X" may be similarly formed. In FIG. 111(a), two wires have been laid, each encapsulated by co-deposited dielectric in certain regions. Conductive material (e.g., ECPC, solder) has then been applied as in FIG. 111(b) to form an electrical junction between the wires. Then, in FIG. 111(c), additional dielectric has been deposited to fully encapsulate the conductive material and any exposed portion of the wires. Finally, in FIG. 111(d), the structure of FIG. 111(c) has been metallized (e.g., by electroless plating after the entire object is fabricated), resulting in a continuous outer shield surrounding the joined center conductors.

Figure 112A:
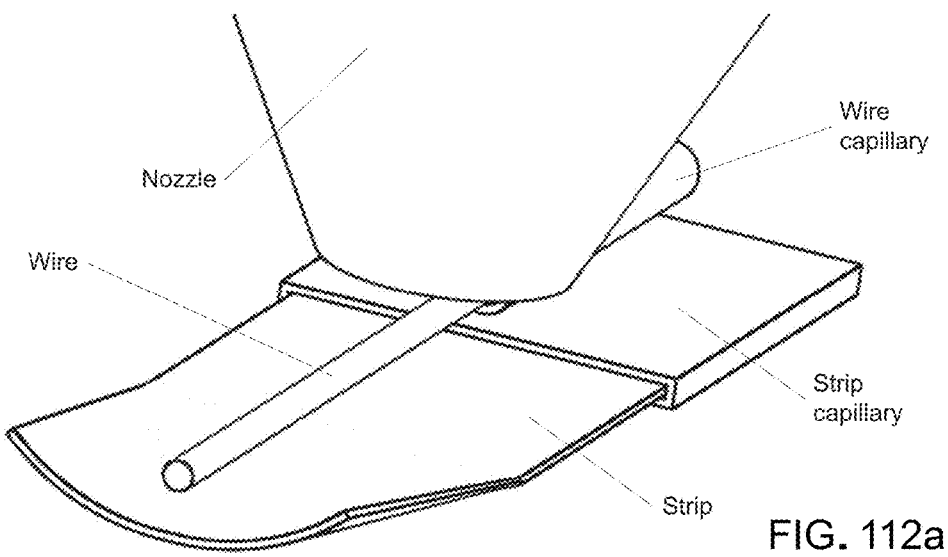
Figure 112B:
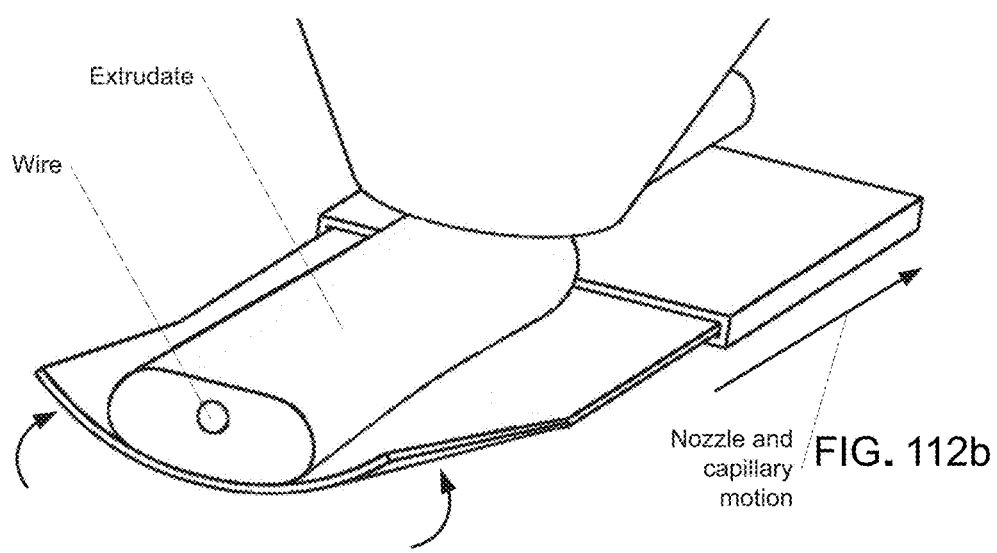
Figure 112C:
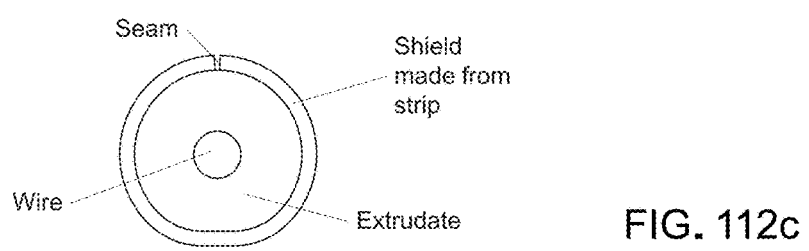

FIGS. 112(a), 112(b), and 112(c) depict a modified FEAM method in some embodiments in which, in addition to supplying wire (e.g., of round cross-section) to the extrudate so that the wire is encapsulated by liquid material as printing progresses, at least one narrow strip or foil of metal is also supplied. FIG. 112(a) is a 3-D view of a nozzle extruding a polymer (e.g., molten thermoplastic), nearby which are located two capillaries. The upper feeds wire, while the lower feeds a metal strip. In some embodiment variations, as shown in the 3-D view of FIG. 112(b), surface tension of the extruded liquid causes the thin strip, whose width has been carefully selected, to be pulled inwards toward the extrudate, ultimately wrapping around the extrudate to form the shield of coax cable, possibly with a small seam (a gap as shown, or overlap area), as illustrated in the cross-sectional view of FIG. 112(c). In some embodiment variations, rather than a single strip wrapping around the extrudate, two or more strips may be provided (e.g., on either side of the extrudate) which both wrap around the extrudate and together form the shield. In some embodiment variations, rather than or in addition to relying on fluid forces to deform the strip(s) into the desired shape(s), at least one mechanism such as guide fingers or forming dies which move along with the nozzle on either side of the extrudate, force the strip to adopt the desired shape.

Figure 113A:
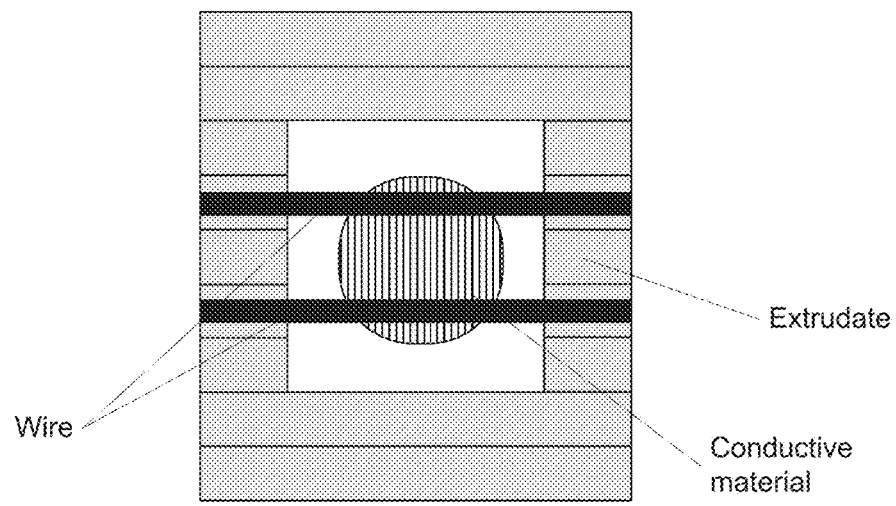
FIGS. 113(a) and 113(b) show different types of junctions.
Figure 113B:
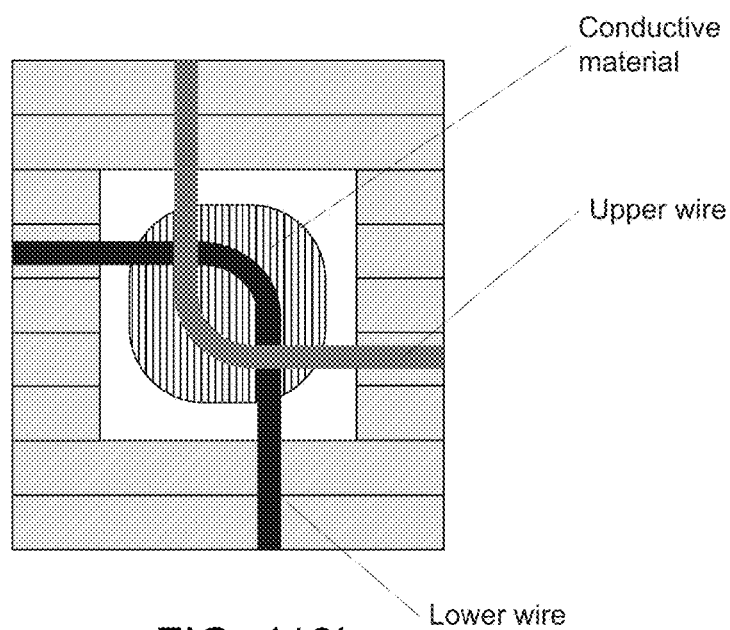

FIGS. 113(*a*) and 113(*b*) depict cross-sectional views of two junction designs in addition to those previously described (e.g., FIGS. 98(*a*), 98(*b*), 98(*c*), 98(*d*), 98(*e*), and 98(*f*)), and used in some embodiments. FIG. 113(*a*) can be seen either as a plan view (for an intra-layer junction) or an elevation view (for an inter-layer junction) of a junction wherein the wires extend substantially straight across a cavity in the surrounding dielectric material. As shown, even if the junction is at the end of a wire, the wire may extend past the cavity so it can be better anchored in the dielectric. FIG. 113(*b*) depicts a plan view of a junction with two wires that are bent approximately 90° within the cavity; these wires may be on the same or different layers. In the case of both junctions, conductive material has been applied to the wires, shorting them together, but the conductive material, as shown, does not necessarily make contact with the material forming the cavity walls, floor, or ceiling (if applicable). Thus the conductive material may be applied or reflowed at a temperature higher than the temperature easily tolerated by the material of the cavity, if care is taken not to make direct contact with the cavity walls. Moreover, the material need not adhere to the cavity walls, so long as it adheres well to the wires. Also, the junction is somewhat isolated from strains imposed on the cavity walls by the surrounding fabricated object, especially in the case of the junction in FIG. 113(*b*). Finally, since the wires in both junctions are anchored within two cavity walls, they are less likely to deflect (e.g., if subject to a force while creating the junction, such as the drag due to ECPC entering the cavity).

As already described above, in addition to forming junctions with ECPC, junctions may be formed with other materials, such as conductive inks, powders, fine wires, and solder (including deposited and reflowed solder balls), or without the addition of other materials, such as by welding. In the cross-sectional elevation views of FIGS. 114(*a*), 114(*b*), 114(*c*), and 114(*d*), junctions may be formed in some embodiments using solder delivered to the wires via a heated tube. In FIG. 114(*a*), a junction precursor comprising two wires (preferably tinned) on different layers (e.g., adjacent layers) similar to that of FIG. 113(*a*) is shown. In some embodiments, the wires may not cross the cavity completely and continue into the right-hand wall of the cavity as shown, but may terminate within the cavity as in FIG. 98(*a*). In some embodiments, the wires may not overlap in FIG. 98(*b*), but may be staggered as in FIG. 98(*c*). A heated tube (e.g., borosilicate glass, stainless steel, ceramic) is provided to deliver molten solder. The tube is filled with solder, or is in communication with a reservoir of solder. The tube can be heated, for example, by wrapping it with an insulated, resistive heater (e.g., wraparound heating cord from Omega Engineering, Inc. (Stamford, Conn.). By applying pressure to the solder (e.g., by air or plunger) or reducing a vacuum above, the solder can be made to flow through and out of the tube. In the figure, the solder is entirely within the tube, which may be beneficial to prevent a solder drop from breaking off inadvertently due to motion or vibration. In some embodiment variations, one or two additional elements are provided, as shown in FIG. 114(*a*): a tube that delivers flux (e.g., from a reservoir), and a tube or other means for extracting fumes which may be produced during soldering of the joint. In some embodiment variations, the tubes are at arranged differently, e.g., at different relative angles. All elements can move together as part of a soldering head which can be positioned anywhere within a layer of the fabricated object that a junction is required; alternatively the elements can be transported by a printhead in the X/Y plane, and lowered as needed to reach the junction volume.

In FIG. 114(*b*), the elements have been positioned to partially enter the cavity and flux (if needed) has been caused to flow from the left-hand tube onto the wires. In some embodiment variations, rather than be provided as a drop, flux can be sprayed in atomized form, or pre-mixed with the solder. In some embodiment variations, the flux can be pre-heated in its reservoir and/or as it flows down the tube, to activate it. In FIG. 114(*c*), molten solder has been caused to flow onto the wires; the fume extractor is also activated if needed. In FIG. 114(*d*), the elements have been removed, breaking off the drop of solder, which remains on the wires, forming a junction.

A similar process can be used in some embodiments to join more than two wires, to join wires within the same layer rather than different layers, to join wires both within the same layer and on different layers, to solder wire to pads on devices such as integrated circuits and photonic devices, etc. A similar process may be used to create a joint using solder paste, such as Indium5.7LT (Indium Corporation, Utica, N.Y.), a low-temperature, no-clean, lead-free solder paste incorporating eutectic 58Bi/42Sn or 57Bi/42Sn/1Ag alloys. In this case, one tube can supply the solder paste (and in some embodiment variations, the paste can be pre-heated in its reservoir and/or as it flows down the tube, to activate it), while the other tube can supply air at high temperature (e.g., similar to the ZT-2-MIL Hot AirPencil) to reflow the paste. A similar process (possibly without flux or fume extraction) can also be used in some embodiments to deliver inks such as self-drying inks (e.g., those of Voxel8), photonically-cured inks (e.g., those of NovaCentrix (Austin, Tex.), etc.

Figures 115A, 115B, 115C:
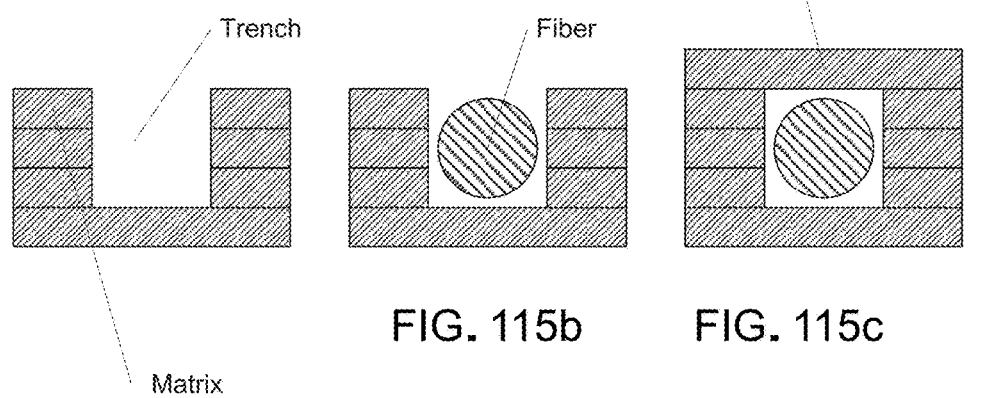
FIGS. 115(a), 115(b), 115(c), 115(d), 115(e), 115(f), 116(a), 116(b), 116(c), and 116(d) show methods for incorporating thick fibers.
Figures 115D, 115E:
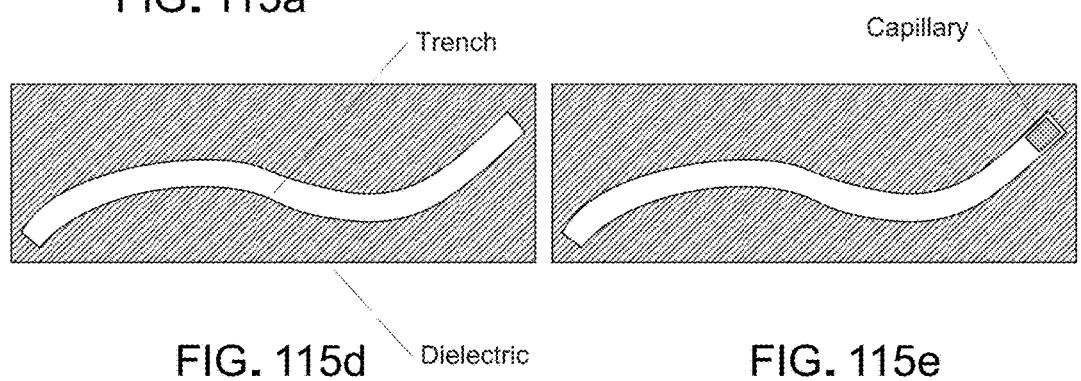
Figure 115F:
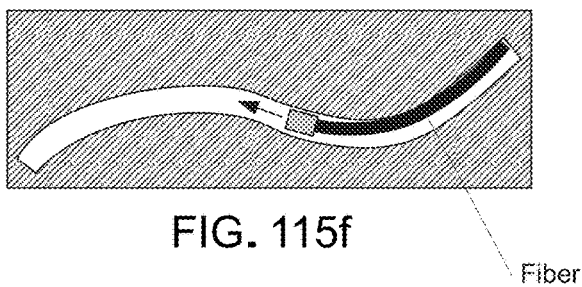
Figure 116A:
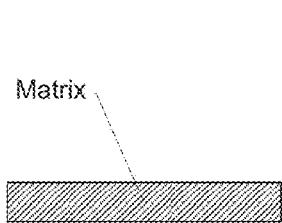
Figure 116B:
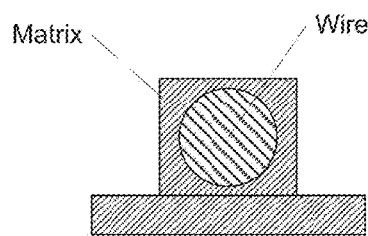
Figure 116C:
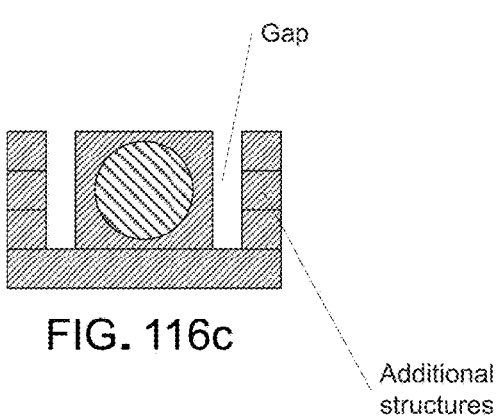
Figure 116D:
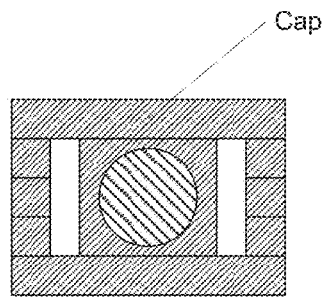

In some embodiments, it is desirable to incorporate into a fabricated object fibers that are large in cross-sectional height (e.g., larger diameter). In some embodiments, the thickness of a layer may be varied according to the height of the fibers to be encapsulated in the layer. In other embodiments as described in FIGS. 115(*a*), 115(*b*), 115(*c*), 115(*d*), 115(*e*), 115(*f*), 116(*a*), 116(*b*), 116(*c*), and 116(*d*), it is possible to incorporate a fiber of greater height than the layer thickness. FIGS. 115(*a*), 115(*b*), and 115(*c*) depict in a cross-sectional elevation view a method of encapsulating a fiber within a trench. In FIG. 115(*a*), the trench is formed by depositing several layers (as shown, three). In FIG. 115(*b*), the fiber is laid within the cavity, and in FIG. 115(*c*), the cavity has been capped. In some embodiment variations, while the fiber is laid, matrix material (e.g., polymer) can be deposited around it, as in the standard FEAM process. In other embodiment variations, after the fiber is laid, matrix material may be introduced to surround it. The plan views of FIGS. 115(*d*), 115(*e*), and 115(*f*) illustrate the steps in FIGS. 115(*a*) and 115(*b*) from a different angle. FIG. 115(*d*) shows that the trench may have a complex (e.g., serpentine) shape. To lay fiber into a non-linear trench such as this, it may be delivered by a capillary such as is normally used in FEAM. The capillary can be entirely above the top surface of the trench, or can be narrow enough to be inserted at least partially in the trench. Matrix material may be deposited around the fiber continuously, intermittently, or at one or both ends, to retain the fiber in the trench, if required (if the trench is capped, this may not be).

FIGS. 116(*a*), 116(*b*), 116(*c*), and 116(*d*) depict in cross-sectional elevation views an alternative approach in some embodiments for incorporating a fiber having a height greater than the local layer thickness. In FIG. 116(*a*), a substrate has been provided, upon which a wire, encapsulated in matrix, has been deposited in FIG. 116(*b*). In FIG. 116(*c*), other structures on the layers above the substrate have been formed around the fiber, possibly with a gap between them and the fiber as shown, as it may not be possible to deposit them directly adjacent to the fiber, protruding above the surface. Finally, in FIG. 116(d), the next layer has been formed, including if desired, a cap over the fiber.

Fiber may shrink less than matrix material in a fabricated object, such as when a metal wire is co-printed with a thermoplastic polymer, and the object allowed to cool. Shrinkage can be due to phase changes, cooling, curing, etc. This differential shrinkage may lead to fibers, especially those surrounded by air (or other fluid) which are intended to be straight but which curve, sag, or buckle as the surrounding matrix contracts. Conversely, the fiber may shrink more than the matrix, in which case, it may break under tensile stress. Several methods may be used in some embodiments to mitigate or control this distortion. For example, in some embodiments, the fiber may be given a corrugated (e.g., serpentine or sinusoidal) shape before laying it. Then, it can be laid under some tension (e.g., by feeding it at a speed or through a distance that is less than the nozzle's motion), stretching out the corrugation and straightening the fiber at least partly (though not enough to completely plastically deform the fiber). Then, if the matrix shrinks relative to the fiber, it will simply adopt a more corrugated form, controllably, without buckling or sagging. Or, if the fiber shrinks more than the matrix, it will simply become less corrugated.

Other methods of reducing differential shrinkage effects include heating the wire to increase its axial shrinkage upon cooling, and using matrix materials with reduced shrinkage (e.g., containing glass microspheres).

Figure 117A:
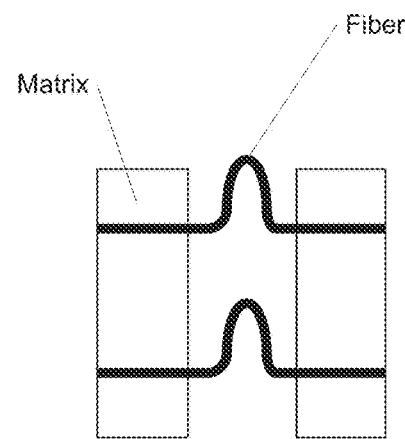
FIGS. 117(a), 117(b), and 117(c) illustrate methods for managing differential size change.
Figures 117B, 117C:
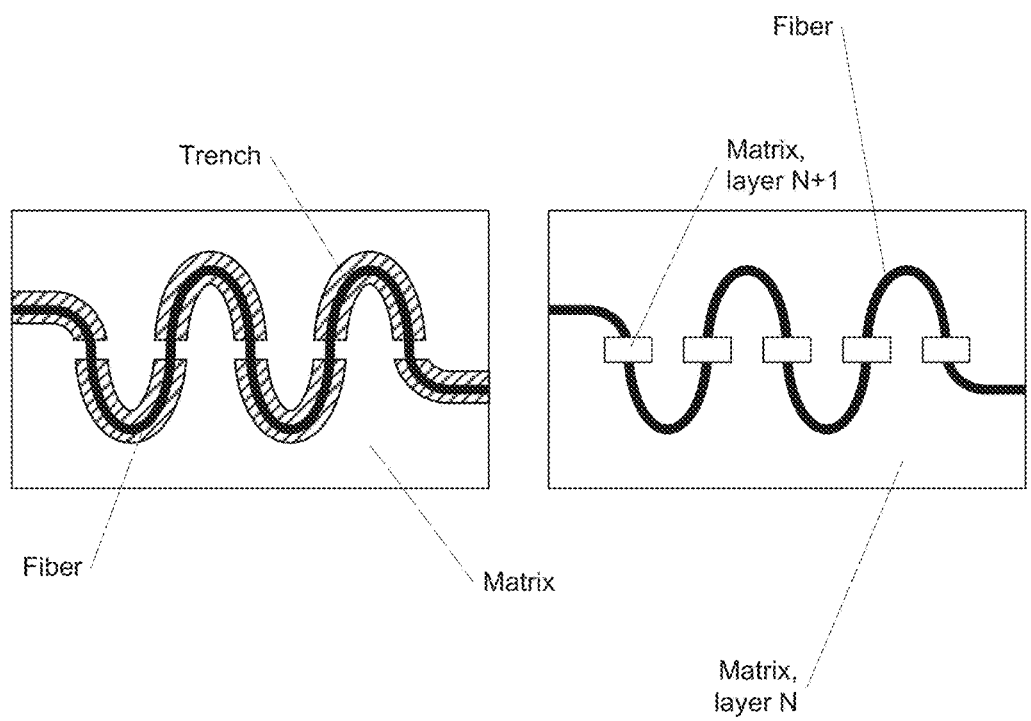

FIGS. 117(a), 117(b), and 117(c) depict an arrangement of fibers which can accommodate differential size changes. In FIG. 117(a), the fibers are formed into compliant loops in the region between regions of matrix material where there is no matrix (e.g., the fibers are surrounded by air). A change in the width of the region causes a controlled deformation of the loop, but no sagging or buckling. In FIGS. 117(b) and 117(c), the fiber is formed into a serpentine shape and anchored to the matrix only at certain locations. Considering the shape of the fiber to be sinusoidal, the fiber is anchored as illustrated in the region of its "zero-crossing points". However, it may instead, or in addition, be anchored in the region of its "peak" and "trough". In FIG. 117(b), the fiber is within a trench which allows it some movement relative to the matrix, while in FIG. 117(c); the fiber is on the surface of layer N and anchored by small structures on layer N+1, allowing it even more potential movement. In some cases, the fiber may undergo a more dramatic size change than the matrix; in such cases, the methods described are similarly applicable.

Other methods of eliminating buckling involve using a wire that can be stretched (e.g., Litz wire, wire that is wound into a helical or double helix (with two strands) shape, etc. If such wire is stretched slightly between two anchor points, it will simply shorten as the surrounding material shrinks, without buckling.

Figure 118A:
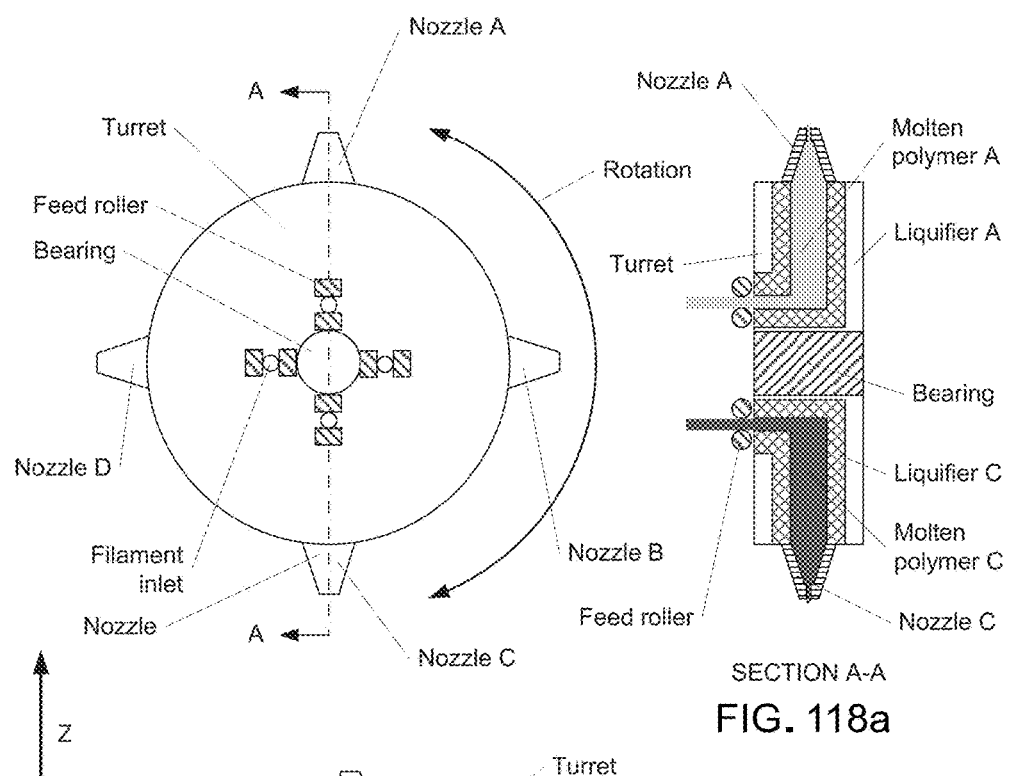
FIGS. 118(a) and 118(b) depict a multiple nozzle printhead.
Figure 118B:
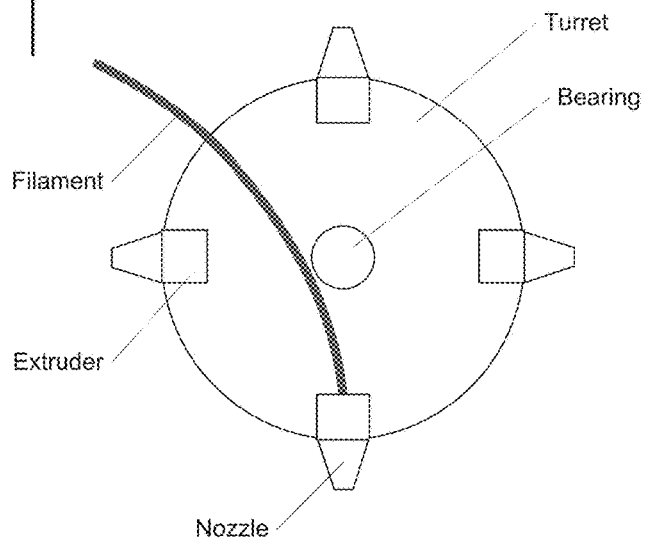

FIGS. 118(a) and 118(b) depict a multi-nozzle printhead intended in some embodiments to allow FDM and FEAM-based printing with multiple materials (e.g., both structural/model and support materials) and/or multiple nozzle geometries. As depicted, a cylindrical turret is provided, though other shapes such as square, hexagonal, and octagonal may be used. Along the outer surface are arranged multiple (e.g., four, as shown) nozzles. The turret can rotate, bringing any nozzle to the bottom, such that its orifice is in a consistent position. In this position, the lower end of all nozzles may be arranged to be at the same height, however in some embodiment variations, the heights may differ among nozzles. By bypassing the need for multiple nozzles in different locations in conventional FDM machines, this approach avoids needing to know the exact X and Y offset distances between nozzles, allows parts larger in X and Y to be built without increasing the travel range(s) of the X and/or Y stages, and avoids the potential for collision between an inactive nozzle and the fabricated layer. It further allows inactive nozzles to be serviced at a convenient location (e.g., wiping excess material from them, purging them to manage a clog). Finally, in the case of a FEAM system in which the platform rotates as in FIG. 42, all nozzles can be precisely aligned with the theta axis, which allows all of them to be used when encapsulating fiber.

In some embodiment variations, the nozzle orifices have different sizes and/or shapes, as may be useful, for example, when a fine nozzle is needed to produce small features, while a coarse, larger diameter nozzle is used, for example, to rapidly deposit material over large areas such as the interior of a layer. If all nozzles are used to deposit the same material, they may be fed in some embodiment variations using a single filament, e.g., entering the side of the turret near its center of rotation. Or, in other embodiment variations using a common hopper and extruder which supplies pellets, and one or more extruders may in some embodiment variations be built into the turret.

In some embodiment variations, different materials are supplied to different nozzles, as shown in the figures. In the elevation and cross-sectional views of FIG. 118(a), each filament may enter the side of the turret through an inlet, advanced by feed rollers, and be melted in a right-angle liquifier in which the molten material flows through a 90° turn (in some embodiment variations, other angles may be used), such that the molten polymer (or other material) can issue through the nozzle.

In some embodiment variations, the turret can be rotated so that the nozzle axis is not vertical as shown in FIG. 118(a), but is at a non-zero angle "A" from the vertical Z axis. At such an angle, the machine can be used to print layers at an angle A from the horizontal, e.g., which may be desirable to minimize stairsteps. Such printing in general requires coordinated movements of the platform or nozzle in Z as well as X and Y. In some embodiments, the turret axis parallel to the Z axis, not horizontal as shown in FIG. 118(a), and the axis of the nozzles is also parallel to Z. In this configuration, the liquifiers may have a straight instead of a right-angle design.

If the turret were to rotate continuously in one direction to switch between nozzles, filaments entering it may become twisted. To avoid over-twisting, in some embodiment variations, the amount of rotation is monitored and the turret reversed as needed. In some embodiment variations, coiled filaments may be arranged concentric with the turret (i.e., multiple coils can be distributed axially along the turret rotation axis), so that as the turret rotates, the coil rotates as well. In such an arrangement, new filament may be pulled from either the exterior of the coil (e.g., if on a spool) or from its center (e.g., if there is no spool).

FIG. 118(b) depicts another embodiment variation in which the filament enters the turret neither parallel to the turret axis of rotation, nor parallel to Z, but rather, through a hole on the (e.g., cylindrical) wall of the turret, and then arcs toward the liquifier. However, care must be taken to prevent excessive filament twisting in this configuration.

In some embodiment variations, a single motor may be used to advance the feed rollers of the active nozzle, so that a motor is not required for all nozzles. In some embodiments, the axis of the turret may be oblique, as with the turrets on multi-objective microscopes, with nozzles oriented such that the active nozzle is always parallel to the Z axis. In the case of multiple nozzles delivering the same material, the turret may include only nozzles and not feed rollers and liquifiers, both of which remain fixed, and a single filament (e.g., entering vertically through the rollers) may be provided. Thus, the nozzle geometry can be rapidly changed. In some embodiment variations, an extruder such as the screw extruder of FIG. 49 may be used in combination with a turret system. Multiple such extruders may be housed within the turret, with polymer pellets fed to them through tubing feeding into the inlets, in lieu of filament. The tubing may be vibrated and/or air flow or pressure may be used to help transport the pellets into the turret.

Figure 119A:
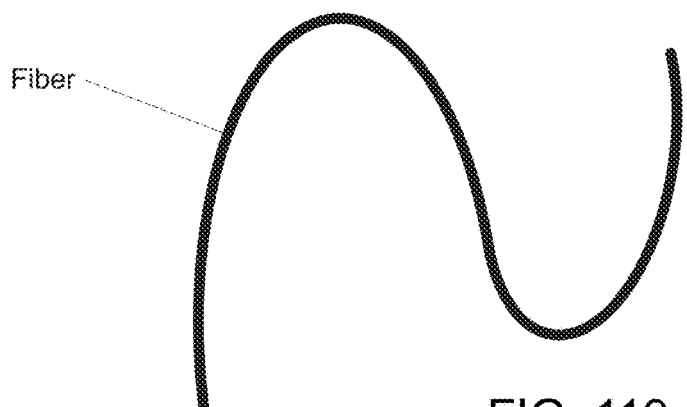
FIGS. 119(a), 119(b), and 119(c) show methods for producing curved fiber shapes.
Figure 119B:
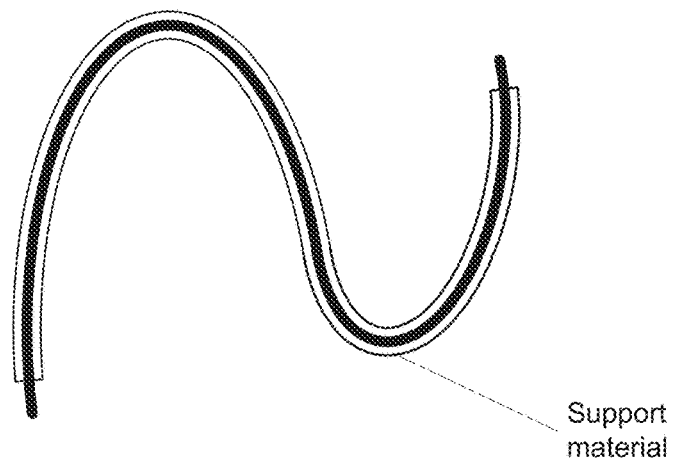
Figure 119C:
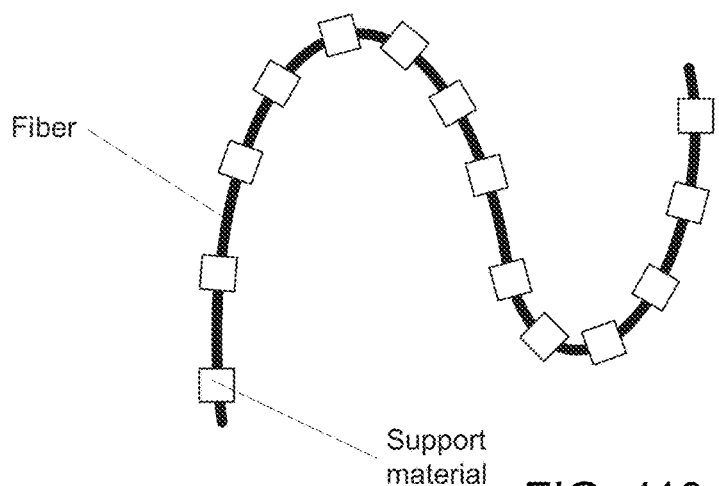

In some embodiments, it is desirable to incorporate bare or minimally-supported fiber in a fabricated object. If the fiber is straight (i.e., the shape it typically has when delivered through the capillary), it may be sufficient to anchor it to the object at both ends. However, if the desired shape is curved as with the fiber in the plan view of FIG. 119(*a*), for example, it must be curved into the shape, as well as being anchored. FIG. 119(*b*) depicts in plan view a fiber which is laid using FEAM while being encapsulated in a removable support material. The support material, which may be anchored to structures on the same or underlying layer, thus captures the fiber and forces it to be laid in the desired form. Removal of the support material then frees the fiber, resulting (if the fiber is very ductile) in a fiber shaped similarly to that of FIG. 119(*a*). If the fiber is less ductile and retained residual stress, then after removal of the support material, it will spring back into a new configuration. For such fibers, the initial shape of the fiber when constrained by support material can be designed to compensate for the springback, so that the desired shape is achieved.

In some embodiments, springback and temporary constraint of non-ductile fibers may be exploited so as to store mechanical energy in a fabricated object, which can later be released to do work or distort the fabricated object in desirable ways. For example, a coil spring may be fabricated from a relatively high yield wire (e.g., thin music wire), encapsulated by soluble support material. Upon dissolution, the spring will unwind partially; this motion or the forces it produces on surrounding elements can be used to advantage, e.g., to produce motion in a fabricated object, or to reduce the clearance between two components in a printed assembly. For example, a wind-up toy may incorporate gears and a spring that is built already wound-up. Removal of the support material can then release the spring. Wire that is laid under tension or torsional strain, as well as bending strain, can deform an object, such as one made at least in part from an flexible material, into a shape that might not easily be fabricated (e.g., one with surfaces which if built at the desired orientation would exhibit stairsteps, so instead they are built horizontally or vertically, and rotated into position automatically). To reliably encapsulate in a deformed state a wire that is relatively stiff, in some embodiment variations cooling of the extrudate may be used, and/or, the FEAM process may process more slowly than usual. In some embodiments, rather than support material per se, fibers can be temporarily constrained by a restraining material that can be melted, softened, or dissolved, allowing the fiber to reconfigure. In the case of a material that is melted (e.g., a wax) or softened, the fiber itself, or a nearby fiber, may be used to provide the heat (through resistive (Joule) heating) needed to melt or soften the material. In some embodiments, energy may be stored in elastomer structures as well as, or in lieu of storing it in encapsulated fibers.

To facilitate removal, support material in some embodiment variations is not continuous along the fiber, but instead is distributed in small regions such as in FIG. 119(*c*).

Figures 120A, 120B:
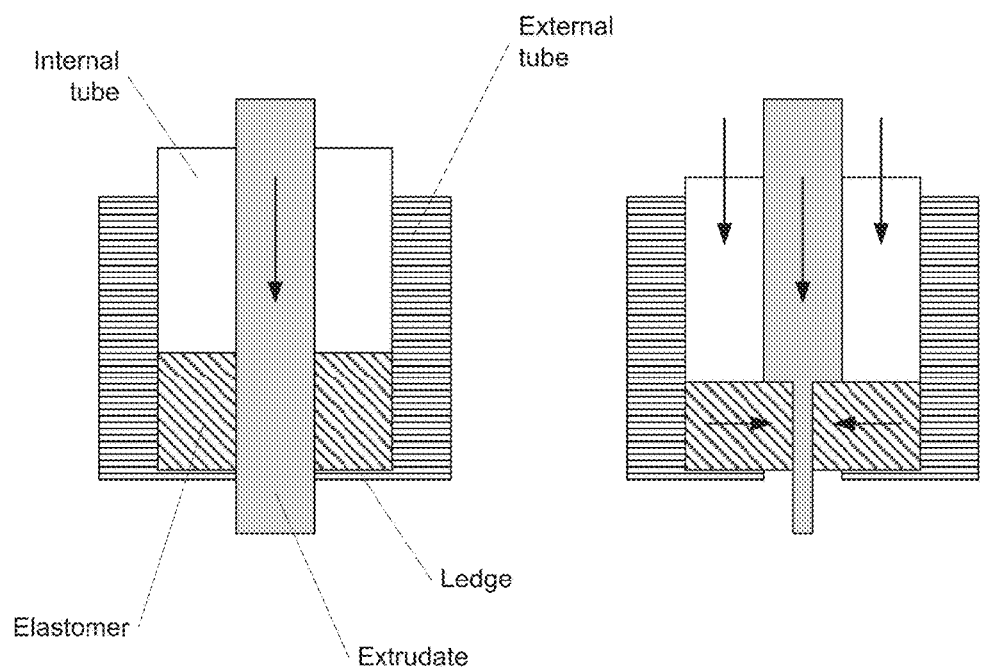
FIGS. 120(a), 120(b), and 120(c) depict a printhead with a variable size orifice.
Figure 120C:
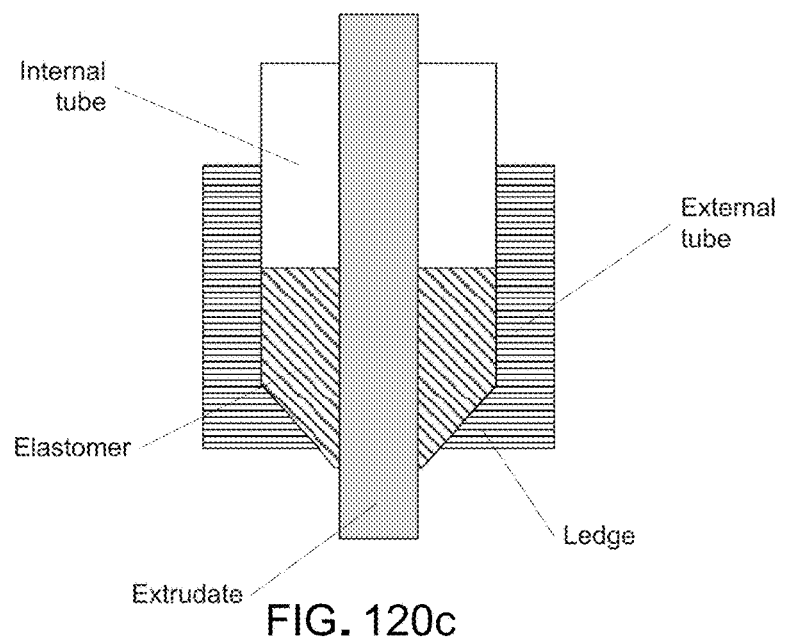

FIGS. 120(*a*), 120(*b*), and 120(*c*) depict a variable-width extruder nozzle used in some embodiments for extruding thermoplastics, thermosets, and other materials. The nozzle has a variable diameter orifice, and is able to produce a variable-width extrudate. The nozzle, similar in some respects to a Touhy-Borst device used in medical equipment, comprises an internal sliding tube, an external tube provided with a ledge at its bottom end, and an elastomeric ring. The ledge is perforated with a central hole whose diameter is at least as large as the largest orifice required. The elastomeric ring has an inside diameter which is at least as large as the largest orifice required. The ring is sandwiched between the lower end of the internal tube and the ledge as in FIG. 120(*a*). By apply a force to the tube, the ring is compressed, causing its inside diameter, which forms an orifice, to be reduced. Material inside the tubes, if pressurized, is forced through the orifice, forming an extrudate whose diameter is determined by the compression of the ring. In FIG. 120(*a*), the ring is compressed little if at all, while in FIG. 120(*b*), is compressed far more, reducing the orifice size. The orifice of such an extruder nozzle can be rapidly varied in size while an object is being fabricated, either continuously, to create tapered extrudates, or in steps. For example, a small orifice can be used to deposit material for small features, while a larger orifice may be used to rapidly deposit material over large areas. The ledge is preferably as thin as possible, so that the orifice can be as close to the layer surface as possible. In some embodiment variations, the ring and ledge may be conical in shape, as in FIG. 120(*c*), with the ring preferably protruding through the ledge, such that there is no opportunity for the ledge to disturb the extrudate. In some embodiment variations, the ring may be compressed radially vs. axially, such as by a 3-4 jaw chuck or collet known to the art of machine tools, or by providing it with a tapered outside surface which is larger toward the bottom, and sliding a ring along it to vary the radial compression. For use with thermoplastics and other materials at elevated temperature, the tubes are preferably made from metal, and the elastomer is preferably a high-temperature material such as silicone.

Figures 121A, 121B:
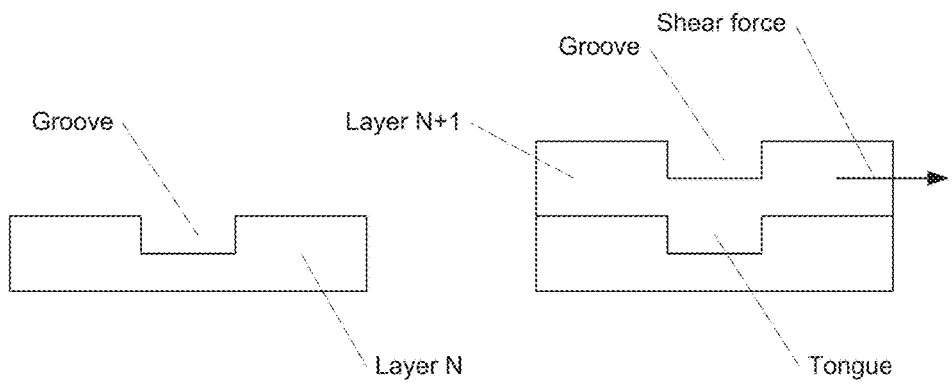
FIGS. 121(a), 121(b), 121(c), 121(d), and 121(e) show a method for increasing bonding between layers.
Figures 121C, 121D:
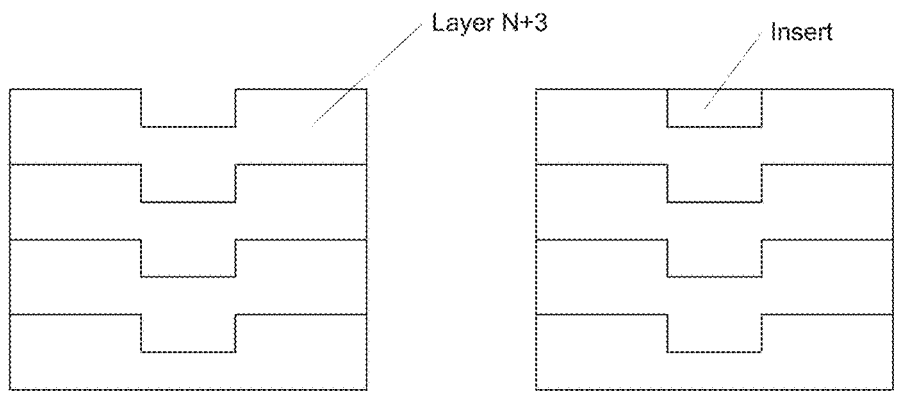

FIGS. 121(*a*), 121(*b*), 121(*c*), 121(*d*), and 121(*e*) are elevation cross-sectional views depicting a method for building structures in some embodiments using additive manufacturing, in which the strength of the fabricated object is improved along the Z-axis and in the X/Y plane. The geometry of the interlayer joint obtained with this method has similarities with tongue and groove joints used in woodworking. In FIG. 121(*a*), material has been deposited on Layer N so as to leave one or more grooves within a single extrudate, or in a group of adjacent extrudates. In FIG. 121(*b*), material has been deposited on Layer N+1 over the material on Layer N. A portion of the material deposited on Layer N+1 forms a tongue which enters into the groove on Layer N, filling it in. The surface area at the interface between Layers N and N+1 is greater due to the tongue and groove than in the case of a typical planar interface, thus increasing adhesion between the layers when subject to tensile forces. Moreover, because of the mechanical interlocking provided, a shear force such as that shown in FIG. 121(*b*) is less likely to cause delamination between the layers. In FIG. 121(*c*), additional layers have been added, and in FIG. 121(*d*), a small amount of material has been added to the groove on Layer N+3—an option if Layer N+3 is the topmost layer in this region of the object—forming an insert that smooths the upper surface.

Figure 121E:
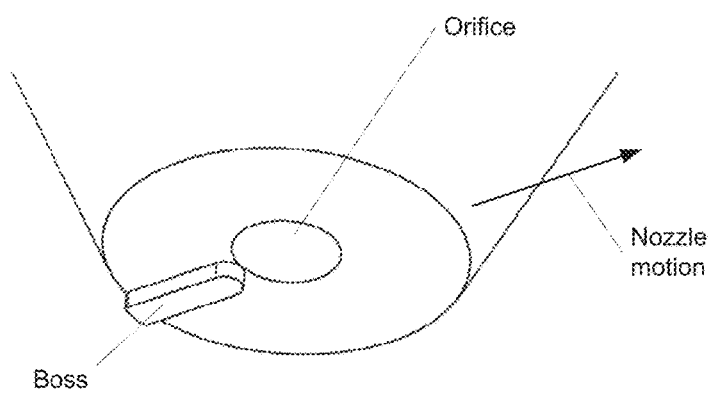

The groove in FIG. 121(a) may be produced by a nozzle having a shape similar to that shown in the 3-D view of FIG. 121(e). A boss having approximately the width of the desired groove projects from the bottom surface of the nozzle. When the nozzle moves relative to the build platform in the direction shown, the boss forms the extrudate into a shape having a groove. The nozzle (or the fabricated object) can be rotated according to the nozzle trajectory, such that the boss remains more or less tangent to the path. Once the groove of FIG. 121(a) is formed, entry of material into the groove on Layer N+1 may occur naturally as the result of the material on Layer N+1 being flowable. However, if a nozzle such as that in FIG. 121(e) is used to deposit material on Layer N+1, the boss, while forming the groove on that layer, will also tend to push material down into the groove on Layer N.

In some embodiment variations, the boss is given an undercut shape (e.g., wider at the bottom than at the top, or shaped like an inverted letter "T"). The resulting groove in the extrudate of Layer N is thus also undercut, and material applied on Layer N+1 entering the groove will be mechanical interlocked once solidified. Despite the undercut geometry, removal of such a boss from the extrudate (e.g., when jumping to a new location on the layer, or on another layer) is easily accomplished by selecting a location along the toolpath where the undercut can be disrupted with negligible effect, and simply pulling the nozzle through the material while the latter is in a flowable state (e.g., melted).

In some embodiments, grooves formed in extrudates may be used to increase the bond strength between extrudates within the same layer. For example, by incorporating a projection on the nozzle of FIG. 121(e) having a cross-sectional shape similar to the letter "L" (in lieu of the "I", or straight shape shown), and locating the projection to one side of the orifice centerline, a groove can be formed in the sidewall of the extrudate, instead of at the top (however, both types of grooves can be used). As with the upper boss, an undercut shape can be provided. For example, the groove can be formed in the side pointing in the direction of positive X, if the extrudate runs parallel to the Y axis). Extrudate then deposited on the opposite side (pointing in the direction of negative X) will then tend to flow into the groove and increase the bonding between the neighboring extrudates. An entire series of side-by-side extrudates may thus be formed, with the groove consistently on one side; however, in some embodiment variations, the side may vary.

Figure 122:
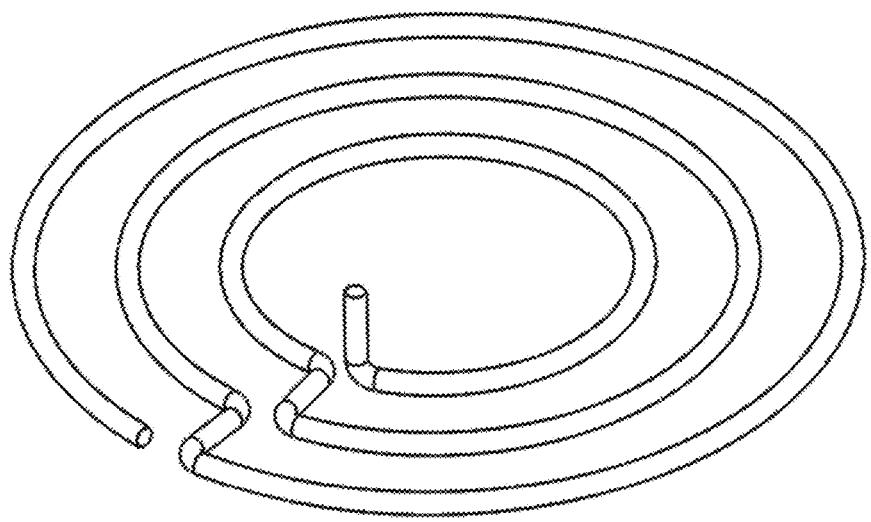
FIG. 122 illustrates a fiber with a particular shape.
Figure 123:
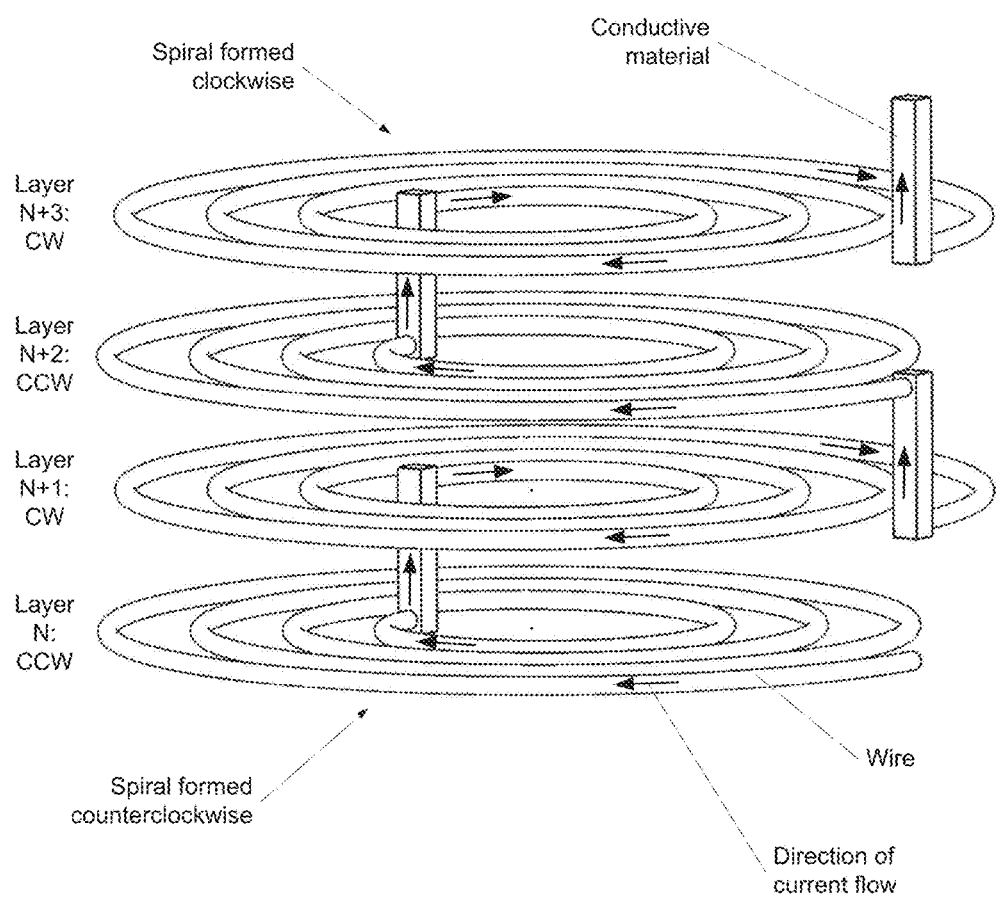
FIGS. 123 and 124 illustrate a method for producing a multi-layer coil.
Figure 124:
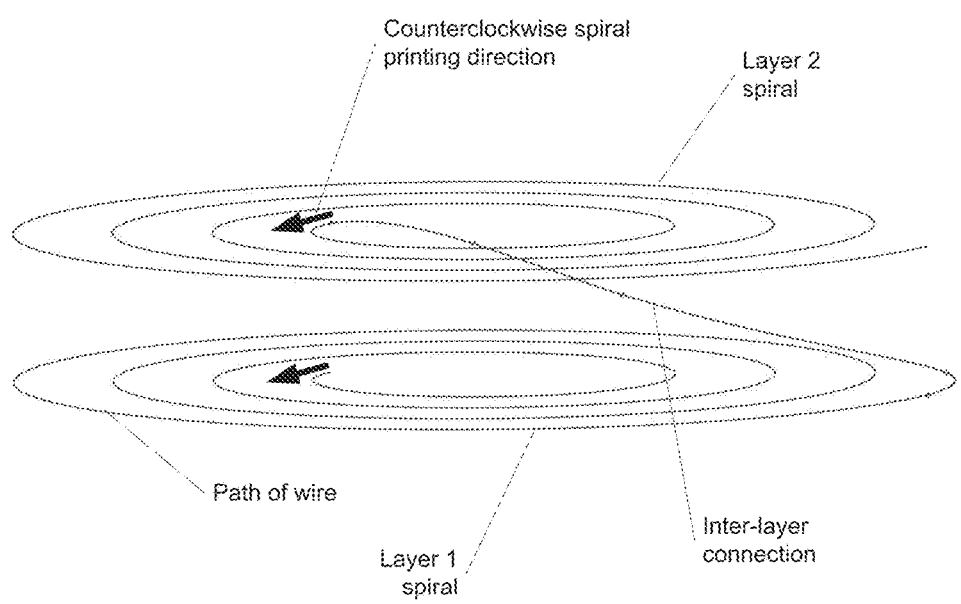

FIGS. 122, 123, and 124 depict novel coil designs that can be advantageous in some embodiments in the context of the FEAM process. FIG. 122 depicts a 3-D view of a single-layer spiral coil similar in some respects to one of the coils in FIGS. 11(a) and 11(b), but having a "quantized" radius. In other words, unlike a typical spiral in which the radius changes continuously with angle, the radius of the spiral in FIG. 122 is constant for most angles, and changes suddenly at a particular angle. This design can be implemented in a multi-layer version as well.

FIG. 123 is a 3-D view of a multi-layer spiral coil in some embodiments in which the spiral wires on each layer are connected electrically in series with one another, in which current can flow consistently counterclockwise as seen from the top or clockwise (as shown) through all spirals, in which the connections between spirals are made using a conductive material such as ECPC or solder (vs. continuous wire), and most significantly, in which the spiral on each layer is produced by laying wire from the inside to the outside, i.e., with increasing radius. It can be easier in the FEAM process to produce a spiral shape in which the radius only increases, as there is no potential for interference, especially with small diameter coils, between a portion of the spiral already formed and the capillary. To achieve this, the spiral on Layer N is formed with increasing radius in a counterclockwise direction, that on Layer N+1 is formed with increasing radius in a clockwise direction, that on Layer N+2 is formed with increasing radius in a counterclockwise direction, and that on Layer N+3 is formed with increasing radius in a clockwise direction, etc. Conductive material, forming a (Z-axis) interlayer junction or via, connects the inner ends of the wires on Layers N and N+1, and the inner ends of the wires on Layers N+2 and N+3. Conductive material also connects the outer ends of the wires on Layers N+1 and N+2, and the outer ends of the wires on Layers N+3 and N+4 (not shown), and so forth. In some embodiment variations, all inner ends of the spirals are connected together, as well as all other ends, thus connecting all spirals electrically in parallel. The spacing of the layers and therefore, the length of the junctions, is not necessarily to scale and is exaggerated for clarity; typically spirals are fabricated on neighboring layers, without layers that are "blank" other than the junction. In some embodiments, spiral wire shapes (e.g., for coils) are preferably made polygonal (e.g., square) so that potential interference between the capillary and deposited material only occurs a few times each layer, and the capillary can be temporarily retracted upward to avoid this interference.

The 3-D view of FIG. 124 depicts a two-layer coil (or two layers of a taller coil) in some embodiments comprising spirals on adjacent layers which are formed counterclockwise as seen from above. As with the coil of FIG. 123, the wire spirals can always be generated by starting with smaller and moving to larger radii. However, here the wire can be continuous: the wire is directed approximately radially inwards and upwards toward the inner portion of the spiral on the next higher layer, connecting the spirals in series. Alternatively in some embodiment variations, the inner ends can be connected together, and the outer ends can be connected together, so that the spirals wired electrically in parallel.

Coils built in layers such as those in FIG. 123 have several unique benefits over coils conventionally made (i.e., wound on a mandrel). For example, each layer can have a different number of spiral turns and/or a different pitch (along the coil access), e.g., by changing the layer thickness and/or omitting spirals on selected "skipped" layers. The composition, shape, and size of wire can also vary from layer to layer as can the shape of the wire loop or spiral (e.g., on Layer N this can be hexagonal, while on Layer N+1 it can be octagonal, or hexagonal with a different orientation of the facets. Thus for example, a coil having a cross-section that twists along the axis can be provided; such a coil if used in a solenoid may provide rotation of the plunger as well as translation, especially if the pitch of the twist is relatively large. Thus, coils which generate gradients (e.g., axial) in magnetic field can readily be printed, and in some embodiments undesirable gradients which exist in conventionally-produced coils can be mitigated. In some embodiments involving solenoid actuators, for example, by varying the wire pitch, size, type, layer thickness, etc. axially, an actuator with a more linear force curve (force vs. displacement) can be produced than is typically possible with a conventionally-wound solenoid coil. Since the wire in a FEAM-produced coil is accessible at least once per layer, producing coils which are tapped at nearly-arbitrary locations (e.g., for transformers) is possible. The dielectric material can be chosen from a wide variety of materials, and can be porous or transparent, allowing fluids or light to penetrate the coil windings. By co-depositing wire and tubing in the same or nearby extrudates, or by using a dielectric with interconnected pores, coolant can be introduced adjacent to the windings, thus allowing them to operate at higher currents than normal. Along with the wire in an extrudate, a fiber can be incorporated made from a fugitive/sacrificial/dissolvable material (this applies in general, not just to coils). Once this is removed, the resulting channel can be used for fluid cooling of the coil windings. Channels between wire-containing extrudates can also be printed in-place, providing fluid conduits without the need to encapsulate tubing. Coils (and other shapes) made using resorbable dielectrics can be used in implanted devices for such purposes as telemetry or through-skin charging, or as neurostimulation or recording electrodes; even if such coils have many turns, once the dielectric is resorbed and replaced by ingrown tissue, they can be very flexible and virtually matched in elastic modulus to the surrounding tissue. Moreover, coils and other shapes can have very high surface area, a useful feature when serving as electrodes. Also, since the coils are not wound on a mandrel, they can have a wide range of cross-sectional shapes, including shapes such as stars which have concave as well as convex regions.

Figure 125:
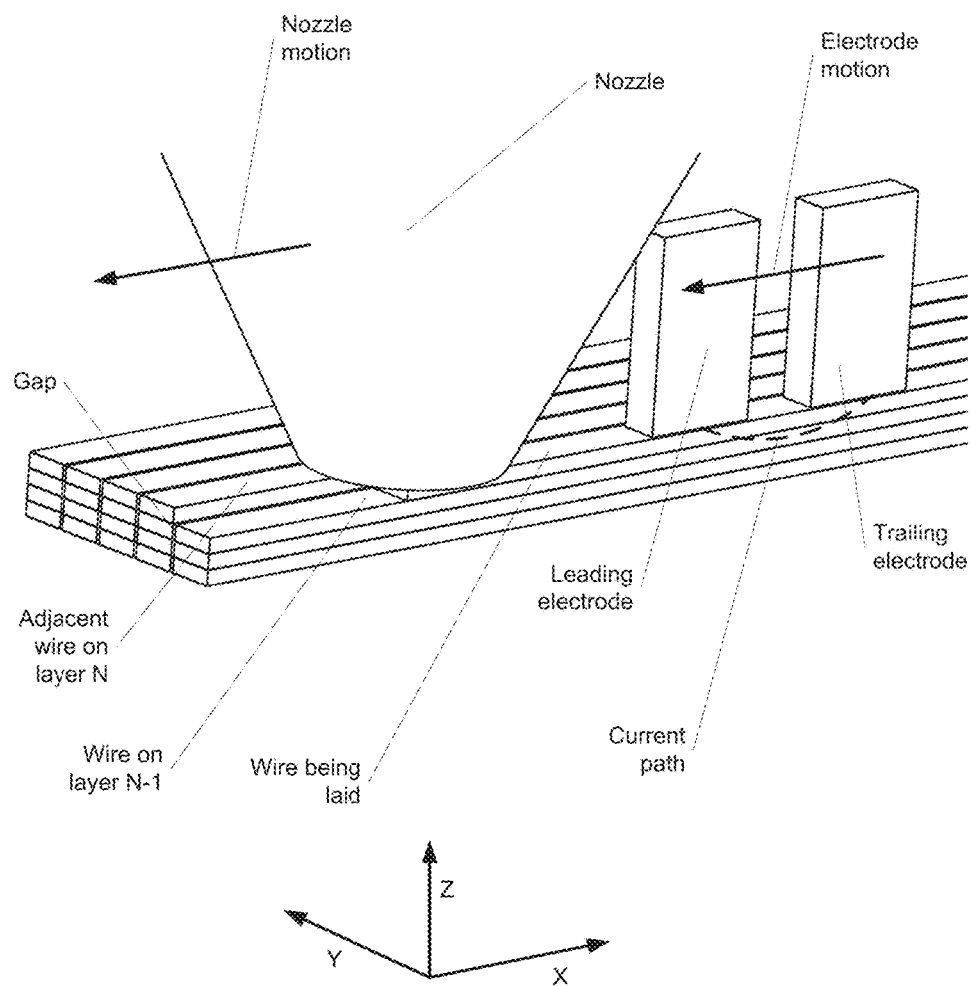
FIG. 125 depicts a method for welding wire.

The 3-D view of FIG. 125 depicts a method for building structures from wire in some embodiments that is similar to that of FIGS. 107(a), 107(b), 107(c), 107(d), and 107(e), but in which individual wires (or other fibers) may be welded to one another, either as they are laid, or afterwards in a separate process. In the example shown in the figure, flat (i.e., rectangular) wires are formed into a group in which there is little or no space between the wires along the Z axis, and a small gap between the wires along the Y axis, thus mimicking the effect of laminations often found in soft magnetic structures to reduce eddy currents. The vertical plane of the laminations shown is suitable for use with coils whose axis is parallel to the Z axis, since the eddy currents would normally circulate in the X/Y plane. The wire thickness along the Z axis is in some embodiment variations set equal to the layer thickness.

In FIG. 125, wire is introduced from the left, negative X direction (e.g., through a capillary, not shown) under a nozzle moving relative to the fabricated object in the negative X direction, while a dielectric material (also not shown) is extruded through the nozzle. In some embodiment variations the nozzle may be furnished with a guide as in FIGS. 107(a), 107(b), 107(c), 107(d), and 107(e). Also provided are two electrodes which contact the wire being laid in two locations a short distance apart. In some embodiment variations, the electrodes are slightly narrower than the wire along the Y axis and are centered on the wire being laid so as to only contact that wire, and not adjacent wire(s). The electrodes in some embodiment variations move along with the nozzle at the same speed (e.g., they may be fixed to the printhead). Continuous or pulsed current (the latter producing a series of spot welds) is passed from one electrode to another using a single-sided, serial, resistance welding configuration known to the art, so that current passes not just through the upper wire, but also through the wire beneath it, welding the two together. Such welding may achieve improved bonding of the upper wire to other wires compared with the application of dielectric alone, and can serve to reduce the gap between wires along the Z axis. The latter is desirable to increase the volumetric percentage of metal and in some soft magnetic structures, for example, or for fabricating conductors such as vertical capacitor plates extending along the Z axis across multiple layers. In some cases, only a light weld is needed to achieve the desired functionality.

In some embodiment variations, the electrodes are located downstream of the nozzle as shown, such that the nozzle first applies dielectric to the wire and a short time later, the wires are welded. In other embodiment variations, the electrodes are located upstream of the nozzle, such that the wires are first welded, and then dielectric enters the gaps between wires parallel to the X axis. The latter may be preferred in that the top of the wire is less likely to be contaminated by dielectric material which may interfere with good electrical contact by the electrodes.

In some embodiment variations, similar welding approaches may be used to weld wires in the same layer (i.e., intra-layer) to one another in lieu of or in addition to the interlayer welding already described. Intra-layer welding can be useful, for example, in fabricating ground planes, capacitors, and patch antennas, or to achieve laminations which are horizontal instead of vertical. In this case, one electrode would contact one wire on the current layer, and the other electrode would contact an adjacent wire, and the wires would be in contact, without a gap.

If the path of the nozzle motion and wire is not straight, the electrodes in some embodiment variations rotate around the vertical nozzle axis along with the capillary (or the fabricated object may rotate) so as to remain always on the wire being welded, either upstream or downstream of the nozzle. In some embodiment variations, in lieu of rotation the electrodes may take the form of two concentric rings at an angle to the X/Y plane so as to contact one or a small group of wires at a time; the angle can be changed according to the nozzle trajectory so as to maintain contact with the intended wire.

In some embodiment variations, more than two electrodes may be provided. In some embodiments, electrodes may contact wires on more than a single layer at a time. In some embodiment variations, electrodes may be configured so as to produce interlayer and intra-layer welds simultaneously.

In some embodiments, in lieu of using electrodes for resistive welding, a spinning pin may be deployed from the printhead which can weld wires (e.g., adjacent wires) using friction stir welding methods known to the art. In some embodiment variations, in lieu of resistance welding, ultrasonic welding may be used. In general, it may be preferred to weld in an area uncontaminated by matrix material, and then apply it as needed.

FIGS. 126-128 are sequences of cross-sectional elevation views depicting processes used in some embodiments for integrating electrical devices such as semiconductor die (e.g., a microcontroller, optoelectronic device, memory chip, digital to analog converter), MEMS devices, transducers, sensors, discrete electronic devices, or other devices into fabricated objects, and providing an electrical interface to wires within the object. The inserted devices may be bare or packaged (e.g., a surface mount package such as a TQFP package), the latter typically providing a larger pad pitch and improved ruggedness, but occupying more space.

Figure 126A:
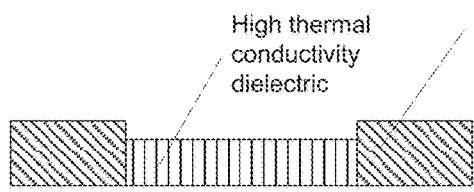

In FIG. 126(a), at least two layers of dielectric material have been fabricated, producing a cavity in which the device can be placed. In some embodiment variations, at least the bottom of the cavity is formed from a dielectric with high thermal conductivity (e.g., a polymer composite containing boron nitride powder, or copper powder at a concentration below percolation) to provide enhanced heat dissipation for the device. In some embodiment variations, the bottom can incorporate ECPC, metal wires, trapped regions of liquid metals such as eutectic Ga—In, phase-change materials (e.g., incorporated into heat pipes), etc. In some embodiments variations, the thermally-conductive material is elastomeric, so as to make better thermal contact with the bottom of device, filling in small irregularities in its surface. The thermally-conductive region may conduct heat to the surface of the object, to a heat sink, etc., in order to dissipate heat from the device.

Figure 126B:
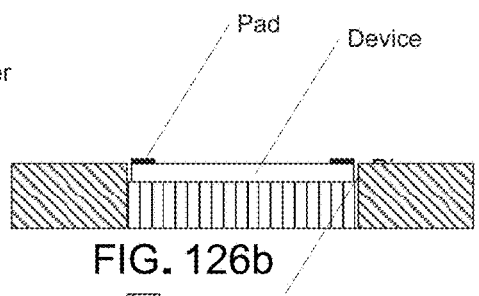
Figure 126C:
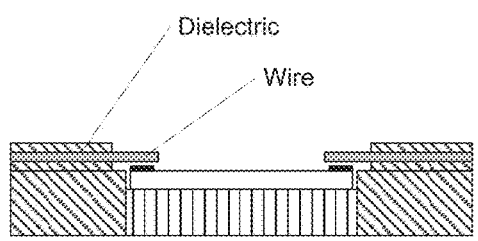
Figure 126D:
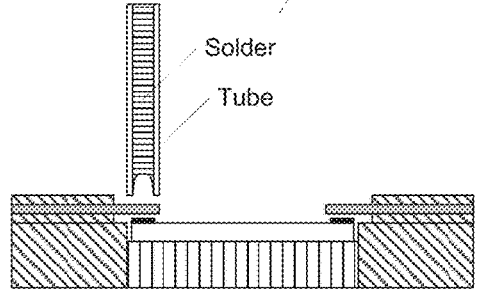
Figure 126E:
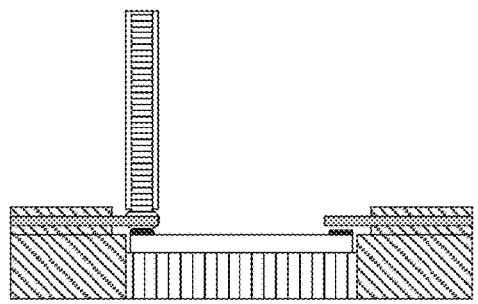

In FIG. 126(b), the device has been placed in the cavity with its pads (which in some embodiment variations may include bumps, studs, or other projections) facing upwards using mechanical tweezers, forceps, vacuum tweezers, an electromagnet, etc. in some embodiment variations, the device may be bonded to the underlying or surrounding material, e.g., such as by use of an adhesive, or reflowing the material. Preferably the underside of the device is relatively flat and smooth so as to make good contact with the bottom of the cavity, but a thermal interface material such as the TPLI™ 200 Series gap filler from Laird Technologies, Inc. (London, U.K.) can be pre-applied to the device or to the cavity bottom to reduce thermal contact resistance if needed. In FIG. 126(c), an additional layer has been deposited which includes wires with bare ends which are to interconnect with the device; the wires are arranged to overlap and possibly touch the pads on the object as shown. In FIG. 126(d), a delivery tube containing conductive material has been positioned above a wire and pad. In some embodiment variations, the tube contains molten solder (as shown and assumed here), while in other embodiment variations, it may contain ECPC, conductive ink, photonically-cured ink, solder paste, etc. Examples of solders include Sn—Pb and low-temperature lead-free solders such as In52-Sn48 (Indalloy 1E), Bi58-Sn42 (Indalloy 281), and In97 Ag3 (Indalloy 290), all made by Indium Corporation. In FIG. 126(e), molten solder has been deposited onto the pad and wire, forming a junction or joint between them. In embodiment variations in which solder paste has been applied by the tube, it may be reflowed individually at this time using a hot air jet, spot or flood infrared light, or laser, for example, or multiple junctions may be formed with solder paste and then reflowed in series or parallel (e.g., using at least one air jet or laser beam) before they are covered with other material, or if the entire fabricated object can tolerate the reflow temperature, the object may be placed in an oven after fabrication to reflow the solder paste. In some embodiment variations, the tube may deliver solid or powdered solder to the joint and a laser or hot air jet used to melt it onto the pad and wire.

Figure 126F:
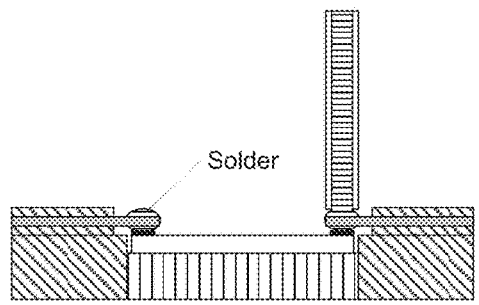
Figure 126G:
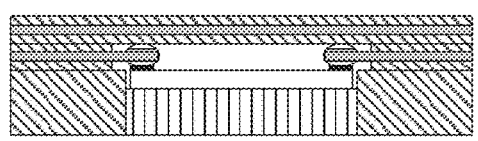
Figure 126G:
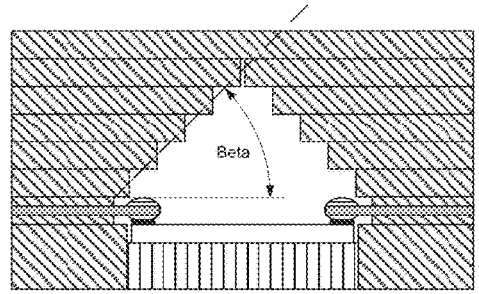

In FIG. 126(f), the tube has been moved (e.g., after lifting it and translating it horizontally) away from the first pad and has made a similar junction on another pad and wire. After all junctions are so formed, additional thermally-conductive material may be deposited above the device in some embodiment variations (not shown) and, assuming the device should not be exposed on its upper surface, the fabrication process can been continued with at least one additional layer added. In FIG. 126(g), a layer of dielectric has been deposited over the device containing a grid of wires which support it as in FIGS. 55(a) and 55(b), forming a closed space. In some embodiment variations, cooling of the extruded dielectric, if a thermoplastic, may be used in addition to, or in lieu of, the wires. In some embodiment variations, a grid of wires above the device, and optionally below the device, may provide electrical shielding of the device. In some embodiment variations in which additional thermally-conductive material is not added above the device, dielectric applied on the next layer is allowed to directly contact the device. FIG. 126(g') depicts an alternative approach to forming a closed space above the device, in which a pyramidal or prism-shaped cavity is formed by building up material in multiple layers such that the sides of the cavity are at an angle beta (e.g., >45°) that allows the material to be self-supporting (i.e., without the use of supports). In some embodiment variations, rather than use solder or other conductive material to create a junction between the pad and wire, the geometry can be such (e.g., the cavity can be shallower) that the wire shown in FIG. 126(c) is in direct contact with the pad and a laser used to weld the wire directly to the pad.

Figure 127A:
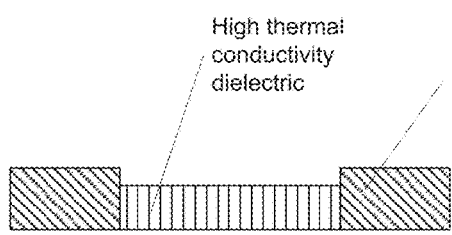
Figure 127B:
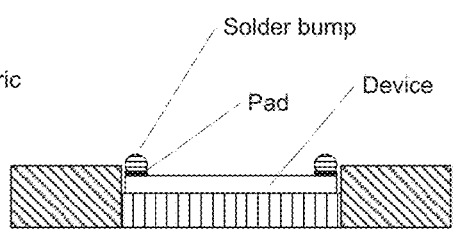
Figure 127C:
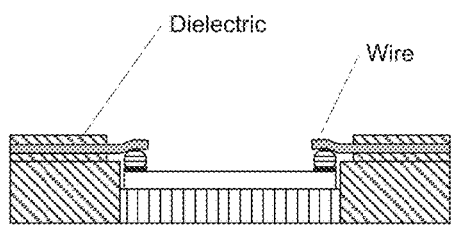
Figure 127D:
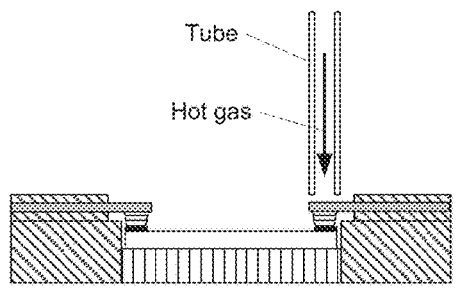

FIGS. 127(a), 127(b), 127(c), and 127(d) depict a method used in some embodiments for integrating devices like those discussed in conjunction with FIGS. 126(a), 126(b), 126(c), 126(d), 126(e), 126(f), 126(g), and 126(g') (or 58(a), 58(b), 58(c), 59(a), 59(b), and 59(c)) in which the device is provided with solder bumps on its pads, or alternatively, solder paste. Solder bumps can be produced as known to the art by wafer-scale bumping processes, for example. In FIG. 127(a), a cavity has been created as in FIG. 126(a), and in FIG. 127(b), the device has been placed with its bumps facing upwards. Next, in FIG. 127(c), an additional layer has been deposited which includes wires with bare ends arranged to contact the bumps on the device. Then, in FIG. 127(d), the solder is reflowed. In some embodiment variations this is achieved by a tube delivering hot gas (e.g., air) as shown, while in other embodiment variations it may be achieved by laser, spot or flood infrared light, by heating the entire object (e.g., after fabrication), etc. Following this step, if desired thermally-conductive material may be deposited on the top surface of the device and/or the device may be closed off using methods similar to those shown in FIG. 126(g) or 126(g'). In some embodiment variations, in lieu of solder, ECPC or an electrically conductive adhesive may be used. This may be a thermoplastic, in which case it may be reflowed as described for solder. If a thermoset, it may be cured thermally or using light (e.g., ultraviolet) to complete the junction.

Figures 128A, 128B, 128C:
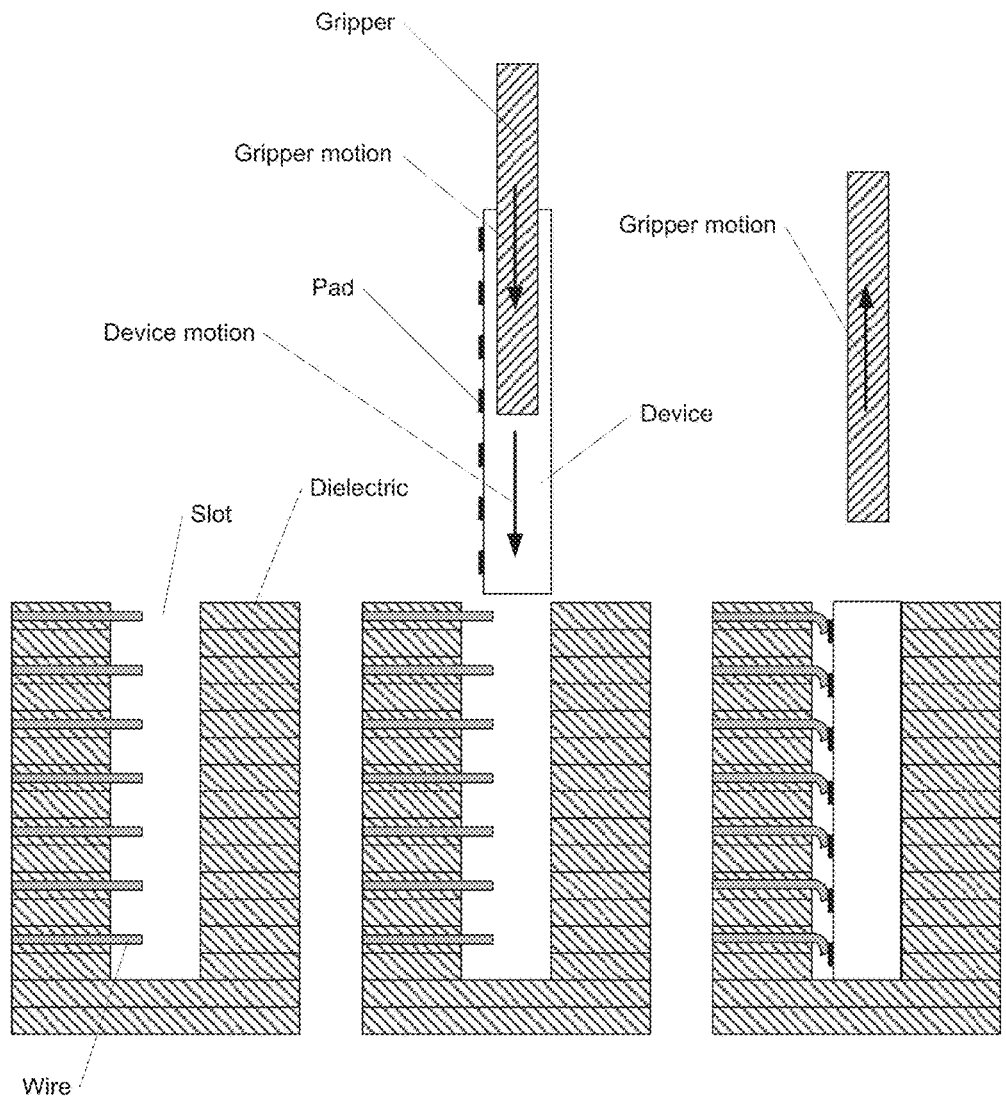

In described with reference to FIGS. 128(a), 128(b), and 128(c), devices with their electrical pads on a vertical surface instead of a horizontal surface (as described above) can be integrated with fabricated objects. In FIG. 128(a), a slot has been fabricated in a region of the object, and the bare ends of wires (e.g., in a 2-D array) protrude into the slot a short distance (enough to deform against the pads to make good contact, but not enough to short pads together, etc.) The wires are preferably of a relatively hard and high yield metal such as nickel or beryllium-copper so they can provide a reasonable contact force against the device pads (or in some embodiment variations, balls, studs, or other interconnect structure) when the device is inserted, and preferably scratch or "scrub" the oxide off the device pads as the device is inserted; however, softer and lower-yield materials such as pure copper may be used. In some embodiment variations, at least the ends of the wires may be coated with gold, to avoid oxide formation. When wires chosen for their properties as contacts are used, they may be joined to other wires (e.g., pure copper, chosen for its electrical conductivity) elsewhere in the fabricated object using ECPC, etc. The wires are spaced vertically (not necessarily every layer as shown) so as to match the pitch of the pads to be interfaced.

In FIG. 128(b), the device, held by gripper, vacuum tweezers, etc. (e.g., along its edges as shown) is lowered into the slot with its pads facing the protruding wires; the slot can be made wide enough in the direction perpendicular to the drawing plane to provide clearance for the grippers. Insertion can be during fabrication of the object, or after it has been fully fabricated (i.e., all layers deposited). As the device is inserted, the wires are deformed by contact with the device pads, and once the device has been fully inserted as in FIG. 128(*c*), they remain deformed and in electrical contact with the pads, without the need for solder or any other extraneous material. In some embodiment variations, between the wires on the left-hand wall of the slot, dielectric material forming standoffs may be provided to prevent excessive deformation of the wires, especially if the right-hand wall is an elastomer as described below that forces the device against the opposite wall. At this time, unless the device is intended to be removable or interchangeable (e.g., a secure digital card, a battery), the device can be retained in place and protected from the environment by depositing a layer of dielectric over it, for example, in which case the depth of the slot is preferably designed to match the height of the device, as shown. Devices may in some embodiment variations be retained and protected by depositing an underfill material between the device and the left-hand wall of the slot (or everywhere inside the slot), applying a blob of encapsulation/potting material (e.g., UV-cured epoxy) over the slot, printing another layer over the top of the devices, etc.

In some embodiment variations, the right-hand wall of the slot is comprised of thermally-conductive material, so that heat from the device can be dissipated. In some embodiment variations, the right-hand wall is comprised of an elastomer or an expanding material that provides increased contact force against the wires. In some embodiment variations, wires protrude from more than one wall of the slot; for example, a slot intended to accommodate a battery such as a button cell would have at least one wire (more than one for contact redundancy) protruding from both the left and right walls.

In addition to integrated circuits, optoelectronic devices such as LEDs, MEMS devices, transducers, and sensors, all of which can be bare die or packaged for surface mounting, and batteries, discrete electronic components having leads such as packaged integrated circuits, capacitors, inductors, resistors, transducers, and switches can be interconnected to wires using this method, by providing slots or holes of whatever shape is required into which device leads can be inserted. If the lead is large enough, multiple wires may be used (e.g., on multiple layers) to provide redundant contacts to the leads. In addition, slots and holes may serve as connectors (permanent or removable) for inserted objects. For example, a slot with protruding wires may serve as an edge connector that makes contact with traces on a printed circuit board, or interface with a row of pins attached to a ribbon cable. A round hole with protruding wires can serve as a jack, socket, outlet, or other female connector, interfacing to a phone plug, mini phone plug, RJ45 connector, BNC connector, AC plug, etc. In some embodiments, the slots are not vertical with respect to the Z, or layer stacking axis of the fabricated object, but at other angles. In some embodiments, the sides of the slot or hole need not be parallel and may be curved (e.g., a 3-D cavity of complex shape). In some embodiments, the tips of each wire protruding into the slot/hole/cavity may be coated with solder (e.g., low melting point solder) or solder paste, or the pads of the device may be coated with solder (e.g., bumped) so that after device insertion (e.g., after all layers are built), the object can be heated (e.g., in an oven at a temperature that does not disturb or damage it, but causes the solder to reflow, establishing a very reliable junction between the inserted device pad, lead, or surface, and the wire.

In the case of integrating high-frequency devices operating for example at RF, microwave, and millimeter wave frequencies using methods such as those described in FIGS. 58(*a*), 58(*b*), 58(*c*), 59(*a*), 59(*b*), and 59(*c*), and 126(*a*), 126(*b*), 126(*c*), 126(*d*), 126(*e*), 126(*f*), 126(*g*), 126(*g'*), 127(*a*), 127(*b*), 127(*c*), 127(*d*), 128(*a*), 128(*b*), and 128(*c*), the interconnects may be coaxial elements such as those in FIGS. 109(*a*), 109(*b*), 109(*c*), 110(*a*), 110(*b*), 110(*c*), 110(*d*), 110(*e*), 110(*f*), 110(*g*), 111(*a*), 111(*b*), 111(*c*), and 111(*d*). In that case, the cavity, slot, hole, etc. surrounding the device may preferably be shielded (e.g., by metallizing its surfaces) and may be made electrically continuous with the coax shield(s), e.g., by using a conductive material like ECPC, solder, etc., by using electroless deposition to metallize the cavity/slot/hole along with the coax shield, etc. In general, FEAM may in some embodiments be used to produce PCBs and other interconnect substrates and structures (collectively, "electronic packages") that are conventionally planar, or 3-D (with components at multiple levels and/or orientations), and which may be rigid or flexible. Components accommodated by such electronic packages may be designed with leads for through-hole connection, or pads, bumps, etc. for surface mounting, and a single electronic package may accommodate more than one type of component. Depending on the method used to create junctions between inserted components and wires within the electronic package, the matrix dielectric may be capable of high temperature (e.g., PEEK (e.g., thermosets (e.g., or thermally or UV-cured) silicone (for flexible electronic packages), epoxy). If solder or solder paste is used, this may be deposited manually or through an automated system (e.g., a dispenser on the FEAM machine producing the electronic package) into cavities (e.g., blind cavities) in the electronic package which are to receive the leads of components with lead, or deposited at or near the surfaces of the electronic package, to interface with surface mount components. With this material deposited, the electronic package may be populated with components, for example, by heating it (e.g., on a hotplate) while components are inserted (manually or by automated equipment). Electronic packages can also designed with acceptable robustness (especially if encapsulation and/or underfill is used) in which wire contacts the component leads (or in some embodiments, pads, balls, etc.) as described with respect to FIGS. 128(*a*), 128(*b*), and 128(*c*), without the need for solder, solder paste, etc., and such electronic packages can be populated rapidly by merely inserting components.

In some embodiments, electronic packages which use a soft/elastomeric and/or reflowable conductive material such as ECPC may be produced. With such electronic packages, component leads, pads, etc. can be pushed into the conductive material (while heating the electronic package generally, or locally heating the conductive material and/or lead/pad if necessary). For example, the leads of packaged integrated circuits (e.g., dual in-line packaged), resistors, capacitors, inductors, transducers, sensors, switches, headers, and other components often found on PCBs can be simply pushed into soft TPE-based ECPC regions that are accessible on the electronic package, allowing very rapid populating of the electronic package after fabrication using FEAM.

Figures 129A, 129B:
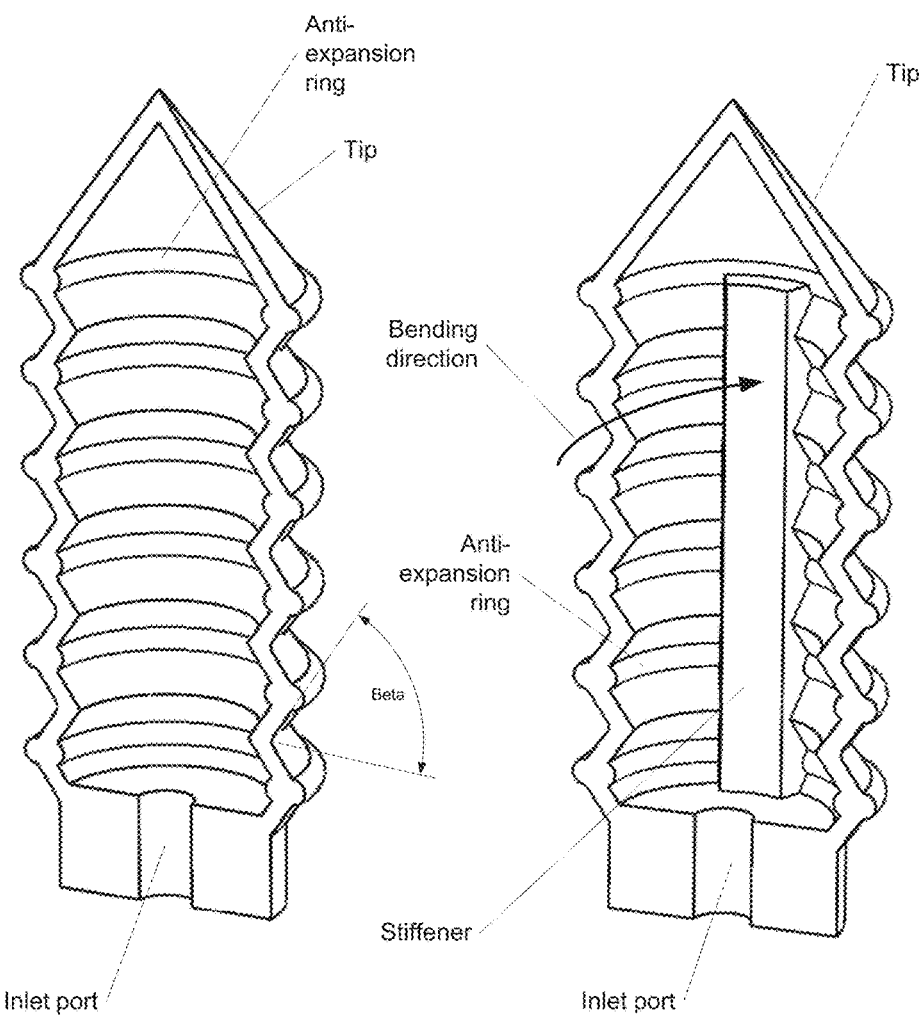

FIGS. 129-133 depict fluidic actuators and related devices which may be fabricated from elastomeric material, in some cases in conjunction with reinforcing fibers using the FEAM process. FIGS. 129(*a*) and 129(*b*) are 3-D sectional views of two bellows-like actuators which may be built without supports if desired, since the angle of their walls is greater than the value beta (e.g., 45°). Both have fluid inlet ports at the bottom, anti-expansion rings which are thicker than the walls to resist radial expansion when the device is pressurized, and pointed tops greater than the angle theta. The device in FIG. 129(a) is axially symmetric and when pressurized with liquid or gas, will elongate in the manner of a standard bellows. The device in FIG. 129(b), however, has a vertical stiffener, or "spine" on one side, which may be internal as shown, external, or partially internal and external. As a result, it cannot expand substantially in the region of the stiffener, and thus not elongate substantially. Expansion of the remaining structure however causes it to bend in the direction of the stiffener, thus its mode of actuation is bending vs. elongation.

Figures 130A, 130B:
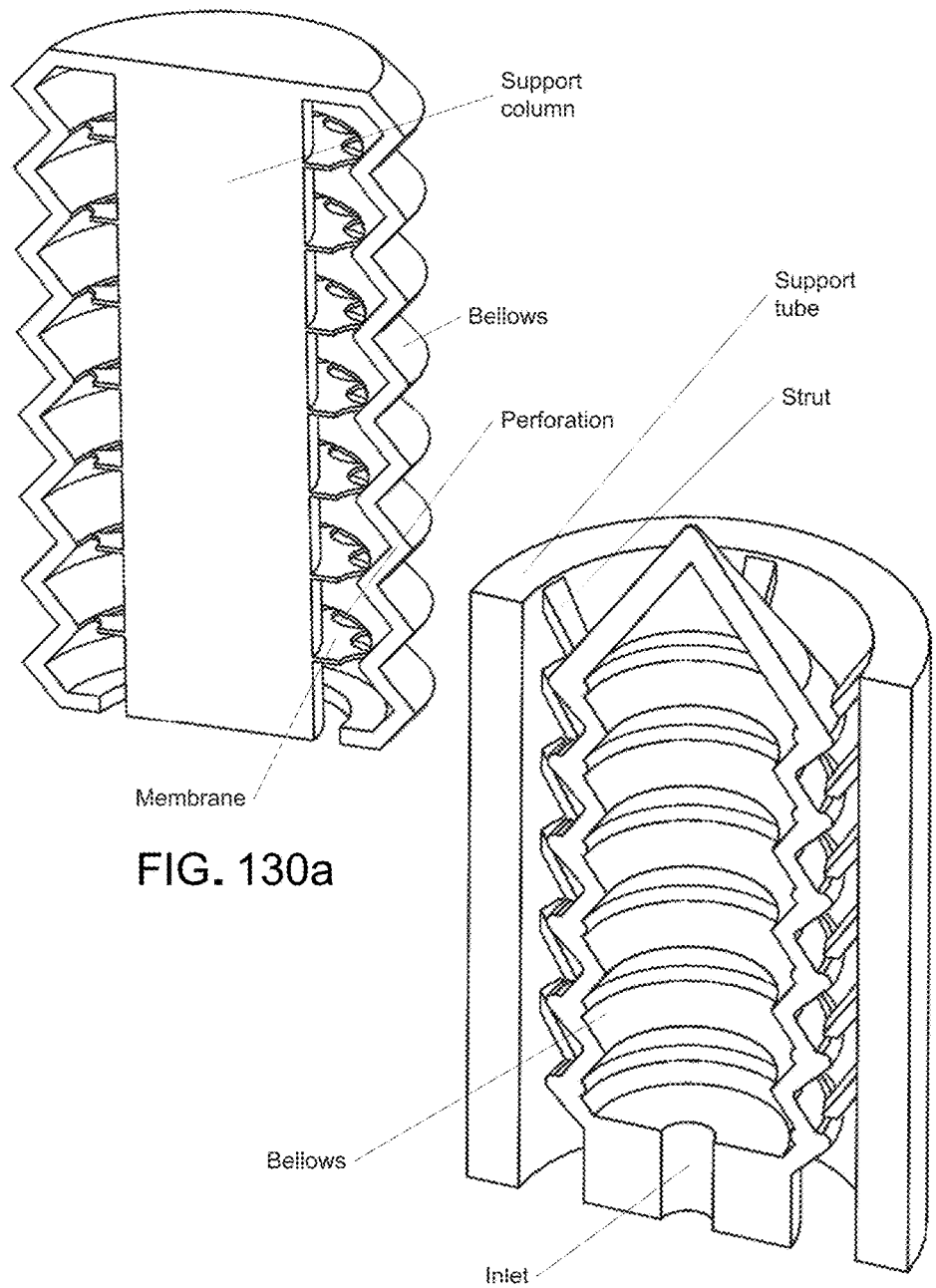

FIGS. 130(a) and 130(b) are 3-D sectional views of bellows which may have walls at angles lower than theta, and which would then require supports, as shown. In some embodiments the supports may be soluble (e.g., if made from polyvinyl alcohol) while in other embodiments, they are made of the same material (i.e., an elastomer such as a TPE), and the supports can be cut off after fabrication. In FIG. 130(a), the supports for the bellows are internal, while in FIG. 130(b), the supports (for a bellows of different design: similar to that of FIG. 129(a), are external. In FIG. 130(a), the supports comprise a center column of large diameter (shown smaller for clarity) which is attached to the bellows inner surface at intervals by a ring-shaped membrane that is perforated to reduce contact area with the bellows. The membrane may be horizontal as shown, if its width is very small, or may be angled at an angle greater than theta (i.e., of conical shape). Removal of the supports can be achieved by collapsing the bellows so as to gain access to each membrane, starting at the bottom, and cutting it away from the internal bellows surface where it is attached between the perforations. The center column can also be cut toward its top and therefore shortened so it does not interfere with the bellows reducing its length.

The bellows of FIG. 130(b) has supports in the form of external struts which link the bellows to a cylinder outside the bellows. The struts may be horizontal if short, or if longer (as shown), may be built at an angle larger than theta. Removal of the supports may be accomplished, for example, by cutting open the cylinder and then cutting off all the struts.

FIGS. 131(a) and 131(b) are 3-D sectional views of a bending actuator which is not axially symmetric and in some embodiments can be built without supports with its long axis along Z (the layer stacking direction) and a sufficiently large angle beta (e.g., >45°). When inflated with a fluid, the thin wall on one side stretches, while the thick wall diametrically opposite it resists elongation, thus bending in the direction shown. Anti-expansion rings similar to those of FIGS. 129(a) and 129(b) may be provided—seen best in FIG. 131(a)—at least in the area of the thin wall (or circumferentially as shown) to avoid "ballooning" of the thin wall. As can be seen from FIG. 131(b), the wall may in some embodiments taper continuously from one side to the other, for example if the inside surface is circular but eccentric with respect to the outside diameter.

Figure 132:
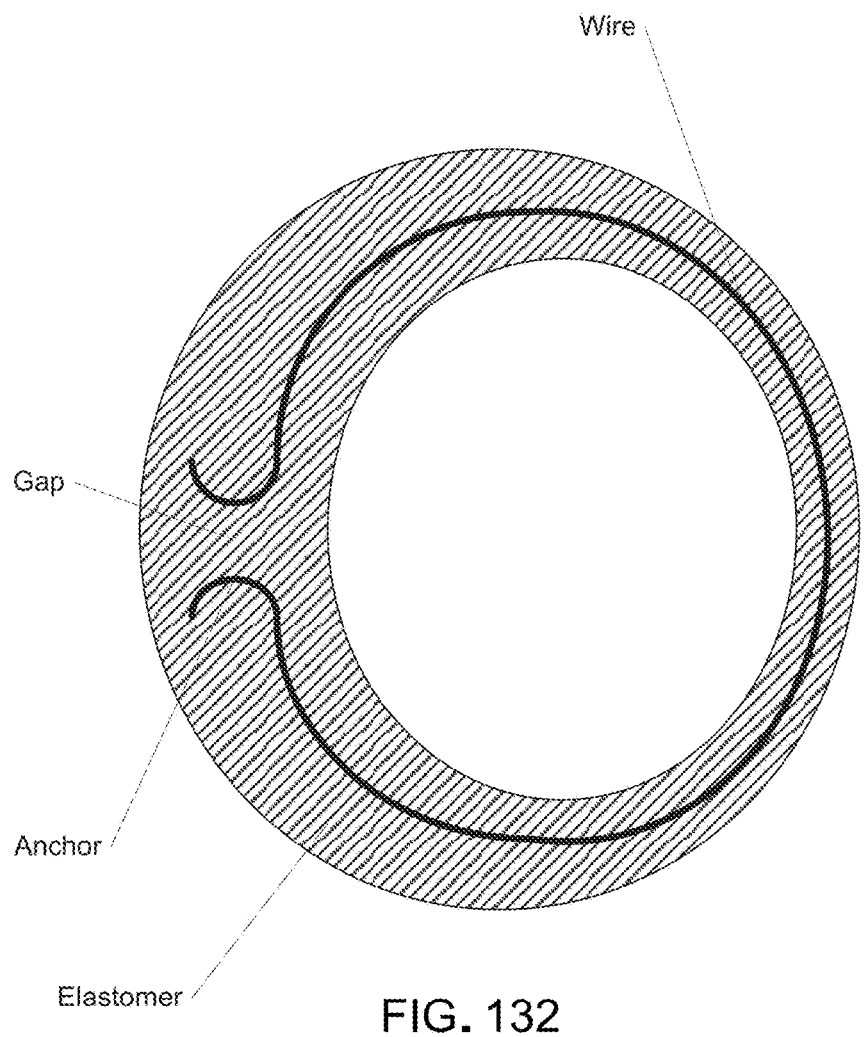

FIG. 132 is a cross-sectional view of an actuator similar to that of FIGS. 131(a) and 131(b), but in which wire has been incorporated into the elastomer to provide radial strength and avoid ballooning, in lieu of using anti-expansion rings. The wire may be continuous and, along with the deposited elastomer, form a helix (for example, and the effective nozzle width may be changed while printing the structure (using the approach shown in FIGS. 46(a), 46(b), and 46(c) or 120(a), 120(b), and 120(c)) so as to vary the wall thickness, for example. Alternatively, multiple wires, each forming a loop within a single layer, can be used, as shown in FIG. 132. The free ends of the wires can be joined together (e.g., by solder or welding) to provide improved mechanical strength, or the gap between the ends can be staggered (i.e., unaligned) from layer to layer, or (as shown), the ends can be deformed into anchoring structures such as the "J" shape shown in the figure, or other shapes such as "L" shapes, serpentines, and even complete or nearly-complete circles or other substantially closed paths, which better anchor them in the polymer. In some embodiment variations, textured wire (e.g., embossed by the cutter/feeder rollers) can be used to improve the anchoring of the wire within the elastomer, as can melting the end of the wire to form a ball (e.g., using electronic flame-off), creating bulges on the fiber (at the ends and/or along its length) using adhered solder or adhesive, twisting the wire (if non-circular in cross-section), etc. In lieu of or in addition to the anti-expansion rings in bellows designs such as that in FIGS. 129(a) and 129(b), a wire loop such as that in FIG. 132 may be used.

Two or more of the structures of FIGS. 129(b) or 131(a) and 131(b), arranged in a group (e.g., a circle) with the stiffeners toward the center can behave as a fluidically-actuated hand, with each "finger" bending inward to grasp an object.

FIGS. 133(a), 133(b), and 133(c) show transparent 3-D views of a cylindrical fluidic actuator that can be fabricated with FEAM from elastomer and fiber. The actuator shortens axially when inflated with fluid, somewhat like a McKibben pneumatic muscle known to the art, and usually fabricated using a rubber tube and netting. When inflated through the inlet at the proximal end, the cylinder wall bulges out; because of the encapsulated fibers, the distal end of the device is pulled axially toward the proximal end. The device is preferably fabricated with the cylinder axis horizontal, as noted by the direction of the Z (layer stacking) axis in FIG. 133(a). In this orientation, fibers having good tensile strength may be encapsulated in a pattern similar to that shown, with at least one U-shaped fiber (only one shown) encapsulated using FEAM on each side of the center axis on any given layer or set of adjacent layers, as shown in the cross-sectional view of FIG. 133(b).

As discussed in the context of FIG. 132, the ends of each U-shaped fiber can be shaped into anchors as shown in FIG. 133(c), to better anchor them in the elastomer. In some embodiment variations, rather than integrate two or more separate fibers on opposite sides of the axis as shown in FIG. 133(b), a single long fiber having the shape of a nearly-closed loop, or a joined loop, can be used on a given layer. The ends of the loop can incorporate anchors in some embodiment variations. In some embodiment variations, the gaps for each wire loop are staggered from layer to layer. Alternatively, the device can be built in a helical fashion with continuous fiber forming a rectangular helix; if the geometry requires thicker walls at the proximal and distal ends than the cylinder walls, a variable-width extrusion nozzle can be used as described above.

In some embodiment variations, fibers within layers closer to the cylinder axis the cylinder can be longer radially (i.e., can have a deeper U-shape) than those closer to the top and bottom of the cylinder, and so have increased surface area for anchoring to the elastomer. In some embodiment variations, in addition to anchoring methods described above, texturing the fibers, heating them during encapsulation, providing a coating on the fibers which promotes bonding to the elastomer, and other methods can be used to ensure that fibers will not be easily pulled loose during inflation.

In some embodiment variations, rather than a circular cross-section, the actuator can have other shapes such as square, hexagonal, and octagonal. In some embodiment variations, the sides of the cylinder may be pleated (e.g., circumferentially or axially) to allow for greater expansion of the wall. In some embodiment variations, asymmetry can be introduced (e.g., by thickening a portion of the cylinder wall, varying the shape, diameter, or type of fiber) so that upon inflation, the actuator bends instead of shortening, or in addition to shortening.

Figure 134A:
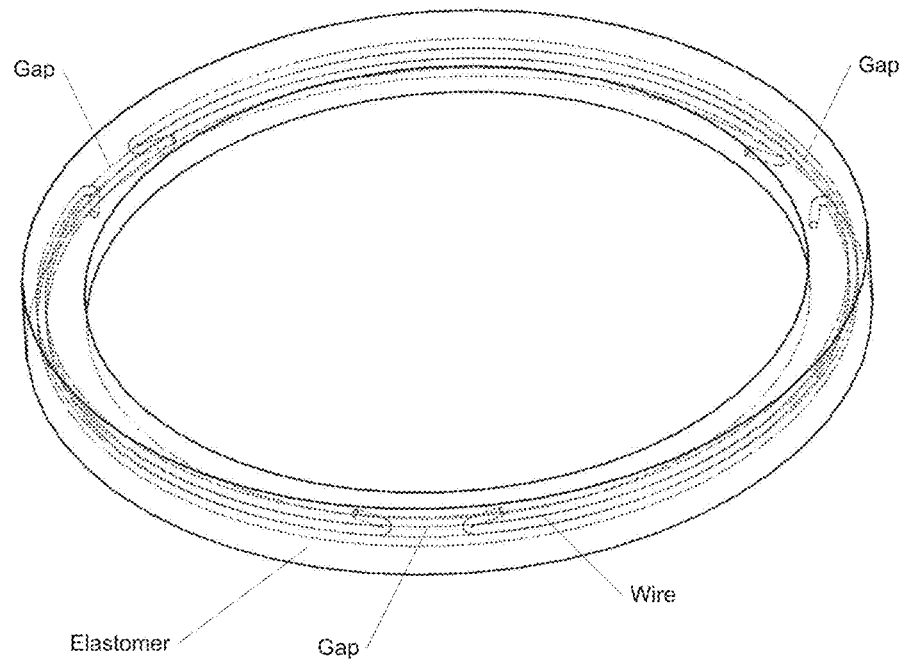
FIGS. 134(a) and 134(b) depict a drive belt fabricated with integrated reinforcement.
Figure 134B:
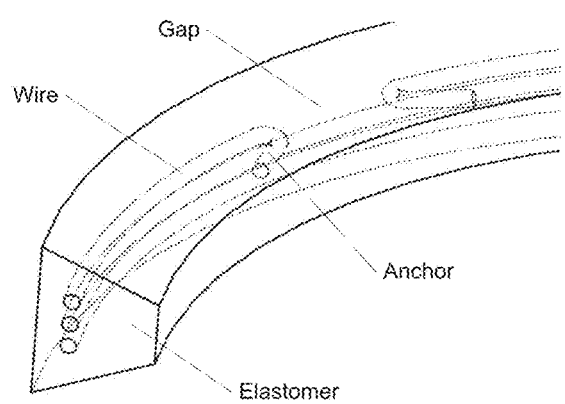

FIG. 134(a) is a 3-D transparent view of a drive belt (a V-belt as shown, but other cross sections are equally possible) made using FEAM from an elastomer and reinforcing fibers. In the example shown, there are three reinforcing wires, each encapsulated on a different layer. As shown in the cross-sectional 3-D transparent view of FIG. 134(b), the fibers in some embodiment variations have the form of nearly-closed loops which may be provided with "J"-shaped anchors at each end. The location of the gap is shown staggered from loop to loop. For example, with the three fiber loops shown in the figures, the gaps may be arranged to be 120° apart. At most locations, the belt is strengthened by a three continuous fibers, while at the gaps, it is strengthened by just two. By using even more fibers with staggered gaps, the strength uniformly along the circumference of the belt can be improved even further. A drive belt may also in some embodiment variations be made in a helical fashion using continuous wire. If the cross-sectional profile is not rectangular, then the variation in width required on each layer can be accommodated using a variable-width nozzle.

Figure 135A:
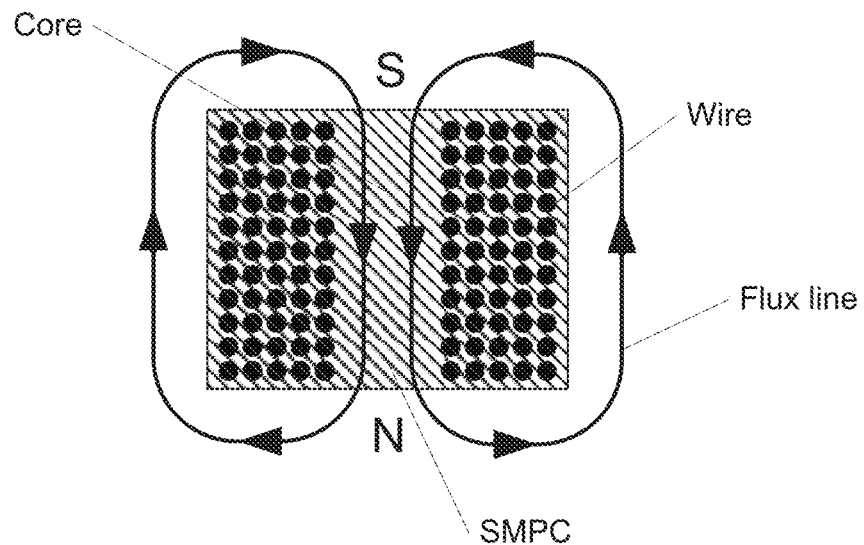
FIGS. 135(a) and 135(b) illustrate monolithic electromagnetic devices.
Figure 135B:
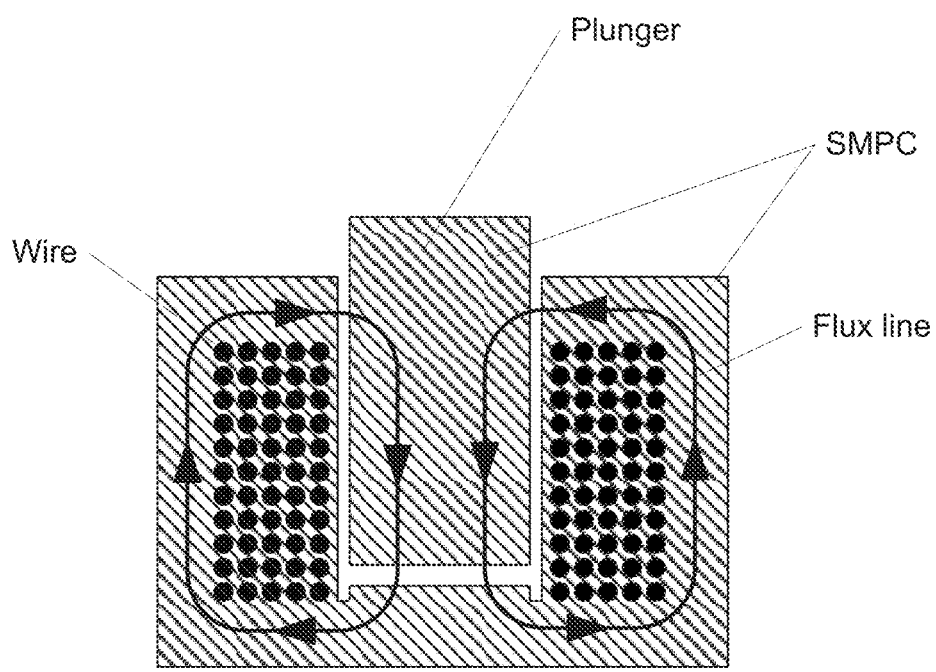

FIGS. 135(a) and 135(b) depict cross-sectional elevation views of electromagnetic devices in which the coils are monolithically fabricated with and integrated with soft magnetic elements such as a core and armature. Normally, coils are insulated by a non-magnetic material such as a lacquer, and coils can be made using FEAM in which a dielectric such as a thermoplastic like ABS forms the insulation. However, an SMPC (containing magnetic particles such as Potters SN08P40 or SI03P40 in a dielectric matrix) can also be used as insulation, in which case it can also serve to form magnetic elements which are highly integrated with the coils, and which increase performance because of the high permeability of the insulation compared to a typical coil. For example, an SMPC can be formulated using a powder such as ATOMET 1001HP. If the powder concentration is substantially below the percolation threshold, the resulting SMPC has magnetic properties, but has negligible electrical conductivity. In the case of a polymer- or ceramic-coated iron, steel, nickel, or cobalt, powder, even higher concentration of powder can be used. Thus an electromagnet such as that in FIG. 135(a) can be fabricated in which the core and winding insulation are both SMPC, and the entire device built monolithically using FEAM. Such an integrated electromagnetic may be used as part of a relay, a vibrating device for haptic feedback, a bell, or of course, as an electromagnet that picks up ferromagnetic objects. Similarly, the coil and armature of the solenoid actuator in FIG. 135(b) can be built monolithically from SMPC using FEAM, with the plunger built either separately or monolithically along with the other elements. Rotary as well as linear actuators can be built in this fashion. In the figures, the flux lines shown are merely representative of many such flux lines in an actual device.

Figure 136A:
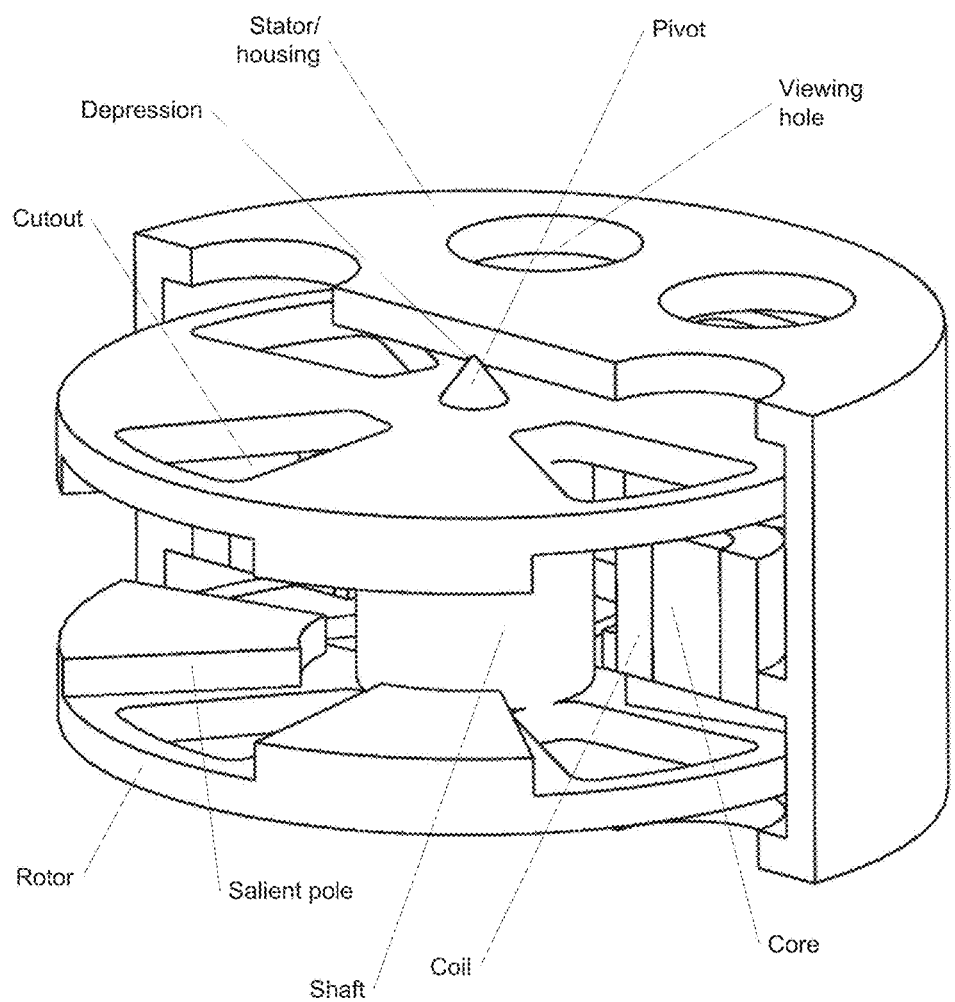
Figure 136B:
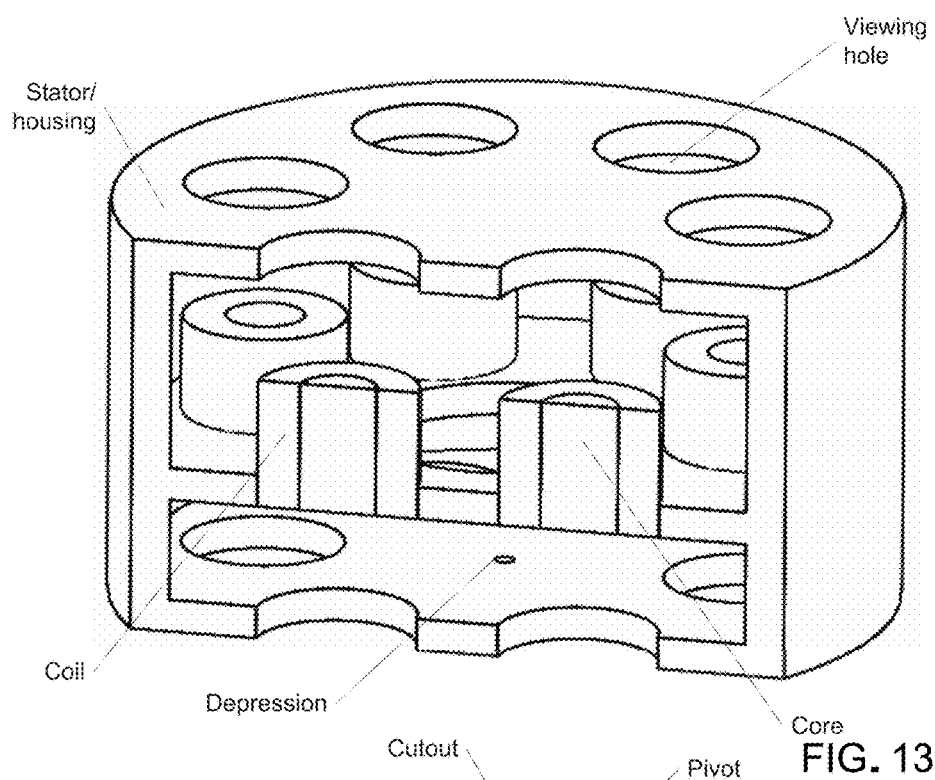
Figure 136C:
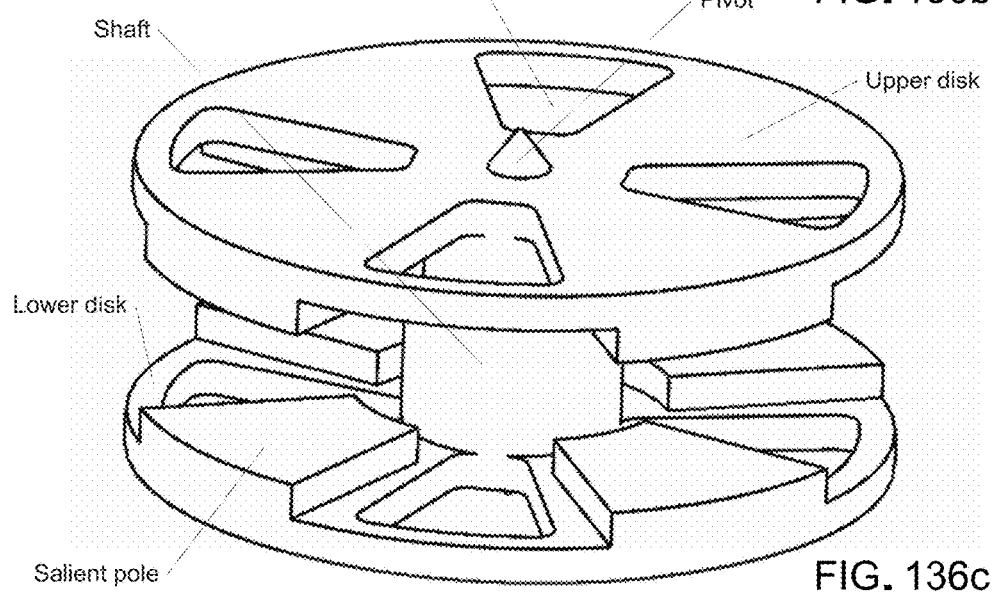

FIGS. 136(a), 136(b) and 136(c) depict 3-D views of a variable reluctance motor with axial flux path that can be fabricated monolithically without assembly (or in separate pieces, and then assembled), entirely with FEAM. Variable reluctance motors do not use a magnet in their construction, thus potentially facilitating fabrication; however, motors using permanent magnets are also possible, especially in view of recent developments in 3-D printing of magnetic structures using PMPCs (NdFeB powders mixed with binders and extruded in an FDM-type machine [Huber et al., 2016]). Moreover, solid magnets (e.g., sintered NdFeB magnets in the form of thin disks, stacked until the desired height is reached) can be inserted into fabricated structures. In the partial sectional view of FIG. 136(a), the three main components of the motor are shown assembled. These components are a stator/housing, a double-disk rotor with integrated salient poles, and a set of coils (six in the example shown). As is the norm with reluctance motors, the number of coils exceeds the number of poles on the rotor. The stator/housing and rotor are composed at least in part of SMPC. Most designs for variable reluctance motors require coils whose axes are radial; however, it is more difficult to fabricate high-quality coils using FEAM with such an orientation. With all coil axes parallel and axial, fabrication becomes much more straightforward, and coils (e.g., of the design shown in FIG. 123) can readily be made one layer at a time, along with building all the other required parts. Moreover, it can be easier to obtain small air gaps between the rotor and stator if the gap is parallel to the layer plane.

FIG. 136(b) shows the motor in section view with the rotor hidden, and FIG. 136(c) shows the rotor by itself. The rotor's upper and lower disks, salient (protruding) poles, and central shaft, complete the magnetic circuit of the magnetic fields generated by the coil and core. To reduce moment of inertia and potentially to better control the flux, the rotor disks may be perforated with cutouts as shown. The top and bottom of the rotor is provided with conical pivots which fit into (e.g., conical) depressions in the stator/housing, allowing for rotor rotation with reasonably low friction. In some embodiment variations, bearings or bushings (e.g., standard ball bearings) may be inserted during or after fabrication in lieu of pivots. In other embodiment variations, bearings or bushings may be fabricated monolithically (e.g., sleeve bearings made from PTFE-thermoplastic or bronze-thermoplastic composites, PEEK, polyimide, nylon, acetal, ultra-high molecular weight polyethylene, or filled versions of these materials; ball bearings; roller bearings, etc.). The stator provides support for the coils, cores, and rotor; it may be provided with a viewing hole as shown to allow observation of the spinning rotor, etc. Support material, preferably soluble such as PVA, is used as required during monolithic fabrication of the motor, such as between the stator housing and rotor lower disk, or between the lower disk salient poles and coils, for example.

FIG. 137(a) shows a cross-sectional elevation view of the motor of FIGS. 136(a), 136(b), and 136(c). The magnetic flux generated by the coil and core passes through the small (horizontal, or axial) upper gap between core and salient pole, when the rotor is rotated to align the pole sufficiently with the core, and then sequentially through the upper salient pole, the upper disk, the rotor shaft, the lower disk, the lower salient pole, the lower gap, and back into the core. In some embodiment variations, only the upper or lower disk is provided. The motor may be operated as a stepper, or operated continuously as a switched reluctance motor, in which case a shaft position sensor may be used (e.g., using a monolithically-fabricated inductive sensor, or else an optical or other sensor), or a digital signal processor such as the TMS320F243 of Texas Instruments (Dallas, Tex.) may be used in the drive electronics.

Alternative designs for an axial flux reluctance motor are shown in FIGS. 137(b) and 137(c); these designs use a single rotor disk. In FIG. 137(b), the rotor disk is provided with upper and lower salient poles, and the core of the coil is extended above and below it to form a C-shaped pole piece. Into the large gap of this structure fits the rotor and poles, forming a complete loop of magnetic material, except for small upper and lower horizontal (axial) gaps. In some embodiment variations only one salient pole (upper or lower) may be used at each position on the roller: the gap is therefore smaller to accommodate the thinner rotor. A rotor such as that of FIG. 137(b) can have a lower moment of inertia than that of FIGS. 136(a), 136(b), and 136(c); however, in some applications (e.g., a gyroscope) this may be a disadvantage. The design in FIG. 137(c) involves an extension of the core into a U-shaped pole piece. With this approach, there is one salient pole per position on the roller, and it projects radially toward the pole piece, with upper and lower gaps that are vertical (radial), not horizontal.

Since the shaft in the design shown in FIGS. 136(a), 136(b), and 136(c) does not penetrate through the stator/housing, extraction of power by the motor can be achieved by fabricating a spur or bevel gear, pulley, or sprocket between the rotor and one or both pivots, and including an opening in the side of the stator/housing to provide access to this new rotating element. For example, an external spur gear can enter the opening and mesh with the internal gear, or a shaft at right angles to the motor shaft can be equipped with a bevel gear that passes through the opening to engage a bevel gear concentric with the motor shaft. Or, a chain or drive belt can penetrate through the stator/housing and wrap around an internal sprocket or pulley. In some embodiment variations, one of the pivots can be in the form of a truncated cone and not one ending in a sharp point as shown. The shaft (or a smaller diameter extension of it) can then pass through the cone(s) so it is accessible outside the motor stator/housing; since the contact area of such a cone against the depression in the stator/housing is much larger than in the pivots of FIGS. 136(a), 136(b), and 136(c), friction in this conical bearing will be greater. However, this can be compensated if desired through the use of gears that increase torque, since in some embodiments, gearing (e.g., planetary reduction gears) can be incorporated into the motor stator/housing, and built monolithically with the motor.

Other motor designs can be achieved with FEAM, both involving permanent magnets (e.g., a permanent magnet stepper motor, a brushless DC motor, a brushed DC motor), and without magnets (e.g., an induction motor).

FIGS. 138(a), 138(b), 138(c), 138(d), 138(a'), 138(b'), and 138(c') depict methods and apparatus for mechanically cutting wire with a blade which in some embodiments may be used in the FEAM process, as alternatives to that shown in FIGS. 33(a), 33(b), 33(c), 33(d), and 33(e), which uses a separate anvil for cutting. In FIG. 138(a), two capillaries—one a center capillary, and one downstream—are located coaxially and spaced close together, separated only by a small gap. Wire passes through both capillaries en route to the nozzle. Within the gap a blade (FIG. 138(a)) can be advanced from one side of the capillaries to the other side, cutting the wire into two segments as shown in FIG. 138(b), after which the blade can be withdrawn (FIG. 138(c)). If cut cleanly (with minimal burrs), the upstream segment of wire can be advanced to enter the downstream capillary in preparation for the next cut, while pushing further downstream the downstream wire segment. To minimize burrs, the blade is preferably very sharp (e.g., the Feather blade made by Feather Safety Razor Co. (Osaka, Japan) and the gap between the capillaries is very small, so that the wire is well supported except where the blade must pass, and cannot bend in the process of being cut. An alternative design is shown in FIG. 138(d), in which a single capillary has been notched (e.g., by laser machining) but not cut through, leaving a portion of the capillary to serve as an anvil. FIGS. 138(a'), 138(b'), and 138(c') show a cutting sequence similar to FIGS. 138(a), 138(b), and 138(c), but using such a notched capillary. In this case, the blade must stop so that its edge does not penetrate any further than the anvil surface (or perhaps a small amount beyond it, if it is allowed to cut into the capillary). To the extent that cutting of the wire does leave a slight burr, feeding of the upstream segment into the downstream capillary may be improved by vibrating the wire and/or one or both capillaries, twisting the wire, lubricating the wire (preferably with a liquid that evaporates quickly or if it remains, does not contaminate the wire surface and impair electrical contact or adhesion to matrix material.

FIGS. 139(a), 139(b), 139(c), 139(d), 139(e), 139(f), 139(g), and 139(h) are 3-D views of an apparatus for actively feeding and cutting wire (or other fiber, such as carbon fiber (individual strands or prepreg), Kevlar, or glass fiber) in some embodiments in accordance with the approaches and apparatus of FIGS. 138(a), 138(b), 138(c), 138(d), 138(a'), 138(b'), and 138(c'). In some embodiments, wire is not fed actively, but rather, fed passively, pulled through the capillary by being anchored in some fashion on the fabricated object (e.g., captured by solidified extrudate). In some embodiments, a slip clutch or active drive mechanism (e.g., using closed-loop tension sensing) can be used to regulate tension on the wire when wire is feeding passively (tension sensing may also be useful when wire is fed actively).

Figure 139A:
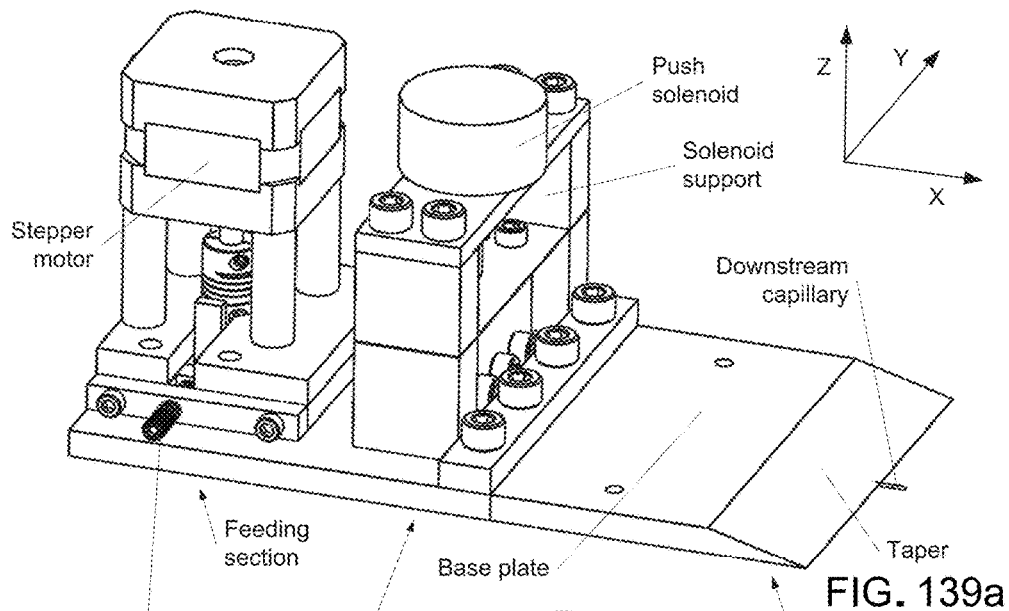
FIGS. 139(a), 139(b), 139(c), 139(d), 139(e), 139(f), 139(g), and 139(h) depict a fiber feeder/cutter.
Figure 139B:
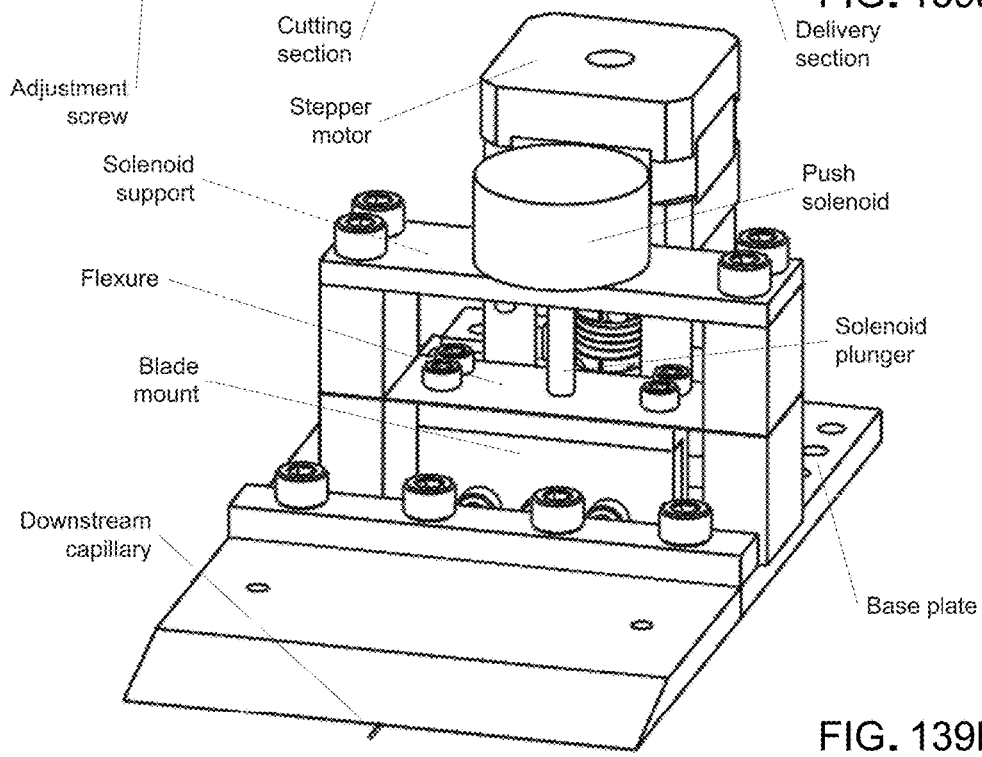
Figure 139C:
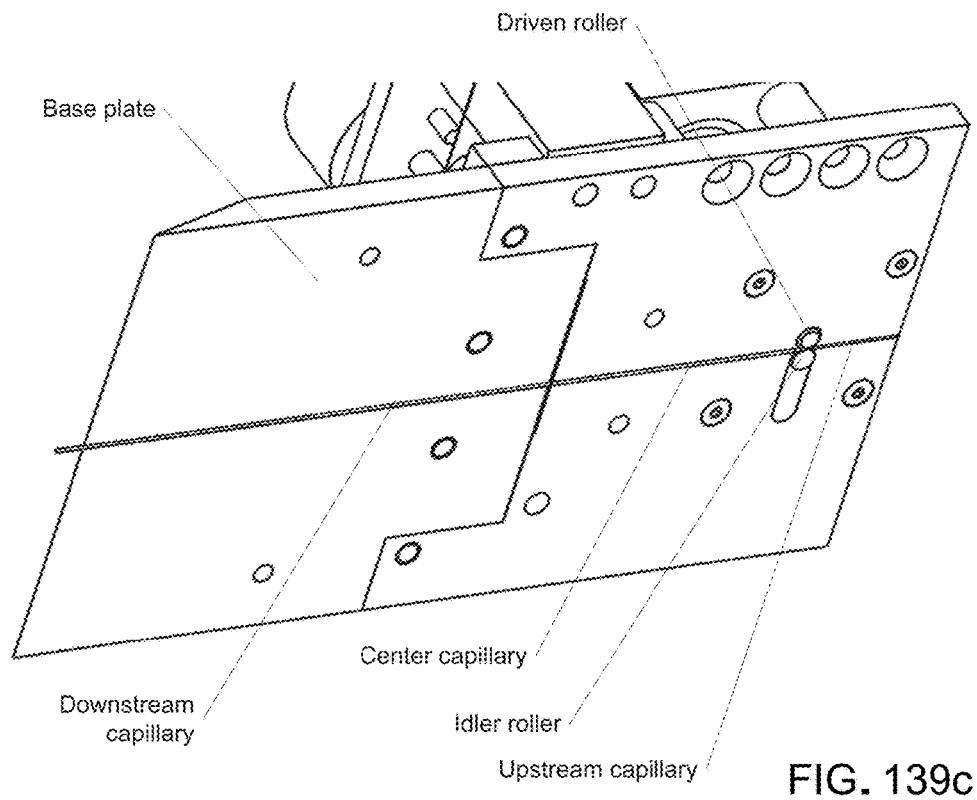

However, to allow starting a wire segment that has been cut, active feeding is desirable. In FIGS. 139(a), 139(b), and 139(c), general views of a feeder/cutter for reasonably soft, small diameter wire (e.g., copper or nickel wire 0.008" diameter or less) are provided. The feeder/cutter comprises a wire feeding section on the left (similar in some respects to the apparatus of FIGS. 32(a) and 32(b)), a wire cutting section in the center, and a wire delivery section on the right. A base plate, which in some embodiment variations may comprise several assembled pieces, provides a common support for all sections.

Figure 139D:
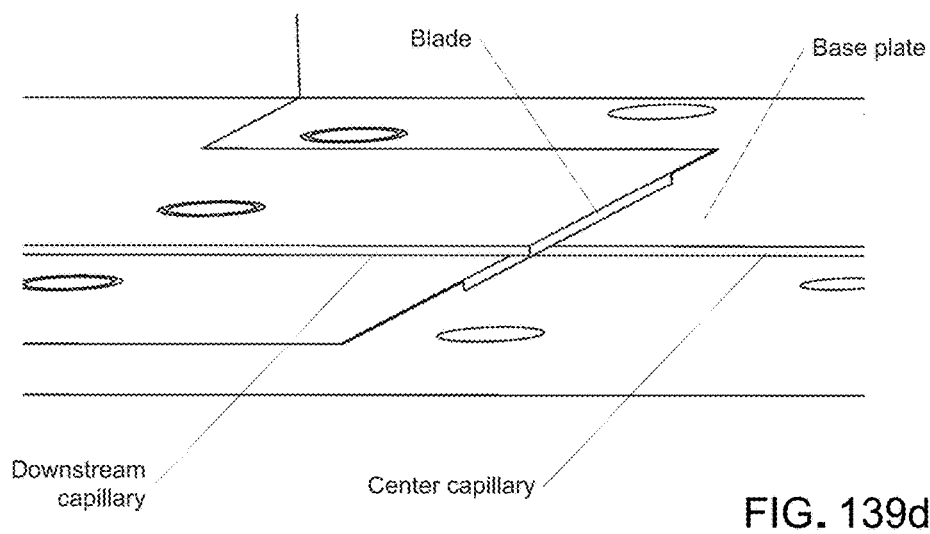
Figure 139E:
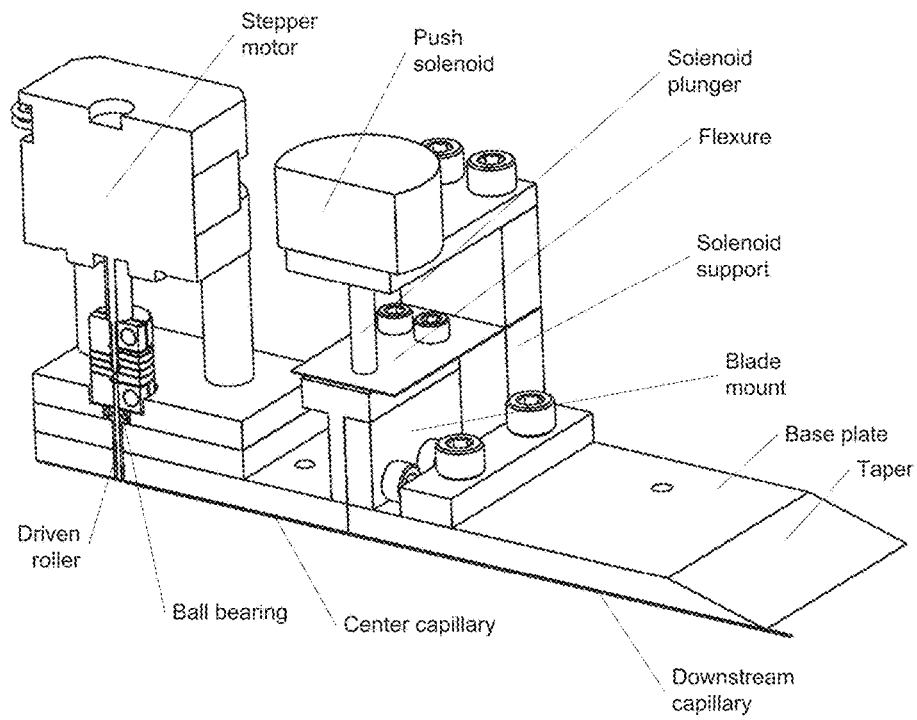
Figure 139F:
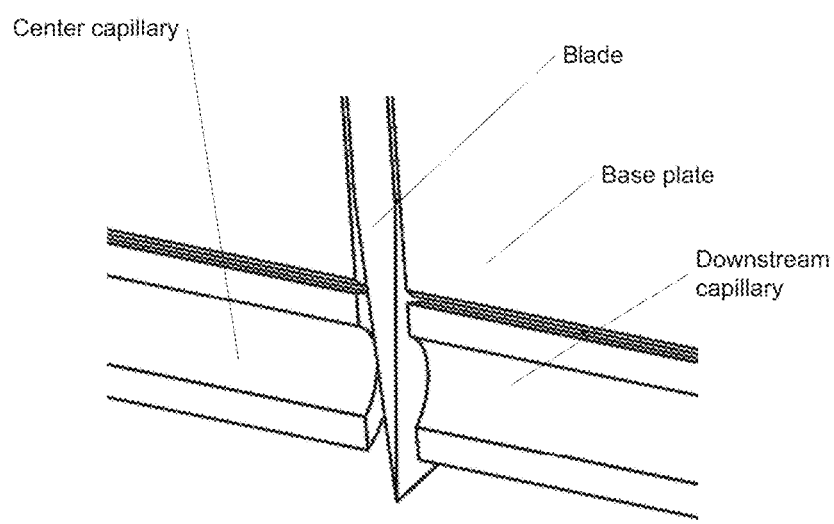
Figure 139G:
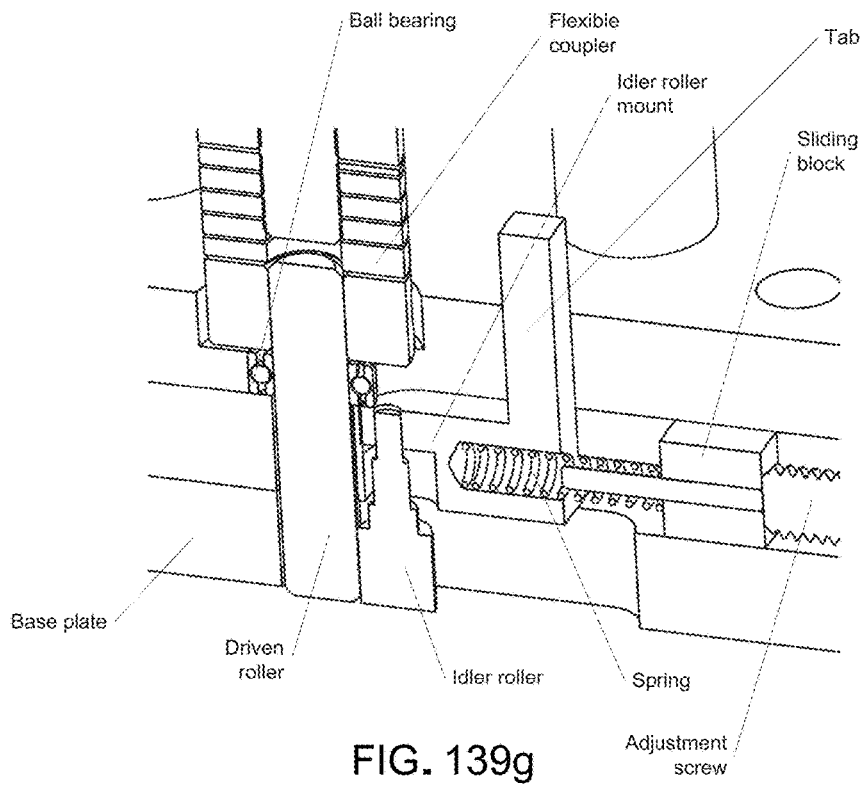
Figure 139H:
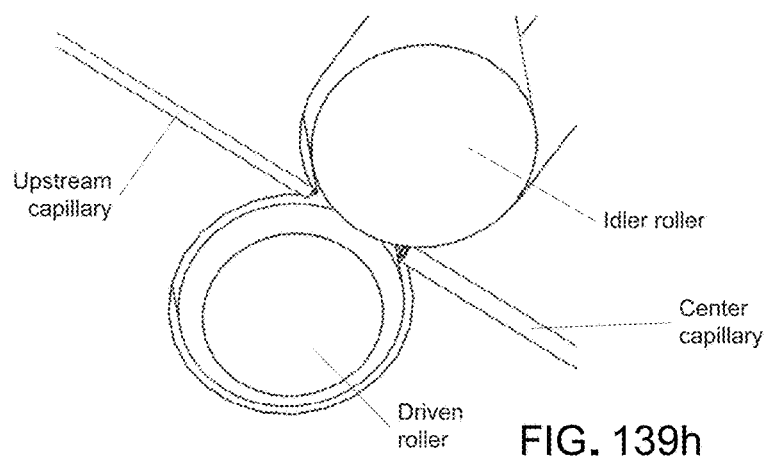

The feeding section comprises a pair of rollers—one driven by a stepper motor and one a spring-loaded idler, and support for the upstream and center capillaries. Within the small gap between upstream and center capillaries, the rollers impinge on opposite sides of the wire passing through the upstream capillary, pulling wire from a feed spool (though in some embodiment variations the wire may be actively fed from the spool), and advancing it into the center capillary. The cutting section comprises a mounted blade capable of controlled vertical motion, a solenoid to provide that motion, and support for the center and downstream capillaries. Finally, the delivery section comprises the downstream capillary, supported at the downstream end of the downstream capillary by a tapered portion of the base plate, allowing the downstream capillary to be placed adjacent to or under the printhead nozzle. FIG. 139(d) is a closeup 3-D view of the blade passing between center and downstream capillaries, as described above in the context of FIGS. 138(a), 138(b), and 138(c). FIG. 139(e) is a sectional 3-D view of the feeder/cutter along the axis of the capillaries, while FIG. 139(*f*) is a closeup of FIG. 139(*f*) showing the blade passing between the capillaries. FIG. 139(*g*) is a 3-D closeup view sectioned perpendicular to the capillary axes showing the drive rollers and the force adjustment mechanism. Finally, FIG. 139(*h*) is a closeup 3-D view of the underside of the feeder/cutter showing the rollers and nearby capillaries.

With respect to the feeding section and referring to FIG. 139(*g*), wire (not shown) is fed between two rollers toward their bottom surfaces. In some embodiment variations, a single roller and a fixed surface (e.g., in lieu of the idler roller) having low friction (e.g., a block of PTFE) can be used, with the wire pinched between the roller and this surface. In some embodiment variations, more than two rollers may be used, and in some embodiment variations, more than one roller may be driven. The sides of the rollers are preferably knurled (not shown), e.g., using a fine pitch straight knurl, or otherwise textured to obtain better traction on the wire. Such a texture is imposed on wire by plastic deformation particularly if it is soft, but unless it is so deep as to lead to wire buckling when the wire is pushed along by the rollers, it is of no consequence, and in fact, can increase the bonding between wire and matrix. The stepper motor drives the driven roller through a ball bearing which controls the roller position. In some embodiments, a servo motor or other rotary actuator may be used in lieu of a stepper motor. The ball bearing idler roller is fastened to a sliding roller mount which is pushed on by a spring placed between the mount and a sliding block. Spring force, and thus, the force pushing the idler roller against the wire, is controlled by an adjustment screw which turns in a fixed thread and pushes on the sliding block. The mount includes a tab that can be manually pulled to retract the idler roller from the wire, allowing the wire to move freely; in some embodiment variations, an actuator may be provided to move the mount automatically, e.g., to allow wire anchored in the fabricated object to be passively fed through the capillaries under tension.

With respect to the cutting section and referring primarily to FIG. 139(*e*), activation of the solenoid causes the plunger to descend and push against the top of a flexure (e.g., spring steel) which is rigidly attached to the solenoid support on one side, and allowed to slide in a gap between portions of the support on the other side. In some embodiments, a pneumatic cylinder or other actuator can be used in lieu of a solenoid. Attached to the flexure is a blade mount, which secures a double-edge razor blade between two solid pieces. The blade is positioned slightly off center with respect to the capillary axes, such that by removing and rotating the blade around a vertical axis, an unused sharp section of the blade may be used. By rotating the blade about a horizontal axis, access to its upper edge may be obtained. Thus four regions of each blade can be used. In some embodiment variations, the blade can be slid parallel to its edges either manually or via an actuator, allowing even more use of the blade edge. In some embodiment variations, the blade is circular in shape and can be rotated gradually or intermittently to provide a sharp region for cutting once another region has dulled from use. In the case of multiple fibers encapsulated in the same extrudate, multiple feeders may be used in some embodiments, or a common feeder may be used, and a common cutter or multiple cutters may be used.

Figure 140:
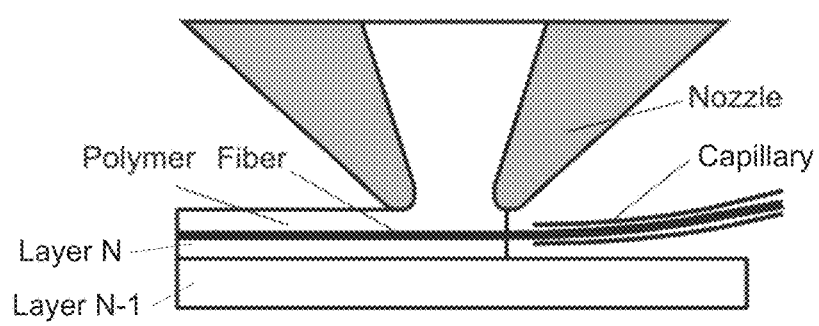
FIG. 140 shows the relative placement of nozzle and capillary in some embodiments.

In use, the feeder/cutter may be mounted in some embodiments so the extended tip of the downstream capillary is located approximately adjacent to the tip of the nozzle as shown in FIG. 140. In the figure, the capillary tip is shown as curved, which in some embodiments it may be, while in other embodiments the tip may be straight, and the feeder/cutter may be mounted so the capillary is tilted down slightly. In FIG. 140, the nozzle motion relative to the fabricated object, while delivering extrudate to encapsulate the wire is not shown, but is toward the right. In general, the downstream capillary inside diameter should be large enough to feed wire easily, including cut pieces of wire which may have small burrs at the cut ends. The capillary outside diameter should be as small as possible, allowing the capillary to be placed close to the underlying layer if required, and minimize the risk of interference between the capillary and previous deposits, as for example when printing a spiral coil from the outside to the inside. If the wire is unheated, in some embodiments it is desirable to position the capillary so that the wire is as high as possible, possibly touching the underside of the nozzle, since the flow of matrix material (e.g., molten polymer) can tend to push the wire down towards the bottom of the extrudate, e.g., due to viscous drag. The size and the shape of the wire (e.g., square vs. rectangular vs. circular), the wire material (e.g., thermal conductivity and specific heat), the size of the nozzle orifice, the properties of the matrix material, the material flow rate, the temperature, and other factors may influence any such tendency. In embodiments in which the wire is heated (e.g., by passing through one or more capillaries heated by a thin-film heater, Joule heating, hot air, etc.) however, this effect may be reduced (e.g., since the viscosity of the flowing material is reduced by the higher temperature in the vicinity of the wire), thus the capillary location and angle may be adjusted to position the wire lower within the extrudate. In some embodiments, especially if the layer thickness is relatively large and the capillary outside diameter small, the capillary tip itself may be positioned under the nozzle tip. In some embodiments, grooves, bosses, or other features in the nozzle may serve to guide the wire into the extrudate at the optimal position and angle, and the capillary may be further away from the nozzle tip.

The feeder/cutter may be mounted in some embodiments so that it can be moved and adjusted in position either manually or using actuators along the X, Y, and Z axes (these X and Y axes are defined in the coordinate system of the FEAM system, and are not to be confused with the X and Y axes of the platform if the platform is rotated; X is assumed to be roughly parallel to the capillary in this case). Movement along the Z axis (and in some embodiments, sequential or simultaneous movement of the X axis as well) allows the capillary to be retracted, as already discussed in conjunction with FIGS. 30(*a*), 30(*b*), and 30(*c*). Adjustments along the Z axis can assist with obtaining vertical concentricity of the wire and extrudate. Adjustments along the Y axis (perpendicular to the extrudate) can assist with obtaining horizontal concentricity, and adjustments along the X axis may be desirable for precise positioning of the capillary and control over the wire, especially for small radius turns. In some embodiments, motion along the Y or the Z axis can be used to create encapsulated wire that has a serpentine shape, allowing stretchability if the matrix is elastomeric, for example, and simultaneous motion in Y and Z enables the production of helical wire shapes such as in FIG. 72. In some embodiments, small Z and/or Y axis motions/vibrations (e.g., 10-100 µm), e.g., at high speed may assist with the extrudate flowing around the wire, which is desirable for the integrity of the object (e.g., interlayer and intra-layer bonding with other extrudates) and to reduce any tendency to push the wire down towards the bottom of the extrudate.

In use, the adjustment screw is tightened enough to provide good traction of the rollers on the wire, and wire is fed at a velocity that in some embodiments matches the nozzle velocity with respect to the fabricated object. In some embodiments, the wire may be fed at a faster speed (e.g., to induce buckling into a serpentine shape that can be stretched) or at a slower speed (e.g., to induce tension in the wire which will be relieved when the surrounding matrix shrinks. When wire needs to be cut, the solenoid is activated briefly, lowering the blade and forcing it through the full diameter of the wire. When the solenoid is deactivated, the flexure then raises the blade so its edge is above the wire. Once a segment of wire is cut, activation of the stepper motor causes wire upstream of the blade to advance, pushing the cut piece through the downstream capillary. In some embodiments, before cutting occurs, feeding of the wire by the rollers is ceased, while in other embodiments, it can continue, as long as the cutting is very rapid or the wire passes through a "buffer" zone (e.g., a section of the feeder/cutter where it can controllably buckle) so it doesn't kink.

If a long wire segment is anchored in the fabricated object and being laid and encapsulated, then in general the feed rollers will be feeding wire as long as the nozzle is moving. However, once the segment is close to being completely laid and played out by the downstream capillary, the feed rollers in some embodiments are not active continuously, but may be turned on and off so as to allow cutting of wire segments "on the fly" without having to pause the printing process. FIGS. 141(a), 141(b), 141(c), 141(d), 141(e), and 141(f) depict in cross-sectional elevation views a sequence that demonstrates this, in which segments are cut that are shorter than the downstream capillary. In FIG. 141(a), wire segment 1 is anchored in the fabricated object and the feeder/cutter and nozzle are moving relative to the object to the left, away from the point of anchor. Segment 1 has already been cut, and additional wire upstream of it can now be cut without needing to stop the nozzle and feeder/cutter motion. As shown in FIG. 141(a), segment 2 of the wire can thus be cut while the feeder/cutter is moving. In FIG. 141(b), the blade is retracted and segment 2 remains in the downstream capillary while segment 1 continues to be pulled out of it due to the feeder/cutter motion away from the anchor point. In FIG. 141(c), wire feeding by the rollers continues, feeding wire beneath the blade in preparation for cutting segment 3, while simultaneously pushing segment 2 further down the capillary. In FIG. 141(d), the blade is lowered, cutting segment 3 loose. In FIG. 141(e), the blade has retracted again, and by now, the gap between segments 2 and 3 has grown. Then, in FIG. 141(e), wire is fed again in preparation for the next cut, and also serving to push segment 2 out of the capillary (partially) and push segment 3 further downstream. In general, wire segments which are short enough to remain in the capillary may be pre-cut while other operations are occurring. If there is excessive motion or vibration that might allow cut segments to spontaneously move down the downstream capillary and even fall out, a thin flexible wire or other element may be incorporated into the capillary to provide a small, controlled frictional resistance to motion, for example.

Figure 142A:
FIGS. 142(a), 142(b), 142(c), 142(d), 142(e), 142(f), and 142(g) depict a method for breaking wire.
Figure 142B:
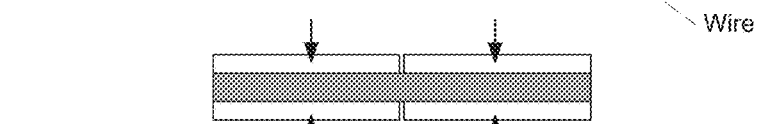
Figure 142C:
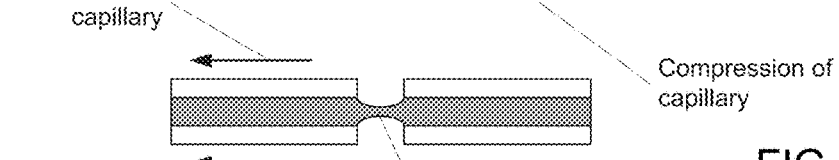
Figure 142D:
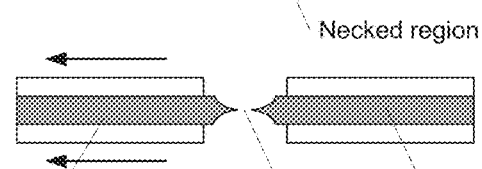
Figure 142E:
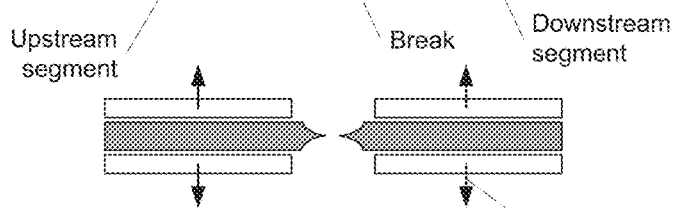
Figure 142F:
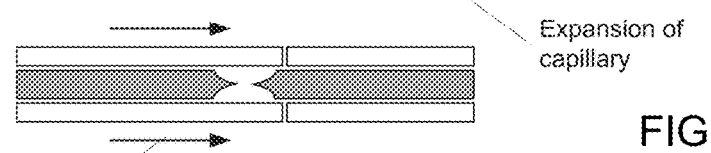
Figure 142G:
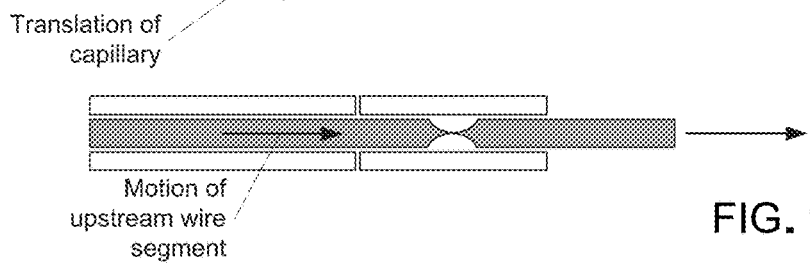

FIGS. 142(a), 142(b), 142(c), 142(d), 142(e), 142(f), and 142(g) depict a cross sectional views (elevation or plan) of a method for breaking wire in lieu of cutting it, and translating at least one capillary to close the gap between the center and downstream capillaries. By stretching wire to break it, the method minimizes the occurrence of burrs on the ends of the segments, thus facilitating their feeding into and passage through the capillaries. In FIG. 142(a), wire is in the desired axial position, ready for segmentation. The capillaries are preferably at least in the regions shown made from a deformable, highly elastic material such as superelastic nickel-titanium. In FIG. 142(b) the capillaries have been squeezed (e.g., by pins or clamps not shown) such that they impinge tightly on the wire and clamping it securely within both capillaries. Then in FIG. 142(c), the center capillary (or in some embodiment variations, the downstream capillary, or both) has moved away from the downstream capillary, causing the wire to neck and then, in FIG. 142(d), break in the necked region. Then, as in FIG. 142(e), the capillaries can expand, releasing their grip on the wire. In FIG. 142(f), the center capillary has translated in some embodiment variations so it is again adjacent to the downstream capillary, thus providing a continuous conduit for the wire and facilitate the upstream wire segment's entry into the downstream capillary. Finally, in FIG. 142(g), the upstream wire has advanced (e.g., by feeder/cutter feed rollers) and has begun to push the downstream segment out of the capillary. In some embodiment variations, prior to stretching the wire, the wire may be partially cut, or nicked, to facilitate breaking or tearing it.

Figure 143A:
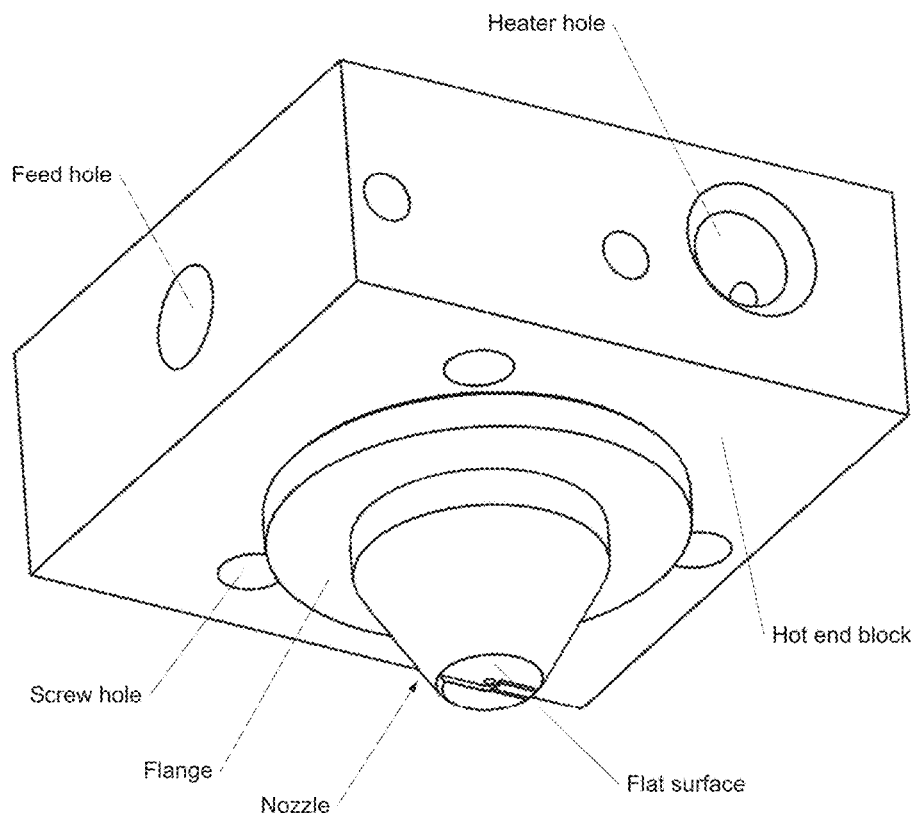
FIGS. 143(a), 143(b), 143(c), and 143(d) show a nozzle that may be used for side-by-side wire laying.

FIGS. 143(a), 143(b), 143(c), and 143(d) depict 3-D views of a nozzle and hot end block which may be used for laying wire such as flat magnetic (e.g., iron) wire side by side, as described in FIGS. 107(a), 107(b), 107(c), 107(d), and 107(e). In some embodiments, such a nozzle and block may also be used for precisely controlling the placement of isolated wire or other fiber as well. The hot end block is heated by a cartridge heater (not shown) and thermoplastic material is fed into it through a feed hole. As shown in FIG. 143(a), the nozzle is equipped with a flange and pressed against the block by a ring (not shown) that surrounds the flange and is retained by screws entering several holes in the block, or directly by the screw heads or washers. Between the block and nozzle is an O-ring in some embodiment variations.

Figure 143B:
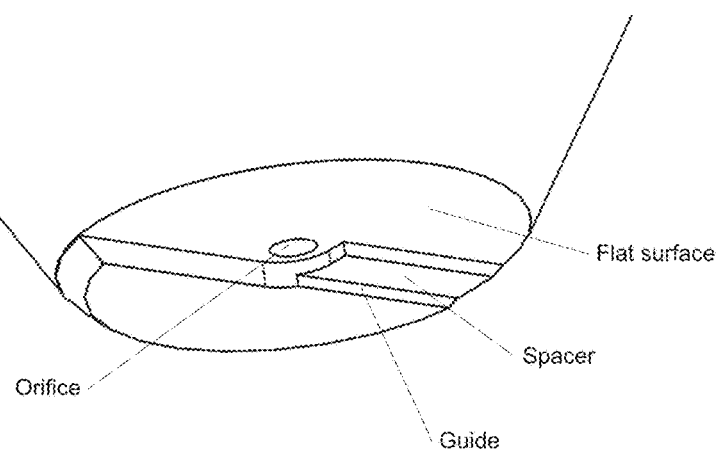
Figure 143C:
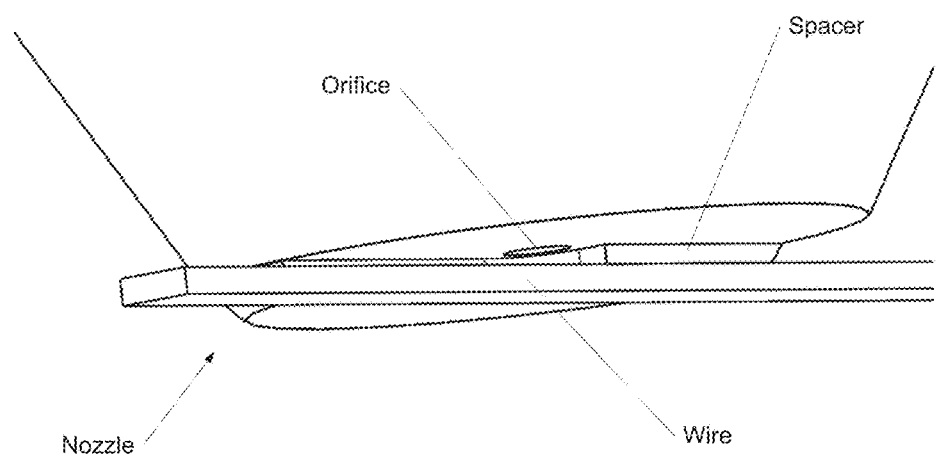
Figure 143D:
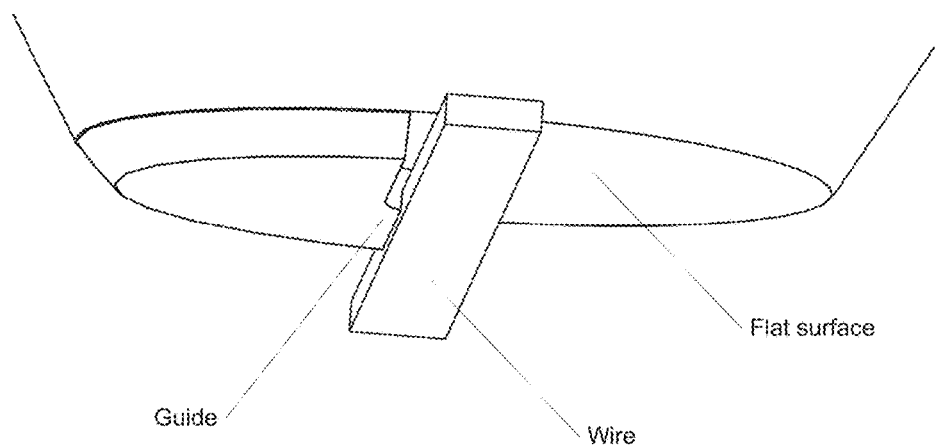

The flat tip of the nozzle includes several features, comprising an orifice and several features that are not axially symmetric, as shown in FIG. 143(b). Before tightening the mounting screws, the nozzle can be rotated relative to the block to align these features parallel to the direction in which wire is to be laid. The two remaining features include a guide whose function is described in conjunction with FIGS. 107(a), 107(b), 107(c), 107(d), and 107(e), and a spacer which establishes the desired gap between the nozzle tip and the top of the wire, and controls the thickness of extruded material that coats the wire when laid. This further affects the spacing of wire along the Z axis. FIGS. 143(c) and 143(d) depict flat wire placed under the nozzle tip such that it contacts the spacer at its top, and the guide at its side.

Figure 144A:
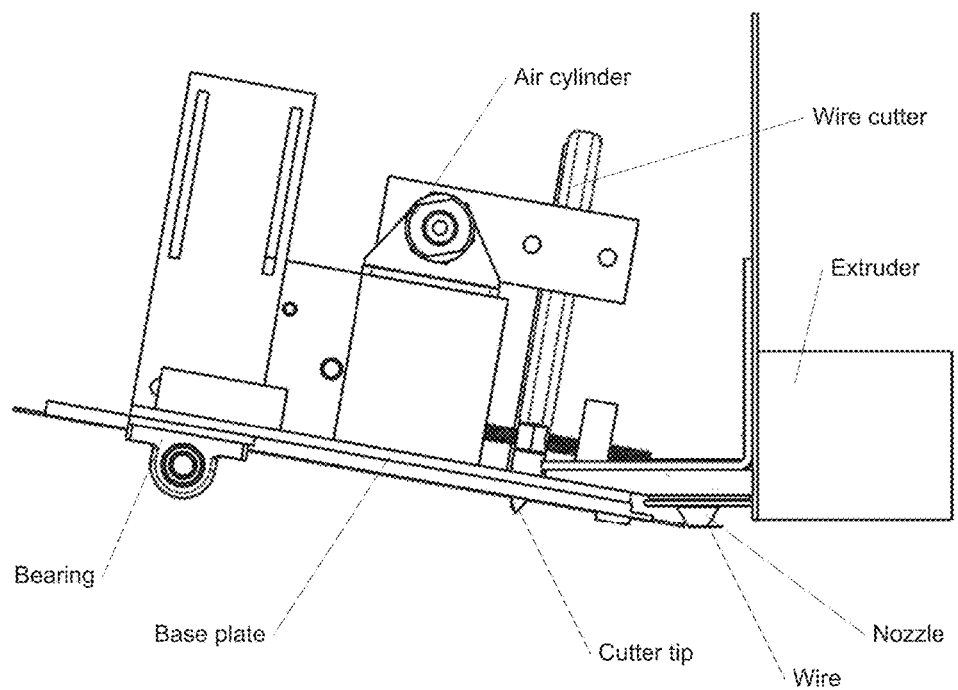
Figure 144B:
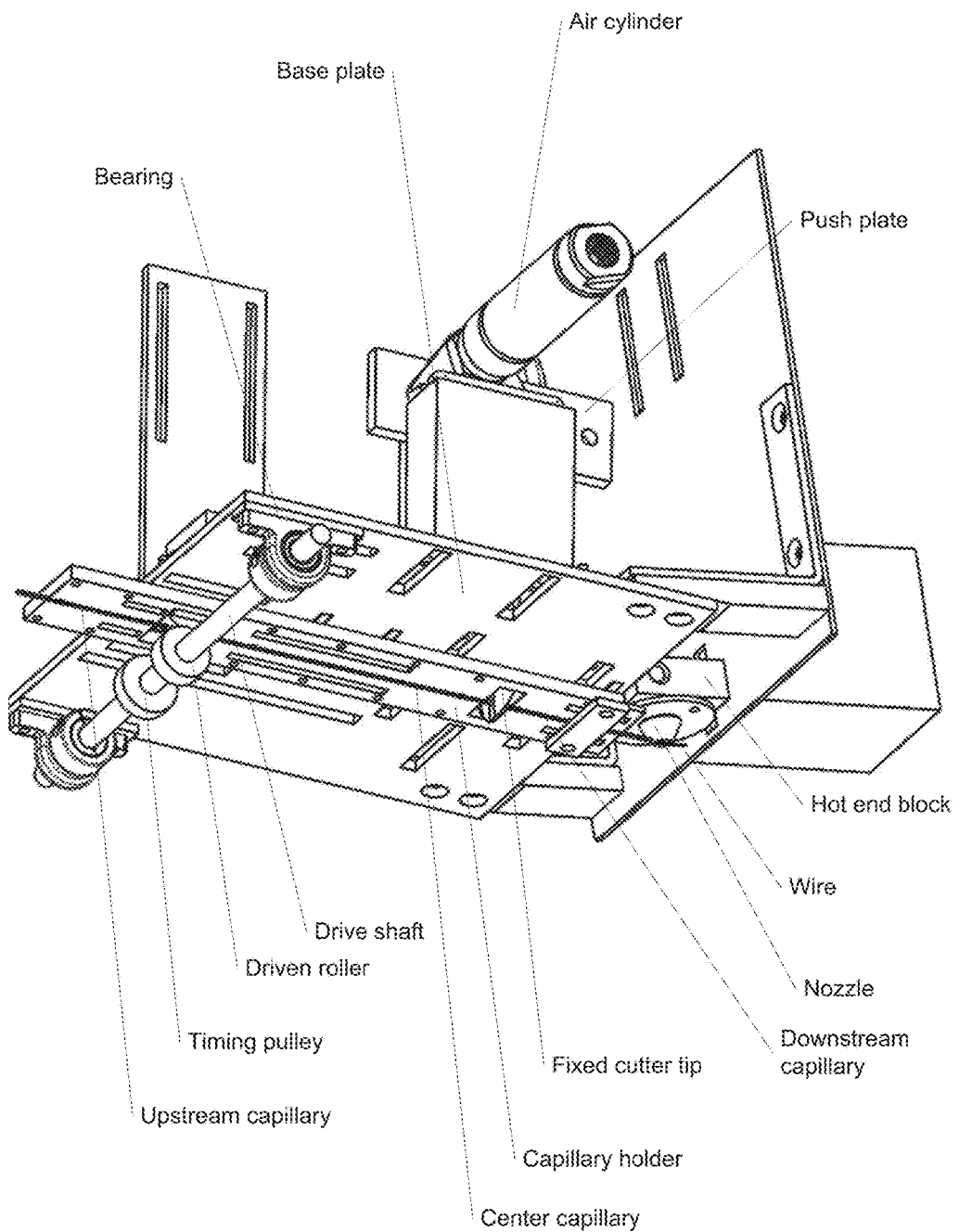

FIG. 144(a) is a front view, and FIGS. 144(b), 144(c), 144(d), 144(e), 144(f), and 144(g) are 3-D views, of a feeder/cutter for heavy gauge wire or other fiber difficult to cut using a sharp razor blade, such as steel wire which can be used in magnetic structures as an alternative or adjunct to SMPC. Such wire can be square in cross-section as in FIG. 107, or rectangular. In some embodiments the wire is rectangular and oriented with the larger dimension parallel to the layers of the fabricated object. This allows thin layers (assuming the wire is no taller than the layer) while permitting larger areas to be formed using fewer wires. Moreover, the wire may be easier to lay in straight, parallel lines. This type of wire, oriented as described, will be assumed in the following description of FIGS. 144(a), 144(b), 144(c), 144 (d), 144(e), 144(f), and 144(g).

Like the feeder/cutter of FIGS. 139(a), 139(b), 139(c), 139(d), 139(e), 139(f), 139(g), and 139(h), wire is pinched between two rollers—one driven by a motor and one, a spring-loaded idler (spring not shown). If the wire were square in cross-section, then it could be driven either with vertical or horizontal rollers. Assuming it is rectangular, however, in some embodiment variations it is driven by rollers above and below it rotating on horizontal axes as in FIG. 144(f), such that the rollers contact the wider surface of the wire. In other embodiment variations, the wire is driven by rollers rotating on vertical axes along the wire's narrower dimension. In such a case, grooves may be provided in the rollers into which the wire enters partway so as to minimize the risk of the wire twisting or distorting, and to increase traction on the wire. The rollers are preferably knurled as already described regarding FIGS. 139(a), 139(b), 139(c), 139(d), 139(e), 139(f), 139(g), and 139(h). In the design shown in the figures, the driven roller is turned by a drive shaft supported by bearings, and a timing pulley fixed to the drive shaft is turned by a timing belt (not shown) which is moved by a motor above the base plate turning another timing pulley (not shown).

The feeder/cutter may in some embodiments (as shown) incorporate the hot end block and nozzle of FIGS. 143(a), 143(b), 143(c), and 143(d) and a filament (or other) extruder, or these may be separate components. In either case, as shown in FIG. 144(a), the design of the feeder/cutter incorporates a base plate which is angled much like that in the feeder/cutter of FIGS. 139(a), 139(b), 139(c), 139(d), 139(e), 139(f), 139(g), and 139(h); however, the angle in this case may be larger so that the bearing which supports the drive roller shaft is higher than the tip of the nozzle, and so cannot interfere with the fabricated object's top layer while building. With vertical axis rollers, the angle can be smaller in some embodiment variations.

Figure 144C:
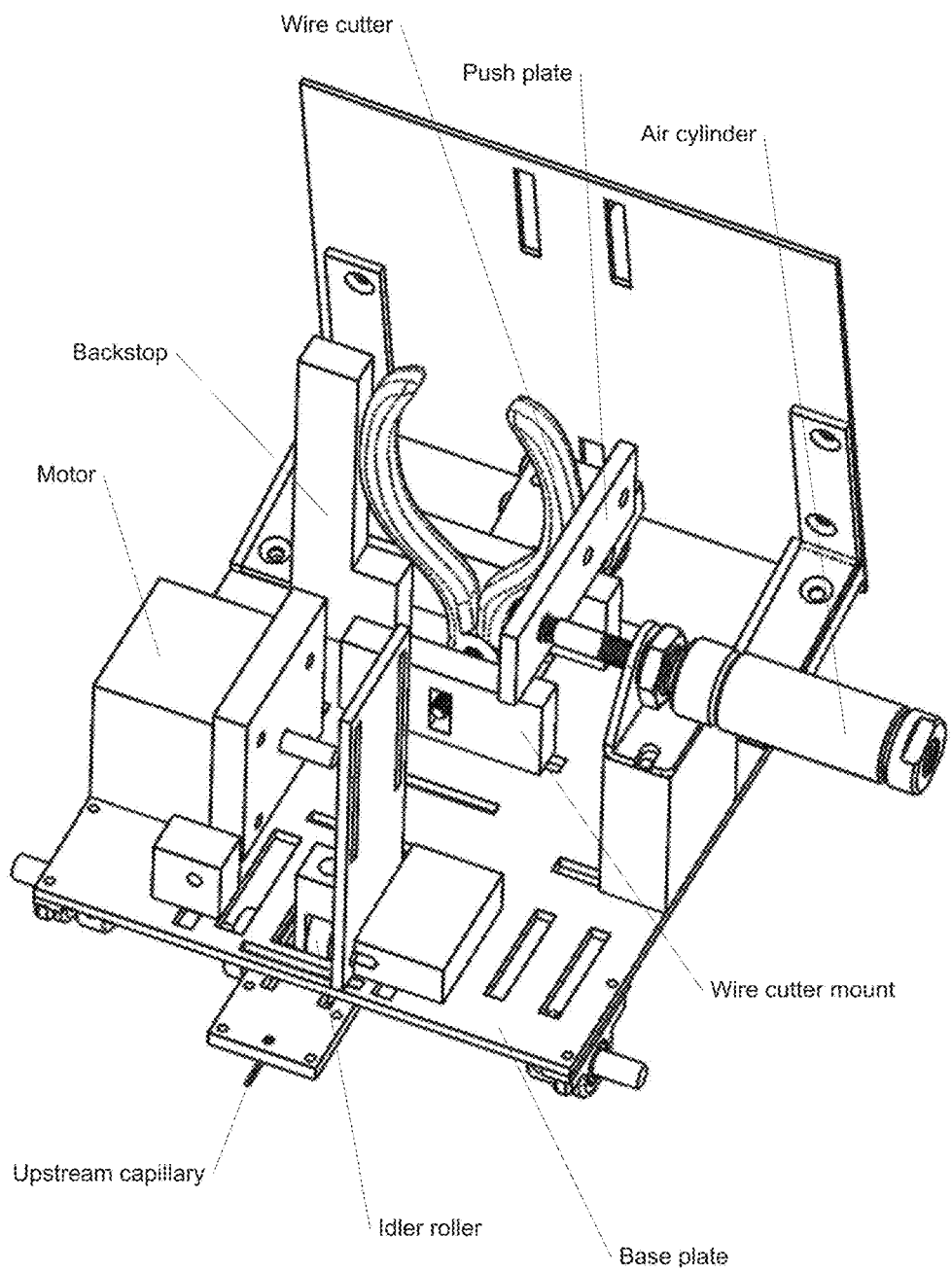
Figure 144D:
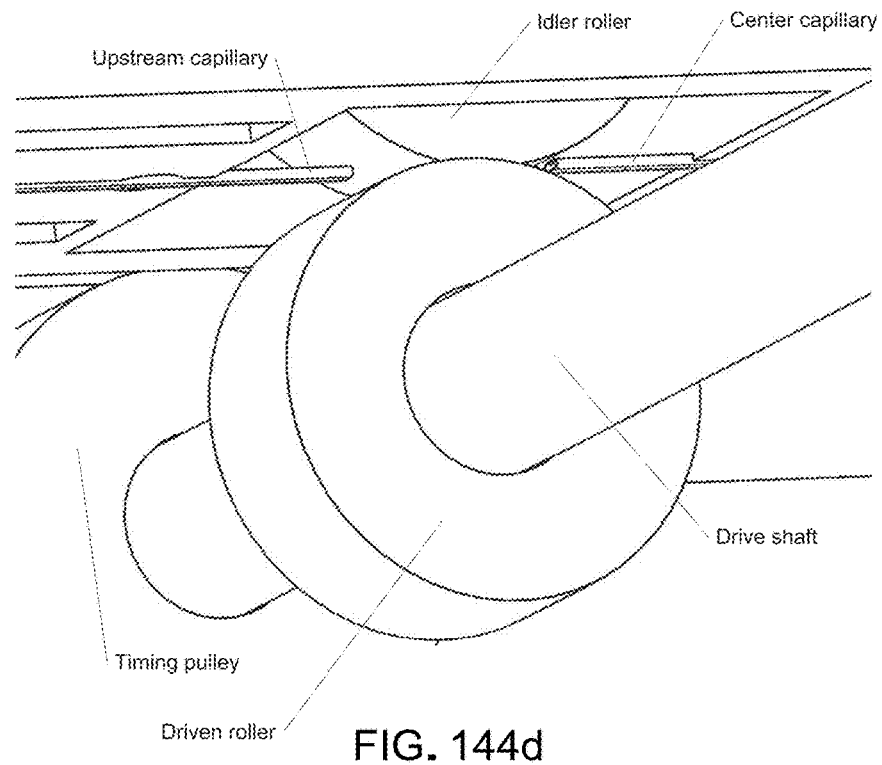
Figure 144E:
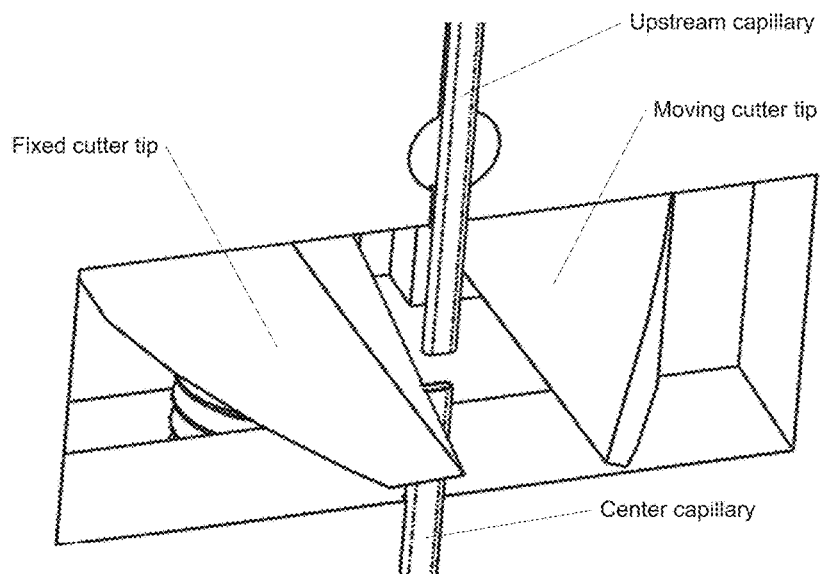
Figure 144F:
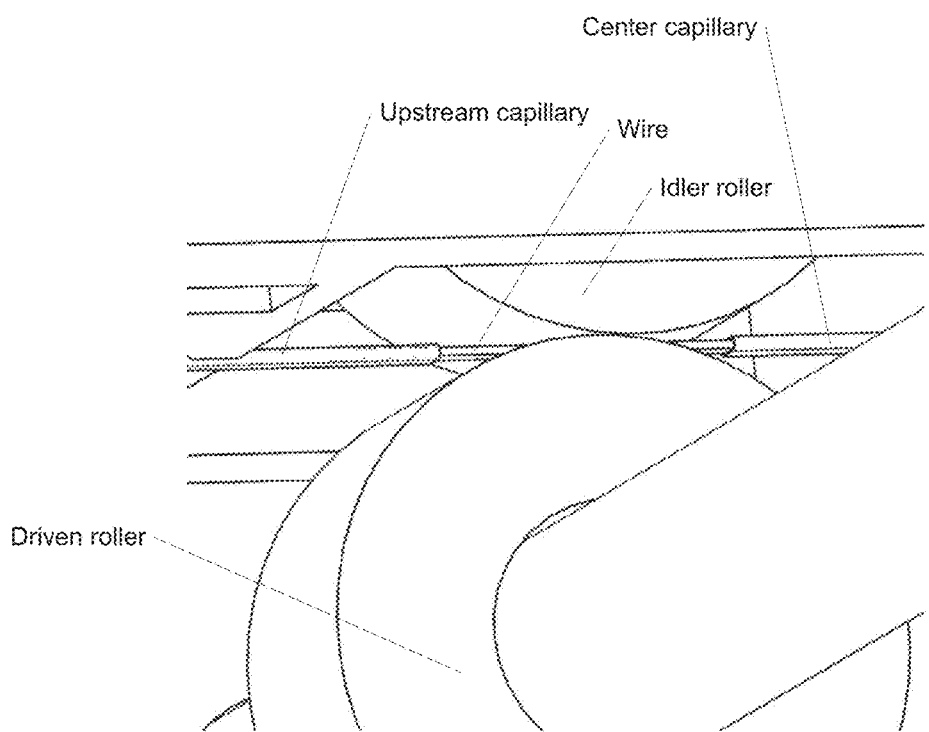
Figure 144G:
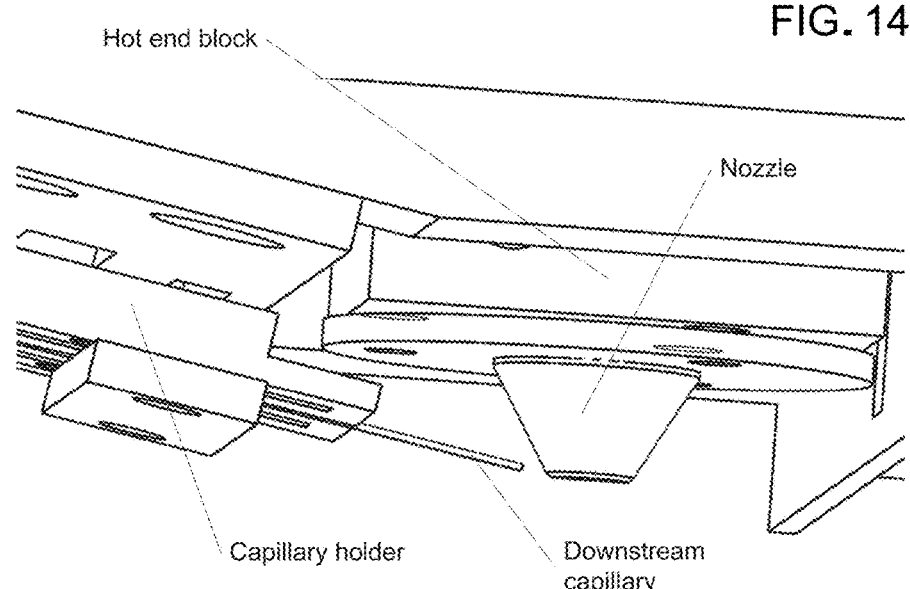
Figure 145A:
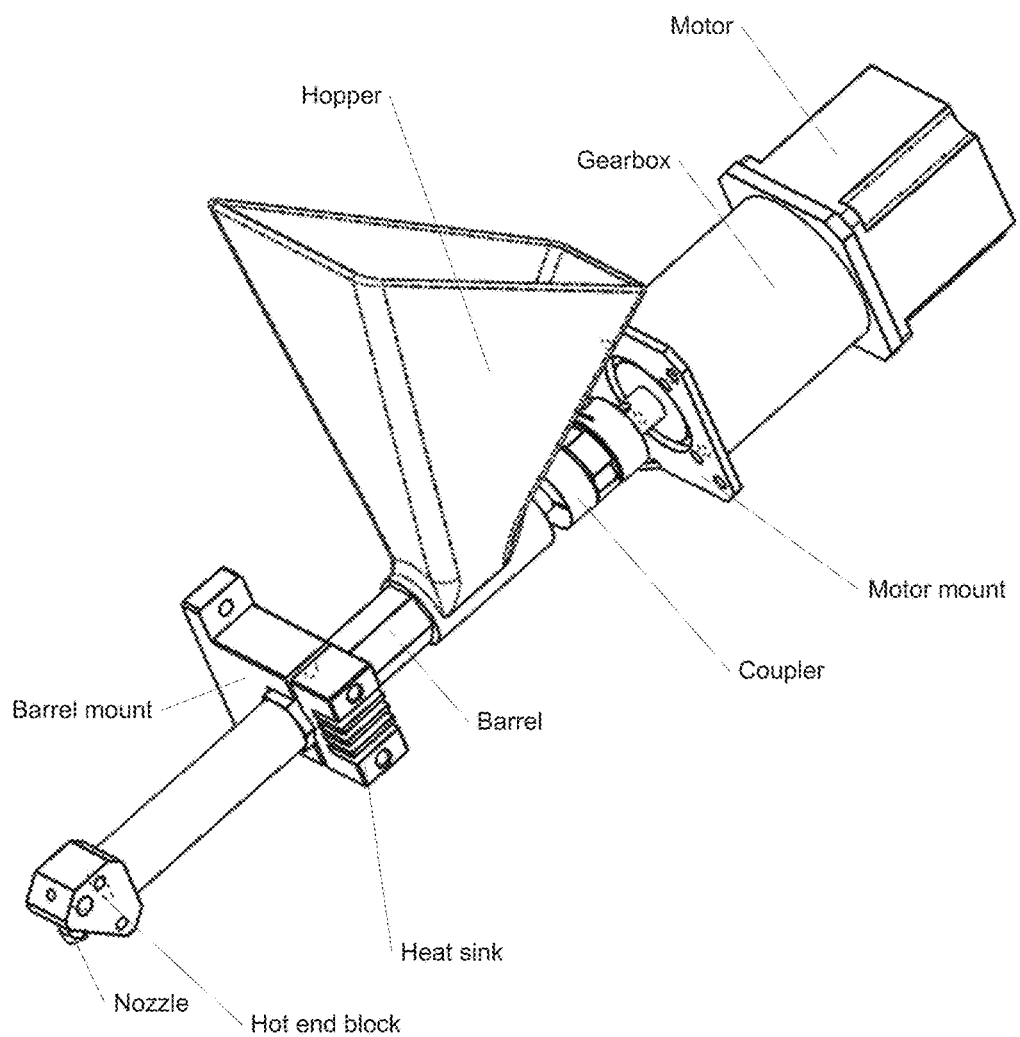
Figure 145B:
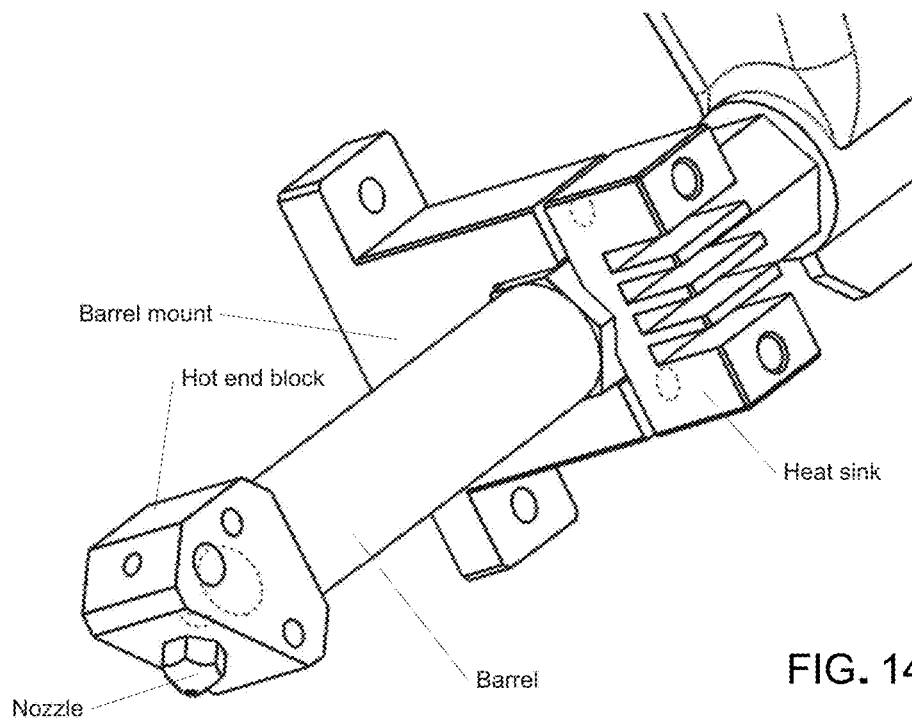
Figure 145C:
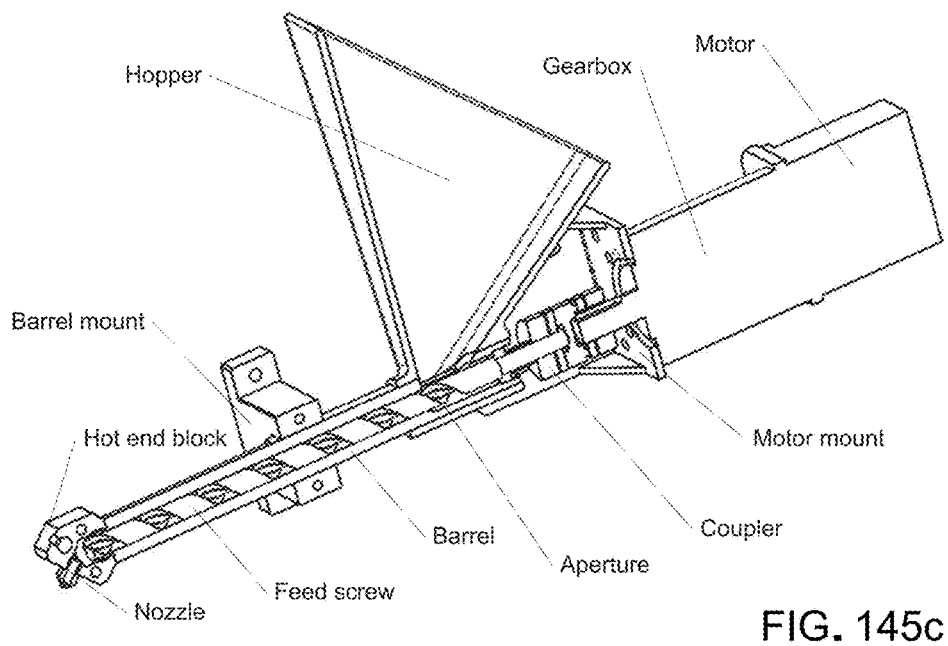
Figure 145D:
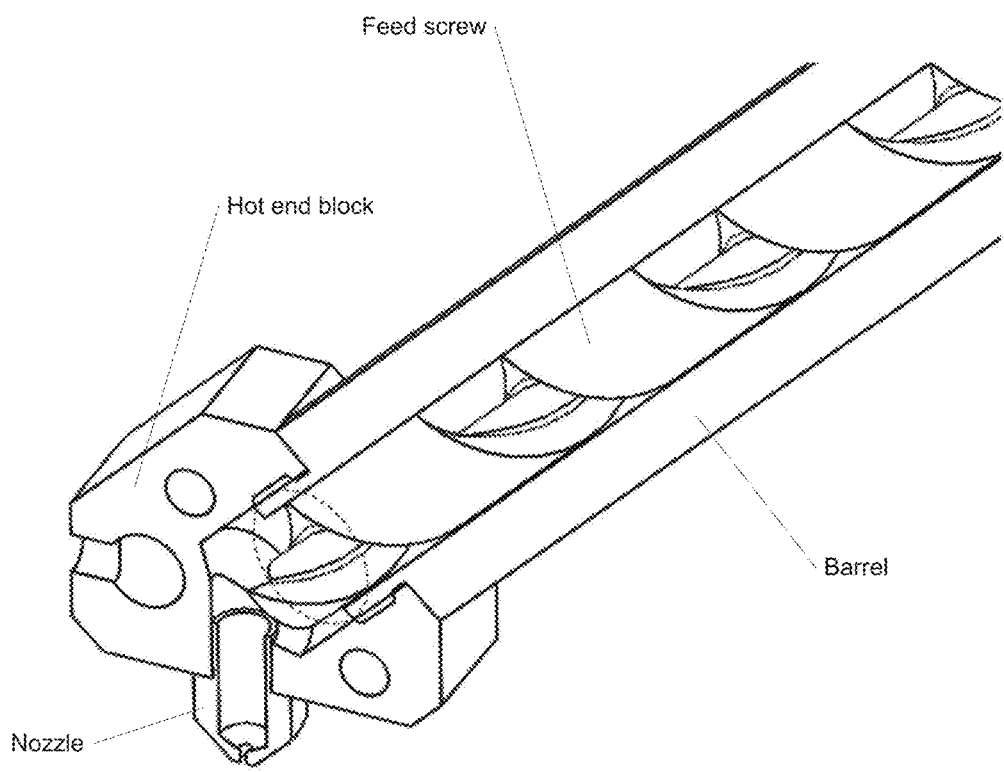

To cut wire, the feeder/cutter may use a number of approaches. Preferably the wire is cut along its narrow dimension (i.e., vertically if oriented as described above) to avoid the risk of twisting. However, sufficient vertical clearance may not be available to cut the wire vertically if an anvil or second cutting blade must be located under the wire. Thus in the approach shown in FIGS. 144(a), 144(b), 144(c), 144(d), 144(e), 144(f), and 144(g), cutting is performed along the wide dimension of the wire, and the wire is prevented from twisting by the center and downstream capillaries, which in some embodiment variations are rectangular in cross section, and just slightly larger in inside dimensions than the wire. In the particular implementation shown, ordinary high quality wire cutters are used to cut the wire; in other embodiment variations blades may be mounted to low-profile fixed, sliding, or compliant elements, thus eliminating the large, traditional wire cutter and allowing for a more compact design. As shown in FIG. 144(c), a pneumatic cylinder is provided that when actuated, presses against one handle of the wire cutters using a push plate, while the other handle is prevented from moving by a backstop. In some embodiment variations, rather than have one blade fixed and one move, both are moved inwards toward the center of the wire to cut it. FIG. 144(e) is a closeup of the fixed and moving wire cutter tips protruding through an aperture in the base plate, and surrounding the rectangular capillaries (wire not shown).

In operation, wire is pulled from a spool (not shown) through the upstream capillary, then pushed through the center and downstream capillaries, as with the feeder/cutter of FIGS. 139(a), 139(b), 139(c), 139(d), 139(e), 139(f), 139(g), and 139(h). The capillaries are mounted to a capillary holder on the underside of the base plate, and the tip of the downstream capillary is located near the tip of the nozzle (FIG. 144(g)). Once wire is cut, the downstream segment is pushed into the downstream capillary (the upstream inlet of which may be flared) by the advancing uncut wire in the center capillary, as in the feeder/cutter of FIGS. 139(a), 139(b), 139(c), 139(d), 139(e), 139(f), 139(g), and 139(h). In some embodiment variations, the capillaries are in the form of grooves machined into the base plate of the feeder/cutter, and covered with a thin shim (e.g., stainless steel) on the bottom surface.

In addition to the double-blade cutter shown in FIGS. 144(a), 144(b), 144(c), 144(d), 144(e), 144(f), and 144(g), in some embodiment variations other cutting methods may be used. These include the method of FIGS. 142(a), 142(b), 142(c), 142(d), 142(e), 142(f), and 142(g), a rotating element such as a blade, cutoff wheel, or dicing saw blade (e.g., diamond or other hard material), single-blade cutter with anvil, laser cutter, and plasma cutter. With some of these methods, cooling may be advisable, such as using spray cooling with a quickly-evaporating coolant, or using a cold air blaster or other source of cold gas. Also, means of collecting dust such as a vacuum and/or a surface coated with adhesive may be used. In some embodiments, wire may be cut simply by providing a shearing action (horizontally and/or vertically) between the center and downstream capillaries with no gap between these. The capillaries are preferably fabricated in the form of channels in rigid plates of hard material, with sharp edges.

As with the wire feeder/cutter of FIGS. 139(a), 139(b), 139(c), 139(d), 139(e), 139(f), 139(g), and 139(h), the feeder/cutter of FIGS. 144(a), 144(b), 144(c), 144(d), 144(e), 144(f), and 144(g) may be mounted in some embodiments so that it can be adjusted in position either manually or using actuators along the X, Y, and Z axes.

FIGS. 145(a), 145(b), 145(c), and 145(d) depict 3-D views of an extruder for FDM and FEAM use, similar in some respects to that shown schematically in FIG. 49, though without the piston and actuator, or extra hopper to introduce powder. Such an extruder is able to feed and extrude a very wide range of materials, from hard materials such as ABS to very soft TPEs (e.g., 5 Shore A), typically materials softer than about 75 Shore A cannot be extruded by filament-based extruders. The extruder comprises a motor (e.g., a stepper), a gearbox which reduces speed and increases torque, a hopper for polymer pellets, a feed screw inside a close-fitting barrel, a coupler to couple the gearbox output to the feed screw, a hot end block, one or more band heaters in some embodiment variations (not shown), a nozzle, a motor mount, a barrel mount, and a heat sink. The overall design of the extruder has material progress from hopper through barrel and hot end block, and extrude out the nozzle. The axis of the extruder barrel is at an angle (e.g., 45°) to the horizontal while the angled hopper allows material to be loaded as if the barrel were horizontal, and the hot end block is shaped so the axis of the nozzle is nonetheless vertical. The hopper is retained in the position shown by the hexagonal outer shape of the barrel and a corresponding hexagonal recess in the lower end of the hopper; the end of the barrel toward the motor is circular. By sliding the hopper along the circular portion of the barrel toward the motor, it can be rotated in order to dump the pellets inside, e.g., when changing materials. In some embodiment variations, a vibrator or other agitator is affixed to the hopper to assist in feeding materials (e.g., low-durometer TPEs) into the barrel.

Material is heated as it progresses down the barrel toward the hot end block, which is heated by a cartridge heater or similar. One or more band heaters may be located along the barrel between the heat sink and hot end block to pre-heat the material. The barrel mount and heat sink (onto which a cooling air stream may be directed) provide a means of dissipating heat so that pellets upstream of these elements are not prematurely heated, which can cause them to agglomerate and not feed properly.

As shown in the sectional 3-D view of FIGS. 145(*c*) and 145(*d*), within the barrel is a feed screw with flights that is rotated to feed material into the hot end. Since the feed screw diameter must be small (e.g., ⅜") for use in FDM and FEAM, the flight depth is preferably large enough for pellets of standard size to fit into them. An auger bit intended for drilling, but rotated backwards, is an example of a suitable feed screw. Material enters the feed screw through an aperture in the upper surface of the barrel, below the hopper.

In FDM and FEAM, it is often necessary to reverse the flow of extruded material before making a jump between one printed area and another to avoid oozing from the nozzle that can cause a "stringer" (thin extraneous material). This is known as suck-back or retraction. If this is done, before extruding again, the extruder normally is primed such that it is full of fluid material and ready to extrude again. In the extruder of the current design, retraction and priming may be accomplished in some embodiment variations by feed screw rotation alone (e.g., reversing the normal feed direction to retract), though a high speed of rotation for retraction (and optionally, priming) may be desirable. In some embodiment variations, the hot end block is equipped with a piston and cylinder similar to that of FIG. 49, to rapidly relieve pressure or establish a partial vacuum in the hot end block and prevent oozing. In some embodiment variations, the feed screw itself may be retracted axially by a suitable actuator to aid in retraction. In some embodiment variations, in addition to the feed screw shown, a second, smaller feed screw is provided with its axis parallel to the nozzle, and inserted into the hot end block and/or nozzle to substantially block the flow from the nozzle when the smaller feed screw is stationary. Upon rotation of the smaller feed screw, flow commences, and upon stopping the smaller feed screw or reversing it, flow is quickly stopped and if desired, retracted (in which case, the nozzle can also be primed in preparation for the next extrusion). Indeed, this smaller, low-inertia feed screw can serve as the primary regulator of flow from the nozzle, at whatever rate is required, and the larger feed screw can serve primarily to replenish material in the hot end that is ejected by action of the smaller feed screw.

The extruder of FIGS. 145(*a*), 145(*b*), 145(*c*), and 145(*d*) is more massive than typical filament extruders, and thus as shown is more difficult to move in X and Y relative to the platform on which the object is being fabricated. In some embodiments, the platform is thus moved in X and Y and the extruder only moves in Z, or not at all. In other embodiments, modifications to the design in FIGS. 145(*a*), 145(*b*), 145(*c*), and 145(*d*) can be made to lighten it, thus better enabling it to move much like a standard filament extruder. In various embodiments such modifications may include:

A fixed, remote hopper, from which pellets travel through a tube (e.g., driven by air flow, air pressure, vibration, or merely tube flexing in the course of extruder motion) to the extruder.

A fixed, remote hopper under or adjacent to which the extruder, with a hopper of much smaller capacity, moves as needed to receive a new load of pellets.

A fixed, remote motor (and in some embodiments, gearbox) with a flexible shaft delivering torque to the moving feed screw and barrel.

A fixed, remote motor with a flexible shaft delivering torque to a moving gearbox, feed screw, and barrel.

A fixed, remote motor with a partial gearbox, and a flexible shaft delivering torque to a moving partial gearbox, feed screw, and barrel (i.e., some of the reduction in speed and increase in torque is performed at the fixed location, and some at the moving printhead). A fixed, remote hopper, motor, gearbox, feed screw, barrel, and band heater, which delivers molten material to a moving hot end through a well-insulated and/or heated umbilical.

Use of an air motor with reduction gearing, or a spring motor/clockwork in lieu of an electric motor and gearbox.

Objects fabricated with FEAM from flexible materials such as TPE can have support structures made from a material that is relatively rigid, such that the supports, rather than needing to be dissolved or cut away, can simply be peeled off of the object by flexing it. Moreover, rigid materials can be more vulnerable to crushing, sand or bead blasting, vibratory deburring, and similar approaches, than the flexible object, so these methods may also be used.

Objects fabricated with FDM and FEAM may not be isotropic in tensile strength, for example, with the weaker axis being the Z axis, due to interlayer adhesion not being generally as good as the bulk properties of the material. This can be particularly a problem for objects with small areas of overlap between layers, such as lattice-like designs. In principal, material deposited on layer N fuses with that already deposited and solidified on layer N−1; however, the fusion is incomplete and interdiffusion at the interface is imperfect. In some embodiments, therefore, the nozzle may be rotated at high speed or vibrated while it is extruding, such that its bottom surface exerts a viscous drag on the softened material on layer N−1, and helps to mix and inter-diffuse it with material on layer N. The bottom of the nozzle may be textured or have relatively large projections (a fraction of the thickness of layer N−1) to enhance this effect. In some embodiments, another method for enhancing inter-layer adhesion may be used, comprising a rapidly-reciprocating, narrow heated needle which moves with the nozzle (e.g., it may be within the nozzle orifice) and penetrates layer N−1, "sewing" the two layers together by helping to intermix the material in each of them. Such techniques of improving inter-layer adhesion, while they may generally useful when printing the part, may also intentionally not be used in regions or under circumstances when it is desired that inter-layer adhesion is relatively weak. For example, when making a part supported by supports made from the same material as the part itself, it is desirable to reduce the adhesion at the interface between the part and supports such that support removal is easier, and less likely to damage the part or leave a small amount of the support behind.

In some embodiments, when co-depositing fiber and matrix material along a path having small radii (e.g., the corners of a square), the forward motion of the nozzle and wire may be slowed or paused to allow more solidification of the matrix to occur, and/or, additional matrix material may be added to form a "staple" or localized blob that helps to trap the fiber and prevent it from herniating out of the extrudate.

In some embodiments, resistors with precise values may be produced from partially-conductive materials such as ECPC, or a variety of commercial "conductive" filaments such as F-Electric made by Functionalize (Seattle, Wash.), as follows:

Deposit resistor material in a pattern (e.g., straight, serpentine) beginning with one end encapsulating a wire (which may be part of an existing or planned circuit, or added for the purpose of monitoring the resistor value); electrically connect to this "probe" wire if not already done.

Print the remainder of the resistor while measuring the resistance between the nozzle and the probe wire.

When the resistance reaches the desired value (compensating in some embodiments for expected changes, e.g., due to solidification or aging), encapsulate another wire serving as the other terminal of the resistor and stop printing the resistor.

This general approach can also be used for producing other components with well-controlled values, such as inductors and capacitors.

In some embodiments, wire that is anchored in matrix material or otherwise may be broken (instead of being cut) by nicking or scoring it with a blade or other cutting element and pulling on it, preferably with a sudden jerky motion (e.g., raising the capillary, moving it sideways, or pulling the feeder/cutter away while the feed rollers are stopped, or reversing the rollers). In some embodiment variations, the wire may be broken, if relatively brittle (e.g., glass or ceramic) by thermal or mechanical shock after being scored. Wire broken this way is already within the downstream capillary or has already exited from it, thus any burrs produced do not affect the wire's ability to be transported.

Objects fabricated from elastomers in the FEAM process may be selectively stiffened in some embodiments by incorporating fibers within the structures in specific locations and with specific orientations.

In some embodiments, wire segments may be fed through a capillary from a cutter such as that in FIGS. 139(a), 139(b), 139(c), 139(d), 139(e), 139(f), 139(g), and 139(h) or 144(a), 144(b), 144(c), 144(d), 144(e), 144(f), and 144(g) using vibration of the capillary (in some embodiments fine springs, "hairs", or "fingers" are incorporated inside the capillary, pointing downstream), or using fluid flow (e.g., air injected into the capillary axially, or through louvers in the capillary wall: such louvers can be laser cut and then deformed into shape to direct air downstream and not catch the edge of advancing wire), or using an external moving magnet to drag the segments (if ferromagnetic) along, or using coils to propel them directly (if ferromagnetic) using the principle of the railgun.

In some embodiments, objects may be produced with fibers or other inserts some of which are embedded using ultrasound or thermal means (e.g., FIGS. 70(a), 70(b), and 70(c)) and some of which are co-deposited and encapsulated using the FEAM process. For example, an object may be printed with FEAM and then have additional fibers or other useful items embedded into it ultrasonically on accessible surfaces. In one such application, wires can be embedded which form vertical vias between encapsulated wires laid parallel to the horizontal layers.

Ultrasonic transducers which may be used to embed fibers and other elements such as in FIGS. 70(a), 70(b), and 70(c)) may not easily tolerate the environment of a heated chamber in which fabrication using FDM or other AM process sometimes occurs. Thus in some embodiments the transducer and associated elements such as the horn can be actively cooled and/or the transducer can be isolated within an enclosure (e.g., one that moves across the surface of the part like a printhead) that is temperature controlled.

Since with FEAM the printhead may not be rotationally symmetric due to the external, lateral placement of the capillary, and given that this is compensated for by rotating at least portions of the printhead or the fabricated object, it is also possible to integrate other elements in the printhead which are beneficial to the process. For example, trowels and other protruding shapes attached to the printhead (e.g., the nozzle) can be used to control the width and shape of extrudates with considerable accuracy and precision, making possible objects with improved tolerances and/or smaller features. These structures may be substantially aligned with the nozzle orifice axis, or be located somewhat upstream or downstream of the axis. In the case of an FDM or FEAM process carried out in a parallel, raster mode (as discussed below), such active shaping of the extrudate can minimize the stairsteps in the X/Y plane that would otherwise result.

In some embodiments in which flat wire is laid with the wider dimension parallel to the layers, it is desirable to bend the wire within the layer plane. Normally this is difficult without twisting it, but with a nozzle or printhead attachment having a groove to accept a portion of the wire's width, such "edge bending" as it is known to the art, can be achieved, with surprisingly small radii if the material is ductile.

In some embodiments, the capillary and wire supply (e.g., spool), and in some cases even a feeder/cutter (collectively, the "WDS" (wire delivery system)), can be independent of the nozzle, and multiple instances of this apparatus may be provided in a single FEAM system. For example, the WDS can be translated on its own X/Y (and optionally theta) stages, or move by piggybacking onto the moving printhead when needed. By separating the WDS from the nozzle and allowing independent movement of each, a structure such as the drive belt of FIGS. 134(a) and 134(b) (and far larger and more complex structures) can be easily created with continuous wire, even without a variable-width nozzle. For example, the WDS and nozzle can follow the same trajectory while forming a single loop of continuous wire, at which point the nozzle can move separately to fill in the remaining portions of the layer, while the WDS remains in place with the wire uncut and intact. The converse is also possible, in which the wire laying is performed last on a layer. Toolpaths for both WDS and nozzle which avoid collisions are of course necessary, and in some cases, the WDS may have to move small distances while playing out wire temporarily (and later retracting it) to avoid such collisions. With one or more WDSs, it becomes possible to build an object such as the axial flux motor of FIGS. 136(a), 136(b), and 136(c) with multiple coils, each made from continuous wire, with no junctions.

Figure 146A:
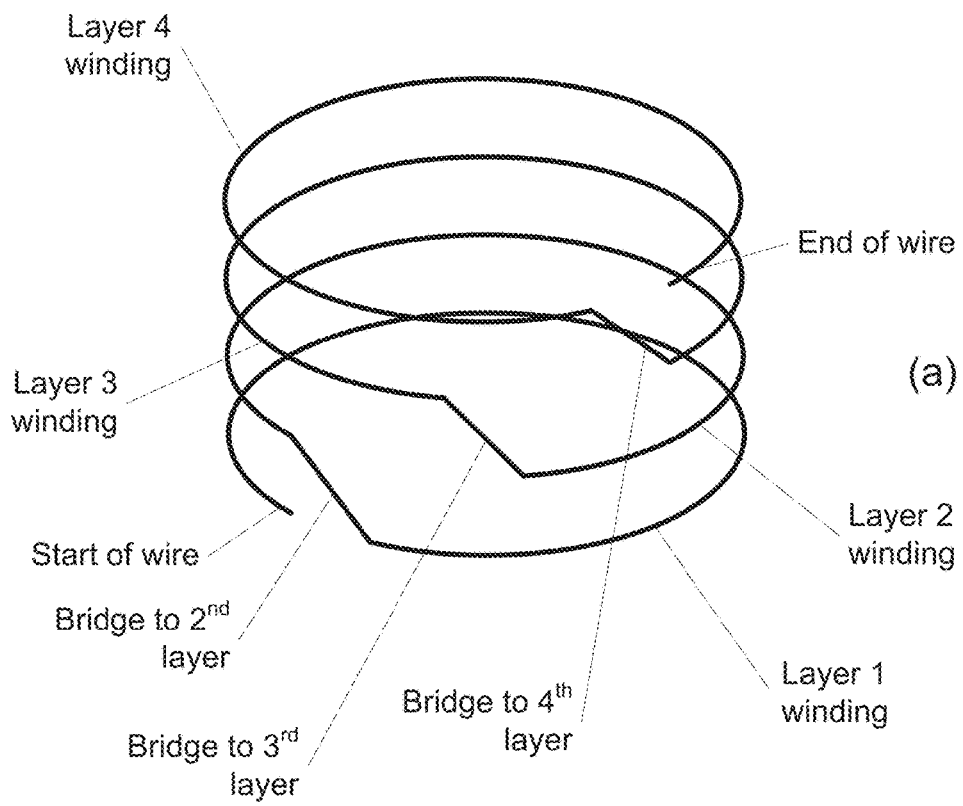
Figure 146B:
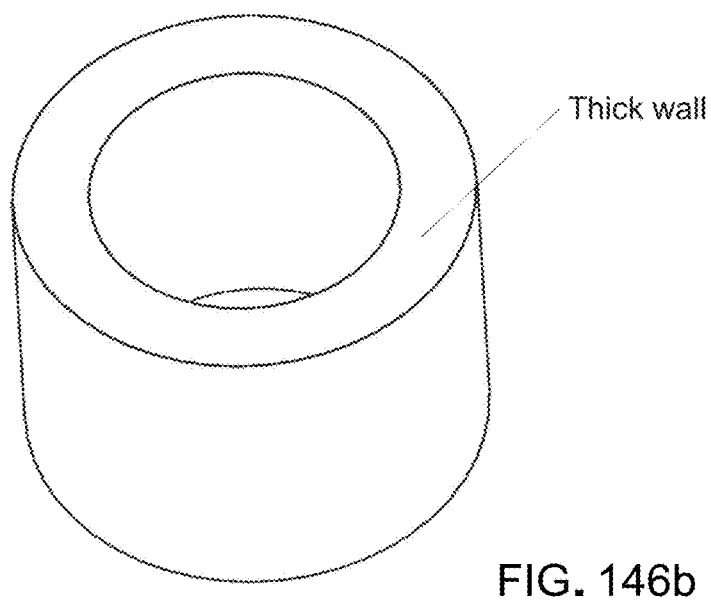
Figures 146K, 146L:
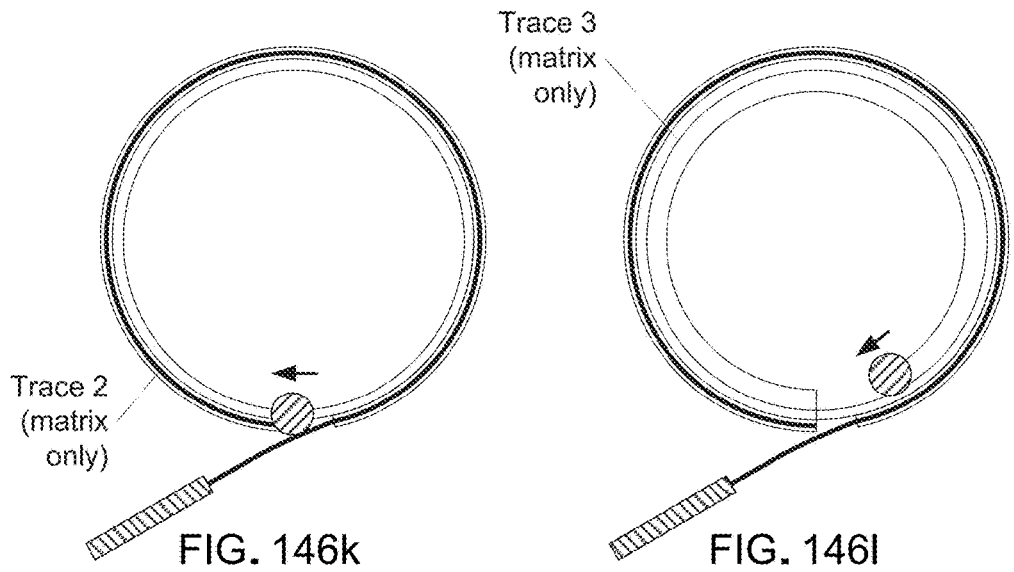

The 3-D views of FIGS. 146(a) and 146(b) depicts as separate pieces (for clarity) a structure to be printed having continuous wire and matrix material in some volumes, but only matrix material in other volumes. The printing of such a structure is enabled by the ability to separately move the nozzle and WDS. In the example shown, the structure is a coil having one winding of wire on each layer as in FIG. 146(a), and "bridges" between wires which connect one winding to another; these bridges may be at various angles, including vertical. The wire starts at the bottom (and may have an elongated lead extending past the winding, not shown) and ends at the top (again, with a possible elongated lead). The wire will be encapsulated near the outside diameter of a thick-walled cylinder of matrix material such as that of FIG. 146(b). In some embodiments, coils with multiple windings on each layer (e.g., as in FIG. 123) may be similarly fabricated, as may be structures such as the belt of FIGS. 134(a) and 134(b).

The plan views of FIGS. 146(c), 146(d), 146(e), 146(f), 146(g), 146(h), 146(i), 146(j), 146(k), 146(l), 146(m), and 146(n) depict a sequence in fabricating a layer of this structure. In FIG. 146(c), a nozzle is beginning to move counterclockwise in a circular pattern starting at the 6 o'clock position, so as to print wire and an extrudate of matrix on a given layer (here assumed to be the first layer). Moving along with the nozzle is a capillary (and WDS) through which the wire is fed. As the nozzle moves, the capillary rotates so as to remain substantially tangent to the nozzle motion as the nozzle moves (in some embodiments the capillary angle may be intentionally kept off-tangent to better keep the wire centered in the extrudate, or bias it to one side of the other). In FIG. 146(d), the nozzle and capillary have moved to the 9 o'clock position, and a quarter of the wire/matrix circle has been printed. In FIGS. 146(e) and 146(f), the nozzle and capillary have moved to the 12 o'clock and 3 o'clock positions, respectively, continuing to print wire and matrix as they progress. In FIG. 146(g), the nozzle and capillary have moved to a position slightly counterclockwise of 6 o'clock, completing the first trace, comprising both matrix and wire. From this position, the bridge to the second layer, which comprises a Z translation of the WDS, can be initiated. However, prior to forming the bridge, it is necessary to print other portions of the layer, which will not include wire.

Figures 146M, 146N:
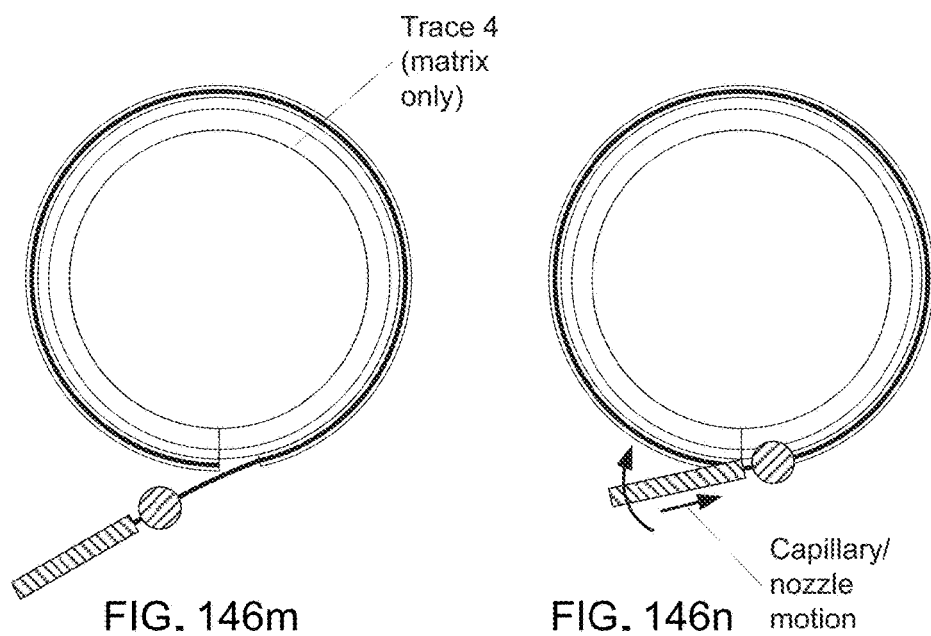

To make room for the nozzle to move independent of the capillary, in FIG. 146(h) the nozzle and capillary have translated and rotated (if both are needed) to a new position, while playing out wire from the WDS (e.g., advancing the WDS' feed rollers, or releasing their grip on the wire). In FIG. 146(i), while the capillary remains stationary, the nozzle has begun to follow a toolpath which allows it to deposit additional matrix material on the layer, forming a portion of the second trace, which contains no wire. In FIG. 146(j), more of the second trace has been printed, and in FIG. 146(k), trace 2 has been completed. Since the wall needs to be thicker, the nozzle then continues to print a third trace, which is nearly completed in FIG. 146(l). After completing a fourth trace, the nozzle then moves back in FIG. 146(m) to its normal position adjacent to the capillary. In FIG. 146(n), the extra wire that had been played out is retracted (e.g., by reversing the feed rollers) while or after repositioning the nozzle and capillary in locations which allow the bridge to then be formed and the second layer to be printed using a similar sequence similar to that shown in FIGS. 146(c), 146(d), 146(e), 146(f), 146(g), 146(h), 146(i), 146(j), 146(k), 146(l), 146(m), and 146(n). This is repeated until all layers are formed; on the last layer the capillary may be moved while playing out wire so as to provide a lead for the coil.

Had the structure needed wire closer to the inside diameter of the wall, the capillary and WDS may have instead moved inwards so as to be out of the way of the nozzle. In some situations, the nozzle toolpath might ordinarily cause the nozzle to move across wire (e.g., which has been played out), potentially depositing material which then anchors the wire inadvertently to the previous layer. In some embodiments, to avoid this, the WDS (and/or the structure being fabricated) can be rotated around so that the wire is always kept out of the way of the nozzle; the rotational angles required to accomplish this may need to be updated dynamically as the layer is printed. While there is relative motion between WDS and fabricated structure, the wire joining them may need to be adjusted in length dynamically so as to maintain the desired tension, avoiding the risk that a sagging wire may snag on the edge of a feature on layers already printed. Lifting the WDS when not in use can also minimize the risk of snagging.

In some embodiments, an independently-moving WDS may have a docking position off to the side of the print area where it may move when not needed. In some embodiments, wire may be deflected and shaped within the extrudate or outside the extrudate (e.g., as bare wire) using magnetic forces. In some embodiment variations, these forces can help to maintain the wire centered coaxially within the extrudate in the X/Y plane and/or along the Z axis. In some embodiment variations, magnetic forces (using alternative current to power an electromagnet) can cause the wire to assume a serpentine shape that facilitates the production of stretchable circuitry. In the case of ferromagnetic wire, or non-ferromagnetic wire temporarily made to carry a current, controlled currents may be applied to one or more (e.g., an array) electromagnets incorporated into the printhead in the vicinity of the nozzle, to apply forces to the wire. In some embodiment variations, current may be passed through the wire by making one electrical contact through the spool and/or feeder/cutter rollers, and making the other electrical contact near the nozzle using the nozzle itself, or another element (e.g., a brush) to contact the wire.

In some embodiments, batteries (primary or secondary cells) can be fabricated with that rely on dissimilar wire electrodes, such as aluminum, zinc, magnesium for one electrode, and copper, nickel, silver, platinum, or alloys of any of these for the other electrode, with an appropriate electrolyte (e.g., aqueous sodium hypochlorite, or bleach) [Qu et al., 2015]). For example, aluminum and copper wires can be encapsulated in the same extrudate, and separated by a porous fiber spacer which can be saturated with electrolyte (e.g., by wicking). Or, in some embodiments, suitable spacers can also serve as solid electrolytes. In some embodiments, a spacer element can be incorporated which later dissolves or is otherwise removed (e.g., by stretching and pulling it out, much like mandrels use in catheter manufacturing). In some embodiments, batteries can be produced in which individual extrudates encapsulate different types of wire, and space is provided between extrudates as required for the electrolyte. Thus for example, one extrudate (e.g., a polymer such as low density polyethylene) may encapsulate one or more aluminum wires, and a nearby extrudate may encapsulate one or more copper wires. Between the two extrudates is a region with no extrudates, or a region with extrudates that have interconnected pores. In this region electrolyte can be introduced. The extrudates encapsulating wires may be porous to allow electrical contact between the wires and the electrolyte and/or may be interrupted (having regions of bare wire exposed to the electrolyte). In some embodiment variations, porosity in extrudates encapsulating wire, and in some cases other nearby extrudates, can provide an escape path for bubbles which may be generated during operation of the battery, and which can degrade its performance. In some embodiments, the electrolyte can be pumped or otherwise driven through channels, to allow bubbles to be removed. In a device using FEAM-produced batteries, a pump can be provided for this function. In a device that is elastomeric and is deformed frequently during ordinary use, the deformation may itself provide pumping of the liquid through available channels, especially if one-way (check) valves are provided, much like the venous system returns blood to the human heart due to muscle contraction adjacent to veins. In some embodiment variations, venting of the battery may be provided by the use of small holes or hydrophobic membranes. In some embodiments, wires are straight, while in other embodiments, they are organized into complex and/or compact shapes which provide large surface areas for the battery components such as the electrodes (e.g., coils). In general, batteries formed using the FEAM process can be distributed through a fabricated device and like many other components in FEAM, serve multiple functions, such as structural and electronic. Distributed power has a number of advantages, including greater energy storage capacity, redundancy, improved thermal management, higher voltages (if connected in series), and much greater design freedom, since the device need not accommodate the limited and often rigid form factors of conventional batteries.

Loudspeakers, headphones, earphones, earbuds, dynamic microphones and geophones, as well as voice coil actuators may be produced with the FEAM process, using PMPC as the magnet, or an inserted magnet. Acoustic transducers may also be produced without permanent magnet materials, using ferromagnetic materials and/or interacting coils only, for example: If the motion produced is unidirectional, an AC signal to be reproduced can be combined with a DC bias to minimize distortion. Galvanometers which indicate the flow of current, or which rotate mirrors in scanning applications, can be fabricated using FEAM. only, Displays of various kinds can be produced with FEAM. These include electrophoretic displays similar to those made by E Ink Corporation (Billerica, Mass.); field emission displays; electrochromic displays; thermochromic displays (e.g., using junctions at the intersections of row and column wires (rapidly-scanned as a matrix circuit) to heat a layer of thermochromic material, or extrudate mixed with thermochromic pigment(s); and liquid crystal displays.

Transformers that can be produced using FEAM include transformers with multiple tapped or tapped windings and high voltage devices (e.g., Tesla coils). Arrays of coils can be used to accelerate and propel ferromagnetic objects, e.g., as in a railgun.

In some embodiments, FEAM may be used to produce actuators and integrated devices having wires serving as electrodes, and in which actuation is produced by gases generated by electrolysis or other chemical reactions activated by an electrical current.

In some embodiments, in lieu of a fiber originating in solid form, and introduced into a matrix material which is solidified to encapsulate the fiber, as has been described in detail, the fiber may originate in liquid form, and become encapsulated nonetheless (e.g., by directing the liquid stream into the extrudate, to form a substantially coaxial liquid structure. During or after the encapsulation, the fiber solidifies spontaneously or be solidified actively (e.g., by UV curing), or permanently remain liquid.

Figures 147A, 147B:
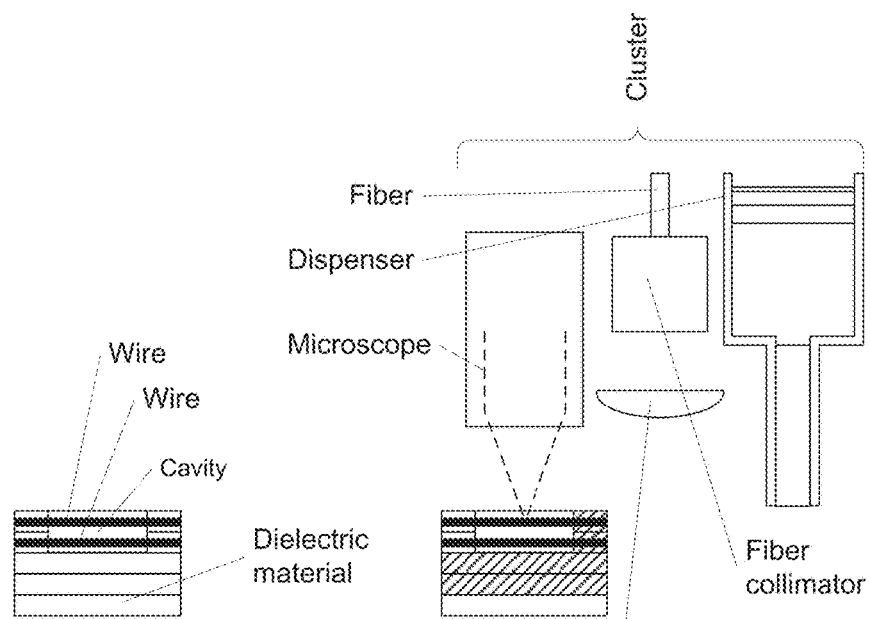

FIGS. 147(a), 147(b), 147(c), and 147(d) depict in elevation cross-sectional views a sequence for producing junctions using solder paste, reflowed by focused energy (in some embodiments, a laser, as will be assumed here, which can very rapidly produce solder joints with low intermetallics and leaching, and with fine grain microstructures, with minimal damage to other materials and components). In some embodiments, a similar process may be used for forming junctions from other materials (e.g., ECPC which is dispensed at a relatively low temperature but then is softened by heating to facilitate junction formation). While the figures depict a process for producing inter-layer junctions, a similar process may be used for producing intra-layer junctions in some embodiments. In FIG. 147(a) the precursor for an inter-layer junction is depicted, including a cavity in which two or more wires (e.g., copper, tin-coated copper) pass through. Wires need not pass entire through the cavity from one region of dielectric to another, but one or both wires may end within the cavity. Nevertheless, having the wire regions to be joined anchored on both sides can facilitate junction formation, especially if contact with the wires is required to deposit or reflow (e.g., in the case of a soldering iron tip) the solder paste, and can be helpful when reflowing using a jet of hot gas.

In FIG. 147(b), a junction-forming cluster capable of moving adjacent to a layer, comprising a source of focused energy (here, a fiber delivering a laser energy), a collimator if required to collimate the beam, and a focusing lens is provided, as well as a dispenser for solder paste and optionally, a microscope. In some embodiments, not all of these are part of a cluster and may move individually, or the fabricated part may be move relative to them. In FIG. 147(b), the microscope is positioned so the desired, target location for the junction is substantially centered on its optical axis or in another suitable, known location (e.g., the center of crosshairs). If the target location is variable (e.g., due to a non-repeatable position of the wires), this step allows for a measurement (e.g., using computer vision software) which allows for the dispenser and beam axis to be adjusted to compensate for the variability.

Figures 147C, 147D:
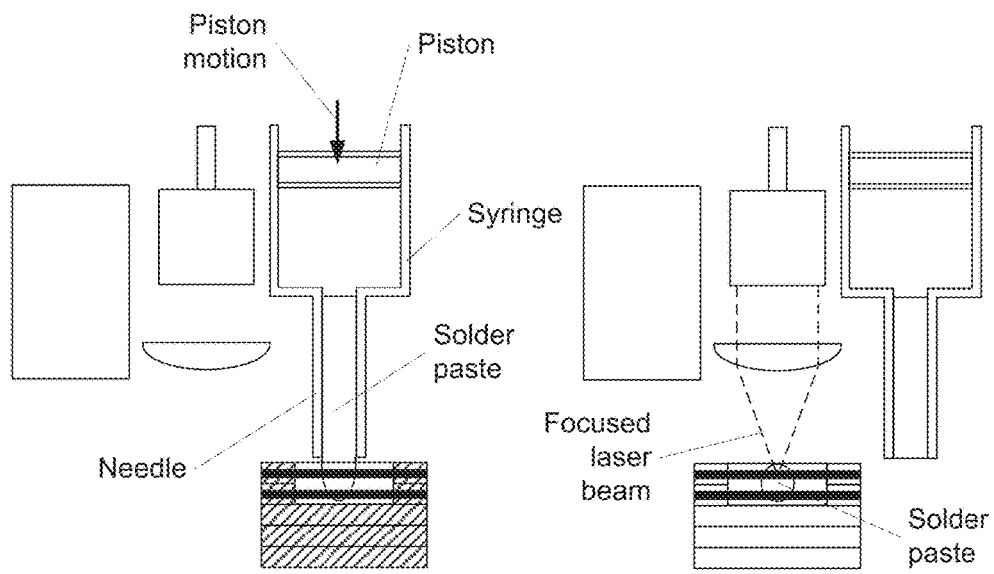

In FIG. 147(c), the cluster has moved so that the dispenser is positioned over the target. The dispenser is assumed here to comprise a syringe filled with solder paste, a piston to displace the solder paste (e.g., when moved using pneumatic pressure), and a hollow needle, though in other embodiments other dispensing methods know to the art may be used. The dispenser may be lowered slightly toward the wires in some embodiments, after which the piston is lowered to displace a small amount of solder paste through the needle onto the wires, while in other embodiments no such motion is required. Once paste is dispensed onto the wires, the cluster moves such that the laser optical axis is aligned with the solder paste as in FIG. 147(d), after which the laser is turned on briefly to reflow the solder paste.

In some embodiments, rather than apply paste to both wires in an inter-layer junction at the same time as in FIG. 147(c), paste can be applied to each wire individually, after the layer containing the wire is formed. The quantities of paste on each wire will tend to merge together before reflow. This approach may be particularly useful when forming an inter-layer junction involve greater than two wires. In some embodiment variations, the paste on each layer can be independently reflowed. In some embodiments, the wires are copper wires which are coated with a thin layer of tin to improve solderability.

In some embodiments a fume extractor (e.g., a nearby tube or an annular slot surrounding the lens connected to a vacuum source) may be used to capture soldering fumes/particulate, which can help keep the optics clean. A longer focal length lens may also be useful so that the fumes do not directly impinge on the optics. A variety of solder pastes may be used, however, no clean lead-free formulations may be preferable. Suitable pastes include QuickAlloy 5LT138LF manufactured by CyberDoc LLC (East Setauket, N.Y.), ZeroLead ZLSP manufactured by Zephyrtronics (Pomona, Calif.), and PF606-P133H manufactured by Shenmao America Inc. (San Jose, Calif.), the last of which is specially formulated for laser soldering. Junction resistances typically less than 10 milliohm are easily produced. Moreover, if a laser having a wavelength in the near infrared (e.g., 800-1100 nm) is used, the radiation will be efficiently absorbed by the solder but heating of and damage to surrounding material (e.g., thermoplastic polymer) can be minimized. A 1064 nm 6 W fiber-pigtailed laser (model LD-1064-UM-6 W from Innolume GmbH, Dortmund, Germany) is an example of a laser suitable for junction formation, though lower power lasers and lasers with other frequencies may also be suitable.

The laser energy used to form a junction may be at a fixed power level during junction formation, or may vary in time (e.g., lower initially to pre-heat the solder paste, activating the flux and pre-warming the wires, then higher to reflow the solder itself. Or, hot air, IR lamp heating, general heating of the process chamber, or other means may be used for pre-heating in some embodiments. Multiple laser pulses with various duty cycles and frequencies may also be used in lieu of continuous illumination. The laser may be raster or spiral scanned (e.g., by moving the stage on which the part is built) over area containing solder paste, wire, and/or pads during pre-heating, and laser focal spot size may be altered for purposes of pre-heating (e.g., the stage may be raised or lowered to defocus the laser).

In some embodiments, junctions produced may have both inter-layer and intra-layer characteristics. For example, on layer N there may be one wire, while on layer N+1 there may be two wires in close proximity. All three wires may then be joined by conductive material, whether solder, ECPC, or other.

Figure 148A:
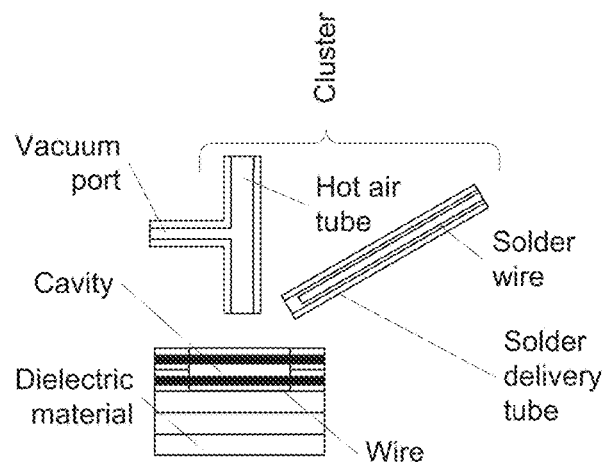
Figure 148B:
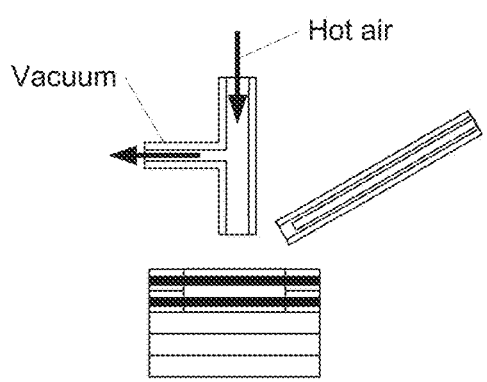

FIGS. 148(a), 148(b), 148(c), 148(d), and 148(e) depict elevation cross-sectional views of a process for producing soldered junctions wherein solid solder is dispensed and then melted by a jet of heated gas (here assumed to be air). In some embodiments, the flow of hot air may be controlled directly, while in other embodiments, hot air may be supplied continuously to the tube but is not allowed to impinge on the precursor or other portions of the fabricated article via another control method. In FIG. 148(a), an inter-layer junction precursor similar to that in FIGS. 147(a), 147(b), 147(c), and 147(d) is located beneath a cluster comprising a hot air tube (which may be equipped with an outlet nozzle, not shown), and a delivery tube containing solder in wire form. The method may however be used to solder intra-layer junctions. In the embodiment shown, the tube is equipped with a side port for vacuum. In FIG. 148(b), vacuum is applied to the vacuum port while hot air is supplied to the tube. As a result, hot air does not issue from the bottom of the tube, but is diverted substantially through the vacuum port.

Figure 148C:
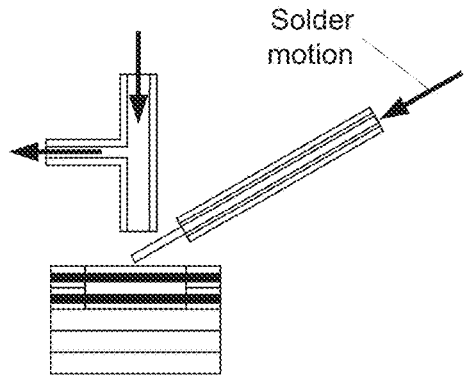
Figure 148D:
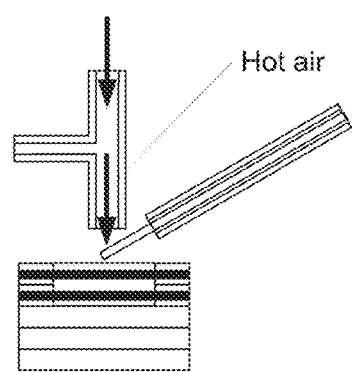
Figure 148E:
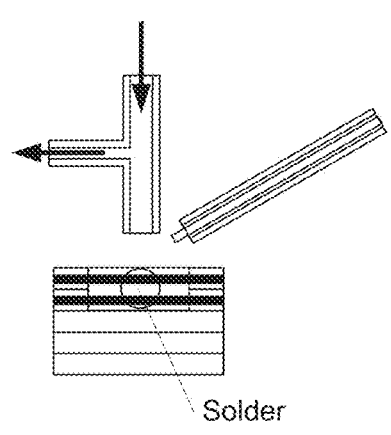

In FIG. 148(c), solder wire has been pushed out of the delivery tube such that a portion of the solder is between the hot air tube and the wires to be soldered. Simultaneous with pushing out the wire or just afterwards, the vacuum port can be switched off as in FIG. 148(d), thus allowing a jet of hot air to issue from the tube and impinge on the solder and precursor wires. In some embodiment variations, the jet may be allowed to first pre-heat the wires, before the solder wire is introduced. Shortly after the solder is heated by the jet, a drop of solder melts and detaches from the wire, where it is blown towards the wires in the precursor and envelopes them as shown in FIG. 148(e). Vacuum can be applied again to the vacuum port to divert the hot air, allowing the solder drop to cool, and forming a junction (alternatively, the cluster can be moved).

In some embodiment variations, a moveable vane (which may include a small hole) may be located between the hot air tube and the solder wire, such that moving the vane can control the flow of hot air. This may be used in lieu of vacuum. In some embodiment variations, in lieu of solder wire, solder in ball form may be delivered (e.g., by a tube) into the air stream. In some embodiment variations, flux if required may be incorporated into the solder (e.g., in a core of the wire), while in other embodiment variations, flux may be applied to the wires by dispensing through a dropper/pipette, jetting, brushing, or other means.

In some embodiments, solder may be delivered as preform (ball, foil, or other shape) to the wires to be joined, and reflowed by hot gas, contact, laser, or other methods. In some embodiments, the wires to be joined may be pre-coated with solder, in which case a source of heat and in some cases, a slight pressure to bring the wires into contact, can suffice to create a joint. In some embodiments, solder wire may be encapsulated in the extrude alongside the wire (e.g., copper) serving as an interconnect or other element. The co-encapsulated solder wire (which may be delivered adjacent to the other wire through a suitably-shaped (e.g., slot-shaped) capillary), may be placed in locations only where needed, or may be placed alongside and co-encapsulated with the other wire in general. In a cavity or other region where a junction is to be formed, the solder wire is melted to form the junction. Not all wires in a junction may require adjacent solder wire, but in these embodiments solder wire would be adjacent to at least one wire.

FIGS. 149(a), 149(b), and 149(c) depict plan views of intra-layer junctions used in some embodiments. In FIG. 149(a), two wires are made to cross one another (at 90 degrees or another angle) on the same layer; the lower wire may be displaced downwards slightly when the second wire is laid. As shown, the wires are incorporated into the extrudate of matrix material, the flow of which is interrupted in the central region so as to provide bare wires. Extrudates of pure matrix material can be provided alongside these composite extrudates as shown. In some embodiment variations, conductive material can be placed at the intersection of the wires, enveloping them. In other embodiment variations, the wires may be directly joined by heating them (e.g., laser welding, resistance welding). FIG. 149(b) depicts two wires which have been brought into close proximity—which may facilitate forming a junction—by producing bends in them. In the case shown, the wires each bend 90 degrees; however, smaller bend angles are also possible. In FIG. 149(c), the relatively small gap between the wires has been filled by conductive material (e.g., solder).

In some embodiments, motions of the capillary during encapsulation of wire (or variable wire heating) may be used to shift the wire position within the extrudate to one side or the other, reducing the inter-wire gap for intra-layer junctions, or shift it up or down in the extrudate, reducing the gap for inter-layer junctions.

Some varieties of conductive material used in junctions (or magnetic material used in magnetic structures) such as certain ECPC and SMPC formulations may be difficult to dispense using an extruder due to high viscosity, segregation of polymer binder and powder, etc. In such cases, small pre-measured quantities of material can be loaded into small compartments in a replaceable carrier and delivered to a junction as needed by merely pushing them out (with some heating of the material and in some cases, the wires, provided). FIG. 150 depicts a 3-D view of a disk-shaped carrier with a series of holes which can be filled with material. If a hole is positioned over wires, material in the hole can be pushed out (e.g., by a pin) to contact the wires and form a junction. In the figure, the disk is designed to be spun slowly using a central hole for an axis and translated. With the material holes arranged in a spiral pattern as shown, any hole can therefore be placed in the desired location. Other arrangement of holes or other compartments for material may be created, including rectangular arrays, narrow strips/tapes, etc.

In some embodiment variations, to soften the material before ejection (or even cause ejection by sufficiently melting it, obviating the need for a pin), heaters may be embedded in the carrier adjacent to each hole. For example, the carrier may be made using printed circuit board techniques and electrodes fashioned from copper on each side of each hole. Once a hole is in position, probes can make contact with the electrodes and heat the material in the holes directly through resistive heating, or indirectly if a resistive heater (e.g., nickel-chromium film) is provided adjacent to the holes. In some embodiment variations, the conductive material may be in the form of a continuous filament (e.g., circular or flat/ribbon-shaped in cross section). A portion of the filament when positioned over a junction precursor can then be broken off and "stamped out" by a moving element, pushing it into a cavity in the precursor and surrounding the wire. Similarly, conductive material may be provided in the form of a thin sheet and sections of the sheet punched out using a moving punch or "cookie cutter".

In some embodiment variations it may be desirable to continuously and globally heat the carrier so that the material is in a state ready for ejection and able to flow around the wires when forming junctions.

Figure 151A:
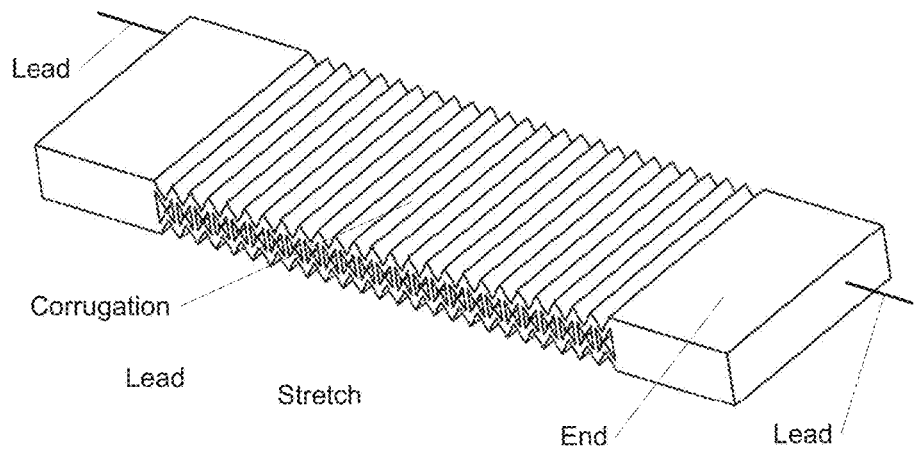
Figure 151B:
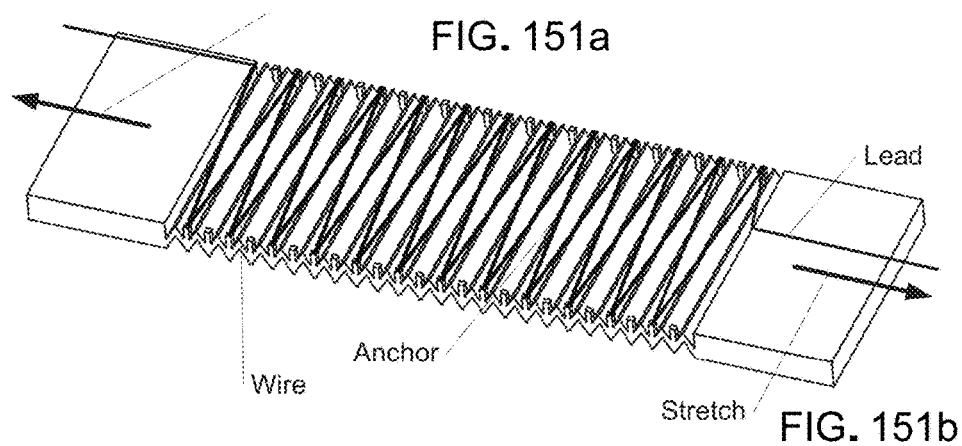
Figure 151C:
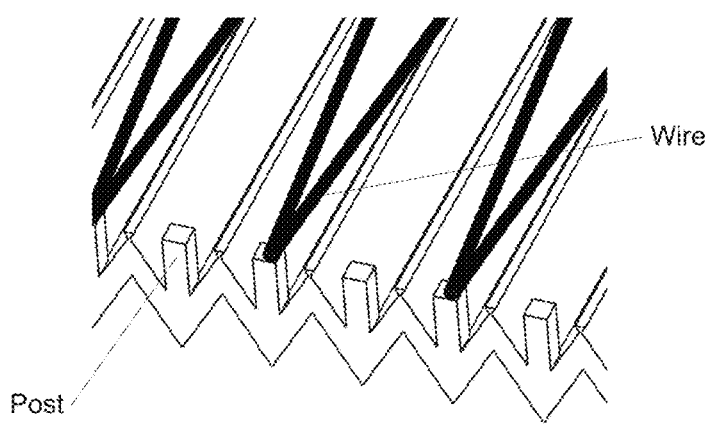

A requirement for some wearables, soft robotics, and other devices is not just flexibility, but stretchability. Thus stretchable interconnects may often be needed. The matrix material may be a highly stretchable material such as a thermoplastic or silicone elastomer with elongations on the order of 1000%. However, the elongation of straight metal wire is minimal. On the other hand, wire that is bent into a serpentine, zigzag, or other non-linear shape will be bent into a new shape when stretched, rather than be immediately put into tension. Wire interconnects can thus be incorporated into stretchable (e.g., elastomeric) structures using FEAM by forming the wire into non-linear shapes. FIG. 151(a) depicts a 3-D view of a stretchable elastomeric block with corrugations which allow it to be stretched with a relatively low force when the ends are pulled. Within the block as shown in the 3-D views of FIGS. 151(b) and 151(c) is a length of wire in a zigzag pattern. The wire continues to pass through the two ends of the block to form leads. Within the block the wire passes through anchor regions where the corrugations from top and bottom of the block converge. The wire also passes through posts located along the long sides of the block, to which the wire is temporarily anchored during the FEAM process, allowing the wire to bend sharply. When the block is stretched sufficiently, beyond the point where the posts can merely deflect, the wires break free of the posts (they are intentionally anchored only weakly by surrounding matrix material) and each "V" shaped section of wire, the vertex of which had been secured to a post during fabrication, now is free to extend, allowing a great increase in the length of the block without putting the wire into tension. Moreover, the corrugations divide the block internally into small transverse compartments, each of which contains one wire section. Thus wire sections are isolated and cannot become tangled with one another when tension on the block is released and the wire is forced to reshape itself to fit the compartment. Moreover, if the corrugations are formed at an angle to the horizontal exceeding approximately 45 degrees, there is no need for support material within the block.

Figure 152A:
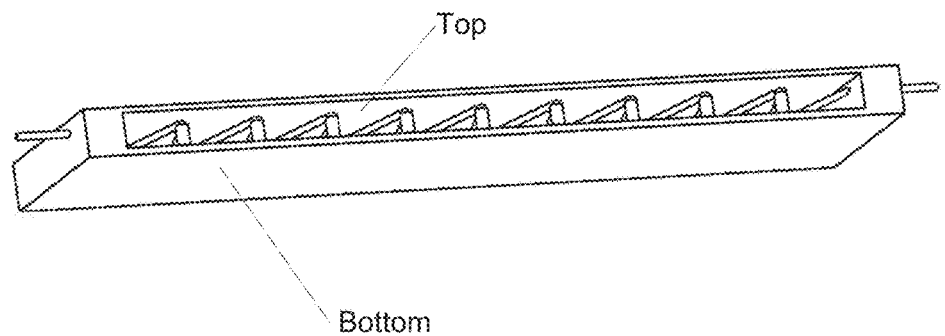
Figure 152B:
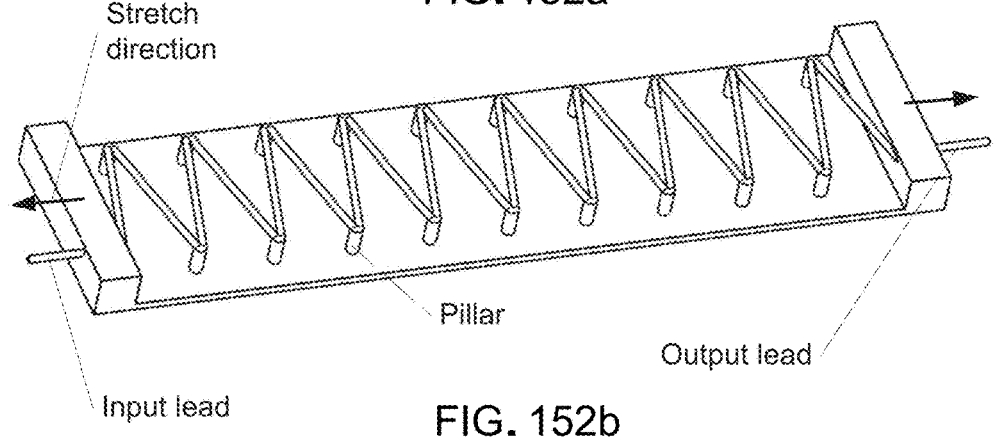
Figure 152C:
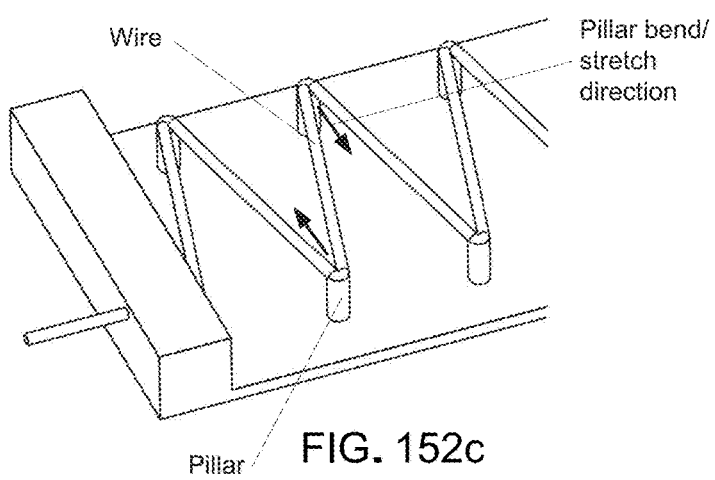

FIGS. 152(a), 152(b), and 152(c) depict 3-D views of another stretchable block, shown with top and bottom in FIG. 152(a). In this case, the block contains a hollow volume (caps on the long sides are not shown, for clarity), within which is a non-linear wire (here, a zigzag). As can be seen in FIGS. 152(b) and 152(c), the wire is attached to pillars which are themselves attached to the bottom of the block. If a serpentine shape is desired for the wire, more pillars can be used to provide temporary attachment points for the wire during the FEAM process. If the block is stretched a small amount, the pillars can deform inwards (especially if not also attached to the top of the block), allowing the wire to form a zigzag with a smaller "amplitude" and increased "wavelength". With a greater degree of stretch, the wire can pull free of the pillars and straighten out entirely if needed. It is preferable in some embodiment variations that the pillars are indeed attached to the top as well as the bottom so that when the block is allowed to shorten, the wire cannot snag on a pillar, which may cause breakage the next time the block is stretched.

Figure 153A:
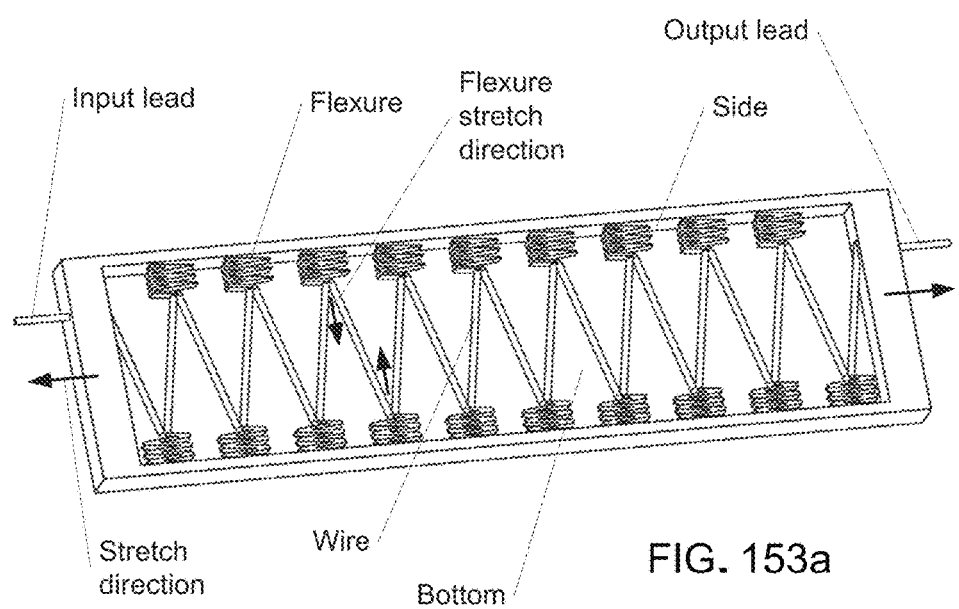
Figure 153B:
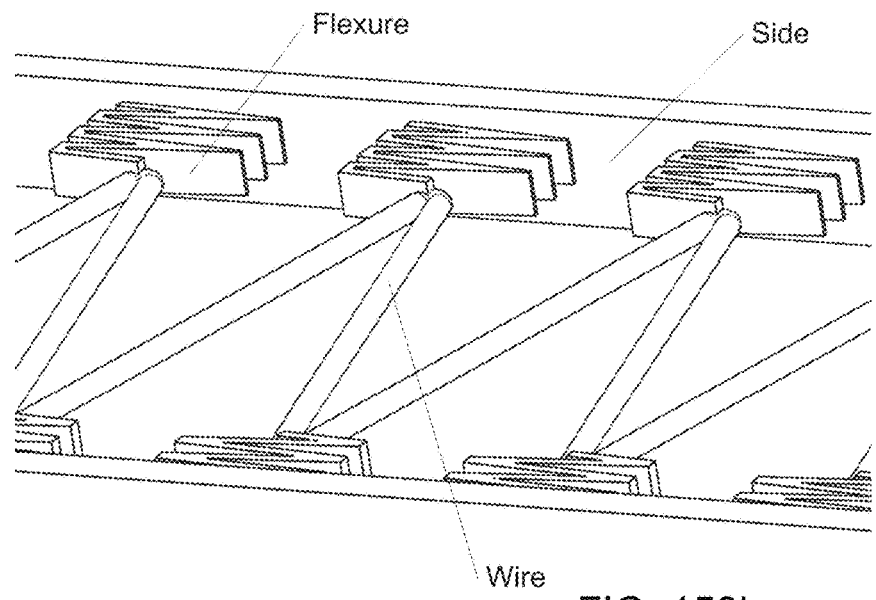

The 3-D views of FIGS. 153(a) and 153(b) depict a similar structure to that of FIGS. 152(a), 152(b), and 152(c), but in which the side caps are visible (and the top is removed to allow the inside to be seen), and the pillars are replaced by flexures which are attached to the caps. In this embodiment, stretching the block causes the flexures to stretch, such that the wire can achieve a lower amplitude and longer wavelength without breaking free (although it may still be free to do so if the block is stretched excessively). The caps themselves may deform somewhat when tension is applied to the flexures by the wire. The top and bottom and/or the caps may be corrugated to facilitate a greater degree of stretching.

Figure 154A:
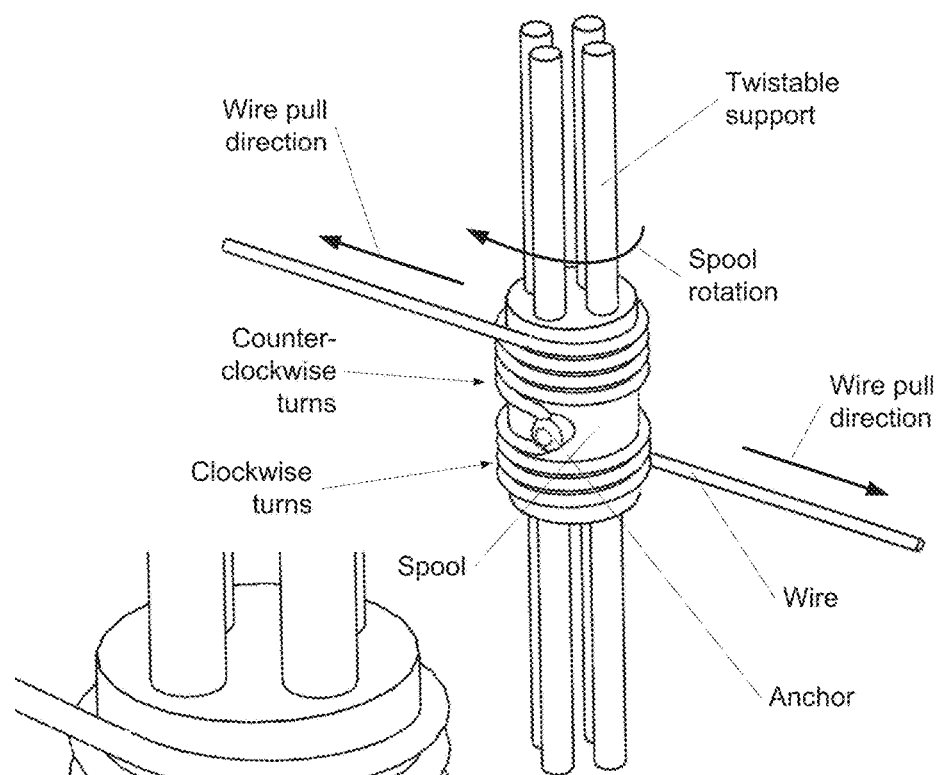
Figure 154B:
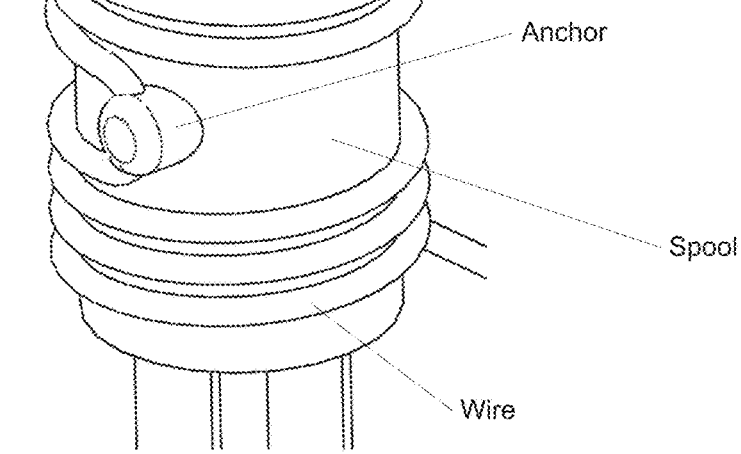

The 3-D views of FIGS. 154(a) and 154(b) depict another approach to providing a stretchable interconnect. Here, a portion of the wire away from its ends (e.g., in the middle) is wrapped both clockwise and counterclockwise around a "spool" and anchored to the spool between the clockwise and counterclockwise windings. The spool is supported so that it is free to twist around its longitudinal axis. In the figures, the spool supports comprise a set of thin flexible rods; however, spiral or helical springs (e.g., of two different handedness) printed in flexible material, and other twistable structures may be used. When the unwound portions of wire are put into tension, the spool is forced to rotate in the direction shown, unwinding wire from the spool in both directions, thus allowing the wire to lengthen. When tension is released, the spool then rotates in the opposite direction, "reeling in" the wires. In effect, the spool acts as a retractable reel. The entire structure can be fabricated using FEAM.

Approaches to allowing stretchability such as those in FIGS. 151(a), 151(b), 151(c), 152(a), 152(b), 152(c), 153(a), 153(b), 154(a), and 154(b) which incorporate extra wire within the printed structure, can also be used to allow for inter-layer interconnects/junctions. If there is extra slack available in a wire on a given layer A and access is provided to it through a channel or other opening, then on a subsequent layer B, a portion of the wire on layer A can be pulled through the opening and brought vertically or at another angle through the structure to arrive at another layer, where it can for example be joined to a wire or component pad on layer B.

FIGS. 155(a), 155(b), and 155(c) depict 3-D views of the front of the WDS (a.k.a., wire feeder/cutter) such as that shown in FIGS. 139(a), 139(b), 139(c), 139(d), 139(e), 139(f), 139(g), and 139(h). The downstream capillary typically must extend past the end of the base plate. However, if the capillary is thin, it can readily be deflected by tension on the wire (once the wire is anchored within the fabricated layer), which can have a deleterious effect on horizontal wire centering. Therefore, it is desirable to stabilize the capillary horizontal position (the vertical position may also be important to stabilize). In FIGS. 155(a) and 155(b), guy-wires have been added between the base plate and the distal end of the capillary. When in tension, the guy-wires minimize capillary deflection, yet do not interfere with printing. Alternatively, as in FIG. 155(c), at least one gusset (two are shown) may be bonded (e.g., welded) to the capillary to stabilize it. In lieu of gussets and guy-wires, the capillary itself can be fashioned from plates (e.g., two grooved plates, or one grooved plate and one flat plate) which sandwich the wire; such plates are much stiffer and therefore more resistant to horizontal bending. Since the capillary cannot be as small on its interior as the wire, there is always some clearance between the two, which may allow the wire position to change within the extrudate. This can be addressed in some embodiments by slightly underfeeding the wire (i.e., feeding it at a lower speed than the tangential speed of the nozzle) so as to keep it in mild tension.

FIGS. 156(a), 156(b), 156(c), and 156(d) depict in elevation cross-sectional views a sequence for backfilling a printed cavity with a powdered material, such as creating a soft magnetic structure using powdered iron or steel. In some embodiment variations, a cavity can be filled with powder only (then capped), while in other embodiment variations, the cavity can be filled with a liquid as well as a powder (then capped), while in still other embodiment variations, the cavity can be filled with a solidifiable material which binds the powder, as well as a powder (then capped or left open). Suitable solidifiable materials include thermoplastic and thermoset materials, photo-cured (e.g., UV-cured) materials, adhesives, etc. For example, low-viscosity waxes (e.g., paraffin, beeswax, Crystalbond 555 (Aremco Products Inc., Valley Cottage, N.Y.)) may be used, as well as higher-viscosity thermoplastics. Thermoset materials such as two-part epoxies and urethanes (typically low viscosity) can also be used, as can gelling materials and agents such as gelatin or agar solution, and heat-setting materials such as albumin. In the case of materials such as urethanes which require mixing two or more parts together, it is problematic to incorporate in a FEAM system a mixer which combines the materials while in contact with system components. This is because if use of the materials is intermittent (as it would be for creating magnetic structures), then unless those components are cleaned/flushed soon after mixed material has contacted them, the material can solidify and make them unusable. Therefore, point-of-use, non-contact mixing is highly desirable.

Figures 156A, 156B:
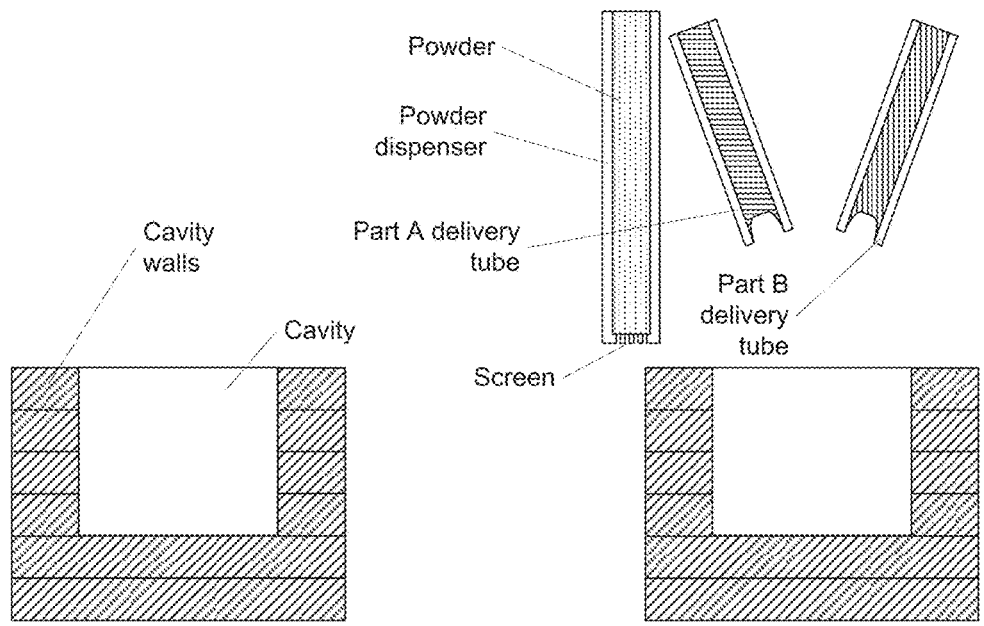
Figures 156C, 156D:
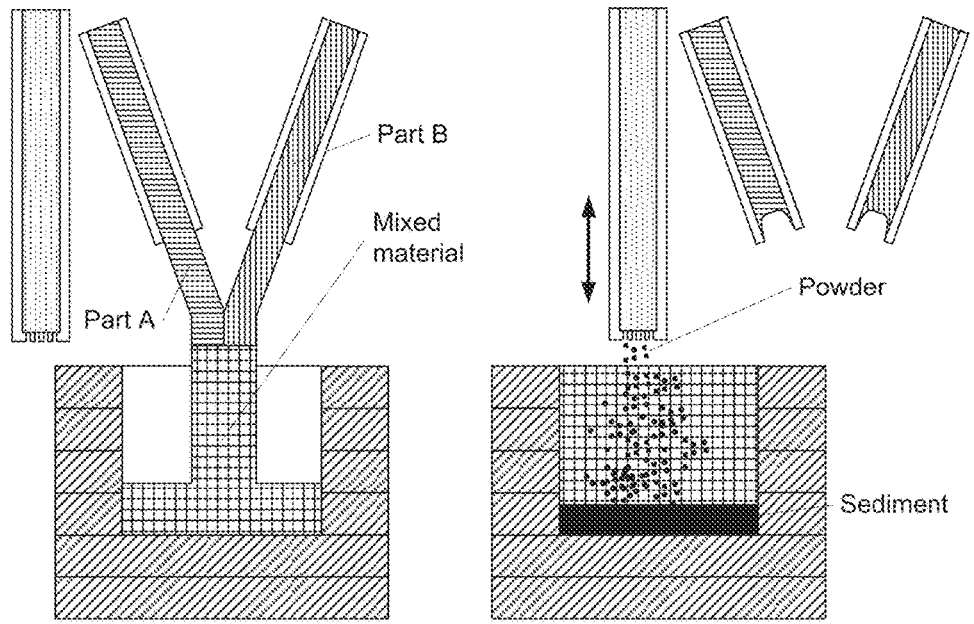

The cavity is shown in FIG. 156(a), while in FIG. 156(b) three delivery tubes are shown having moved so that two of them are above the cavity. These two tubes are intended to deliver parts A and B of a two-part solidifiable liquid such as a quick-setting hard or elastomeric urethane. Mixing may be accomplished in at least two ways. In the first, liquids A and B merely fall into the cavity and intermix within it. In the second, as shown in FIG. 156(c), liquid streams or drops (e.g., if the liquid has been jetted using pulsed/drop-on-demand or continuous jet approaches) A and B collide in mid-air en route to the cavity. The collision encourages intermixing such that the liquid entering the cavity is already reasonably mixed, and depending on setting time, inter-diffusion can accomplish the rest. If the Reynolds number is high so the flows are turbulent even before collision, additional mixing may occur. After filling the cavity with mixed liquid, a dispenser such as a tube equipped with a screen (as depicted) or cap at it lower end and filled with powder is positioned above the cavity. Vibrating or shaking the tube horizontally and/or vertically allows powder to be dispensed through the screen, as would briefly opening a cap. Powder entering the mixed liquid, assuming low enough viscosity, can settle to the bottom of the cavity due to its higher density, forming a reasonably dense sediment.

The method of FIGS. 156(a), 156(b), 156(c), and 156(d) is not limited to materials mixed from multiple (two or more) parts, and can be used with single-part materials such as waxes which are introduced while hot and low viscosity, then allowed to harden as they cool, etc. In some embodiments, binders with high surface tensions and which are allowed to evaporate can help pull particles together into a compact, high-density mass. The method of FIGS. 156(a), 156(b), 156(c), and 156(d) can be performed with cavities that are of the desired depth, or with cavities which are gradually printed and filled (e.g., one or a few layers at a time).

FIGS. 157(a), 157(b), 157(c), and 157(d) depicts in cross-sectional elevation views a method for incorporating solid objects such as balls for built-in ball bearings (assumed here), magnets, balls of conductive material such as ECPC, solder preforms, electronic components, etc. within a printed structure. Useable ball bearings (e.g., for rotary motors) can be built using FEAM by incorporating such balls in races which are lined with hard or lubricious fibers/wires (similar to FIGS. 76(a), 76(b), 76(c), and 76(d)), are made from hard (e.g., filled) polymers, etc. In FIG. 157(a), a cavity has been left in a printed structure (typically one only partially built). Above the cavity has been positioned a dispenser filled with balls. The dispenser has an offset opening at its bottom, and a moveable pin/plunger which can push balls above the opening (FIG. 157(b)) and allow them to fall out of the dispenser (FIG. 157(c)). If friction is inadequate to prevent balls from moving above the opening on their own, a flexure can be provided whose restraining force is overcome by pin motion. In FIG. 157(d), the pin has retracted, allowing the next ball to come into a position (via gravity or a spring) where it can be dispensed by the next movement of the pin, once the dispenser has moved to another position. In addition to balls In some embodiments, a method for producing magnetic structures may be used which involves dispensing small, solid pieces of magnetic material of standardized shape and arranging them to form a volume of the desired shape. These pieces, or blocks, can in some embodiment variations fill a cavity, or be held together by a binder/matrix which is applied to them or around them. For example, to create a solenoid plunger/core, a cavity can be created in the printed structure, and small space-filling or nearly space-filling blocks of iron or other soft magnetic material can be introduced into the cavity. A dispenser similar to that of FIGS. 157(a), 157(b), 157(c), and 157(d) may be used, or other dispensers or positioners may be used (e.g., pick and place approaches using vacuum cups, electromagnets, etc.). One example of a space-filling structure that could fill a rectangular cavity of suitable dimensions is a cube (e.g., 1 mm on a side), and if the cavity is deeper than the side of the cube is long, multiple "layers" of cubes may be inserted into the cavity until it is filled. If cavities normally have standardized or minimum depths (e.g., if solenoids are always made with plungers of a certain axial length), widths, or lengths, then shapes which are not equiaxed such as rectangular, triangular, or hexagonal prisms may allow for more efficient packing. Dimensions of blocks may be made to be integer multiples of layer thickness, although accommodation may be made for binder or adhesive thicknesses. In the case of a solenoid, since the magnetic flux is axial, it is desirable to use elongated blocks which are arranged parallel to the solenoid axis, minimizing air gaps along this axis which increase reluctance.

In some embodiment variations, shapes may be provided in continuous form (e.g., a wire or rod) and are cut to fit as they are dispensed. In some embodiment variations, if a shape is not itself space filling, and a high volume fraction of the material comprising the shape is desirable, then multiple polyhedra which together are space-filling may be used (e.g., tetrahedra and octahedra). In some embodiment variations, deposited blocks may be simply placed and then captured in the desired configuration by capping a cavity or depositing material around them. In other embodiment variations, blocks may be bound by applying a binder/adhesive to them as they are placed (e.g., via roller, brush, dipping, or spray), be manufactured with surfaces coated with adhesive (a pressure-sensitive adhesive, an adhesive that is activated during dispensing, etc.), coated with solder or a heat-activated adhesive such as low-viscosity epoxy so they can become bound together (they can be briefly heated as deposited by a laser, for example), be manufactured with mechanical interlocking features (e.g., such as LEGO® blocks), etc. In other embodiment variations, they may have features such as re-entrant "arrowheads" at their lower ends, and pressed into the cavity or on a surface of a layer while hot such that the lower ends penetrate into the material below them (assuming it is reflowable such as a thermoplastic) and capture the blocks, or an adhesive layer may be applied to the cavity bottom or layer surface to bind the blocks from their lower ends. In other embodiment variations the blocks can include features which lock onto wires which are exposed below or around them, or can be soldered to them. In yet other embodiment variations, they may be bound by placing them and then infiltrating them with a preferably low-viscosity binder, which may wick into small gaps between the blocks via capillarity, or inserting them into a cavity filled with a liquid binder. In such cases, the blocks may be provided with modified shapes which don't completely fill space, and which allow for infiltration (e.g., grooves or textures on surfaces, radiused or chamfered edges). In some embodiment variations, blocks are not bound, but simply placed in a cavity which is then capped (e.g., by depositing more structural material over them), capturing them.

FIGS. 158(a) and 158(b) depict elevation cross-sectional views of a piloted, normally-closed solenoid valve that may be produced with FEAM. A piloted valve can handle high pressures yet be actuated with a relatively low force solenoid. In FIG. 158(a), the solenoid plunger is down, held there by both a lower and upper elastomeric element. In this position, the plunger blocks the pilot hole of a diaphragm which rests on an annular seat, such that the valve is closed. When the solenoid is energized, the plunger need only provide enough force to lift the plunger off the pilot hole in the diaphragm, after which fluid pressure will equalize on both sides of the diaphragm, lifting it and allowing fluid to flow through the channel (FIG. 158(b)).

FIGS. 159(a), 159(b), 159(c), 160(a), 160(b), 160(c), 161(a), 161(b), 161(c), 161(d), 162(a), 162(b), 162(c), 163(a), and 163(b) depict 3-D views, some in cross-section, of fluidic actuators which may be produced monolithically with FEAM, using elastomeric materials and in some cases, rigid materials. Temporary, preferable easily removable (dissolvable, friable, and/or meltable) support materials may also be used during fabrication. The actuators can use valves of the kind shown in FIGS. 158(a) and 158(b), and may use two in a valve assembly, for example: one for inlet and one for exhaust. Actuators may be combined together, and may share common inlet plumbing (e.g., a common pressure source) and exhaust plumbing; in some embodiments plumbing may be integrated into the device. Some actuators incorporate rigid plates or other elements at their ends or elsewhere as part of the design.

Figure 159A:
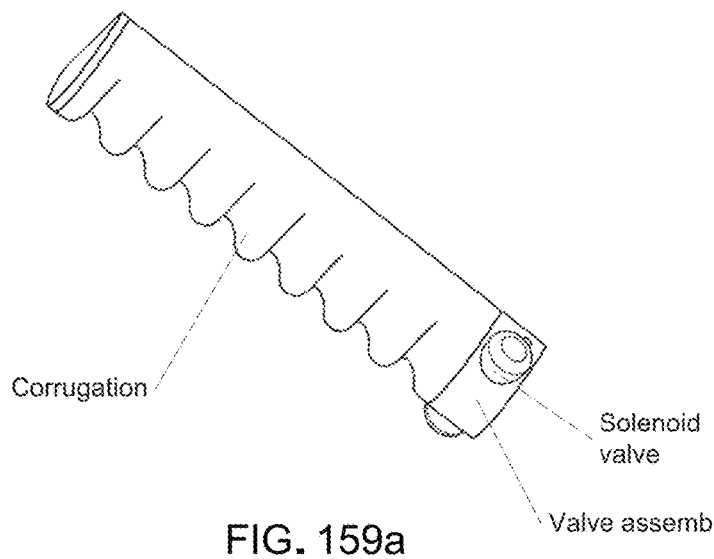
Figure 159B:
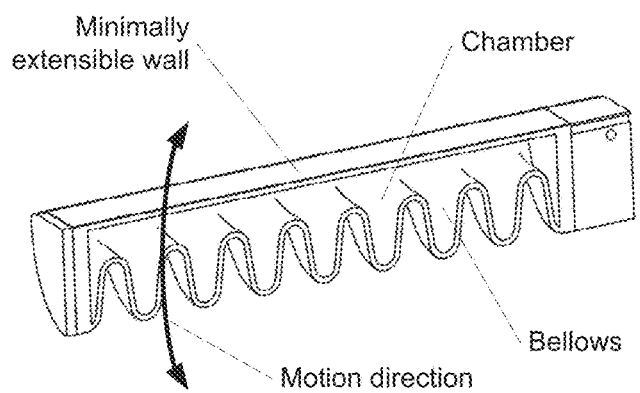
Figure 159C:
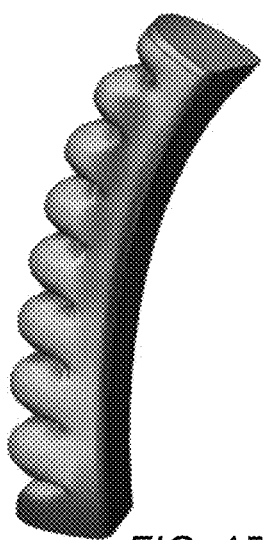

In FIGS. 159(a), 159(b), and 159(c) a bending actuator is shown. On one side of it is a wall which is minimally extensible, and may contain fiber/wire reinforcement (in the case of wires, they may serve a dual purpose in also transmitting signals through the device, e.g., to control a valve in another device). On the opposite side is a corrugated, bellows-like surface. Between the two is a chamber which is filled with fluid, causing bending away from the bellows side as shown in the finite element analysis simulation of FIG. 159(c).

Figure 161A:
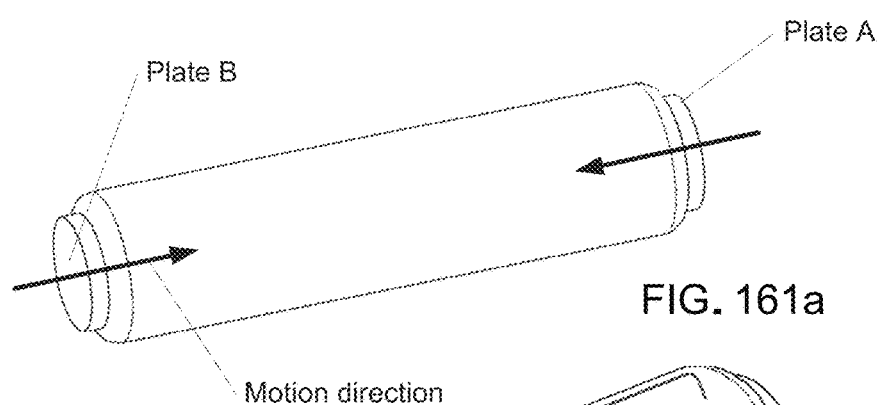
Figure 161B:
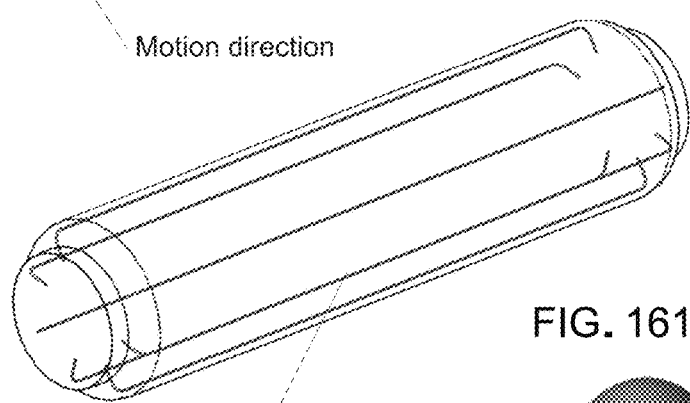
Figure 161C:
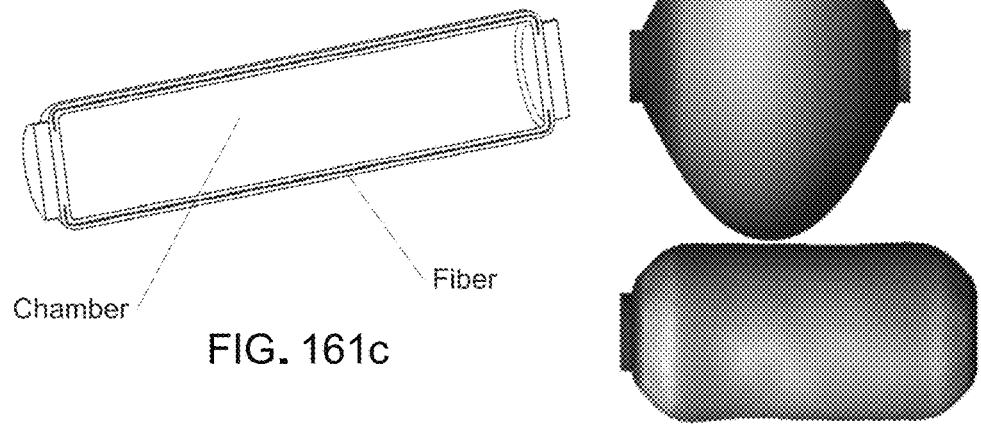
Figure 161D:
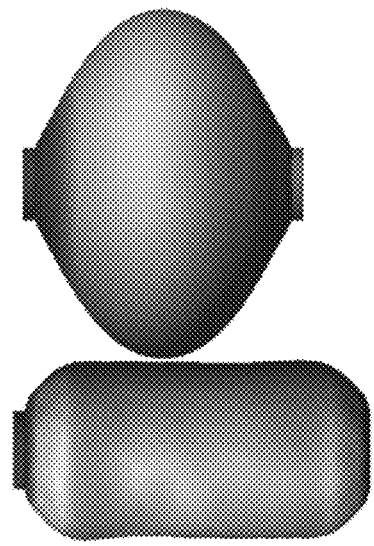

FIGS. 160(a), 160(b), and 160(c) show an extending actuator which grows in length when inflated, as shown in the simulation of FIG. 160(c). FIGS. 161(a), 161(b), 161(c), and 161(d) show a shortening/contracting, muscle-like actuator, somewhat similar to a McKibben air muscle, but using either no reinforcing fibers or longitudinal ones. FIG. 161(b) shows the muscle with multiple axial fibers arranged circumferentially around the device; two of these fibers can be seen in the sectional view of FIG. 161(c). FIG. 161(d) shows a simulation (top) of the device without fibers when inflated, while the bottom simulation shows the device with fibers when inflated.

Figure 162A:
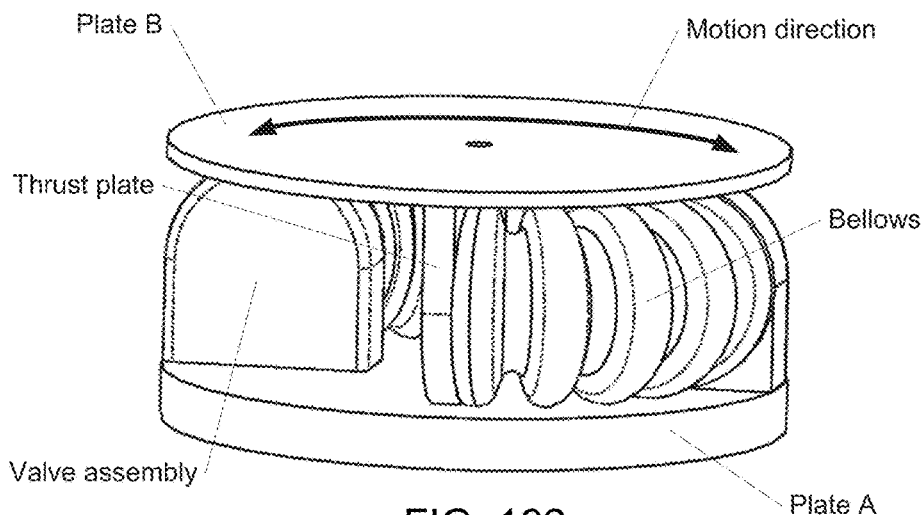
Figure 162B:
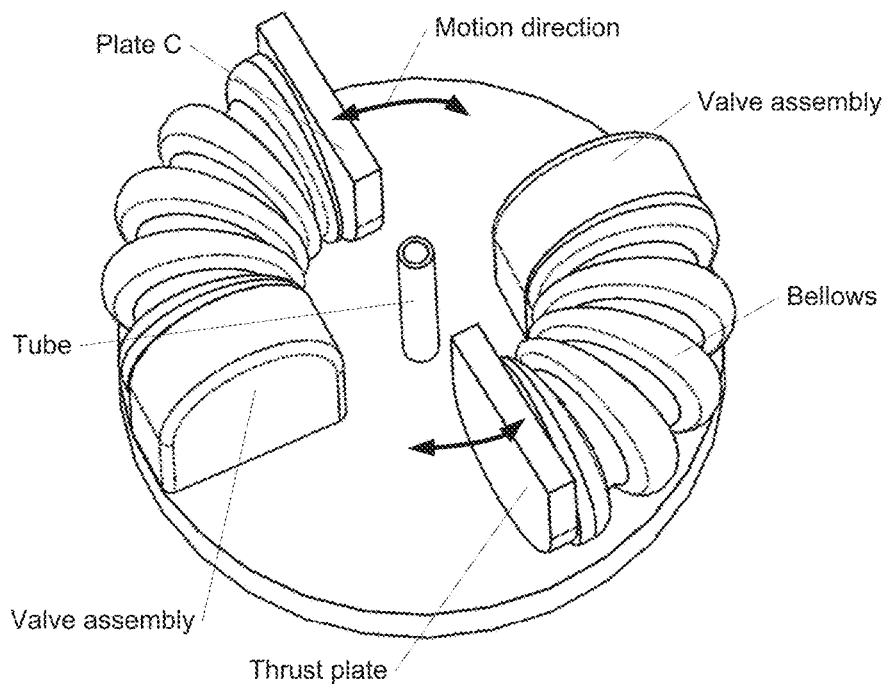
Figure 162C:
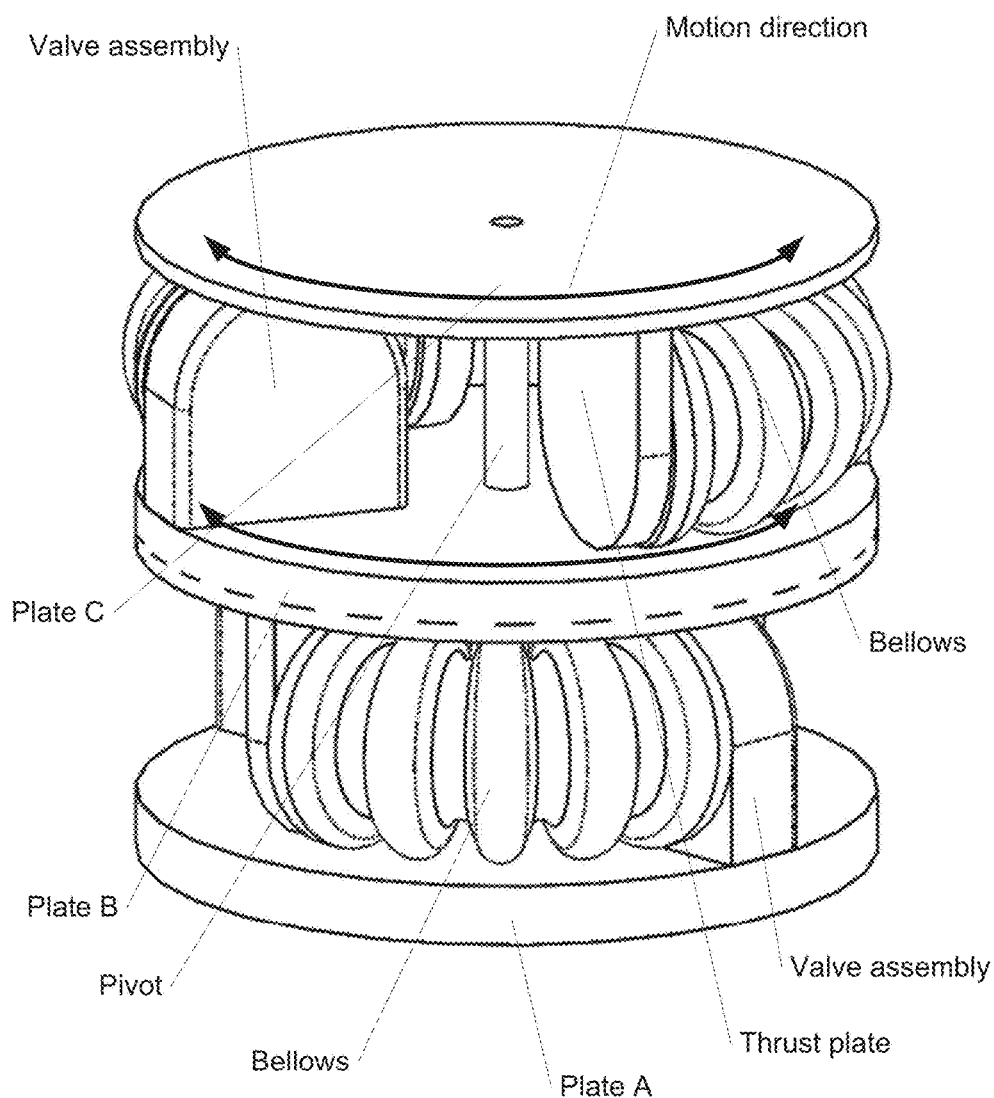

In FIGS. 162(a), 162(b), and 162(c) a rotary actuator is shown. The device comprises at least two extension actuators similar to those of FIGS. 160(a), 160(b), and 160(c) (though two shortening actuators like those of FIGS. 161(a), 161(b), 161(c), and 161(d) may alternatively be used) but with curved longitudinal axes. The valve assemblies of the actuators are fixed to plate A, and the actuator creates a rotation of one plate (plate B) relative to another (plate A) by applying forces to thrust plates attached to plate B (FIG. 162(b): a section view with Plate B removed). The two actuation units can work in "parallel" creating larger torque, or antagonistically, creating the ability of reversing the rotation as well as adjusting the rotational stiffness. The range of motion can be extended by stacking several actuators as seen in FIG. 162(c). The central flexible tube (which allows for twisting) allows for pressurized air and valve control signals to be transmitted to serially-connected actuators of the same or different configuration.

Figure 163A:
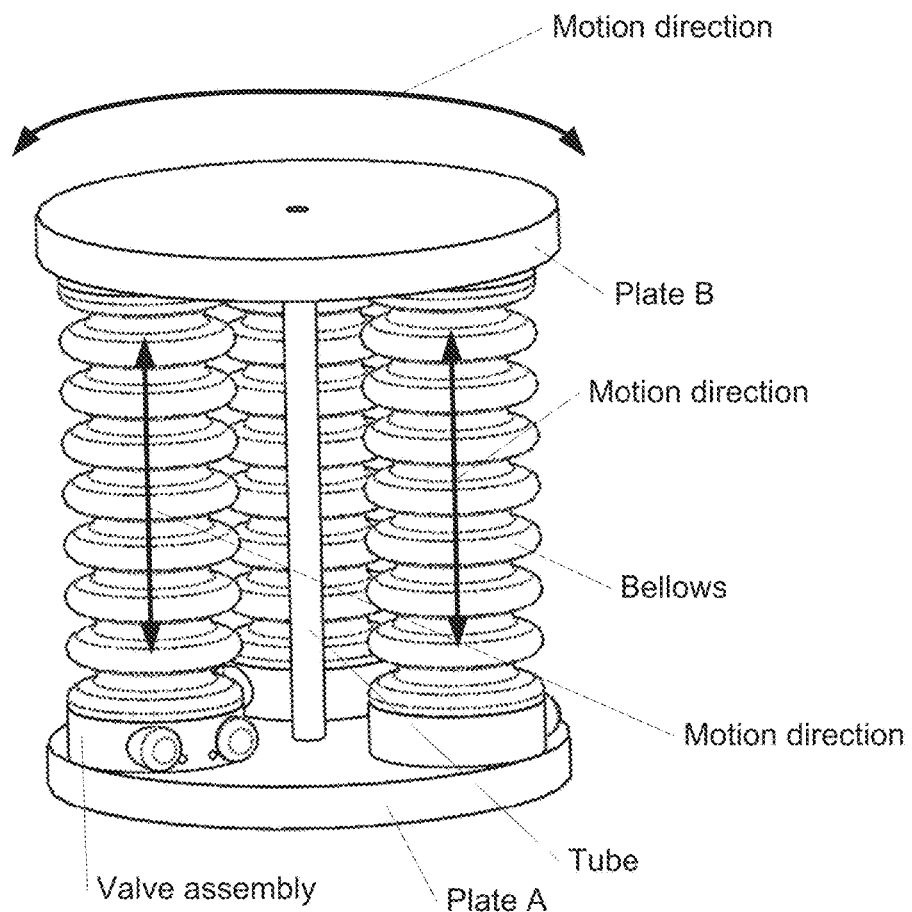
Figure 163B:
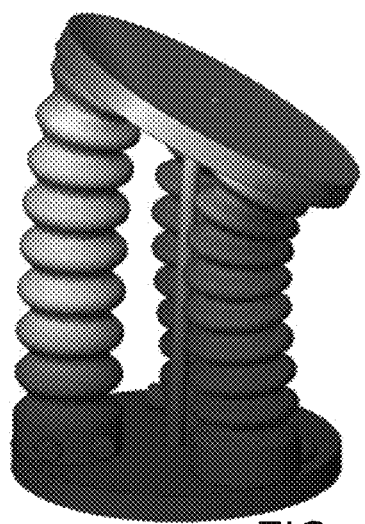

FIGS. 163(a) and 163(b) depict a group of actuators such as those of FIGS. 160(a), 160(b), and 160(c) (though two shortening actuators like those of FIGS. 161(a), 161(b), 161(c), and 161(d) may alternatively be used) to form a three degree-of-freedom device which can both tilt plate B in any direction relate to plate A by different angles, or change the distance between plates A and B. FIG. 163(b) depicts a simulation with plate B tilted. The central tube, flexible to allow for bending and changes in length, also allows air and signals to be transmitted further on.

Figures 164A, 164B:
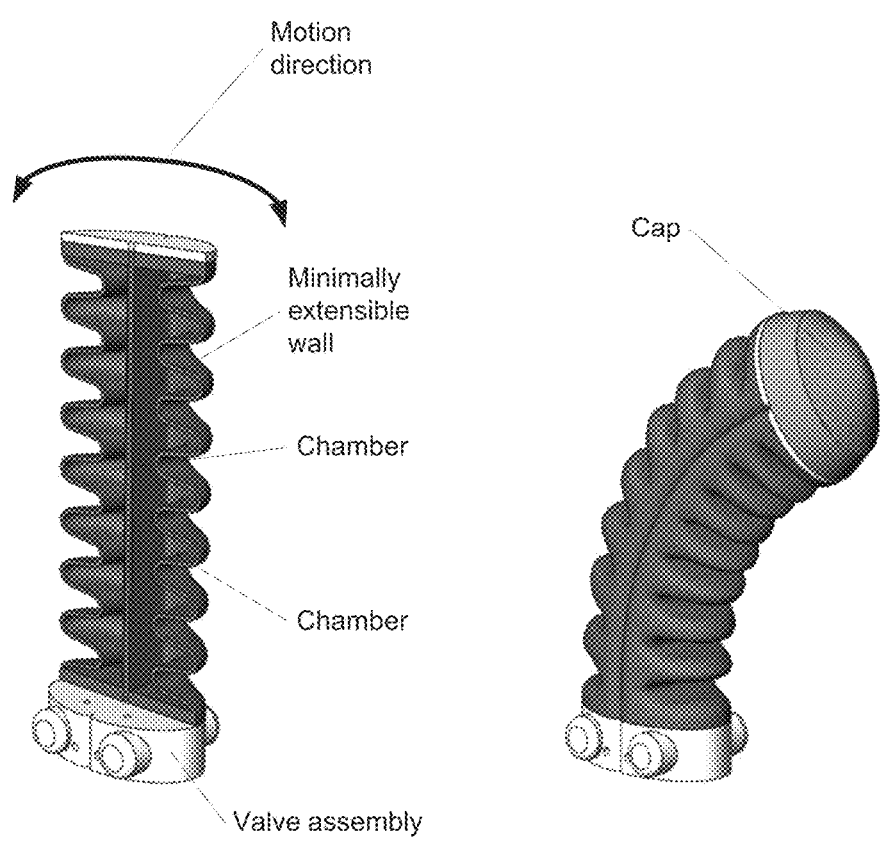

FIGS. 164(a) and 164(b) depict a dual-direction bending actuator with two chambers separated by a minimally extensible wall (forming a "spine"), allowing bending in a plane in either direction (whereas the actuator of FIG. 159 only allows bending in one direction). Actuators able to bend in any direction (not just in a plane) can similarly be fabricated, using three or four actuators surrounding a minimally extensible central core. The actuator may be provided with an optional cap (FIG. 164(b)).

Figure 165:
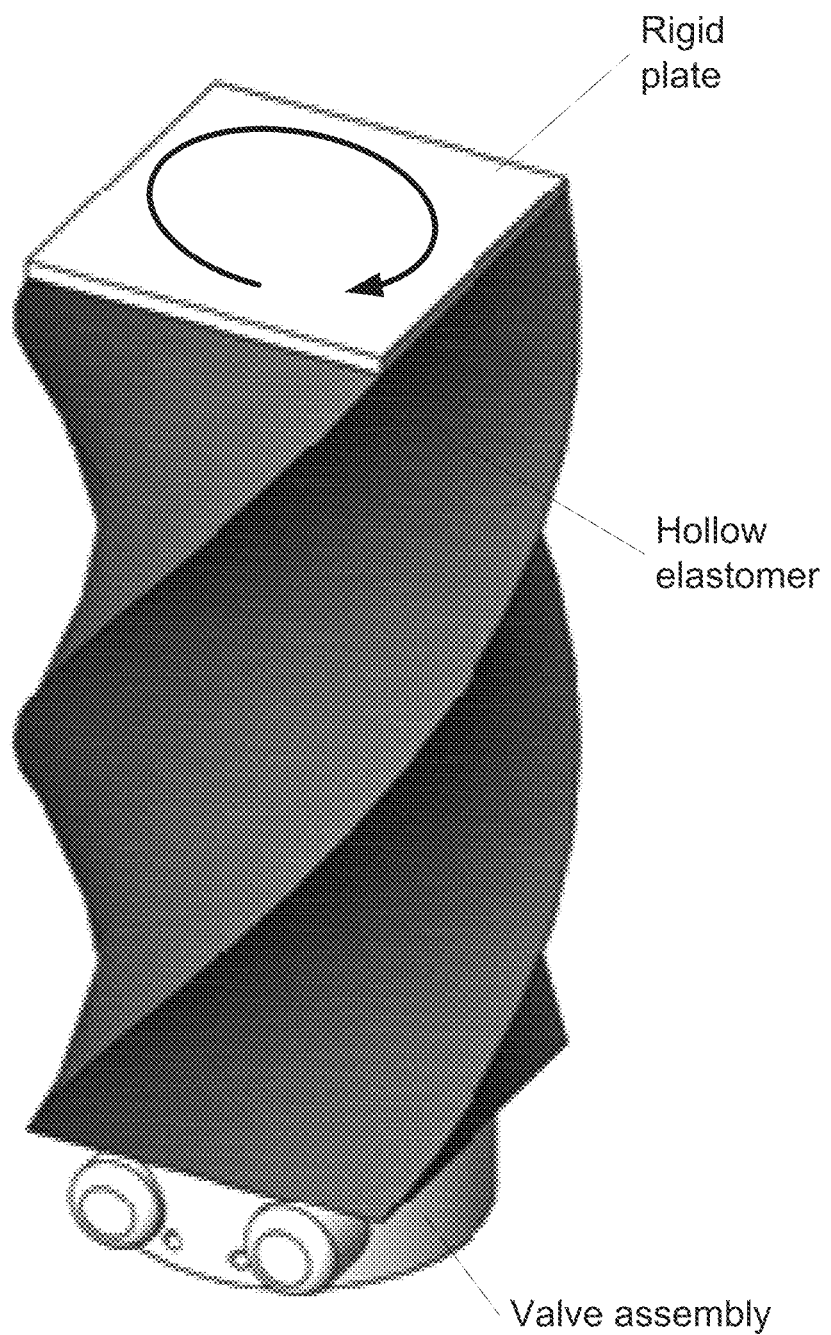

FIG. 165 shows an actuator fabricated in a hollow, twisted shape. When inflated, the rigid plate at the top untwists itself through a small angle as shown, with a minimal change in overall length of the actuator.

FIG. 166 depicts several of the actuators described above, joined together to form a robot arm. Joining may be done after fabricating each module separately, or the entire arm may be monolithically fabricated.

In the elevation view of FIG. 167, a solenoid is shown in which the windings on each layer are joined together by a conductive material such as solder or ECPC, and the junctions are staggered from layer to layer. The conductive material should not extend too much past a layer junction, so as not to interfere with depositing the next layer or risk shorting to an adjacent wire.

Figure 168A:
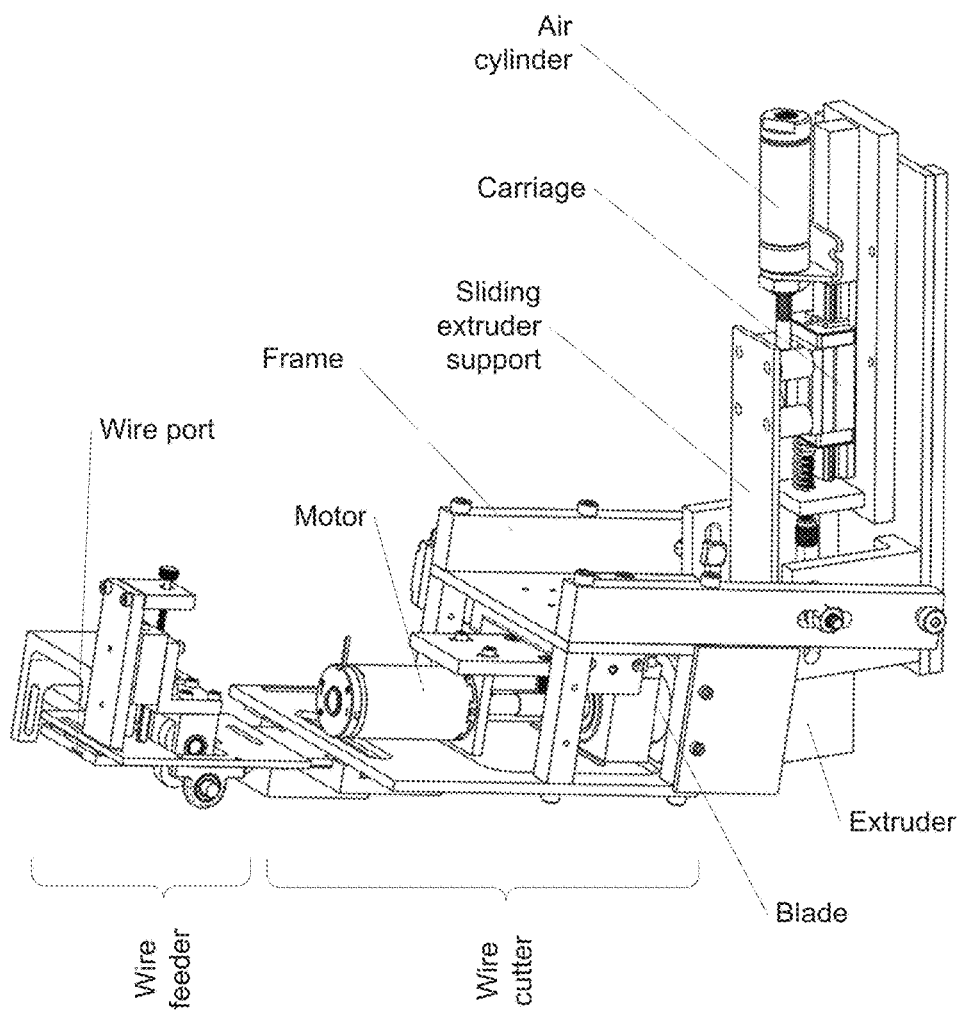
Figure 168B:
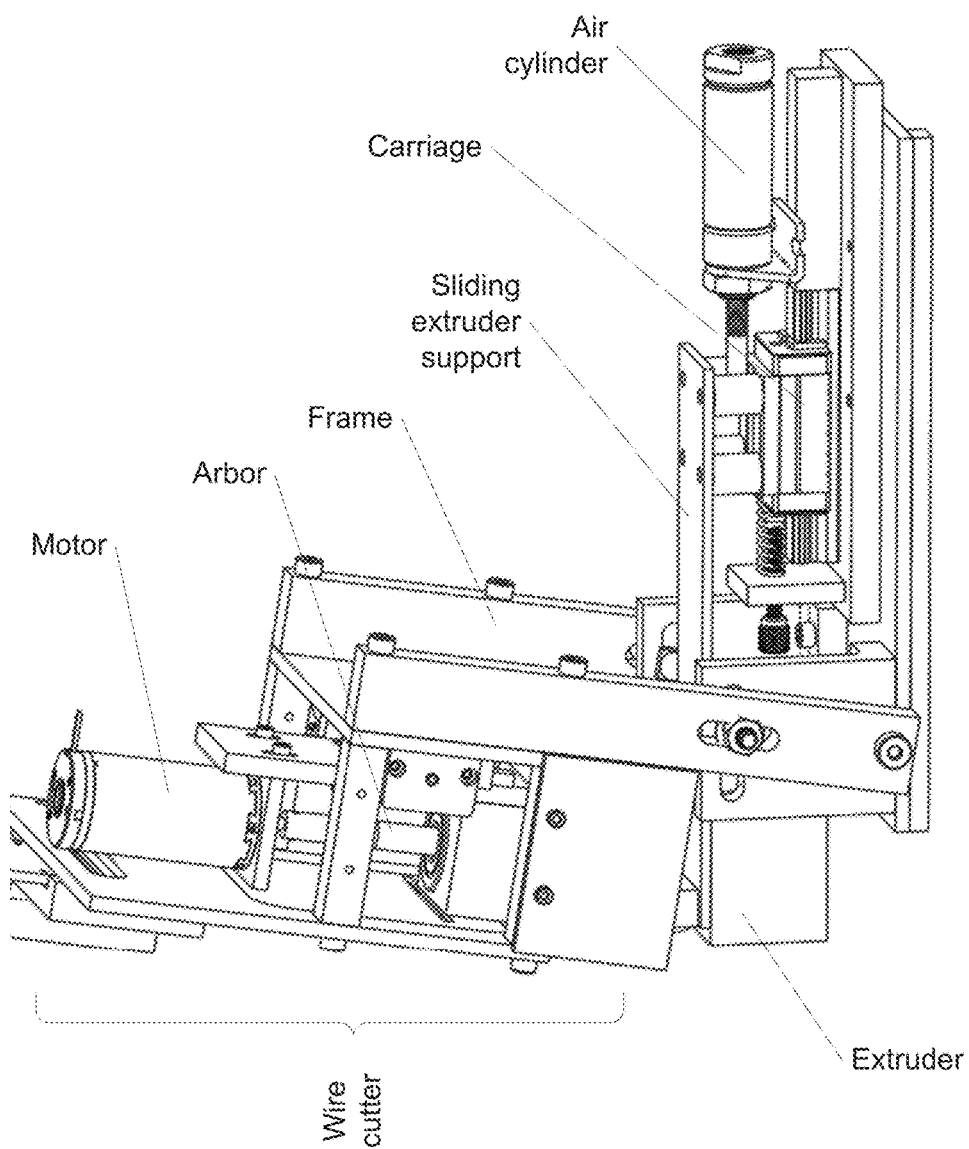
Figure 168C:
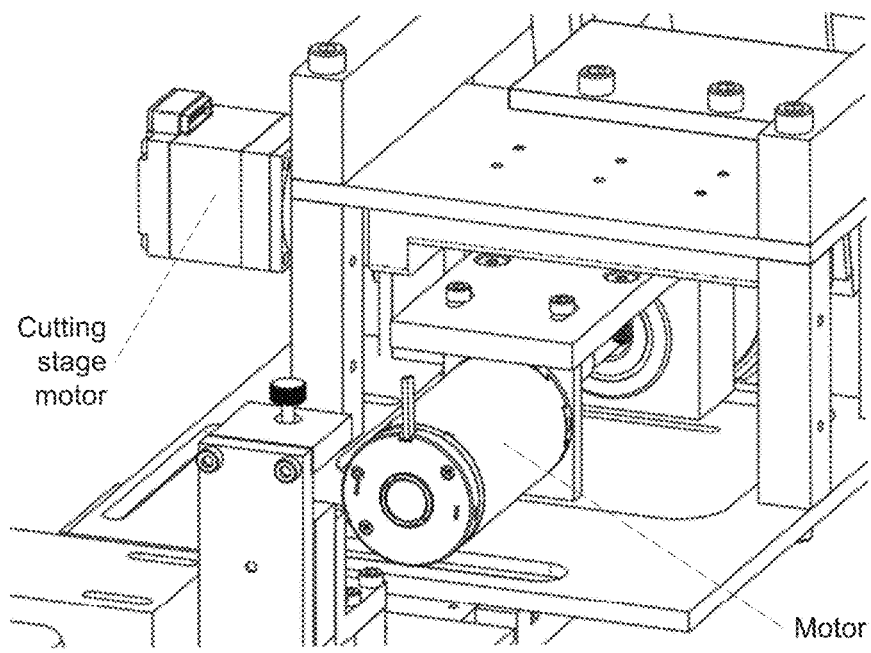
Figure 168D:
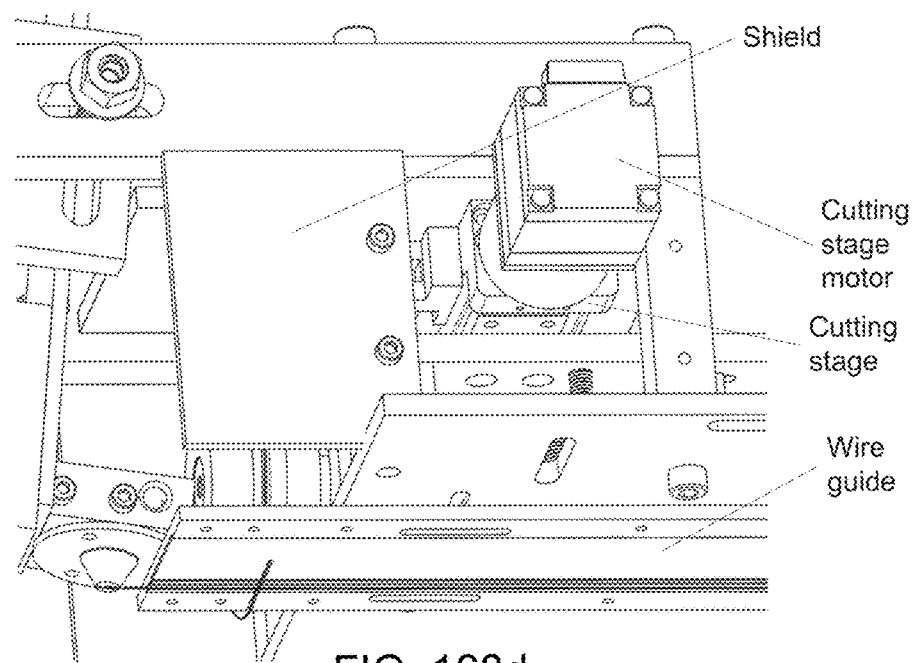
Figure 168E:
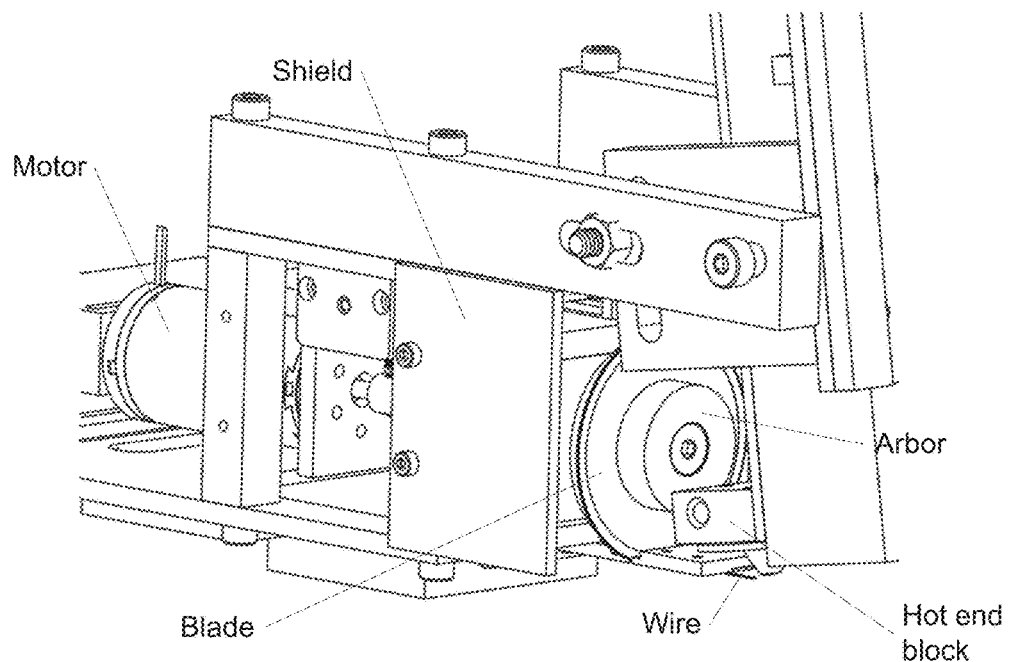
Figure 168F:
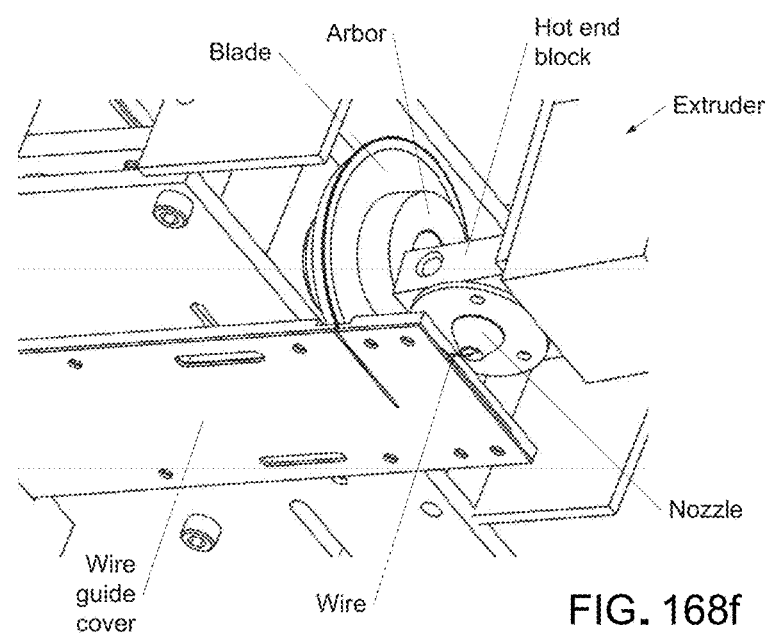
Figure 168G:
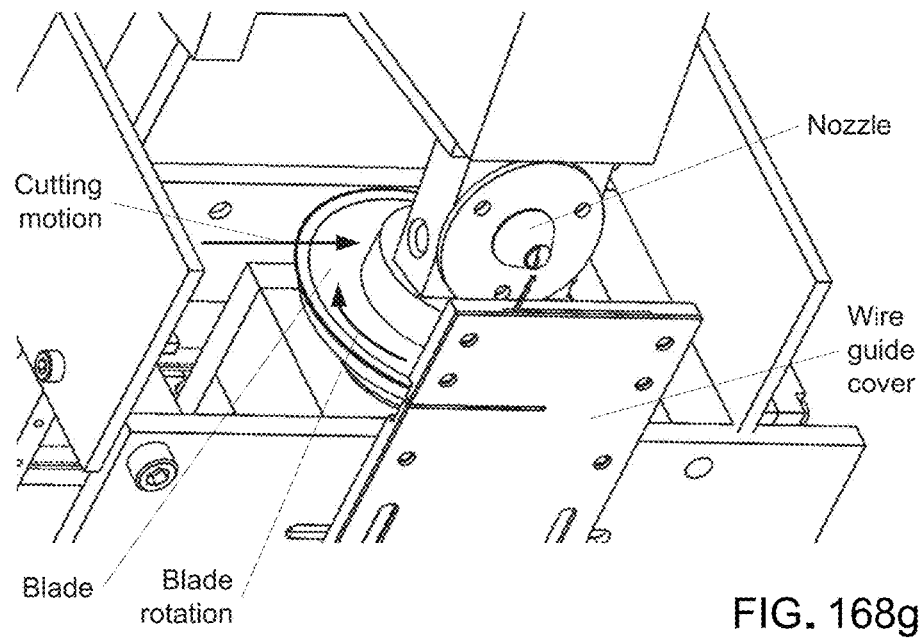
Figure 168H:
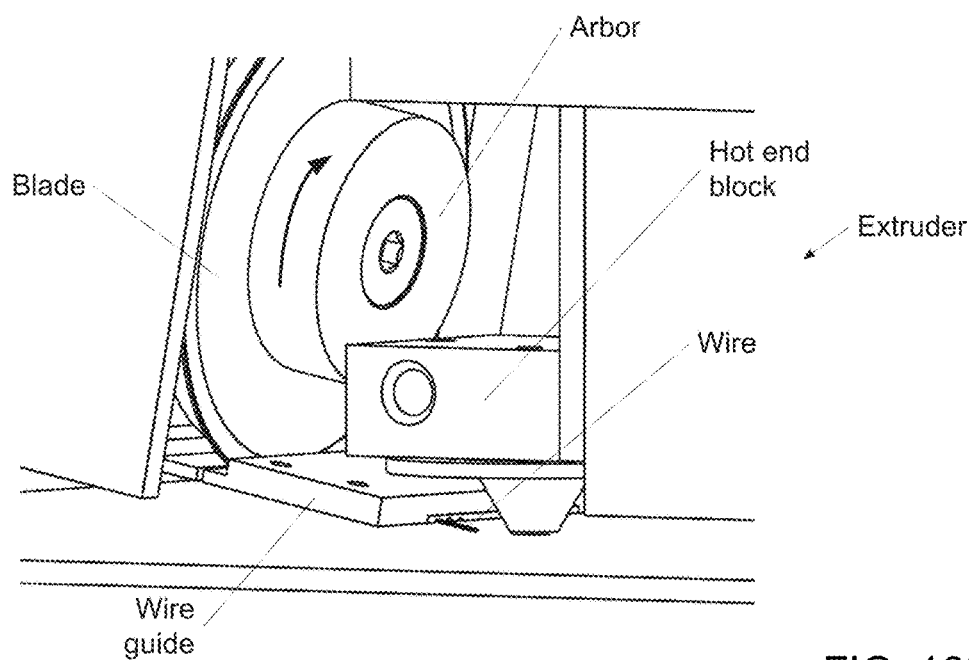
Figure 168I:
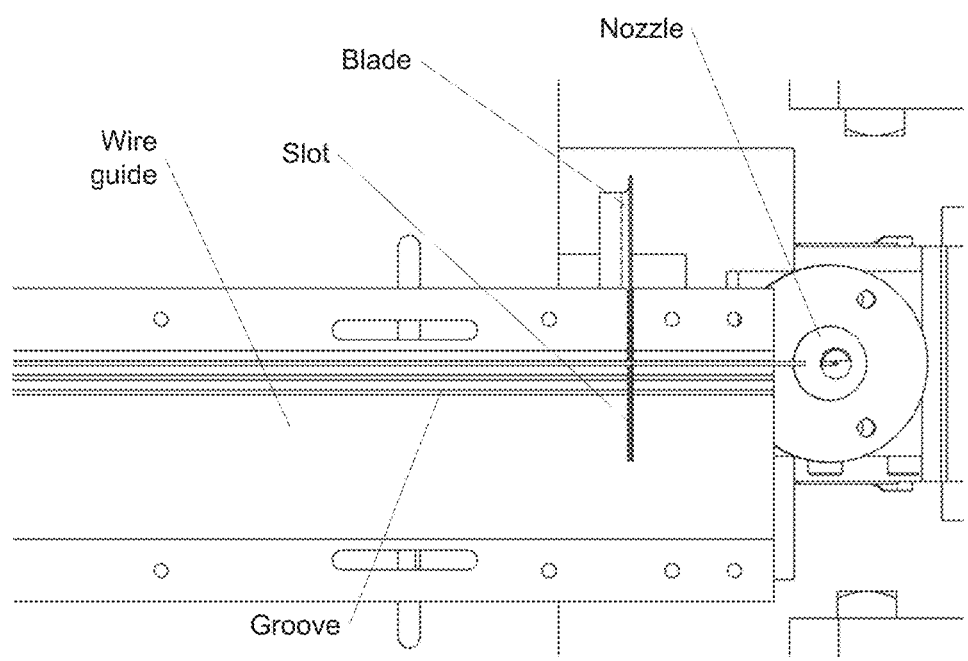
Figure 168J:
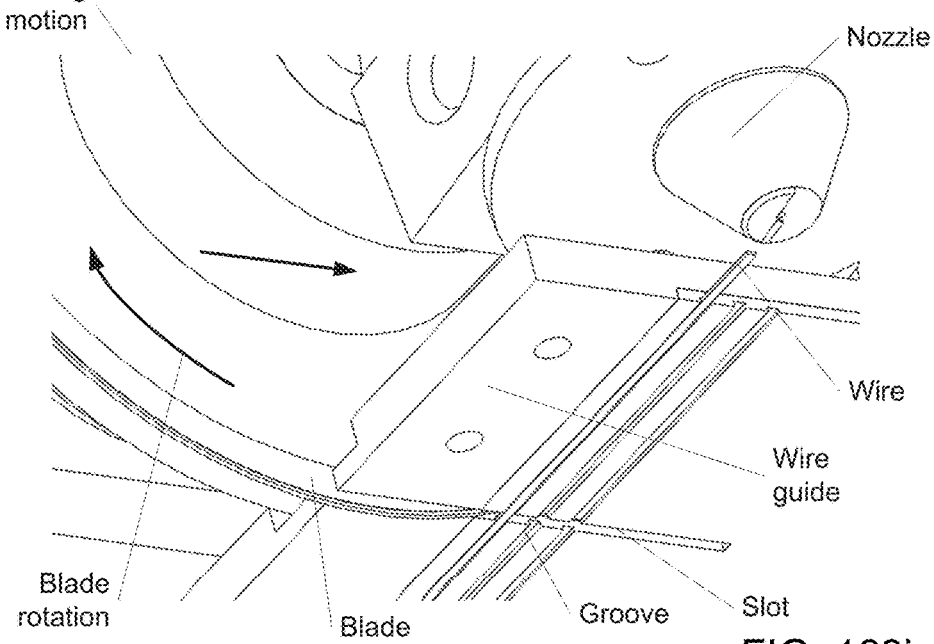

FIGS. 168(a), 168(b), 168(c), 168(d) 168(e), 168(f), 168(g), 168(h), 168(i), and 168(j) depict a number of 3-D views of a WDS for difficult-to-cut fiber (e.g., flat steel wire used to make soft magnetic structures) with some similarities to that of FIGS. 144(a), 144(b), 144(c), 144(d), 144(e), 144(f), and 144(g). However, this WDS uses a rotating blade (e.g., a non-slotted thin diamond dicing saw from Disco Hi-Tec America, Inc., Santa Clara, Calif.) to cut the wire. Such blades may be very thin (e.g., 100 μm) and normally have a surface coated with fine diamond. In some embodiments, blades made from other materials (e.g., abrasive cut-off wheels) may be used, and in some embodiments, the blades may be toothed or slotted. In some embodiments, coolant (e.g., rapidly-evaporating liquid or water) may be provided. In some embodiments, debris released by cutting may be collected by a vacuum nozzle or other structure, be collected by sticky "flypaper", etc. FIG. 168(a) is an overview of the WDS, which has a feeding subsystem based on rollers similar to that of FIGS. 144(a), 144(b), 144(c), 144(d), 144(e), 144(f), and 144(g), which FIG. 168(b) is an overview of the wire cutting and binding portion of the WDS. The WDS shown in the FIGS. 168(a), 168(b), 168(c), 168(d) 168(e), 168(f), 168(g), 168(h), 168(i), and 168(j) includes an extruder as well, which provides a binder to attach wire segments to one another and surrounding materials. The binder may be a thermoplastic material, in which case the extruder may be filament fed, or be a screw extruder similar to that of FIGS. 145(a), 145(b), 145(c), and 145(d). Or, the extruder may extrude an adhesive or paste. Possible binders include hot melt glues (e.g., if formulated for adhesion to the fiber and in some embodiments, surrounding materials), cyanoacrylates, UV-cured epoxies, etc. The extruder in some embodiments is mounted to a support which is moved on a carriage by an actuator such as an air cylinder. This allows the extruder to retract while a cut segment of wire (or other fiber) is positioned below the nozzle. Shields may be provided to protect personnel from cutting-produced debris or blade fragments (if the blade fractures).

FIGS. 168(c), 168(d) 168(e), and 168(f) are views focusing on the cutting blade and related hardware. The blade is rotated by a motor at significant speed. The blade and motor are both translated by a motorized cutting stage such that the blade can be moved across the wire, cutting the wire with a motion similar to a radial arm saw. The wire is pushed by the feeding subsystem through a groove in a wire guide, which has a cover at its bottom to prevent the wire from falling out of the groove (however, if the wire is magnetic, it may also be retained magnetically in some embodiments): the guide and cover serve as a capillary. As shown best in FIGS. 168(i) and 168(j), the wire passes across a region of the guide that is slotted to allow the blade to completely transect the wire as it moves across. The blade may be rotated in the direction shown or in the opposite direction. Cut segments of wire are directed beneath the nozzle of the extruder. Once cut, there may be a slight burr on the wire, or a slight bend in the wire, which interferes with insertion of the wire into the downstream capillary/wire guide. This can be corrected in some embodiments by withdrawing the wire into the capillary/wire guide section just upstream of the dicing blade (or for the feeder/cutter of FIGS. 139(a), 139(b), 139(c), 139(d), 139(e), 139(f), 139(g), and 139(h), the descending blade) so that the burr and/or wire is bent/shaved.

The 3-D views of FIGS. 169(a), 169(b), 169(c), 169(d), 169(e), and 169(f) depict a ring similar to that of FIG. 83, in which the capillary is supported by guy-wires. The ring may contain wire arranged circumferentially within, and thus serves as a wire dispenser. The ring can rotate around the nozzle so as to orient the capillary tangent to the nozzle path, for example. The guy-wires may be passive, or be actively tensioned (or the nominal tension reduced) so as to move the tip of the capillary as needed. For example, the tip of the capillary may need to be retracted as in FIGS. 30(a), 30(b), and 30(c), in which case both guy wires may be pulled inwards, lifting the tip, or in some embodiments, the ring itself may be lifted. Or, if the tip is to be moved horizontally (e.g., to better center the wire in the extrudate, e.g., while the extrudate curves in one direction), then the guy-wire on one side of the capillary can be pulled inwards while that on the opposite side can be played out. Thus the tip of the capillary, which nominally can be deflected from its natural shape by tension in the guy-wires, can be controlled to move in both the vertical and horizontal directions. Stepper motor-driven linear actuators, etc. may be used to control the guy-wires.

Figure 169A:
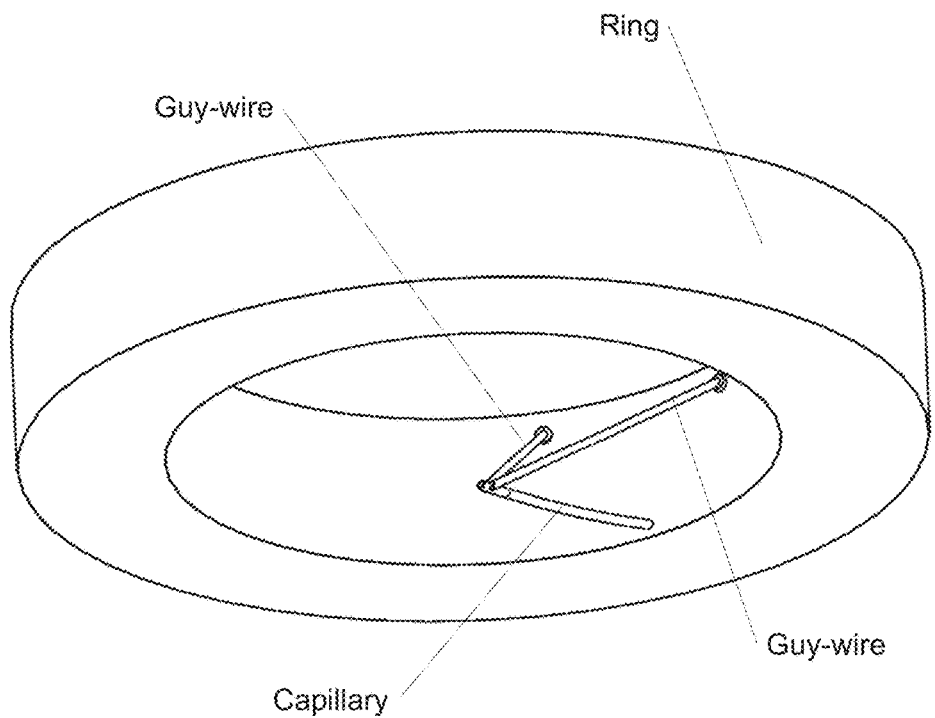
Figure 169B:
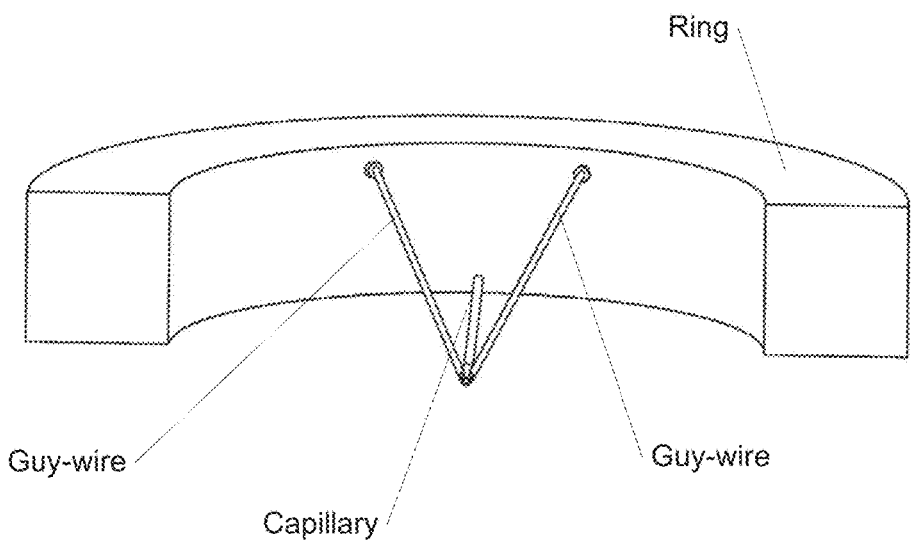
Figure 169C:
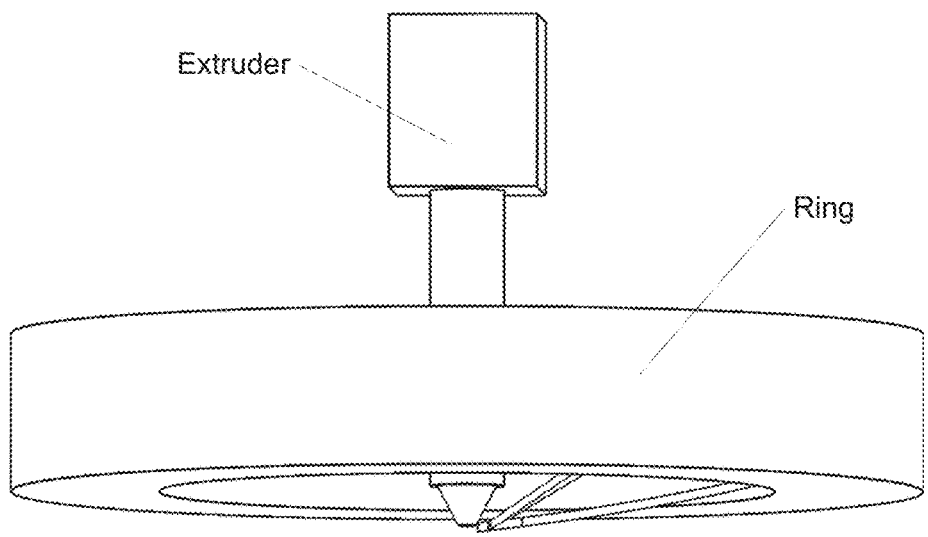
Figure 169D:
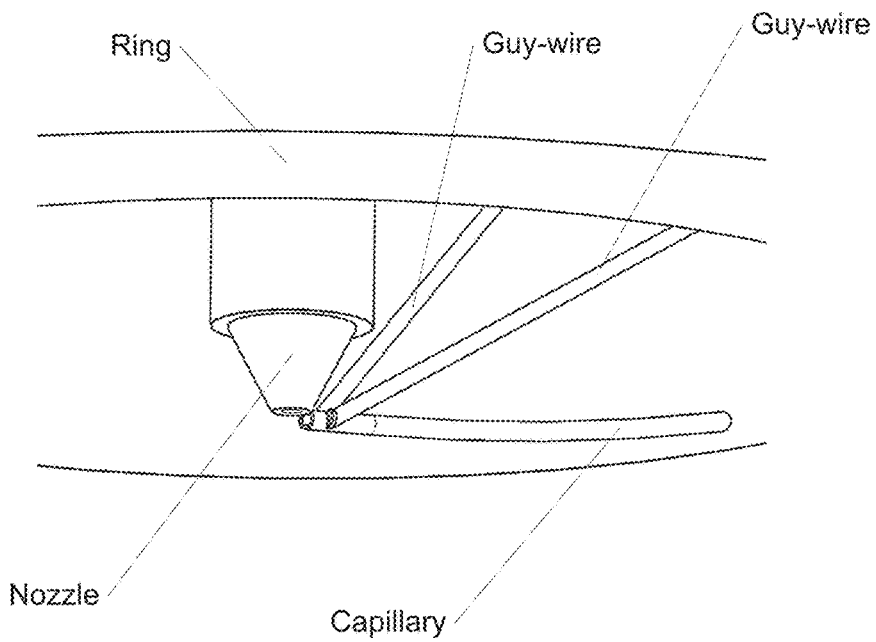
Figure 169E:
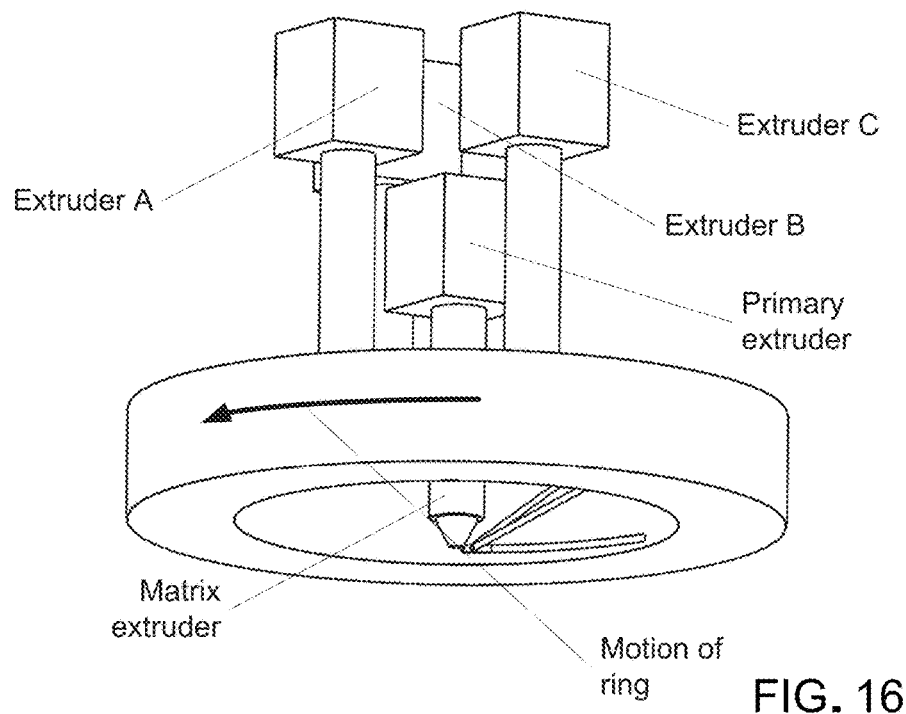
Figure 169F:
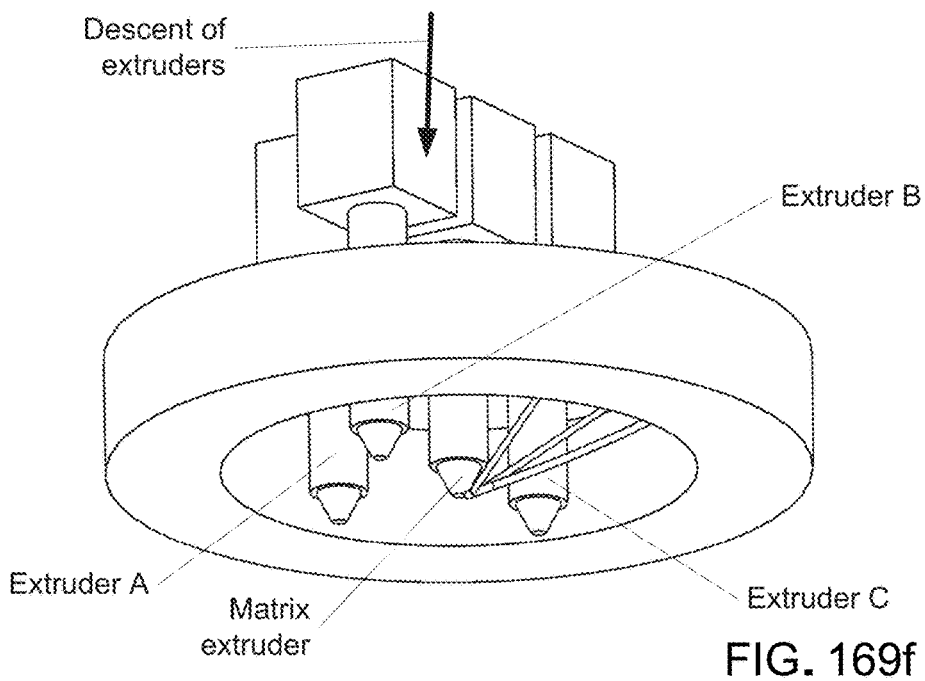

In FIG. 169(a) and in the section view of FIG. 169(b), the ring, capillary, and guy-wires are shown. In FIGS. 169(c) and 169(d), an extruder with its nozzle has been inserted, with the nozzle orifice aligned to the axis of rotation of the ring. In FIGS. 169(e) and 169(f), additional extruders A-C (and/or other apparatus, such as solder paste dispensers, SMPC delivery systems, laser welding apparatus, etc.) have been added to the primary extruder, whose orifice is centered on the ring axis. The additional extruders may be coupled together but whether individually controlled or clustered, are capable of moving vertically. Initially as in FIG. 169(e) the primary extruder may be extruding while wire is fed through the capillary, so as to encapsulate the wire as in the standard FEAM process. When this is done and it is time to employ at least one of the extruders A-C, the ring rotates to one or more "safe" positions which allow extruders A-C to descend without colliding with the capillary or guy-wires to the required height (which may vary with the particular extruder (the stage moving extruders A-C may also be used to focus a laser soldering system, etc.). Once descended, extruders A-C may operate normally. Before needing to encapsulate wire again, the extruders retract vertically, allowing the ring to rotate again without interference. In some embodiments, additional extruders may be located outside the ring. However, locating them inside the ring has the benefit of achieving reducing the space between the nozzles, allowing for a larger device to be printed which includes material from any of the extruders.

FIGS. 170(a), 170(b), and 170(c) depict several views of a method for fabricating a helical coil with a horizontal axis that minimizes the number of junctions needed (indeed, as shown the wire is continuous, with no junctions). The method involves fabricating the coil in an initially flattened state, and then (optionally) expanding it so that it forms a shape suitable for a core or plunger to be inserted (this can be fabricated alongside the coil, and then slid into place). As shown in the elevation cross-section of FIG. 170(a), the coil is built from two layers which are separated by a small gap, so that they are not fused. Layer 2 is produced without supports in some embodiments by virtue of the wire (under slight tension) within layer 2 providing a substrate around which extrudate can solidify (e.g., as in FIGS. 55(*a*), 55(*b*), 56(*a*), and 56(*b*)). A small vertical section of the wire is provided between layers 1 and 2 to establish the required gap in some embodiments. The wire is continuous, but for clarity, wire on layer 1 is shown as a wide solid line, while wire on layer 2 is shown as a wide dashed line; vertical sections are shown as narrow solid lines.

FIG. 170(*b*) is a 3-D view of the coil as-fabricated; only wire is shown; matrix material is not shown for clarity. However, matrix material surrounding the wire is in close proximity on adjacent windings and fuses together along the Y axis. The FEAM printhead (nozzle and capillary) produces this coil by moving in X, Y, and Z, not merely X and Y as usual. The result is a flat tube of matrix material within which is a (flattened) helical coil. As shown, the two ends of the coil can be extended to provide leads for electrically connecting the coil.

The coil may be used as-is (e.g., a narrow core or plunger may be inserted into it, or it may serve as an air core inductor or other coil. However, it may be expanded as in FIG. 170(*c*), after the coil has been fabricated. This may be performed mechanically by pulling on it, inserting an object into it, or (if it is substantially free of leaks and closed at both ends by deposited material) by inflating it with a fluid such as air. If the matrix material is capable of thermally setting or is a thermoplastic or a photo-cured material, then once expanded, the expanded shape can be maintained by the application of heat or light (e.g., UV). Indeed, hot gas may be used to both expand the coil and set the new, expanded shape. The approach of FIGS. 170(*a*), 170(*b*), and 170(*c*) may be used with either elastomeric or rigid matrix materials.

In general, structures may be 3-D printed in a flattened condition to save printing time and/or obtain better strength, then inflated or otherwise reshaped into the final configuration required. If made from thermoplastic materials, the application of heat can retain the new configuration.

FIG. 171(*a*) is a 3-D view of an elastomeric robotic arm comprising built-in actuation provided by specially-shaped and arranged electrodes. FEAM can produce dielectric elastomer actuators (DEAs) by embedding wire (e.g., round, square, flat/ribbon) within an elastomer. In the example shown, a large number of electrodes are provided to create a cephalopod-like arm which can bend and change its length and stiffness. Also provided are touch sensors at the surface of the arm, and stretch sensors which can be used for proprioceptive feedback and control. These sensors may be piezoresistive, capacitive, inductive, or use other modalities. As shown, certain electrodes are used to locally contract the elastomer transversely, which causes a local expansion along the longitudinal axis of the arm, since the elastomer volume is constant (if an incompressible, vs. foam-like material). Other electrodes are used to locally contract the elastomer axially, which causes a local transverse extension. A central channel provides space for wiring for the electrodes, etc.

In FIG. 171(*b*), a close-up view of the end of the arm is provided, while FIG. 171(*c*) shows a building block of the transverse electrode structure. The structure comprises wires forming alternative positive and negative electrodes. Electrodes of one type are which are connected together by flexible (e.g., thinner) wires in pairs, allowing relative movement of the electrodes, and these pairs may be connected by positive and negative bus wire (not shown) running along the sides of the electrode structure. Wires can be made thinner and more flexible as needed by dynamically adjusting the force applied to the rollers in the wire feeder to squeeze the wire (if ductile), or thin wires may be joined to thicker wires as needed. When a voltage is applied to the structure, it contracts as shown. The wires also serve to limit contraction along their lengths, such that most of the corresponding expansion occurs perpendicular to the plane of the structure. As shown in FIG. 171(*d*), the structure of FIG. 171(*d*) may be stacked, as is the case in the arm of FIG. 171(*a*). Here it may be appreciated that when the contraction occurs, it results in an extension as shown.

FIG. 171(*e*) shows a building block of the longitudinal electrode structure. The wires here are all shorted together by flexible wires (or flexible regions of the wire), such that all the electrodes form a structure with the same polarity. As shown in FIG. 171(*f*), the structure is then stacked and connected with alternating positive and negative polarities. When energized, the positive and negative layers approach one another. This results in a simultaneous transverse extension as shown. The wires may be corrugated as shown so as to not restrict expansion along their lengths in some embodiments.

FIGS. 172(*a*), 172(*b*), 172(*c*), 172(*d*), and 172(*e*) depict 3-D views of a subsystem for FEAM which includes the ability to deposit materials other than fiber and a primary matrix material, and to perform soldering (e.g., using a laser). The system as shown incorporates a filament-type extruder (#1) for the primary matrix, a second such extruder (#2) for support material (e.g., polyvinyl alcohol), a syringe extruder for SMPC, and apparatus required for soldering (a solder paste dispenser and laser optics (e.g., a fiber collimator and fiber connected to a fiber-coupled laser diode). It also incorporates a microscope which for example can be used to determine the exact position of wires prior to junction formation (allowing better targeting of the solder paste and/or laser spot) and inspect/document the junctions produced (providing in-situ quality control); in some embodiments, automated computer vision capabilities known to the art may be used for both alignment and assessment purposes.

With the goal of locating all the extruders and other elements in a small space, the subsystem has certain elements (laser optics, solder paste dispenser, and microscope in this case) mounted to a plate (the "front plate") which is hinged through the use of a shaft and bearings to another plate (the "side plate"). This allows access to these elements for servicing, as well as to elements mounted to the plate (the "rear plate") behind them. A stop is provided against which the front plate can be securely fixed with a screw during normal operation.

The rear plate is adjustable in X and Y so that the orifice of extruder #1 can be aligned to the theta stage axis of the platform below; the theta stage is provided as in FIG. 42 to re-orient the capillary. As shown in FIGS. 172(*a*), 172(*b*), 172(*c*), 172(*d*), and 172(*e*), the rear plate is mounted to the large plate behind it (the "Z plate") through a pivoting mechanism best shown in FIG. 172(*c*), which allows translation of the Z plate along the X axis, but also pivoting around the X axis when adjustment screws best shown in FIG. 172(*d*) are moved, which causes a movement of the extruder orifice along the Y axis. Springs are used to pre-load both directions of adjustment, as shown.

FIGS. 173(*a*), 173(*b*), and 173(*c*) are a sequence of plan views of a portion of an electronic circuit breadboard produced using FEAM. In FIG. 173(*a*), a hole is provided for the insertion of the pin of an electronic device (or a wire or connector). A wire which is preferably somewhat springy so it is pre-loaded against the pin (but could in some embodiments be annealed Cu or another soft material) may be embedded in polymer (here, an elastomer) in most areas, but is exposed within the hole. It may be formed into a loop as shown so that it can contact the inserted pin on more than one side, or can be bent into a double, overlapping V-shape to contact the pin in four locations, etc. Prior to inserting the pin, in some embodiments the breadboard is stretched locally in the region of the hole (if elastomeric), e.g., by inserting instruments into the stretch holes provided and pulling, as in FIG. 173(b). This provides for a zero insertion force connection. The pin is then inserted as shown. In FIG. 173(d), the elastomer is relaxed and the wire deforms around the pin. In some embodiments, no pre-stretching is required (or possible, if the dielectric is rigid), and the pin simply deforms the wire as it is inserted. In some embodiments, the pin hole may be shaped differently than shown (e.g., round for flat leads). In some embodiments, the device is stretched, but no stretch holes are provided (e.g., the entire breadboard might be stretched for component insertion). In some embodiments, multiple wires may be inside the hole; these wires may be on the same fabricated layer or on different layers. In some cases, the inserted pin may also therefore serve as a junction between such wires. Indeed, in some embodiments, intra- and or inter-layer junctions are formed between wires by inserting plain pins or wires into holes.

FIGS. 174(a), 174(b), 174(c), 174(d), 174(e), 174(f), and 174(g) depict sectional elevation views of a lightweight, inexpensive fluidic (pneumatic or hydraulic) robot which may be printed entirely from elastomer and which is capable of crawling on surfaces no matter what their orientation (e.g., the robot may crawl on the ceiling, wall, window, hull of a ship, airplane, etc.) and is capable of moving in any direction on the surface. The robot comprises two or more blocks, each equipped with a cup or similar arrangement (although a simple hole in the block may suffice in some embodiments) on their bottoms. Blocks are interconnected by bellows which can expand (or contract in some embodiments) when supplied with fluid. Blocks are provided with ports which communicated with cups and a port for communication with the bellows (though this can be done directly, vs. through the block). Tubing (not shown) in connected to the ports to supply fluid to the bellows and supply or withdraw fluid from the cups. When fluid is withdrawn from a cup, it adheres to the adjacent surface, while when fluid is supplied to a cup, it detached from and is able to glide over the surface with very low friction (as in an air bearing).

Figure 174A:
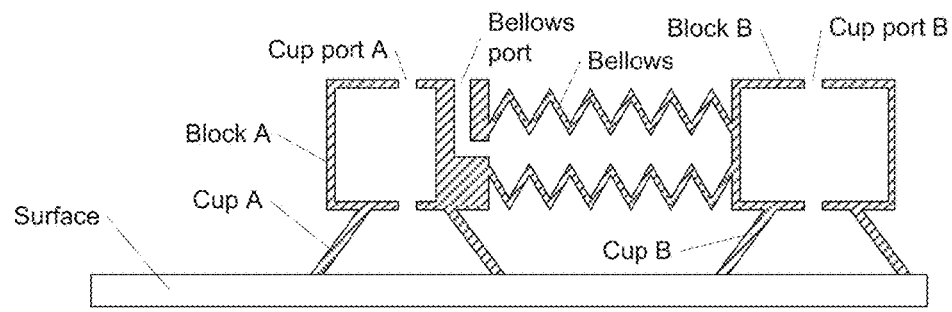
Figure 174B:
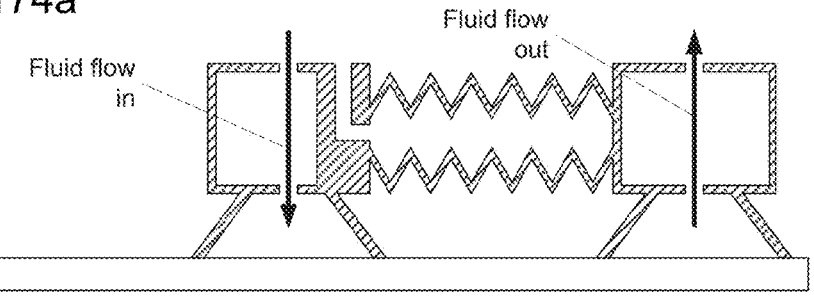
Figure 174C:
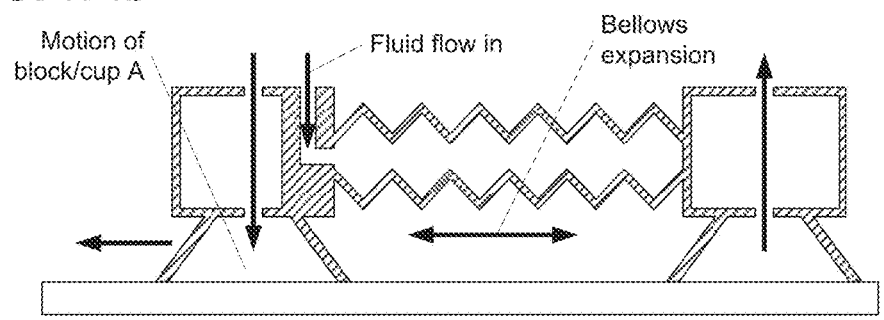
Figure 174D:
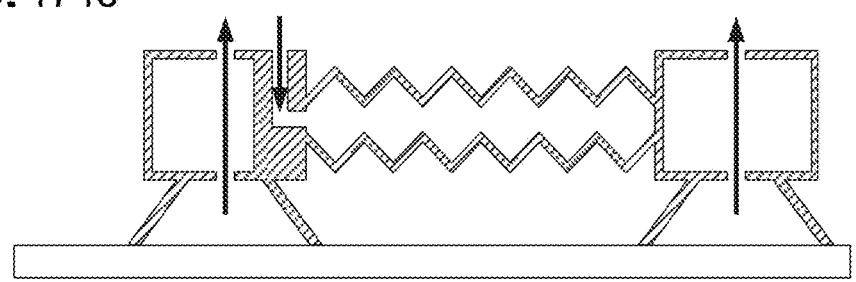
Figure 174E:
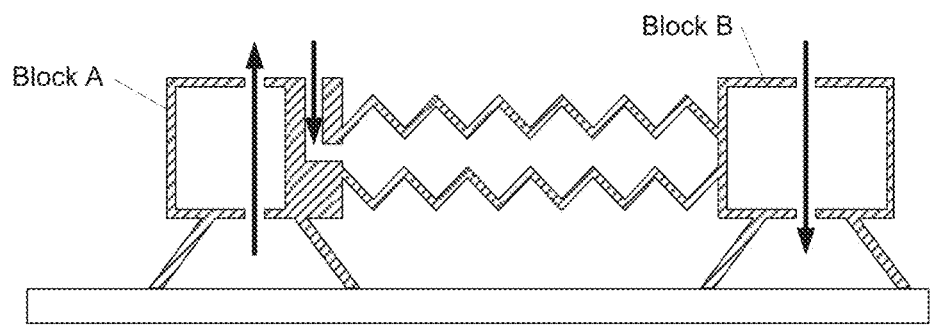
Figure 174F:
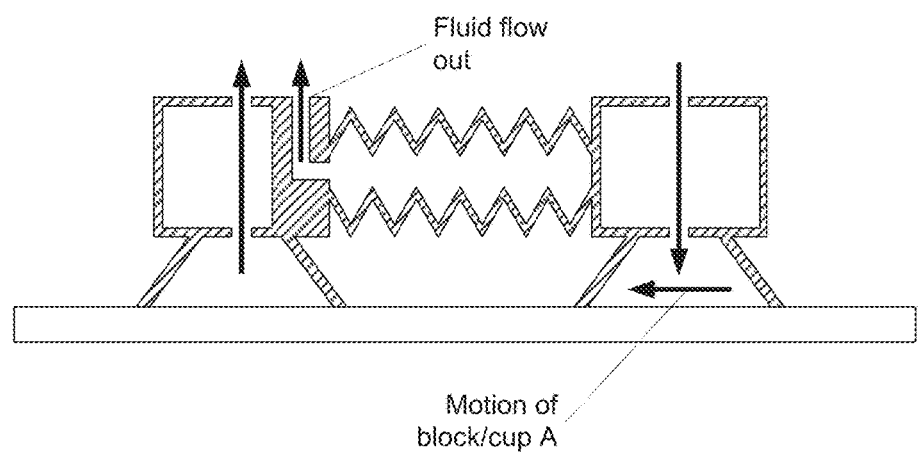
Figure 174G:
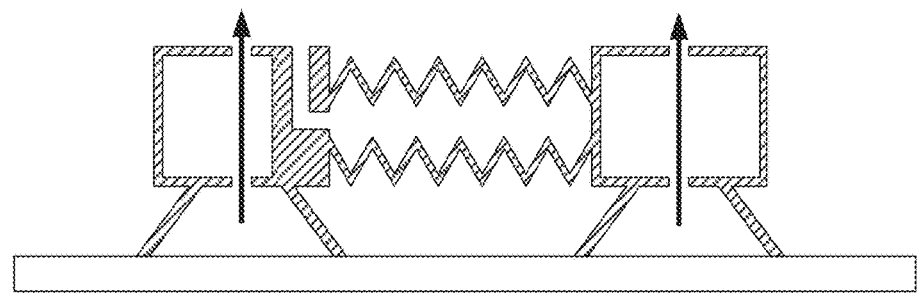

The robot moves using an inchworm gait, as depicted in the sequence of FIGS. 174(a), 174(b), 174(c), 174(d), 174(e), 174(f), and 174(g), in which the arrows indicate the direction of fluid flow and the direction in which elements of the robot move. In FIG. 174(a), the robot is inactive, but in FIG. 174(b), fluid is withdrawn from cup port B, locking block B to the surface, while fluid is injected into cup port A. Next in FIG. 174(c), fluid is injected into the bellows port, causing block A to move to the left while block B remains in place. In FIG. 174(d), block A is locked onto the surface as well; fluid may continue to be supplied to the bellows as shown, or the pressure may be reduced in the bellows in preparation for a forthcoming step, shown in FIG. 174(e). In the latter figure, fluid flow has been reversed in block B, causing block B to detach from the surface. In FIG. 174(f), fluid is let out of the bellows (if not already done), causing the bellows to elastically contract and advancing block B. In FIG. 174(g), fluid is removed from both blocks, locking them to the surface. The process can then repeat, starting again with the step shown in FIG. 174(b), causing the robot to advance further. Other actuators other than bellows (e.g., bending actuators such as FIGS. 159(a), 159(b), and 159(c)) may also be used to displace one block relative to another.

Figure 174H:
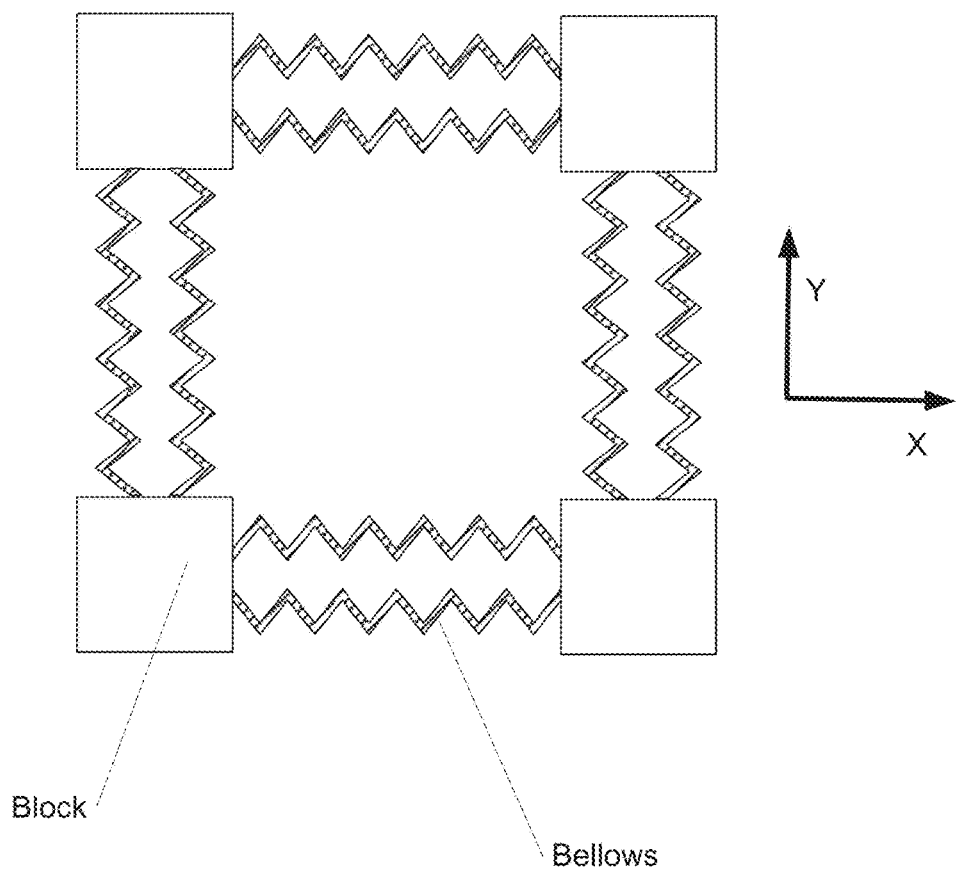

In FIG. 174(h), a robot with four blocks and four bellows (shown in section) is shown in plan view. Such a robot is able to move in any direction by proper sequencing of the fluid flows. Movement can be either strictly parallel to the X or Y axes, and may alternate between these movements to move along a diagonal. Or, by adjusting the stroke length of the righthand vs. the lefthand bellows so they are unequal (by varying time and/or pressure for bellows length changes), the robot can be made to turn. In some embodiments, robots may have built-in pressure and vacuum pumps, with batteries, and so be self-contained.

Figure 175A:
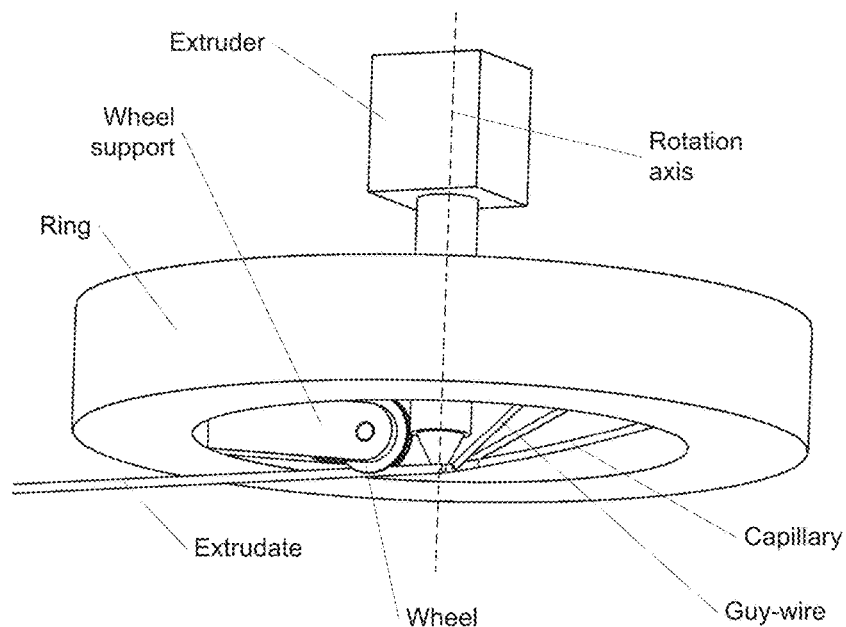
Figure 175B:
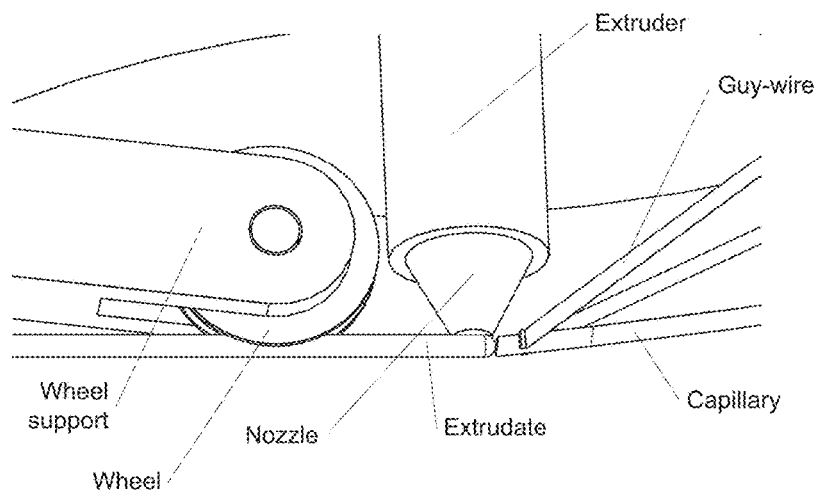
Figure 175C:
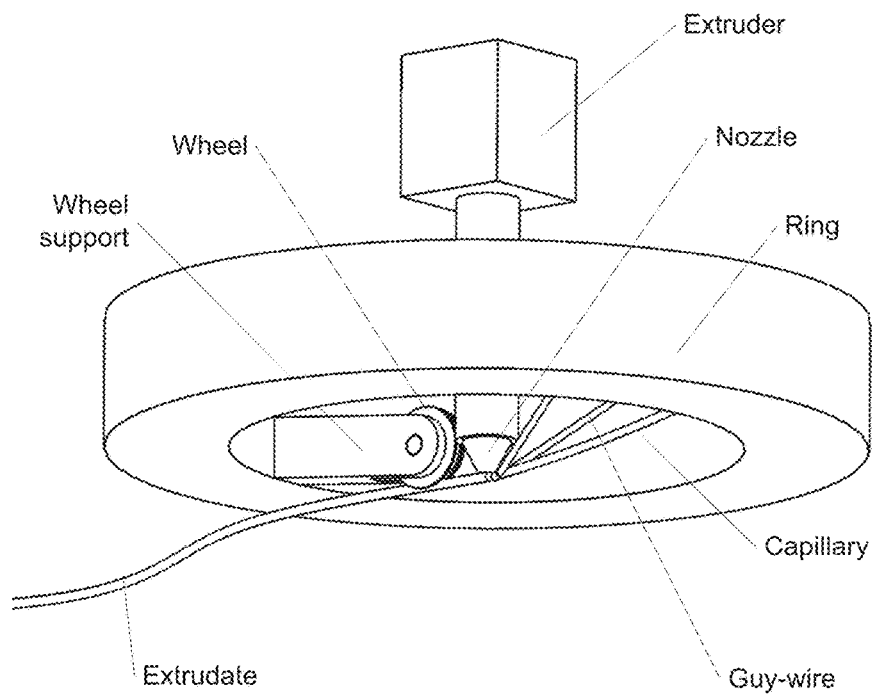
Figure 175D:
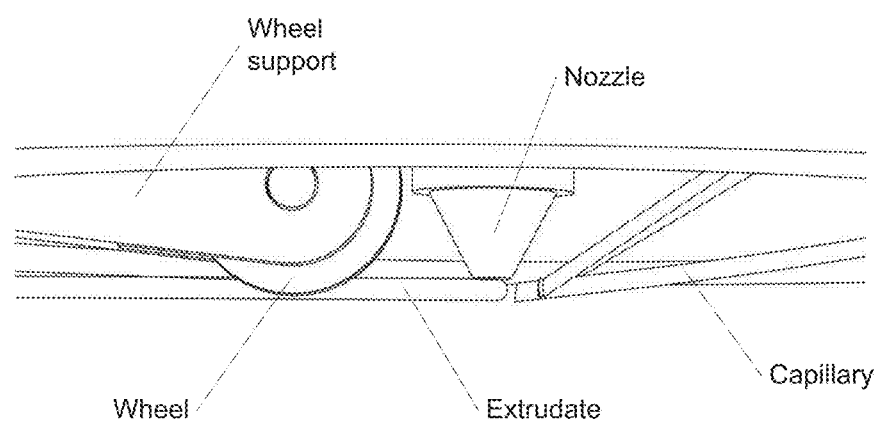
Figure 175E:
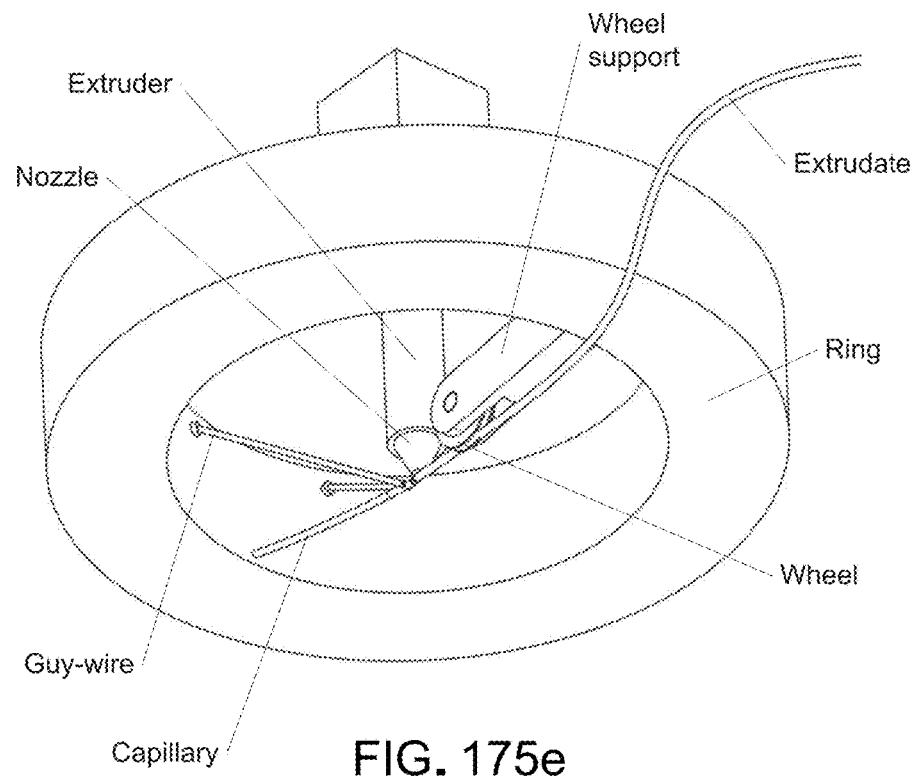
Figure 175F:
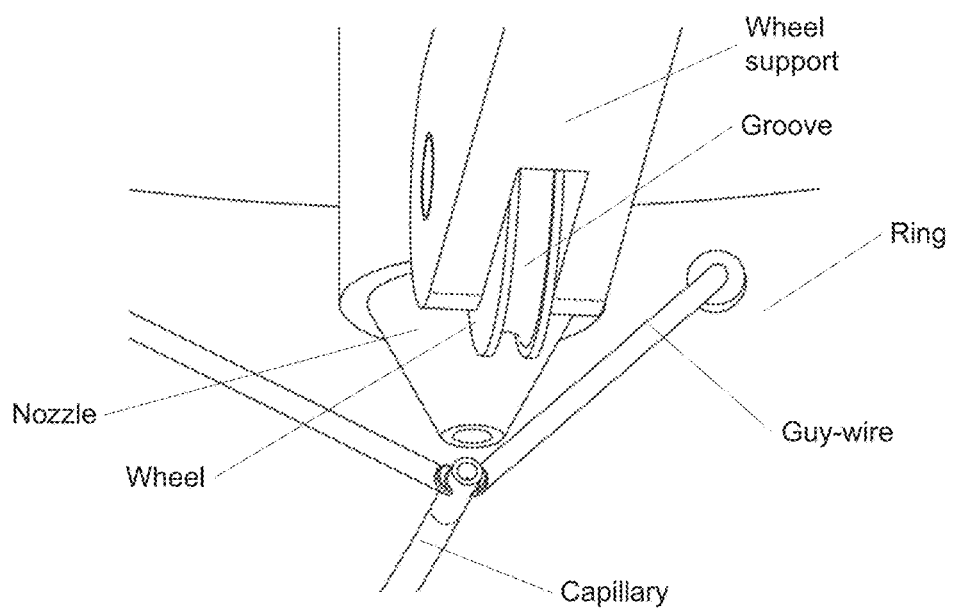

FIGS. 175(a), 175(b), 175(c), 175(d), 175(e), and 175(f) depict 3-D views of an arrangement similar to that of FIGS. 169(a), 169(b), 169(c), 169(d), 169(e), and 169(f), but which also includes a wheel supported by the ring (in some embodiments the wheel (and capillary) may be supported by a bearing surrounding the extruder nozzle, etc.). The previous layer of material is not shown. The wheel may be grooved as shown in FIG. 175(f) such that it can fit over the solidified extrudate (shown as round, but which may have another shape) and cause the ring, which is supported by a low-friction bearing, to rotate as the wheel rolls along the extrudate, using the extrudate as a track and the wheel somewhat like a caster. This keeps the capillary (and potentially other hardware such as a cooling nozzle, a source of radiation used for curing, etc.) substantially tangent to the extrudate without using an actuator to rotate the ring and may be a lower cost alternative. The wheel should preferably be small and close to the nozzle, and may be cooled to help solidify the extrudate. Nonetheless, the extrudate cannot have a very radius of curvature, since the wheel must fit on it, and there will be a small error in how tangential the capillary is relative to the extrudate since the wheel is aligning itself to the extrudate at a position offset from the nozzle. In some embodiments, the wheel can reshape the extrudate, and help push it into the previous layer, improving adhesion. In some embodiments, the wheel is driven and actively swiveled, pulling along the nozzle.

If the wheel is shaped as in FIG. 175(f), it cannot fit over extrudate next to other extrudate. This situation can be often avoided by first printing extrudate containing wire on a given layer. After this, the ring is raised, raising both the capillary and wheel out of the way, so that the nozzle can print according to any desired toolpath. In some embodiment variations, the wheel can track the extrudate using small projections (e.g., as with a pounce wheel), or a groove can be formed in the extrudate by a projection on the nozzle which can interface with a ridge on the wheel. In these cases, the wheel does not require a groove.

FIGS. 176(a), 176(b), and 176(c) depict a method of producing an extrudate in which wire or other fiber is exposed on one or more surfaces (e.g., for bearing surfaces, electrical connections, as electrodes), such as those shown in FIGS. 76(a), 76(b), 76(c), and 76(d). As shown in FIG. 176(a), the hot end of the extruder has two input ports. Into one port flows structural material, and into the other port flows support material. Both materials may be reasonably mutually adherent when solidified. Assuming these materials are of high viscosity, and given the small dimensions and low flow velocity, the Reynolds number is low, so the flows are laminar and minimal inter-mixing of the materials will occur at their interface. Thus, the extrudate issuing from the nozzle has structural material on one side and support material on the other. If the extrudate encapsulates a wire (shown with rectangular cross section), a 3-material composite will be formed. Since one material is sacrificial, once it is removed, the wire is exposed along its length. In some embodiments, materials may be arranged to flow such that the interface between them is horizontal, thus allowing the top or bottom of the wire to be exposed. In some embodiments, the wire is textured (e.g., with axial/longitudinal grooves) to better interlock it within the structural material. To facilitate interlocking of wire that is not fully encapsulated with extruded matrix material, in some embodiments the cross-sectional shape of the wire can comprise re-entrant/undercut features (e.g., an hourglass-like shape), thus allowing the wire to be anchored securely within the solidified matrix, for example, on a sidewall or horizontal up-facing surface of a part. In some embodiments, large diameter wire (e.g., with a circular cross-sectional profile) can be captured by dispensing at least a portion of the wire bare (without matrix material encapsulating it), and depositing extruded material along its sides, such that the profile is captured, but no material overlies the top, leaving it exposed (e.g., for use as a contact in a USB or PCB-like edge connector).

FIG. 177 depicts an arrangement similar to that of FIGS. 29(a) and 29(b), but in which discrete objects, vs. continuous fiber, are introduced into the extrudate by the capillary/feed tube. These objects may be solid or semi-solid, or made from a liquid which may be miscible or immiscible with the extruded material. For example, balls for ball bearings used in printed electric motors may be deposited as shown in the figure within a soluble support material, which when dissolved allows the balls to move freely. Objects can be delivered through the capillary/tube by gravity feed, fluid pressure, a push wire, vibration, etc. in some embodiments, rather than deliver objects through an external capillary, then may be delivered through the nozzle orifice directly.

Figure 178E:
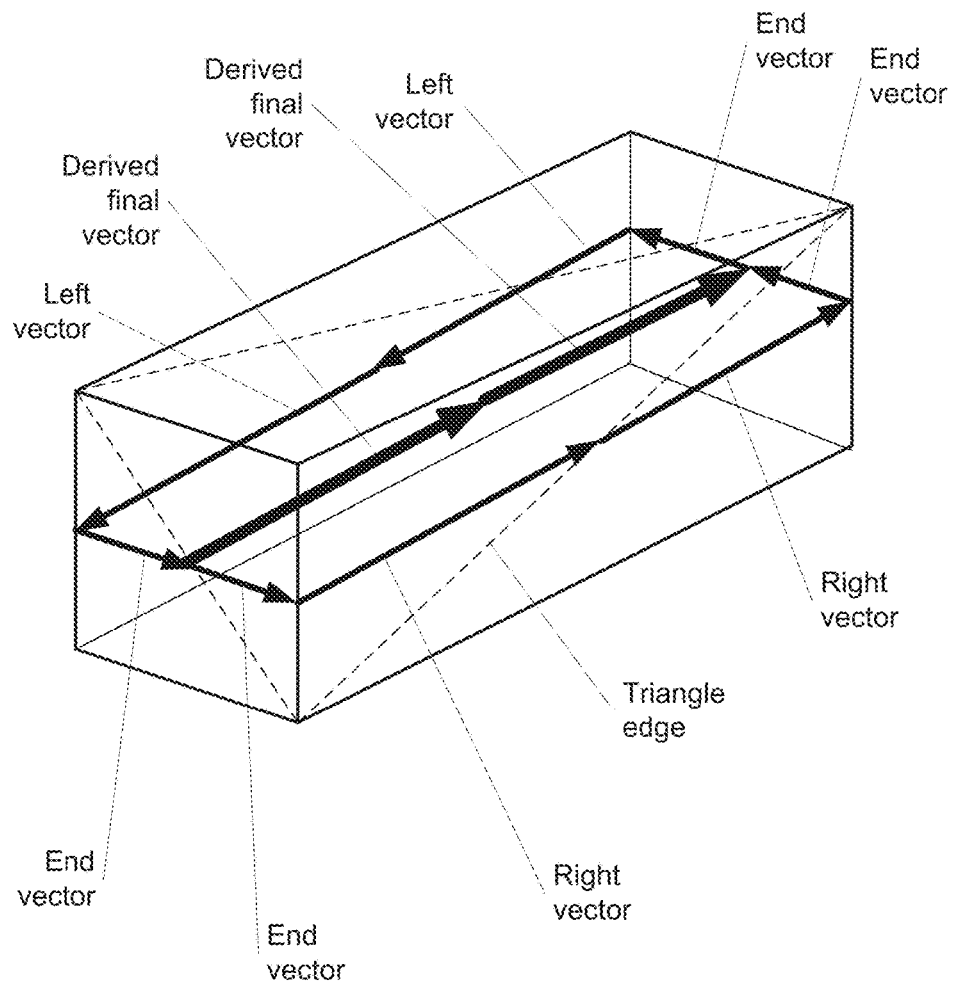

FIGS. 178(a), 178(b), 178(c), 178(d), and 178(e) depict a method for determining toolpaths for the FEAM process which involve fiber, based on geometry created in computer aided design (CAD) software. In FIG. 178(a), a curved shape representing the desired path for a wire in a structure is shown. If the wire is to be encapsulated on a horizontal layer, the shape is planar, but can be complex in 2-D. Such a structure may be included in a CAD assembly along with other structures to be printed in various materials. In FIG. 178(b), the shape has been exported as an STL file, such that it is represented by a set of triangles. The curved sides of the shape are represented as planar, rectangular facets, each subdivided into two triangles, and triangles also represent portions of the top and bottom surfaces. In FIG. 178(c), a computer has been used to slice the STL file, intersecting the triangles with a horizontal plane that is partway up the sides (e.g., halfway as shown). Vectors are then generated as shown in FIG. 178(c) and enlarged, in FIG. 178(d), determined by the intersection between the side triangles and the plane. Triangles at the top and bottom are not intersected and no vectors are thus derived. FIG. 178(e) depicts the vectors that would be obtained from a short, straight shape. Next, a process running on a computer performs two steps. In one, the short "end vectors" of known length (based on the specified width of the shape as-designed, or other identifying characteristics) are disposed of In the other, in some embodiments one set of the remaining vectors, either left or right, is disposed of, or in other embodiments in which the desired vectors are defined by the centerline of the designed shape, final vectors shown by the bold vectors in FIG. 178(e) are derived halfway between the left and right vectors, then both left and right vectors are disposed of. The surviving vectors then represent the desired toolpath for the extrudate.

Rather than cut wire with a blade to segment it as described above (e.g., in conjunction with FIGS. 178(a), 178(b), 178(c), 178(d), and 178(e)), wire segment feeders (WSFs) capable of delivering wire (or other fiber) segments of the required length to the nozzle may be based on alternative designs. It is desirable that such WSFs are small and lightweight enough that they can be rotated around the nozzle, obviating the need to rotate the printed part during fabrication (e.g., using a theta stage as in FIG. 42). Avoiding part rotation 1) reduces the sensitivity of nozzle/rotation axis alignment; 2) allows for higher speed motion due to the lower moment of inertia of an WSF versus a printed part, X/Y stages, and theta stage; 3) allows the use of multiple FEAM printheads in a single system (e.g., to increase productivity by making many parts simultaneously on a common platform); etc.

In some embodiments, a WSF may involve scoring the wire (e.g., using a blade) but not cutting through it. When tension is applied to the (e.g., using two pairs of rollers), the wire is broken. With ductile materials such as copper, distortions such as burrs may be especially likely if the wire is fully cut; such distortions can make re-threading the wire into the downstream capillary difficult and unreliable, causing jamming. However, wires made from ductile materials, when tensioned, tend to straighten and neck down in the region of the score before breaking, leaving no burrs and allowing reliable delivery. Non- or less ductile fibers (e.g., glass, carbon, steel, tungsten, nickel-chromium) can also be broken by the methods and apparatus described by exceeding their ultimate tensile strength, and the location of the break can be controlled by scoring them in the location desired, since the score (a small fracture, microcracks, and/or stress-concentrating geometry) will fail in tension before the fiber fails in unaffected areas. Compared with cutting, scoring wears the blade considerably less (to reduce wear even further, a ceramic or diamond blade may be used), can work for fibers considerably thicker and harder than annealed copper wire, such as (for reinforcement) carbon, glass, and steel fiber, or metals such as nickel-chromium and tungsten, and is easier to perform while the fiber is in motion.

Figure 179A:
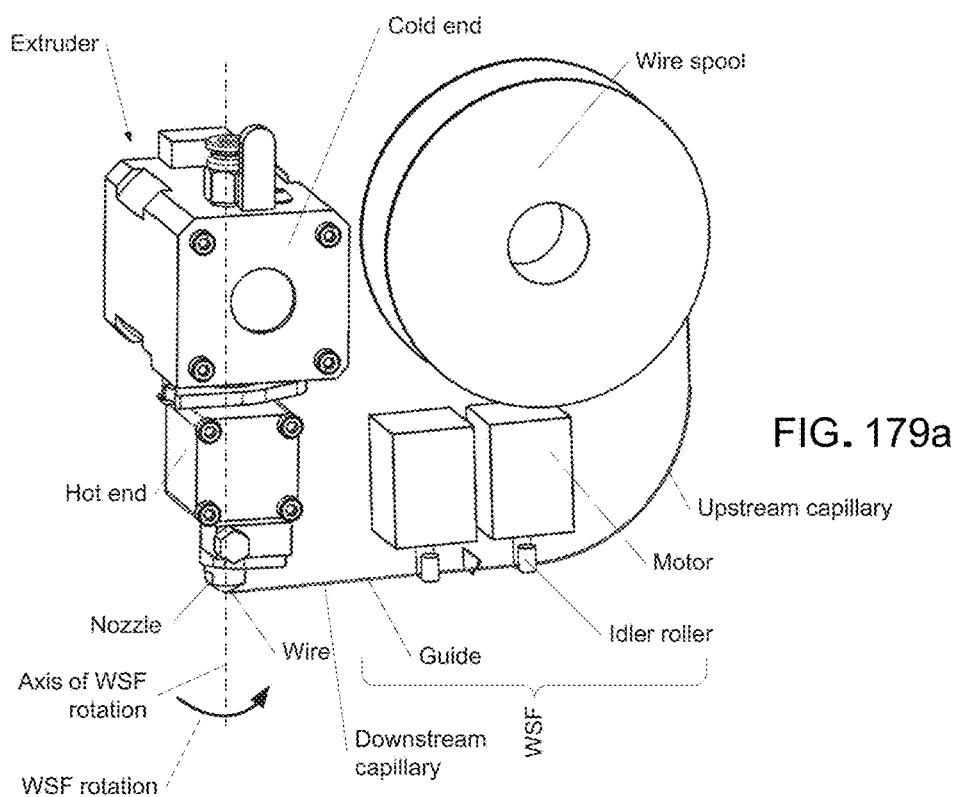
Figure 179B:
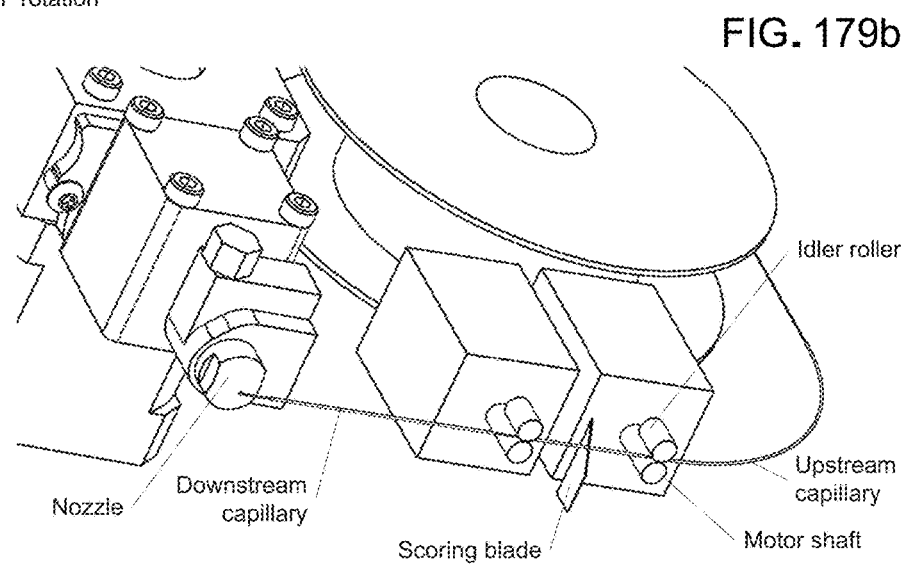
Figure 179C:
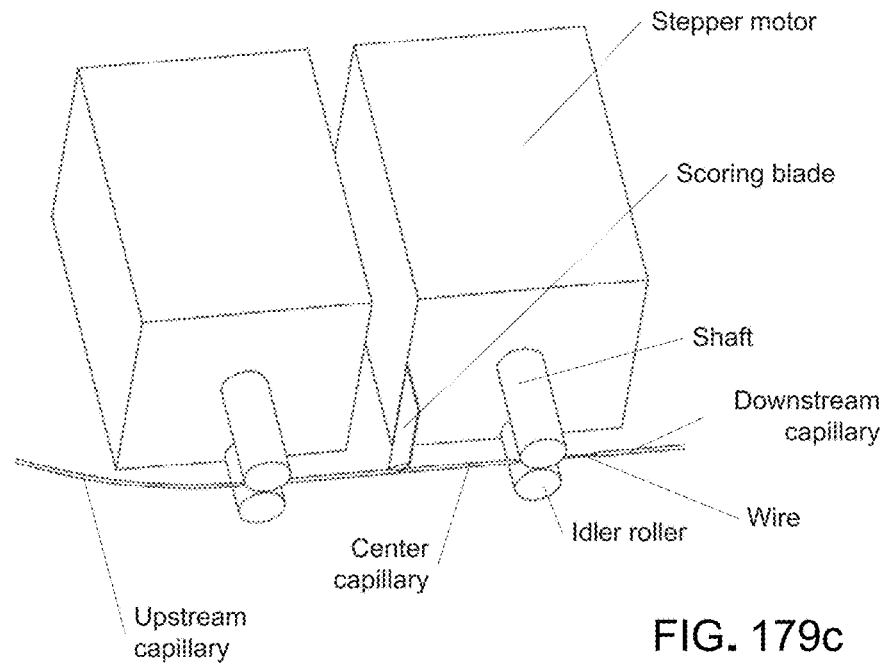
Figure 179D:
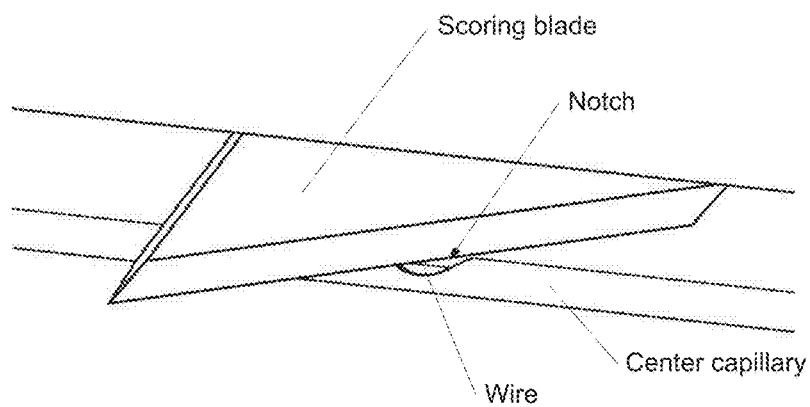
Figure 180A:
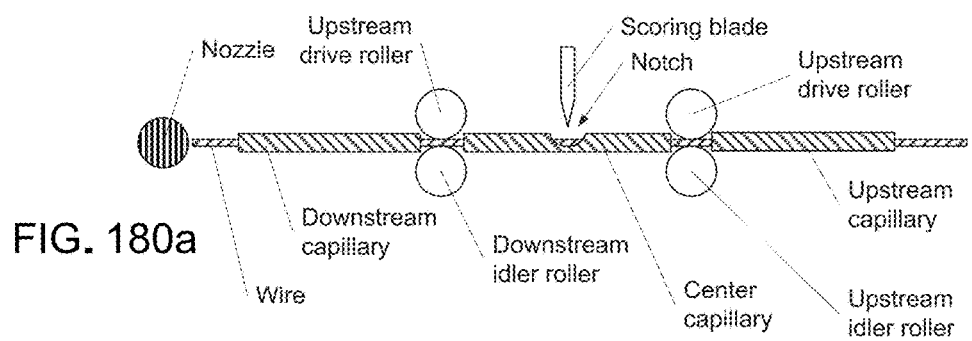
Figure 180B:
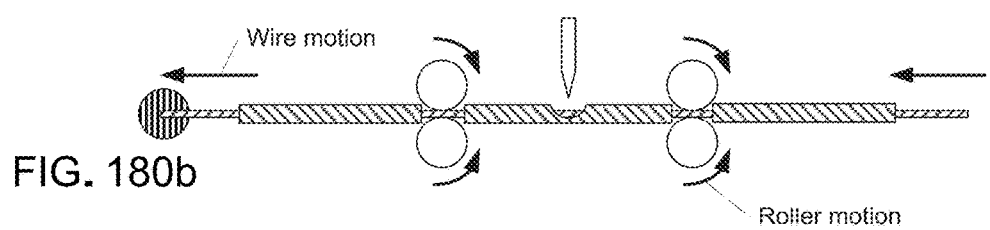
Figure 180C:
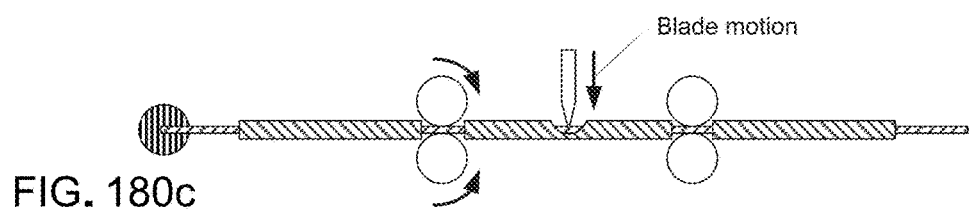
Figure 180D:
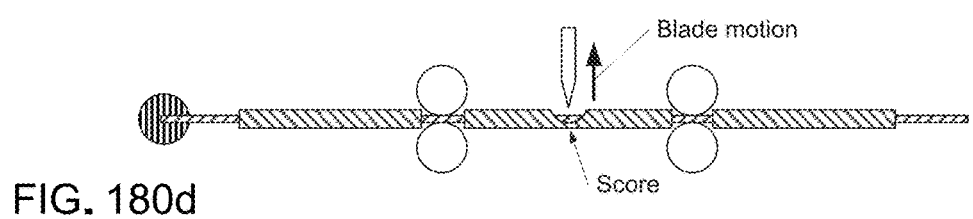
Figure 180E:
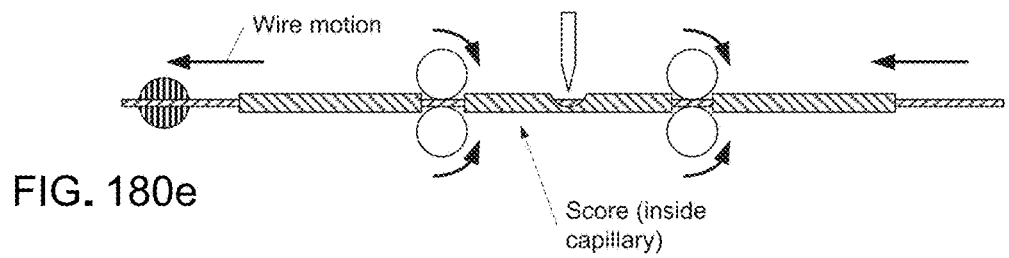
Figure 180F:
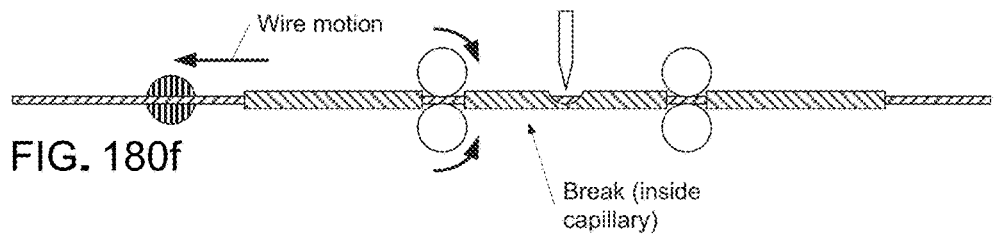
Figure 180G:
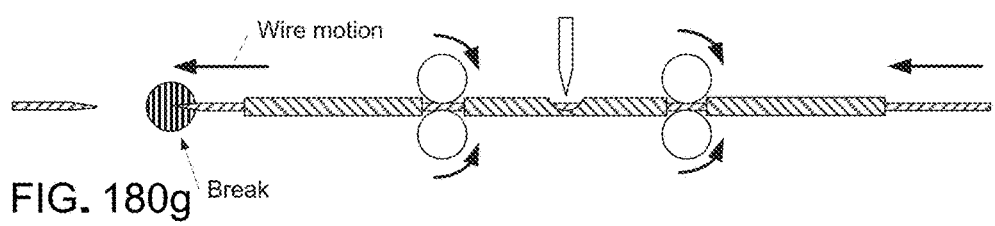

FIGS. 179(a)-(b) show 3-D views of a printhead comprising an extruder (with cold and hot end) and a WSF comprising a wire spool with wire, two small motors (e.g., two NEMA 8 stepper motors, the shafts of which serve as drive rollers (in some embodiments separate drive rollers are used), two idler rollers (or in some embodiments, two additional motors) which together with the motor shafts pinch the wire with a controlled pressure, a horizontally-sliding (in some embodiments blade motion is in another direction) scoring blade (or other element able to locally damage the wire (such as a rotating roller which moves to engage the wire and has a protruding blade or boss; this allows the wire to be scored without pausing while the roller tangential speed matches the wire speed), and three capillaries: downstream, upstream, and center, all of which may comprise, for example, stainless steel hypodermic tubes. The downstream capillary delivers wire to the nozzle, while the center capillary is notched (or made from two pieces, possibly with an anvil) to allow access of the blade to the wire, whereas the upstream capillary guides wire from the spool. In some embodiments center and upstream capillaries may be combined into one capillary that is notched on both sides to allow roller access, while in other embodiments in which wire/capillary friction is low, a single notch and a single drive roller may be used. Not shown are mounting and adjustment elements (e.g., to support idler rollers and adjust the wire guide position relative to the nozzle), the blade actuator (e.g., solenoid or air cylinder), an actuator to rotate the WSF around its axis of rotation (e.g., coincident with the center of the nozzle orifice), slip rings (if applicable) to supply power to the motors at any WSF orientation, a cooling nozzle to rapidly cool the extrudate (e.g., etc., located 180 degrees opposite the downstream capillary, and supported so as to rotate with the WSF), apparatus used to heat the wire (if applicable), etc.

Each motor shaft and idler roller form a roller pair: one upstream and one downstream. As is shown better in the closer 3-D views FIGS. 179(*c*) and 179(*d*), the blade may be angled as shown so the point of contact with the wire moves as it scores the wire through the notch in the center capillary, providing more efficient cutting and reducing local wear. In some embodiments the wire spool may be horizontal (i.e., have a vertical rotation axis) and in some embodiment variations the spool may surround the extruder. The spool may be oriented at other angles as well. In some embodiments, multiple WSFs may surround a single extruder (e.g., three WSFs 120 degrees apart) so that multiple filaments (e.g., round copper wire, flat copper wire, glass fiber for reinforcement) can be introduced into the extrudate: the angle of the multiple-WSF subsystem would be adjusted so that the active WSF is made tangent to the nozzle path, for example).

The downstream capillary of the WSF (or capillaries in the case of multiple WSFs)—or else the entire WSF— should be able to be lifted by a short distance when not needed so that the capillary does not collide with materials already deposited on the layer.

FIGS. 180(*b*), 180(*c*), 180(*d*), 180(*e*), 180(*f*), and 180(*g*) depict in plan view a sequence of steps in delivering a wire segment with the apparatus of FIGS. 179(*a*), 179(*b*), 179(*c*), and 179(*d*), while FIG. 180(*a*) shows all components of the apparatus with the wire about to be fed toward the nozzle. In order to feed a wire segment through the three capillaries, both pairs of rollers turn at the same speed as shown in FIG. 180(*b*). In the position shown in FIG. 180(*b*), the distal/downstream end of the wire is in a position to be encapsulated by matrix material issuing from the nozzle if further fed by the rollers, or passively pulled through the capillaries. When the control system, based on design data, determines that the currently-dispensed wire segment is to be terminated and thus the wire is to be severed, the rollers briefly stop and then in some embodiments are rotated so as to feed wire in opposite directions. Or, as shown in FIG. 180(*c*), the downstream roller, if provided with a means of slipping (e.g., reduced current, a low friction surface contacting the wire, a slip clutch) may rotate so as to pre-tension the wire, if desired. (e.g., especially if there is nothing to stop the wire from moving during scoring). The blade is then advanced through the notch to score the wire as in FIG. 180(*c*) while the wall of the central capillary opposite the notch prevents the wire from moving excessively. The blade is then retracted, as shown in FIG. 180(*d*). Scoring can be performed while the wire is not advancing through the capillary, or in some embodiments while it is.

In FIG. 180(*e*), the scored wire has been optionally advanced further downstream within the center capillary by the rollers so that the score is downstream from the region of the notch when it breaks; this can minimize the risk of a distortion in the wire interfering with feeding (e.g., a burr catching on the edge of the notch). If both upstream and downstream rollers rotate with the same tangential speed, tension in the wire will not be low or zero, and so the wire will not prematurely break. In FIG. 180(*f*), the wire is tensioned and (possibly after stretching and necking) broken in the vicinity of the score—its weakest point—by rotating the downstream rollers, or in some embodiments the downstream/distal end of the wire is anchored in the part and the downstream rollers turn passively or are disengaged while the upstream rollers are stopped (or rotated to feed wire upstream, in the opposite direction). In FIG. 180(*g*), the wire has been broken into two pieces: a segment and the remainder of the wire upstream of it. The segment has moved further downstream while the nozzle has advanced relative to the printed part, while the tip of the remaining wire is positioned similarly to the wire in FIG. 180(*b*), thus allowing the process to repeat. Movement of the segment can be the result of being pulled passively through the capillaries, or being pushed along by the advancing tip of the remaining of the wire. Depending on their lengths and the length of the capillaries, multiple wire segments can be produced and stored within the center and/or downstream capillaries, ready for delivery. To minimize the risk of segments falling spontaneously out of the downstream capillary (e.g., due to vibration), frictional elements may be added to the capillary such as small leaf springs within the capillary lumen, elastomer elements within the capillary lumen, external elements pressed against the wire through an aperture in the capillary, etc. These elements can also serve as electrical contacts if resistive heating of the wire is implemented.

In some embodiments in which the exact position at which the wire breaks is not critical, wire can be segmented without scoring, with breakage occurring between the locations where tension is applied to the wire (e.g., where the wire is impinged upon by the two pairs of rollers).

In some embodiments, only a single pair of rollers is required in a wire segment feeder, and in which there is no risk of the segmented wire catching on any edges and jamming even if it is distorted, since the broken end is already within the downstream capillary. Thus such a WSF can be lightweight, compact, and highly reliable. FIGS. 181(*a*), 181(*b*), 181(*c*), 181(*d*), 181(*e*), 181(*f*), 181(*g*), and 181(*h*) depict in plan view a WSF in which the downstream capillary is deformable and thus can be pinched by a jaw moved by a suitable actuator so that its inner wall(s) impinge on the wire within and prevent movement. In some embodiments the downstream capillary may be made using a superelastic alloy such as nickel-titanium or a polymer and is preferably harder than the wire and thus wear-resistant. Or, the capillary may be made from a less elastic material but have very thin walls (the inside surface of the capillary lumen can be continuous, but the outside surface can be machined to thin the wall). In some embodiments the actuator is a stepper motor-based linear actuator with lead screw, a shape memory alloy actuator (producing a high level of force with minimal size and weight), a piezoelectric actuator, or other actuators known to the art.

FIG. 181(*a*) shows all components of the apparatus with the wire about to be fed toward the nozzle. In some embodiments a single moving jaw is used, with an optional anvil opposite the jaw to prevent capillary movement (though other methods may be used), while in other embodiments two jaws may impinge on the capillary; these may be driven by a single actuator (e.g., the jaws may be similar to plier jaws with a single actuator pulling them together). A center capillary and upstream capillary are depicted in the embodiment shown in the figures, separated by a gap, and with an optional anvil to stabilize the wire within the gap to prevent it from bending while being scored. If the gap is small, however, the anvil may be unnecessary. In some embodiments all three capillaries shown may be replaced by a single, deformable, multiply-notched capillary: one or more upstream notches are provided to allow access of the roller(s) to the wire, and a notch is provided to allow blade access to the wire.

Figure 181A:
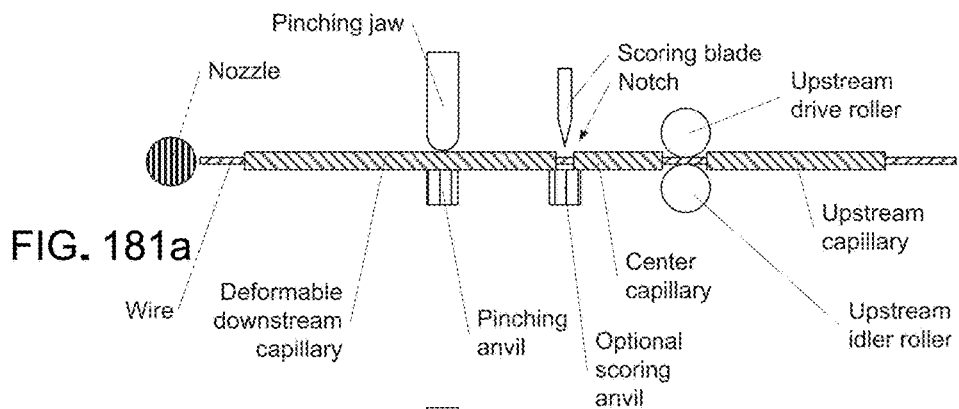
Figure 181B:
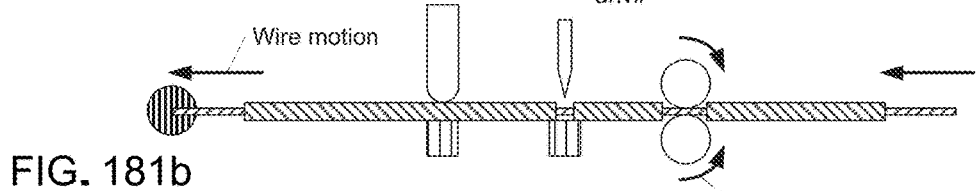
Figure 181C:
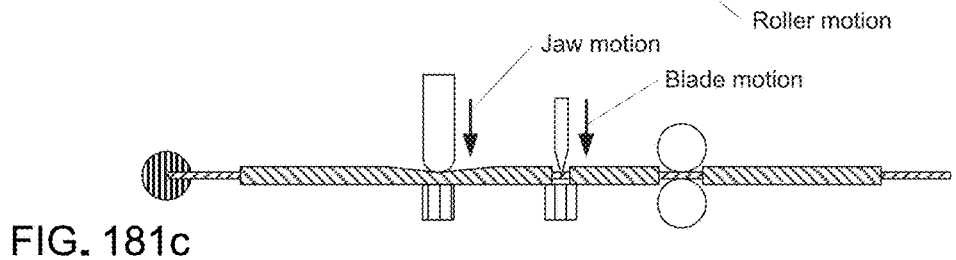
Figure 181D:
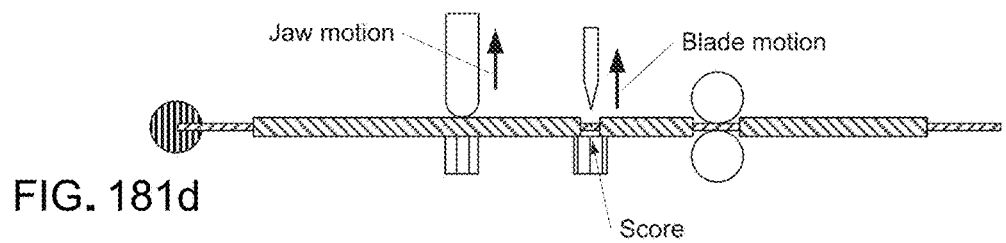
Figure 180E:
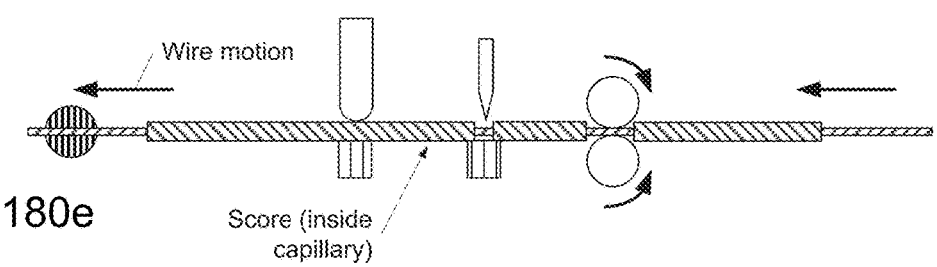
Figure 181F:
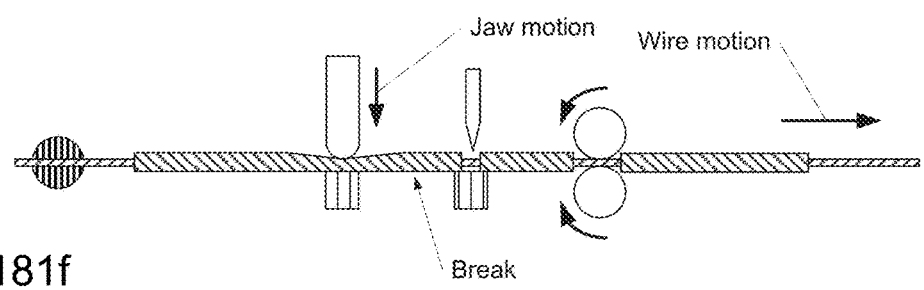
Figure 181G:
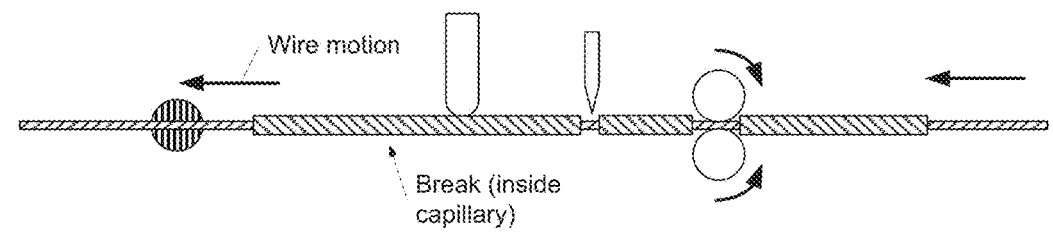
Figure 181H:
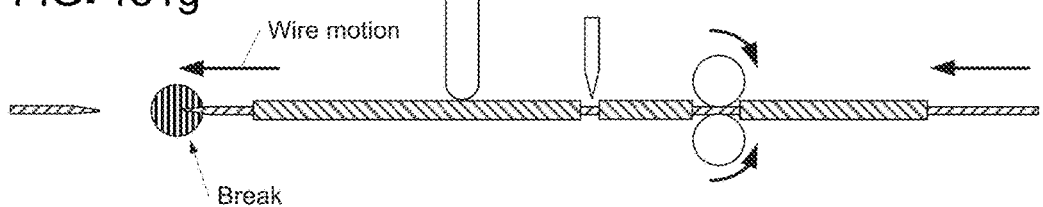

FIGS. 181(b), 181(c), 181(d), 181(e), 181(f), 181(g), and 181(h) depict a sequence for dispensing a wire segment. In FIG. 181(b), the rollers are rotating, feeding wire downstream. When the control system determines that the currently-dispensed segment is to be terminated and thus the wire is to be severed, the rollers briefly stop as in FIG. 181(c), and in some embodiments the jaw, which can be resting against the downstream capillary, now presses against it, pinching it to minimize movement of the wire within while the wire is scored. The scoring blade then scores the wire and retracts as in FIG. 181(d), and the jaw also retracts. In FIG. 181(e), the rollers are rotating, moving the wire, now scored, downstream such that the score is within the downstream capillary. In FIG. 181(f), the jaw has moved towards the wire, pinching it and preventing movement. Once the wire is immobile, the rollers reverse their normal feed direction and apply tension to the wire. The wire then breaks at the score to form a segment and the remainder of the wire upstream of it (FIG. 181(g)). The broken end of the remainder of the wire is already within the downstream capillary, so feeding it forward to repeat the cycle is not a problem: in FIG. 181(h) it has been bed forward so that its downstream end is now positioned where the dispensed segment's downstream end had been in FIG. 181(b).

The current-carrying capability of an insulated wire is determined by the material and cross-sectional area of its conductor, as well as its ability to dissipate heat generated by Joule heating effects. To produce efficient electromagnetic devices such as solenoids, motors, and transformers, wire—typically copper magnet wire coated with a thin insulator—is normally wound in coils as in the cross-sectional view of FIG. 182(a). As may be seen, the conductor occupies a large percentage of the coil cross-section, allowing for significant current handling. Coils printed using FEAM may, on the other hand, have considerably less wire as a percentage of their cross sections (the cross-sectional view of FIG. 182(b)), which comprise wire and an insulating matrix material, especially if the wire is of small diameter relative to the layer thickness. Moreover, the low thermal conductivity of the thick matrix makes it more difficult to dissipate unwanted heat.

Figures 182A, 182B:
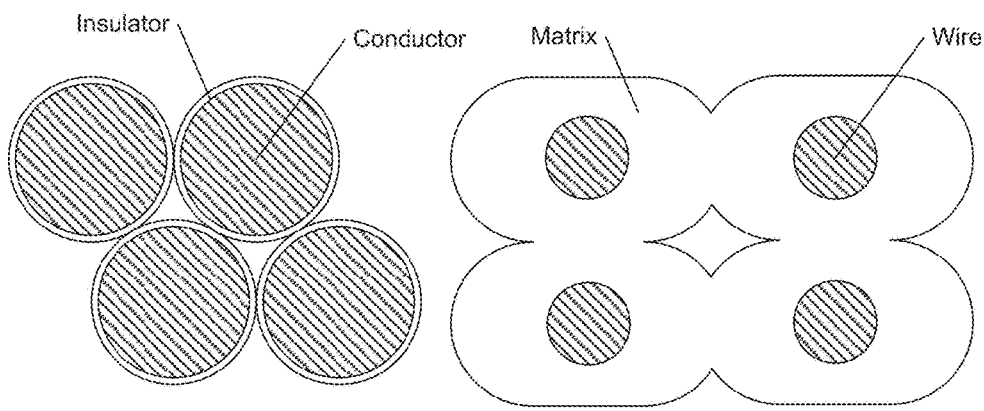
Figures 182C, 182D:
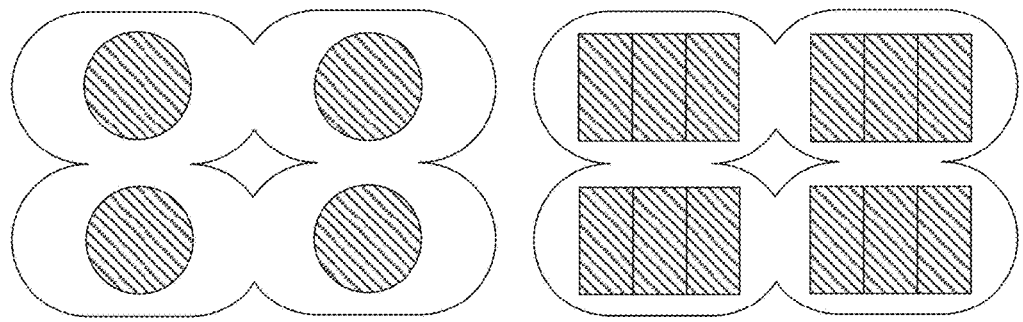

Several approaches may be used in various embodiments, and either singly or in various combinations, to maximize the cross-sectional area of wire within FEAM-produced interconnects and coils. The first of these is to use multiple small wires—effectively created a stranded vs. a solid wire—that better fills the "racetrack" shape typical of extrudates in FDM-like processes such as FEAM. Other approaches are illustrated (for coils) in the cross-sectional views of FIGS. 182(c), 182(d), 182(e), 182(f), 182(g). In FIG. 182(c), the first approach is to increase wire diameter while maintaining layer thickness, decrease layer thickness while maintaining diameter, or do a combination of both. This approach can work to the extent that the wires do not short together (e.g., remain separated by at least some thickness of matrix, given the required voltage, or are insulated (vs. bare) wires. Staggering the wires from layer to layer (as in FIG. 182(a)) can help reduce the risk of shorting.

As shown in FIG. 182(d), the second approach is to use single or multiple square or rectangular stands, which better fill the racetrack shape. Single rectangular wires can be bent within the plane of their widths (i.e., their larger dimension) using edge bending techniques known to the art, and such approaches can be miniaturized. However, in some embodiments it is preferable to use multiple strands which can bend more easily. Such multiple wires may be fed from individual spools or from a common spool, and through multiple capillaries converging onto the nozzle, or through a single capillary. However, in order to allow for curved trajectories (as in making coils), individual spools are preferred since wires on the outside of the turn can be fed (or can passively be pulled through the capillary) at a higher speed than those on the inside of the turn. In some embodiments three independent pairs of drive rollers may be used, while in other embodiments multiple strands from multiple wire spools can enter the upstream hypotube, and can be driven while pressed together between the rollers forced together by an actuator. At the beginning of a new wire segment when the wire is being anchored (or anytime the toolpath is straight, if desired), the strands can be fed at the same rate. While dispensing wire along a curved path, however, the rollers can separate so that each strand can be passively pulled independently. In some embodiments each strand can be independently actively driven. Capillaries for single or multiple rectangular wires may be circular in cross section, or may be of a cross-section that better controls wire (e.g., prevents it from twisting excessively). In the case of a common capillary for multiple strands, the capillary may be designed with multiple inlets at its upstream ends, and a common outlet at its downstream end.

Figures 182E, 182F, 182G:
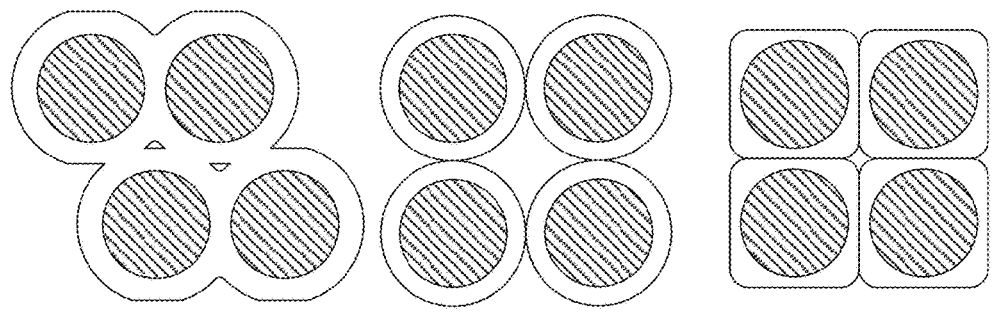
Figure 184G:
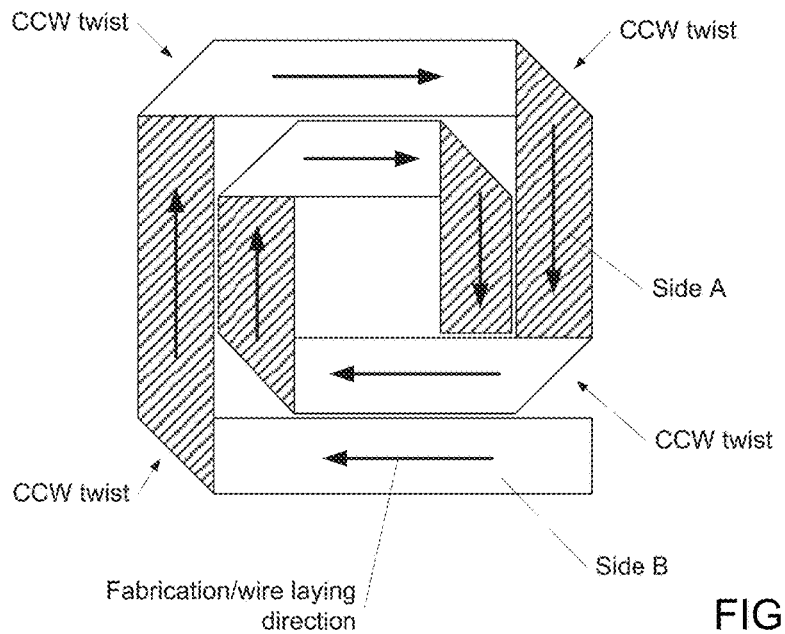
Figure 184H:
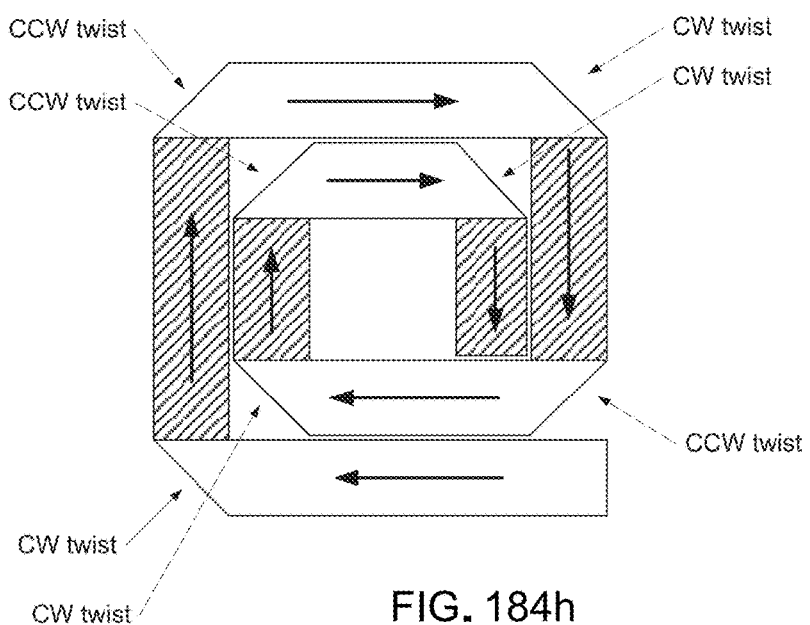

In lieu of or in addition to the above approaches in which the wire(s) are made to more closely match the normal extrudate shape, approaches may be used in some embodiments wherein the extrudate shape is made to more closely match that of the wire(s). FIGS. 182(e) and 182(f) depict two versions of another approach, in which the wire passes through a miniature version of an extrusion crosshead used for wire coating, such that wire enters the crosshead nearly horizontally, and the matrix material enters from the top (e.g., fed by a standard filament extruder) and envelops the wire while it passes through a channel in the crosshead. The resulting coating of matrix can be relatively thin, allowing wires to be placed closer together when forming coils with either staggered layers (FIG. 182(e) or non-staggered layers (FIG. 182(f)).

Another extrudate-shaping approach—explained in conjunction with FIGS. 183(a), 183(b), and 183(c) more completely—uses "fences" which control the extrudate shape. The result is a coil such as that shown in FIG. 182(g), in which the wire (circular here, though square or rectangular may be used in some embodiments) is surrounded by an extrudate whose normal side extents have been limited by the fence, minimizing the amount of matrix material and allowing closer packing of wires. An application for such closer packing is in printing circuits with more densely packed traces (i.e., smaller line and space).

FIGS. 183(a), 183(b), and 183(c) depict 3-D views of a nozzle equipped with fences to achieve insulated wires such as those shown in FIG. 182(g). The use of fences makes the printhead asymmetric (as does the capillary feeding the wire), so if the printed part does not rotate beneath the printhead, both the WSF (including capillary) and fences would rotate around the nozzle (e.g., keeping the side of the fence tangential to the nozzle motion with respect to the part). As shown in the close-up image of FIG. 183(a), the nozzle orifice is surrounded on both sides by fences-elements with surfaces that constrain and mold the extrudate so it cannot extend past the surfaces. The fences should preferably make intimate contact with the underside of the nozzle, so that little if any extrudate can enter between the fence and nozzle, where it could form a type of molding "flash" (however, if the extruded material is viscous, then since the pressure in the vicinity of the fences is low, a small gap may be acceptable). The surfaces of the fences can be flat, flat with filleted edges (e.g., vertical edges in contact with matrix material), cylindrical, or have other shapes that are best determined to produce smooth, controlled extrudate walls. It should be noted that such walls need not be flat or vertical (i.e., perpendicular to the layers), but if they are flat, the sidewall roughness of the printed part, and its transparency (if a transparent material is used) can be improved, especially if the walls are also vertical.

FIG. 183(b) shows the nozzle and fences from a wider viewpoint, along with the wire-feeding capillary, the wire, and the extrudate. The fences are supported by arms which allow them to independently move out of the way (e.g., upwards, away from the printed layers) when not needed and when printing under conditions that may risk collisions, e.g., with material already printed on the layer. In the figure, pivot holes (e.g., coaxial) may be seen at the tops of the arms to receive pivot pins (not shown) around which arms can rotate, either forward or backward with respect to the nozzle motion. FIG. 183(c) depicts (from a low angle) a nozzle equipped with fences supported by arms, printing a spiral coil from outside to inside. For such a geometry, only the left fence is needed to constrain the extrudate, and indeed, the right fence would collide with already-printed turns of the coil if it overlapped the layer. Thus the right arm has been pivoted so as to retract it and the fence to a position above the layer. In some embodiments fences may rotate and/or translate different in order to rise up above the layer. For example, arms supporting fences may pivot around parallel but non-coaxial axes such that the fences move away from one another in a direction that initially (for small displacements) is perpendicular to the extrudate long axis/nozzle velocity. Fences are preferably made from—or coated with—a material (e.g., a low surface energy material such as PTFE) to which the extrudate cannot easily adhere. However, fences in some embodiments may be cleaned (e.g., by rubbing across a brush) when they are retracted and not in use.

In some embodiments in lieu of rotating fences as shown in FIGS. 183(a), 183(b), and 183(c), translating fences may be used. For example, retractable pins with square or circular cross section can be introduced on either side of the orifice through holes formed in the nozzle, and serve as fences. The pins can, for example, extend upwards through the hot end of the printhead, if applicable, and be actuated by shape memory alloys (e.g., a Ni—Ti wire which shortens, pushing a spring-loaded pin resting against its side downwards), or by fluidic, electromagnetic, or piezoelectric actuators located at some distance from the nozzle and hot end, and thermally isolated if desired. The pins need not be straight or vertical: for example, a superelastic pin can be delivered through a curved channel. When a fence is to be withdrawn (to allow wider extrudates to be formed, e.g., to speed up printing, or to avoid collisions with printed material), the pin(s) need merely to be retracted by the actuator(s). If the pins pass through holes that are only slightly oversize, then withdrawing them can accomplish a self-cleaning action, since matrix material attached to them would be scraped off and remain at the nozzle bottom surface.

In some embodiments, in lieu of movable fences, a single fixed fence built into the nozzle, similar to the guide of FIGS. 143(a), 143(b), 143(c), and 143(d) may be used to constrain and shape the molten material. The nozzle can be actuated so as to rotate such that the fence is always tangential to the nozzle motion. Since the guide only contains material on one side, it cannot produce extrudates which are narrow on both sides of the wire. However, for spiral coils, this can be acceptable since the extrudate is constrained on one side by neighboring turns for all but the first turn of the spiral. If the coil winds inwards and then winds outwards without a junction in the wire (e.g., FIG. 185(e)), then the nozzle can rotate (e.g., 180 degrees) after the inwards spiral is completed and before the outwards spiral is started.

In some embodiments, in order to print coils (or interconnects) with a high percentage of metal as a function of total interconnect volume, pre-insulated wire may be used, in which case this may be printed with little if any matrix material, without concerns over shorting. While the use of insulated wire can make forming wire-wire and wire-pad junctions more difficult, this is not necessarily the case with solderable magnet wire, which has a coating (e.g., comprising polyurethane) which is removed in the process of soldering. For example, Soderon® FS/155 Magnet Wire (Essex Group, Inc., Fort Wayne, Ind.) is a solderable magnet wire typical available as a coated copper wire in sizes 7 to 31 AWG. Such a wire can be soldered using solder paste and laser soldering methods.

In some embodiments, rather than printing using fibers such as metal wires (e.g., circular, square) which are substantially equiaxed in cross-section, printing using flat, ribbon-like fibers may be done. In such fibers, the wire thickness (dimension along the Z or layer-stacking direction) and width (dimension in the planes of the layers) provides a low thickness/width aspect ratio. Use of flat wires can offer certain benefits such as 1) allowing thinner layers, through the use of thin wires (with widths adequate for the required current); 2) filling a higher percentage of the cross-sectional area of the printed trace with wire; 3) providing flat pads for attaching components; 4) facilitating the printing of large metal areas (e.g., for ground and power planes, capacitors, patch antennas, etc.); 5) providing flat, broad electrical contacts/pins to facilitate printing connectors (e.g., for a USB device).

If the aspect ratio is too low, it can be very difficult to edge bend wire within the plane of the layer, as may be done very easily with circular or square wire, or example. Thus, in lieu of creating such bends in order to change the direction of the wire, in some embodiments the wire is instead folded at an angle that will provide the desired new direction. While having the wire lie flat and folding it doesn't lend itself readily to forming wire into arcs and circles, it nonetheless allows very complex wire paths to be printed.

FIGS. 184(a), 184(b), 184(c), and 184(d) depict plan views of flat wire. The wide sides of the wire are designated A and B, while the narrow (i.e., vertical) sides are ignored in this discussion. In FIG. 184(a), the wire follows a straight path, being printed in the direction shown by the arrow, and only side A is up. In FIG. 184(b), however, the wire has been folded along a 45-degree crease which causes the wire downstream of the bend to have its side B up and follow a path that is rotated 90 degrees from the original path. In FIG. 184(c), the wire has been folded with a crease having an angle less than 45 degrees from the original path, while in FIG. 184(d) it has been folded with a crease having an angle of more than 45 degrees. In general, the angle, gamma, between the wire downstream of the fold and its original direction, will be twice that of the angle, delta, between the crease and the original direction of the wire, as shown in FIG. 184(*d*).

The wire can be fed through a capillary (e.g., the downstream capillary) having a suitable cross-sectional shape (e.g., rectangular, elliptical) that allows torque to be applied to the wire. To fold and crease the wire, the capillary can be rotated by 180 degrees (flipping side A so it faces downwards and side B so it faces upwards) while the capillary is re-oriented with respect to the printed part (e.g., by rotating the part or capillary similarly as when performing FEAM with round wire), thus determining angles gamma and delta. The wire may be ductile (e.g., annealed copper) in which case the crease can be flattened at least to some extent by suitable means, so that the total thickness of the fold equals, or slightly exceeds, twice the wire thickness: minimizing the thickness of the fold can be important such that the fold is thinner than the layer surrounding it. Flattening/creasing the fold can be achieved in some embodiments by pressing the upper wire down towards the lower wire using the nozzle, using a tool attached to the printhead (e.g., a blunt probe, a roller), etc. While the wire is being delivered, it can be encapsulated with matrix material, and if the material is sufficiently molten, the wire can be folded and creased within it in some embodiments. In other embodiments, matrix material may be deposited on and near the wire intermittently (e.g., just upstream and downstream of a fold, over a crease) as a means of anchoring the wire; in some embodiment variations this can be followed by depositing matrix material (possibly a lower-temperature material that doesn't remelt the anchoring material) over all or most of the wire to complete the layer.

Because it can be difficult for some matrix materials to flow around a wire having a low aspect ratio, in some embodiments the wire is initially dispensed so that its width is not parallel to the layer plane, but at an angle (e.g., 90 degrees), and after the material flows around it, it is re-oriented before the material solidifies. When it is desirable to print coils, on the other hand, the wire can be printed with its width vertical, which allows tight, smooth (non-polygonal) spiral shapes to be printed.

With the ability to print with flat wire along complex paths, it becomes possible to produce large, nearly-continuous metal areas from wire, as is depicted in FIGS. 184(*e*), 184(*f*), and 184(*g*). The relative size of the structures shown such as the wire width and gap between wires—like all figures in this specification—are not necessarily to scale. Moreover, although a roughly rectangular region is depicted being formed by wire in the figures, more complex 2-D shapes can be formed.

In the plan view of FIG. 184(*e*), the wire is printed into a serpentine pattern to define a rectangular region, with two folds (e.g., two 90-degree redirections) at the end of each straight run to reverse the direction of printing. Gaps between the straight runs of wire may be provided as shown (e.g., to allow matrix material to completely surround each run and tack it down) and may be considerably larger than shown. In some embodiments along the printing direction, the first two folds (to reverse direction) comprise counter-clockwise (CCW) twists of the wire, while the next two folds (to reverse direction again) comprise clockwise (CW) twists. This pattern—alternating between pairs of CCW and CW twists, then repeats as printing continues. As depicted in the plan view of FIG. 184(*f*), in other embodiments the pairs of twists can be arranged differently: at the end of the first run there is a CCW twist, but this is followed by a CW twist in which the wire is tucked underneath the wire immediately downstream of it, rather than overlying it as in FIGS. 184(*b*), 184(*c*), 184(*d*), and 184(*e*). After completing the 180-degree turn, reversal is accomplished by applying a CW and then a CCW twist. In the case of both the pattern of FIG. 184(*e*) and FIG. 184(*f*), the twist pattern (alternating pairs of CCW and CW twists such as CCW-CCW-CC-CC-CCW-CCW-CC . . . ) is identical, but the location of those twists differs: in one version, each reversal requires two similar twists, while in the other version, the reversal requires two opposite twists.

To the extent that gaps between runs are objectionable, at least one other layer of wire (adjacent or several layers away) can be printed in which the direction of the straight runs is non-parallel to the first layer of wire, thus "plugging" the gaps.

FIG. 184(*g*) shows in plan view an alternative approach to forming a large area from wire in which the wire is delivered along a spiral path. In this case, the spiral is rectangular, with four corners/direction changes per turn, but other shapes are possible (e.g., octagonal spirals with eight direction changes per turn).

If a wire must change direction multiple times there is potential to torsionally "wind up" the wire between the printed part and the spool due to the 180-degree twists required each time the wire is folded. To avoid this, in some embodiments the wire spool is rotated as well as the capillary and wire, while in some embodiments the twists are not allowed to accumulate by implementing twist reversals as needed. For example, in the patterns of FIGS. 184(*e*) and 184(*f*), the paired CCW and CW twists cancel one another out. However, in the spiral pattern of FIG. 184(*g*), in which the wire always turns in the same direction, the wire twists CCW at each time, as seen from the capillary as shown. In such a case, a rotating spool can be used. Or, CW and CCW twists can both be used (e.g., approximately equal numbers) to avoid torsion accumulation, such as in the plan view of FIG. 184(*h*).

It can be challenging to fully encapsulate flat wire—as compared with more equiaxed wire—with matrix material when the only source of the material is above (i.e., on one side of) the wire (e.g., an extruder nozzle). In some embodiments, in addition to a nozzle delivering material from above the wire, a channel may be used below the downstream capillary, and for example, running alongside it in parallel, to introduce material below the wire as well. The flow of material under the wire can also minimize any tendency for the wire (whether flat or equiaxed) to be pushed downwards by the flow of material from above, helping it remain more centered vertically. The channel (e.g., a metal tube) moves (e.g., rotates) along with the capillary as needed. In some embodiments, fences such as those in FIGS. 183(*a*), 183(*b*), and 183(*c*) can incorporate apertures on their surfaces intended to introduce matrix material along the side and/or underneath the wire. In some embodiments, rather than a single central orifice, the nozzle can include two or more orifices arranged along a line that is perpendicular to the wire axis (i.e., straddling the wire); matrix material issuing from these orifices can more easily go around the wire, whether flat or equiaxed.

In some embodiments, especially those using flat wire and/or fences, stranded, perforated, or Litz wire can be used instead of solid (i.e., monofilament) wire so that matrix material need not be forced to flow around a large single wire, but can flow around smaller strands or through perforations. In some embodiments the flow through the nozzle can be pulsed instead of continuous, to aid in uniform encapsulation of the wire; this can be achieved for example using a small oscillating piston in a cylinder formed in the hot end (or nozzle).

If flat wire is desirable, wire need not be flat to begin with, but can be flattened by crushing as needed, and in the regions it is needed. Thus, for example, wire can be round in cross-section when following curved trajectories, but when a flat region is needed for a patch antenna or capacitor or connector contact, it can be flattened over a specified length. Flattening can be accomplished with ductile wire such as copper (or tin-coated copper) using pressure from rollers that are used in the WSF, such as the downstream rollers of FIGS. 180(a), 180(b), 180(c), 180(d), 180(e), 180(f), and 180(g). The drive and/or idler roller can be forced against the opposite roller by a suitable actuator (e.g., pneumatic, hydraulic, motor-driven lead screw), flattening the wire (i.e. decreasing thickness, increasing width, and producing a flat top and bottom). If the rollers are oriented as shown (axes vertical) then the wide dimension of the wire will initially be vertical, but the wire can be twisted if needed by approximately 90 degrees so that the wire lays flat. Or, in some embodiments the rollers are oriented at other angles (e.g., with their axes horizontal).

Flat wire is generally best delivered using a WSF in which at least the downstream capillary is shaped so as to prevent twisting (e.g., rectangular, elliptical, or racetrack-shaped). If the WSF can deliver both flat and round wire (e.g., wire that is flattened from round to flat by the WSF rollers, or simply wire that is sometimes round and sometimes flat, depending on what is loaded into the WSF), then capillaries can be shaped so as to accommodate either one. In some embodiments the cross-section of the capillary lumen may be shaped according to the Boolean union of a circle and a rectangle that overlaps it on center or off-center (e.g., forming a keyhole shape), thus allowing the capillary to accommodate both wire shapes, while preventing twisting of flat wire.

Rotary and linear motors, both stepper motors and motors for continuous rotation (e.g., brushless DC motors, synchronous motors) can be produced using FEAM technology. These may incorporate permanent magnetic materials which are inserted (e.g., sintered magnets inserted into a device during or after fabrication) or which are printed (e.g., NdFeB, SmCo, or ferrite powder mixed with a binder and printed using FDM-like methods). Variable reluctance (VR) devices may also be produced, in which only soft magnetic materials such as iron, steel, cobalt, nickel, alloys (e.g., nickel-iron) are used. These materials may be incorporated into devices as solid objects (e.g., blocks, foils, wire), may be built up by depositing soft magnetic composite (SMC) materials, may be built up using cold spray and capillary cold spray methods, ultrasonic welding, etc.

FIGS. 185(a), 185(b), 185(c), and 185(d) depict in 3-D views an exemplary design for an axial flux, VR rotary stepper motor having six stator poles and eight rotor poles. In the design shown, three stator poles would suffice to produce rotation, however, six poles are used to increase torque. The design shown has a step size of 15 degrees, but can be microstepped with appropriate drive electronics. Other combinations of stator and rotor pole pieces are possible, such as eight stator poles and six rotor poles. While the motor shown is considered an "inboard" motor (with an internal rotor), similar motors that are "outboard" (with external rotors) can also be designed; such motors may be preferable for use in unmanned aerial vehicles, for example. Similar designs can be used for motors providing continuous rotation such as switched reluctance motors. For such motors, sensing of rotor position can be provided, if required, by incorporating holes or other features in the printed rotor, and incorporating sensors (e.g., Hall effect, photosensitive) in the stator or related components, for example. However, sensorless (e.g., DSP-based) techniques for driving the coils can also be used.

Figure 185A:
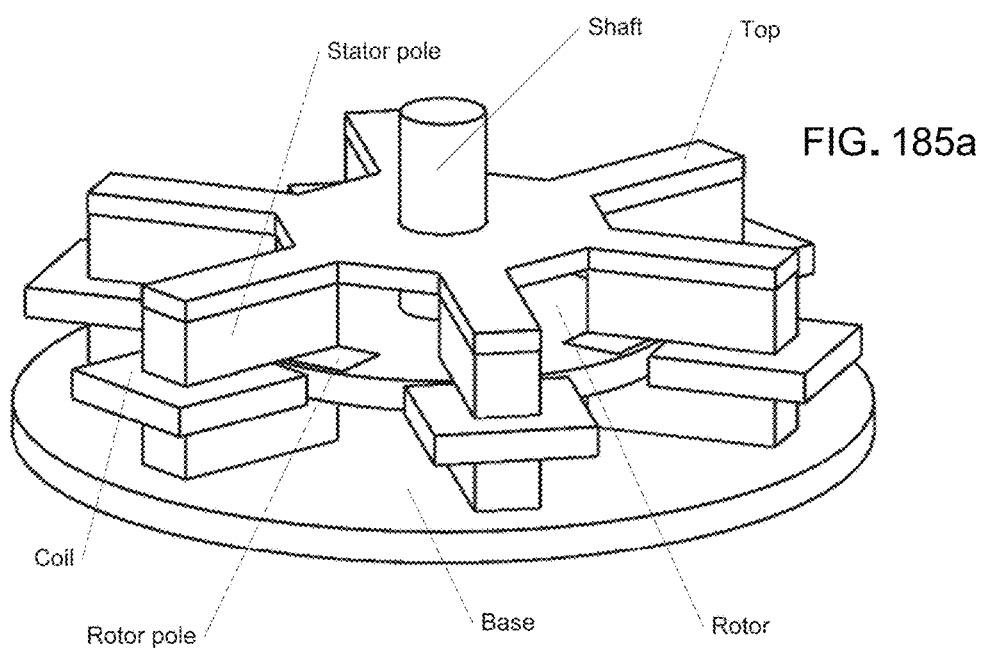
Figure 185B:
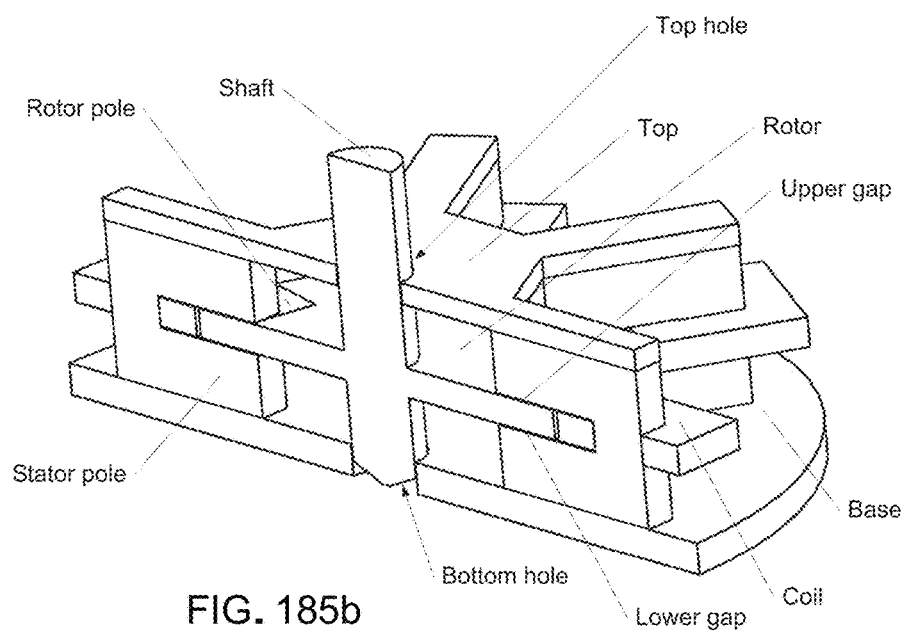
Figure 185C:
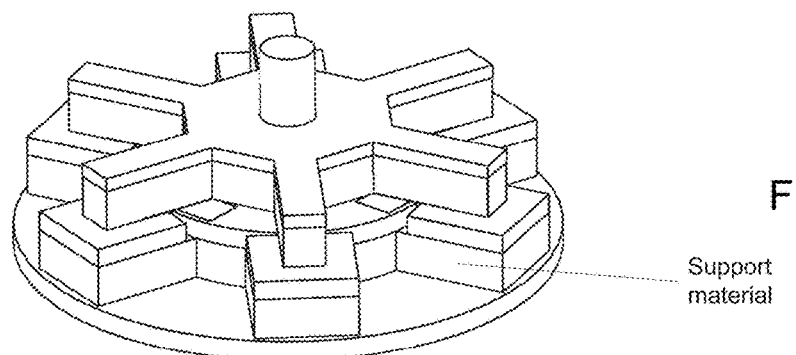
Figure 185D:
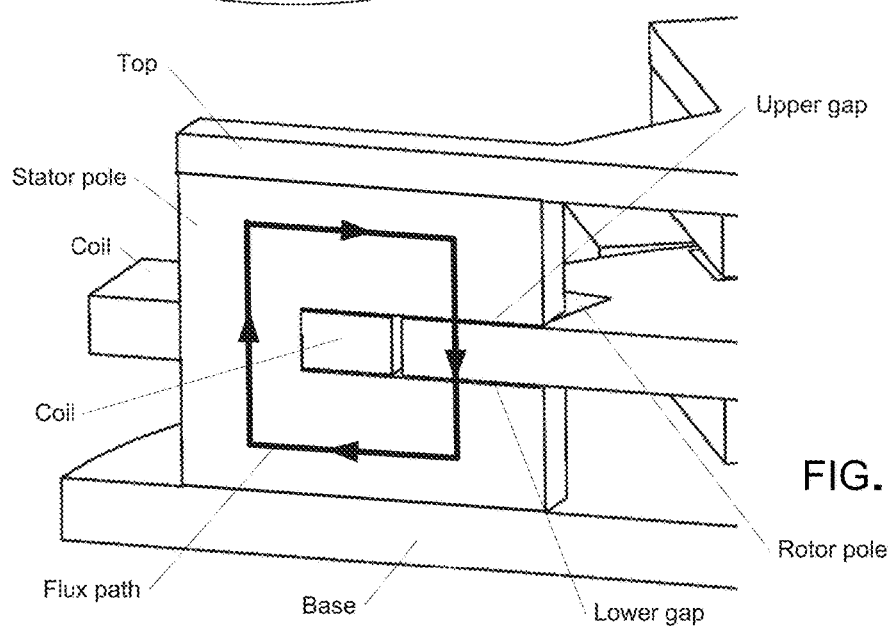

FIGS. 185(b) and 185(d) are cross-sectional 3-D views. The motor comprises a rotor with multiple pole pieces incorporated, a shaft fixed to the rotor, a base, a top, multiple stator poles, and multiple coils. The main body of the rotor may be fabricated from a non-magnetic, possibly dielectric material such as a thermoplastic, with cavities to receive the rotor poles. The rotor and stator poles may be fabricated from ferromagnetic material: for example, an SMC may be deposited into a cavity, or directly printed (e.g., by extrusion). While aspects of the motor shown in FIGS. 185(a), 185(b), 185(c), 185(d), and 185(e) are similar to some "salient pole" motors, since the rotor is composed of non-magnetic material, there is no need for the poles to protrude, and they can be flush with the rotor if desired. The shaft may be composed of any desired material, such as a polymer, composite, or metal that is printed, a solid object (e.g., a steel rod) that is inserted, etc. In the design shown, the shaft is designed to rest due to its weight against a smooth surface on which the motor is placed, forming a bearing and allowing the upper and lower gaps between the rotor and stator poles to be maintained. The bottom of the shaft is tapered to reduce friction with that surface. In some embodiments other types bearings may be used, including bearings which involve placing plastic, ceramic, or metal balls into the motor during printing or afterwards. An advantage to inserting balls—in addition to replacing sliding friction with rolling friction—is that the balls can fill clearances between parts fabricated monolithically without assembly. When it is desirable to use a sleeve vs. a ball bearing, however, and the bearing is to be fabricated monolithically, excessive shaft/bore clearance may be an issue. In some embodiments the shaft is designed with compliant elements that allow it to be expanded in outside diameter by the insertion of an object (e.g., a ball) during or after fabrication, thus reducing the clearance (similarly, the inside diameter of the bore could be reduced). A bushing handling both radial and thrust loads can be made using a shaft with an approximately spherical section that is expanded into a bore of similar shape. Approaches based on inserting objects, releasing built-in stresses, building in moveable elements that can be retained in new positions (e.g., by local melting, by ratchets) can in general be used to reduce clearances between moving elements.

The base and top include holes to accept the shaft, thus serving as radial bushings, and the stator poles are fixed between them. Surrounding each rotor pole is a coil such as a multi-layer, multi-turn coil. FIG. 185(c) depicts the motor as-fabricated, with support material (e.g., soluble support such as PVA) in locations where required to support the structure. FIG. 185(d) depicts the coil and stator poles in more detail, and the closed-loop path of magnetic flux (shown approximately and shown flowing clockwise, but which may actually flow counterclockwise) flowing through the upper horizontal portion of a stator pole, the upper air gap between stator and rotor poles, the rotor pole, the lower gap, the lower horizontal portion of the stator pole, and finally, closing the loop through the vertical portion of the station pole. The overall flux path is short, reducing iron losses in the motor. When the coils are energized and no rotor poles are aligned with the energized stator poles, the nearest poles will be attracted to the stator poles so as to minimize the reluctance of the motor, thus causing the rotor to rotate through an angle. By turning on current to groups of stator poles in the proper sequence as is known to the art, rotation may be continued, allowing for 360-degree motor operation.

Figure 185E:
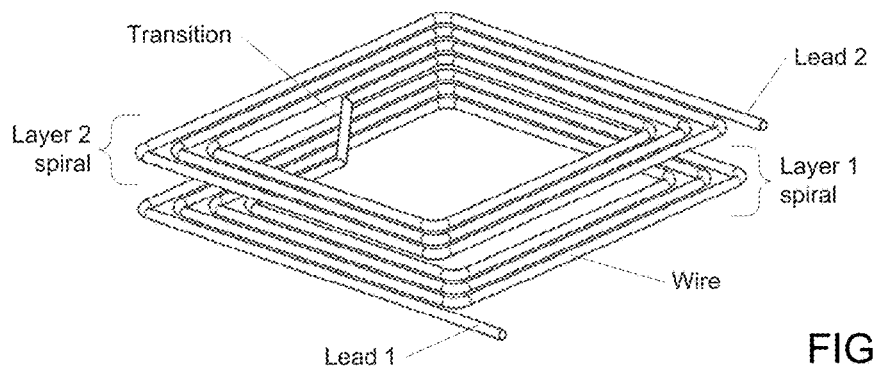

Lastly, FIG. 185(e) depicts a 3-D view of a coil that can be printed with FEAM for use in the motor or other devices. The coil comprises spiral turns on multiple layers: for clarity, only about three turns are shown, and only about two layers are shown in the figure. Since it is desirable in some embodiments to minimize the number of junctions, coils with many layers can be built from sub-units, each comprising two spiral coils as shown in FIG. 185(e), which can be printed using a single wire segment. The spirals on each layer are connected to one another through transitions which extend vertically or diagonally to bridge layers. Transitions may be made of wire (i.e., the wire need not be broken/cut, but can simply be redirected into another layer) or if two wires are involved, can comprise any conducting material (solder, ECPC, etc.). The spiral turns on even and odd layers alternate, such that current flows always in consistent direction. In the example shown, current flows inwards (or outwards) on lead 1 on layer 1, spirals clockwise inwards, then transitions to layer two, continuing to flow clockwise but now spiraling outwards, and ultimately exits the coil on lead 2. A coil with more than two layers would have a transition between layer 2 and layer 3 near the outer part of the spiral, in lieu of lead 2, since some transitions must be near the center of the spiral (e.g., continuous wire) and some (e.g., solder) near the periphery. Other coil windings are possible, including ones in which all external ends of the spirals are connected together in parallel and to one lead, while all internal ends of the spirals are connected together in parallel and to another lead. If a coil such as that of FIG. 185(e) is produced from a single wire segment, then the thickness of each layer of the coil is preferably half that of the thickness of layers in the surrounding device, and the order of fabrication for the two layers X and X+1 which include the coil is: 1) print everything on layer X other than the coil; 2) print the double-spiral coil, starting on layer X and ending on layer X+1 (note: multiple coils can be printed at this time); 3) print everything on layer X+1 other than the coil.

FIG. 186(a) is a 3-D view of a method of fabricating a stator pole having a design similar to that of FIGS. 185(a), 185(b), 185(c), 185(d), and 185(e), while FIG. 186(b) is a cross-sectional elevation view of a fabricated stator pole. In the method illustrated, soft magnetic material is provided in the form of blocks (e.g., rectangular prisms as shown, but potentially other shapes (e.g., other space-filling shapes such as hexagonal prisms) may be used, as well as non space-filling shapes such as cylinders of equal diameter. Blocks may be inserted into a housing (e.g., with thin walls) that is 3-D printed to accommodate them, and insertion may occur during fabrication or afterwards (backfilling of such a housing with SMC is another method to create poles). For example, the blocks in FIG. 186(b) could be inserted after printing the housing, with blocks in the lower half inserted from the bottom, and blocks in the upper half inserted from the top. Or, if blocks must all be inserted from the top, then insertion of lower blocks must occur during fabrication by pausing printing at one or more locations where insertion of a block would not interfere with further printing (i.e., the cavity is deep enough), inserting one or more blocks, and then continuing.

Since at least small gaps between blocks are inevitable, and since such gaps have high magnetic reluctance, it is desirable to minimize the number of gaps along the flux path. For rectangular prism-shaped blocks, an arrangement that accomplishes that for a stator pole is shown in FIGS. 186(a) and 186(b), in which blocks are inserted with their long dimensions both horizontal and vertical, since the flux path is a closed loop. Blocks are not necessarily of the same length, though if of the same length, it may be easier to maintain an adequate supply in the printer, and dispensing may be simpler. Since the flux through rotor poles is vertical, such a pole would best be constructed solely from blocks with their long axes vertical. Blocks may be coated with an adhesive (e.g., a pressure sensitive adhesive, possibly covered with a strip that is peeled off as they're dispensed) to retain them, or if inserted into a cavity, the cavity may contain an adhesive (e.g. a low viscosity slowly-hardening one, allowing it to seep into the void space between blocks), or they may be held in place by friction and/or the material deposited around and over them to encapsulate them, which in some cases may be deposited between layers or groups of blocks. If a material fills gaps between blocks, it may in some embodiments contain magnetic particles (e.g., the material can be an SMC or ferrofluid) to minimize reluctance.

Figure 187A:
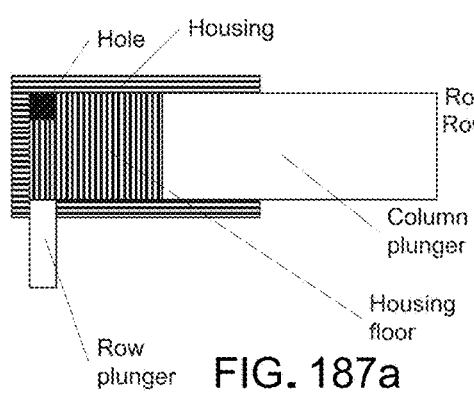

Blocks may be inserted by a variety of manual and automated pick and place methods, including using pick-ups that are magnetic, or which incorporate vacuum or an adhesive, etc. Blocks may be dispensed from a cartridge directly into printed cavities, or dispensed and fed to pick-ups. FIGS. 187(a), 187(b), 187(c), 187(d), 187(e), 187(f), 187(g), and 187(h) depict in plan view a cartridge comprising a housing and two plungers—narrow and wide—used in some embodiments to dispense blocks (in this case, in the form of rectangular prisms), e.g., to manufacture a magnetic pole (however, blocks of various shapes may be used for a number of other purposes, such as serving as drive shafts, reinforcing elements, vertical/interlayer vias, magnets (if made from a permanent magnet material), etc.). In FIG. 187(a), the housing is empty. A hole through which blocks can be ejected (e.g., downwards, perpendicular to the plane of the figure) by pushing, pulling, or simply falling out, is shown in one corner of the interior volume. The housing may be designed with such dimensions, or from such materials (e.g., with elastomeric surfaces) that blocks do not move readily without being pushed by a plunger.

Figure 187B:
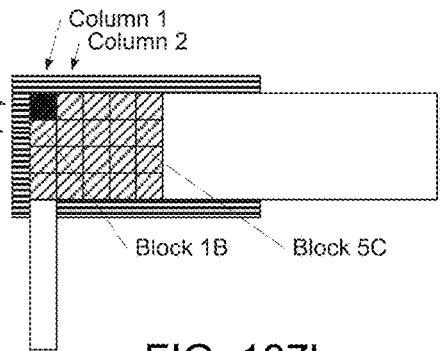
Figure 187C:
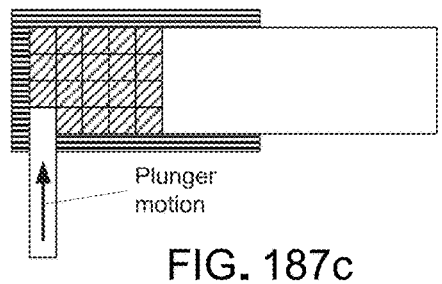
Figure 187D:
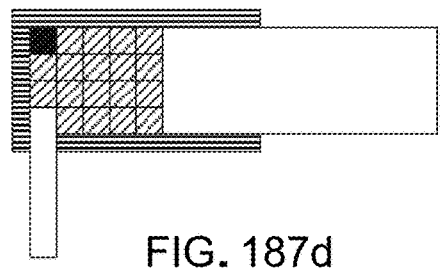
Figure 187E:
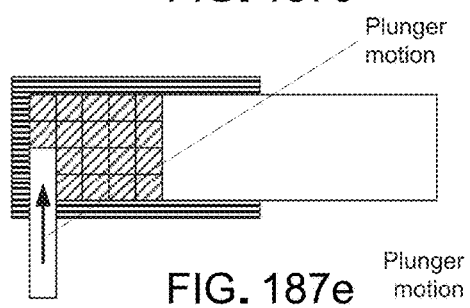
Figure 187F:
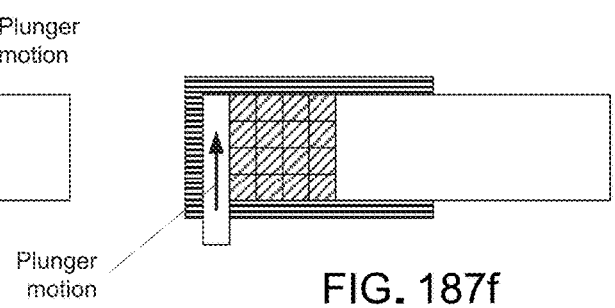
Figure 187G:
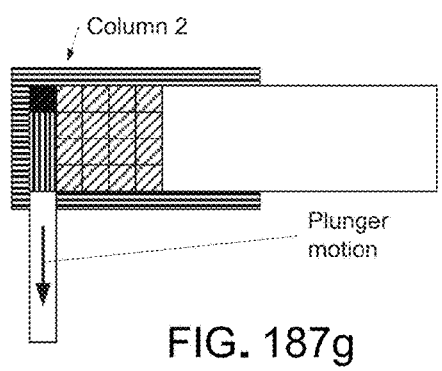
Figure 187H:
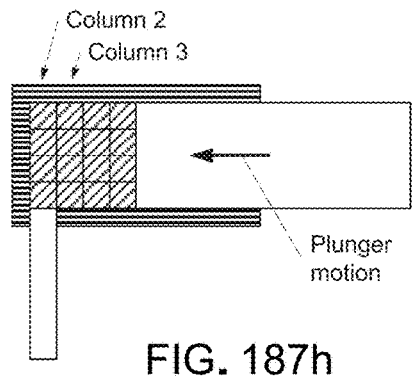

In the plan view of FIG. 187(b), the housing has been filled with blocks forming numbered columns (e.g., 1, 2) and lettered rows (e.g., A, B) and the block over the hole has already been ejected (e.g., by a pin being lowered to force it out), where for example it may enter a magnetic pole housing as in FIG. 186. FIGS. 187(c), 187(d), 187(e), 187(f), 187(g), and 187(h) depict in plan view a sequence for ejecting additional blocks. In FIG. 187(c), a narrow plunger has pushed forward all the blocks in column 1. Once a block is over the hole, it can be ejected, as may be seen in FIG. 187(d). In FIG. 187(e), the narrow plunger has advanced again, pushing the blocks in column 1 forward, and in FIG. 187(f), all the blocks in column 1 have been pushed over the hole, one at a time, and been ejected. At this point, the narrow plunger retracts as in FIG. 187(g). Next, the wide plunger advances, pushing the blocks in column 2 into the location formerly occupied by column 1 blocks. The cycle shown in FIGS. 187(c), 187(d), 187(e), 187(f), 187(g), and 187(h) can then repeat until as many blocks as are needed are ejected. The wide plunger may in some embodiments be spring-loaded rather than actively driven, since it cannot advance until all blocks in a given column have been ejected and the narrow plunger has withdrawn as in FIG. 187(g).

Other ways of providing and dispensing blocks may be used in some embodiments. For example, blocks may be attached to a continuous tape, or be retained within compartments attached to a continuous tape (similar to electronic components fed to pick and place machines). Blocks may also be pushed out of a tube that is at an angle with respect to vertical, so that blocks falling out of the tube rotate into a desired horizontal position.

FIG. 188 depicts a "3-D printed hybrid electronic module", or 3DPHEM: a device in which the mechanical structure and interconnects are printed using FEAM from a dielectric matrix material and metal wire, respectively, and components such as electronic components, MEMS, and optoelectronic components (packaged or bare die) are inserted during or after printing. 3DPHEMs are similar in some respects to circuit card assemblies (populated PCBs) but can have a very wide range of 3-D shapes (not merely rectangular and flat), can be lightweight (e.g., by printing with pockets or widely-spaced infill), compact (3-D structured with components distributed throughout the volume, and potentially hundreds of layers), robust (with encapsulated, protected components), and can be rapidly manufactured by an integrated, automated process in a single machine. Junctions between wires—and between wires and the pads of inserted components—in a 3DPHEM may be made by various approach discussed above including soldering (e.g., laser soldering), welding (e.g., laser welding), electrically conductive adhesives, and ECPC, as well as wire bonding (e.g., thermosonic wire bonding), the latter being especially attractive for bonding wire to the pads of bare die.

To fabricate a 3DPHEM, dielectric matrix material (which may be chosen for favorable properties such as high glass transition temperature, low dielectric constant, stiffness, etc.) is printed layer by layer, including one or more cavities into which components can be placed. Once a sufficiently deep cavity has been created to house a given component (packaged or bare die) such that it won't protrude), the component (e.g., a surface mount component) can be placed in the cavity with its pads (or leads, such as a gull-wing lead) facing upwards, using standard pick and place techniques as adapted to a 3-D printer (e.g., a vacuum pickup attached to the printhead). Next, wire encapsulated in matrix material can be printed together using FEAM according to the circuit topology such that the bare ends of wires needed on the current layer overlap pads on the component. Next, a junction is formed between the component pads and the wires. In some embodiments this is done using solder paste applied to the wire and pad after the wire is printed, or before the wire is printed: the paste can be reflowed (e.g., by laser soldering) as fabrication progresses, or if the solder reflow temperature is low relative to the matrix material and maximum component temperature; reflow can be performed after all layers of the 3DPHEM are printed. In other embodiments the junctions is formed by depositing small quantities of ECPC over the wire and pad, or onto the pad before the wire is printed, or by laser welding or thermosonic bonding, etc. Junctions between wires which may be needed in the current layer are also created. Before proceeding to the next layer, the remaining matrix material required for the layer (which may include material forming a "roof" over the inserted component) is deposited. This process repeats until all layers are formed, all components are inserted and joined, and all wire-wire junctions are made. If any support material has been used, it can then be removed. In some 3DPHEMs, it is desirable to efficiently remove heat from a component; metal wires can be used for this purpose, but also, cavities may be produced within the matrix material allowing access to the component surface by cooling fluids (e.g., leak-proof, sealed channels can be formed around a component), or allowing insertion of a cooling element such as a heat pipe or heat spreader that makes contact with a component embedded deep within the 3DPHEM. Heat can also be removed by use of a matrix (from which the entire 3DPHEM is made, or just a portion) with high thermal conductivity, such as a polymer containing cubic boron nitride powder, or even metal powder below the percolation threshold.

A what-you-see-is-what-you-get design/fabrication process may be implemented in some embodiments, in which the design engineer can specify and visualize the exact size and positioning of components, wires, and junction cavities in CAD, just as it will be in the actual 3DPHEM. An exemplary process flow is as follows (assuming, for ease of explanation, 3-D CAD terminology used by SOLIDWORKS (Dassault Systémes SolidWorks Corporation, Waltham, Mass.)), which is compatible with standard mechanical 3-D CAD software and the standard .STL files used in 3-D printing:

Step 1: CAD design. a) Create a circuit schematic and bill of materials, and download or create CAD models of all the components to be inserted into the 3DPHEM. If desired, add margins around each component to allow for manufacturing tolerances, ensuring all components will fit into their respective cavities. The margin can take into account the desire to have good thermal contact between the component and the cavity walls, ceiling, or floor, or the desire to decouple stress in the structure from the device, allowing it to "float" within the cavity, suspended by the wires joined to its pads. Give each component file a suitable name (e.g., Cap1.sldprt for a particular capacitor). b) Create the 3-D shape of the dielectric portion of the 3DPHEM in CAD (this may be modified during subsequent steps). Add other features if desired such as channels for flow-through cooling using air or (especially if all electrical contacts will be fully encapsulated) liquid. Give the part a name such as Dielectric.sldprt. c) Create a 3DPHEM assembly file (e.g., 3DPHEM.sldasm) and insert the Dielectric.sldprt file. d) Insert all the component part files in the assembly and constrain using mates. e) While working in the assembly, create a part file (e.g., Wiring.sldprt) with the geometry of the wires needed to connect the components to one another (e.g., FIG. 189(*a*)), and mate the wires to the component pads. Individual wires will often have the same cross-sectional shape, and can be created using the extruded boss/base feature (standard or thin), sweep feature, etc. To specify whether a portion of a wire is to be insulated (i.e., coated with dielectric) or bare, adjust the width of the wire shape in CAD (e.g., wide to designate insulated portions, narrow to designate bare portions, FIG. 189(*b*)); the width will later be extracted and used to control polymer flow from the nozzle. Typically the wire ends will be bare, and will overlap pads on the components or will be bare so as to create a wire-wire junction: intra-layer (e.g., between two wires end-to-end or arranged in a "T" or "Y" junction, or three wires meeting end-to-end), inter-layer, or both (wires, including long wires with a serpentine or spiral shape, may be joined to a component pad merely to help dissipate heat). f) While working in the assembly, create one or more part files (e.g., Junctions.sldprt) containing the 3-D shapes of rectangular boxes which define the volumes and locations of junctions. Position the boxes using mates so that they overlap groups of wires to be joined with wire-wire junctions (intra- and/or inter-layer), or overlap wires and pads to be joined with wire-pad junctions (FIG. 189(*c*)). Different files might be created for different types of junctions such as intra-layer junctions, inter-layer junctions, and wire-pad junctions, since the machine parameters required to form these junctions may differ. The box size might be varied according to the needs of the junction, encoding the amount of solder paste required, laser power or time required, etc. g) While working within the assembly, edit the Dielectric. sldprt file and use the cavity feature to select the files (Wiring. sldprt, Junctions. sldprt, and each component file) to be subtracted and produce voids in the Dielectric..sldprt file. Add the cavity feature, resulting in a geometry in which the volumes occupied by the components, wiring, and junctions are missing. h) Export the Dielectric.stl file from Dielectric.sldprt; export the Wiring.stl file from Wiring.sldprt; export the Junctions.stl file from Junctions.sldprt.

Step 2: File processing. By interpreting each .stl file differently, a FEAM 3-D printer can be directed to process the three materials of interest (dielectric, metal wire, and junction material (assumed here to be solder paste which will be laser soldered) even though the .stl files themselves contain no material information. i) Process Dielectric.stl as usual (e.g., using slicing software such as Slic3r) to generate standard G-code (e.g., Dielectric.x3g) which controls nozzle motion. j) Using specialized software, process Wiring.stl to generate a custom G-code ASCII file (e.g., Wiring.feam) that controls wire deposition (including nozzle X/Y position, feeding and segmenting). The software is able to slice the file, extract contours, calculate a set of vectors which follow the wire trajectory (as in FIGS. 178(a), 178(b), 178(c), 178(d), and 178(e)), and insert codes which turn on and off the polymer flow based on the local contour width to allow insulated and bare regions of wire to be formed. k) Using the software, process Junctions.stl (one or multiple files) to generate a custom G-code ASCII file (e.g., Junctions.feam) that controls the positioning and activation (e.g., on and off timing) of the solder paste dispenser and the laser, and may also control laser power during pre-heat and soldering, or other parameters according to junction type and the specific junction geometry (e.g., number of wires being joined). The centroid of the box can be calculated to determine (with an offset) the position of the solder paste dispensing needle tip, while the calculated box volume can determine the solder volume to be dispensed (e.g., the time of dispensing, which may be different for different components and different junction types, etc.)

Step 3: Consolidation and printing. 1) Import all three G-code files into specialized printer control software and consolidate them into a single machine control file which includes all relevant machine control commands. m) Print the 3DPHEM using the custom software: insert components manually or using automated pick and place approaches as needed.

In some embodiments the electrical contact between a component pad and a wire (e.g., in a 3DPHEM) is based on preloading the component so that its pads contact wires or conductive materials making contact with the wire (e.g., a compliant blob of ECPC). For example, a component may be inserted with its pads facing downwards to contact wires below (e.g., in a cavity). While pressure is applied to the component to preload it, material can be extruded above the component to lock it in place, maintaining the preload.

3DPHEMs and other structures in which components are inserted may need to be reworked involving replacement of a component. If the component is placed within a cavity in which at least one surface (e.g., the floor) is removable, the surface can be removed and the component replaced once its electrical contacts to the wires have been loosened. In the case of components merely preloaded against wires or conductive materials, the component need only be extracted since its pads are not bonded to anything.

For applications (e.g., power and ground planes, capacitors, patch antennas) in which it is desirable to integrate into the device a continuous or near-continuous sheet of metal, this can be approximated using various techniques. The use of flat wire has already been noted. Depositing parallel lengths of wire on multiple (e.g., adjacent) layers, in which the lengths are staggered between layers (like bricks in a wall) can be done in some embodiments, such that the wire in one layer covers the gaps in another. Arranging parallel wires in a layer so they are oriented at a non-zero angle (e.g., 90 degrees) with respect to wire in another layer can also be done in some embodiments. In some embodiments, "hatched" or "mesh" power and ground planes can be used, which are porous and easily achieved with wire laid in patterns such as serpentines/zigzags and spirals.

An inserted part such as an electronic component may have its pads in a different position than anticipated when designing the routing of wires in CAD. To compensate for this, in some embodiments a vision system may be used to determine the precise location and orientation of a component's pads, and adjust the path along which wire is laid—as well as the location of solder paste dispensing and laser spot position, if applicable—so as to compensate for the error in pad location and orientation and ensure that wires are properly located with respect to pads to allow reliable junctions to be formed. In some embodiments after the component is inserted, an adhesive, underfill, etc. is used to ensure that once the component is placed and inspected/measured, it will not move (e.g., due to vibration, acceleration, forces applied while depositing solder paste, etc.). In some embodiments material (e.g., matrix material) is deposited on top of and/or on the sides of the component to fix it to the surrounding structure.

Sacrificial fibers incorporated into structures, once removed (e.g., by dissolution) can form channels for fluids that are much narrower than can easily be produced directly. Such channels can also be used to accommodate solid objects, e.g., an optical fiber, through which light can travel within the structure (e.g., to stimulate or probe a microfluidic volume within) without being affected by the optical properties of the structure. A similar result can be obtained through the encapsulating using FEAM of hollow fibers. In some embodiments channels produced in structures by any method can be filled during or after fabrication by conductive fluids such as ionic solutions/electrolytes, low melting point alloys (e.g., gallium-indium), and solders.

3DPHEMs, circuits, and other devices fabricated according to some embodiments can contain components—either inserted or fabricated in-situ—that need to be modified for use. For example, an inserted EEPROM or FPGA device may need programming, an inserted battery may need charging, an inserted or fabricated component may need laser trimming to its correct value. In some embodiments these modifications can be performed as the device is fabricated, rather that afterwards or, in the case of inserted components, beforehand. For components that may be fabricated in-situ such as resistors, the characteristics (e.g., resistance) may be measured during or shortly after the component is made, such that the component can be adjusted to the correct value. For example, the length and/or path of a resistive wire used as a resistive component can be adjusted in real time as the wire is deposited, based on real-time measurements of resistance.

ECPCs (and SMCs) can in some embodiments be formulated using waxes and hot melt adhesives as the polymer or portion thereof. Such adhesives may have improved adhesion to substrates such as metals (e.g., wire, electronic component pads) when compared to polymers such as TPEs. Moreover, they may have a much lower viscosity, facilitating mixing with conductive (or magnetic) powders, and dispensing. An example of a hot melt adhesive suitable for use is Tecbond 7718, a low viscosity polyamide hot melt adhesive (Ellsworth Adhesives, Germantown, Wis.).

When printing structures from soft materials, material may deform too much under gravitational forces, inertial forces (e.g., if the structure is on a moving platform), tension applied by the moving nozzle through the solidifying extrudate, tension applied by the wire anchored in the structure, and shrinkage of the solidifying, cooling material (if thermoplastic), which cannot be resisted by other such material due to the low modulus. Thus in some embodiments such structures are built along with a relatively rigid support material which stabilizes it during fabrication. The support material may be removed by peeling off, breaking off (if friable), melting, or dissolution. A suitable rigid support material for TPE such as Kraton D1161P and StarClear® 1003-0000 (Star Thermoplastic Alloys & Rubbers, Broadview, Ill.) is polyvinyl alcohol (PVA), which is preferably kept in a dry box and fed through a tube to protect it from humidity.

In some situations, the orientation required for actuation of an actuator or displacement of a sensor may not (e.g., in a robot) be the same as the optimal orientation for fabricating the device. In such situations in some embodiments the device can be fabricated in the optimal orientation, but a fluid coupling may be created between the device and the desired actuation or displacement. For example, a solenoid actuator is best printed with its axis of actuation vertical (perpendicular to the layers). If the required actuation is horizontal, then the solenoid plunger can deform a diaphragm or bellows or translate a piston in a cylinder, pressurizing a liquid. The liquid pressure can then be communicated to another diaphragm, bellows, or piston having an axis of actuation that is horizontal; the conduit between the two sets of bellows, etc. may easily be fabricated with a right-angle turn or equivalent.

In some embodiments, actuators or sensors may be fabricated which include a ferrofluid that is applied during fabrication or afterwards. Ferrofluids are able to sustain magnetic fields with low reluctance compared to air, and yet cannot sustain mechanical stress. Thus an actuator such as the dome actuator of FIGS. 26(a) and 26(b) might have ferrofluid between neighboring turns of wire, to better couple the magnetic field from one turn to the other. A variety of compliant electromagnetic actuators may be produced which combine an elastomeric structure with hollow regions that are filled with a ferrofluid and/or ferromagnetic particles, and a coil is provided to generate a magnetic field. When the field is turned on, motions of the fluid will force the structure into a new shape, or in the case of particles, they may transition from an unjammed/flowable to a jammed state or vice-versa, providing variable stiffness and/or actuation.

In some embodiments, the wire should be heated to allow better control over vertical centering within the extrudate. This can be accomplished by heating the capillary, by Joule heating of the wire, by inductive heating of wire or capillary, etc. One method of heating the capillary is wrapping it with (if the capillary is metal, insulated) heating wire (e.g., Ni—Cr).

In some embodiments, structures made with embedded wires can be made to self-heal after a fissure, tear, or other rupture, by using Joule heating of the wires to soften the surrounding material (if thermoplastic), release a micro/nano-encapsulated adhesive material within the surrounding material, etc.

Ramifications:

In some embodiments, wire can be included within extrudates of polymer or other material as a matter of course, throughout the fabricated object, rather than be stopped (e.g., cut) and started so as to include it only where needed. In such embodiments, if an object is built in layers, vs. in a continuous, quasi-helical fashion, wire may still be stopped and started between layers. In such embodiments, the wires remain electrically isolated from one another except where they pass through regions of ECPC that themselves, or through other regions of ECPC, form an electrical junction between the wires. As noted above, polymer filament may be supplied with wire pre-embedded, and the entire volume of the filament need not necessarily be softened to allow deposition of extrudates and fusing to previously-deposited extrudates on the same or the previous layer: melting the outer surface of the filament can be sufficient.

In general, conductors can be wire, ECPC, or a combination of the two. In some embodiments, rather than limit ECPC to junctions between wires as in FIGS. 8(a) and 8(b), ECPC can be provided throughout the entire length of wire-containing extrudate. This minimizes the transitions between pure, dielectric polymer and ECPC that are required, and allows the conductivity of the ECPC to contribute to the overall conductivity of the extrudate. However, neighboring extrudates which are not intended to be shorted along their common boundary may not both have ECPC throughout their volumes; thus conductive, wire/ECPC containing extrudates will generally need to be spaced further apart than conductive wire-only extrudates. Also, ECPC is generally stiffer than pure polymer, thus altering (for better or worse) mechanical properties of the fabricated object, and is generally more costly.

Components made with the processes disclosed herein may be combined to form larger components, including those too large to fabricate in a single machine, with electrical junctions made between multiple components so that current can flow across the boundaries. For example, two components may be fabricated with exposed regions of ECPC at the surfaces that will be joined together, with such regions serving as connectors. In some embodiments, providing pressure at the opposing regions of ECPC is sufficient to create a satisfactory junction, while in other embodiments the ECPC may be softened (e.g., if thermoplastic) or coated with a conductive adhesive or other intermediary. In some embodiments, wire may protrude from one component and be pushed into ECPC in another component.

In some embodiments in which the printhead moves in at least one axis parallel to the layers, fabrication may be accelerated and accuracy improved by independently positioning the nozzle and possibly, closely-associated components, with respect to the move massive printhead. For example, when rounding a sharp corner, the printhead may follow a path with a larger radius than is required by the extrudate, while the nozzle, independently actuated to move over small distances within the printhead, follows the desired contour far more exactly. Such partitioning between small, rapid motions and large, slower ones can be applied to FDM and similar processes in general.

Regions of wires intended to be bare (e.g., for connection to external circuitry, or for the insertion of external components into a fabrication object, or for applications requiring freely-moving wire) can be nonetheless anchored temporarily, as an aid to wire delivery, in sacrificial support material. After this is removed, the bare wire remains exposed.

Insulated wire (e.g., magnet wire with thin insulation) may be used in lieu of bare wire, e.g., to obtain coils with more tightly-spaced turns, by stripping the insulation off the ends of the wire as needed. This may be done using heat, mechanical scraping or abrasion, laser, chemicals, ultrasonic energy, etc.

Abrupt transitions in elastic modulus between polymer matrix and ECPC may lead to stress concentrations; these can be mitigated by creating gradients in powder filler concentration, such that only regions above the percolation threshold are nonetheless conductive, by altering the geometry, or by incorporating other materials or grades of materials that can help produce a more graduate transition. In some embodiments, polymers can generally be filled with powder and thus have fairly uniform elastic modulus: some of the powder is conductive (e.g., for junctions) and some is not.

The quality of junctions produced using FEAM can be determined as the object is fabricated using in-situ inspection. For example, the resistance between two region of ECPC on the same layer may be measured by extending probes into both of them, or by making contact with wire that is embedded within them (e.g., as the wire is delivered and embedded). To measure the resistance between two regions on two adjacent layers N and N+1, the region on layer N can be designed to be only partially overlapped by the region on layer N+1, such that a probe can extend into the non-overlapped portion while another probe is inserted into the region on layer N. Junctions which fail the inspection criteria for resistance and which are needed for functionality may be in some embodiments reworked (e.g., re-melted, or melted together by a jet of hot air, or material can be melted, extracted by vacuum, and redeposited), or in some embodiments simply bypassed by forming additional junctions elsewhere.

In some embodiments, filament may be deposited before polymer is deposited, not simultaneously or subsequently, and a mixture of these approaches may be used throughout a single fabricated object. For example, filament may be placed onto the top of an existing layer, optionally tacked down at certain locations with polymer, and material extruded over it more or less as in conventional FDM. In this scenario, the filament will tend to be at the bottom of the new layer, not centered vertically within it. Thus in some embodiment variations, a partial layer of thickness less than the desired layer (e.g., half the thickness) can be deposited, followed by filament, followed by another partial layer. Or, the filament can be spaced vertically by deploying onto it small "beads" which support it, or if ductile it can be bent (e.g. by the head of FIG. 36) to form small supporting regions which suspend the majority of the filament above the surface.

Rather than form separate regions of ECPC as in FIG. 8(b) to create a junction on a layer such as layer N, in some embodiments the regions can be combined into a single ECPC region, with ECPC deposited to fill in the entire region, for example, depositing ECPC into a trench left after forming the pure polymer extrudates with embedded wire. In some embodiments the same is approach is used for junctions that span two or more layers, e.g., with a multi-layer trench backfilled using ECPC. In some embodiments, regions of ECPC may be shaped to provide both an intra-layer junction such as FIG. 8(a) and an inter-layer junction such as FIG. 8(b).

In some embodiments, objects can be fabricated entirely in a unidirectional raster deposition mode (with a fast and slow axis), such that the orientation of asymmetric nozzles, external capillaries, and the like need not vary during deposition as when depositing curved extrudates in a vector deposition mode. Thus no rotation of printhead components or of the fabricated object (as in FIG. 42) is required. In such a mode, the layer cross sectional area is formed by a set of parallel extrudates—e.g., some with and some without filament—all deposited by the printhead moving in one direction (e.g., along positive X). Assuming printhead rapid motion along X (the "fast axis"), adjacent regions of ECPC can provide connectivity along the Y axis (the "slow axis"); while this is sub-optimal, judicious design can in some cases minimize the need for conductivity along this axis on a particular layer, and the orientation of the raster can be varied from layer to layer (e.g., by rotating the object) with interconnects designed (e.g., automatically) to optimize resistance by selecting those layers offering the highest conductivity for the required interconnect directions. With proper design (e.g., a vertically-quantized helix with polygonal sides) even coils can be produced with a raster-based approach. In raster-based embodiments using an external capillary, two such capillaries may be provided diametrically opposite the nozzle and in line with the raster fast axis, so that filament delivery can occur bidirectionally. In raster-based embodiments, ECPC-delivering nozzles may be positioned in line (e.g., two nozzles diametrically opposite the nozzle delivering pure polymer, all aligned with the raster fast axis), such that ECPC can be delivered through its own nozzle and switching between materials can be avoided. In raster-based embodiments, multiple nozzles can be used, with some or all nozzles being capable of depositing filament, to significantly speed up layer formation. In some embodiment variations, one or more external capillaries can be mounted to a stage similar to FIG. 45(a) and move along the slow axis, providing wire embedding to one or more particular nozzles for a given layer, then reposition near one or more, possibly different, nozzles for a different layer.

In some embodiments, in lieu of or in addition to embedded solid conductors, small channels may be incorporated into the fabricated object which can be filled with conductive material in liquid or solid form. For example, small-diameter tubes may be integrated much like fibers into a structure, and filled (e.g., by capillarity) with a molten low melting-point metal alloy that is either maintained molten (e.g., the device may operate in a heated environment, or the metal may be melted through resistive heating using a current or by induction) or allowed to solidify. In some embodiments, conductive pathways may be formed by extruding a material having an interconnected porosity as-fabricated or upon further processing, and then infiltrating the material in selected regions with a conductive liquid, which in some embodiment variations can thereafter solidify. Interconnected pores may be produced by injecting air bubbles during deposition in a manner similar to FIG. 71, by depositing a two-phase material (e.g., one having a particulate in high concentration that is subsequently removed or evaporates to leave voids), or other methods.

In some embodiments it is desirable or necessary to provide a force that brings together or into closer proximity elements that are to be joined. For example, in the case of laser soldering, it may be advantageous to force one wire against another or near another when making a wire-wire junction, or force a wire against or near a component pad when making a wire-pad junction. In the case of laser soldering of junctions, a tube may be provided through which the laser beam propagates (e.g., between a fiber collimator and its focal point). The tube can be designed such that its tip is of small diameter, but it does not intersect the beam, which may be converging: e.g., the tip may be tapered like a funnel. In addition to its possible uses as a safety shield for the laser beam and a means of withdrawing smoke and fumes produced during soldering by applying vacuum to the tube, the tip of the tube (e.g., made from a metal) can be used to press together the objects to be joined, ensuring they are in the proper position for joining. For example, in the case of a ball grid array or similar device (packaged or bare) having an array of pads (versus pads only at the device edges), the device may be placed inverted within a printed structure and there are many wires which need to be soldered to the pads. These wires, especially if uninsulated, may originate from various layers within the fabricated structure, and must be bent downwards by various amounts to make contact with the pads on the device. Wires originating on lower layers may be used to connect to pads near the periphery of the device, while wires originating on higher layers may be used to connect to pads towards the interior of the device. Solder paste can be deposited onto the pads and then wire is printed on a number of layers. Soldering can be performed gradually (e.g., as each layer of wires is added, additional pads are soldered) or all at once, the former being preferable such that wires originating on higher layers do not shadow pads on lower layers, since the wires have not yet been printed. While the wires from lower layer(s) may already be in contact or in proximity to their corresponding pads, wires on higher layers will often need to be deformed so that they can reach down to their corresponding pads. This deformation can be accomplished by use of the tube, which presses against the wire (in some embodiments a notch may be provided in the tube to prevent the wire from slipping sideways), deforms it downward so that it touches or is near the pad, at which point the laser can melt the solder paste (if the wire is sufficiently ductile or the paste sufficiently adhesive, the tube need not remain in place during the soldering; otherwise, it can continue to hold the wire in position during the soldering operation).

An FDM-type 3-D printer may utilize multiple, independent extruders to produce a part more quickly than is possible with a single extruder. However, such parts might normally be less strong than if made with a single extruder due to weaknesses at the interface (e.g., vertical) between regions printed by different extruders. To greatly increase the surface area of this interface and thus strength of the part, the workspaces of two or more extruders can be made to overlap to some extent, and in the region of overlap, layers can be printed by alternating one extruder and another. This produces a part with partially interleaved layers. To further increase strength, reinforcing fibers can be printed in the overlapping region in the form of "U"-shaped loops using FEAM-based printheads with extruders and WSFs. When matrix material is deposited by printhead A into loops formed by printhead B (and vice-versa), the loops are embedded in matrix material, further binding the two regions of the part together.

It can be advantageous if the nozzle through which material is delivered can accommodate the presence of elements such as components to be embedded in the structure which protrude above the previous layer (rather than are flush or below flush with the layer upper surface, in a cavity). While a standard FDM-type nozzle can achieve this to some extent, it requires leaving a wide, material-free margin around the component, to avoid collisions. In some embodiments a nozzle may therefore be used that is tilted in a vertical plane so that one side of the nozzle is no less than 90 degrees from the layer surface, allowing the nozzle orifice to move much closer to the component and reducing the margin width or eliminating it entirely. Since such a nozzle is no longer symmetric, it—or the structure being fabricated—must rotate if the nozzle path changes direction, so as to keep the side adjacent to the component in the desired orientation.

In some embodiments devices can be produced with FEAM which have hidden functionality and are thus useful in covert applications. Sensors as well as antennae, processors, memory, power sources, and actuators can be built-in or embedded. Such a device, for example, might appear like a rock, but in fact serve as an unattended ground sensor for military or law enforcement use.

Soluble support materials such as PVA can be made to dissolve even more quickly if they are printed with sparse infill so they are much less than 100% dense. Moreover, support structures may be made with lattice-like structures or provided with channels to introduce the solvent.

In some embodiments a FEAM or FDM machine can use interchangeable toolheads, at least one of which can be mounted to a moving carriage and be active at a time, while others await use in a storage area. Toolheads may include filament extruders (in which case the filament may remain inserted when the toolhead is in storage), pellet extruders (in which case a small hopper on the toolhead may be refilled while in storage), syringe extruders (e.g., for SMC, ECPC, solder paste), high-pressure ram extruders, spindles (for subtractive processing such as drilling and milling), laser collimators (in which case an optical fiber may remain attached while the collimator is in storage), inspection microscopes, manipulators (e.g., vacuum, magnetic) for pick and place placement of components, etc. The carriage can move to a position where it can mate with a toolhead in a very repeatable fashion (e.g., using a kinematic mount, using a keyed taper). Mating electrical interfaces on the carriage and toolhead can be provided so that electrical power and signals can pass from carriage to toolhead and back. Commonly, frequently-used toolheads (e.g., build/model material and support material, or solder syringe extruder and collimator) may be loaded onto the carriage simultaneously in some embodiments, to minimize the time needed for toolhead exchange. This approach also allows for off-line toolhead maintenance (e.g., removing residue build-up on a nozzle, purging, priming, pre-heating) and provides redundancy (e.g., there can be more than one printhead for a critical material).

In some embodiments, printed structures comprising a deformable wire and elastomer (or shape memory polymer) matrix may be reshaped after fabrication. If the wire is plastically deformed by a force, the elastomeric structure can change shape permanently. If the wire is elastically deformed, the structure normally reverts to its original shape after the force is removed. However, if the elastomer is heated while the force is applied, then the elastomer may set into a new shape. After cooling, it remains in that shape without the application of power. Since there are residual stresses in the wires but the wires are unable to return to their original shape (in which the stresses are released), the structure is left with residual wire stresses. If reheated again, it will spontaneously change its shape based on those stresses. Forces may be applied externally, or may be applied internally, e.g., electromagnetically, capacitively/using the principle of dielectric elastomer actuators, using shape memory effects, thermal expansion, piezoelectric and magnetostrictive effects, etc.

In some embodiments, printed material can have features added to it after printing. For example, printed thermoplastics can be embossed using suitable tooling, e.g., to provide useful surface textures (e.g., super-hydrophobic textures), channels to transfer fluids, etc. Alternatively, a printhead in which the nozzle or surrounding elements is specially shaped (e.g., with small-scale protrusions) can emboss the polymer as it prints.

In some embodiments FEAM may be implemented in a rectilinear fashion such that wires are only routed parallel to the X and Y axes (or other two axes, not necessarily separated by 90 degrees), and in some embodiment variations, while moving the printhead only in a positive X or positive Y direction (or the inverse). When so implemented, two separate WSFs can be used: one for depositing wires parallel to X, and one for depositing wires parallel to Y, and no WSF rotation is needed, thus potentially reducing cost and complexity. Junctions are formed between X and Y wire segments as needed to obtain the desired circuit routing.

In the FEAM process, it is useful in some embodiments to vary the feed rate of wire according to the radius of the path followed by the nozzle while printing wire and matrix. If the wire is fed faster, it will move to the outside of a curve; if the wire not fed more slowly, it will move to the inside of the curve.

Slightly underfeeding wire (feeding at a lower speed than the printhead tangential velocity) or other methods can be used to provide a slight tension in the wire to prevent it from wandering within the capillary, which can affect its location in the extrudate.

3-D printing may be performed in a granular gel medium into which a material is delivered through a needle or similar, with the granular gel supporting the delivered material [O'Brian et al., 2017]. In some embodiments, FEAM can also be performed in a granular gel medium, such that in addition to the delivered material, a fiber is delivered into the gel. The fiber may be encapsulated by the delivered material, or in some embodiment variations be adjacent to it.

Continued, uncontrolled leakage of material from a nozzle is undesirable. While a filament extruder can reverse the direction of filament motion to reduce pressure in the nozzle to minimize this, it can be more difficult with a screw-based extruder. In some embodiments pressure reduction can be implemented by incorporating a crushable tube (e.g., thick-walled silicone, superelastic Ni—Ti) into the printhead. Under normal extrusion conditions, the tube is kept partially crushed (e.g., by an actuator). When a reduction in pressure is needed, pressure is released (at least partially) allowing the tube to increase in size. Such an arrangement allows for an easily-cleaned device.

In some embodiments in lieu of a downstream capillary adjacent to the nozzle, pins are provided which protrude from the nozzle, or a groove is provided in the nozzle, to control the wire position.

In some embodiments, the printhead is equipped with a "hot shoe" which smooths and reflows the surface of the extrudate so as to reduce porosity (by reflowing/pushing together neighboring extrudates). The shoe can also increase intra-layer bonding and improve thickness control and surface finish of up-facing surfaces.

The accuracy and repeatability of an FDM or FEAM printer is to some extend a function of the width of the extrudate, and this is a function in part of extrudate diameter, which can vary over some range. In some embodiments between the "cold end" of the printhead (e.g., driven and idler rollers) one can incorporate a sensor that measures the local diameter of the filament, allowing the roller speed to be adjusted in real time such that extrusion flow rate is constant, regardless of small diameter variations.

Calibration (preferably automatic and periodic) of the fiber feed speed can be performed in some embodiments for different wire types, hardnesses, diameters, shapes, and to compensate for wear of the rollers (or other mechanism) that feeds the wires.

In some embodiments, ECPCs may be conditioned for use by a "burn-in" process which subjects the ECPC to an electrical current, an elevated temperature, etc., with the result that the resistivity of the ECPC is stabilized and may be decreased.

When flat wire, or wire that is locally flattened is used for intra-layer junctions, in some embodiments it is preferentially oriented so that the wider dimension is vertical, allowing solder paste to be dispensed into or near the gap between the wires.

A system containing multiple electromagnetic devices with permanent magnetic materials that are deposited is most easily magnetized if the desired field orientations of all the magnets are arranged to be parallel.

In some embodiments, laser-induced forward transfer (LIFT) may be used to deposit solder, solder paste, ECPC, magnetic materials, etc. in conjunction with an FDM or FEAM process.

In some embodiments small errors in fiber feed rate may cause undesired buildup of tension. This can be corrected in some embodiments by having the fiber execute a turn while unembedded in material, enter a cavity, etc. to provide slack.

FEAM and Big Area Additive Manufacturing (BAAM, a scaled-up form of FDM typically using pellet-fed extruders) may be combined, allowing large-scale structures such as car, boat, and aircraft bodies, as well as major appliances, to be built with built-in wiring and/or continuous fiber reinforcement.

Artificial pressure/touch-sensing "skin" (e.g., for robots) can be produced in which a powdered conductive material (e.g., carbon black) is dispersed in an elastomeric matrix, and electrodes (e.g., formed from wire) are connected with wire to measure the resistivity change of regions of the structure when they are subject to forces (compressive, tensile, shear, etc.), which can alter the resistance by altering the average distance between particles.

FEAM can be used to check for faults in manufactured parts (e.g., to counter cyber-attacks or to indicate when parts have failed or are about to fail (from otherwise normal usage). For example, strain gauges or piezoresistive elements can be incorporated throughout the part (perhaps manufactured using ECPC) and connected with wires to a central sensing unit. If ECPC is used as the sensing element, carbon black can be used, for example, at low concentrations to obtain good material properties but high resistance, as could conductive inks.

To enhance the thermal management of heat-sensitive components within 3DPHEMs, etc., thermally-conductive paste and adhesives may be dispensed adjacent to the component.

Control System

The control of the apparatus and the implementation of the methods and steps described herein may be achieved using hardware, software, or any combination thereof, together forming a control system. The term "hardware" may refer to either one or more general or special purpose computers; microcontrollers; microprocessors; embedded controllers; or other types of processor, any of which may be provided with a memory capability such as static or dynamic RAM (random access memory); non-volatile memory such as ROM (read only memory); EPROM (erasable programmable read only memory), or flash memory; magnetic memory such as a hard drive; optical storage media such as CD (compact disc) or DVD (digital versatile disc); etc. The term may also refer to a PAL (programmable array logic) device, an ASIC (application specific integrated circuit), an FPGA (field programmable gate array), or to any device capable of processing and manipulating electronic signals.

The term "software" may refer to a program held in memory, loaded from a mass storage device, firmware, and so forth. The program may be created using a programming language such as C, C#, C++, Java, or any other programming language, including structured, procedural, and object oriented programming languages; assembly language; hardware description language; and machine language, some of which may be compiled or interpreted and use in conjunction with said hardware.

The control system may serve to load files, perform calculations, output files, control actuators such as motors, voice coils, solenoids, fans, and heaters, and acquire data from sensors, to automate or semi-automate apparatus which can implement the methods and steps described herein. Each method described herein, including any sequential steps that may be taken for the method's implementation and any modification of the behavior of the apparatus or control system as a result of human or sensor input, as well as combinations of such methods, may be implemented and performed by the control system, executing a program, or code, embodied in the control system. In some embodiments, multiple control systems may be employed, and portions of the functionality of the control system may be distributed across multiple pieces of hardware and/or software, or combined into a single piece of hardware running a single piece of software.

General

The terms "wire" and "fiber" are generally speaking and for the most part used interchangeably herein, referring to elements that can be co-deposited, laid, encapsulated, and/or embedded within another material to form a composite structure or material. Moreover, the term "filament", unless it is referring to the form of the material fed into a printhead, may be taken to be synonymous with the terms "wire" and "fiber" as described in this paragraph. The term "wire" does not necessarily imply metal, nor does "filament" or "fiber" necessarily imply a material other than metal.

It is contemplated that any embodiment discussed in this specification can be implemented with respect to any method, kit, reagent, or composition of the disclosure, and vice versa. Furthermore, compositions of the disclosure can be used to achieve methods of the disclosure.

It will be understood that particular embodiments described herein are shown by way of illustration and not as limitations of the disclosure. The principal features of this disclosure can be employed in various embodiments without departing from the scope of the disclosure. Those skilled in the art will recognize, or be able to ascertain using no more than routine experimentation, numerous equivalents to the specific procedures described herein. Such equivalents are considered to be within the scope of this disclosure and are covered by the claims.

All publications and patent applications mentioned in the specification are indicative of the level of skill of those skilled in the art to which this disclosure pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context. In certain embodiments, the present disclosure may also include methods and compositions in which the transition phrase "consisting essentially of" or "consisting of" may also be used.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and/or methods and in the steps or in the sequence of steps of the method described herein without departing from the concept, spirit and scope of the disclosure. All such similar substitutes and modifications apparent to those skilled in the art are deemed to be within the spirit, scope and concept of the disclosure as defined by the appended claims.

REFERENCES

M. K. Agarwala, et al. (1996), "Fused Deposition of ceramics and metals: an overview. Solid Freeform Fabrication Symposium Proceedings, Austin, Tex., August 1996, pp. 385-392.

E. Aguilera et al., (2013), "3D Printing of Electro Mechanical Systems", Solid Freeform Fabrication Symposium Proceedings, Austin, Tex., August 2013, pp. 950-961.

Matthew Paul Alonso et al. (2009) "Reprinting the Telegraph: Replicating the Vail Register using Multi-materials 3D Printing", Solid Freeform Fabrication Symposium Proceedings, Austin, Tex., August 2009, pp. 761-769.

R. K. Bayer et al. (1988) "Conductive PE-carbon composite by elongation flow injection moulding, Part 1—Flow-induced conductivity profile-high molecular weight matrix", Journal of Materials Science, 23, 475-480.

Jacob Bayless et al. (2010) "Wire Embedding 3D Printer", University of British Columbia (http://reprap.org/mediawiki/images/2/25/SpoolHead_FinalReport.pdf).

Holger Bose and Rene Roder (2009), US patent application 2009/0039309, published Feb. 12, 2009.

John Brauer (2006) Magnetic Actuators and Sensors, Wiley, ch. 7.

Mark R. Cutkosky and Sangbae Kim (2009) Design and fabrication of multi-material structures for bioinspired robots. Phil. Trans. R. Soc. A 2009 367, pp. 1799-1813.

Erick DeNava et al. (2008) "3D Off-Axis Component Placement and Routing with Solid Freeform Fabrication," Solid Freeform Fabrication Symposium Proceedings, Austin, Tex., August 2008, pp. 362-369.

Olaf Diegel et al. (2011) "Getting rid of the wires: Curved Layer Fused Deposition Modeling in Conductive Polymer Additive Manufacturing", Key Engineering Materials (Volumes 467-469), pp. 662-667.

Jiri George Drobny (2011) Polymers for Electricity and Electronics: Materials, Properties, and Applications, Wiley, pp. 225-227.

Kurt Elkins et al. (1997) "Soft Elastomers for Fused Deposition Modeling", Solid Freeform Fabrication Symposium Proceedings, Austin, Tex., August 1997, pp. 441-448.

Laurentiu Encica et al. (2008) "Passive and active constant force-displacement characteristics and optimization of a long-stroke linear actuator," 11th International Conference on Optimization of Electrical and Electronic Equipment, OPTIM 2008, pp. 117-124, 22-24 May 2008.

David Espalin et al. (2012) "Multi-Material, Multi-Technology FDM System", Solid Freeform Fabrication Symposium Proceedings, Austin, Tex., August 2012, pp. 828-835.

T. A. Ezquerra et al. (1988) "Conductive PE-carbon black composites by elongation flow injection moulding, Part 2—Variation of the molecular weight of the matrix", Journal of Materials Science, 23, 4121-4126.

L. Flandin et al. (2001) "Interrelationships between electrical and mechanical properties of a carbon black-filled ethylene—octene elastomer", Polymer, 42, 827-838.

Ken Gilleo (2000) "Flip Chip Assembly with Conductive Adhesives", Proceedings, 2000 HD International Conference on High-Density Interconnect and Systems Packaging, Denver, Colo., April 2000, pp. 256-260.

George Harman (1997) Wire Bonding in Microelectronics: Materials, Processes, Reliability, and Yield, McGraw-Hill Professional, 2nd edition (Jun. 1, 1997).

J.-C. Huang (2002) "Carbon Black Filled Conducting Polymers and Polymer Blends", Advances in Polymer Technology, 21, 299-313.

C. Huber et al., (2016) "3D print of polymer bonded rare-earth magnets, and 3D magnetic field scanning with an end-user 3D printer", Applied Physics Letters 109, 162401.

D. M. Kalyon et al. (2002) "Electrical Properties of Composites as Affected by the Degree of Mixedness of the Conductive Filler in the Polymer Matrix", Polymer Engineering and Science, 42, 1609-1617.

Kim et al. (2011) "Epidermal Electronics" Science, 12 Aug. 2011, Vol. 333.

David M. Kozlak et al. (2011) U.S. Pat. No. 7,917,243, Mar. 29, 2011.

David M. Kozlak (2011) U.S. Pat. No. 8,070,473, Dec. 6, 2011.

S. Kumar and J.-P. Kruth (2010) "Composites by rapid prototyping technology", Materials and Design 31, pp. 850-856.

A. V. Kyrylyuk et al. (2011) "Controlling electrical percolation in multicomponent carbon nanotube dispersions", Nature Nanotechnology, 6, 364-369.

B. Lesquesne (1988) "Finite element analysis of a constant force solenoid for fluid flow control", IEEE Trans. Indust. Appl., Vol. 24, pp. 574-581.

Y. Li and H. Shimizu (2009) "Toward a Stretchable, Elastic, and Electrically Conductive Nanocomposite: Morphology and Properties of Poly[styrene-b-(ethylene-co-butylene)-b-styrene]/Multiwalled Carbon Nanotube Composites Fabricated by High-Shear Processing", Macromolecules, 42, 2587-2593.

Marcio D. Lima et al. (2012), Electrically, Chemically, and Photonically Powered Torsional and Tensile Actuation of Hybrid Carbon Nanotube Yarn Muscles", Science 16 Nov. 2012: Vol. 338 no. 6109 pp. 928-932.

Jiajie Lian and Qibing Pei (2014) "Intrinsically Elastomeric Polymer Light-Emitting Devices", http://informationdisplay.org/IDArchive/2014/JanuaryFebruary/FrontlineTechnologyIntrinsicallyElastomeric.aspx.

Daniel Lipsker (2000) U.S. Pat. No. 6,153,034, Nov. 28, 2000.

John Lang Lombardi et al. (2002) U.S. Pat. No. 6,437,034, Aug. 20, 2002.

Amit Joe Lopes et al. (2012) "Integrating stereolithography and direct print technologies for 3D structural electronics fabrication", Rapid Prototyping Journal, Vol. 18 Iss: 2, pp. 129-143.

Evan Malone and Hod Lipson (2008), "Multi-material Freeform Fabrication of Active Systems, Proceedings of the 9th Biennial ASME Conference on Engineering Systems Design and Analysis, July 2008, Haifa, Israel.

Evan Malone and Hod Lipson (2007) "Freeform Fabrication of a Complete Electromechanical Relay", Solid Freeform Fabrication Symposium Proceedings, Austin, Tex., August 2007, pp. 513-526.

S. H. Masood, W. Q. Song (2004) "Development of new metal/polymer materials for rapid tooling used Fused Deposition Modeling", Materials and Design 25, pp. 587-594.

Jorge Mireles et al. (2012) "Fused Deposition Modeling of Metals", Solid Freeform Fabrication Symposium Proceedings, Austin, Tex., August 2012, pp. 836-845.

Thomas F. McNulty et al. (1998) "Development of a Binder Formulation for Fused Deposition of Ceramics", Rapid Prototyping Journal, Vol. 4 Iss: 4, pp. 144-150.

M. Nikzad et al. (2011) "Thermo-mechanical properties of a highly filled polymer composites for Fused Deposition Modeling" Materials and Design 32, pp. 3448-3456.

C. O'Bryan et al. (2017) "Self-assembled micro-organogels for 3D printing silicone structures" Science Advances, 3, May 10.

Seyi Onagoruwa et al. (2001) "Fused Deposition of Ceramic (FDC) and Composites", Solid Freeform Fabrication Symposium Proceedings, Austin, Tex., August 2001, pp. 224-231.

Mike O'Reilly and Jeff Leal (2010) "Jetting Your Way to Fine-pitch 3D Interconnects", Chip Scale Review, October 2010.

Periard et al. (2007) "Printing Embedded Circuits" Solid Freeform Fabrication Symposium Proceedings, Austin, Tex., August 2007.

Hang Qu et al., (2015) "Flexible fiber batteries for applications in smart textiles", Smart Mater. Struct. 24.

Joshua E. Rabinovich (1996) U.S. Pat. No. 5,578,227, Nov. 26, 1996.

Chris Rauwendaal (2001), *Polymer Extrusion, Revised 4th Edition*, Hanser Publishers, Munich. pp. 22-23.

Jonathan Rossiter et al., (2012) "Biomimetic chromatophores for camouflage and soft active surfaces", Bioinspiration and Biomimetics, 7, 1-10.

G. R. Ruschau and R. E. Newnham (1992) "Critical Volume Fractions in Conductive Composites", Journal of Composite Materials, 26, 2727.

G. R. Ruschau et al. (1992) "Resistivities of conductive composites", Journal of Applied Physics, 72, 953-959.

K. P. Sau et al. (1997) "Conductive rubber composites from different blends of ethylene-propylene-diene rubber and nitrile rubber", Journal of Materials Science, 32, 5717-5724.

Sears, P. and Dupont, P. (2006) "A steerable needle technology using curved concentric tubes", Proceedings of the 2006 IEEE/RSJ International Conference on Intelligent Robots and Systems (IROS), Beijing, China, Oct. 9-15, 2006:2850-2856

Sangok Seok, "Meshworm: A Peristaltic Soft Robot with Antagonistic Nickel Titanium Coil Actuators", IEEE/ASME Transactions on Mechatronics 1 (in publication).

Yonas Tadesse et al. (2011) "Twelve Degree of Freedom Baby Humanoid Face using Shape Memory Alloy Actuators", Journal of Mechanisms and Robotics vol. 3, pp. 1-18.

R. Vaidyanathan et al. (1999) "Extrusion Freeform Fabrication of Functional Ceramic Prototypes", Solid Freeform Fabrication Symposium Proceedings, Austin, Tex., August 1999, pp. 327-334.

Ian D. Walker et al. (2005) "Continuum Robots Arms Inspired by Cephalopods", Unmanned Ground Vehicle Technology VII, Proceedings of SPIE Vol. 5804.

Ryan Wicker et al., U.S. Pat. No. 7,556,490, Jul. 7, 2009.

The invention claimed is:

1. A method for segmenting and feeding a fiber comprising:
   providing a continuous fiber;
   providing a capillary having a lumen;
   advancing the fiber through the lumen in a downstream direction;
   locally damaging the fiber in a region upstream of the capillary;
   advancing the fiber downstream until the damaged region is inside the capillary;
   clamping the fiber inside the capillary at a location downstream of the damaged region so the fiber cannot move;
   applying tension to the fiber upstream of the capillary to break the fiber in the damaged region and yield a downstream wire segment;
   releasing the downstream wire segment within the capillary so the downstream wire segment can be advanced;
   advancing the downstream wire segment by pushing the downstream wire segment with the fiber upstream of the segment,
   wherein a fiber segment of the desired length is delivered by the capillary.

2. The method of claim 1, wherein the advancing is achieved by rotating at least one roller in contact with the fiber.

3. The method of claim 1, wherein the damaging is achieved by advancing a blade into the fiber.

4. The method of claim 1, wherein the clamping is achieved by compressing the capillary.

* * * * *